US008633535B2

(12) United States Patent
Matsuo et al.

(10) Patent No.: US 8,633,535 B2
(45) Date of Patent: Jan. 21, 2014

(54) NONVOLATILE SEMICONDUCTOR MEMORY

(75) Inventors: Kouji Matsuo, Yokohama (JP); Toshiyuki Enda, Zushi (JP); Nobutoshi Aoki, Yokohama (JP); Toshihiko Iinuma, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 13/156,702

(22) Filed: Jun. 9, 2011

(65) Prior Publication Data

US 2011/0303958 A1 Dec. 15, 2011

(30) Foreign Application Priority Data

Jun. 9, 2010 (JP) ................................ 2010-132366

(51) Int. Cl.
*H01L 29/792* (2006.01)

(52) U.S. Cl.
USPC ............ 257/324; 257/67; 257/330; 257/331; 257/E29.134; 257/E29.345

(58) Field of Classification Search
USPC ............... 257/49, 60, 67, 202, 288, 300, 324, 257/329, 330, 331, E27.081, E29.118, 257/E29.122, E29.13, E29.17, E29.345; 438/142, 156, 279
See application file for complete search history.

(56) References Cited

U.S. PATENT DOCUMENTS

| | | | |
|---|---|---|---|
| 6,376,888 B1 | 4/2002 | Tsunashima et al. | |
| 6,737,309 B2 | 5/2004 | Matsuo | |
| 6,964,893 B2 | 11/2005 | Matsuo | |
| 6,992,357 B2 | 1/2006 | Matsuo et al. | |
| 7,172,955 B2 | 2/2007 | Matsuo et al. | |
| 7,539,056 B2 | 5/2009 | Katsumata et al. | |
| 7,642,162 B2 | 1/2010 | Matsuo | |
| 7,679,133 B2 | 3/2010 | Son et al. | |
| 7,902,603 B2 | 3/2011 | Matsuo | |
| 2008/0073635 A1* | 3/2008 | Kiyotoshi et al. | 257/2 |
| 2009/0152623 A1 | 6/2009 | Goto et al. | |
| 2009/0267155 A1 | 10/2009 | Izumida et al. | |
| 2011/0068401 A1 | 3/2011 | Izumida et al. | |
| 2012/0217572 A1* | 8/2012 | Shin et al. | 257/324 |
| 2013/0161727 A1* | 6/2013 | Kim et al. | 257/324 |

FOREIGN PATENT DOCUMENTS

| | | |
|---|---|---|
| JP | 2007-266143 | 10/2007 |
| JP | 2008-066562 | 3/2008 |
| JP | 2008-078404 | 4/2008 |
| JP | 2008-186868 | 8/2008 |
| JP | 2009-146954 | 7/2009 |
| WO | WO 2009/107241 A1 | 9/2009 |

* cited by examiner

*Primary Examiner* — Eduardo A Rodela
(74) *Attorney, Agent, or Firm* — Finnegan, Henderson, Farabow, Garrett & Dunner, LLP

(57) ABSTRACT

According to one embodiment, a nonvolatile semiconductor memory includes control gates provided in an array form, the control gates passing through the first semiconductor layer, data recording layers between the first semiconductor layer and the control gates, two first conductive-type diffusion layers at two ends in the first direction of the first semiconductor layer, two second conductive-type diffusion layers at two ends in the second direction of the first semiconductor layer, select gate lines extending in the first direction on the first semiconductor layer, and word lines extending in the second direction on the select gate lines. The select gate lines function as select gates shared by select transistors connected between the control gates and the word lines arranged in the first direction. Each of the word lines is commonly connected to the control gates arranged in the second direction.

20 Claims, 388 Drawing Sheets

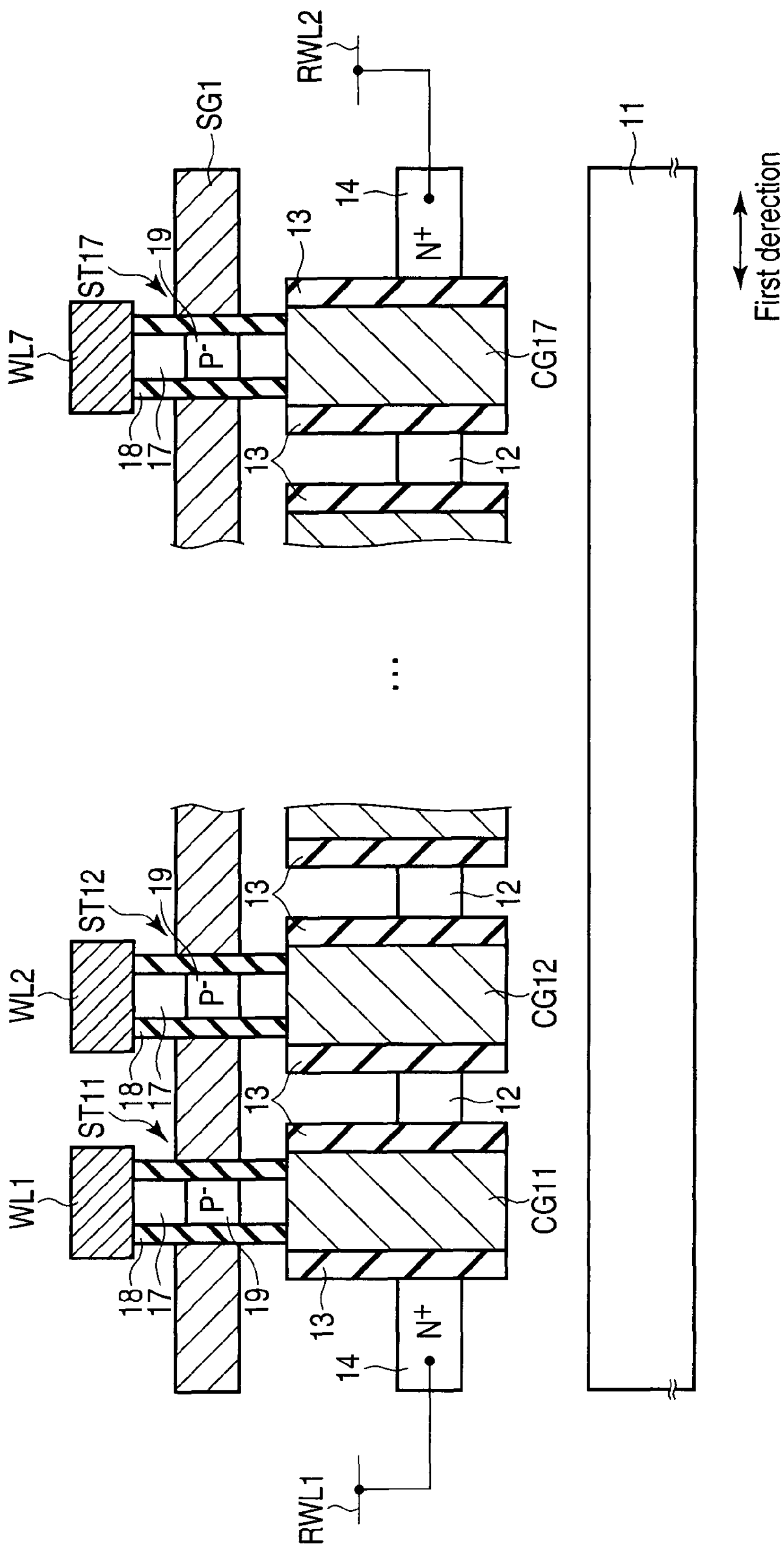
F I G. 2

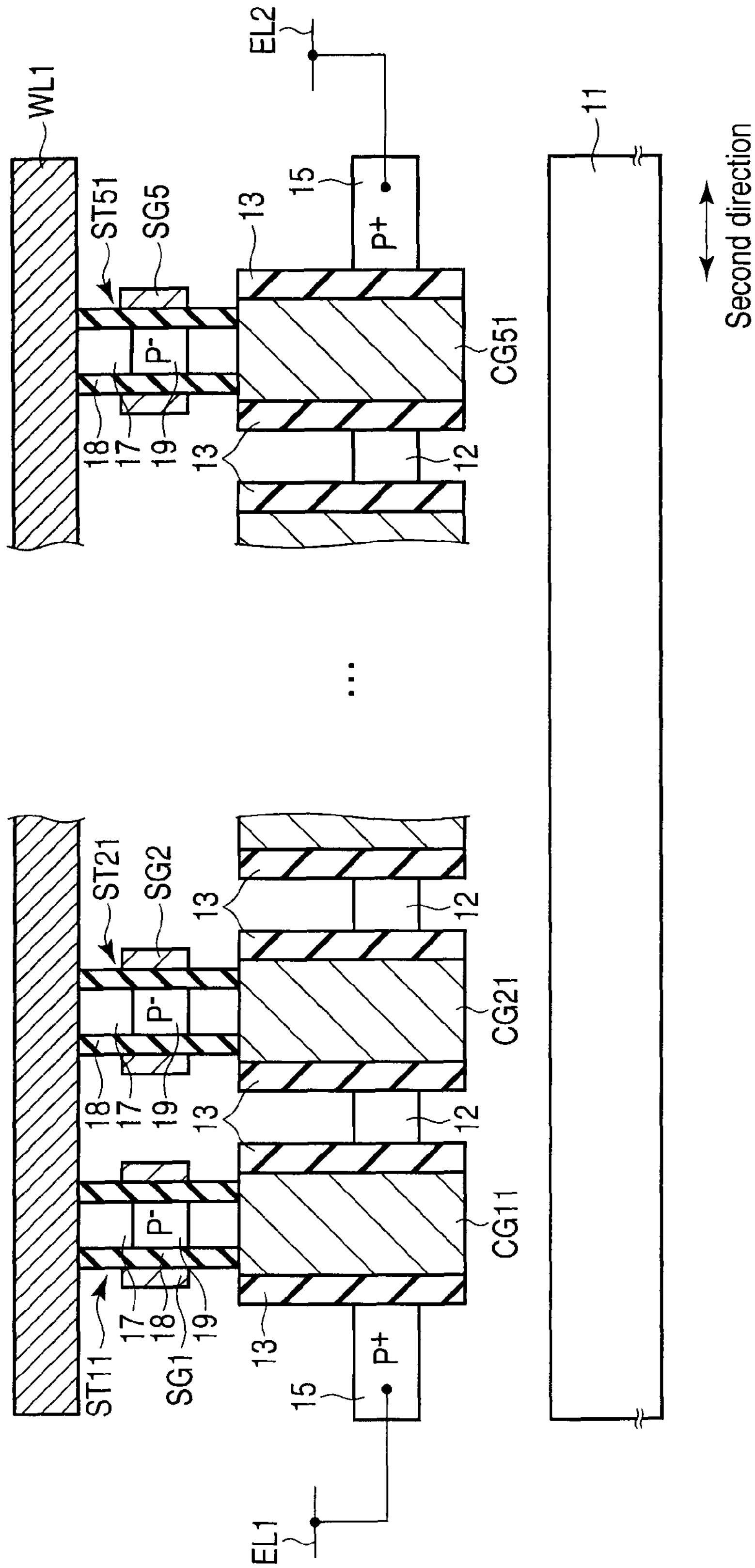
F I G. 3

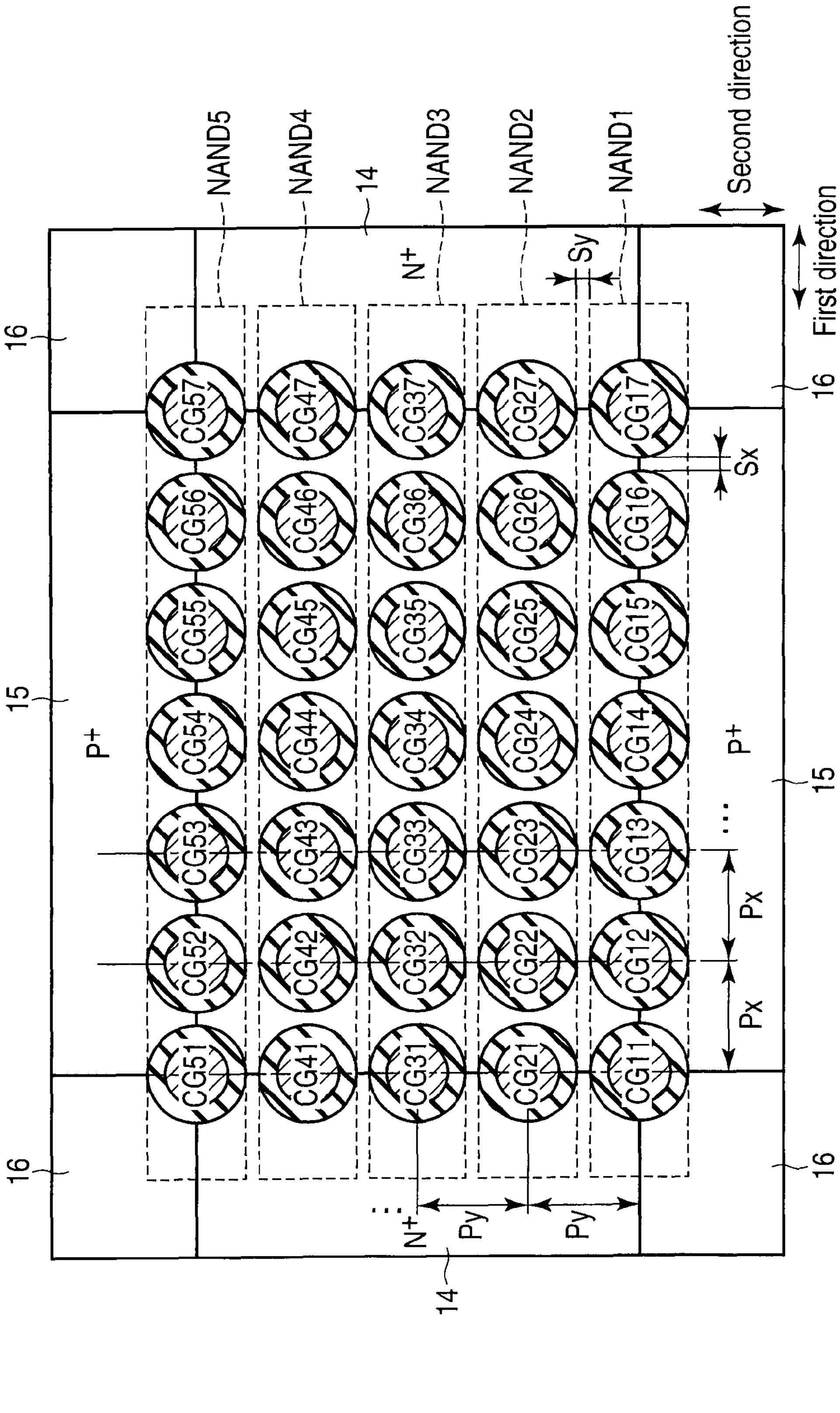
F I G. 4

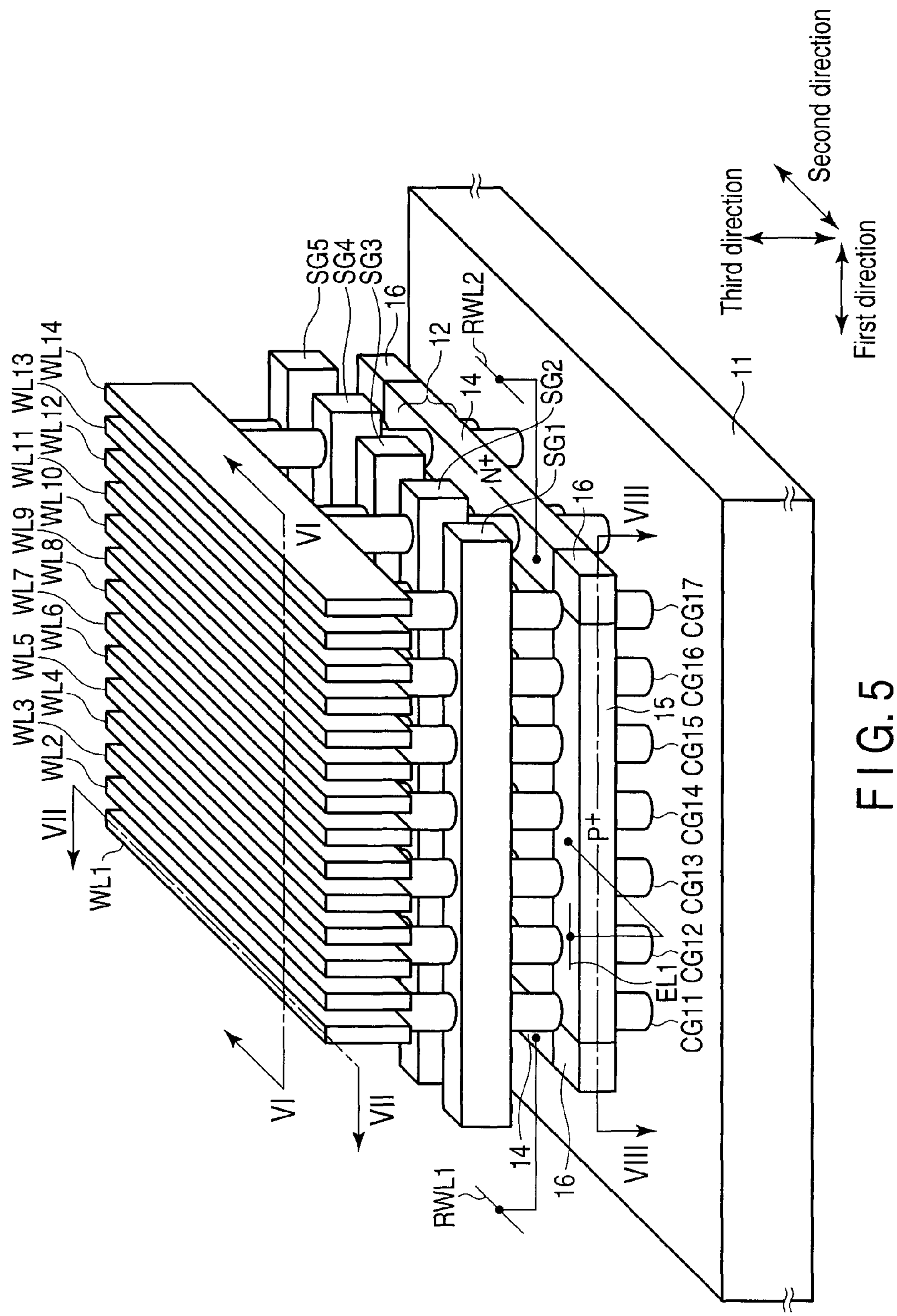
F I G. 5

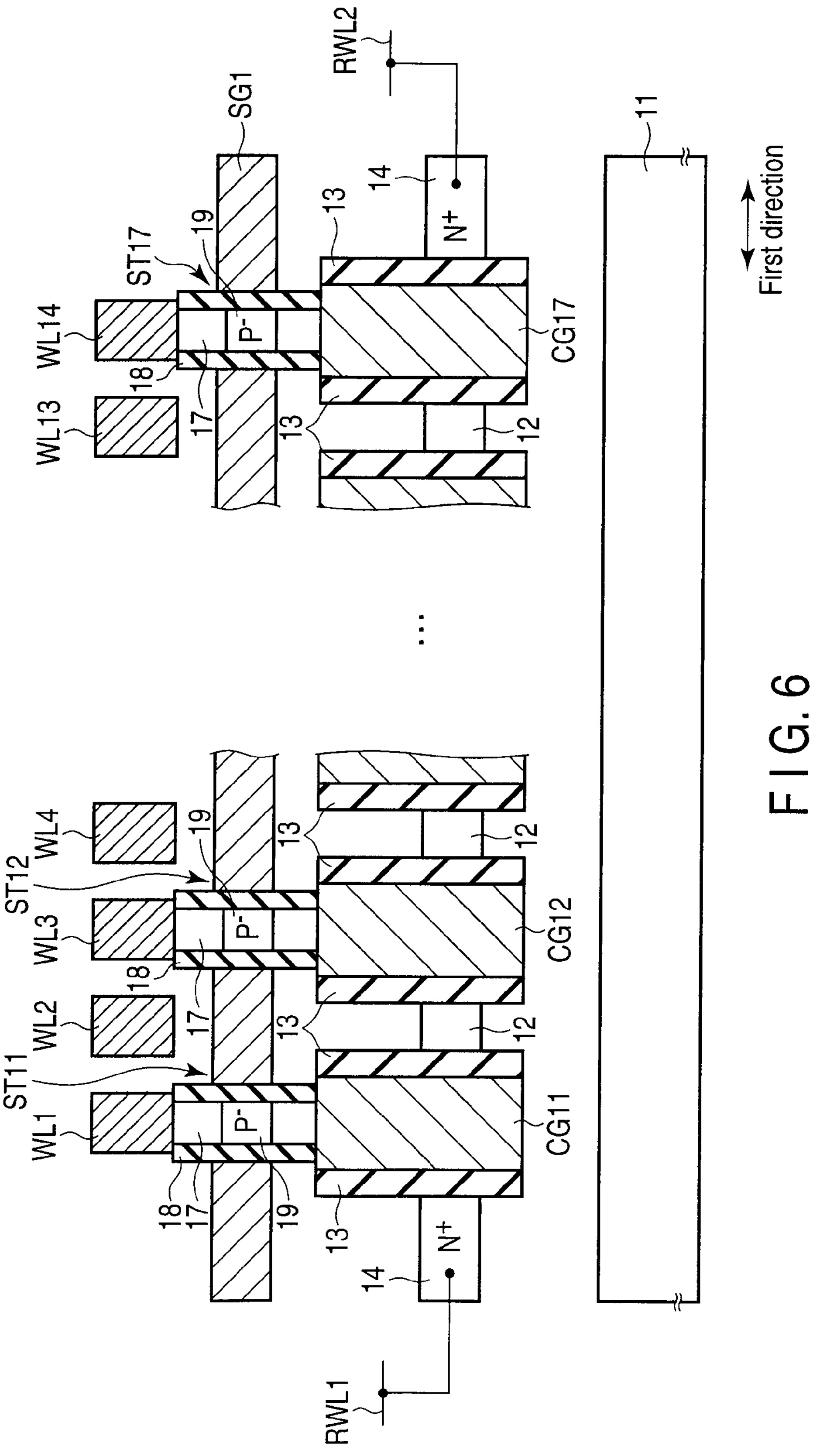
F I G. 6

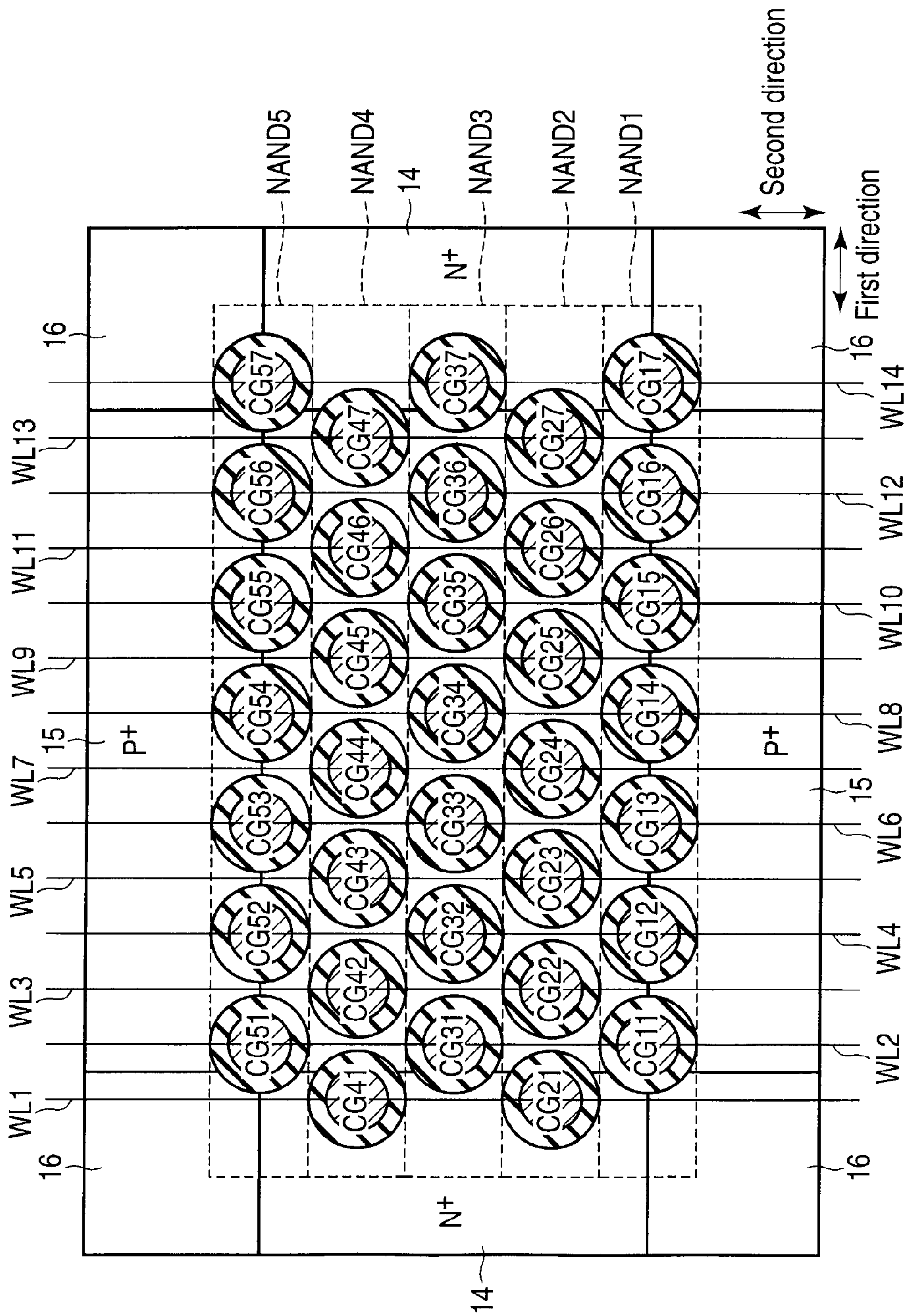
F I G. 9

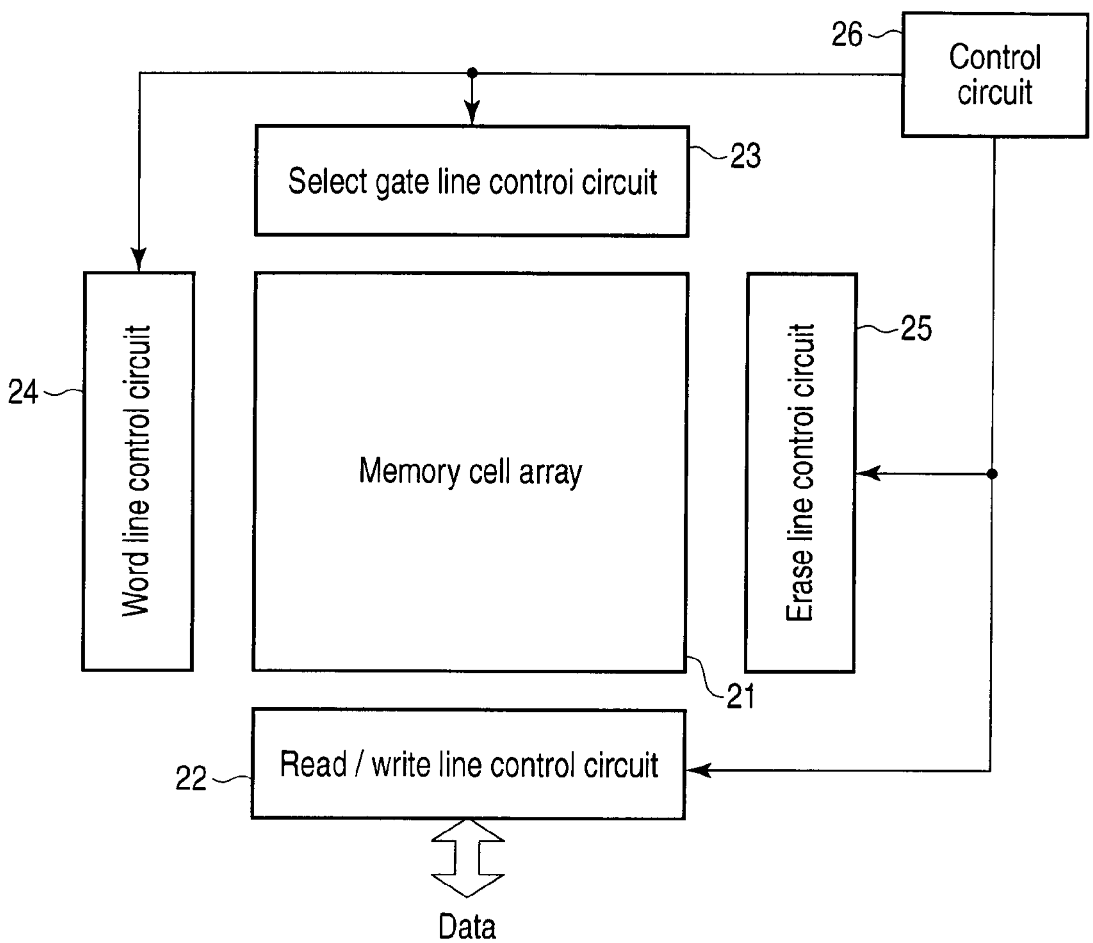
F I G. 1 4

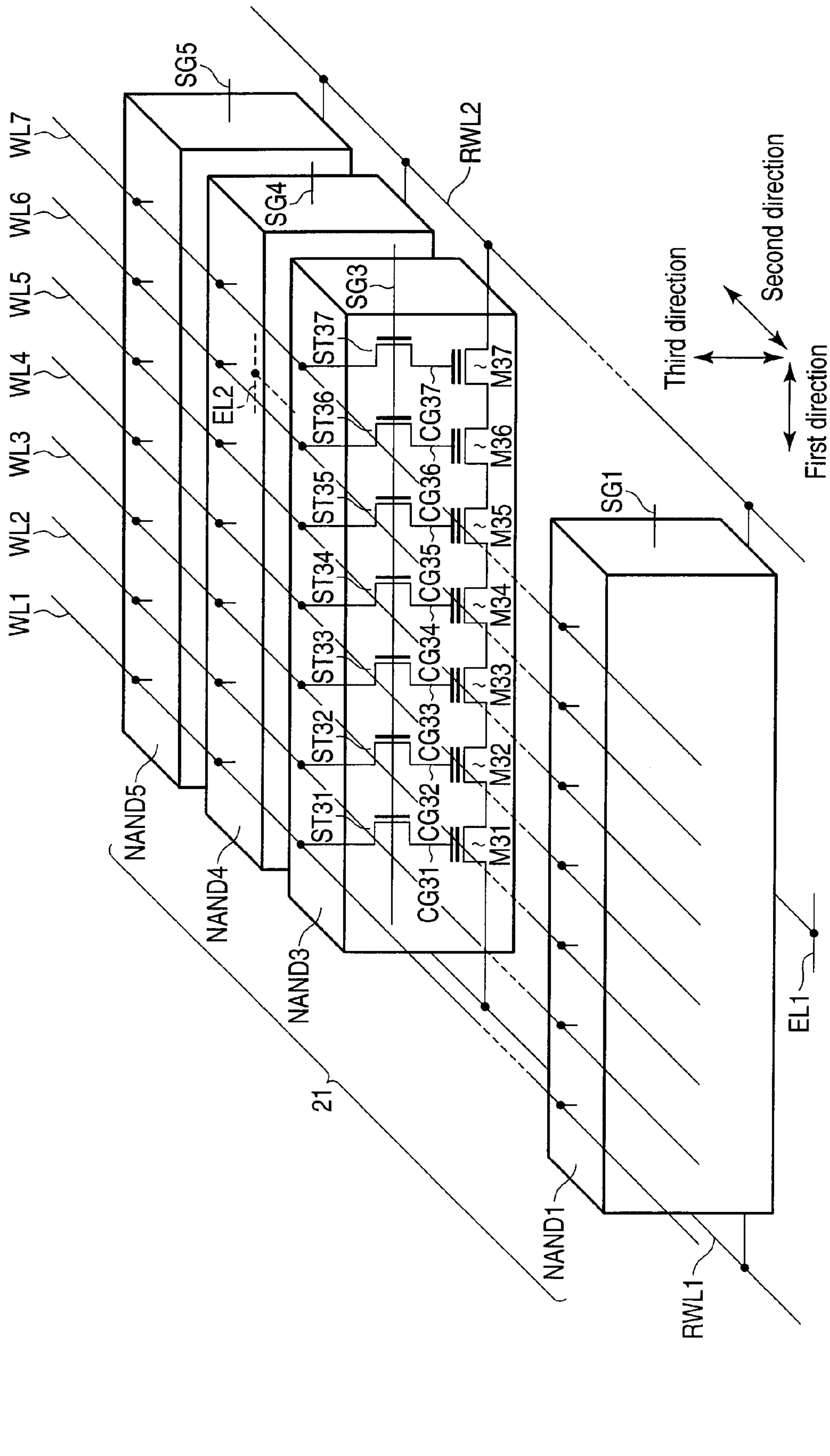
F I G. 1 5

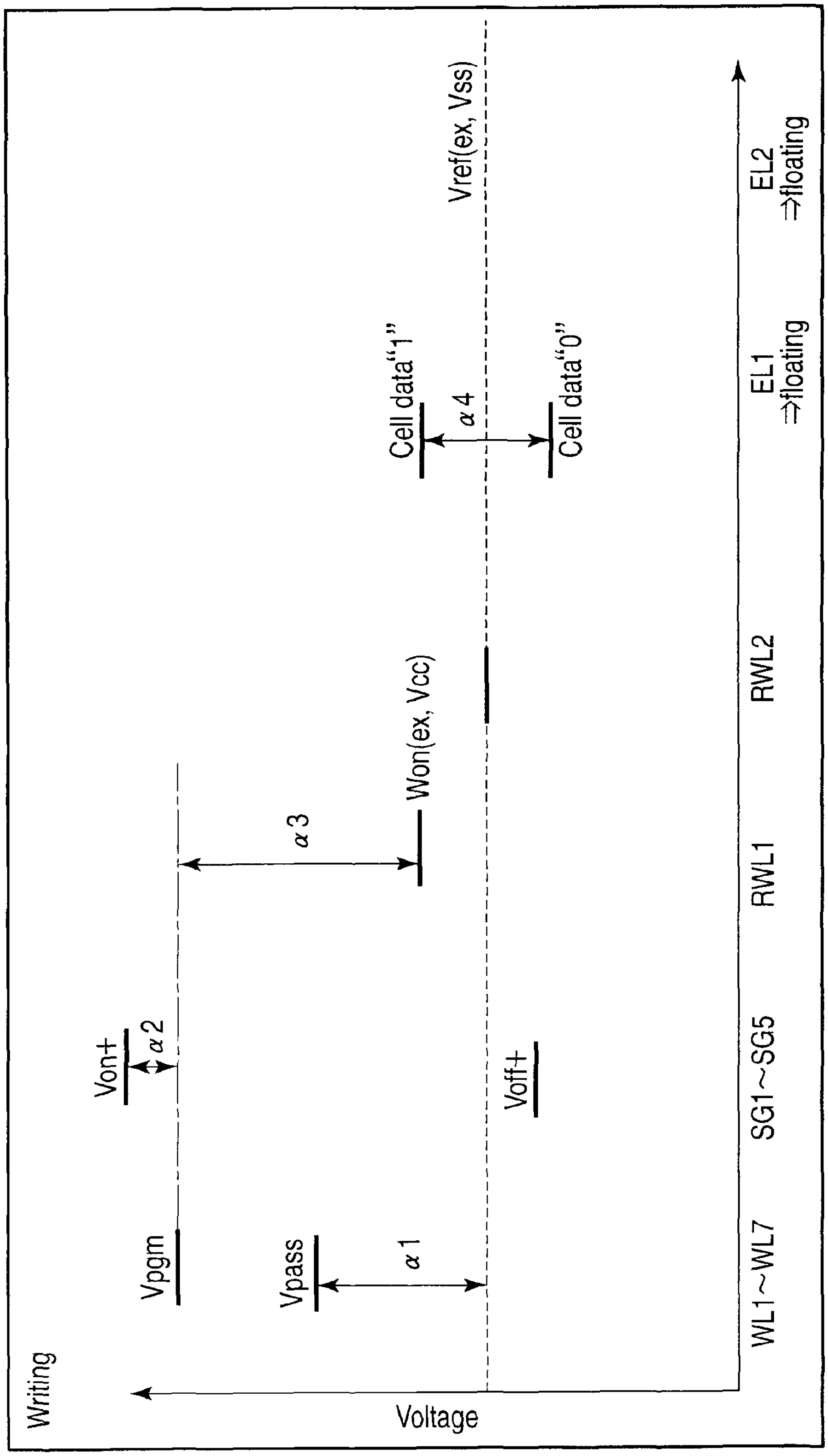
F I G. 1 7

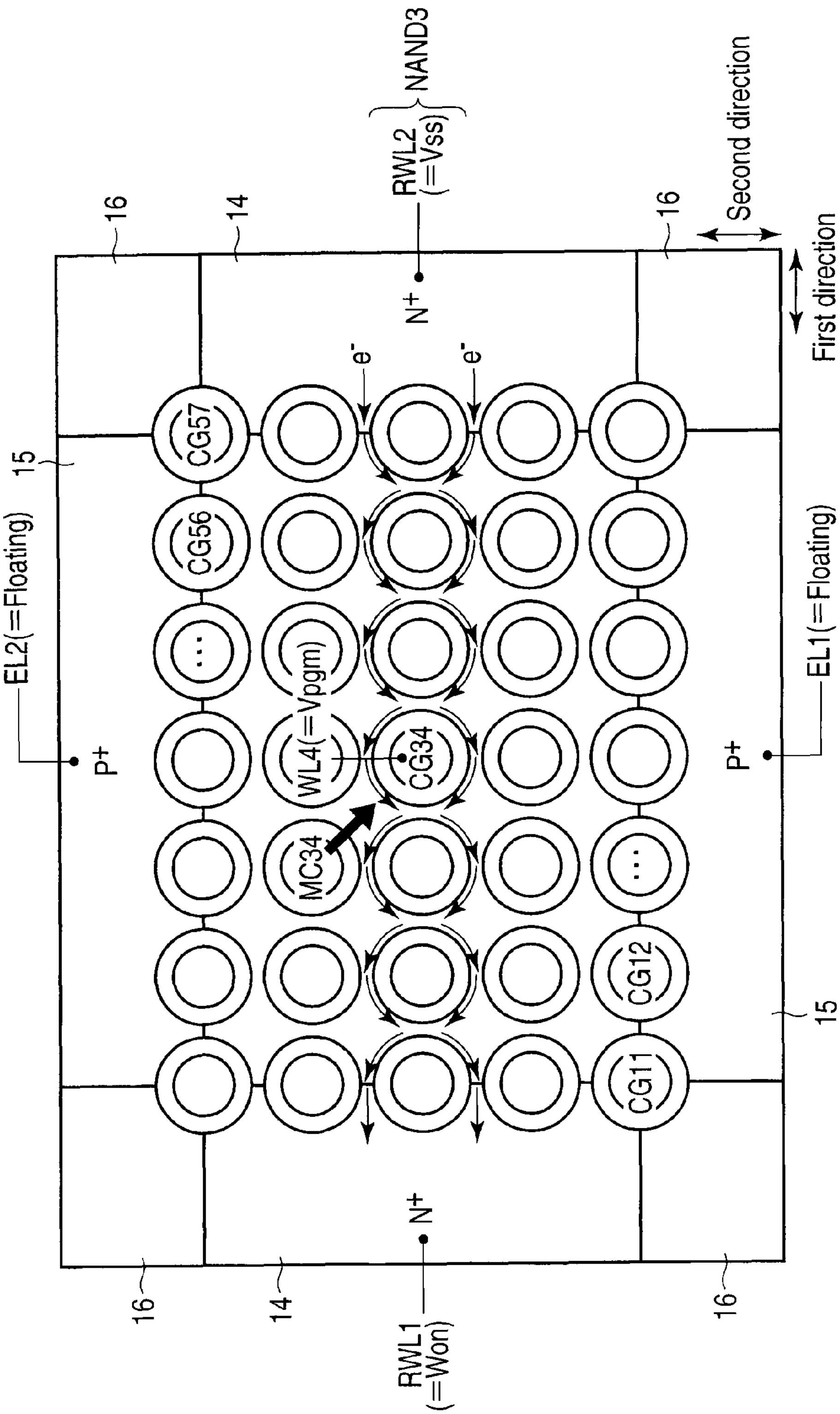
F I G. 1 9

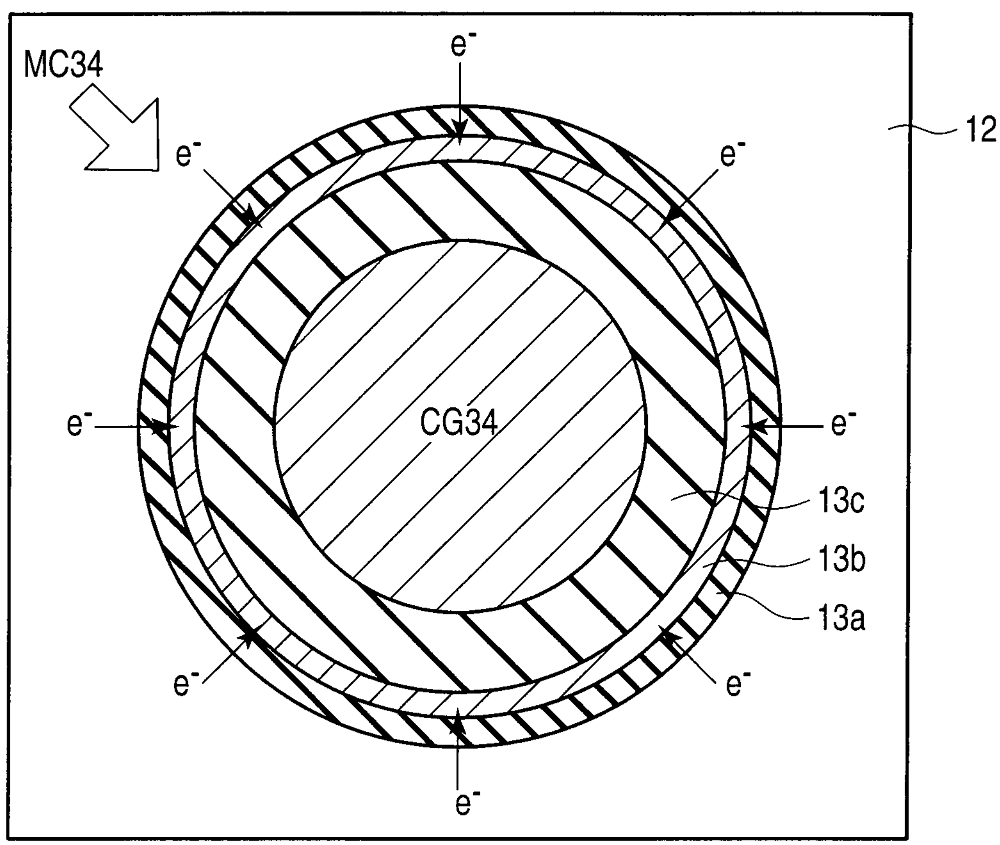
F I G. 2 0

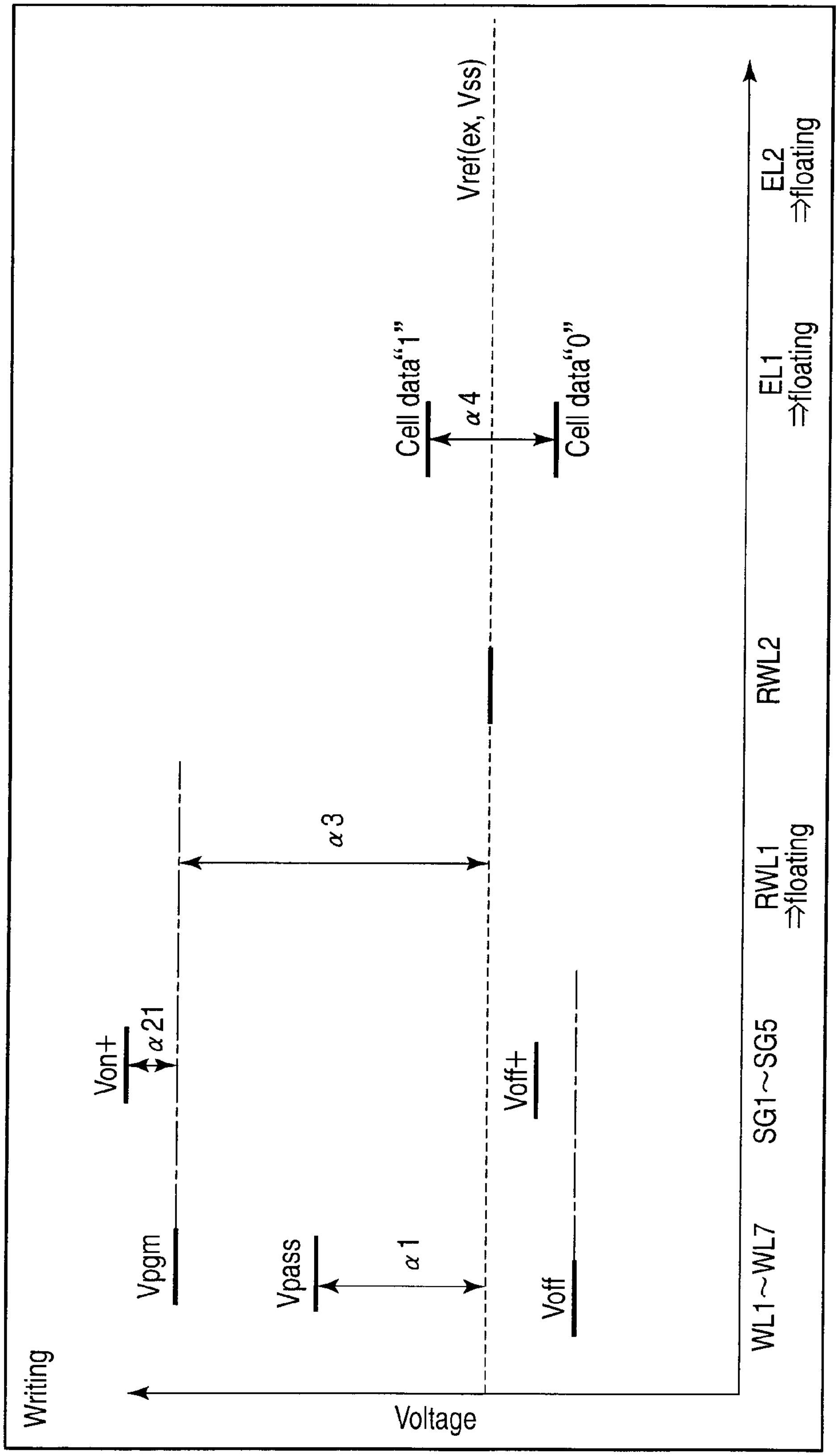
F I G. 2 4

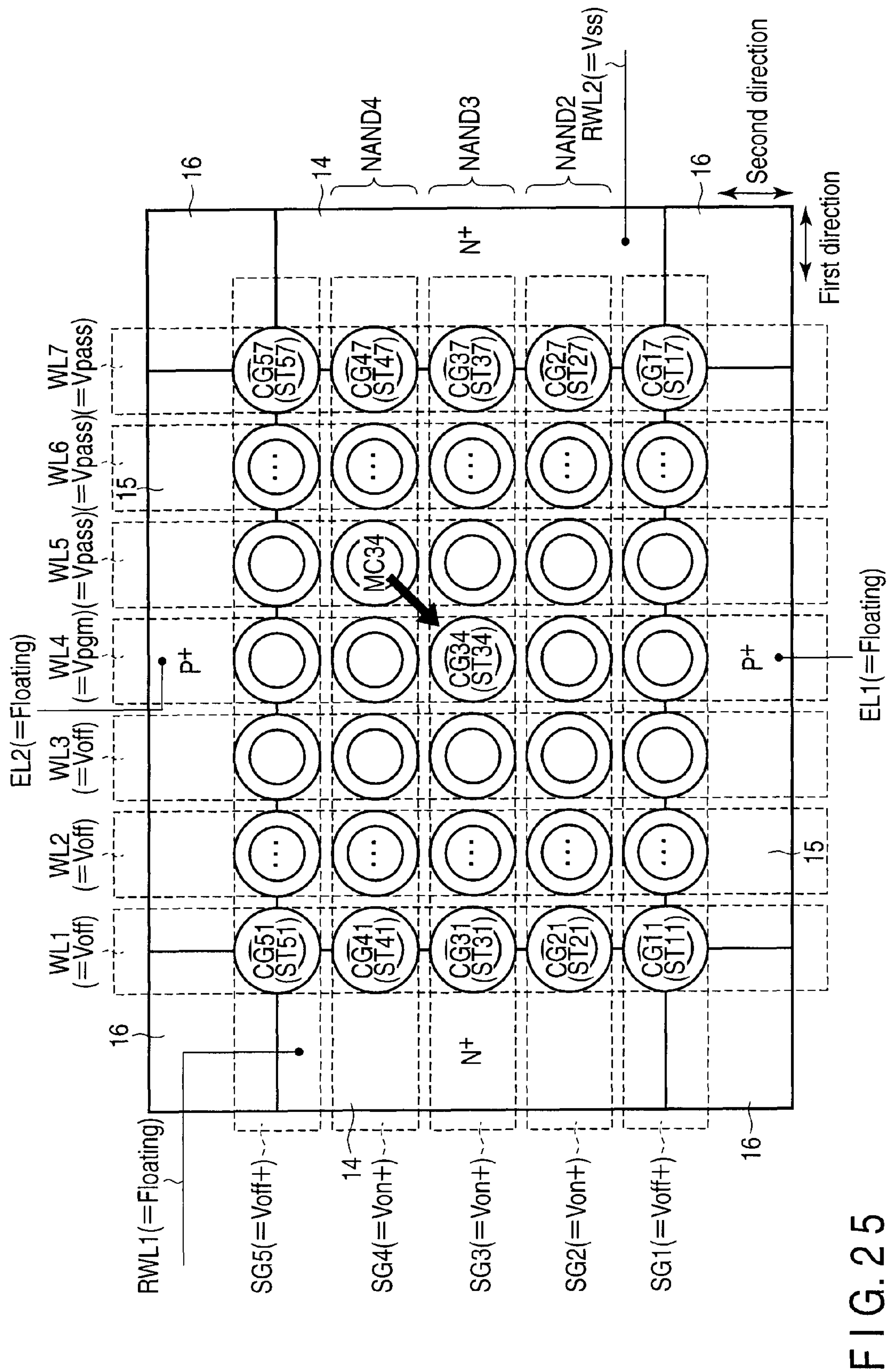
F I G. 2 5

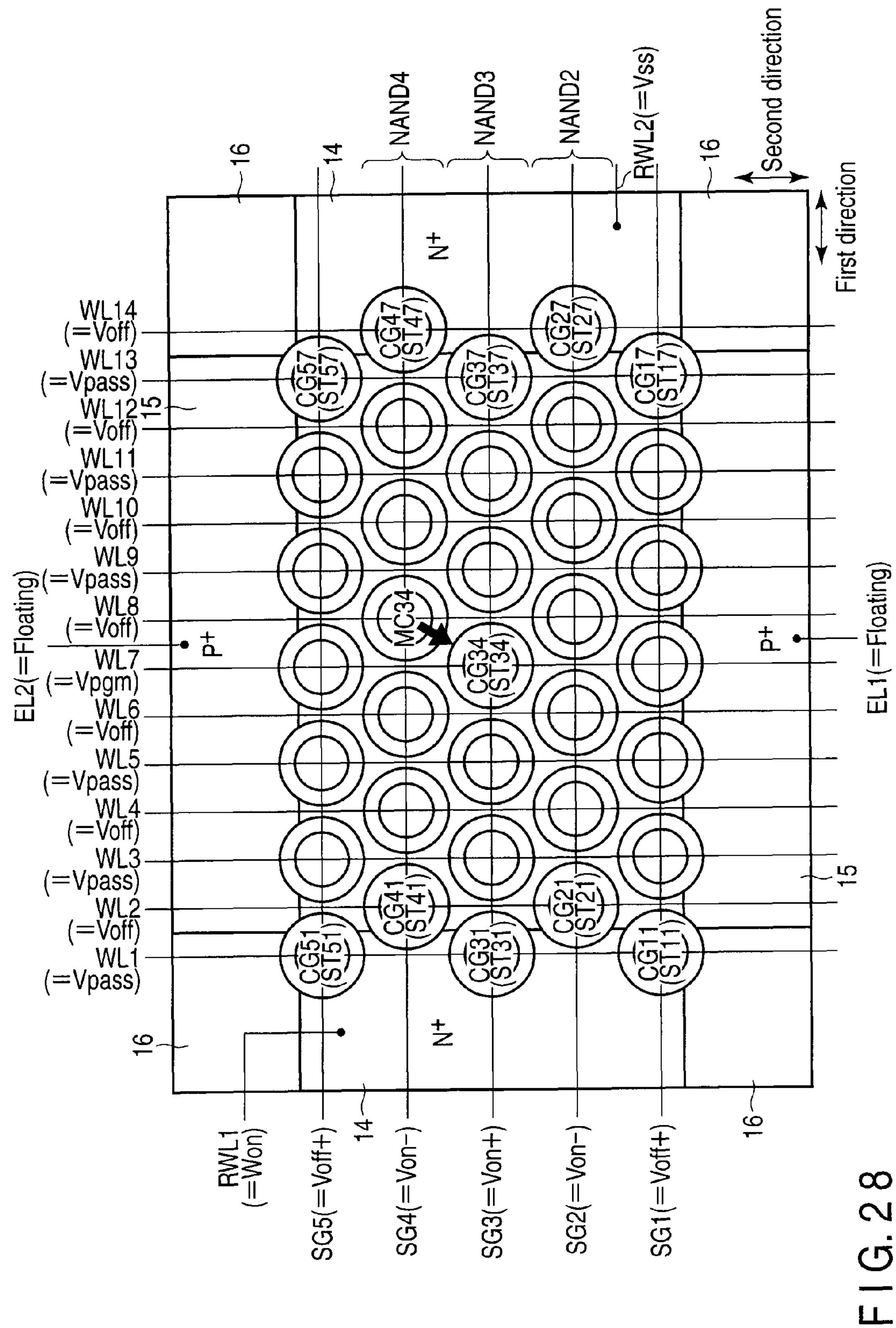
F I G. 2 8

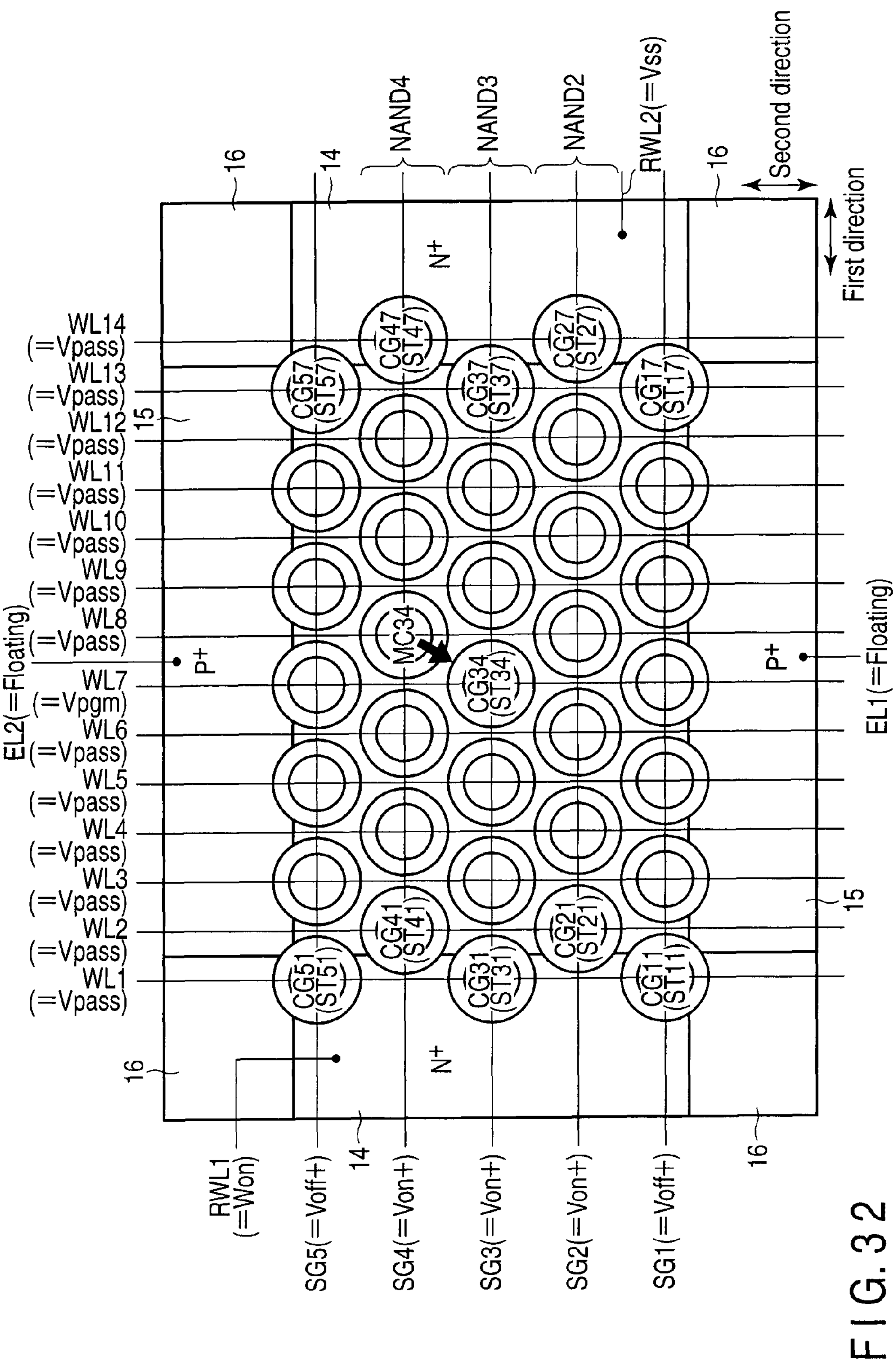
F I G. 3 2

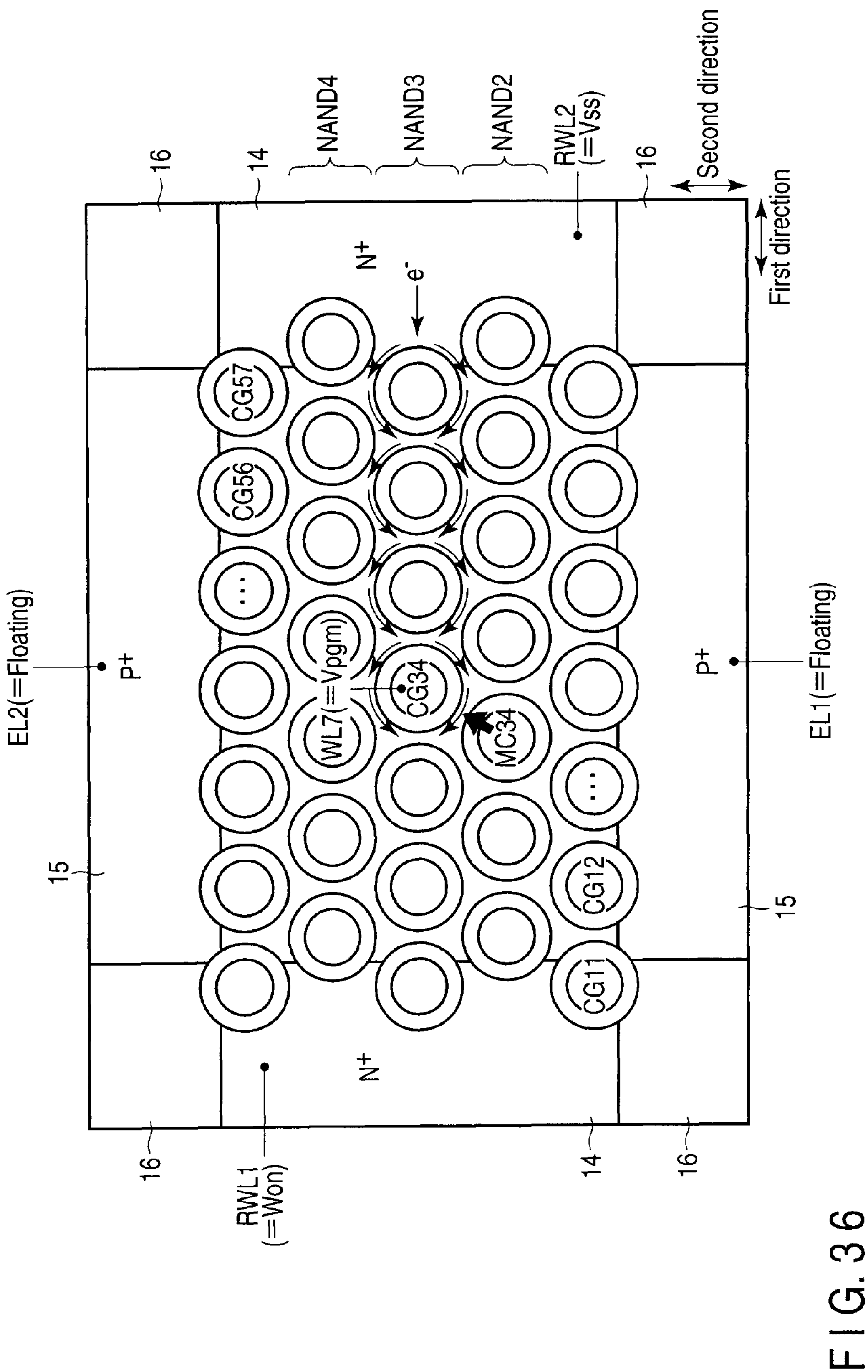
F I G. 3 6

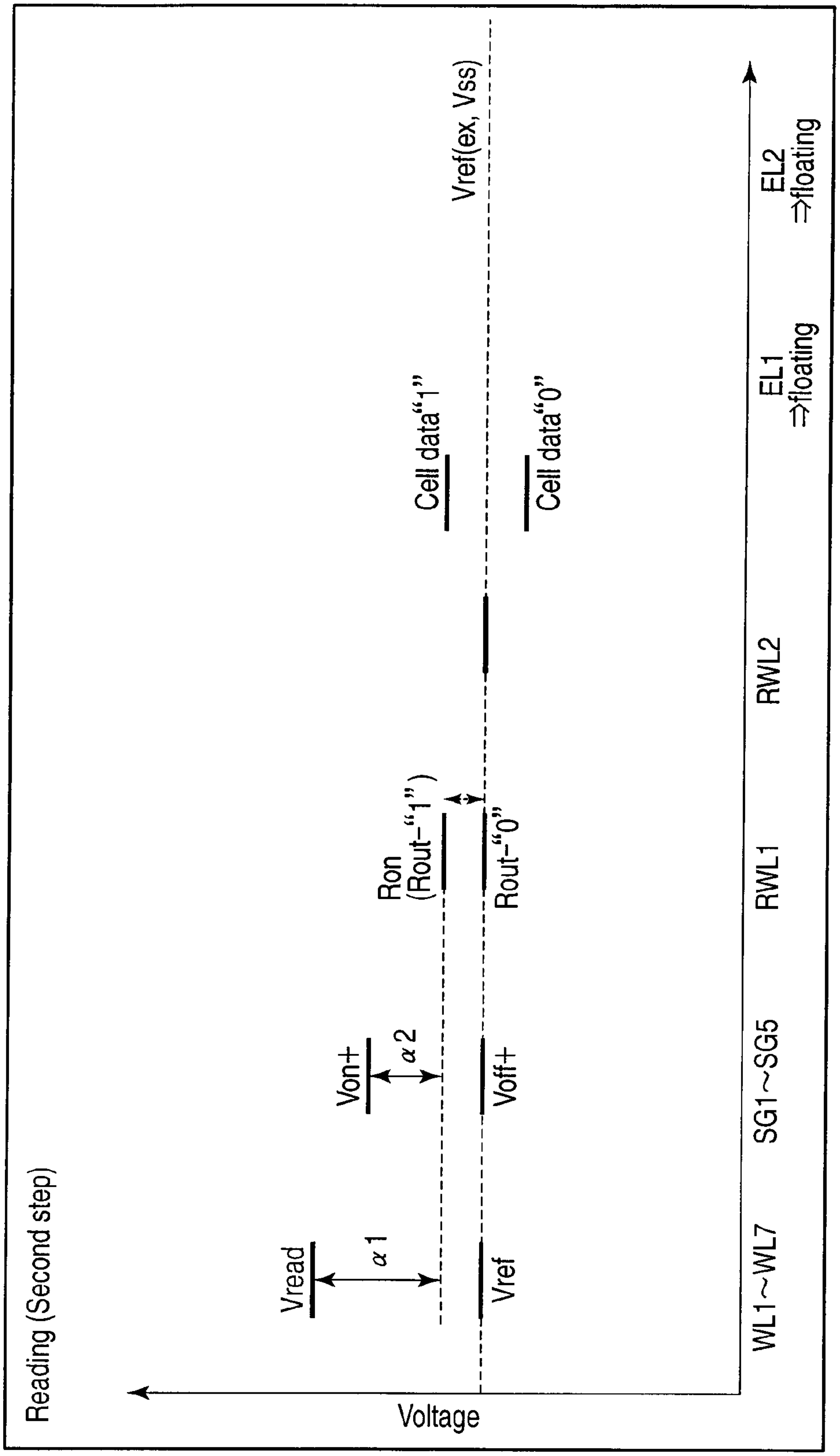
F I G. 4 2

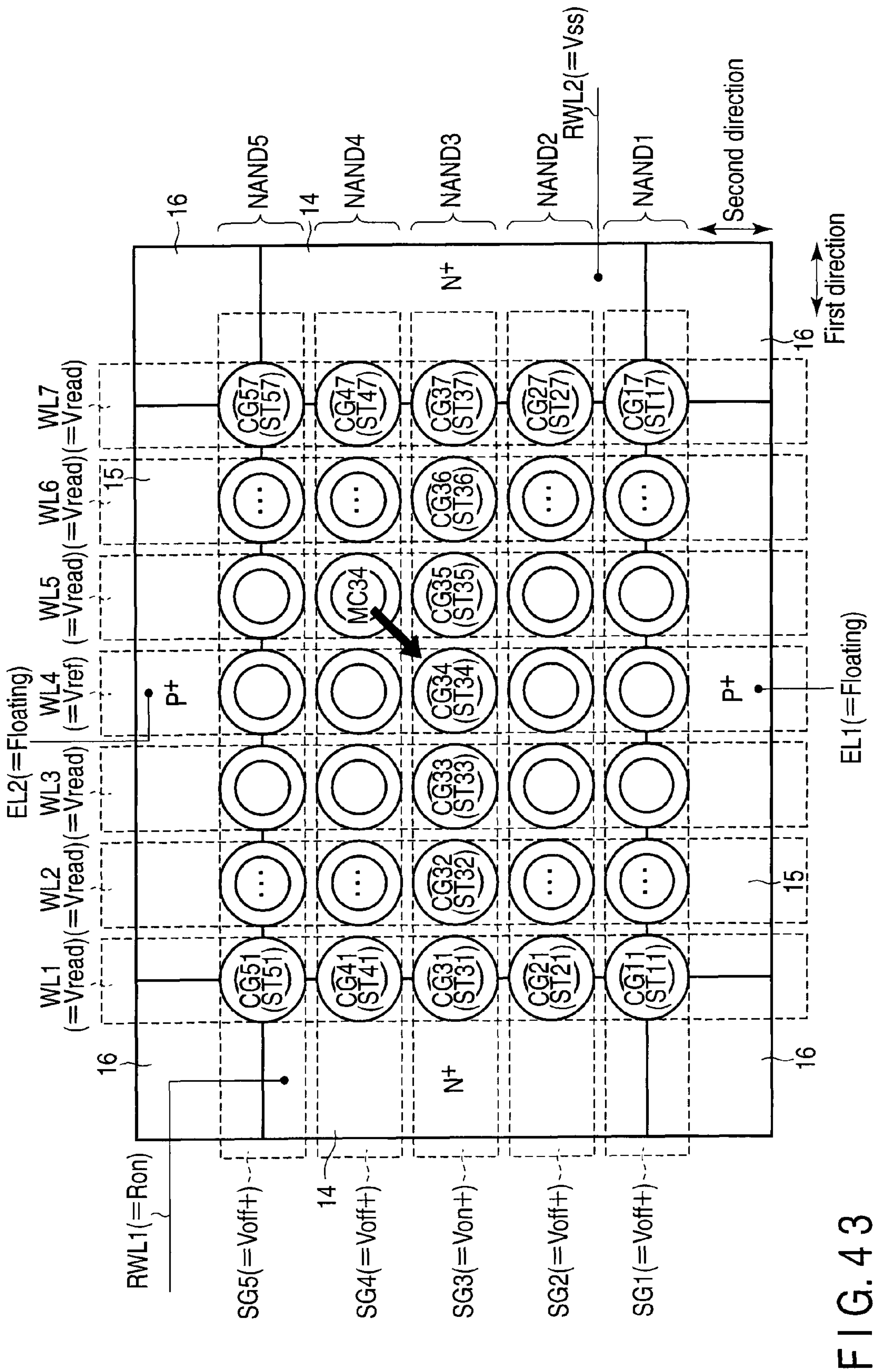
F I G. 4 3

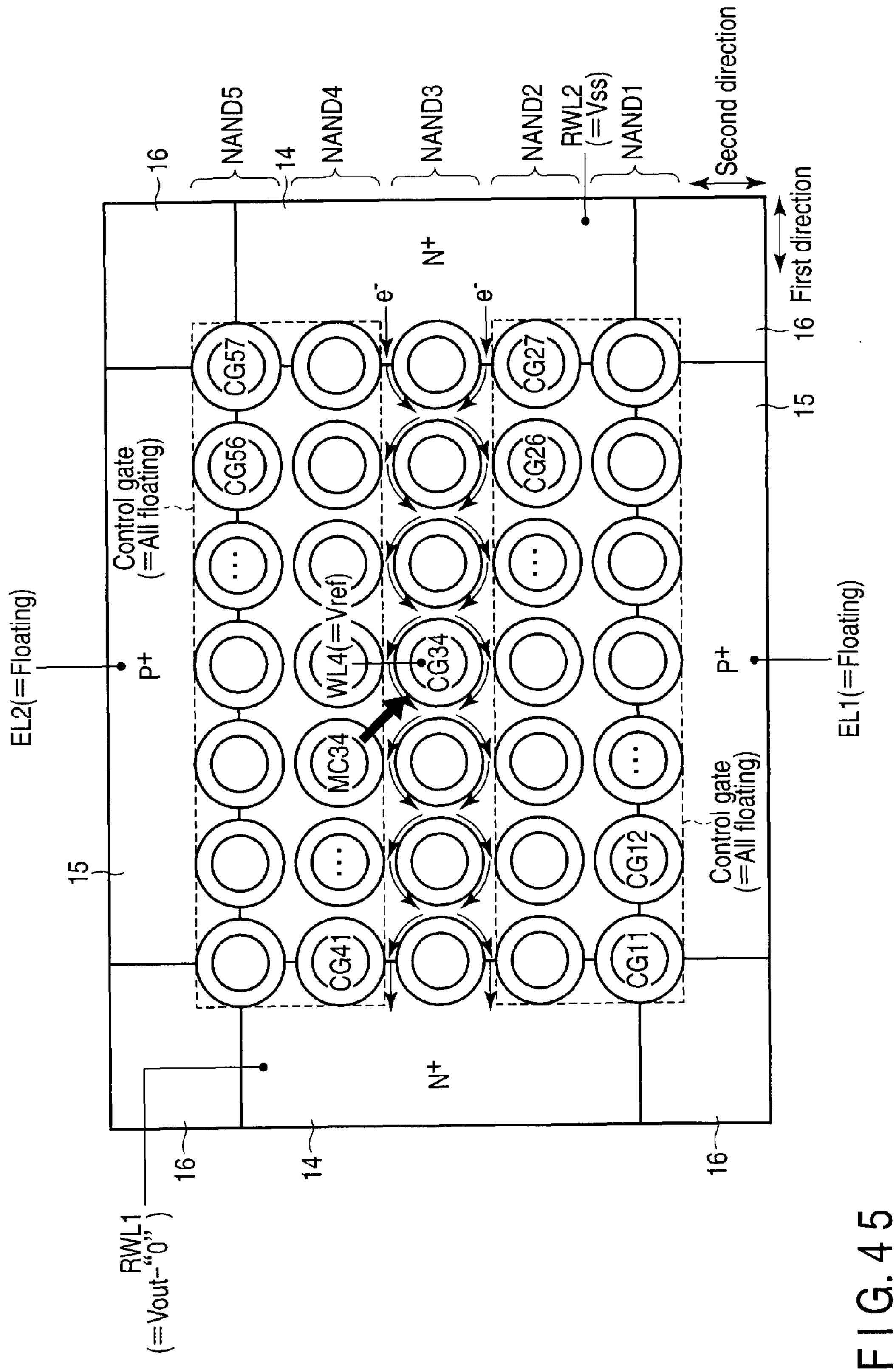
F I G. 4 5

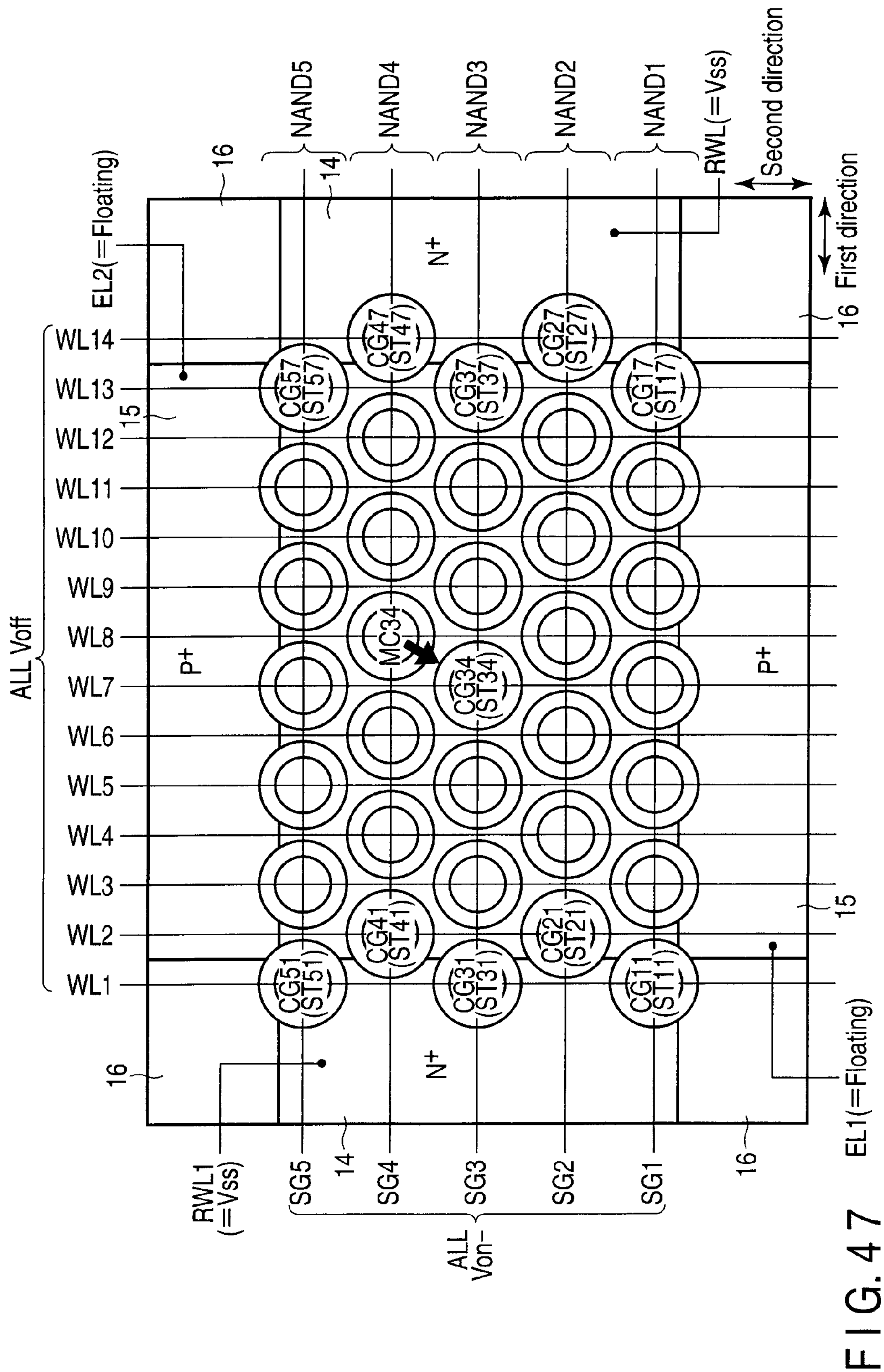
F I G. 4 7

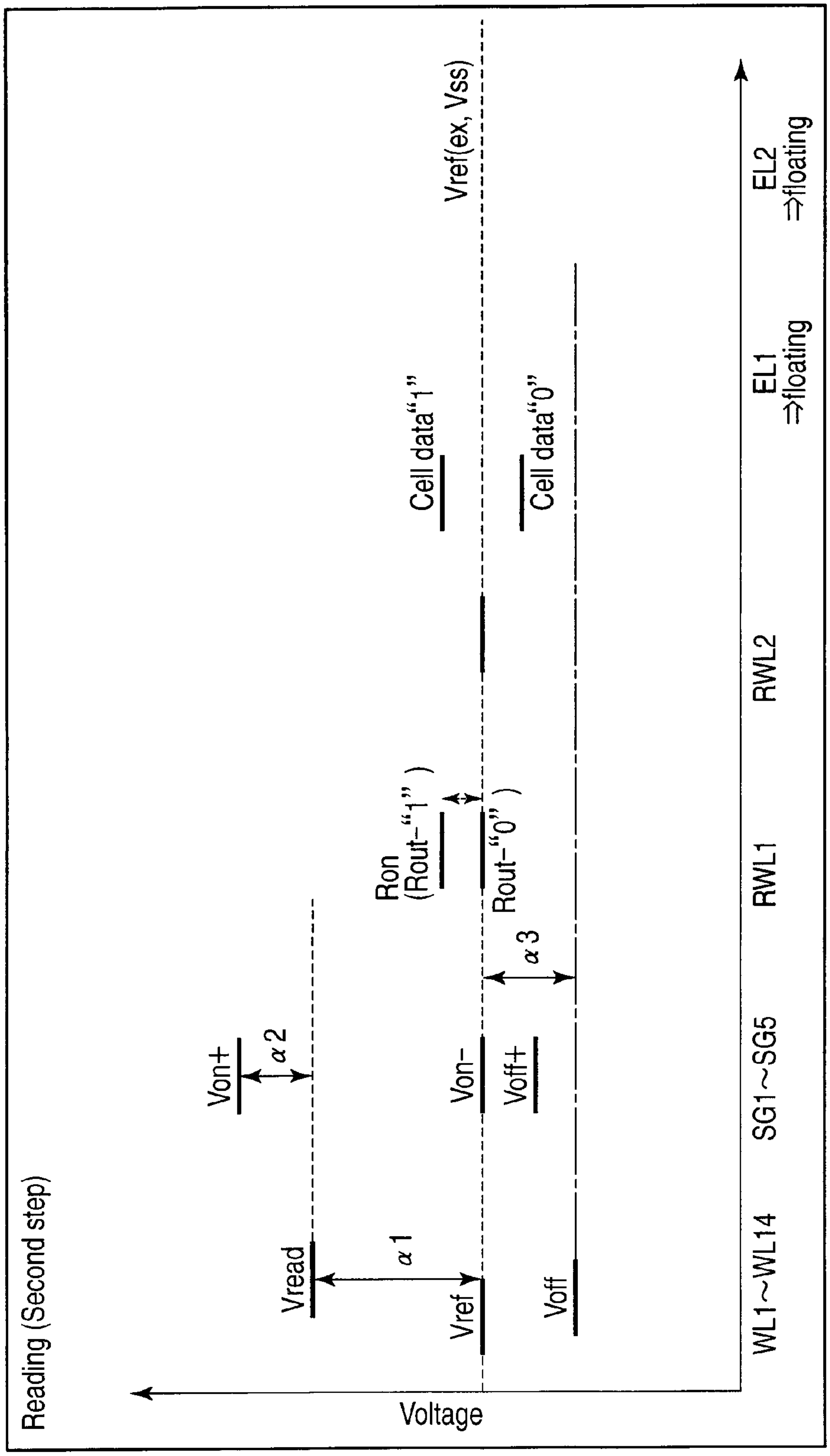
F I G. 4 8

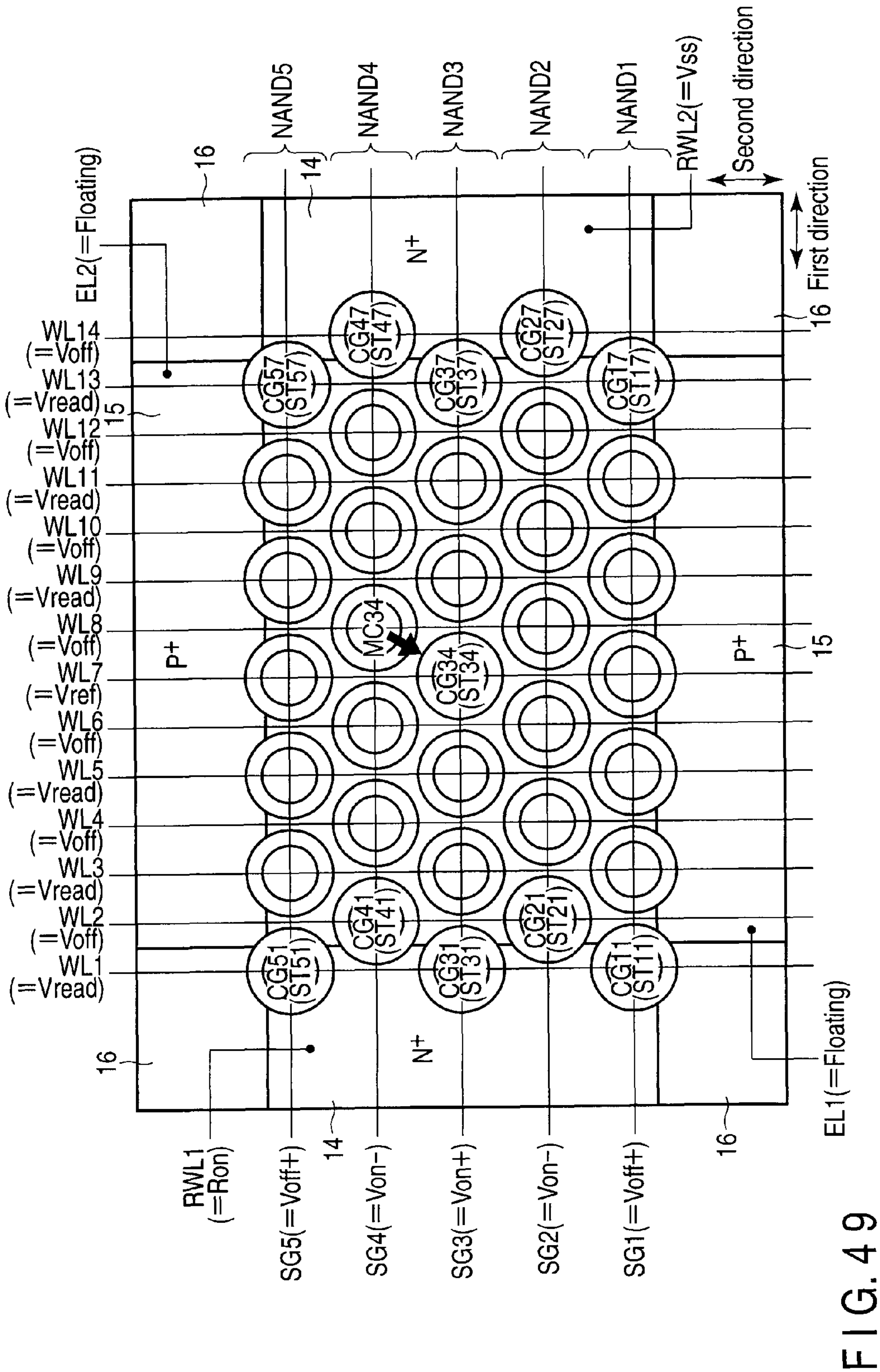
F I G. 4 9

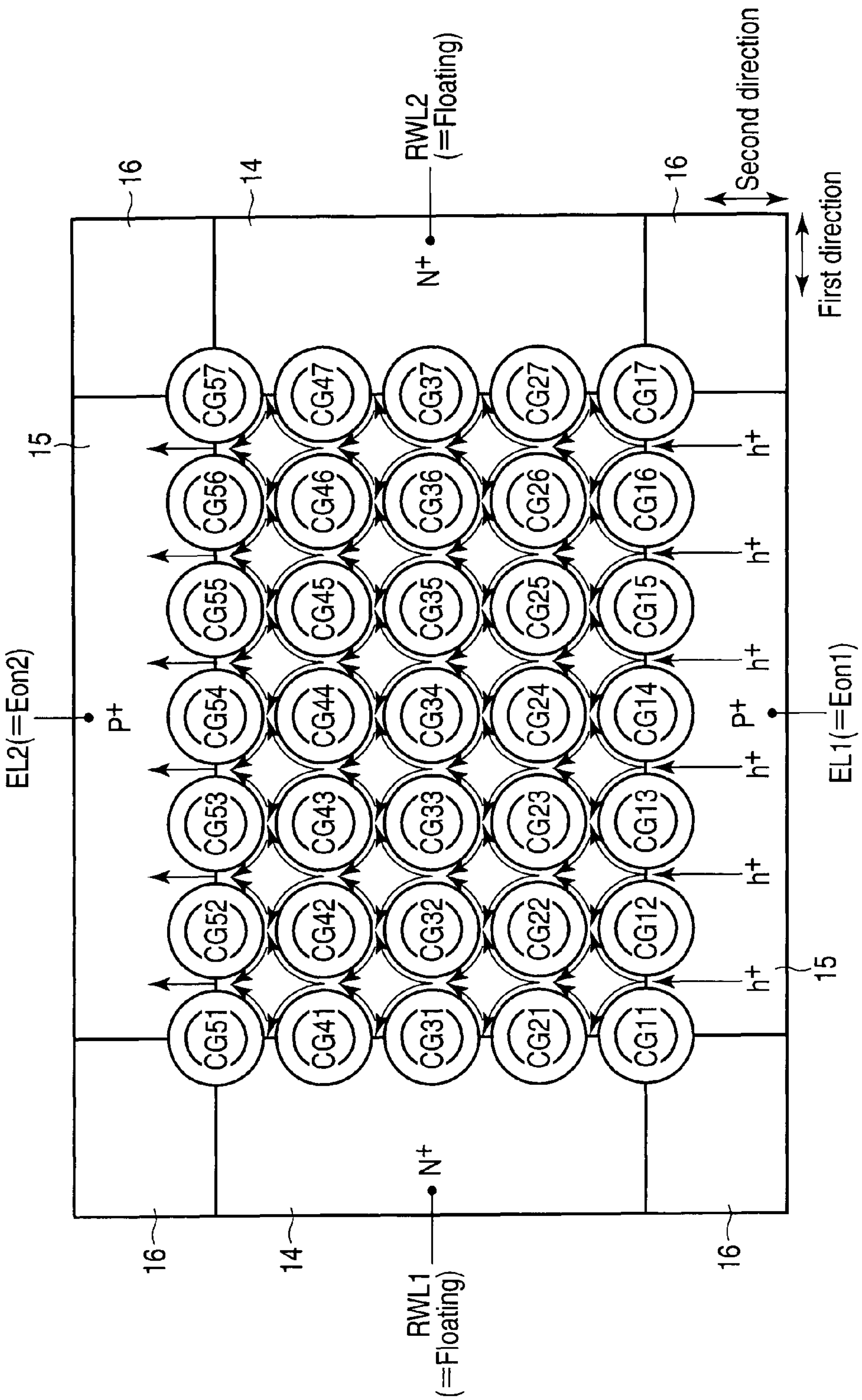
F I G. 5 5

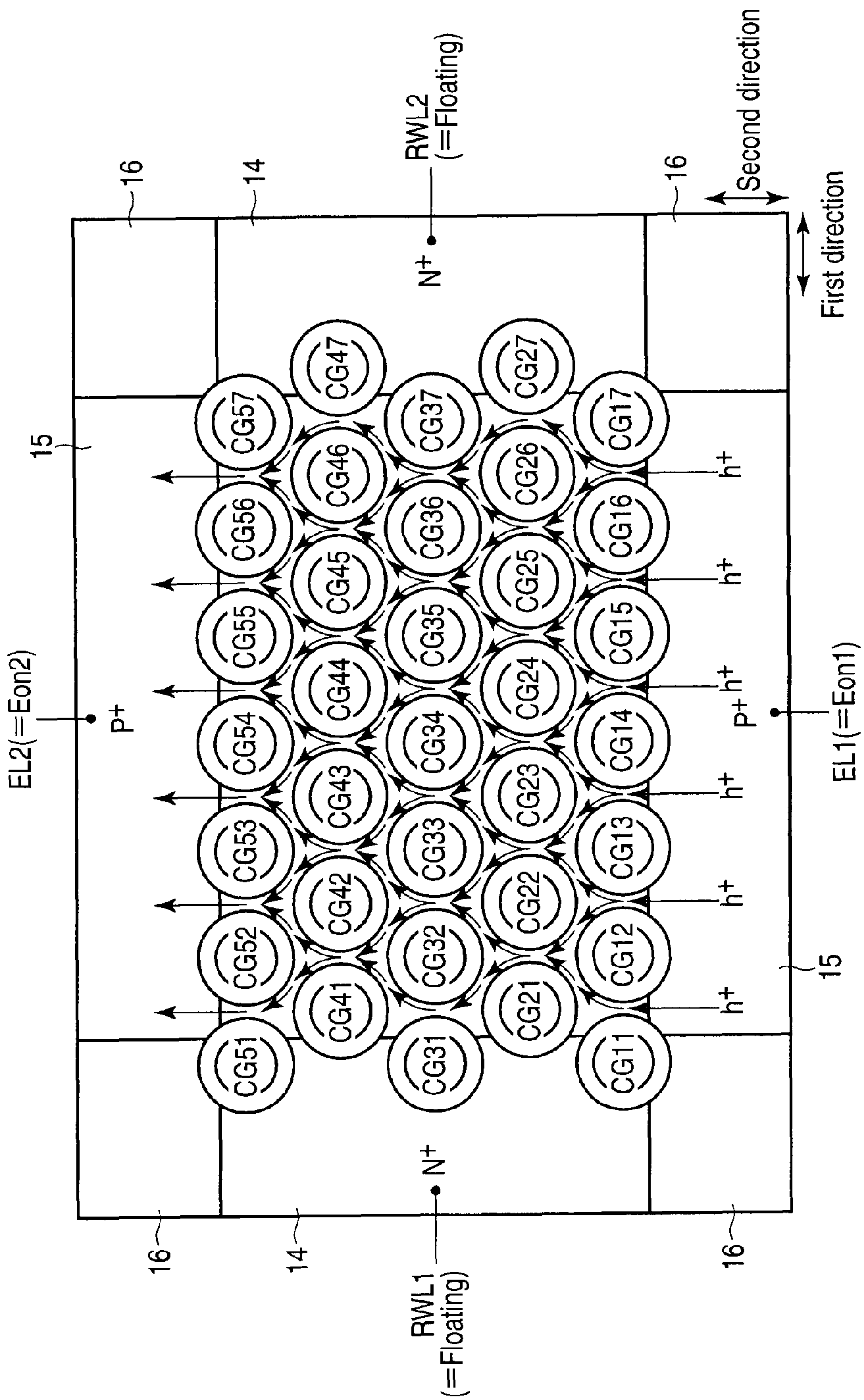
F I G. 5 9

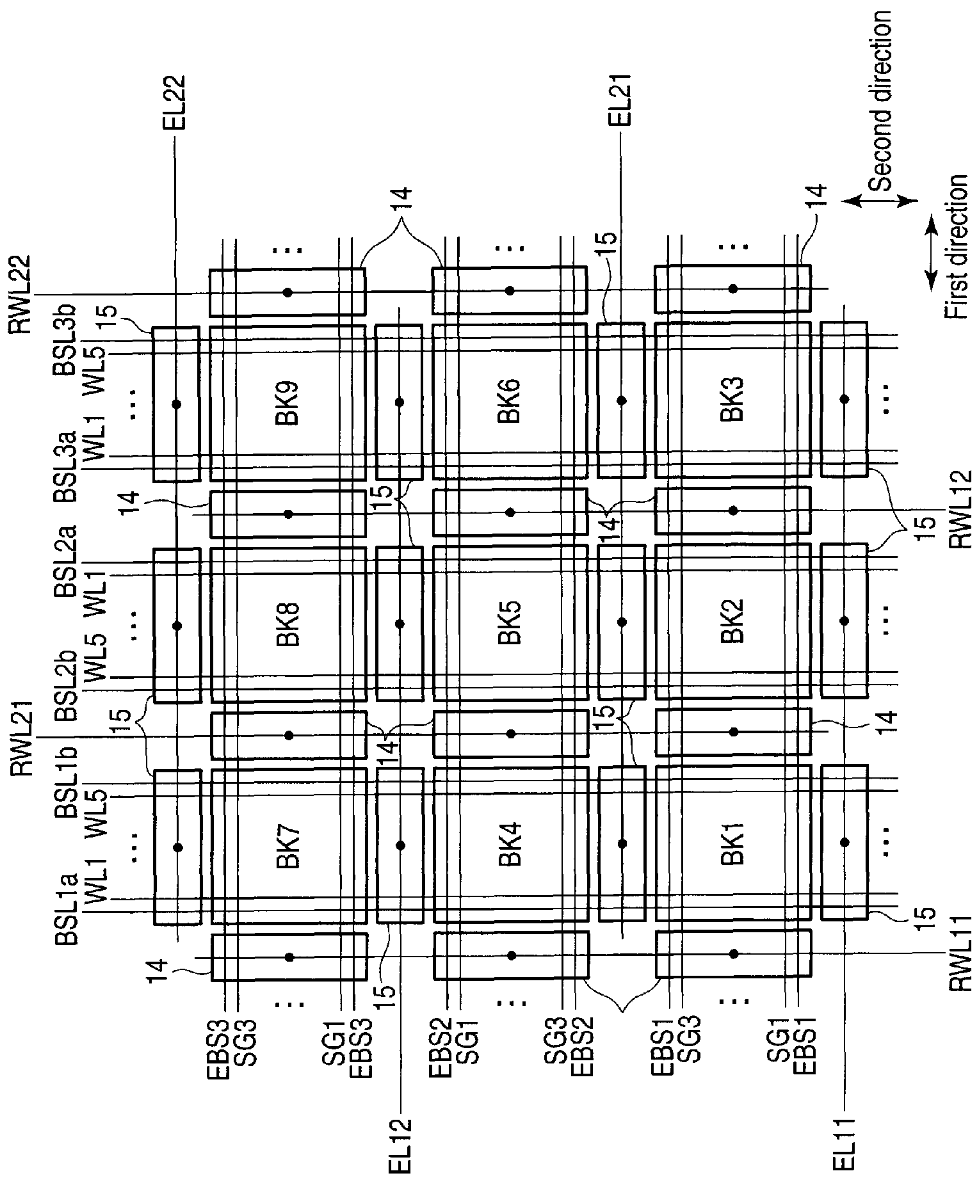
F I G. 6 3

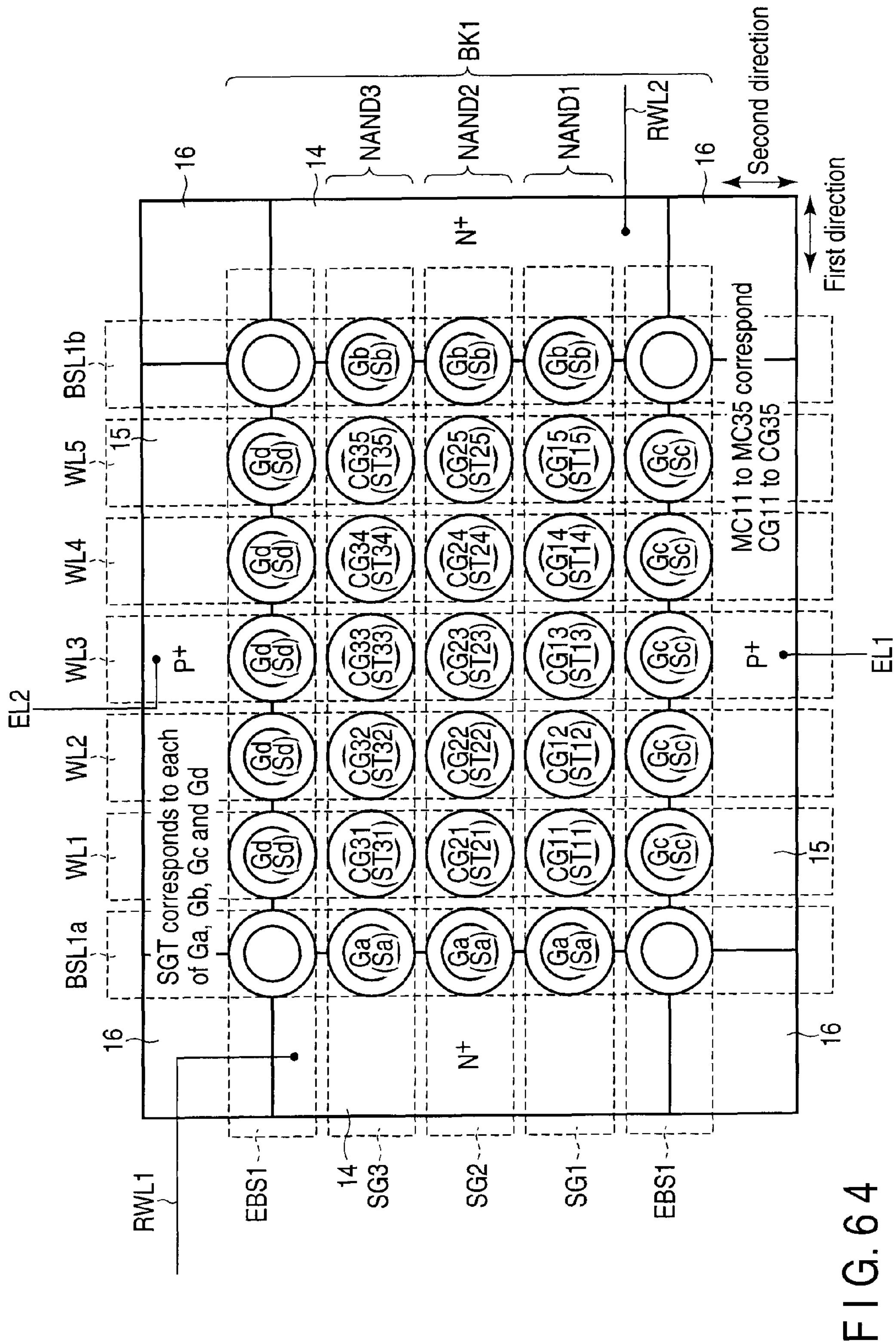
F I G. 6 4

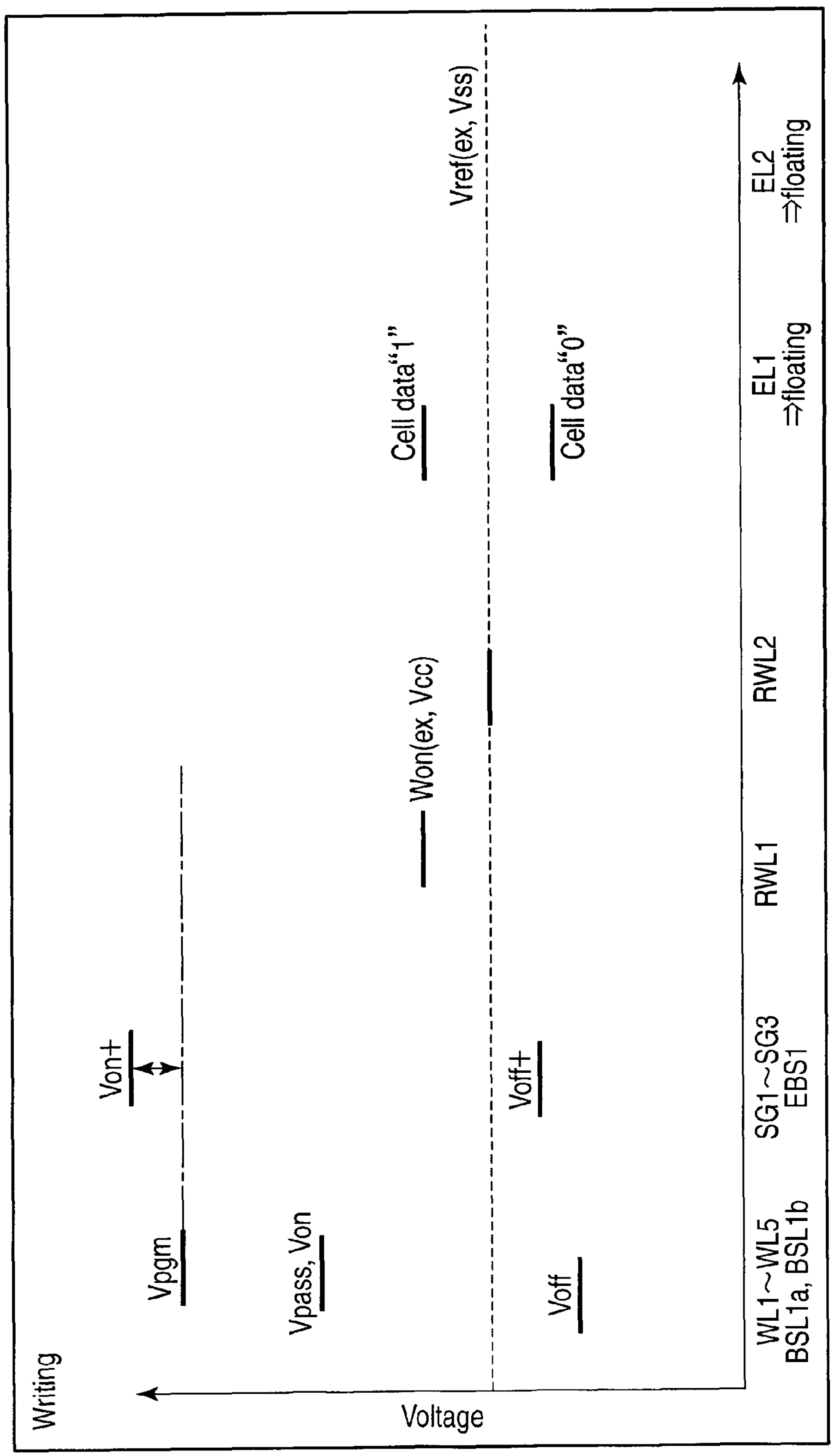
F I G. 6 5

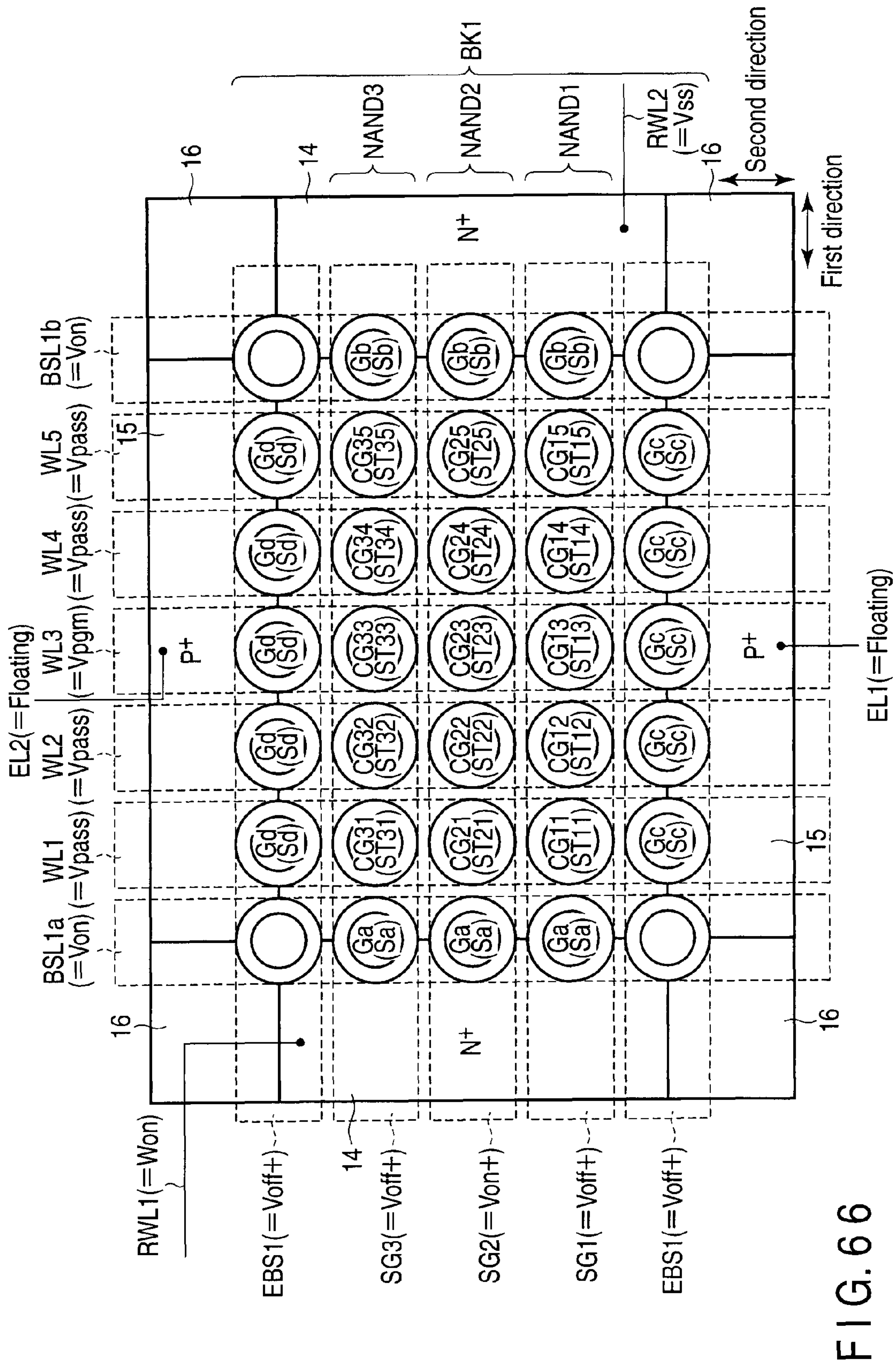
F I G. 66

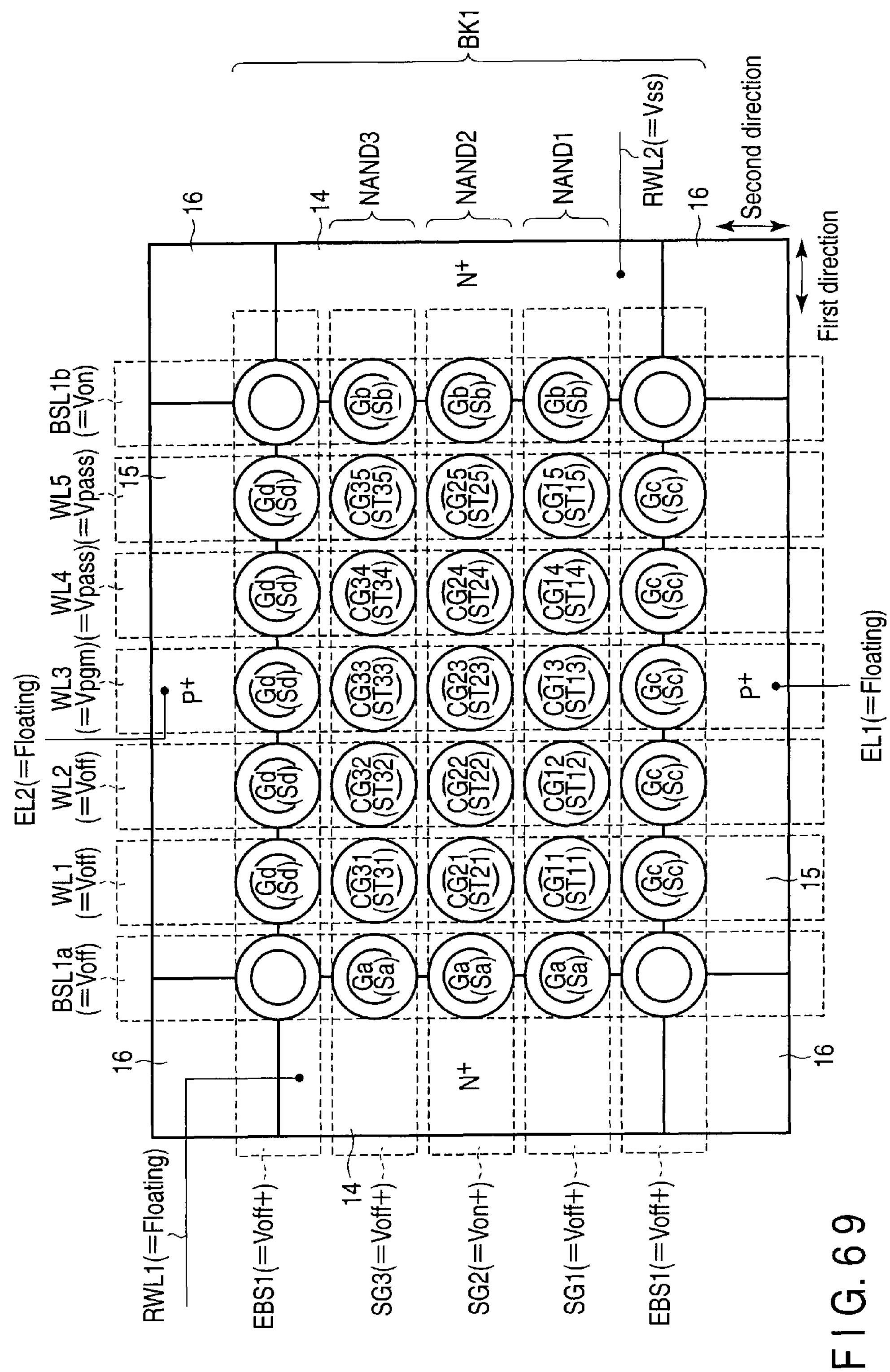
F I G. 6 9

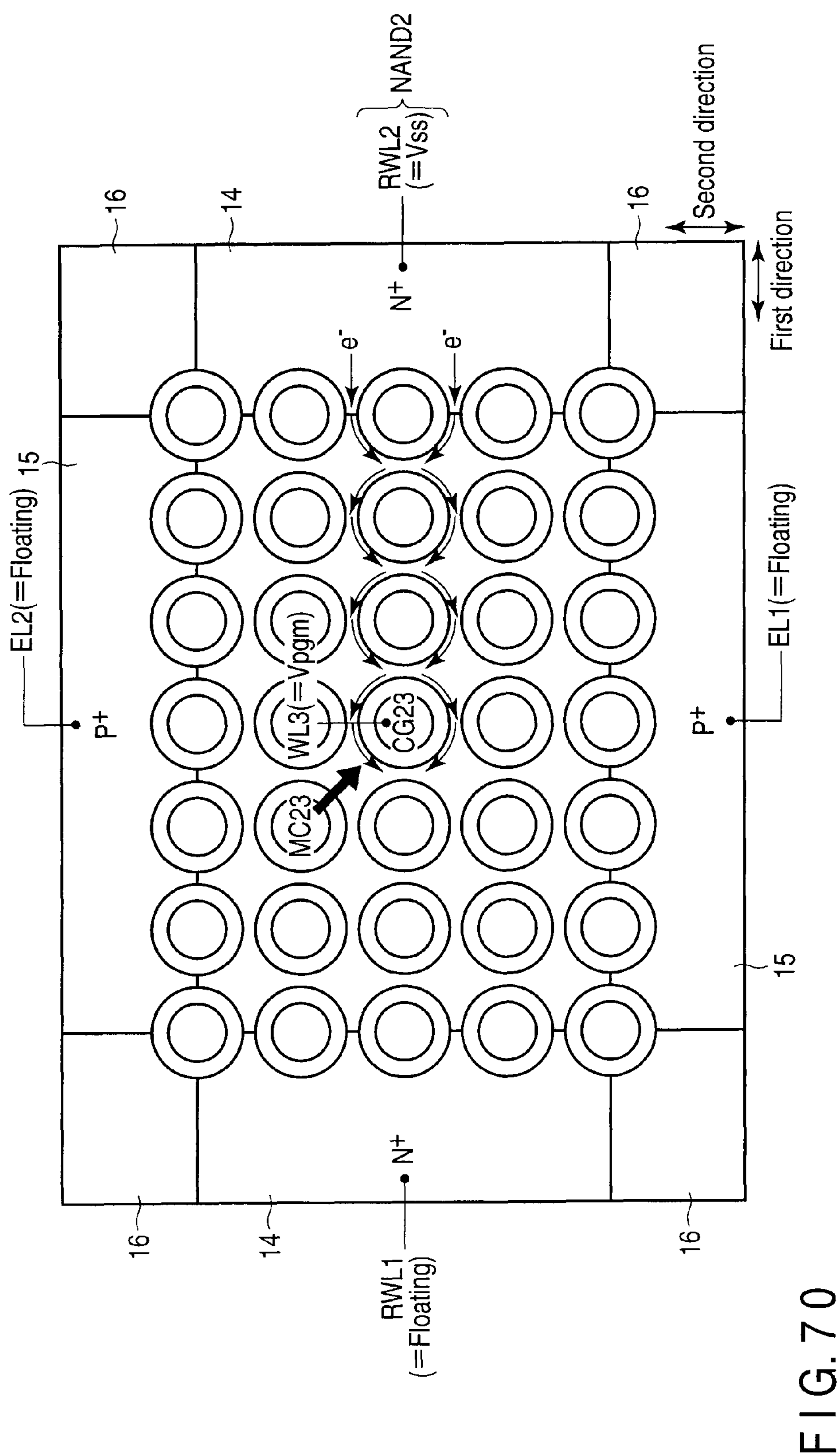
F I G. 7 0

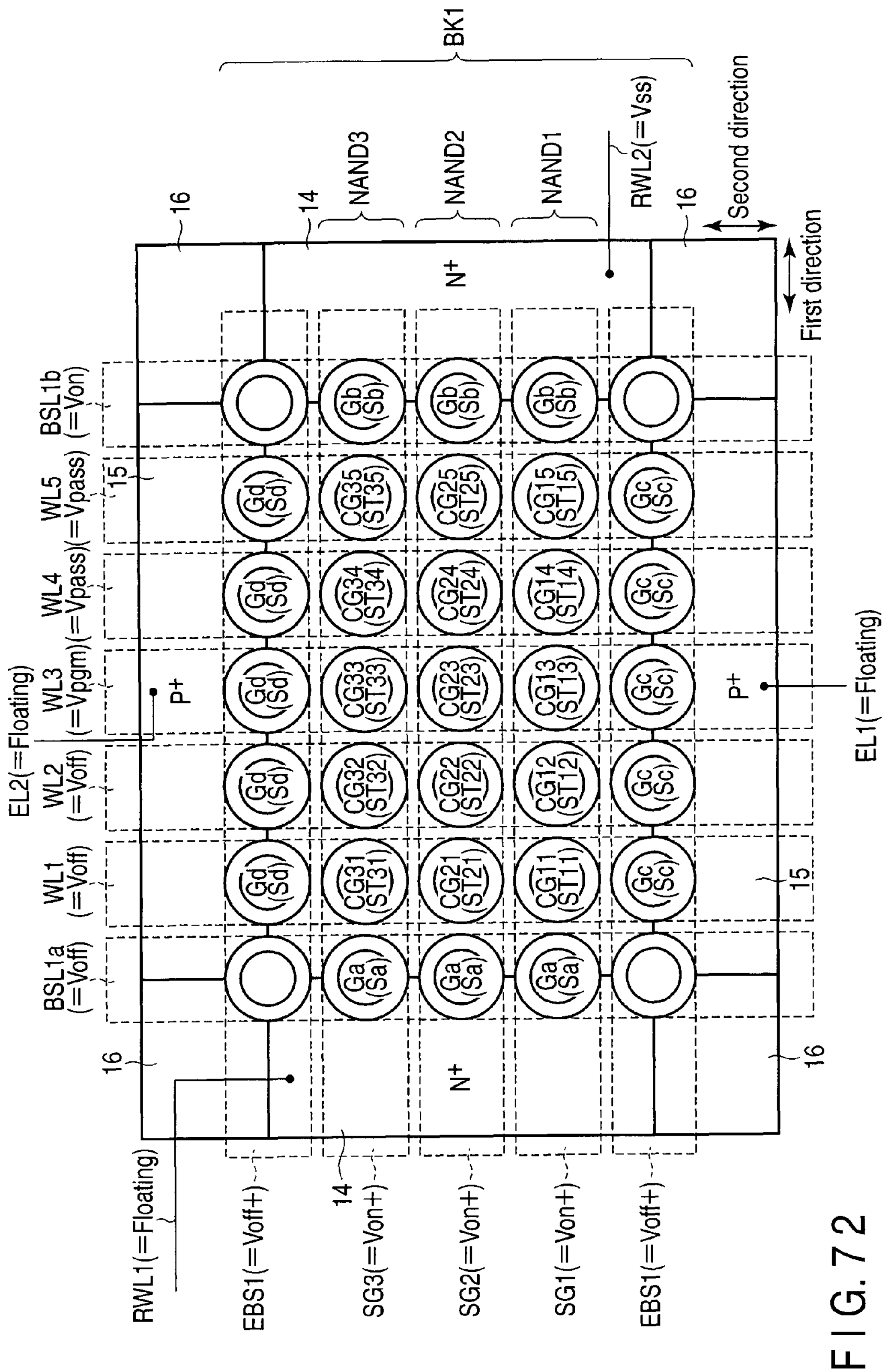
F I G. 7 2

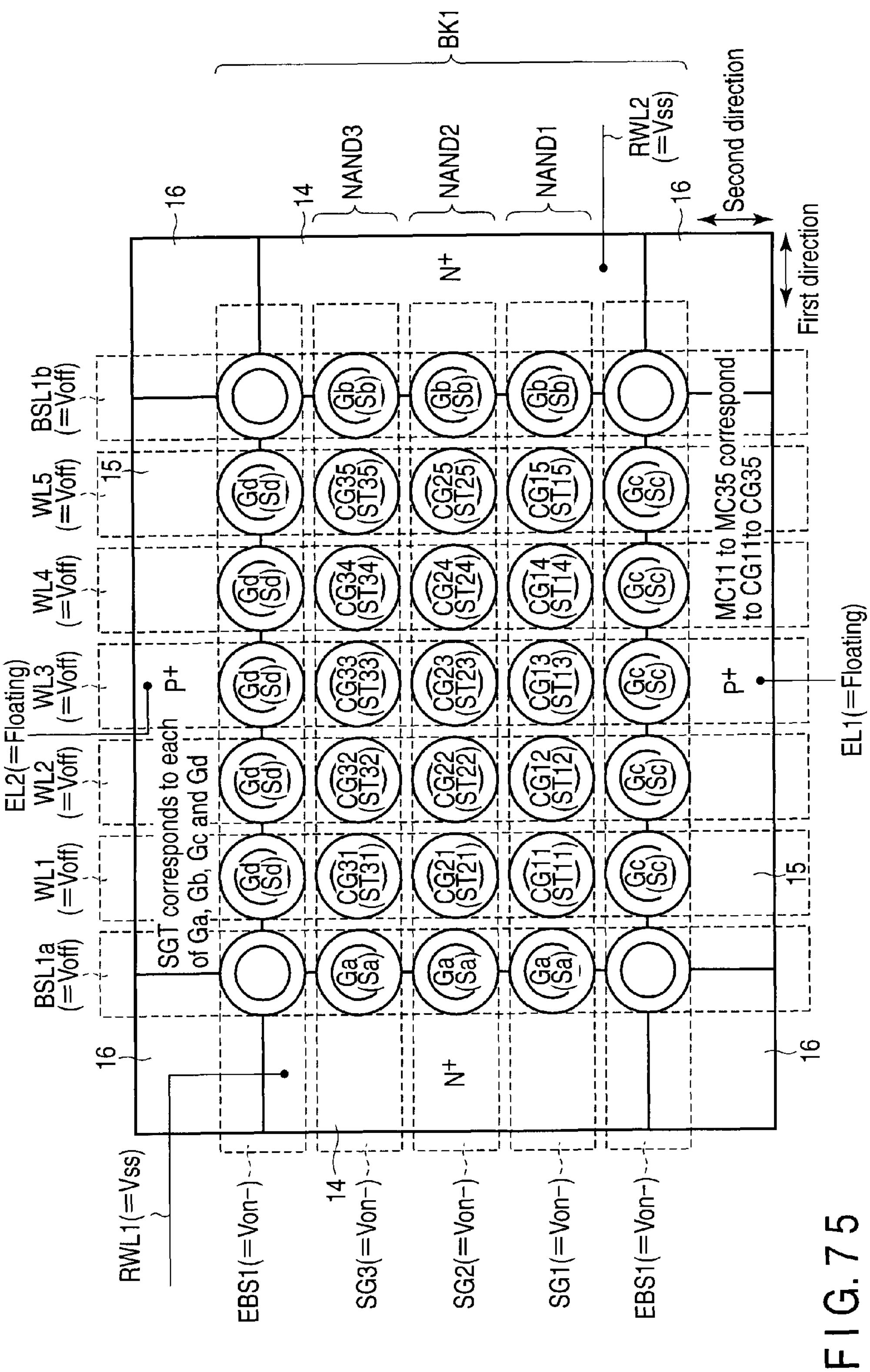
F I G. 7 5

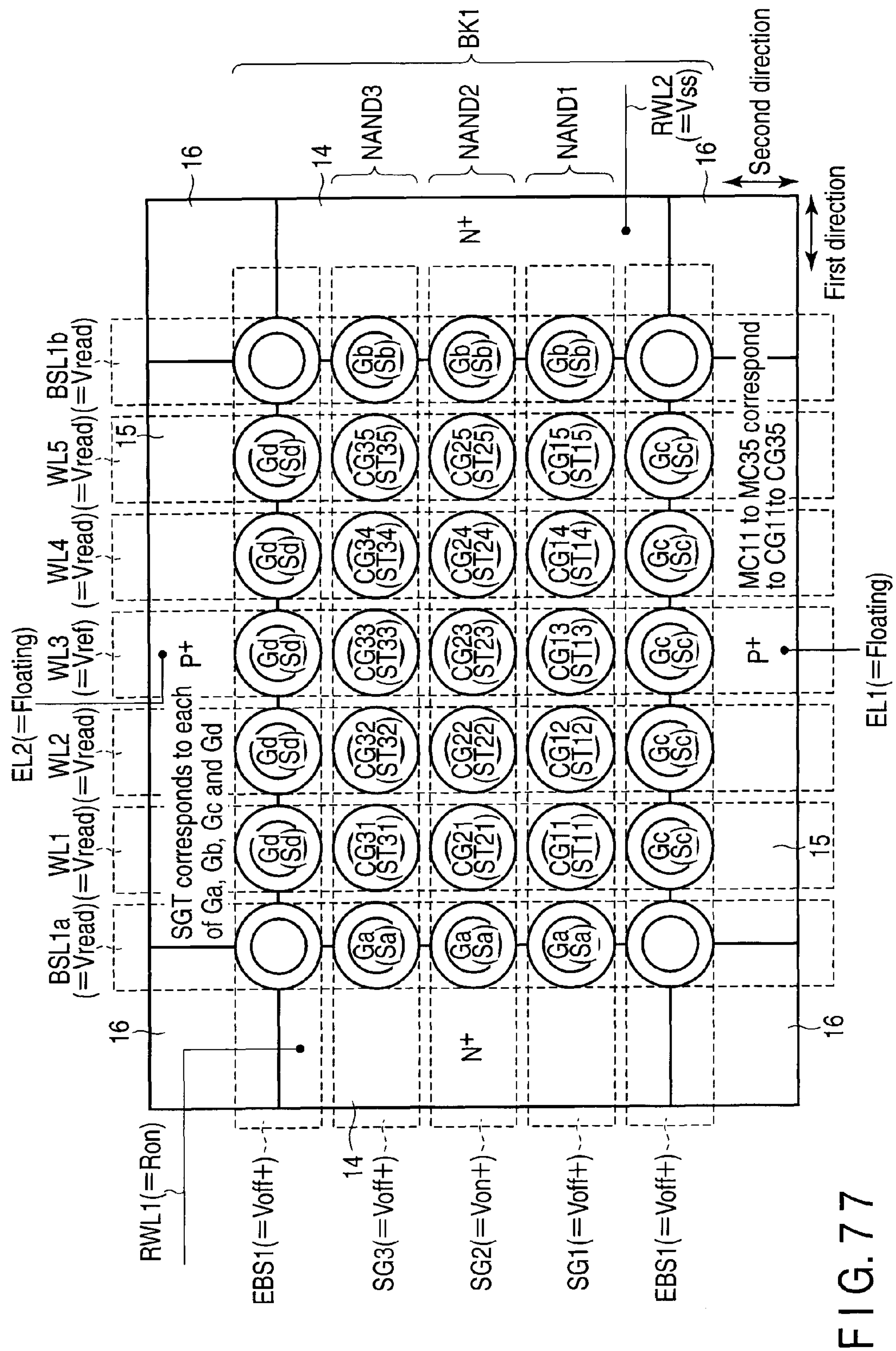
F I G. 7 7

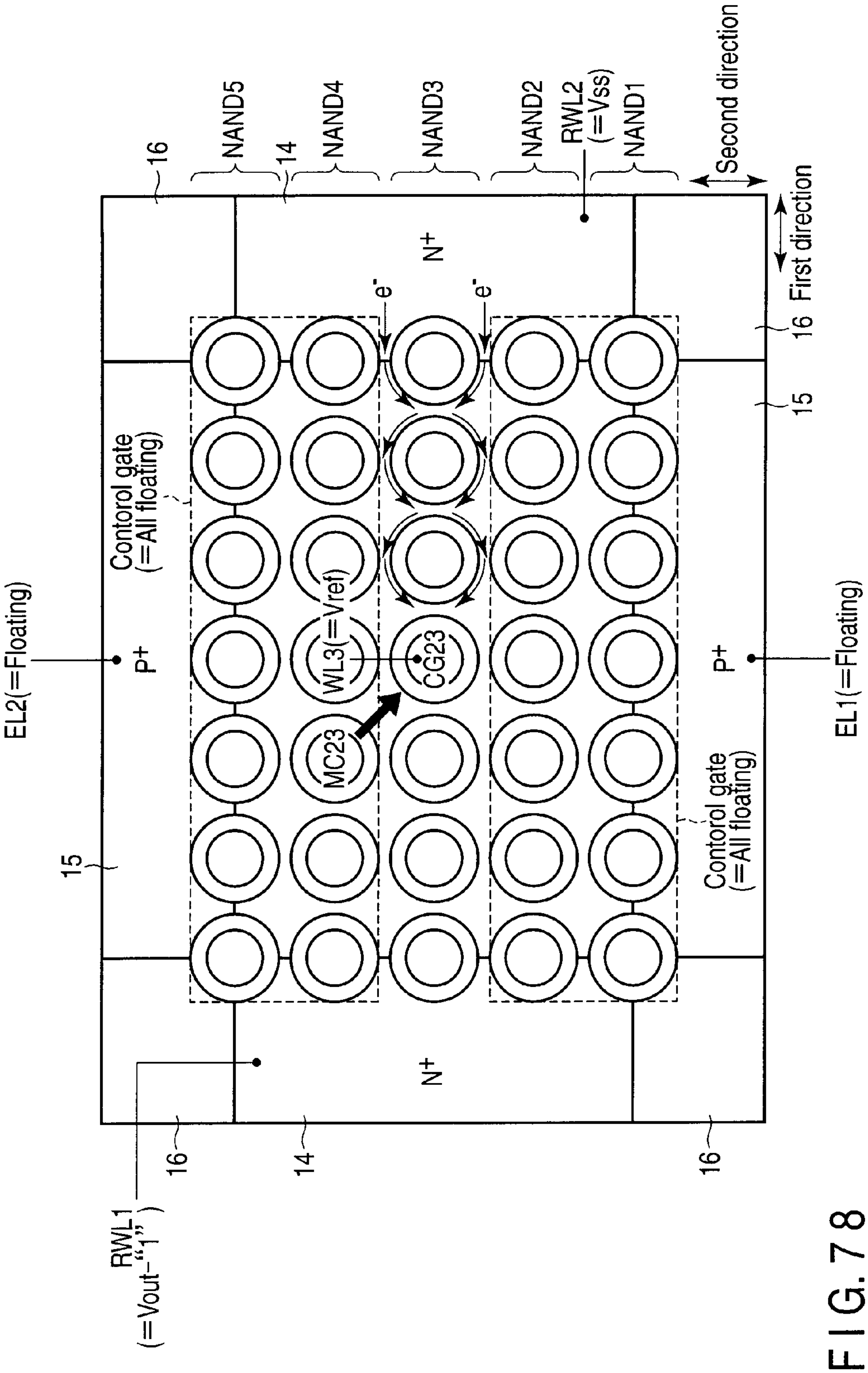
F I G. 7 8

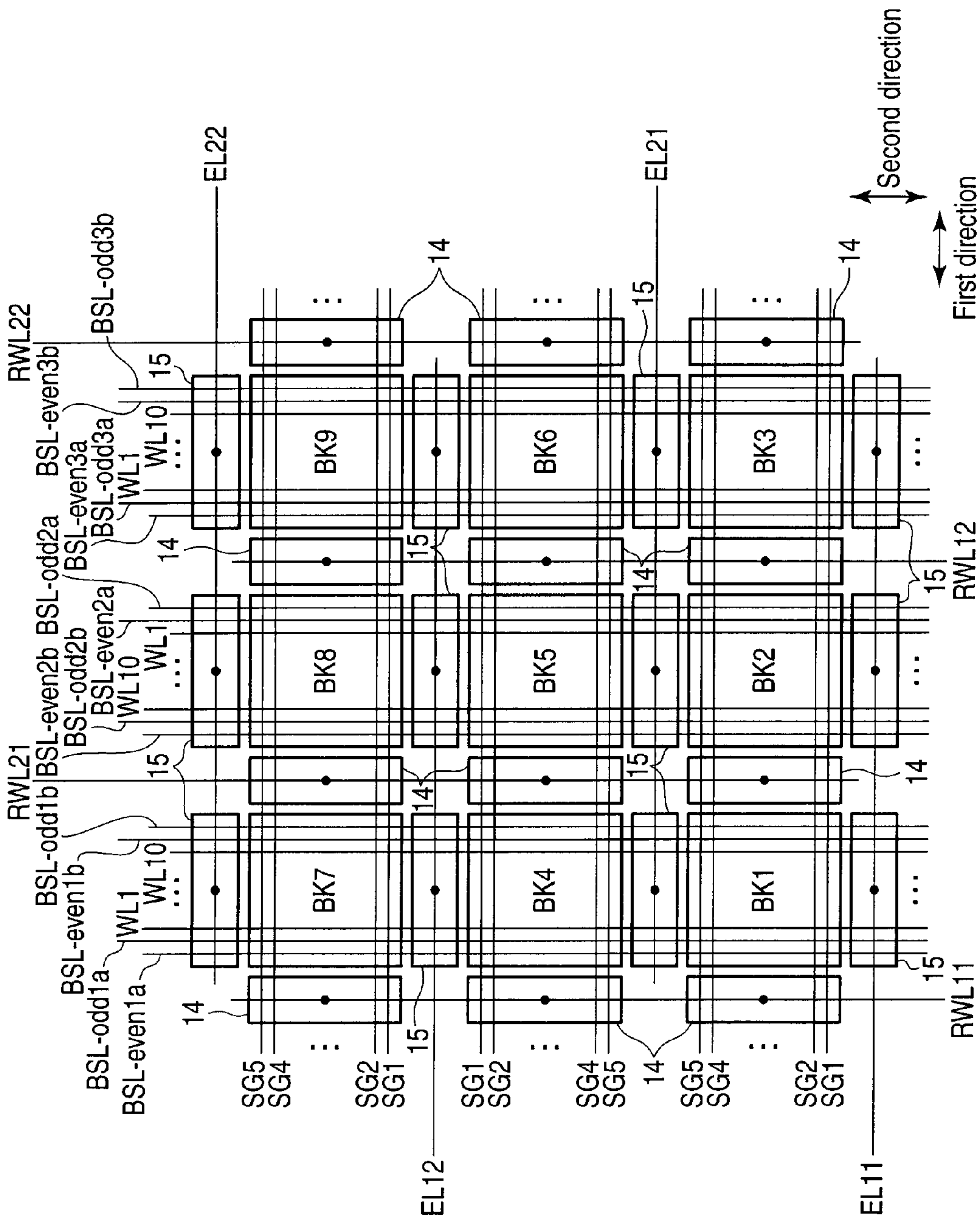
F I G. 8 4

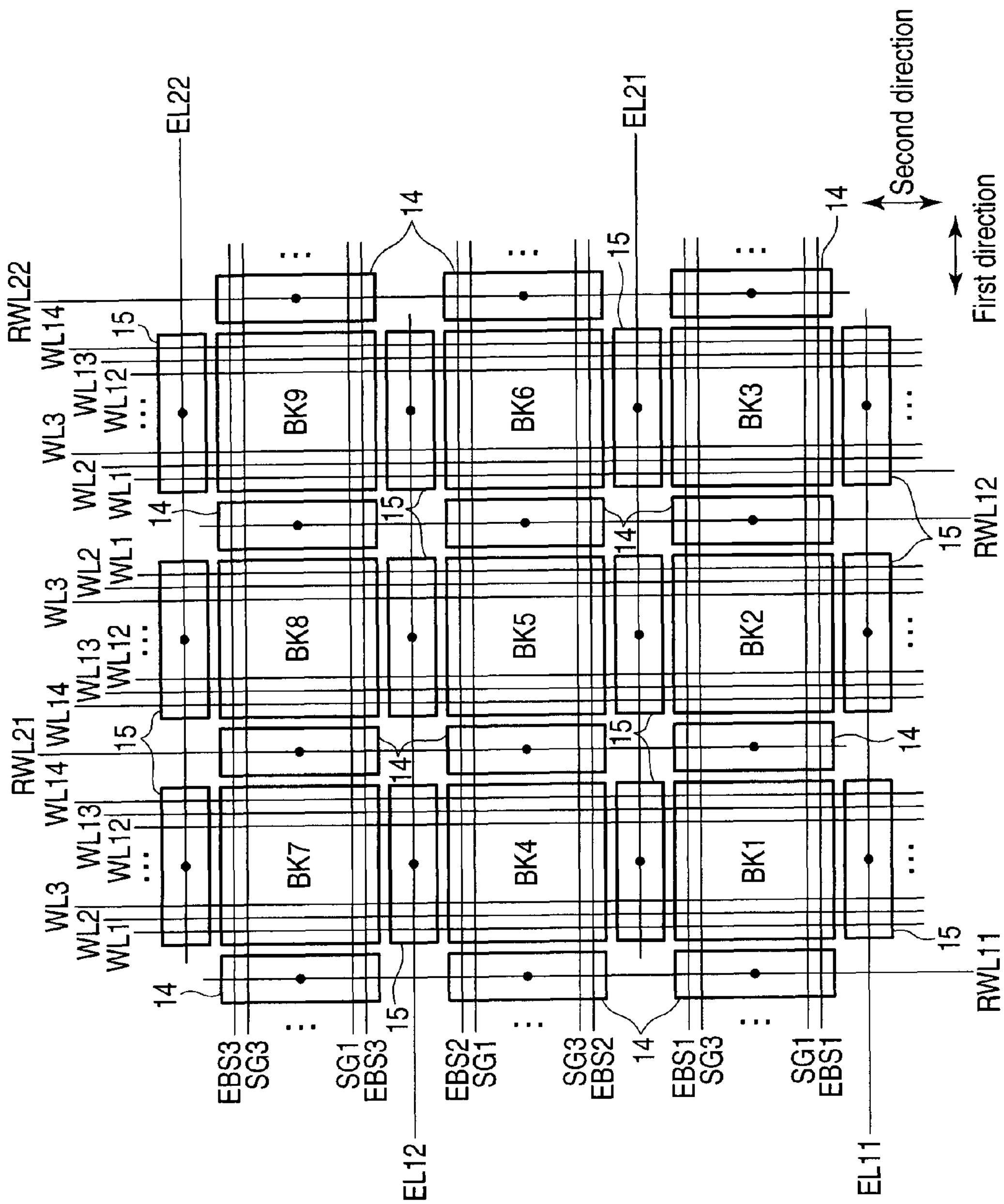
F I G. 8 5

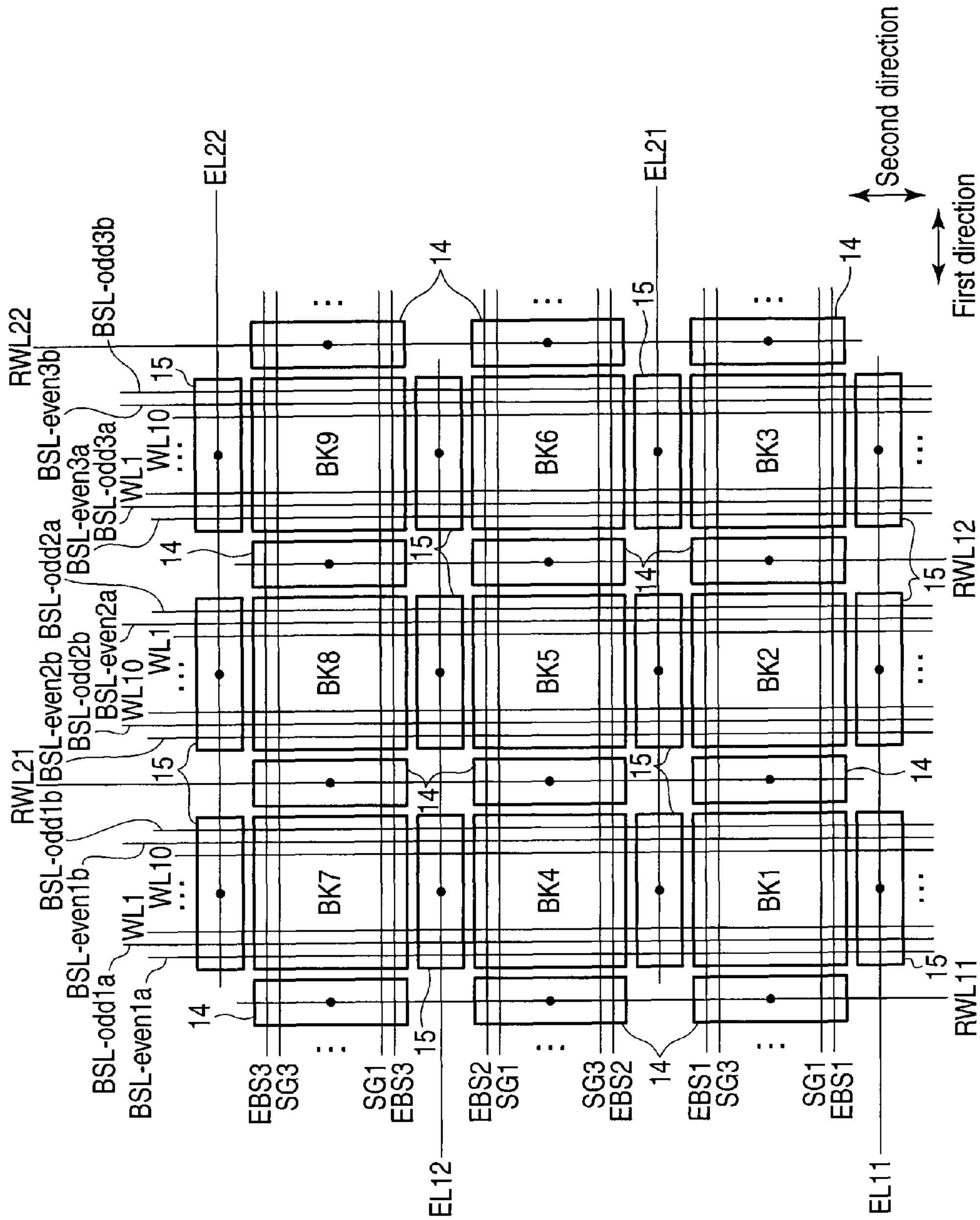
F I G. 8 6

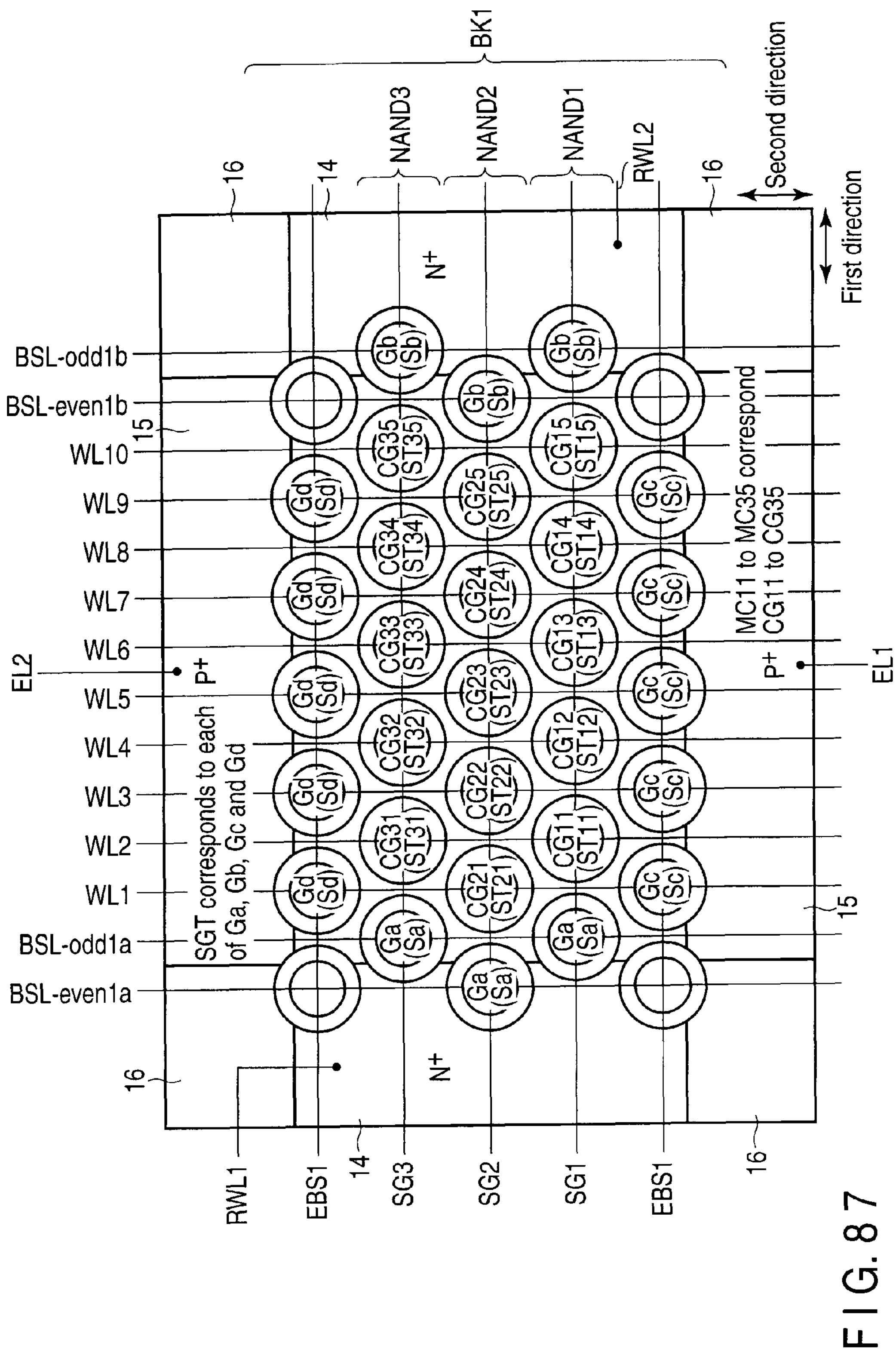
F I G. 8 7

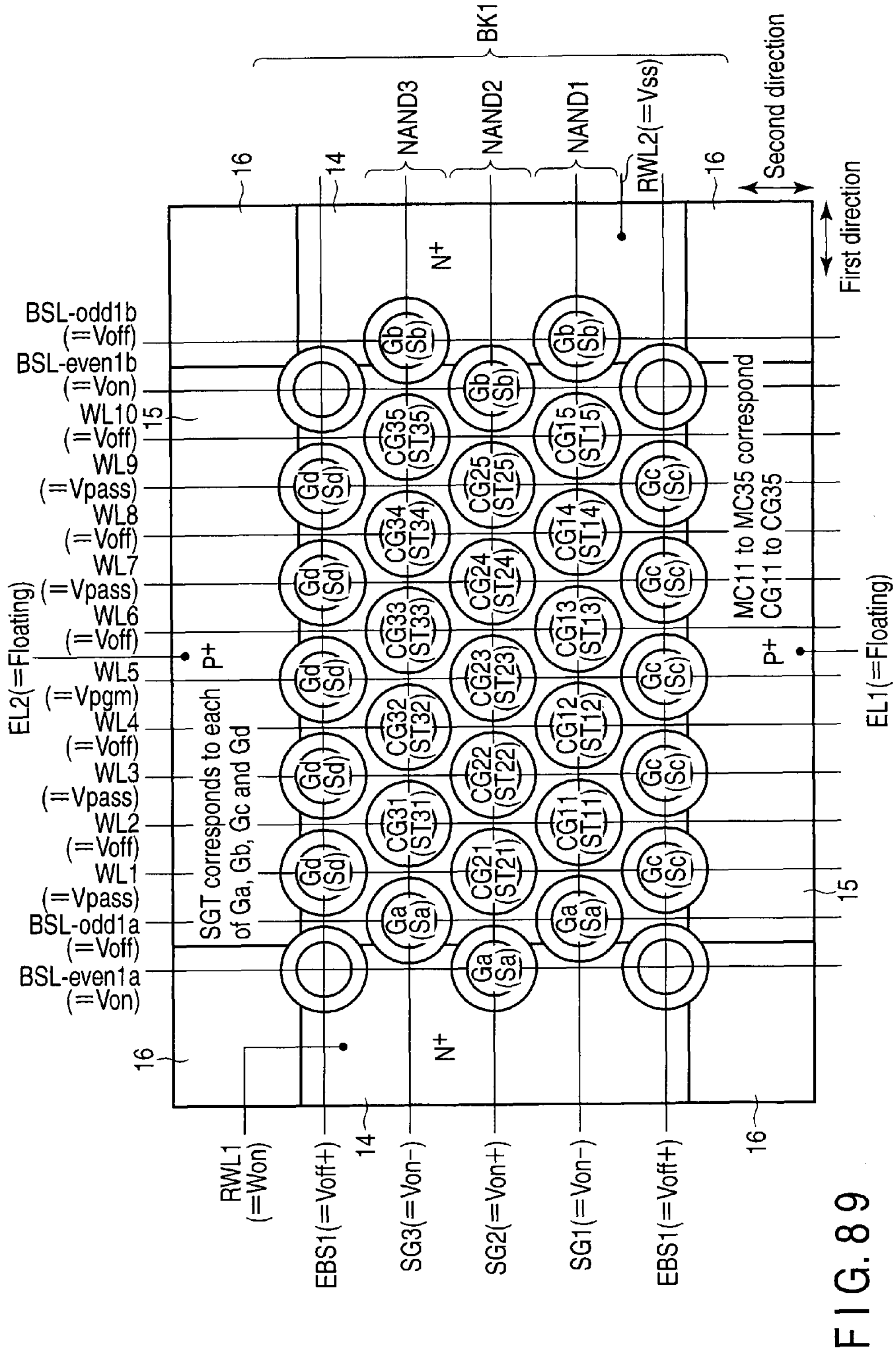
F I G. 8 9

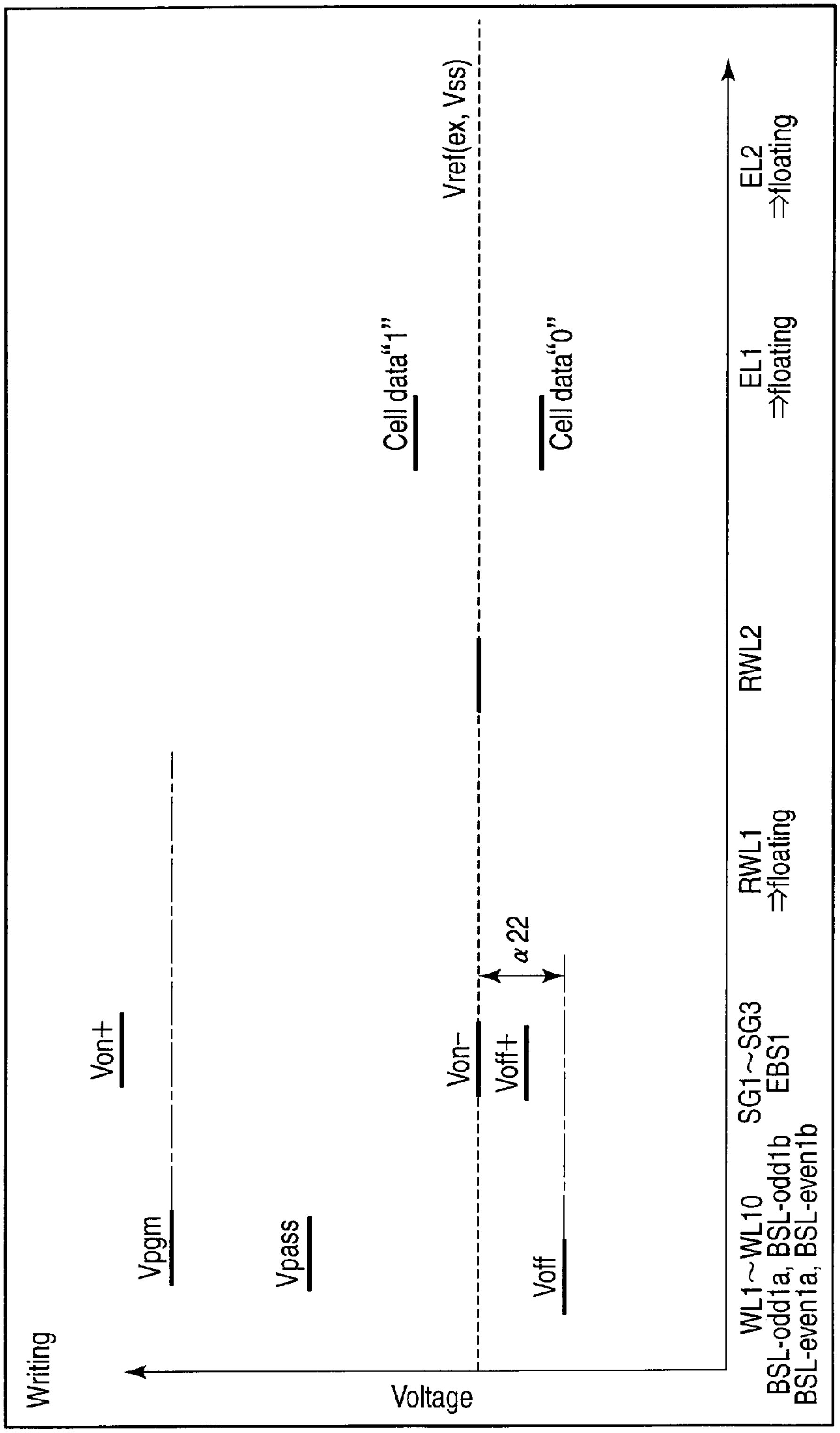
F I G. 9 4

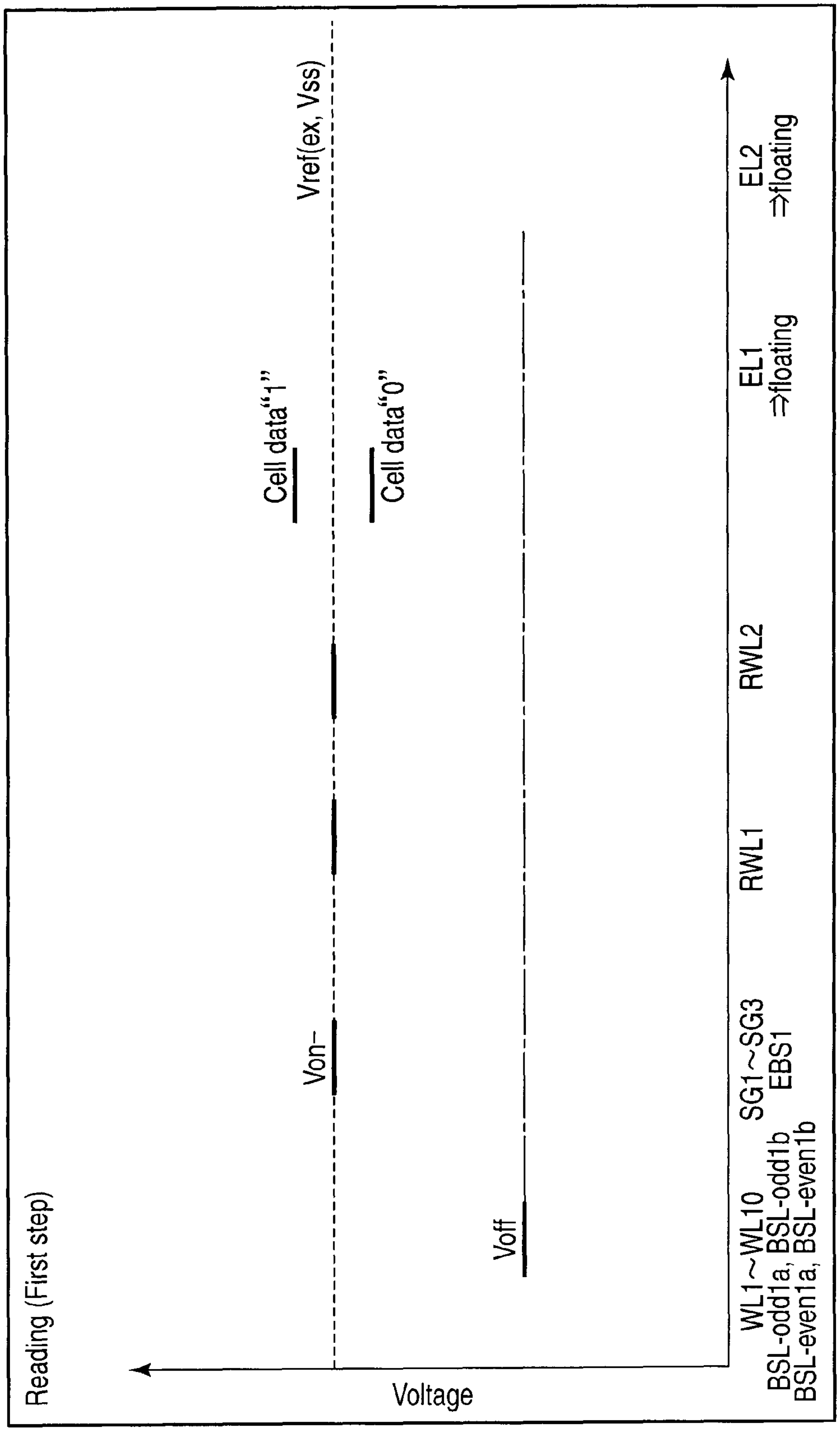
F I G. 1 0 0

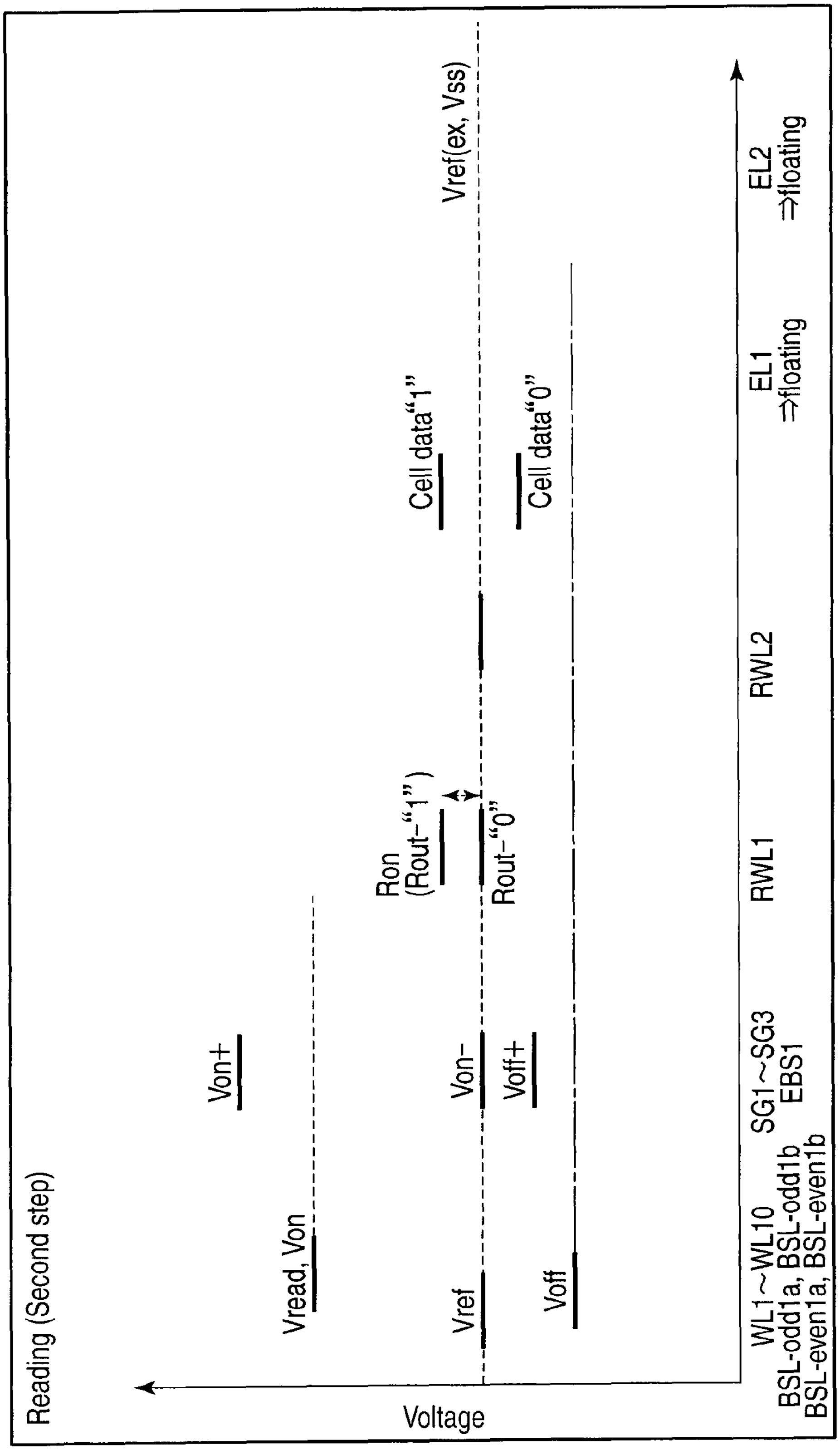
F I G. 1 0 2

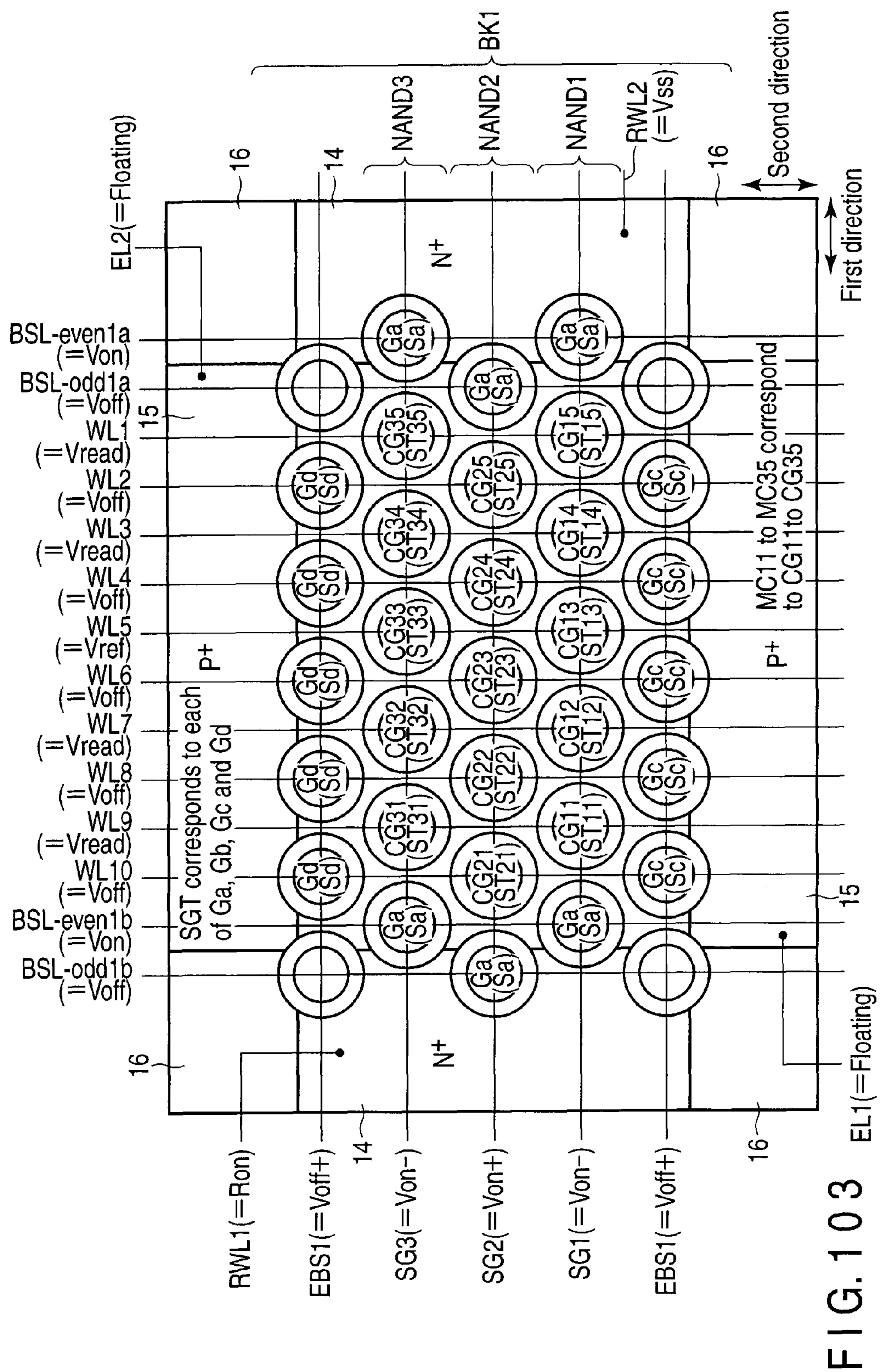
F I G. 1 0 3

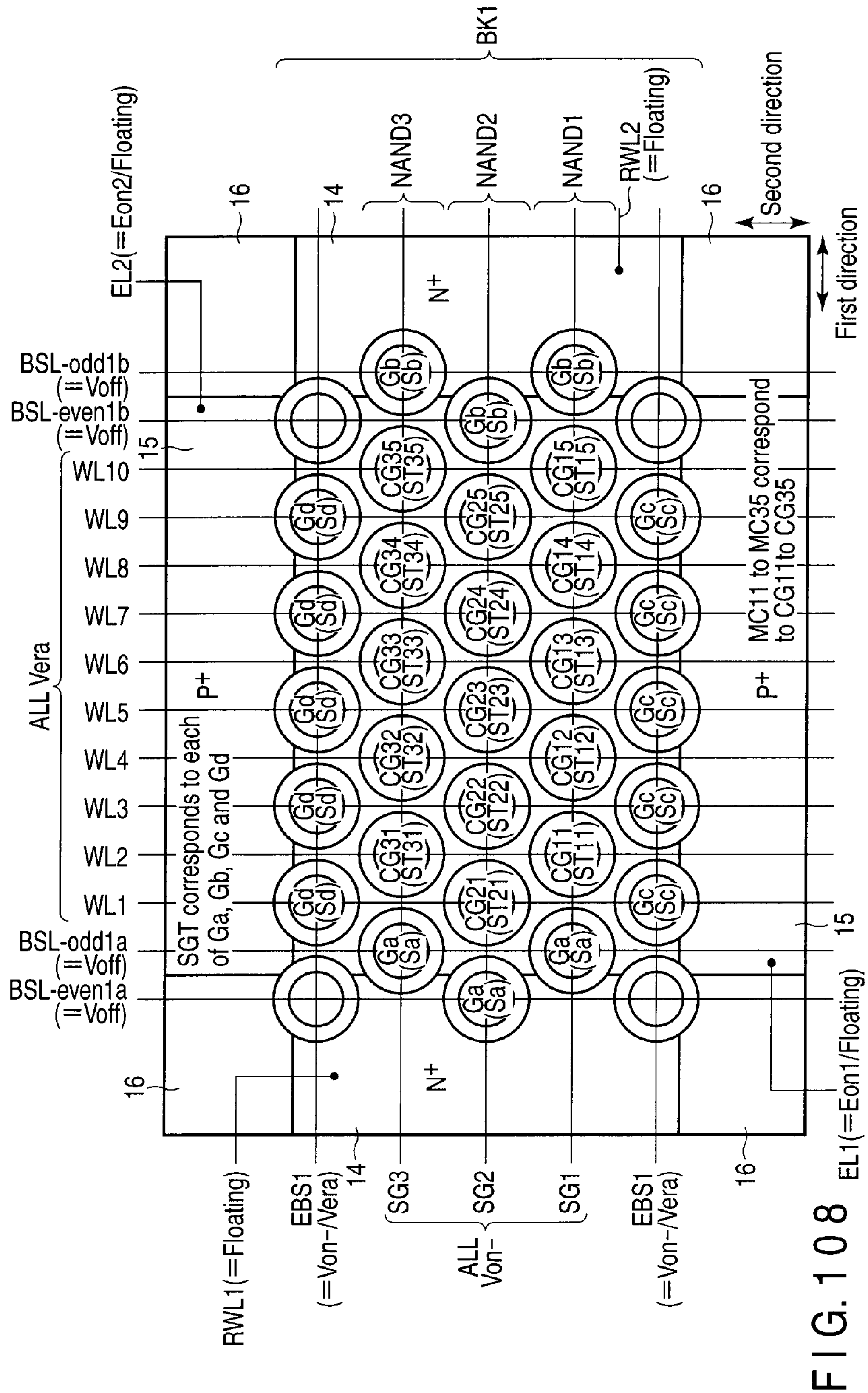
F I G. 1 0 8

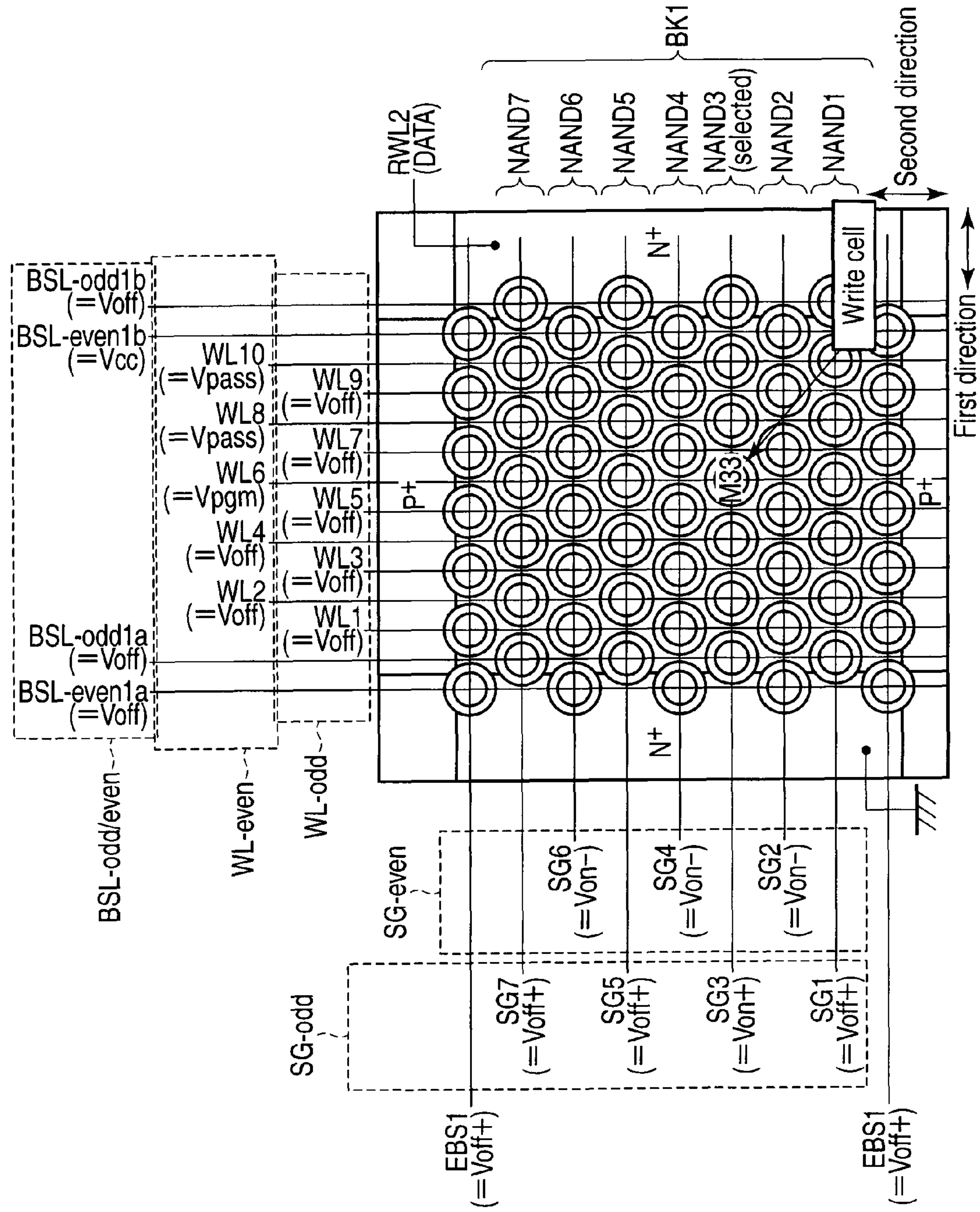
F I G. 1 1 3

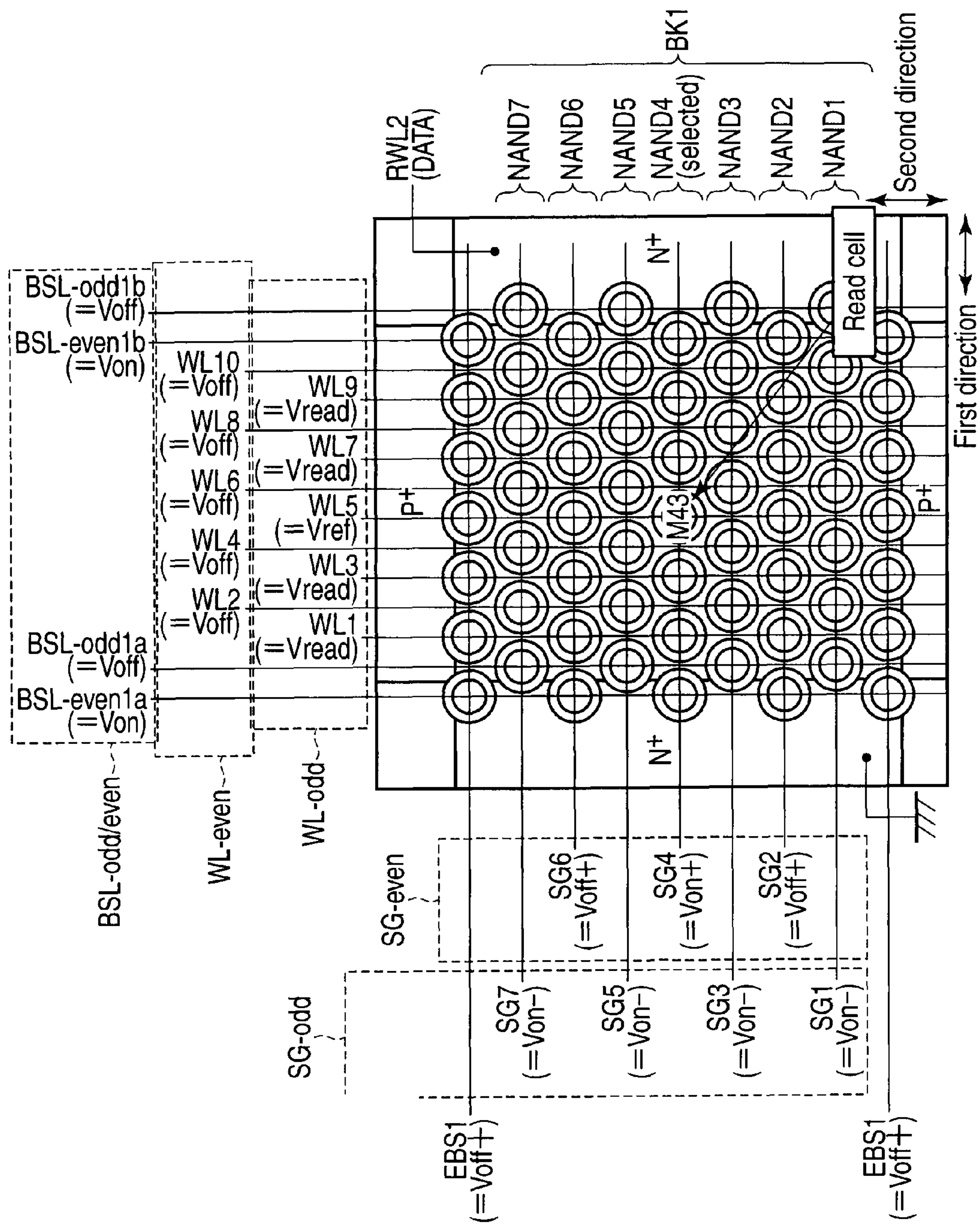
F I G. 1 1 4

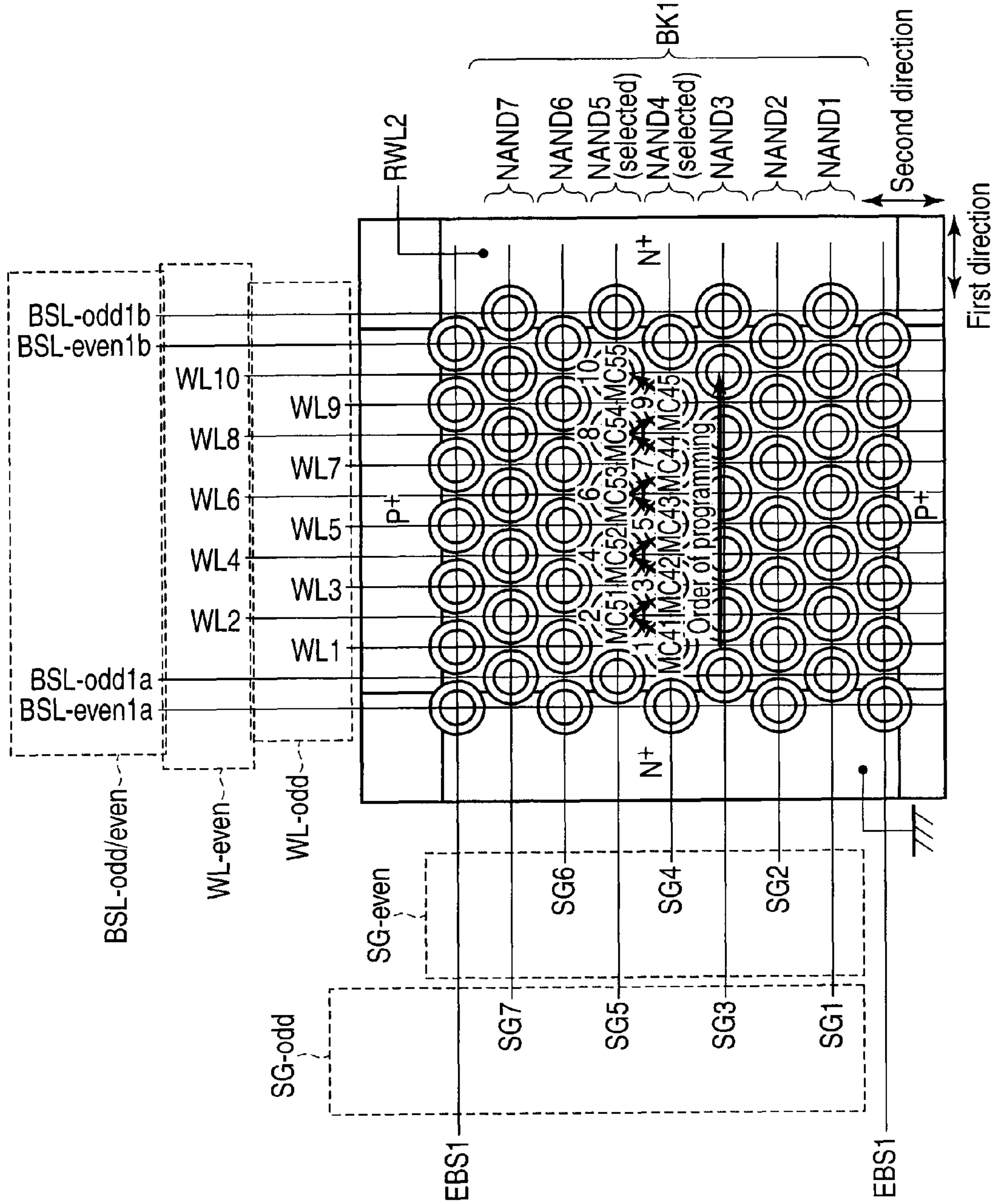
F I G. 1 1 7

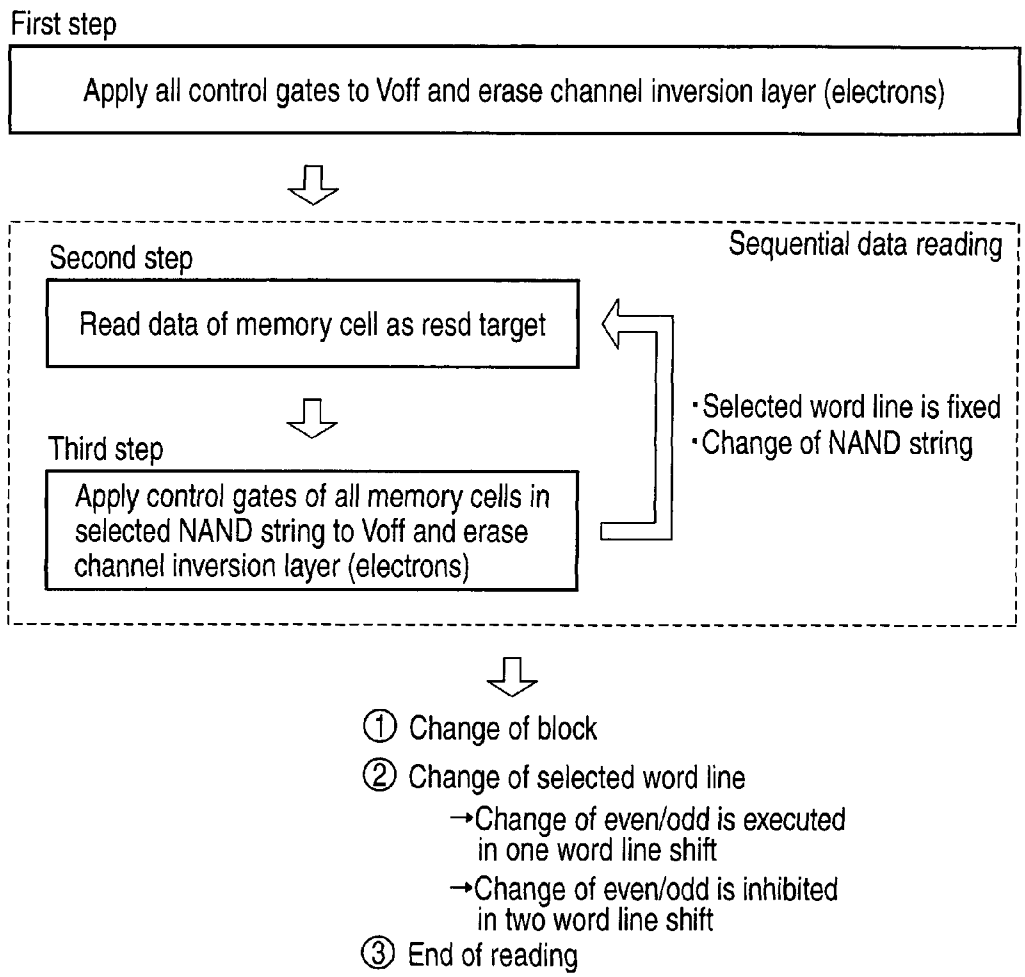
F I G. 1 2 0

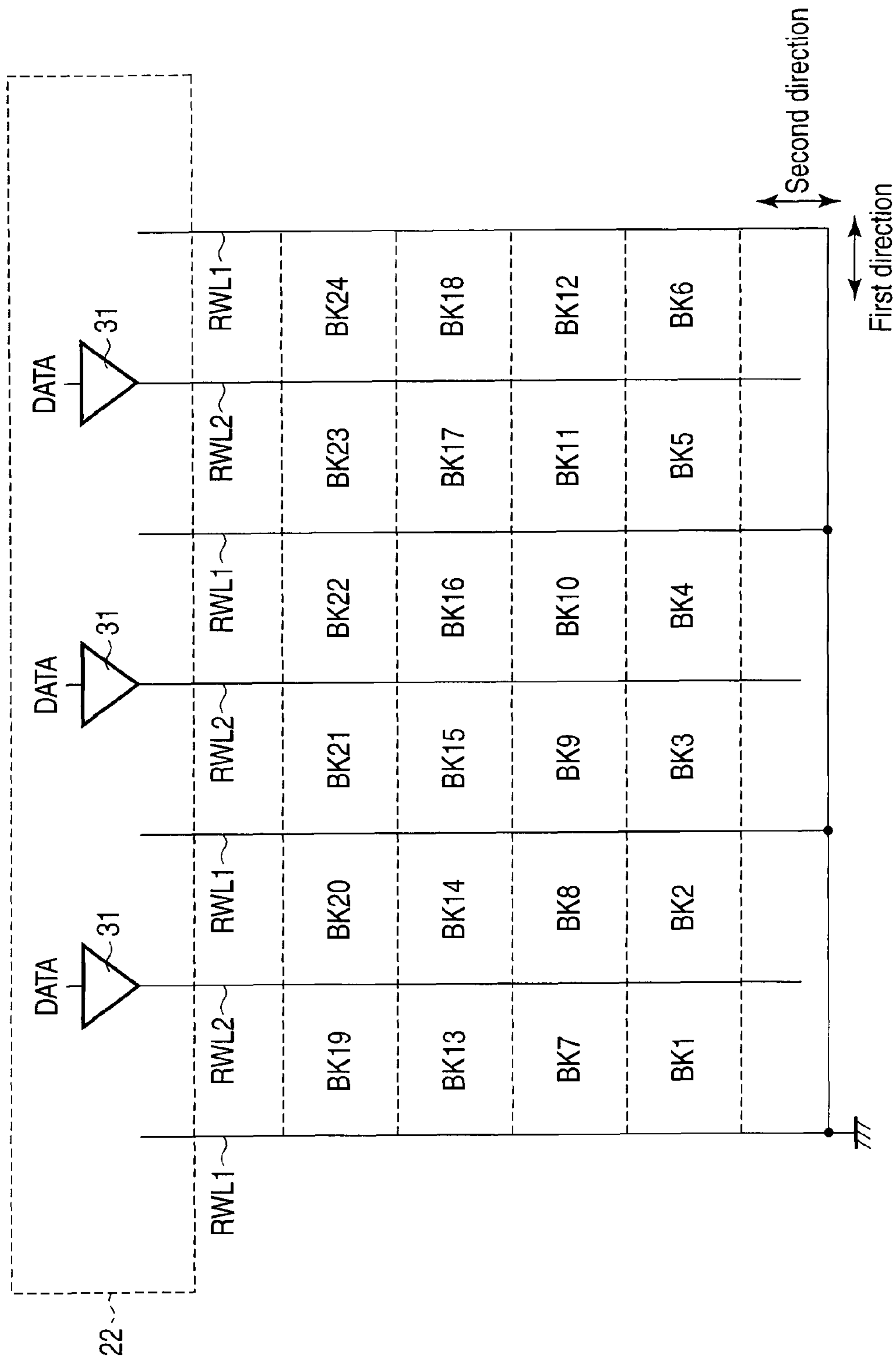
F I G. 1 2 2

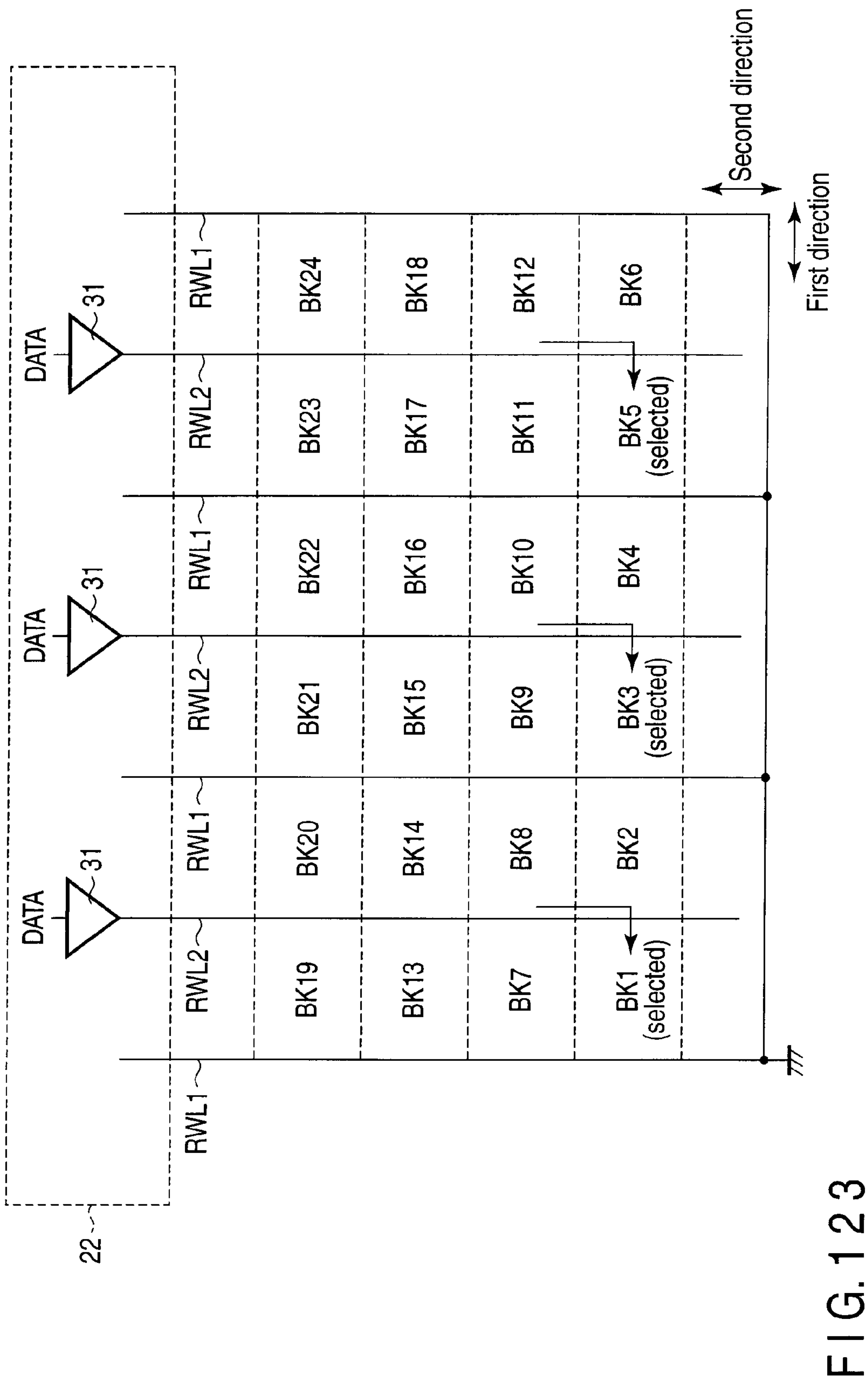
F I G. 1 2 3

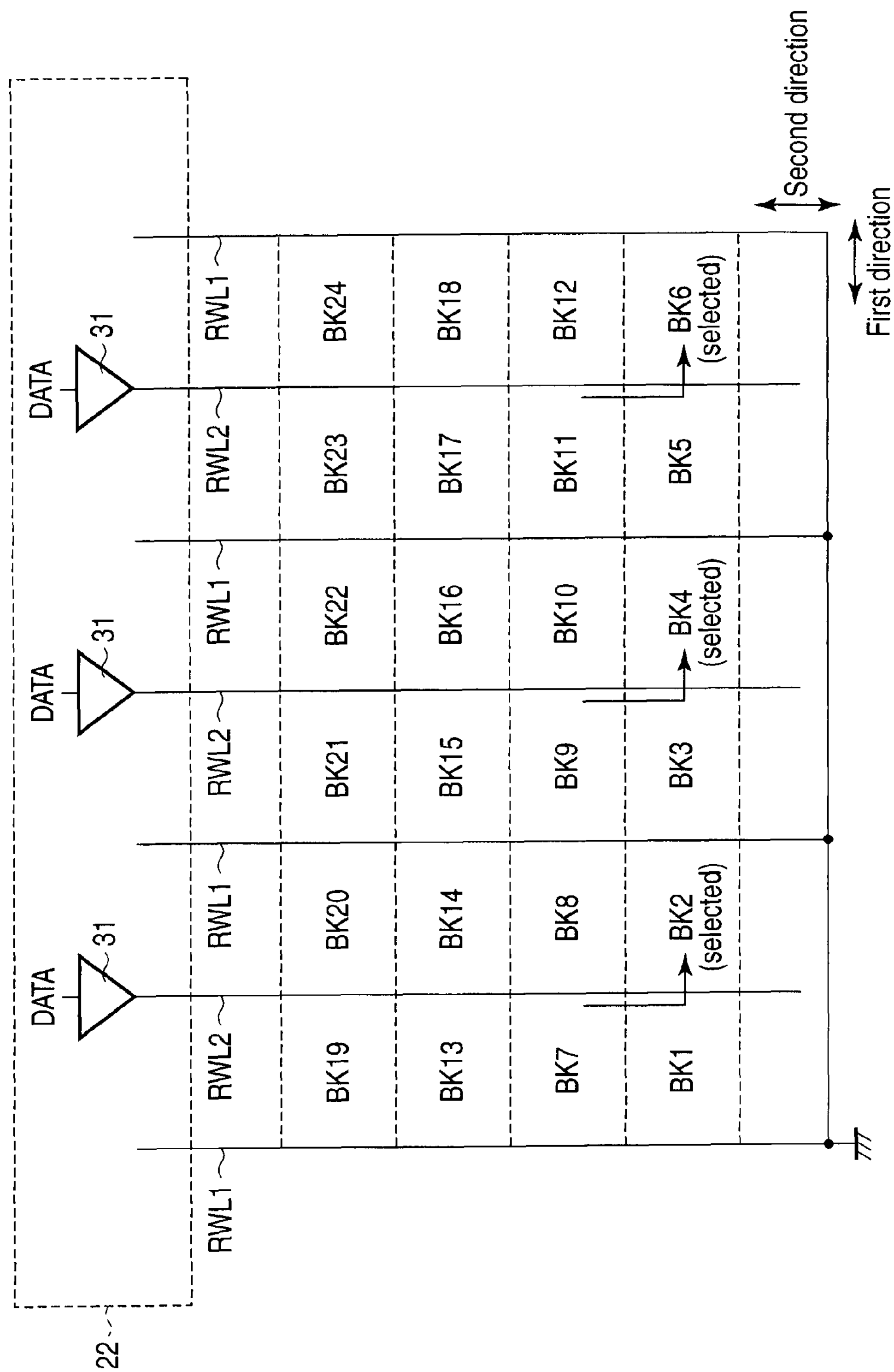
F I G. 1 2 4

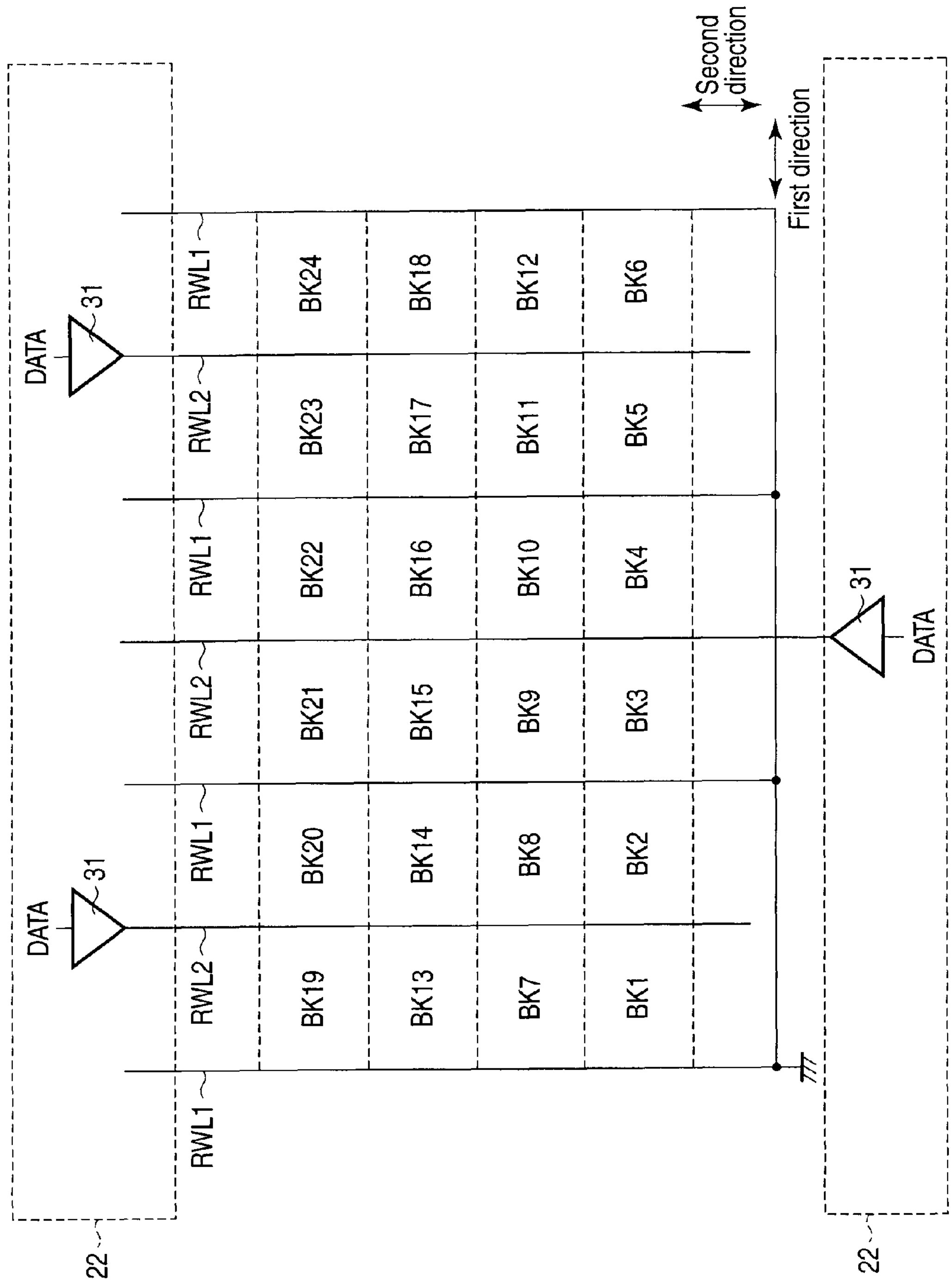
F I G. 1 2 5

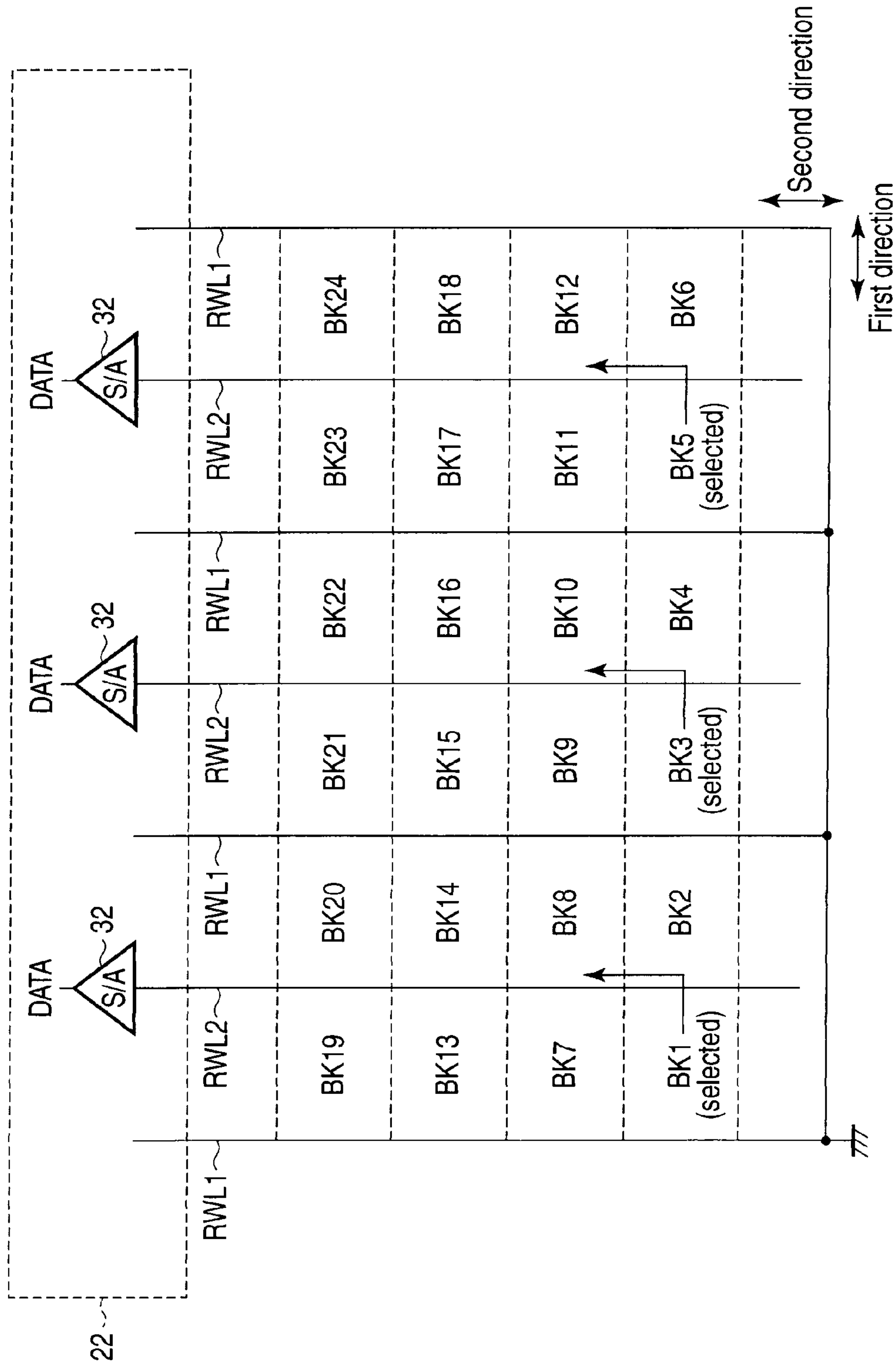
F I G. 1 2 8

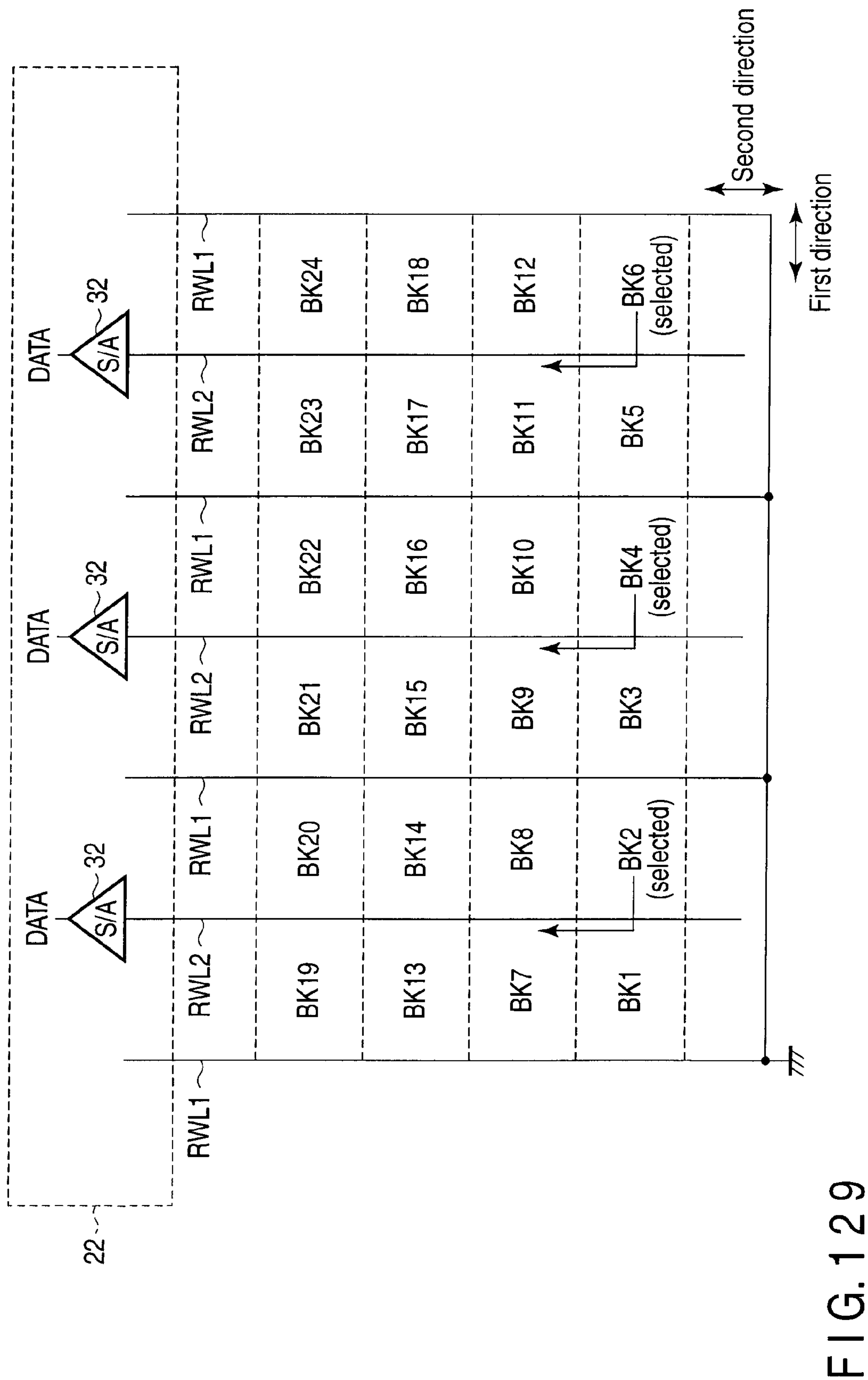
F I G. 1 2 9

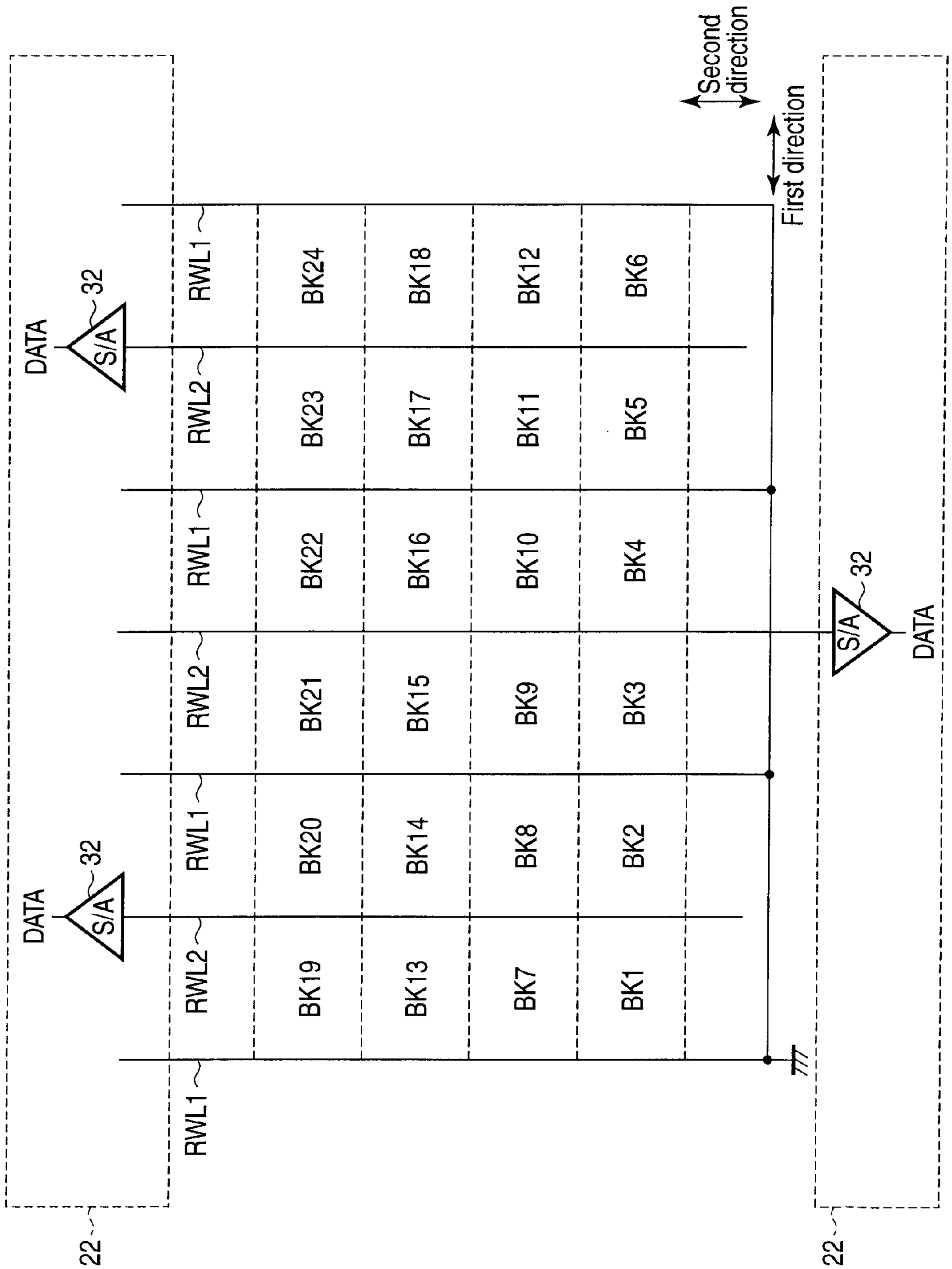
F I G. 1 3 0

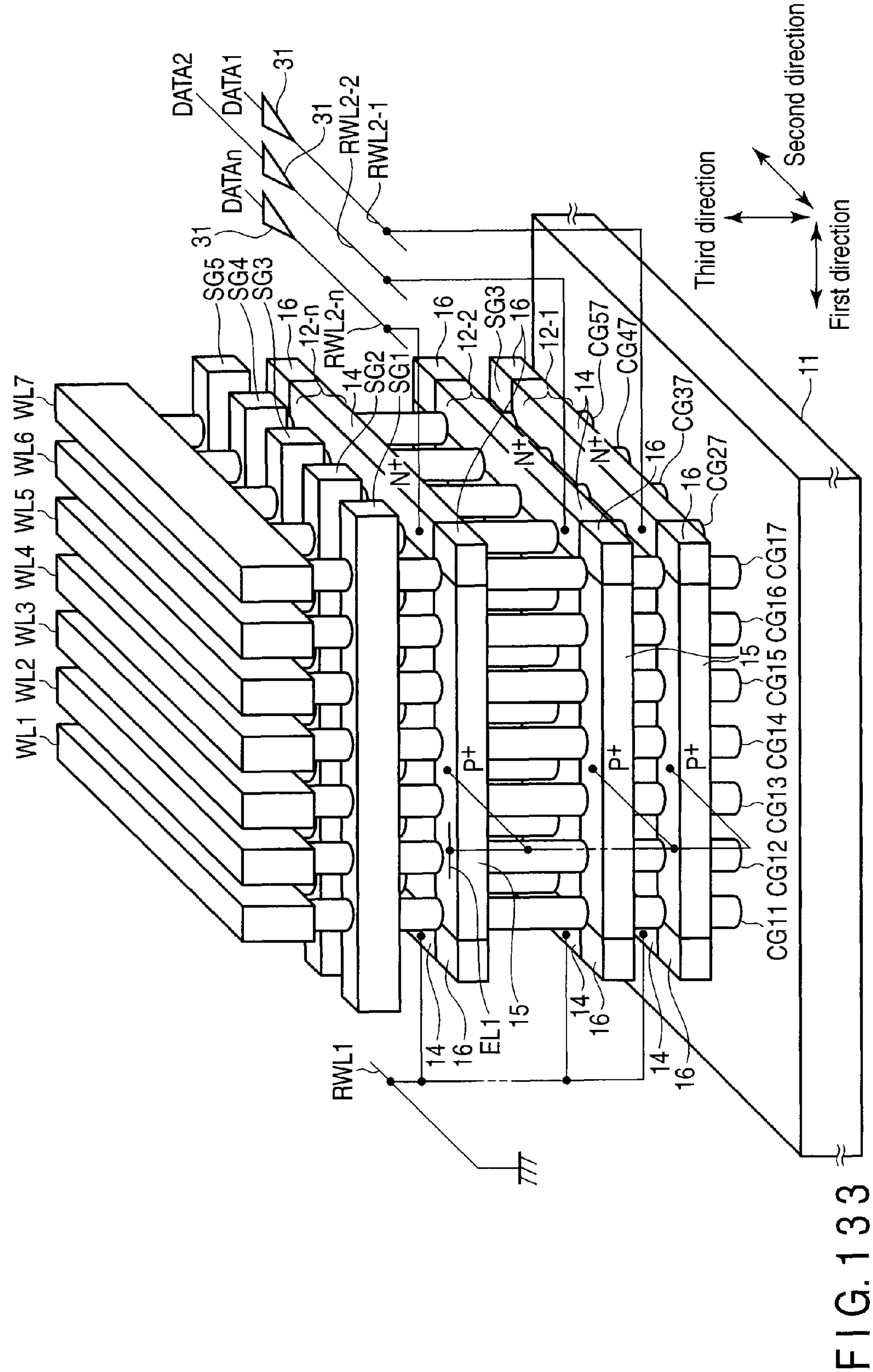
F I G. 1 3 3

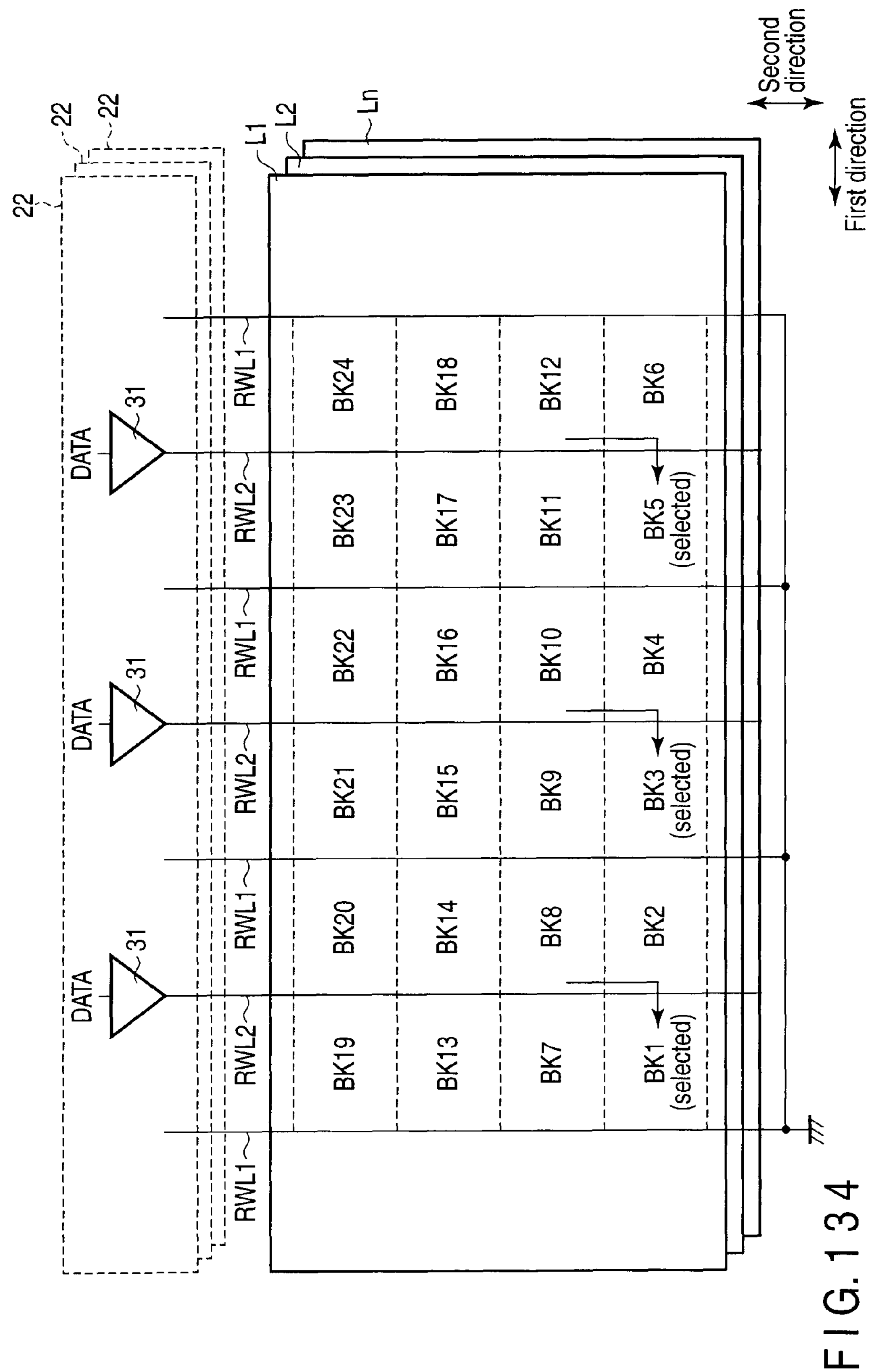
F I G. 1 3 4

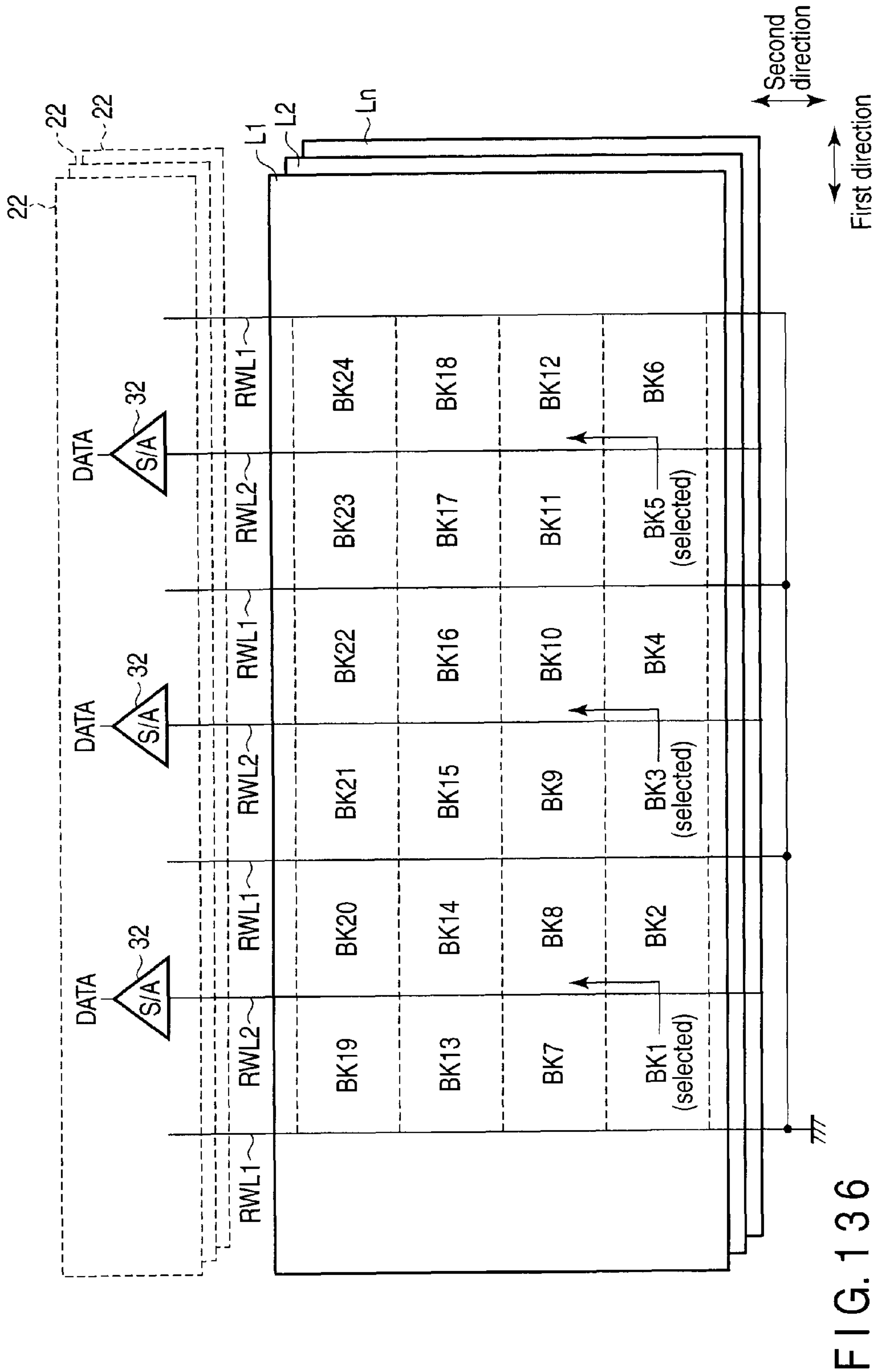
F I G. 1 3 6

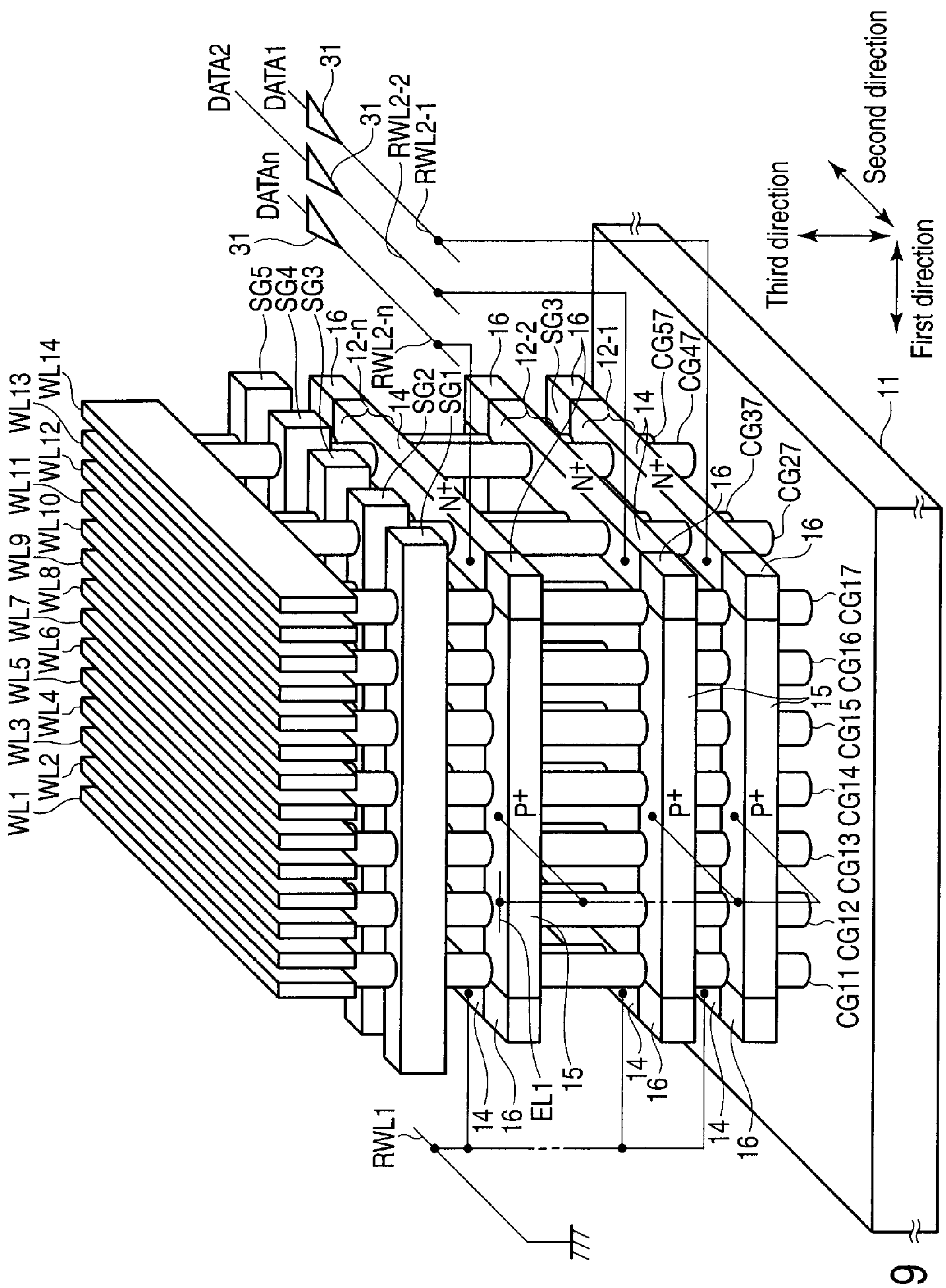
F I G. 1 3 9

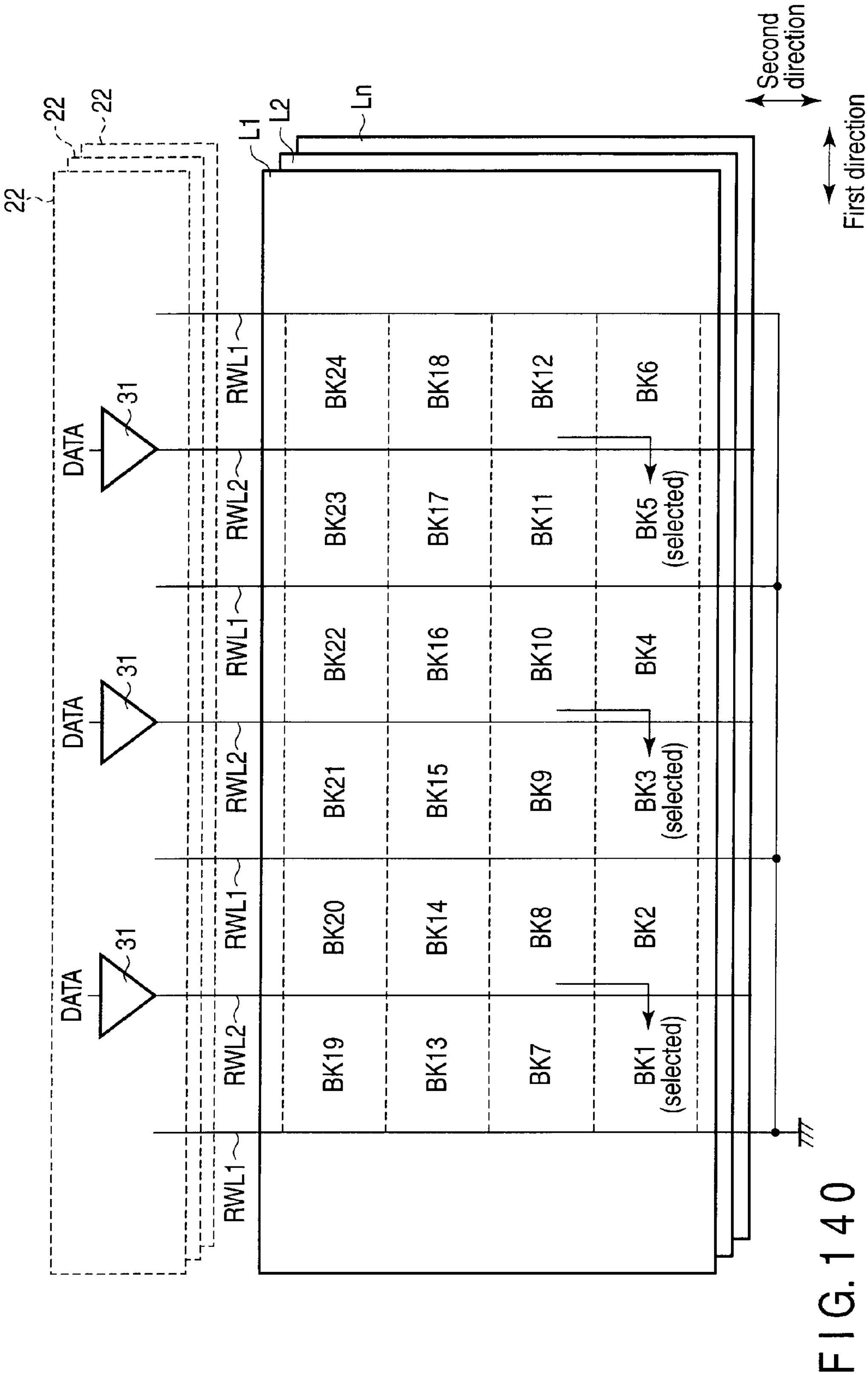
F I G. 1 4 0

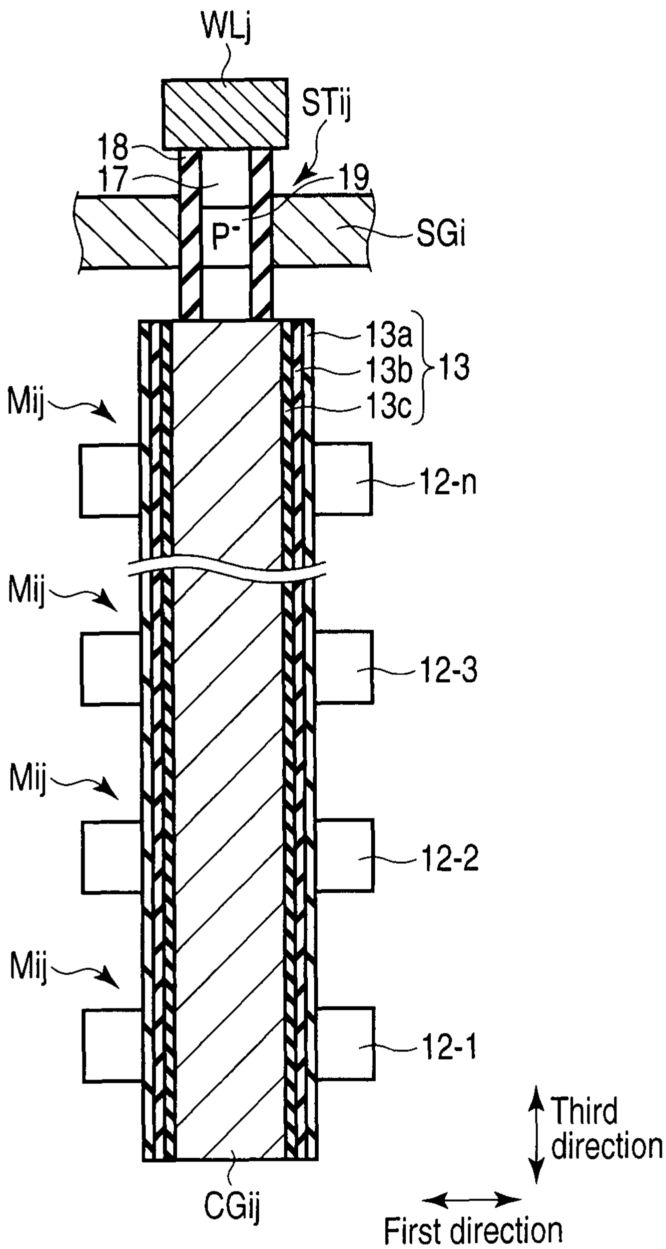
F I G. 1 4 3

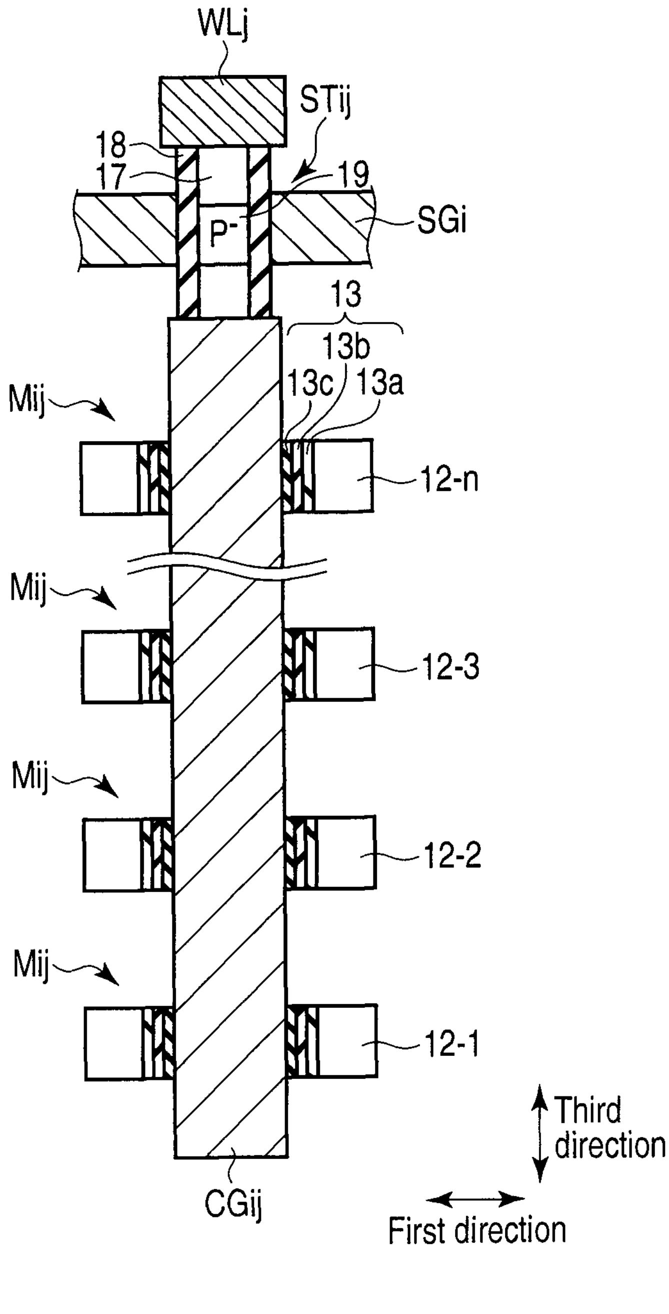
F I G. 1 4 4

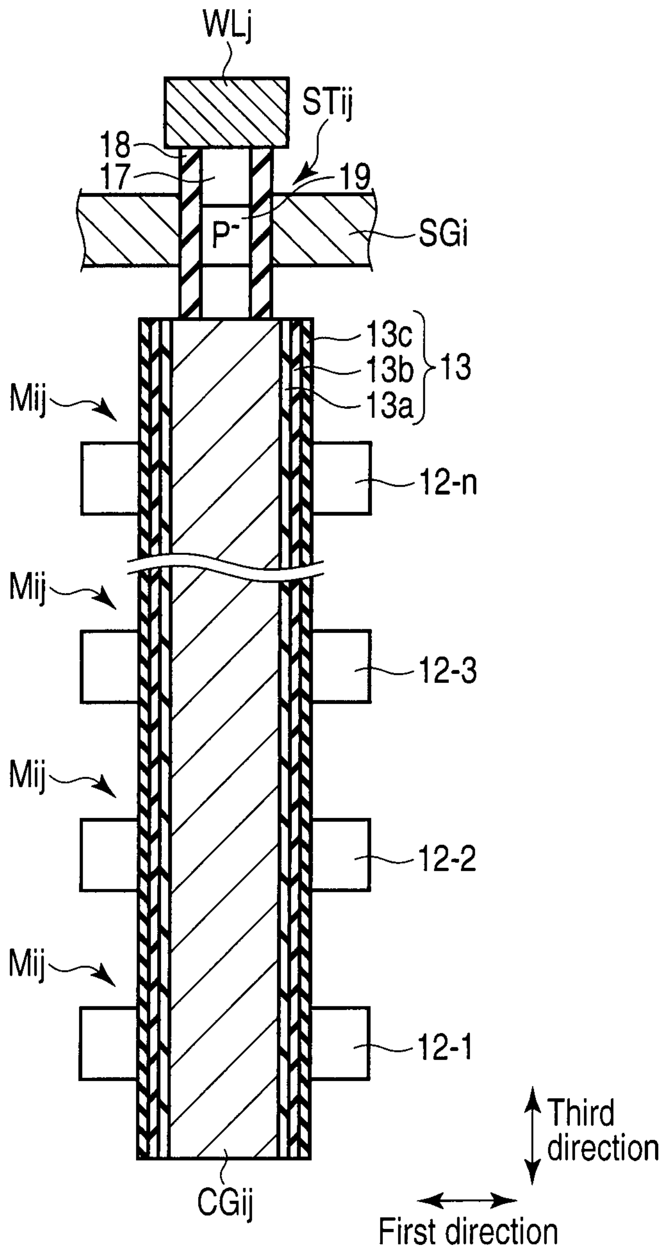
F I G. 1 4 5

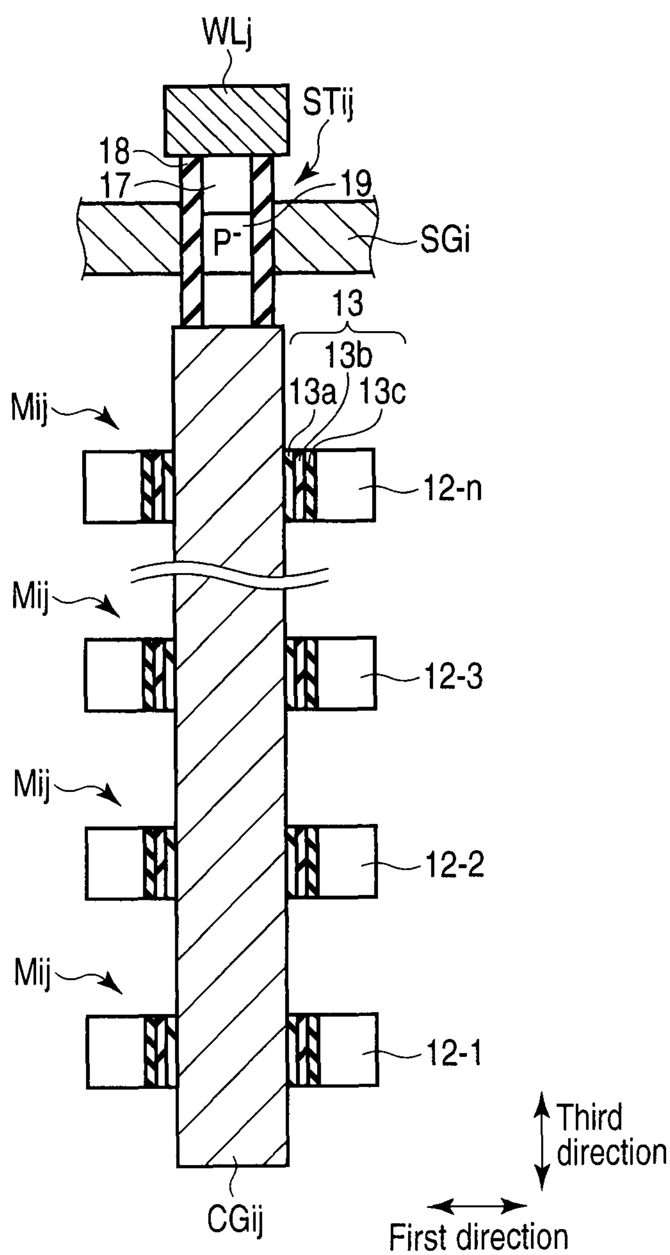
F I G. 1 4 6

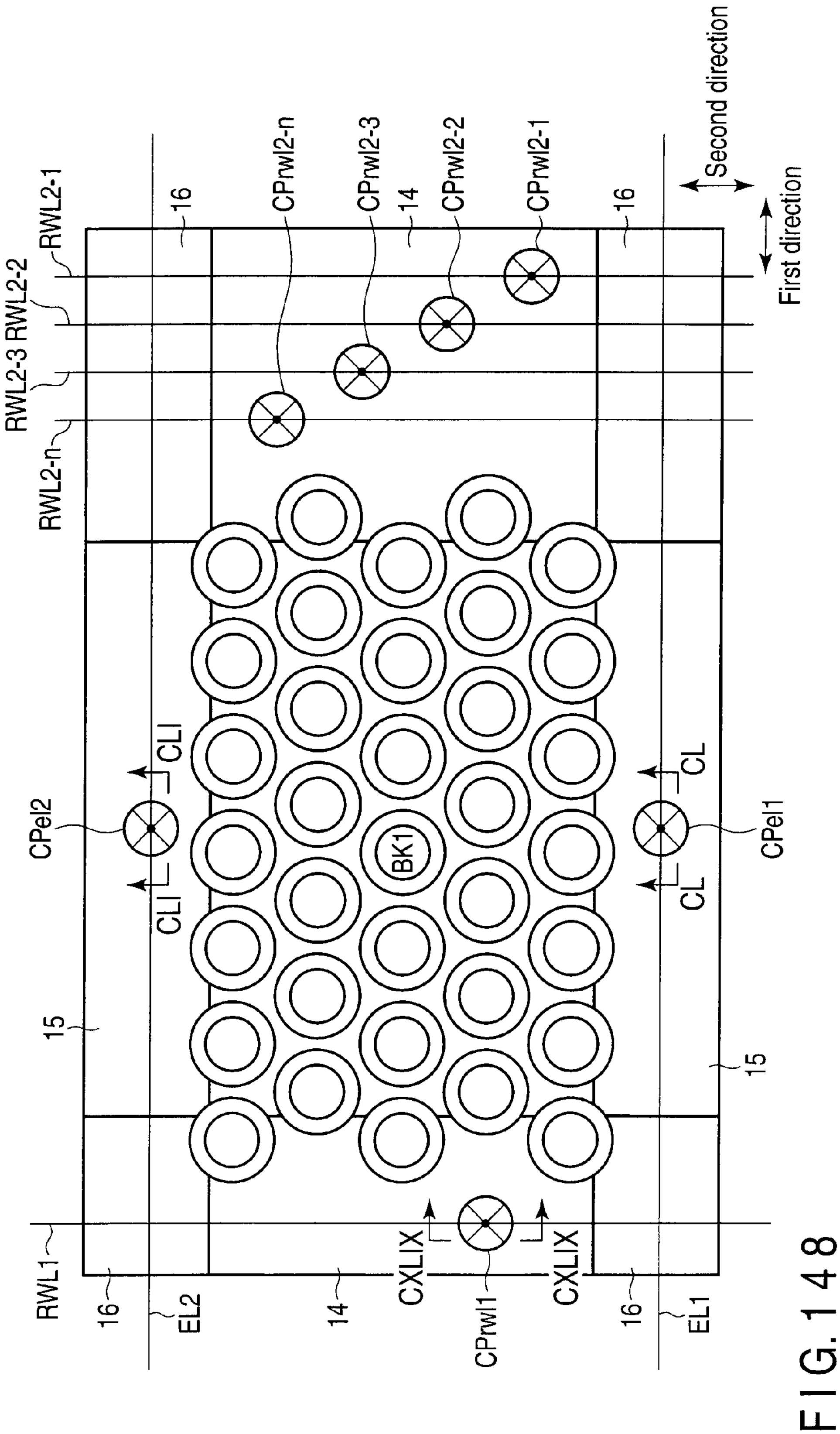
F I G. 1 4 8

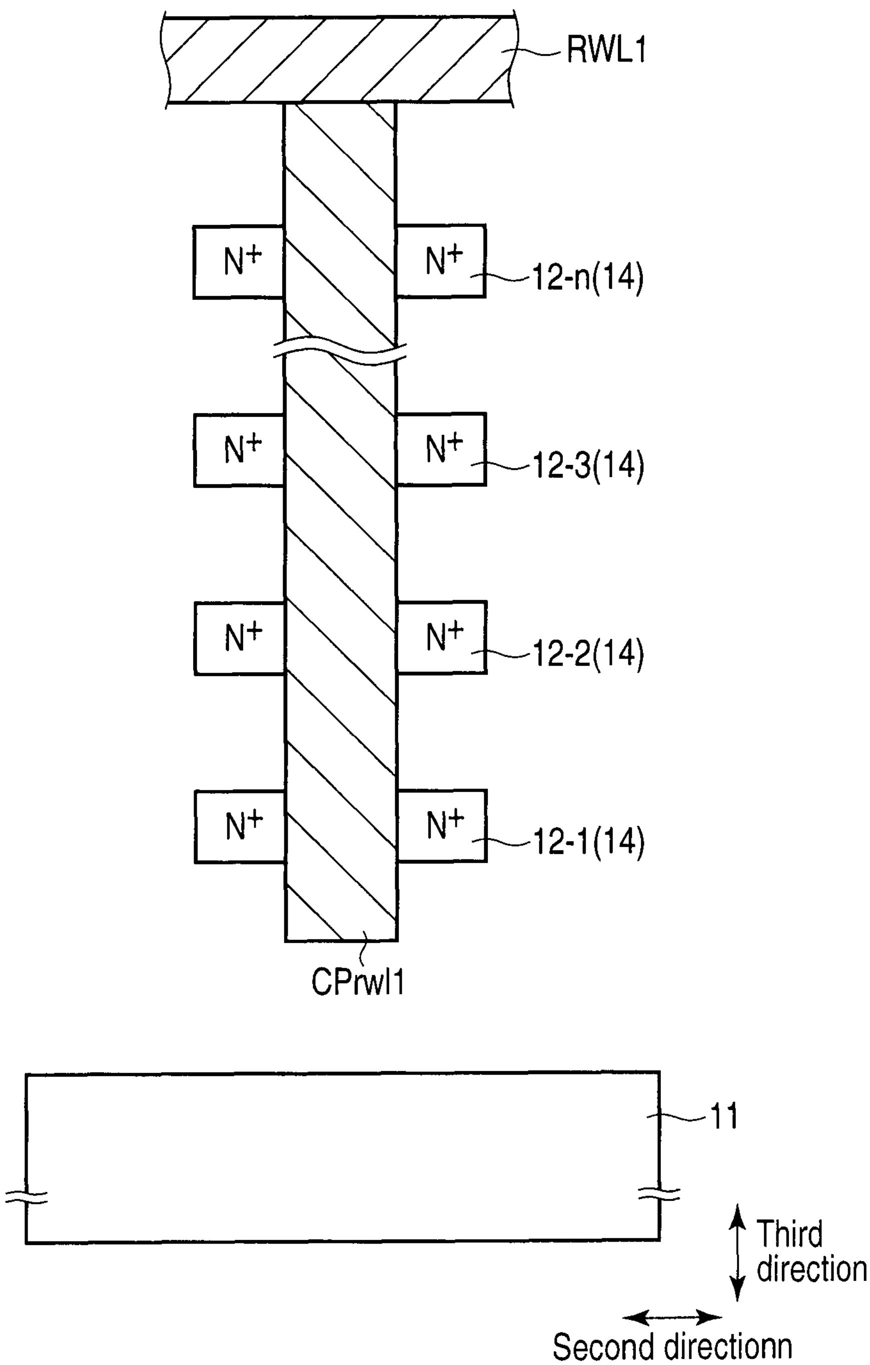
F I G. 1 4 9

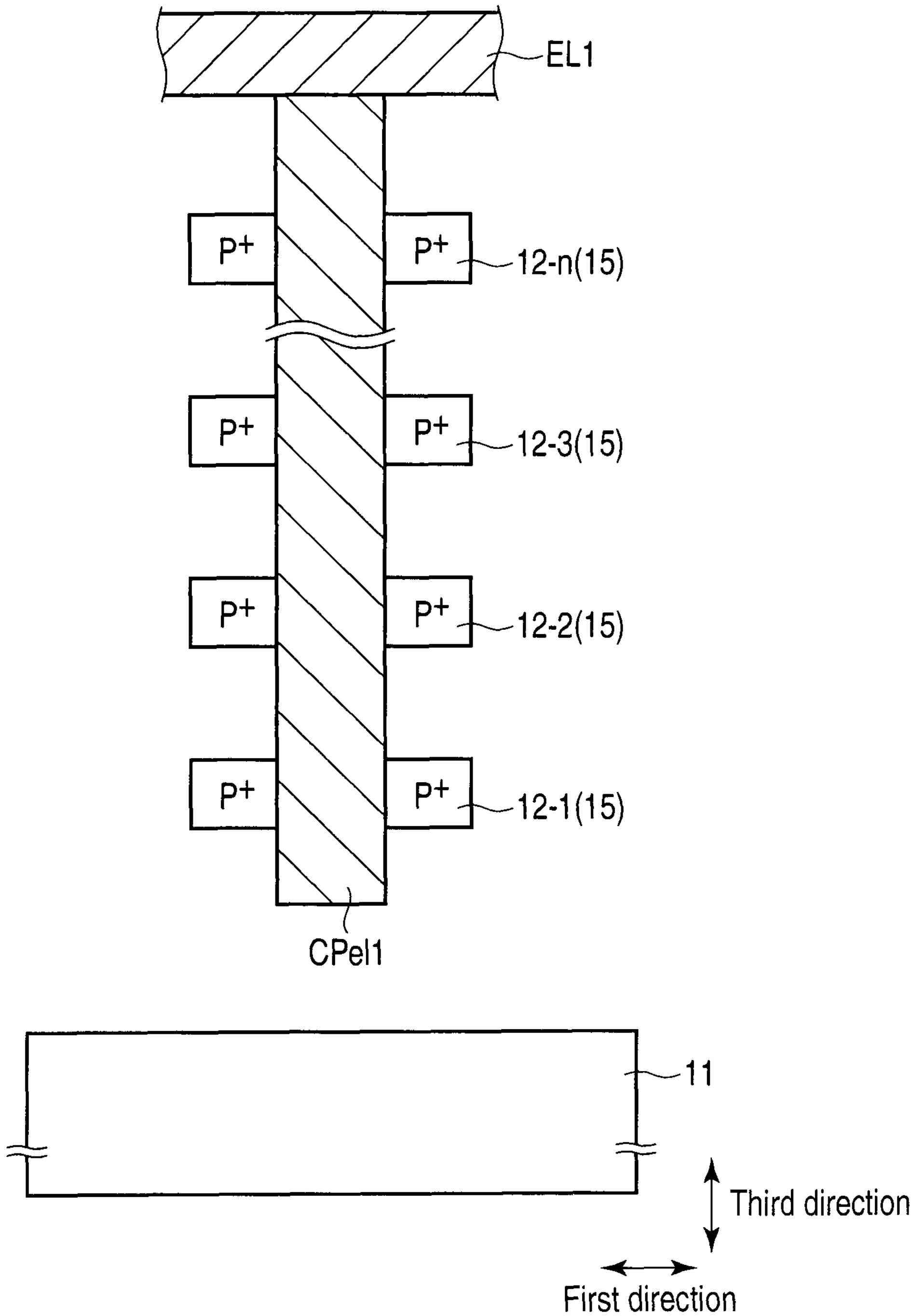
F I G. 1 5 0

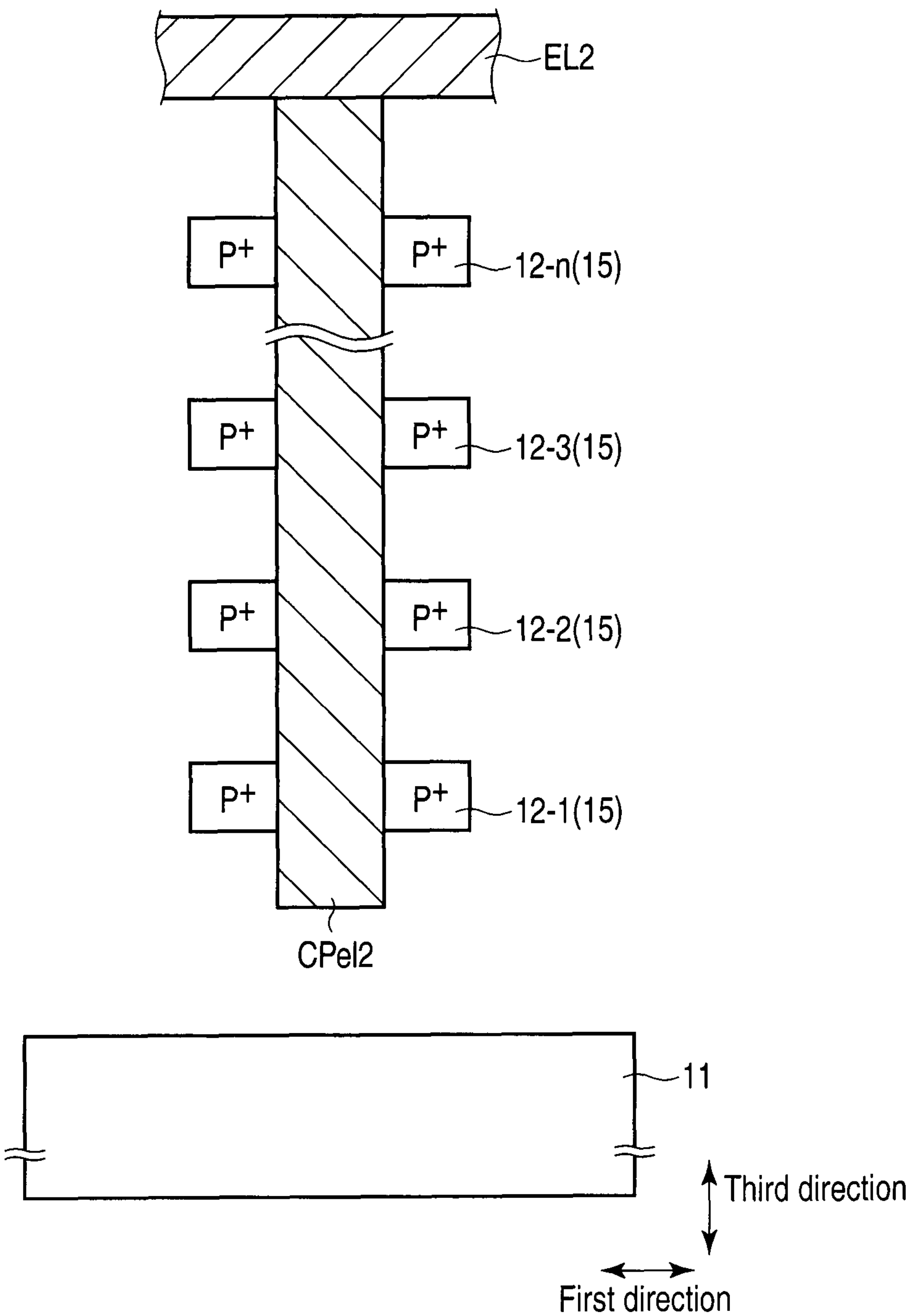
F I G. 1 5 1

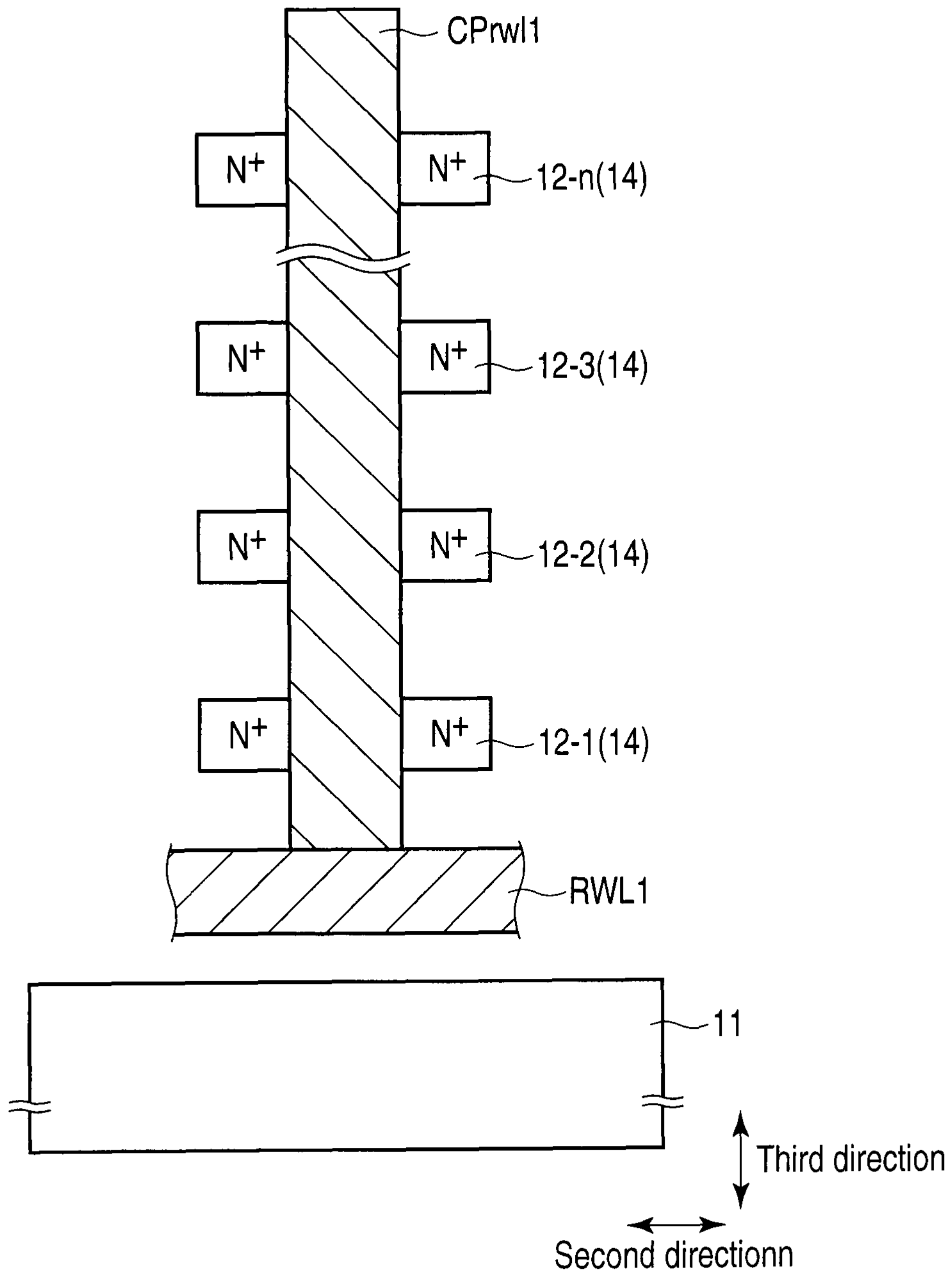
F I G. 1 5 2

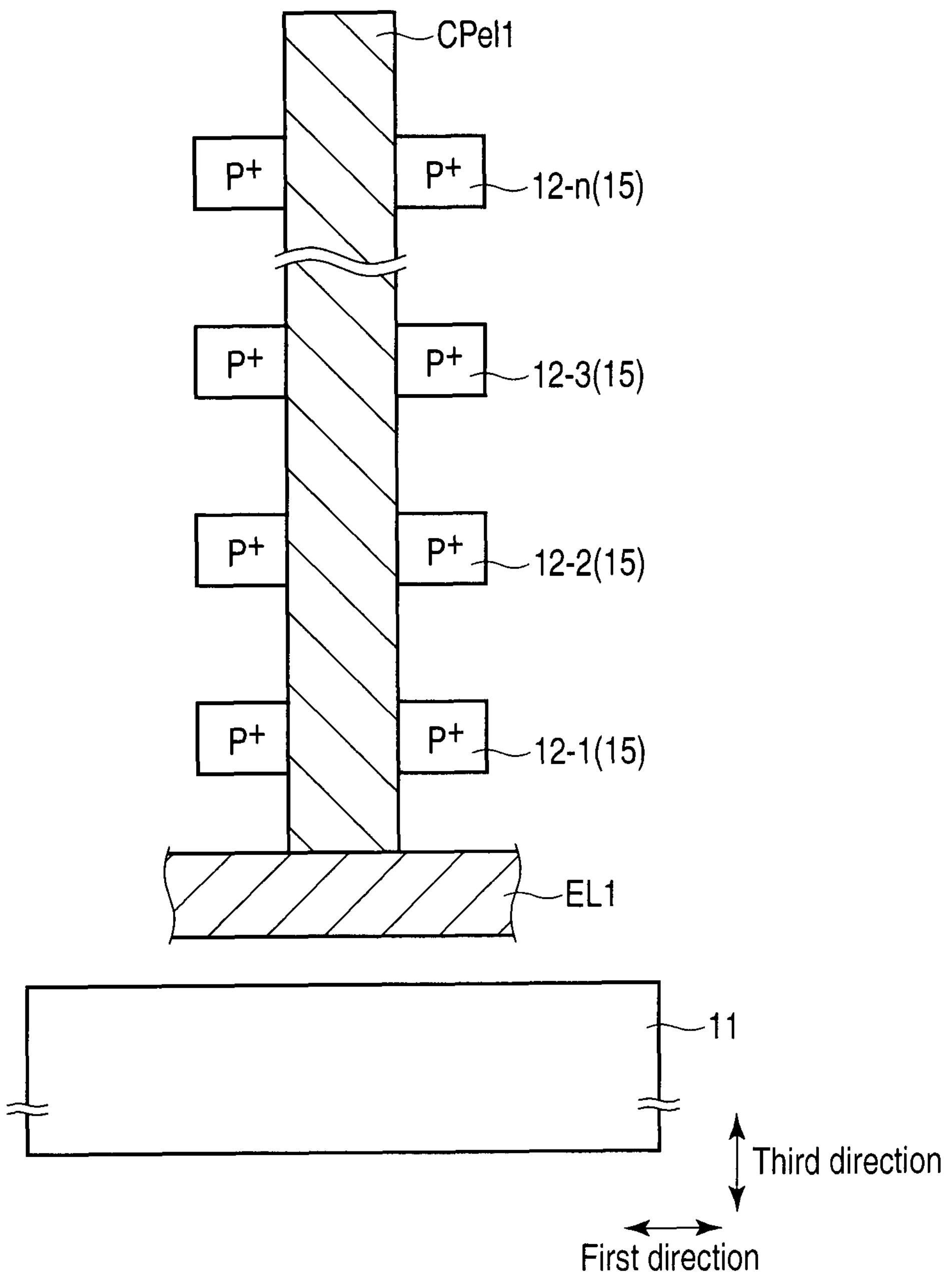
F I G. 1 5 3

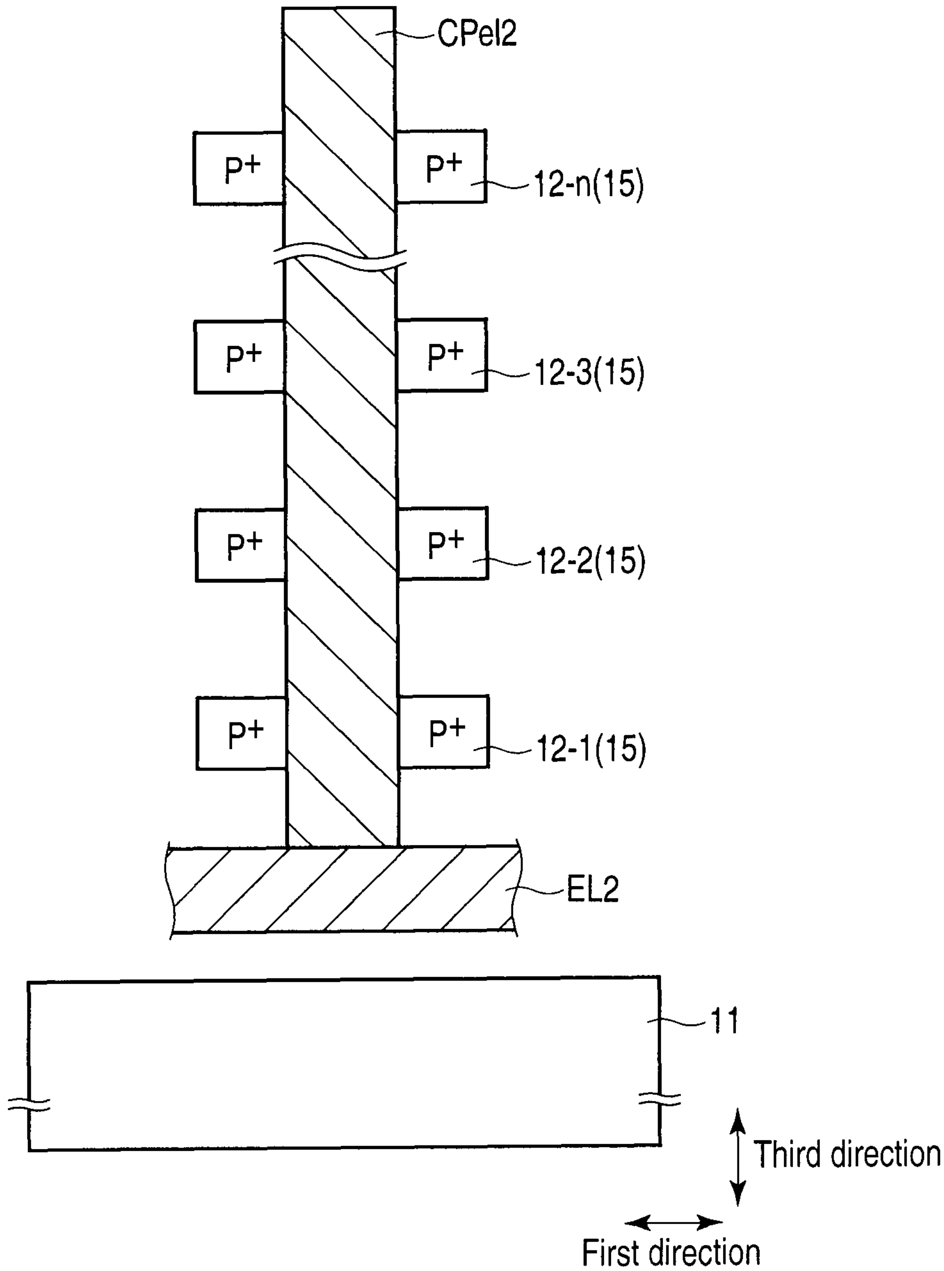
F I G. 1 5 4

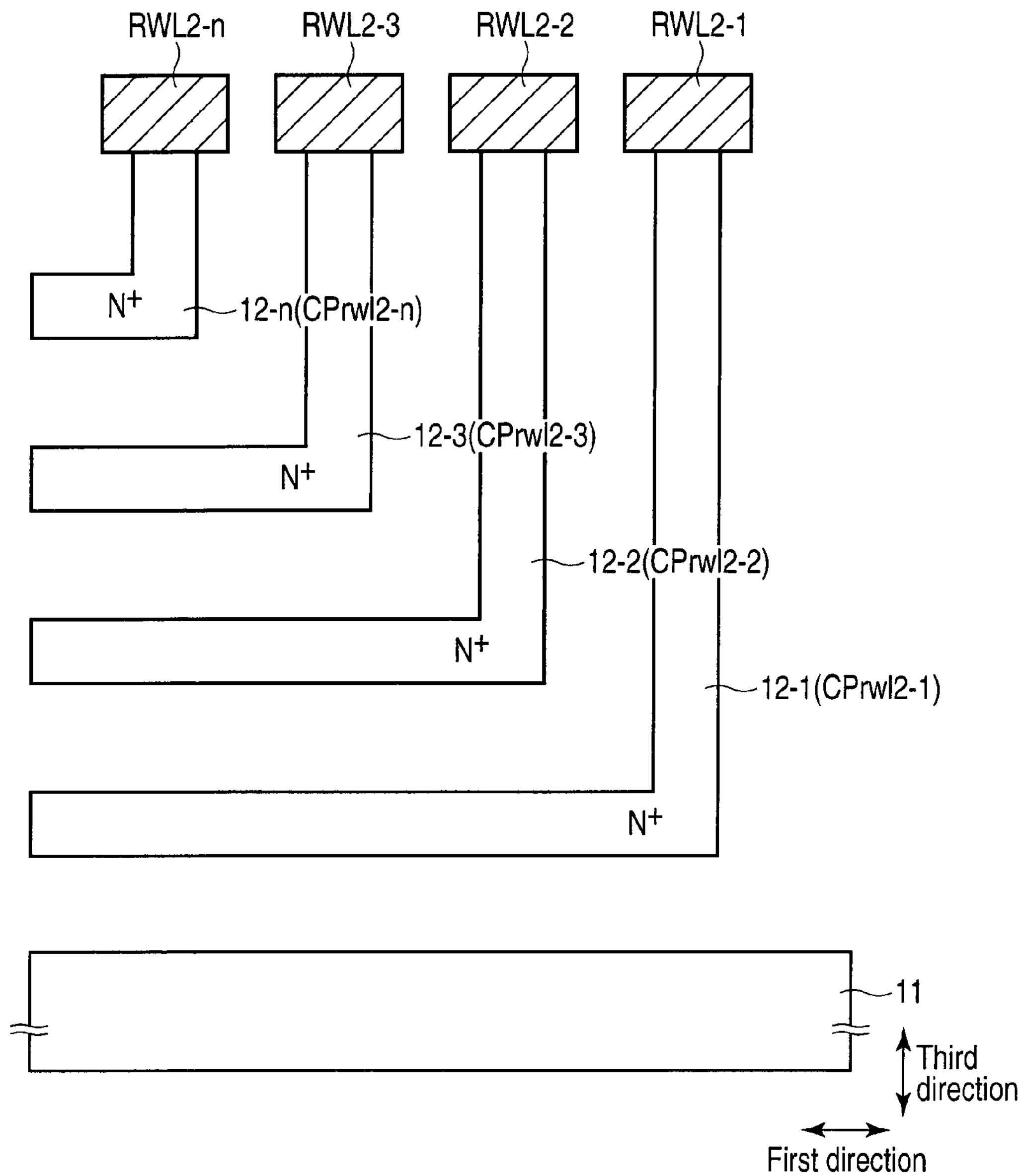
F I G. 1 5 8

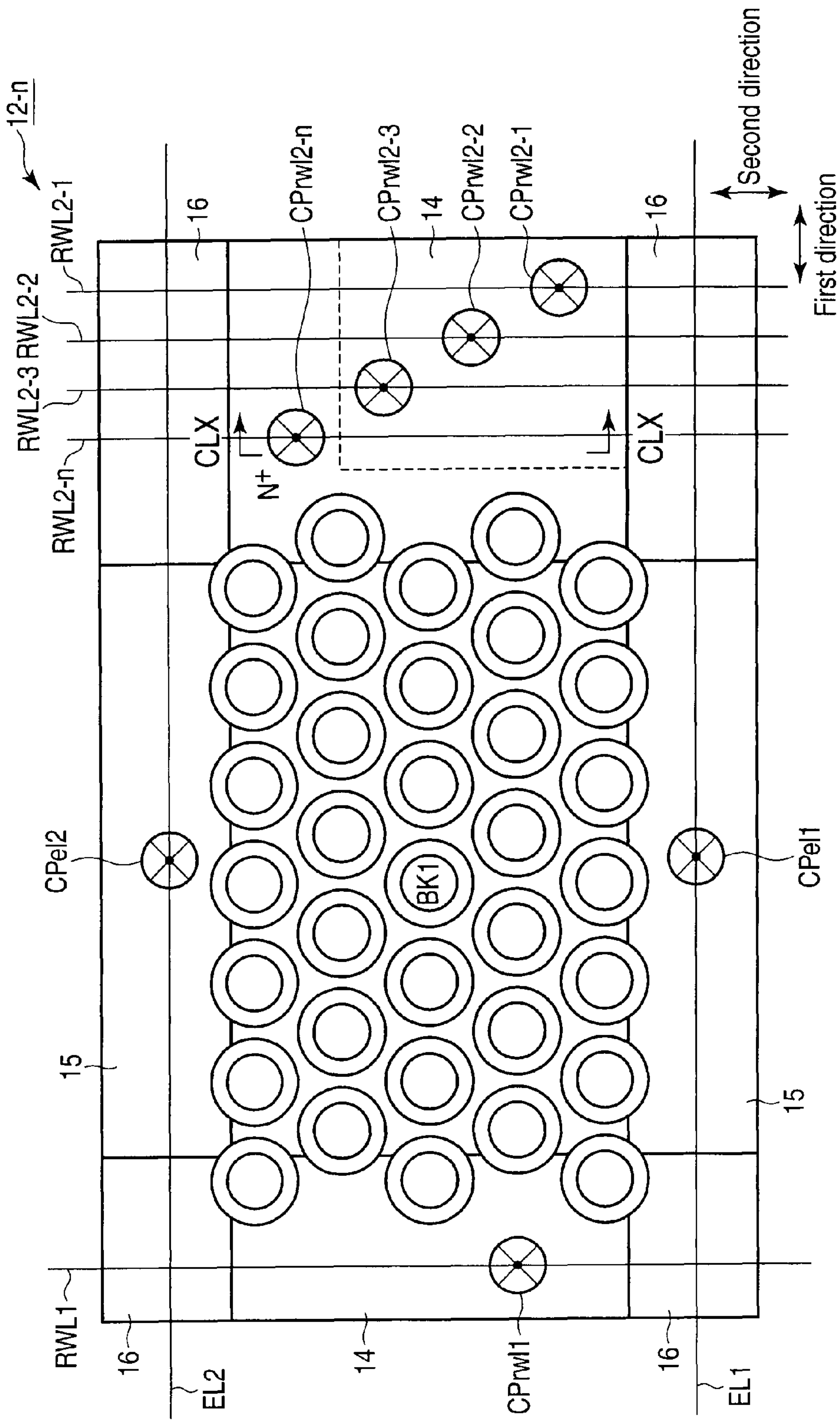
F I G. 1 5 9

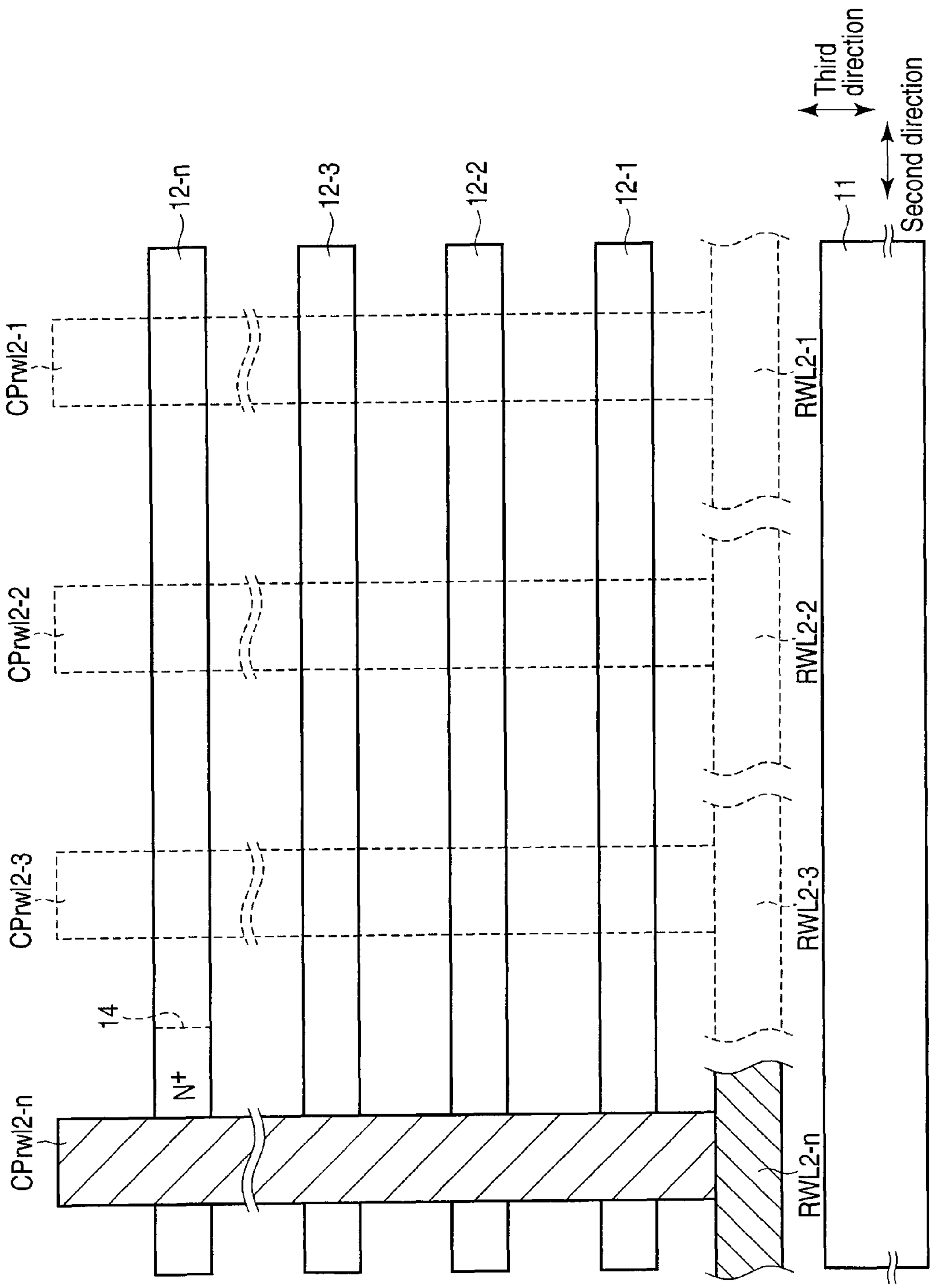
F I G. 1 6 1

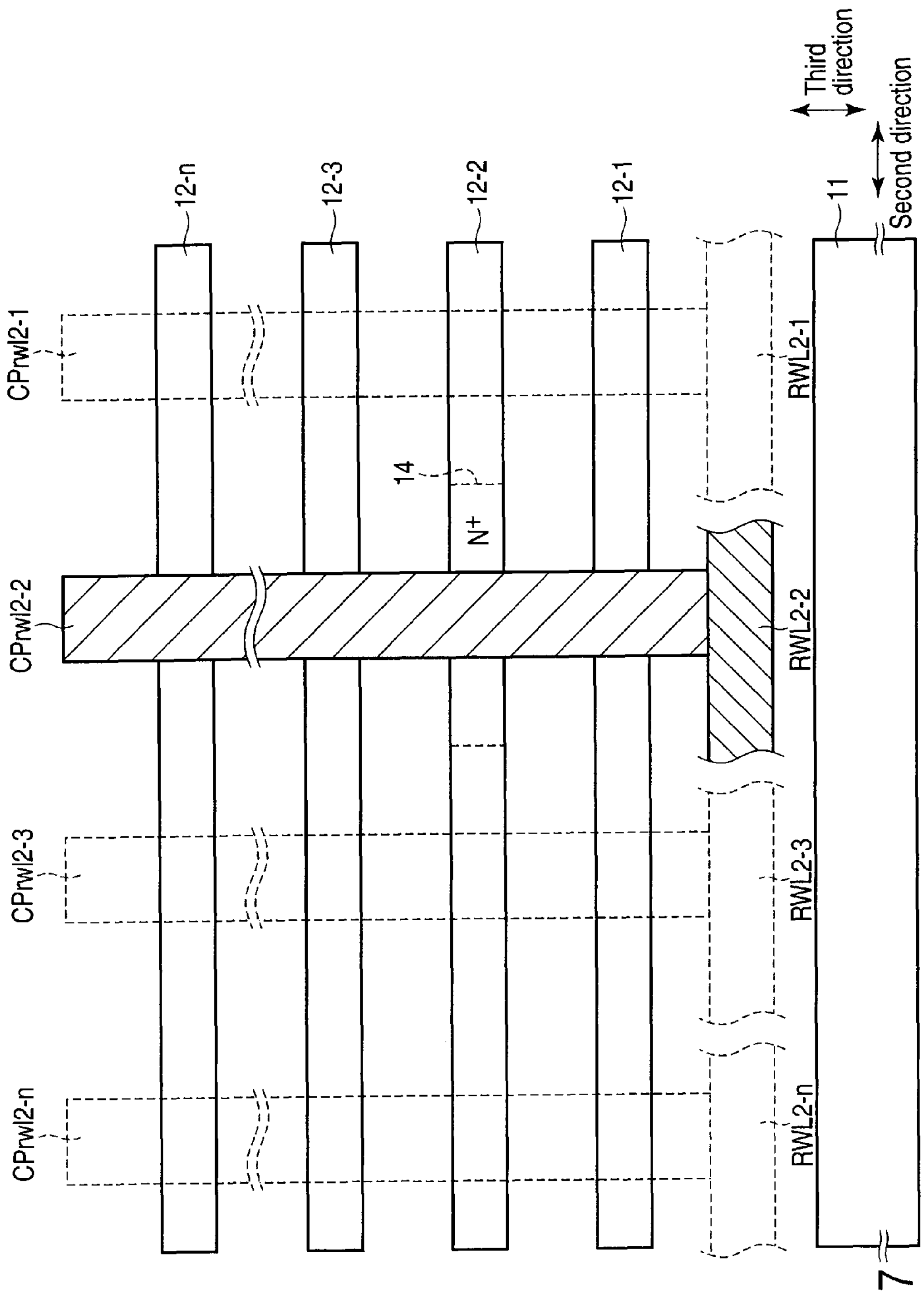
F I G. 1 6 7

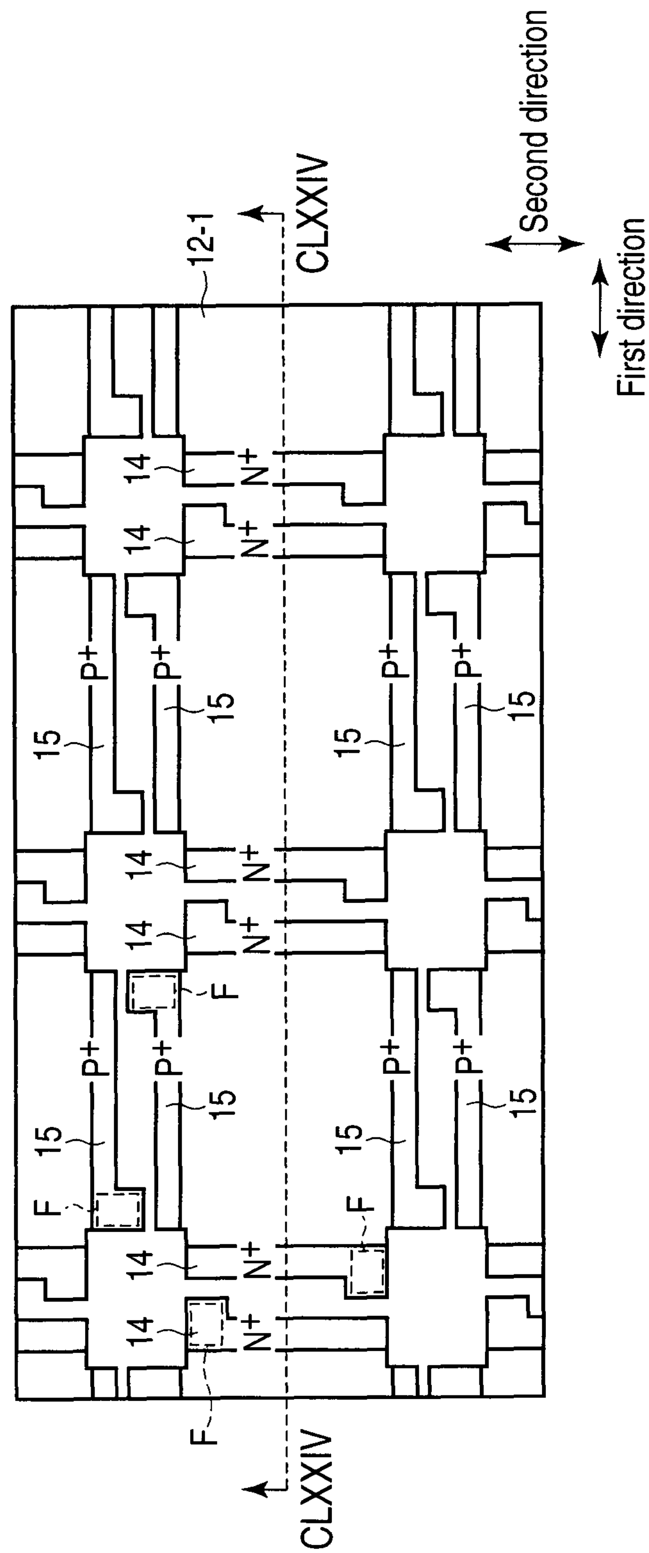
F I G. 1 7 3

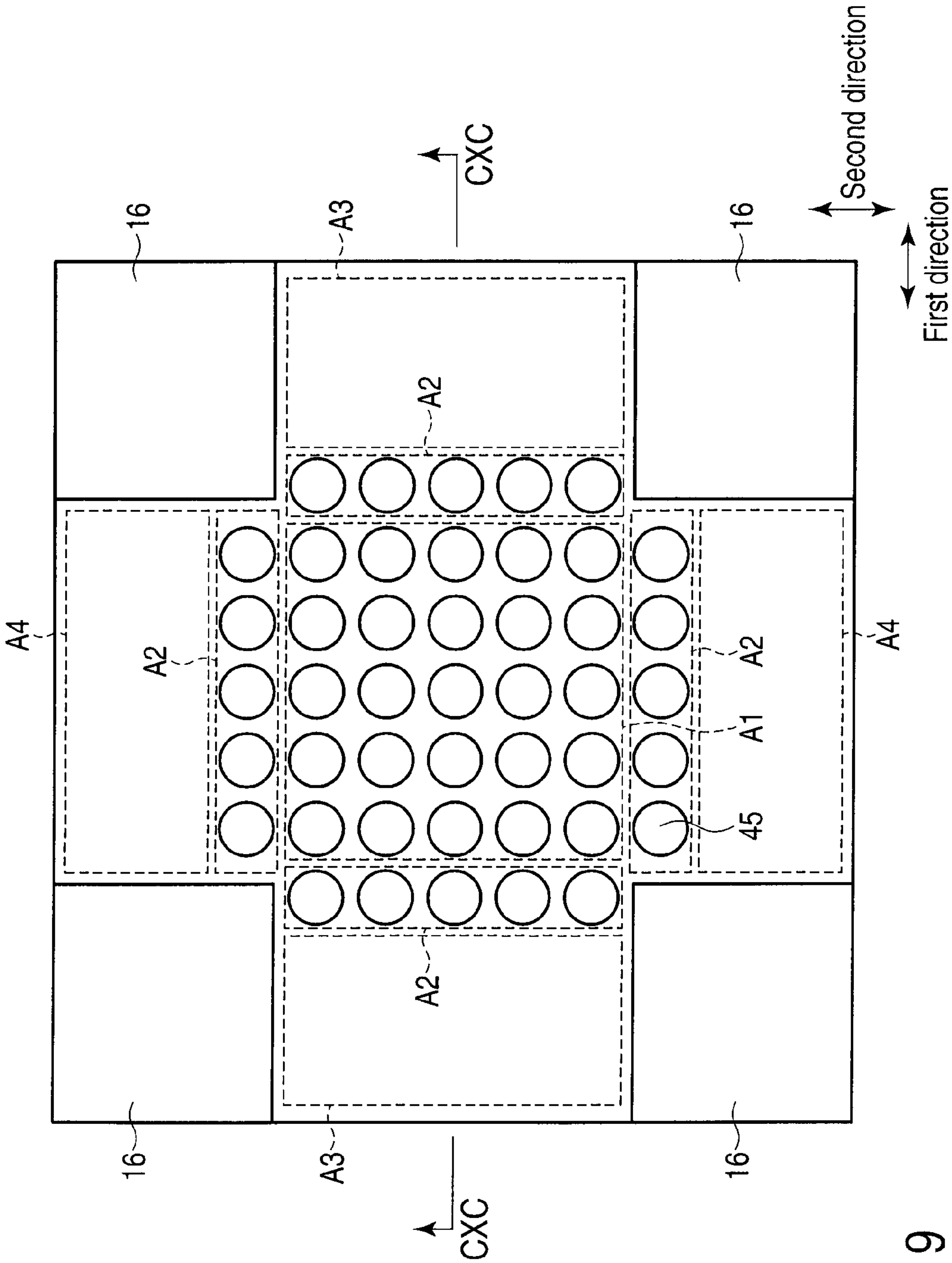
F I G. 1 8 9

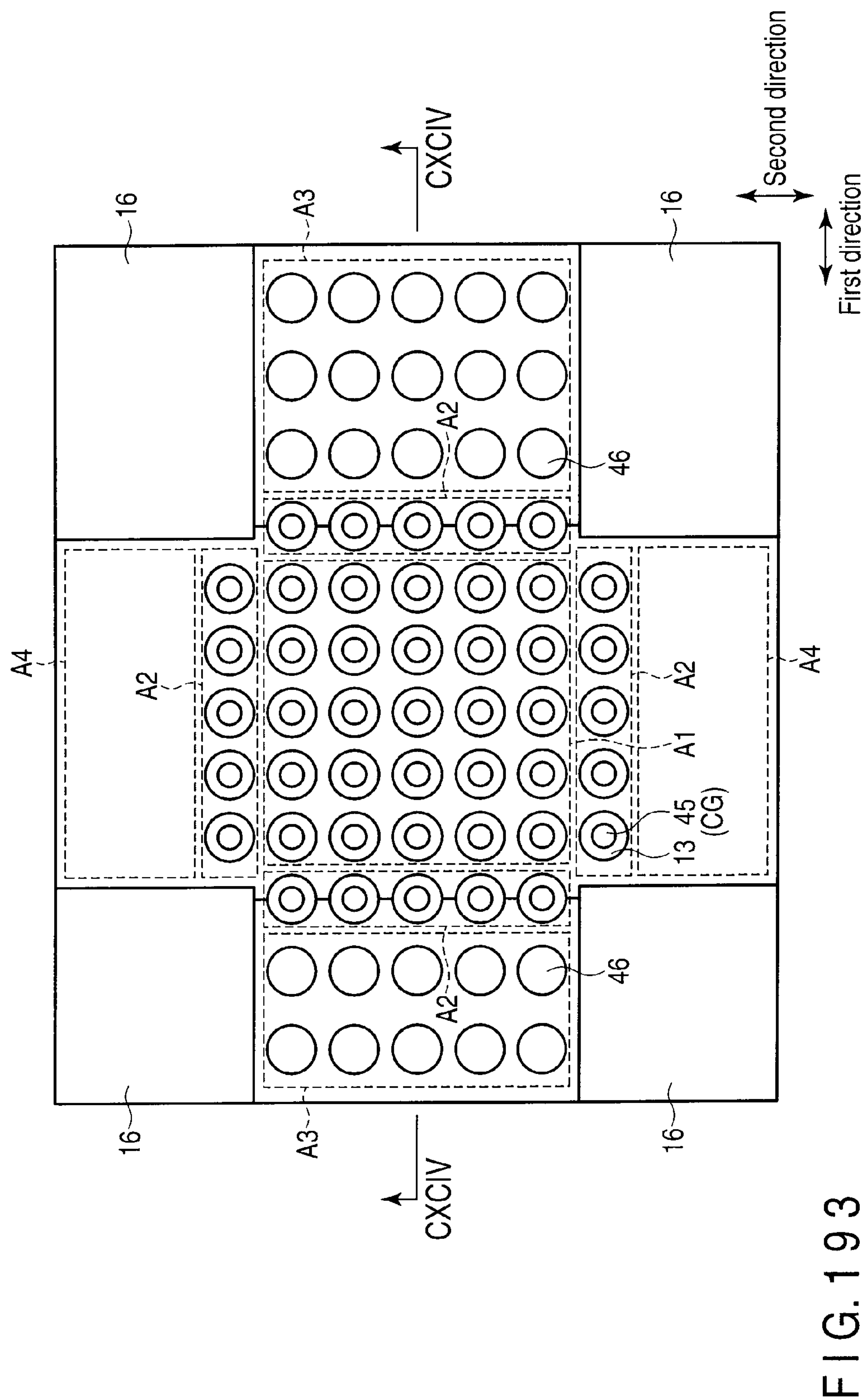
F I G. 1 9 3

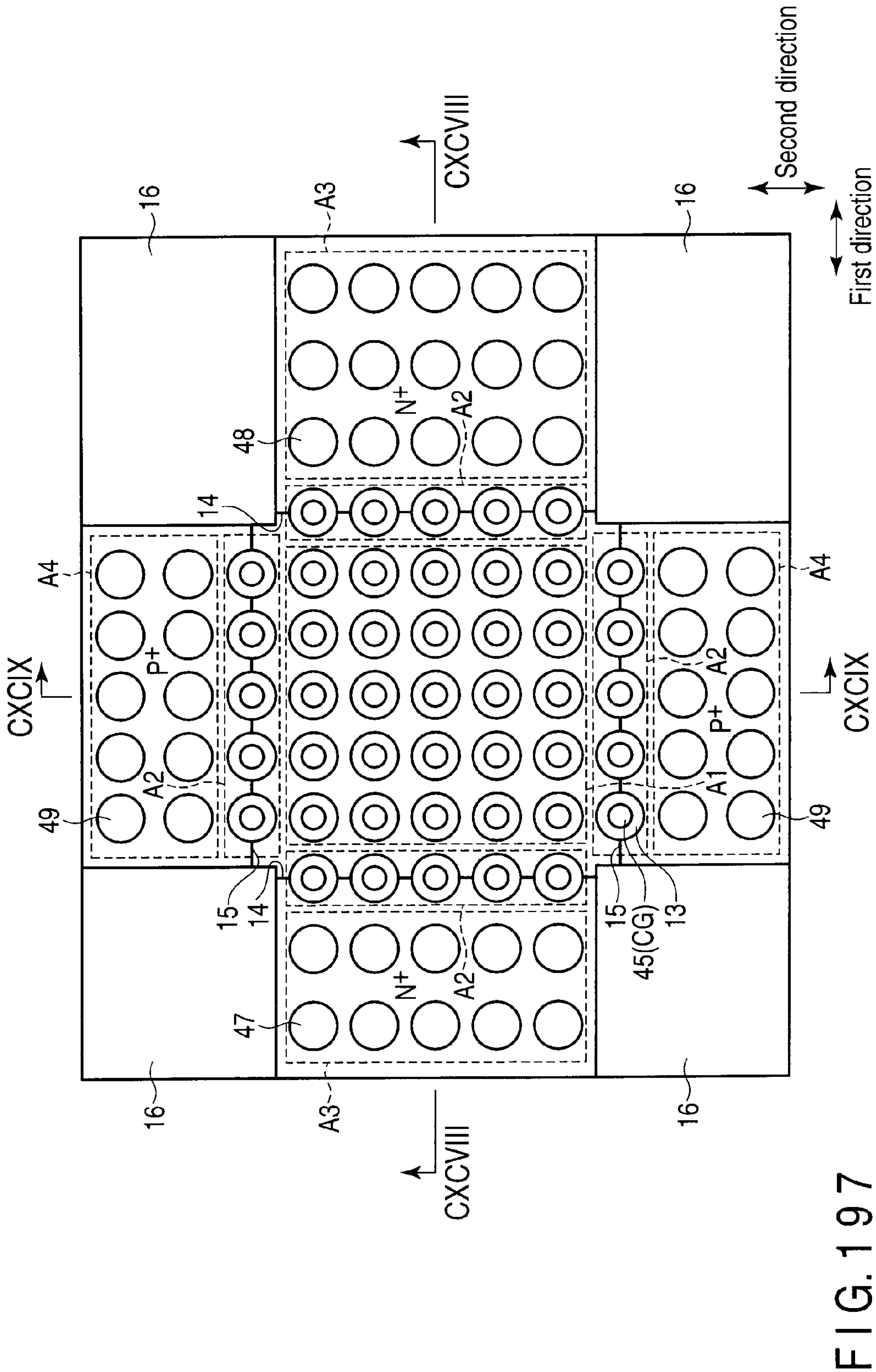
F I G. 1 9 7

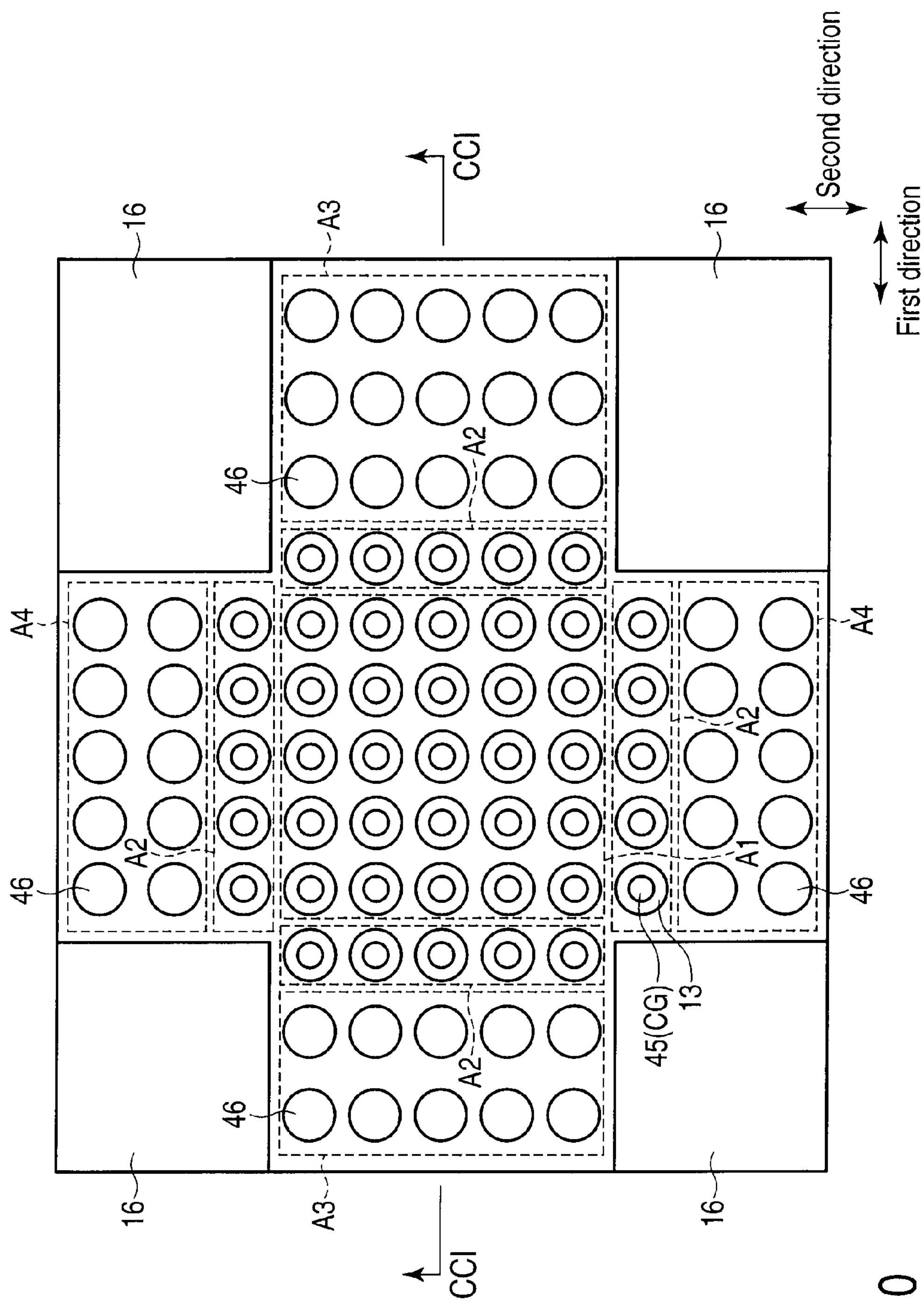
F I G. 2 0 0

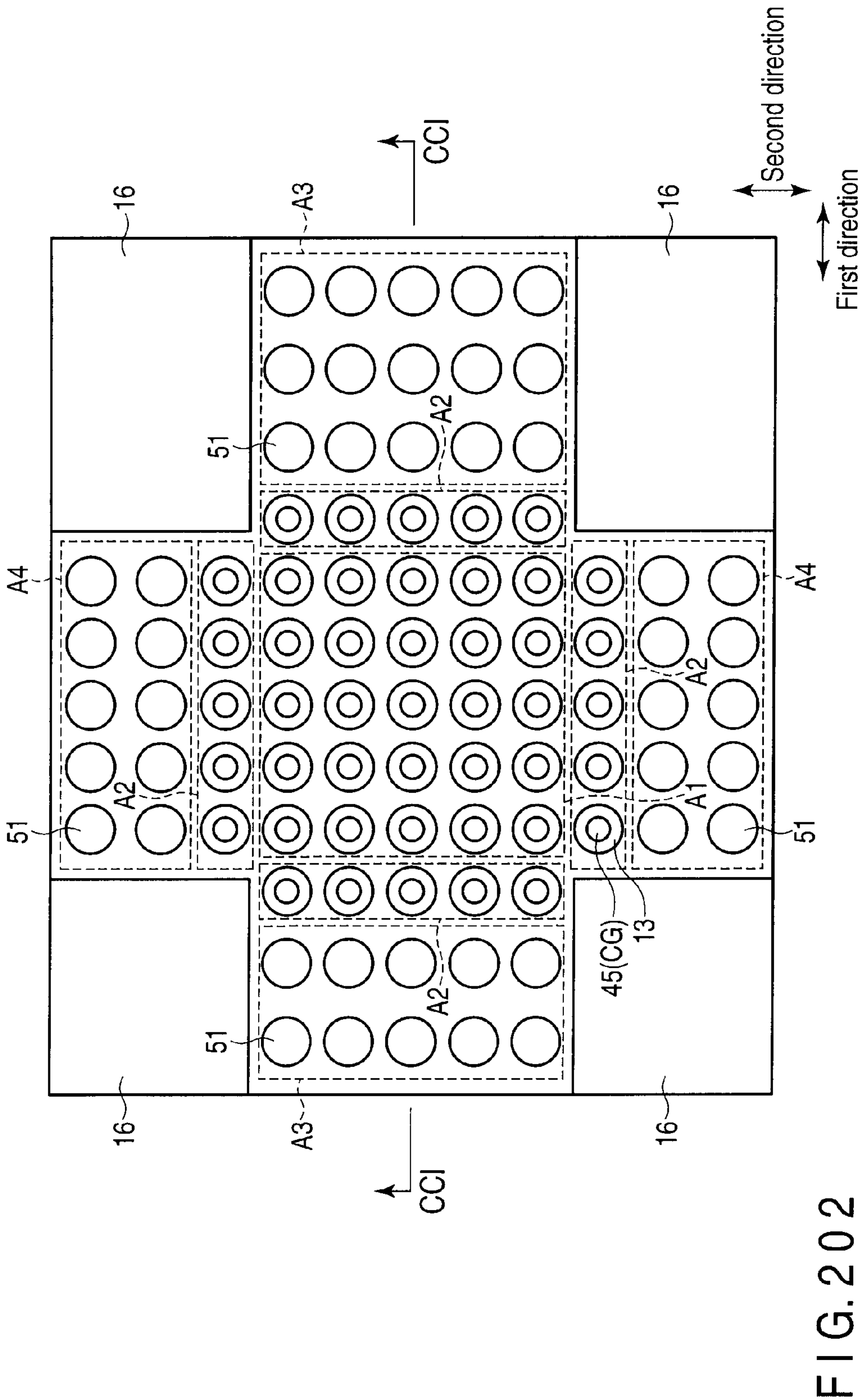
F I G. 2 0 2

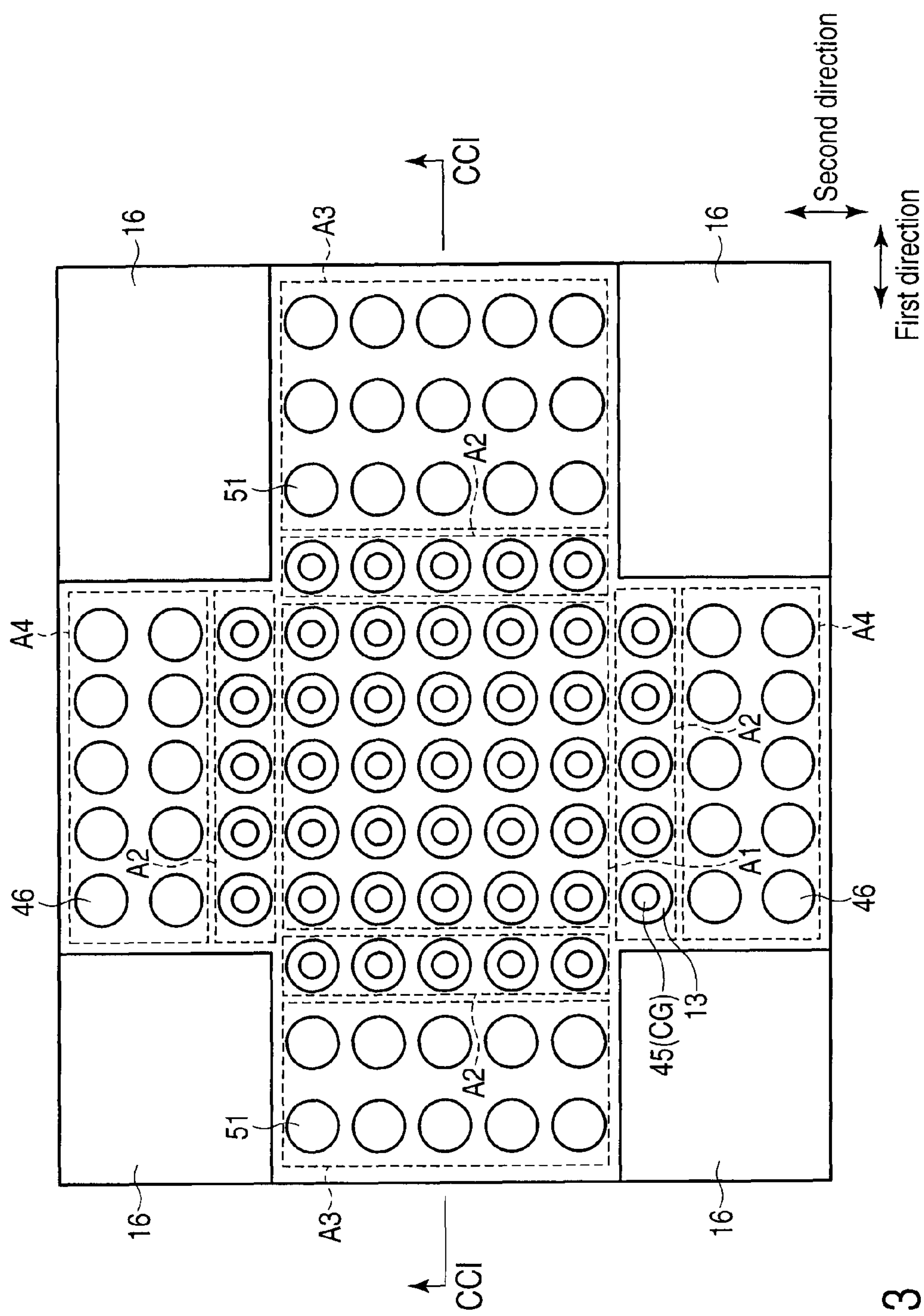
F I G. 2 0 3

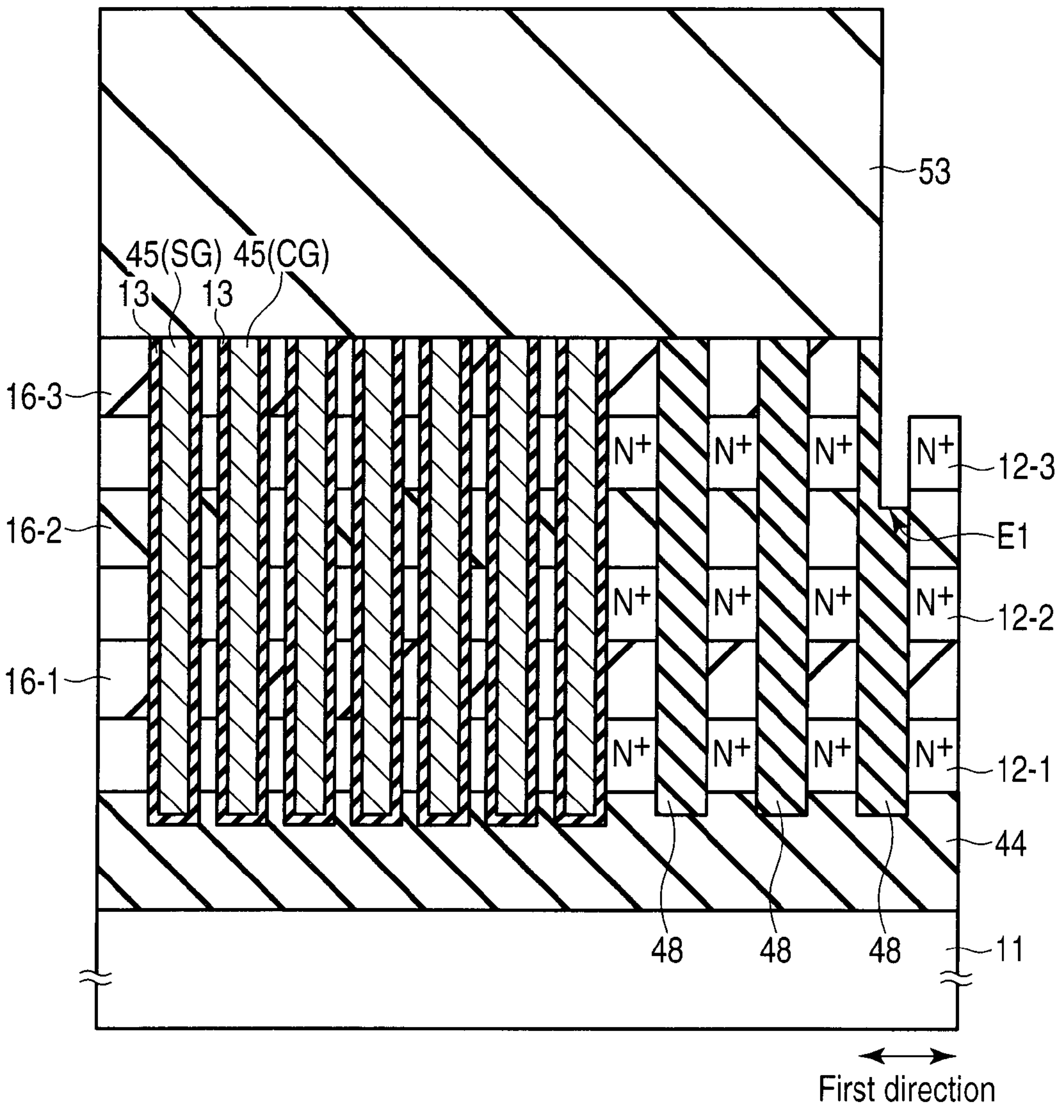
F I G. 2 0 8

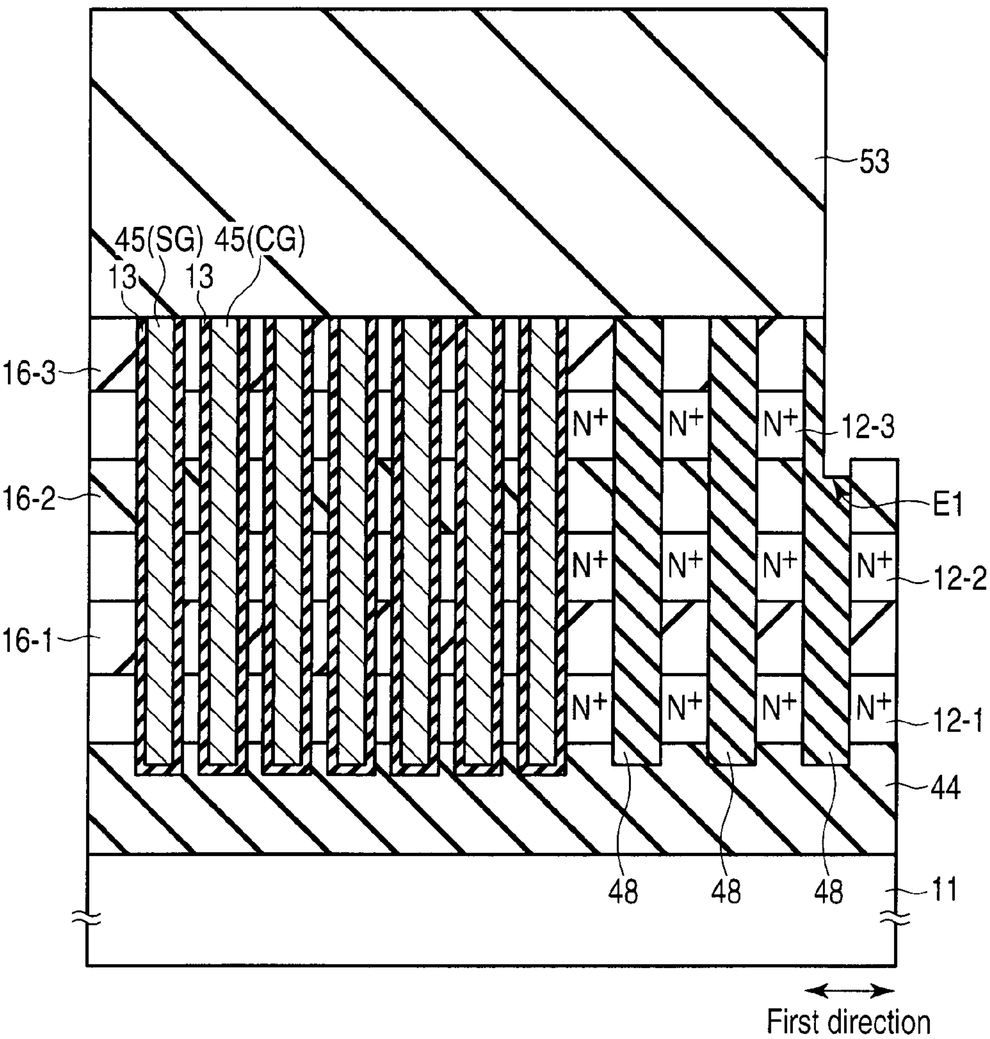
F I G. 2 0 9

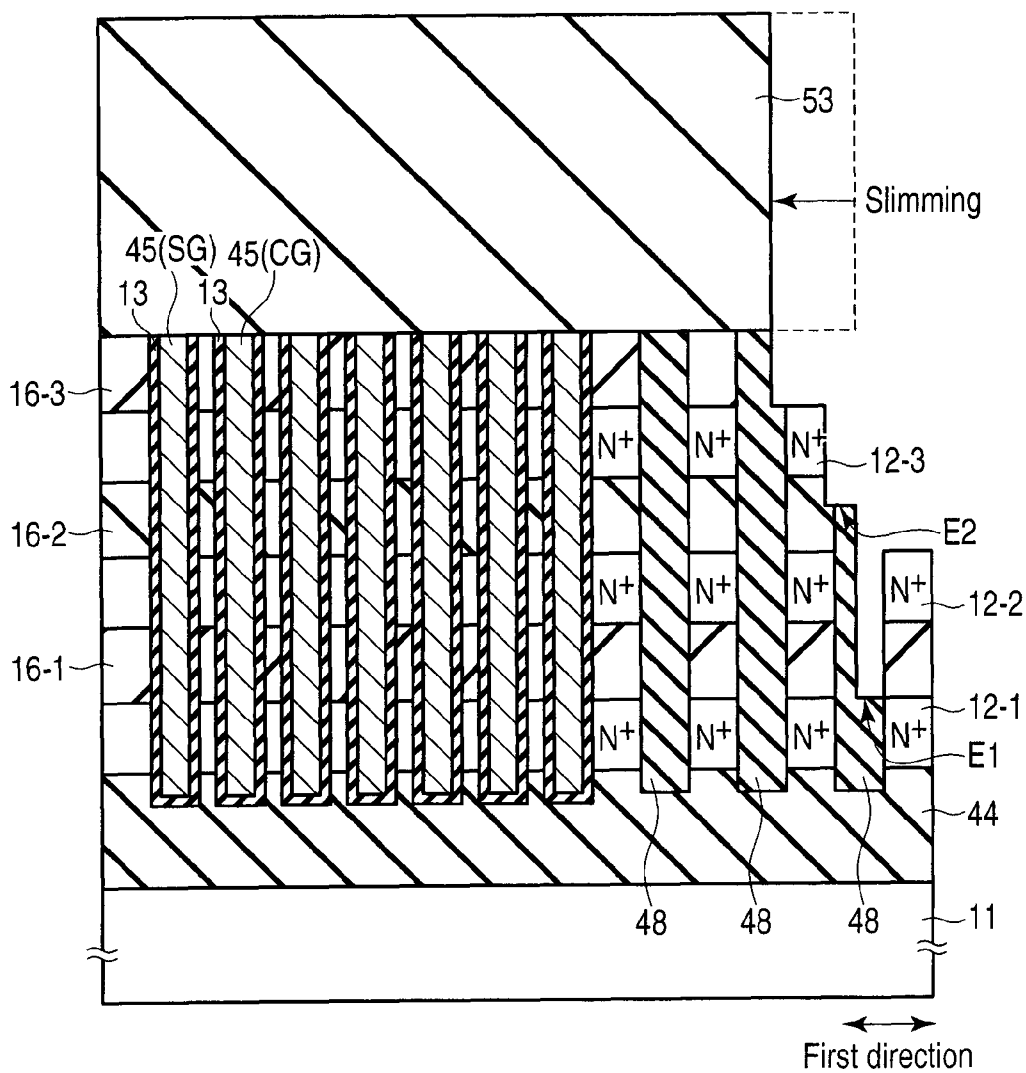
F I G. 2 1 0

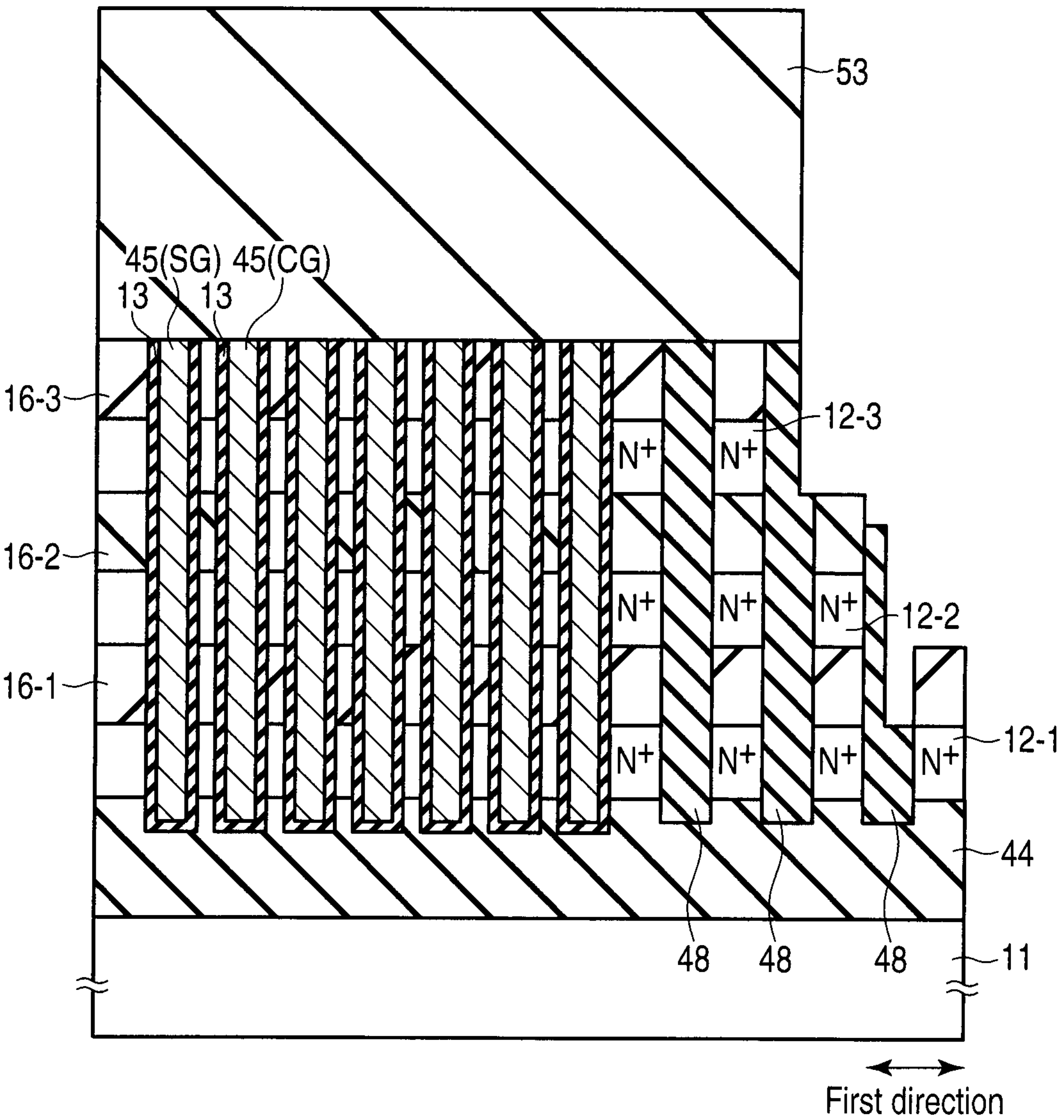
F I G. 2 1 1

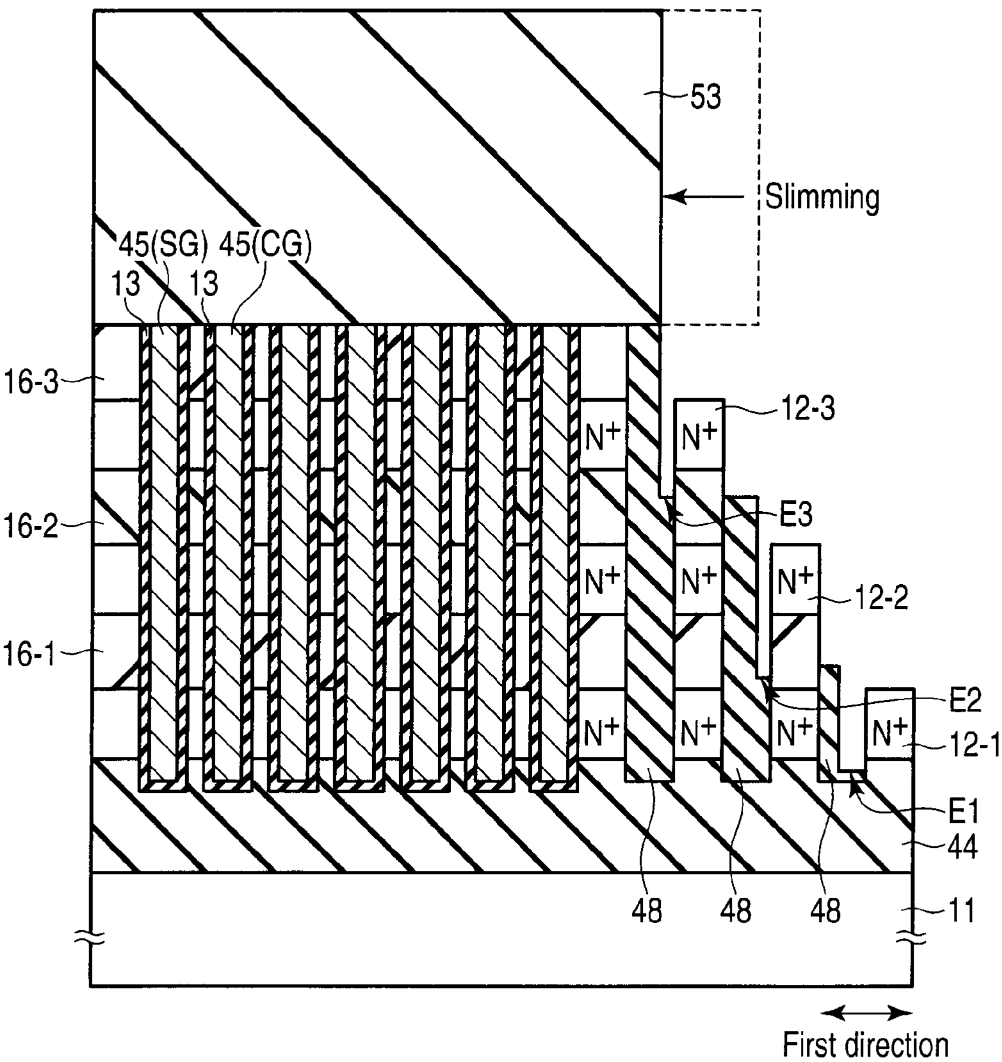
F I G. 2 1 2

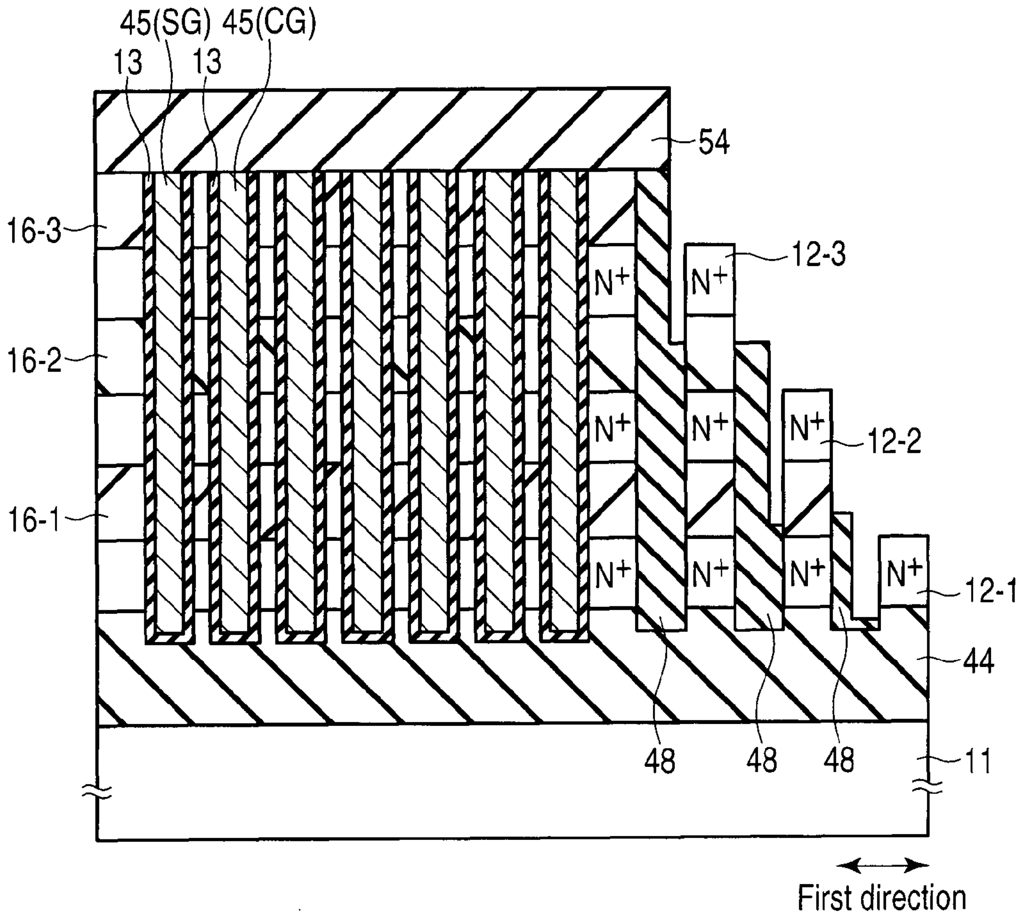
F I G. 2 1 3

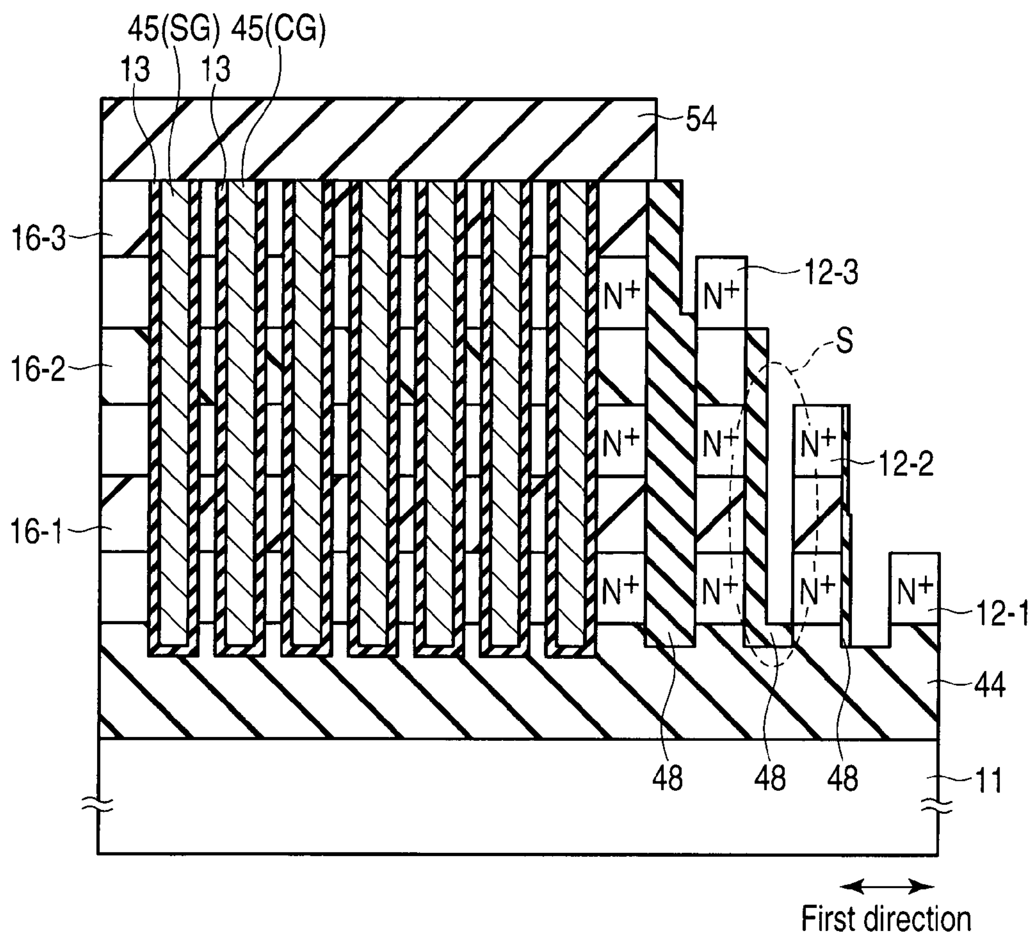
F I G. 2 1 4

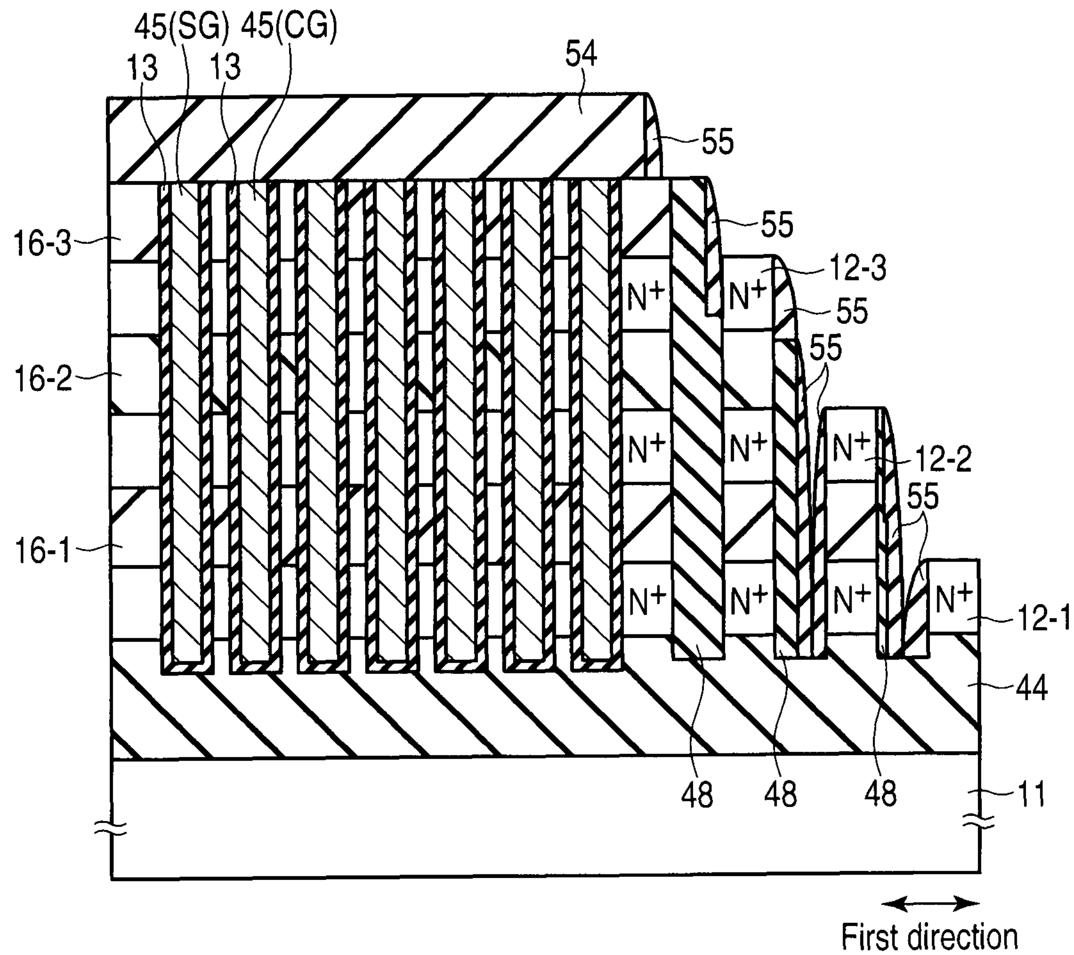
F I G. 2 1 5

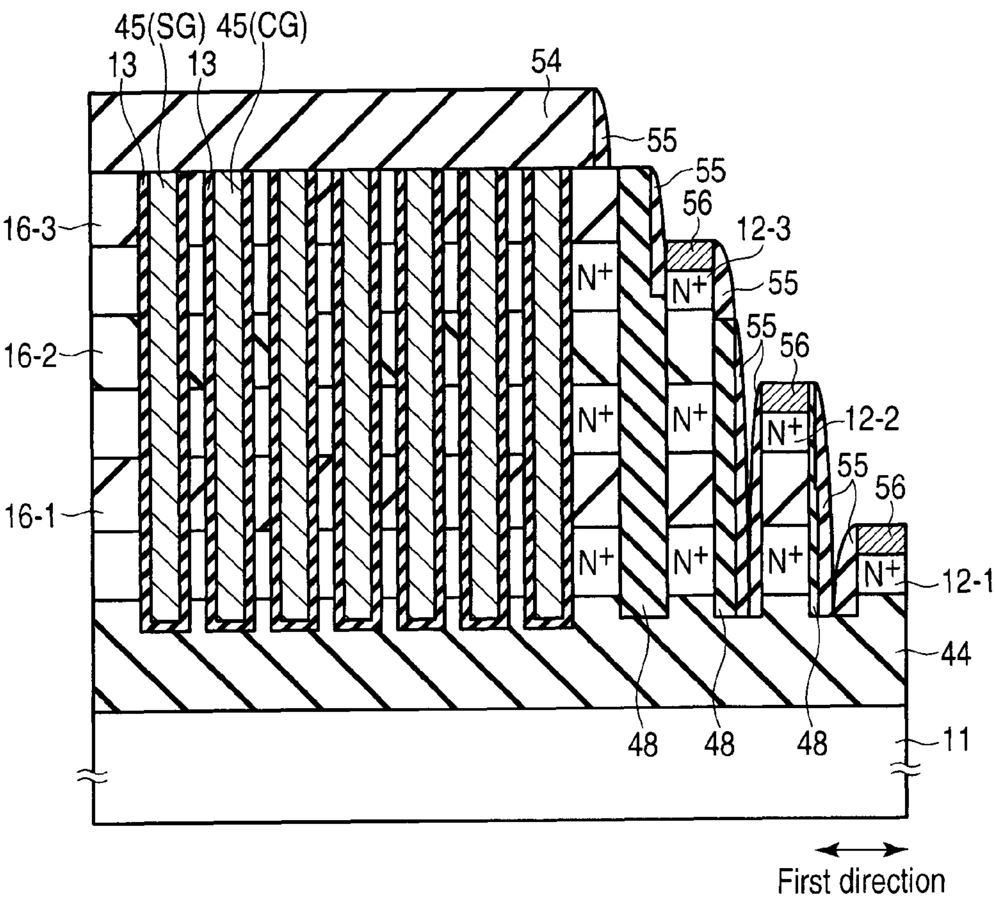
F I G. 2 1 6

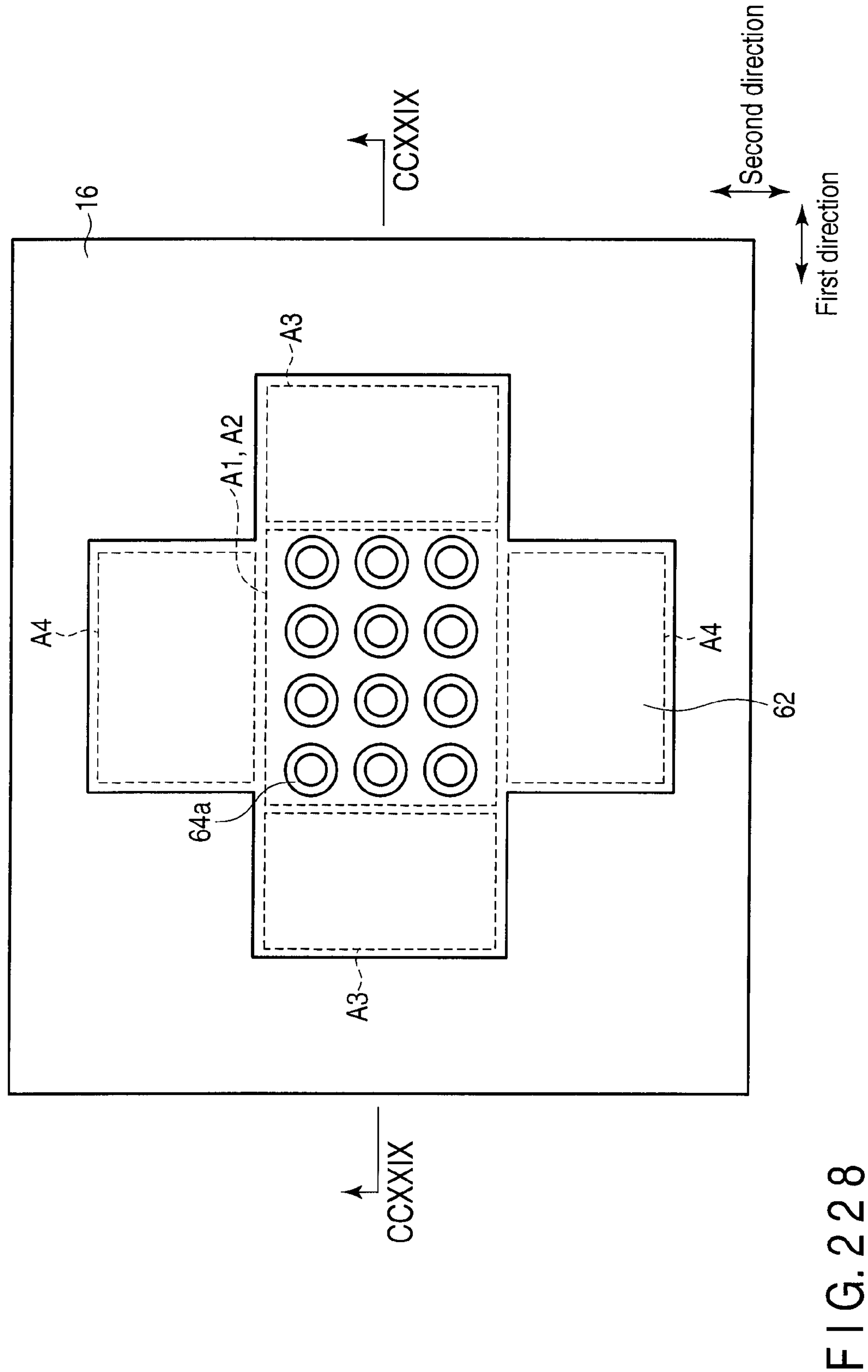
F I G. 2 2 8

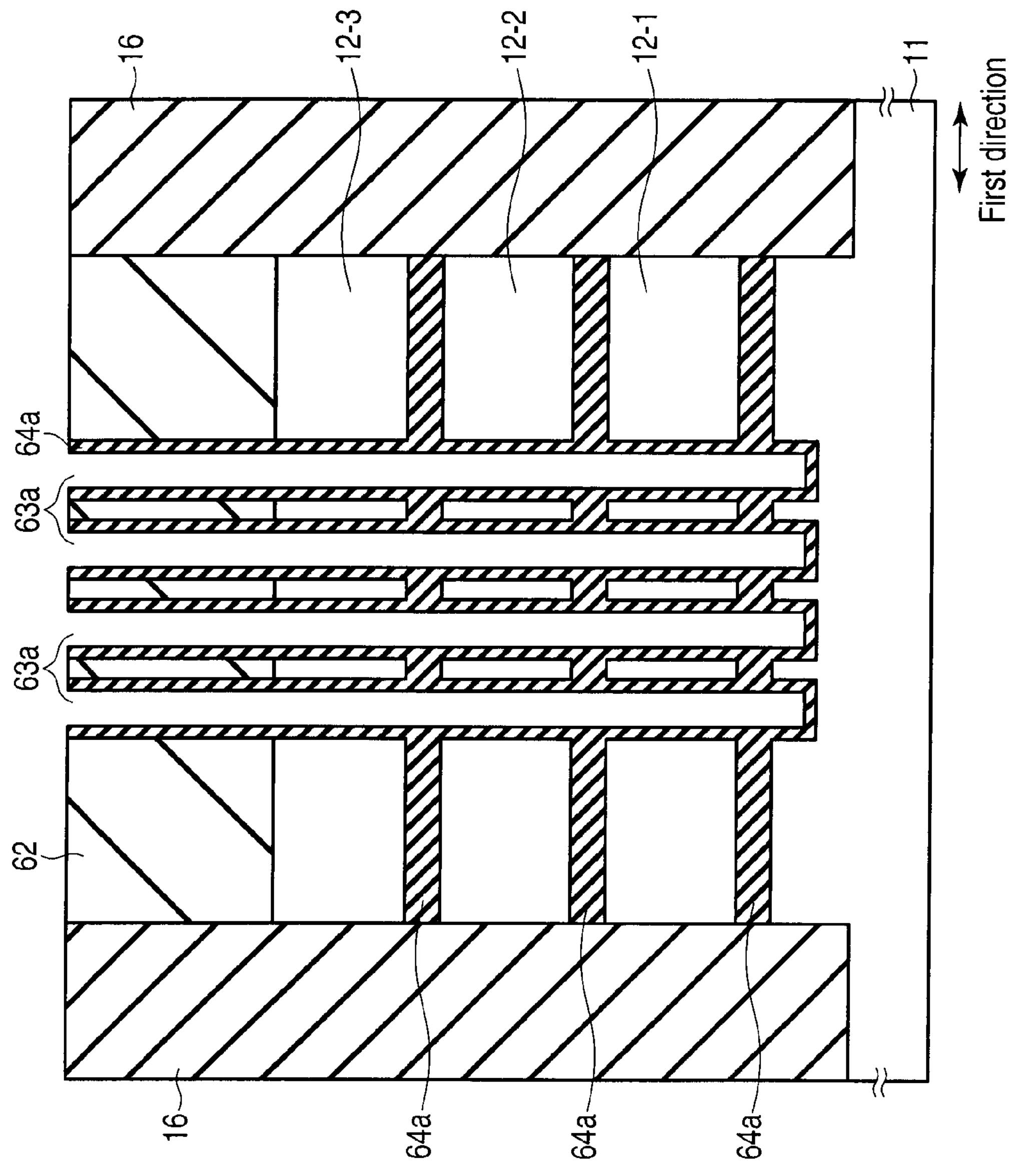
F I G. 2 2 9

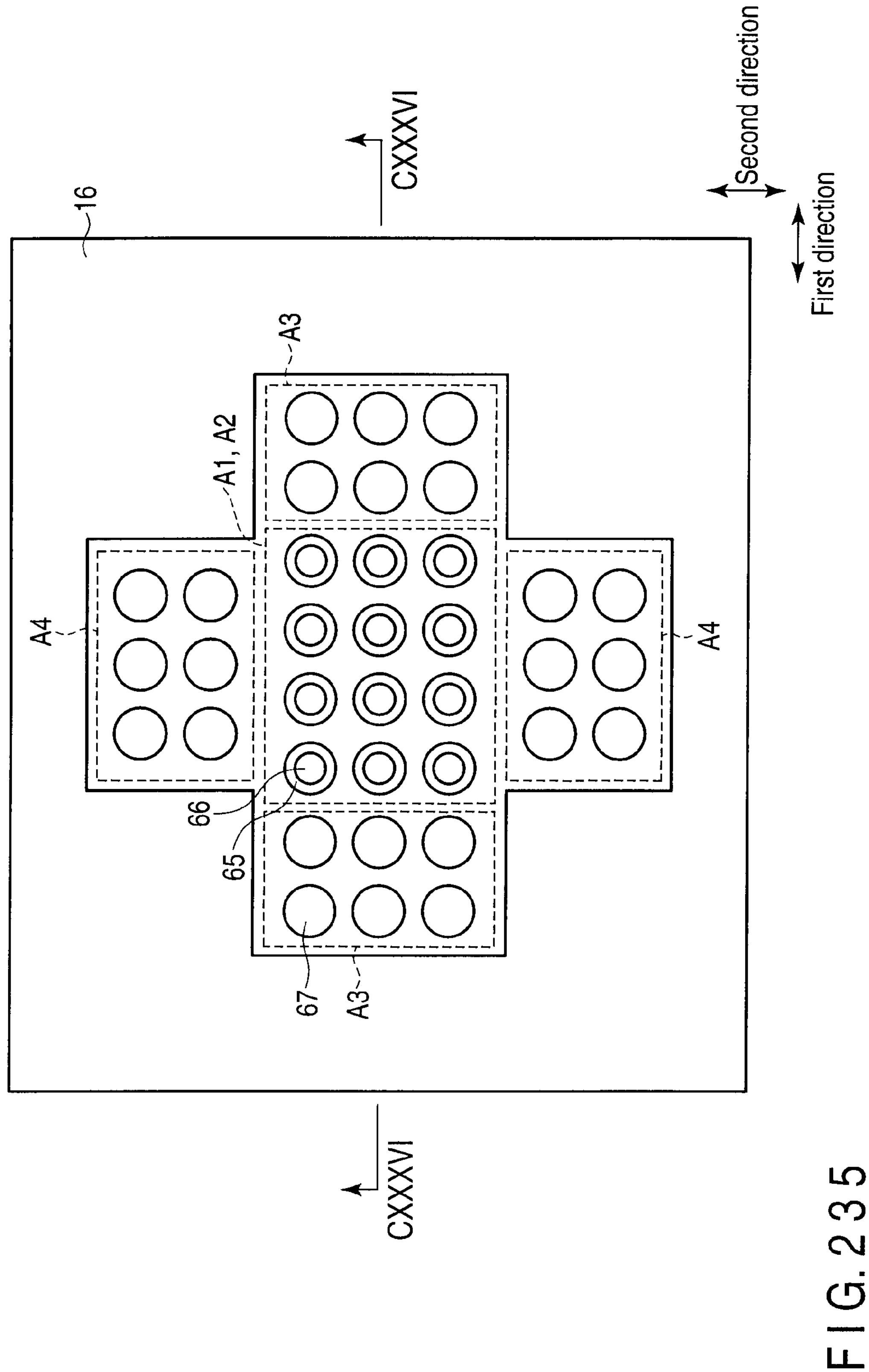
F I G. 2 3 5

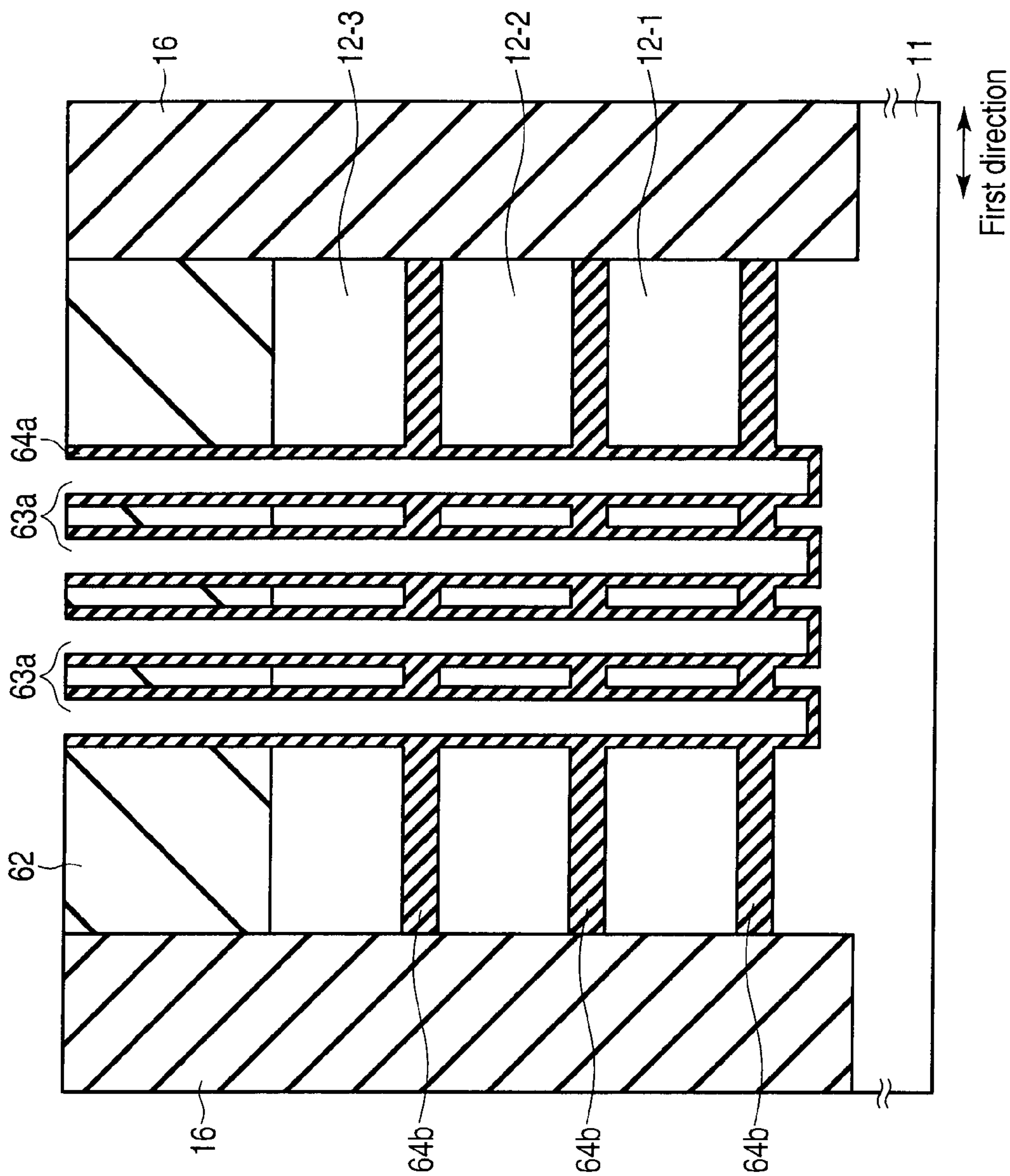
F I G. 2 3 8

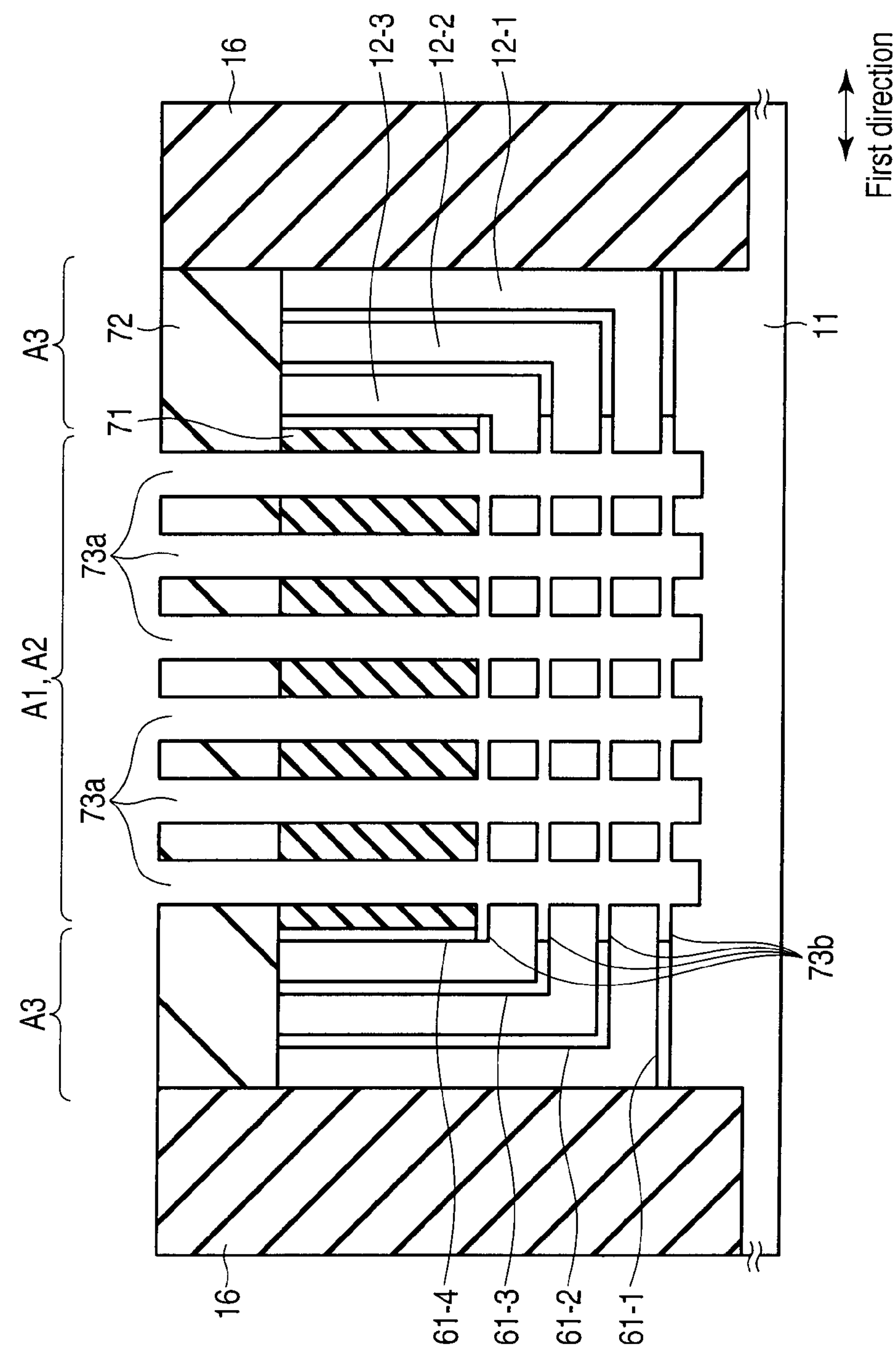
F I G. 2 5 3

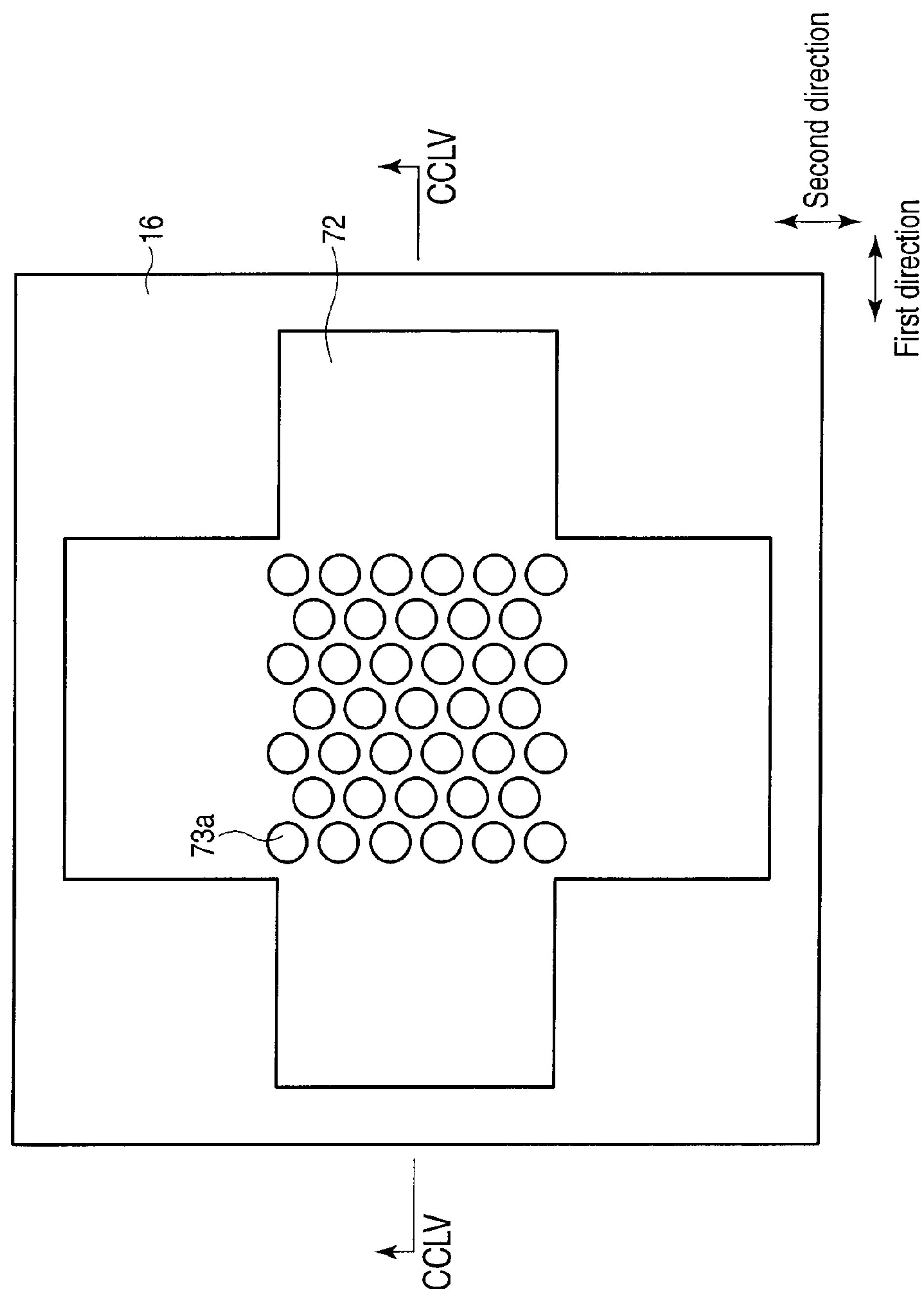
F I G. 2 5 4

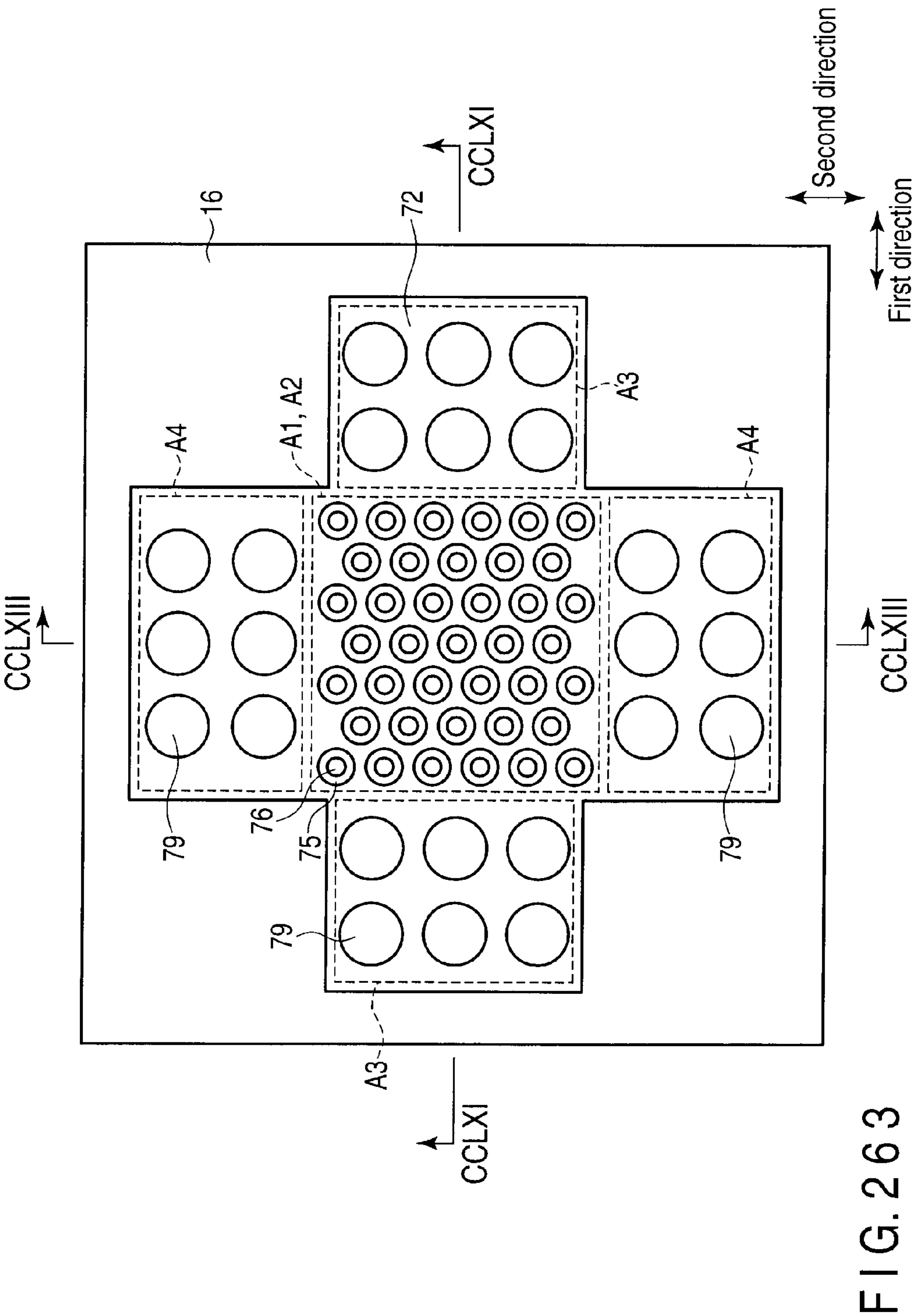
F I G. 2 6 3

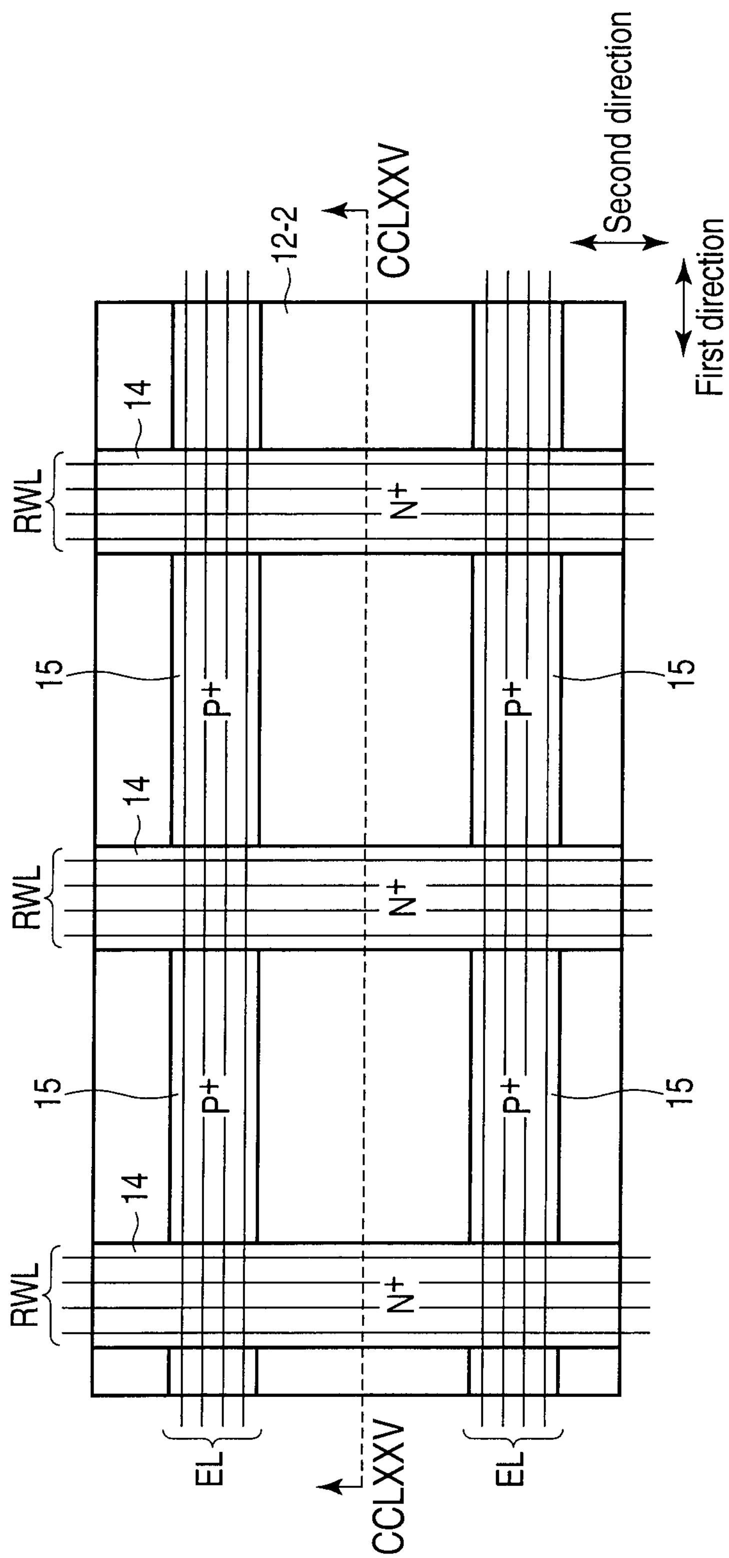
F I G. 274

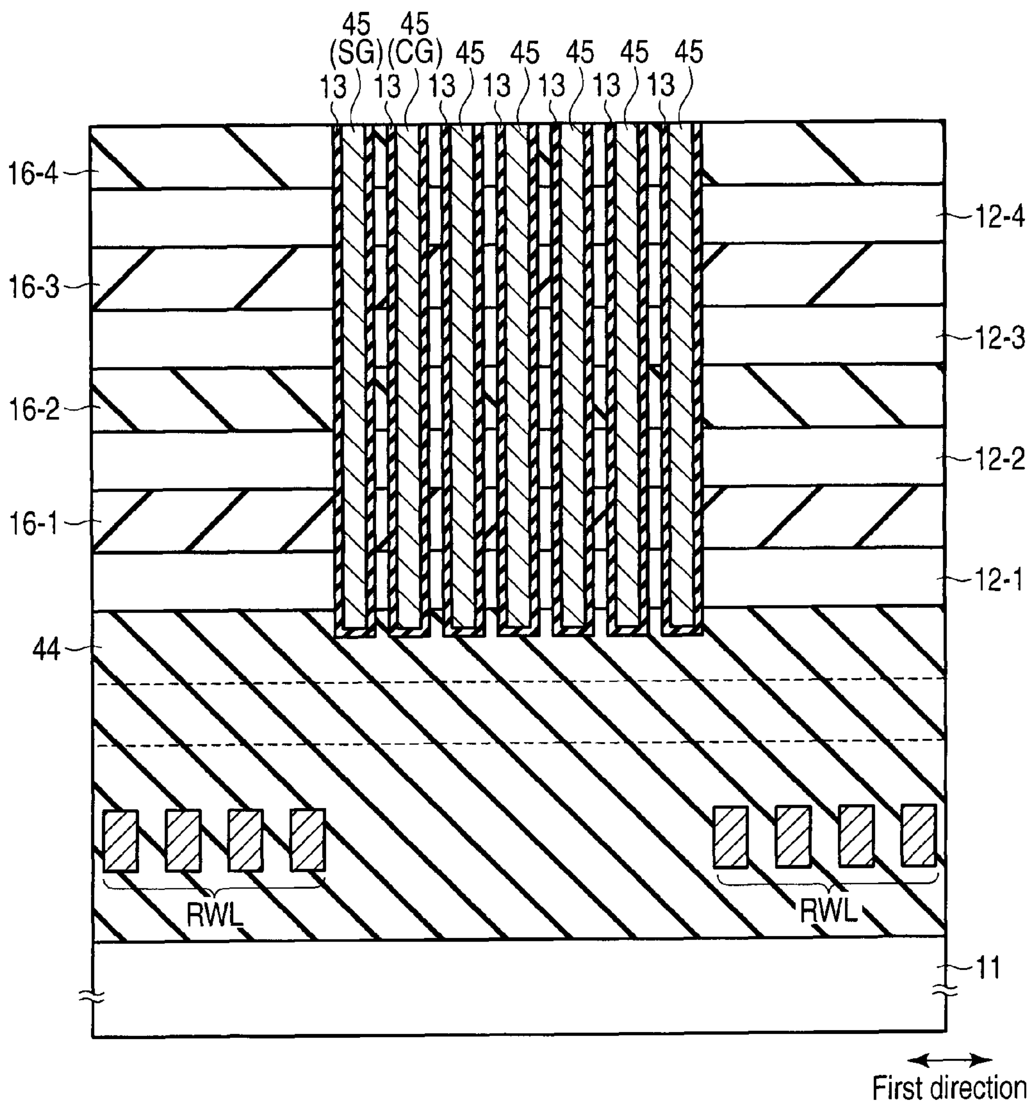
F I G. 2 8 7

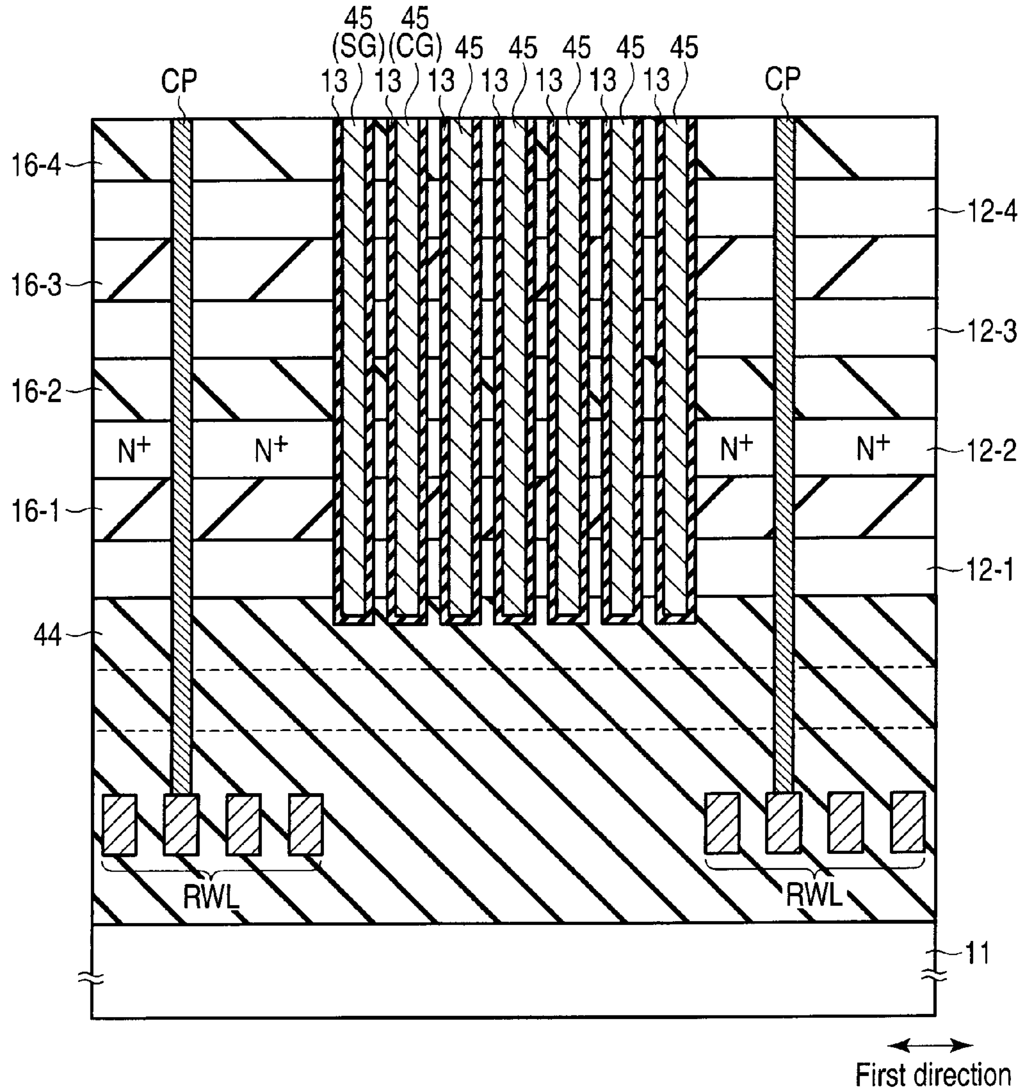
F I G. 2 9 0

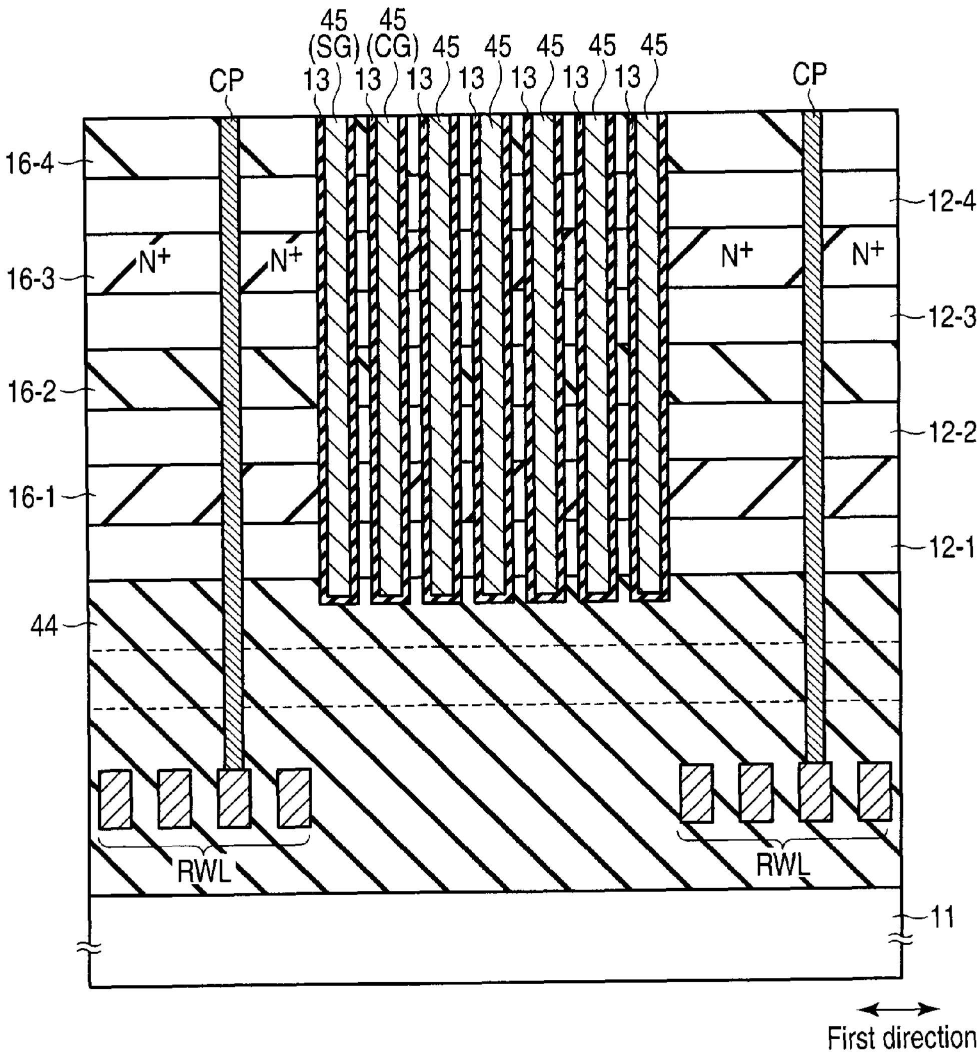
F I G. 2 9 1

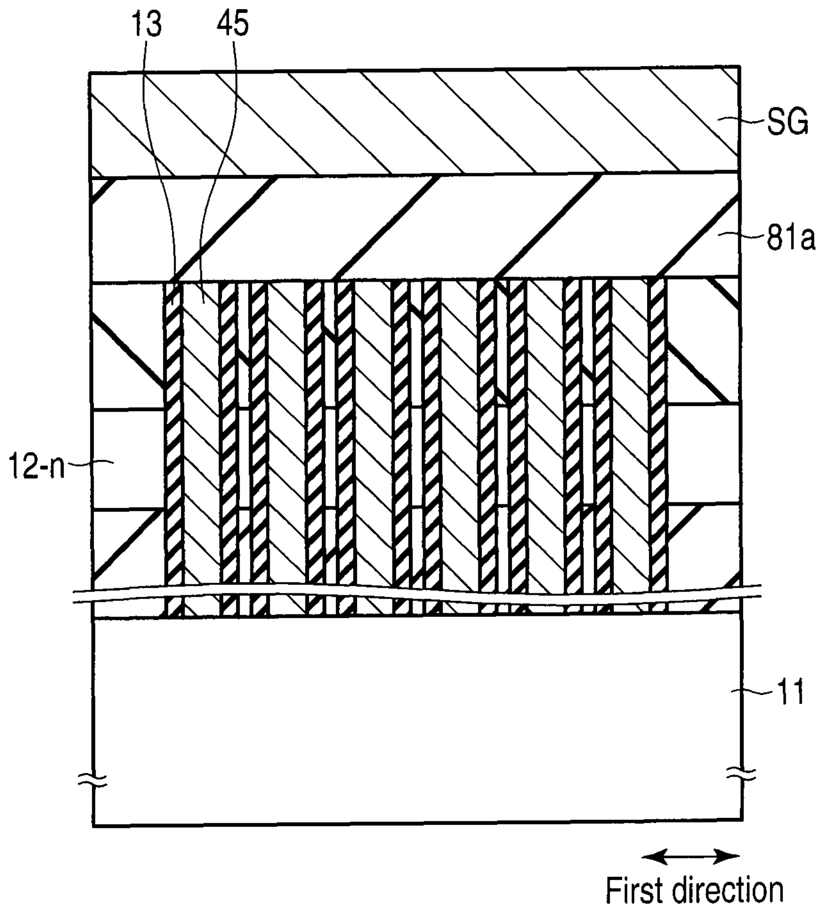
F I G. 2 9 6

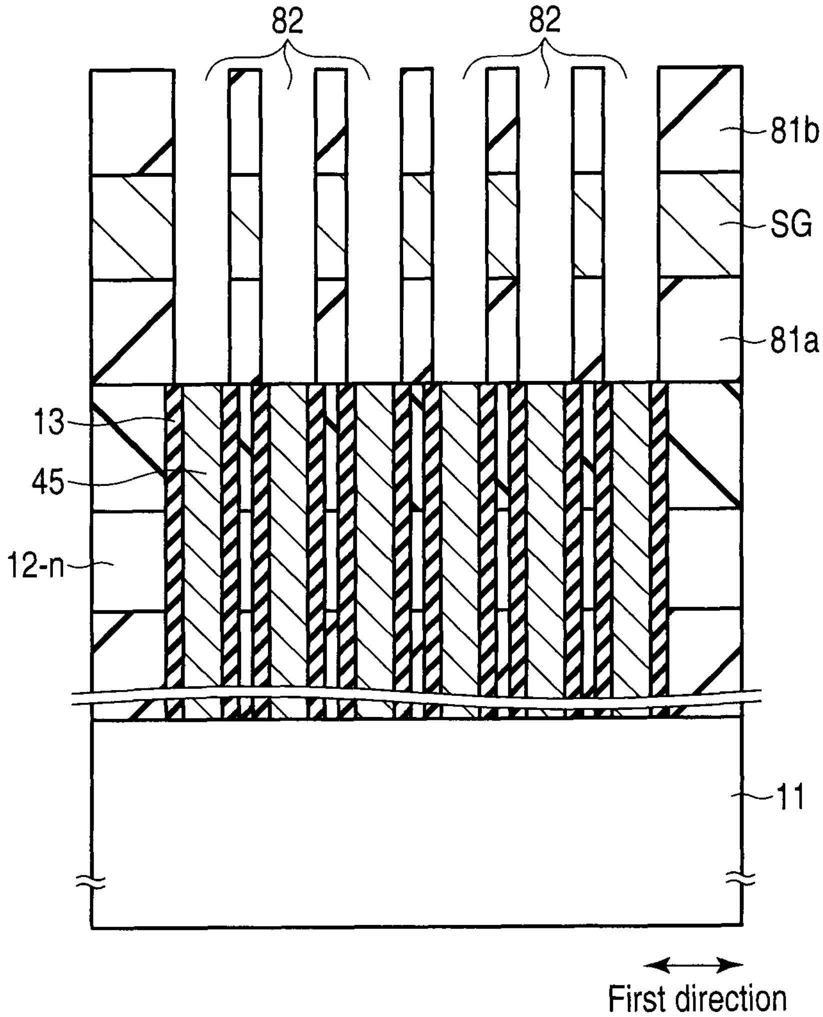
F I G. 2 9 8

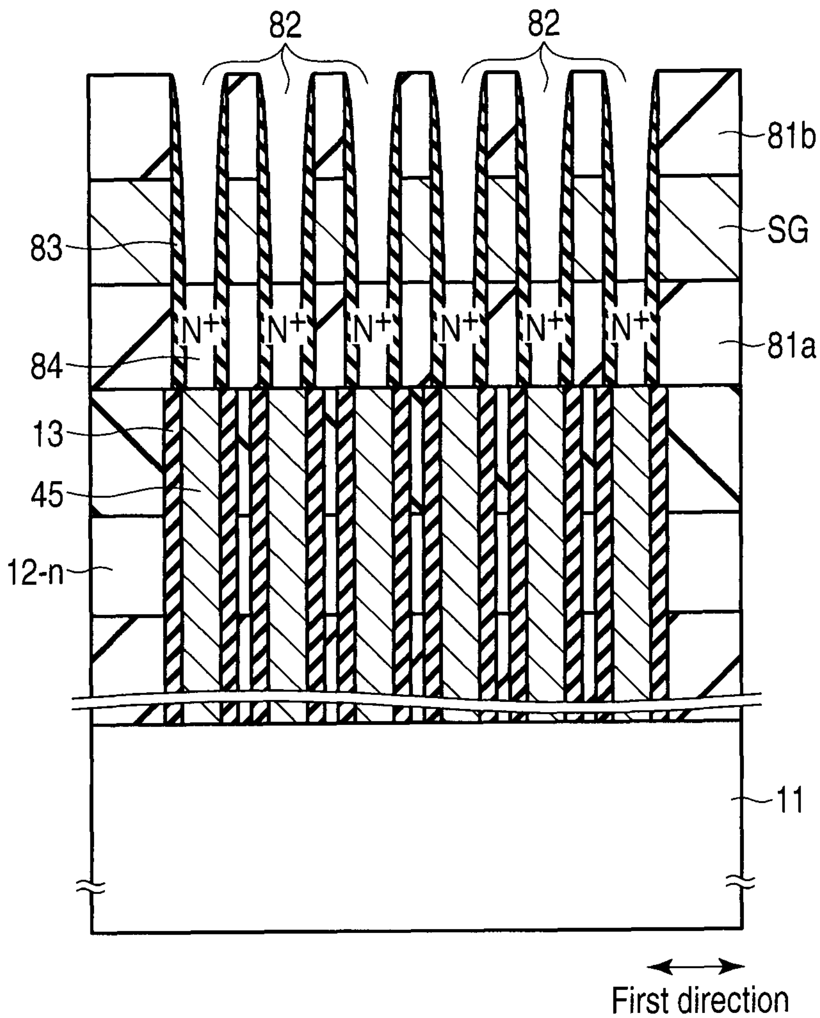
F I G. 2 9 9

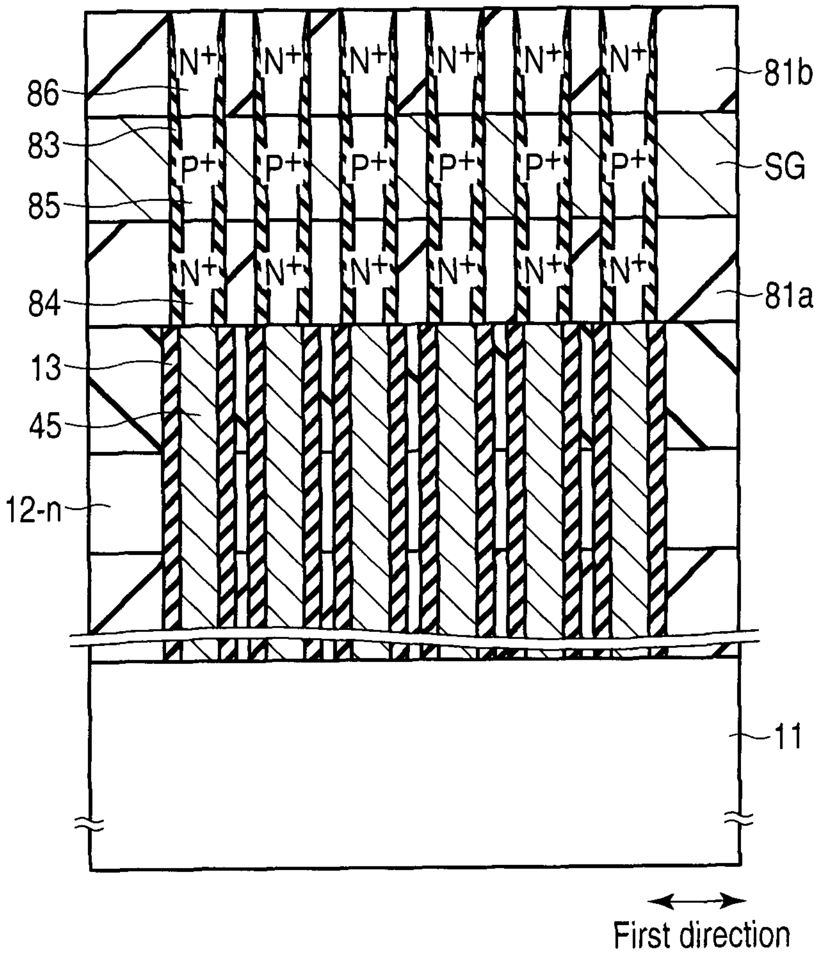
F I G. 3 0 0

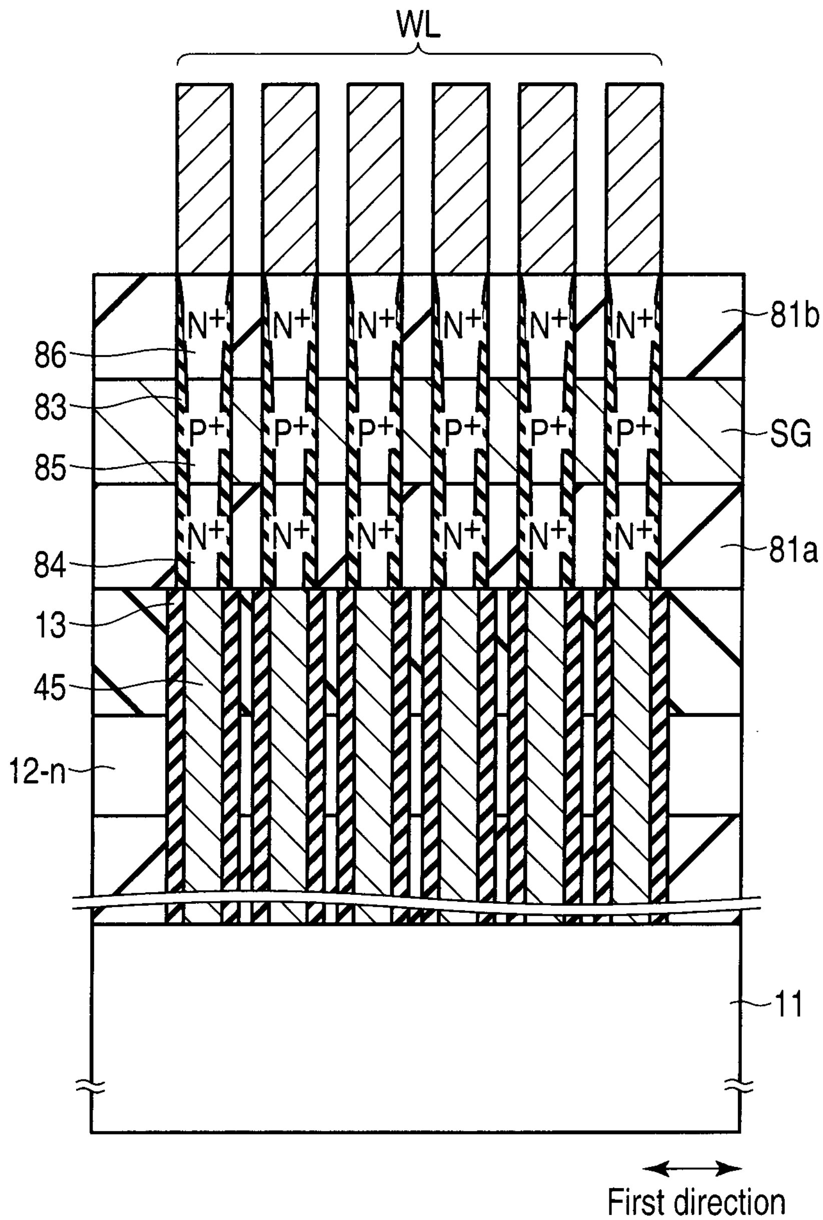
F I G. 3 0 2

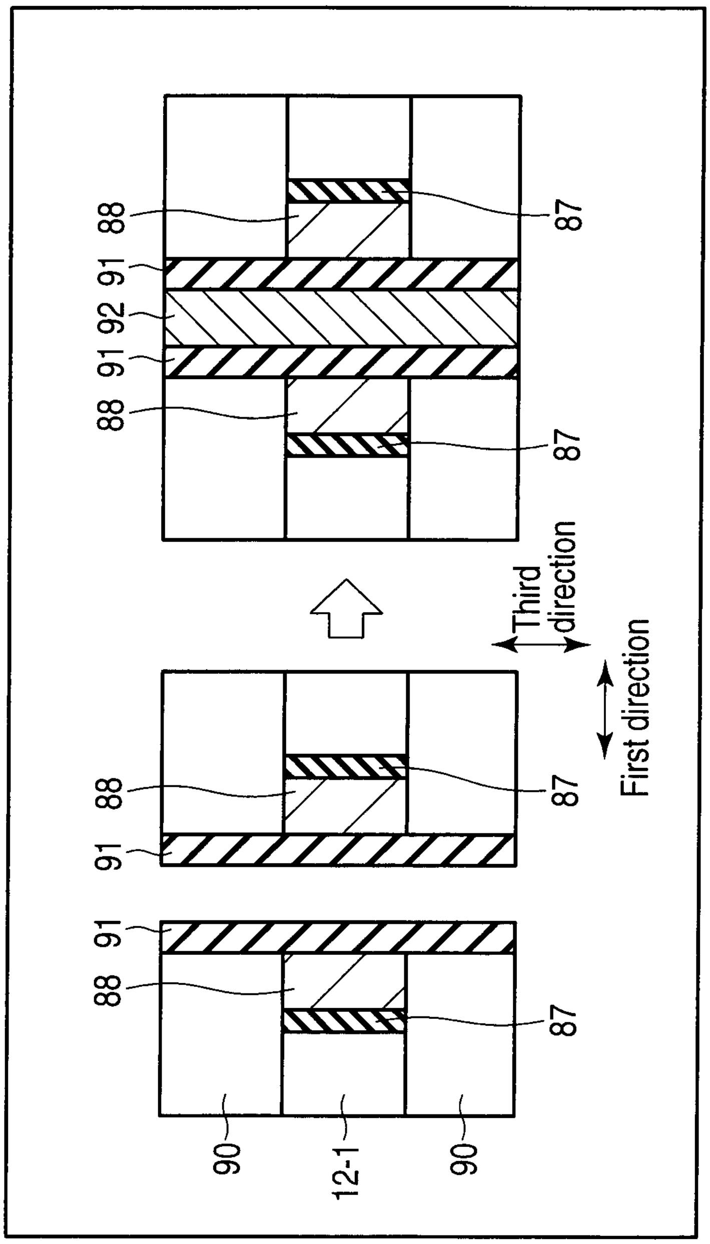
F I G. 3 0 5

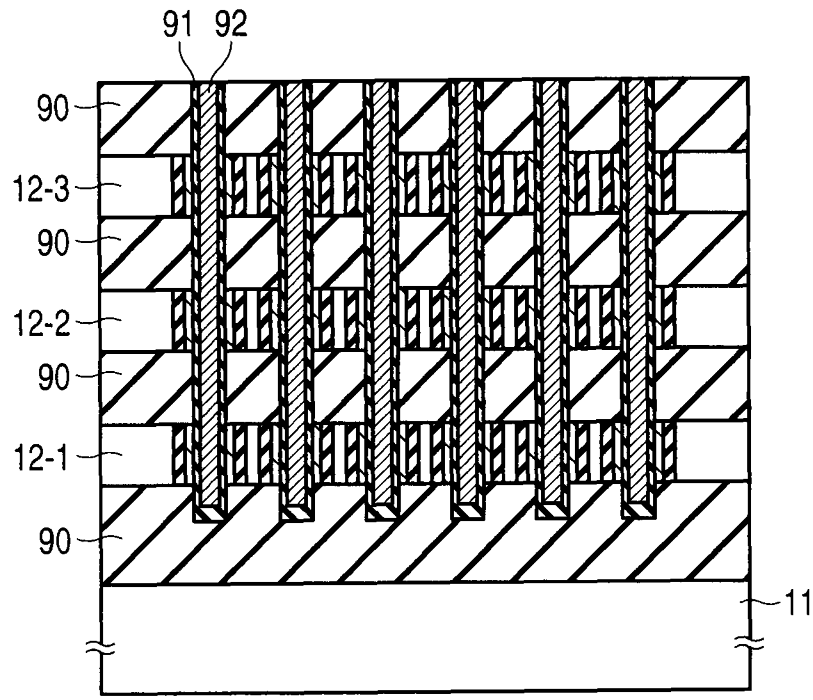
F I G. 3 0 6

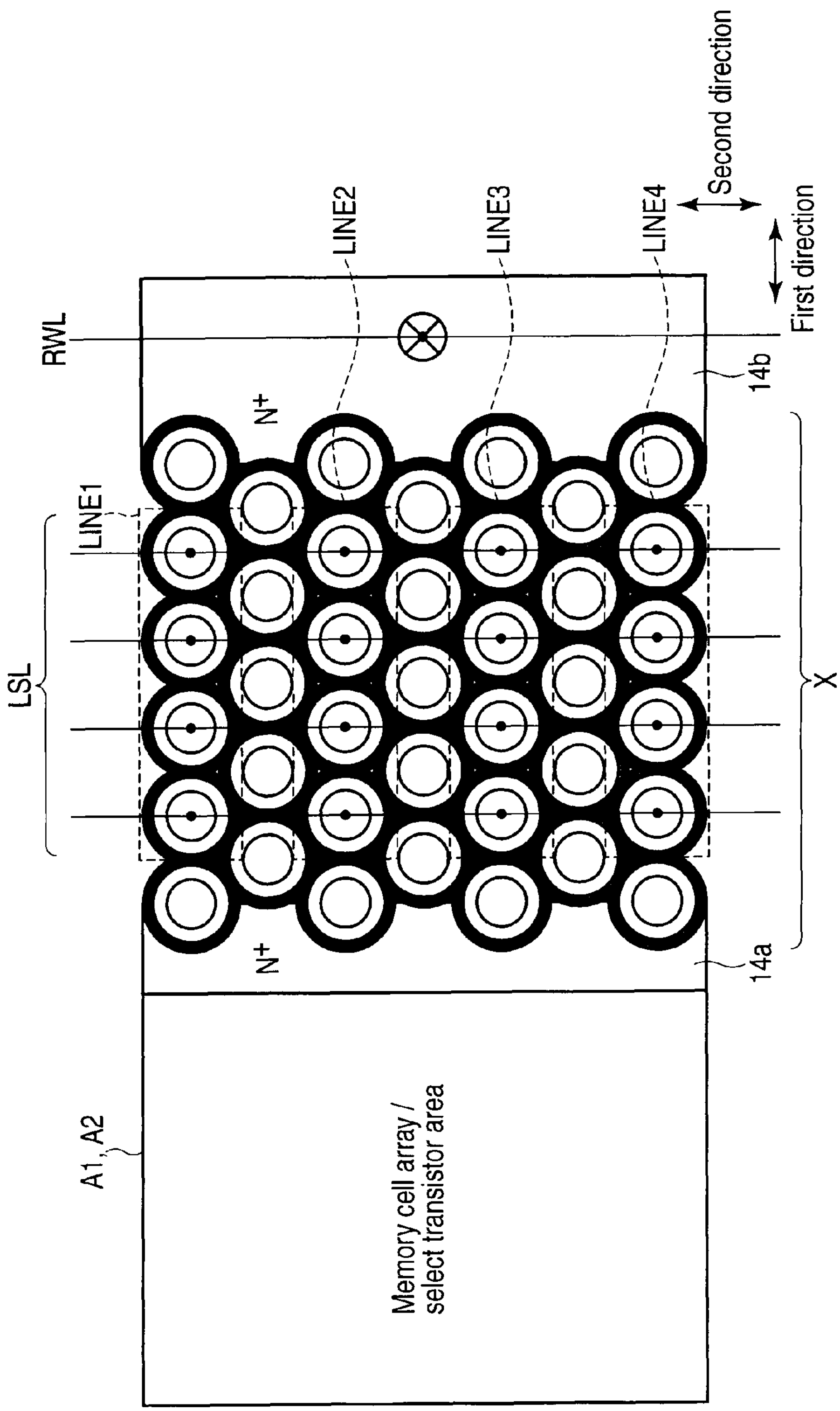
F I G. 3 0 9

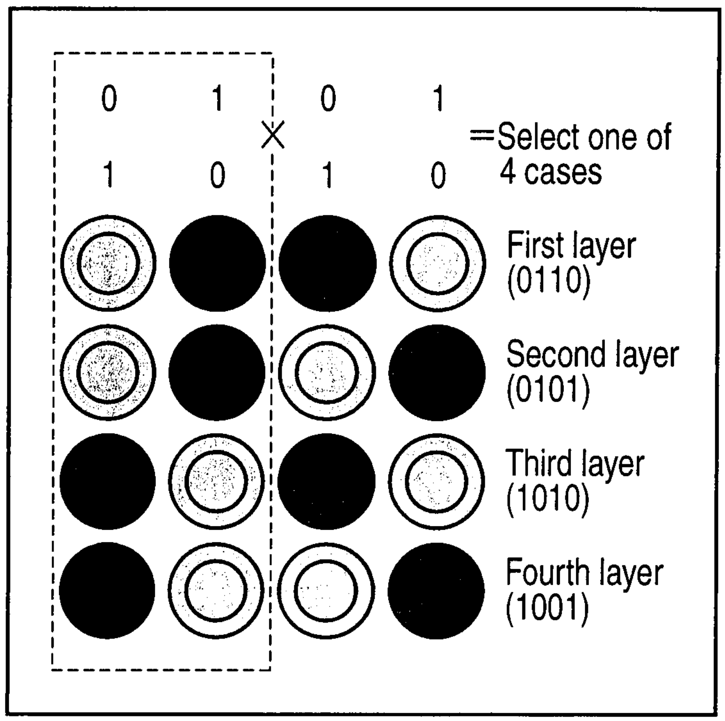
F I G. 3 1 5

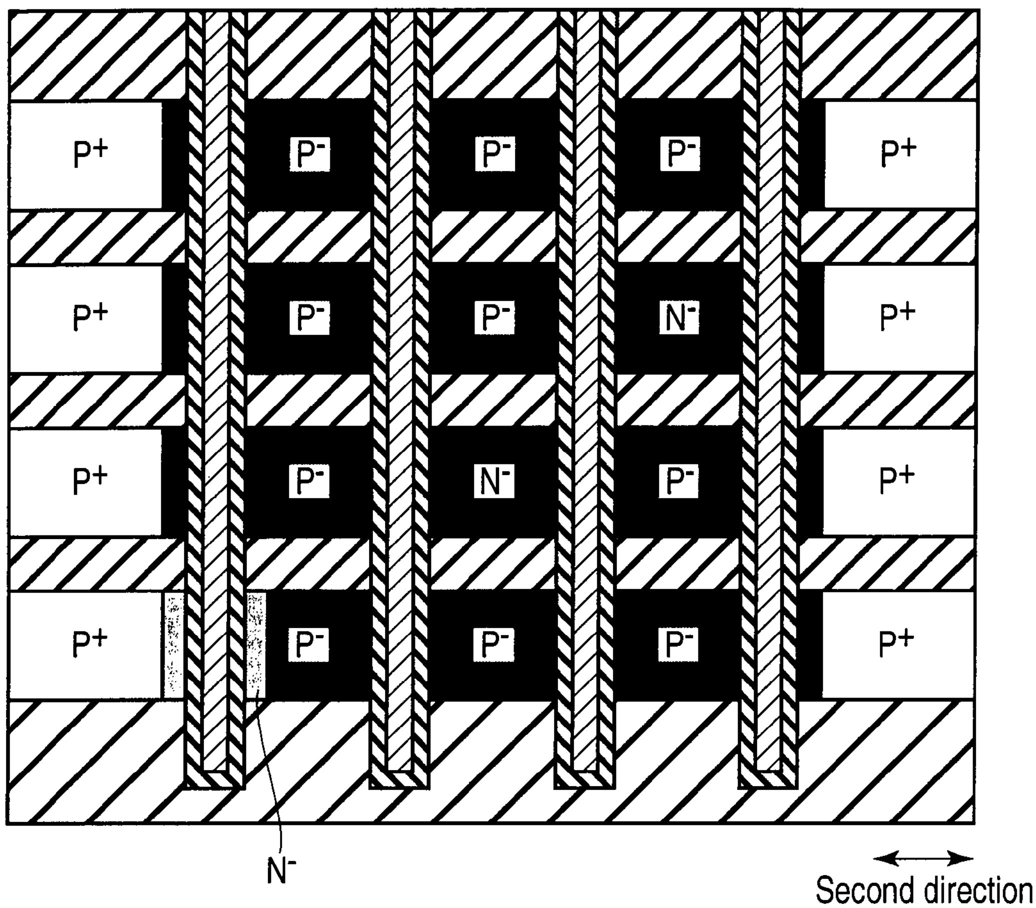
F I G. 3 1 8

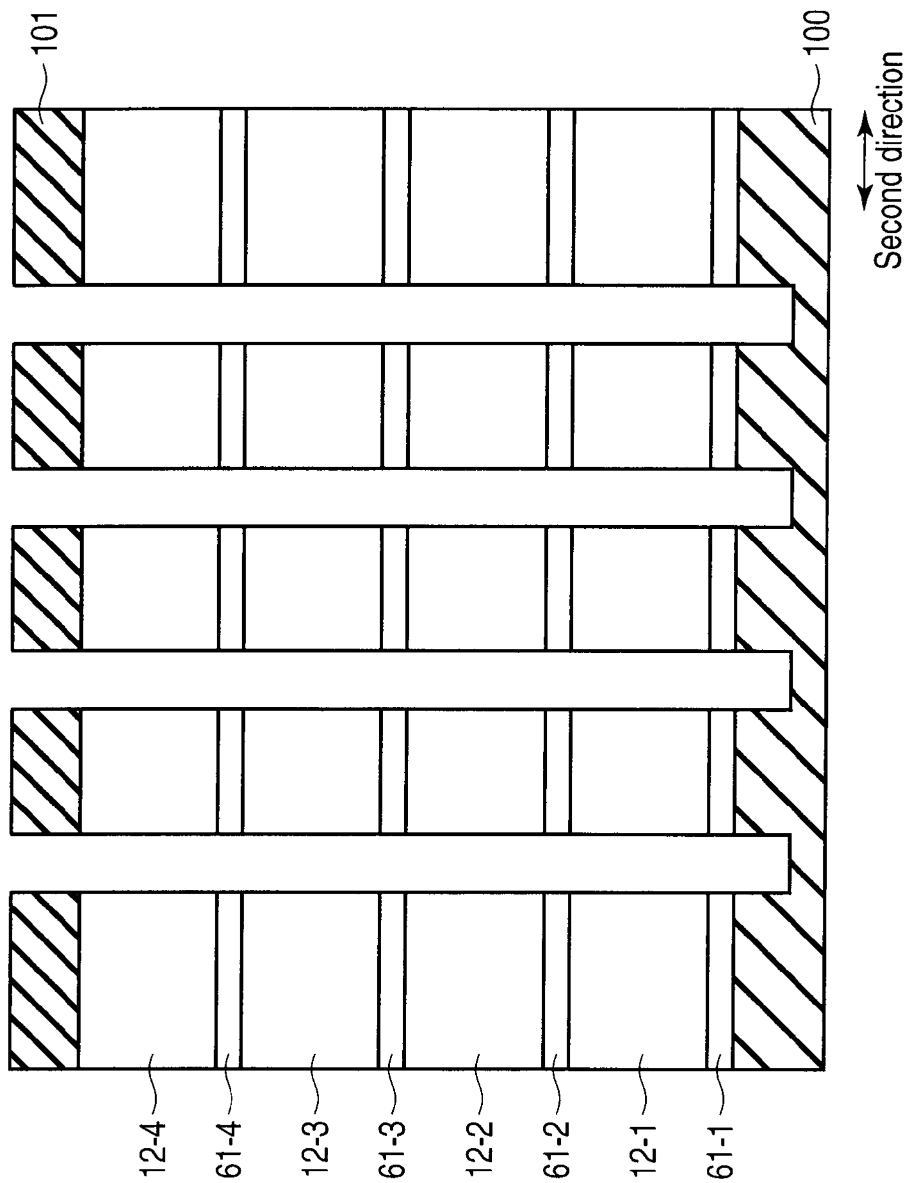
F I G. 3 2 1

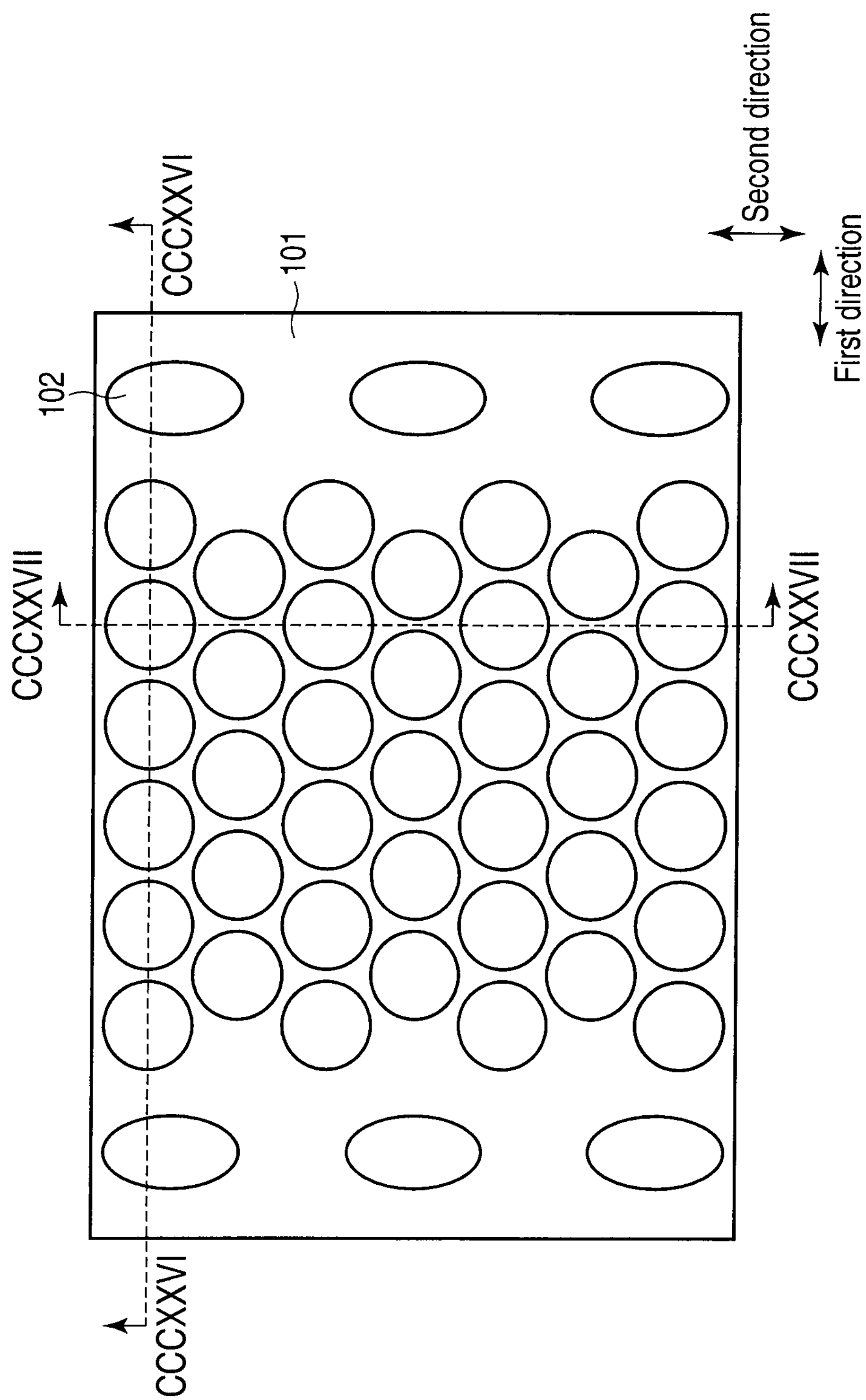
F I G. 3 2 5

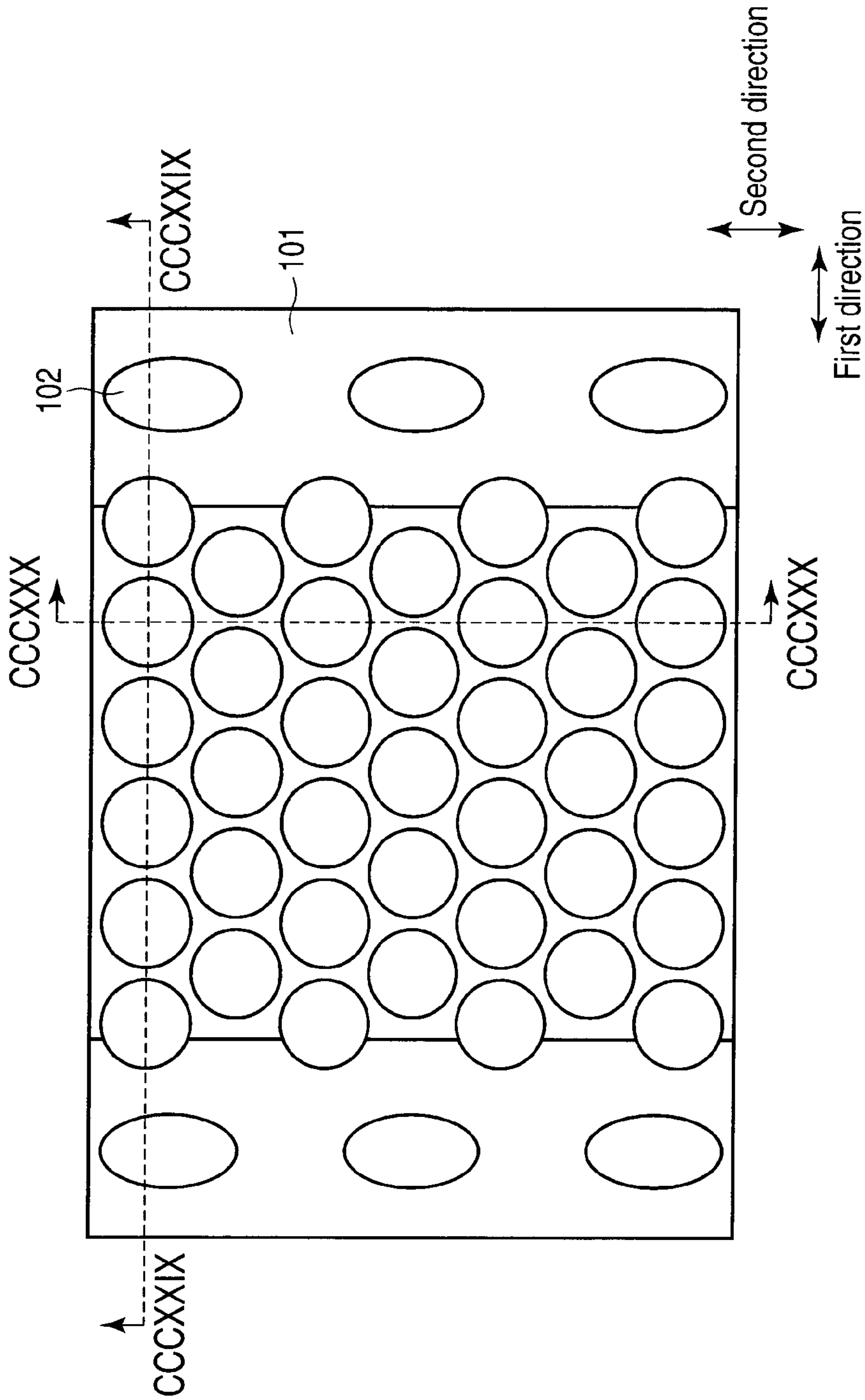
F I G. 3 2 8

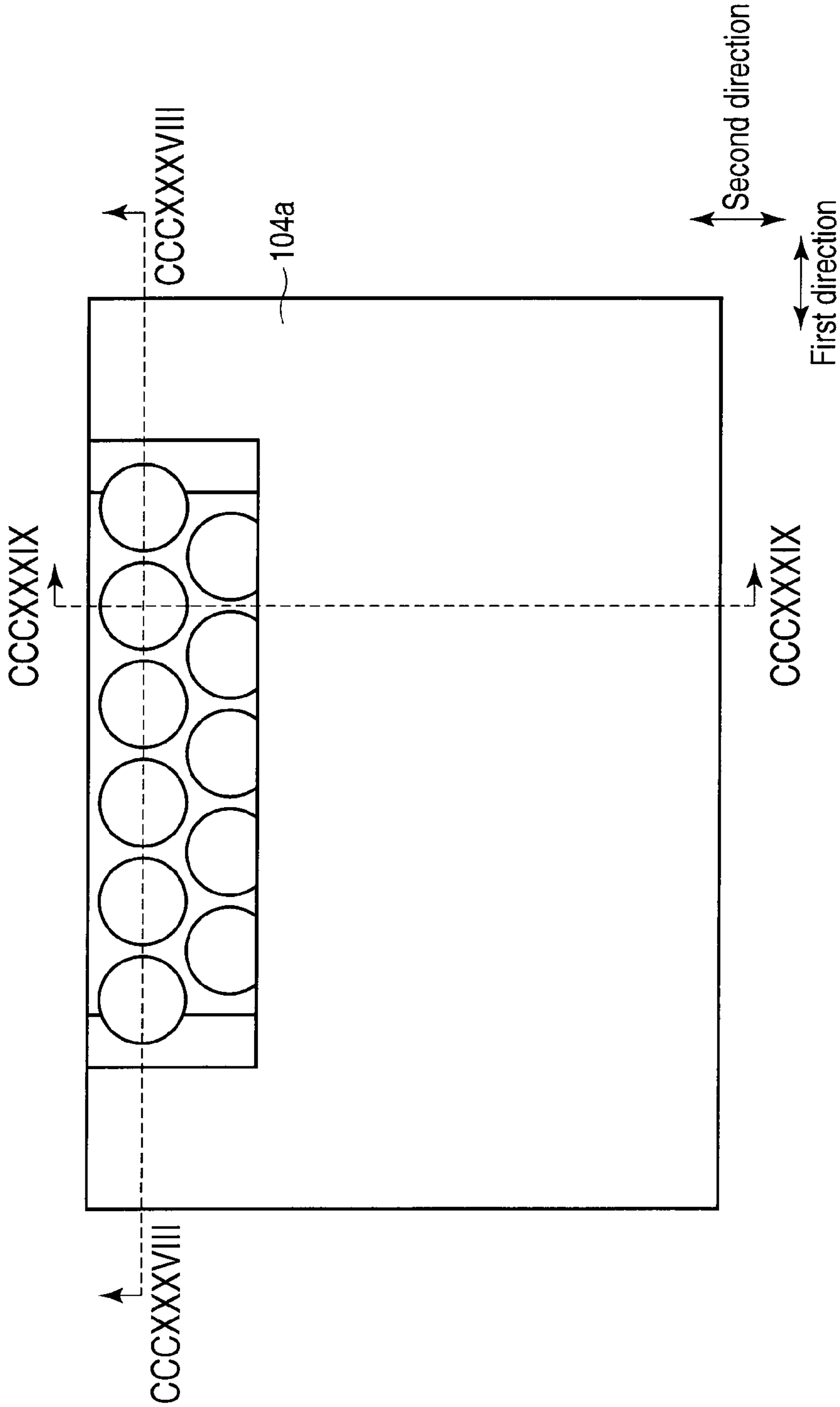
F I G. 3 3 7

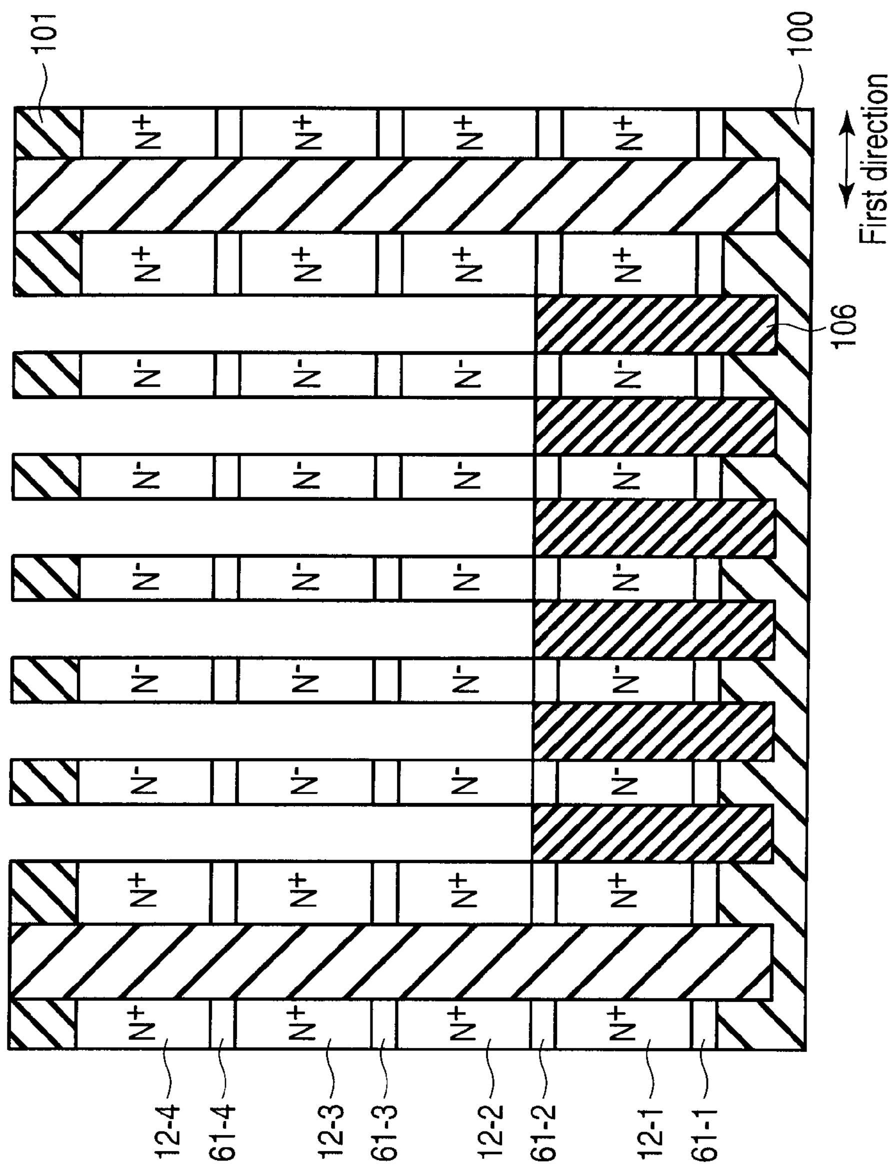
F I G. 350

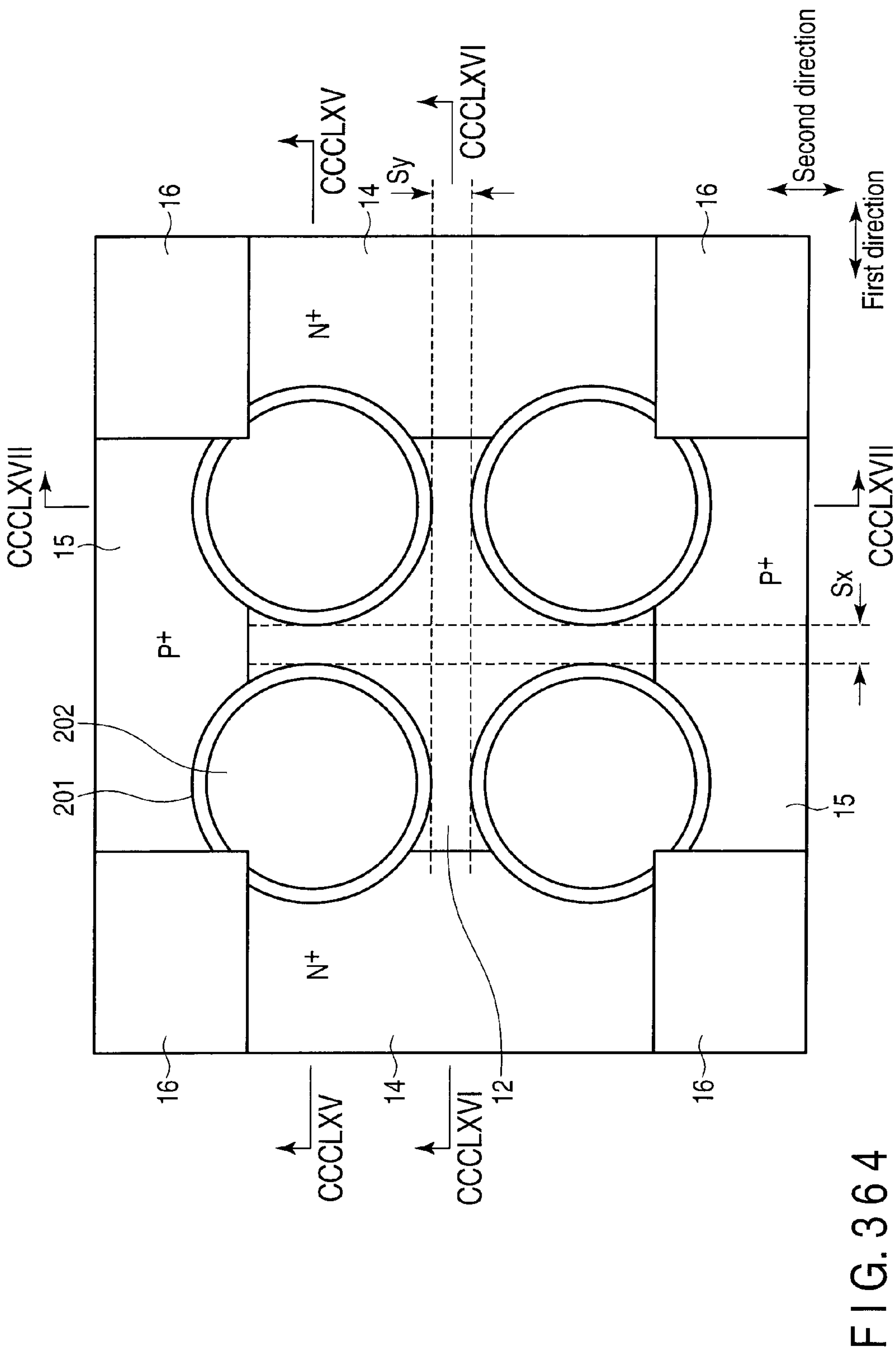
F I G. 3 6 4

NAND equivalent circuit
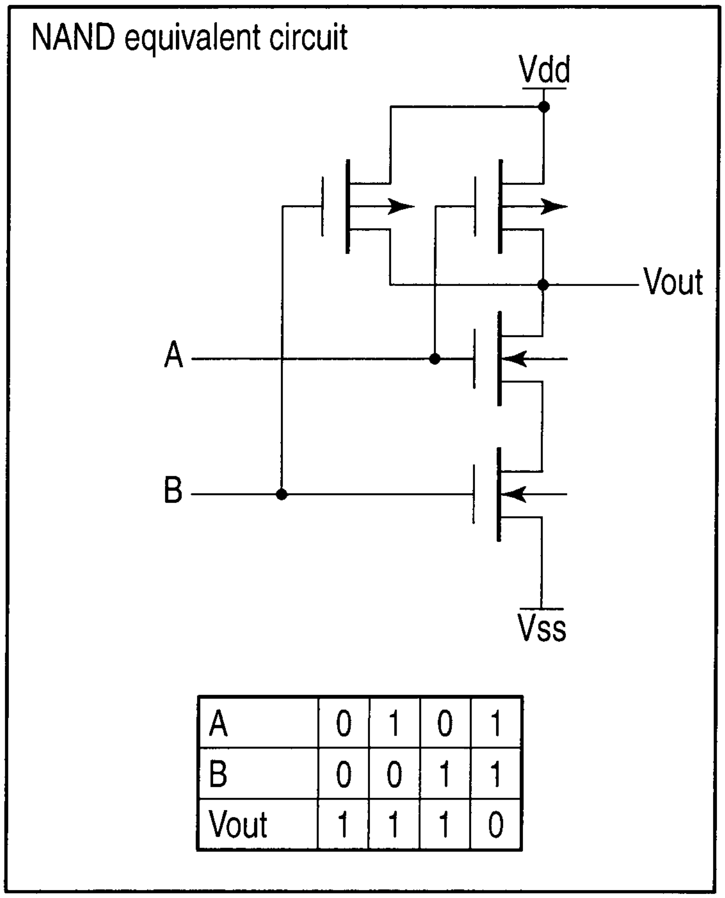
| A | 0 | 1 | 0 | 1 |
|---|---|---|---|---|
| B | 0 | 0 | 1 | 1 |
| Vout | 1 | 1 | 1 | 0 |
F I G. 3 7 5

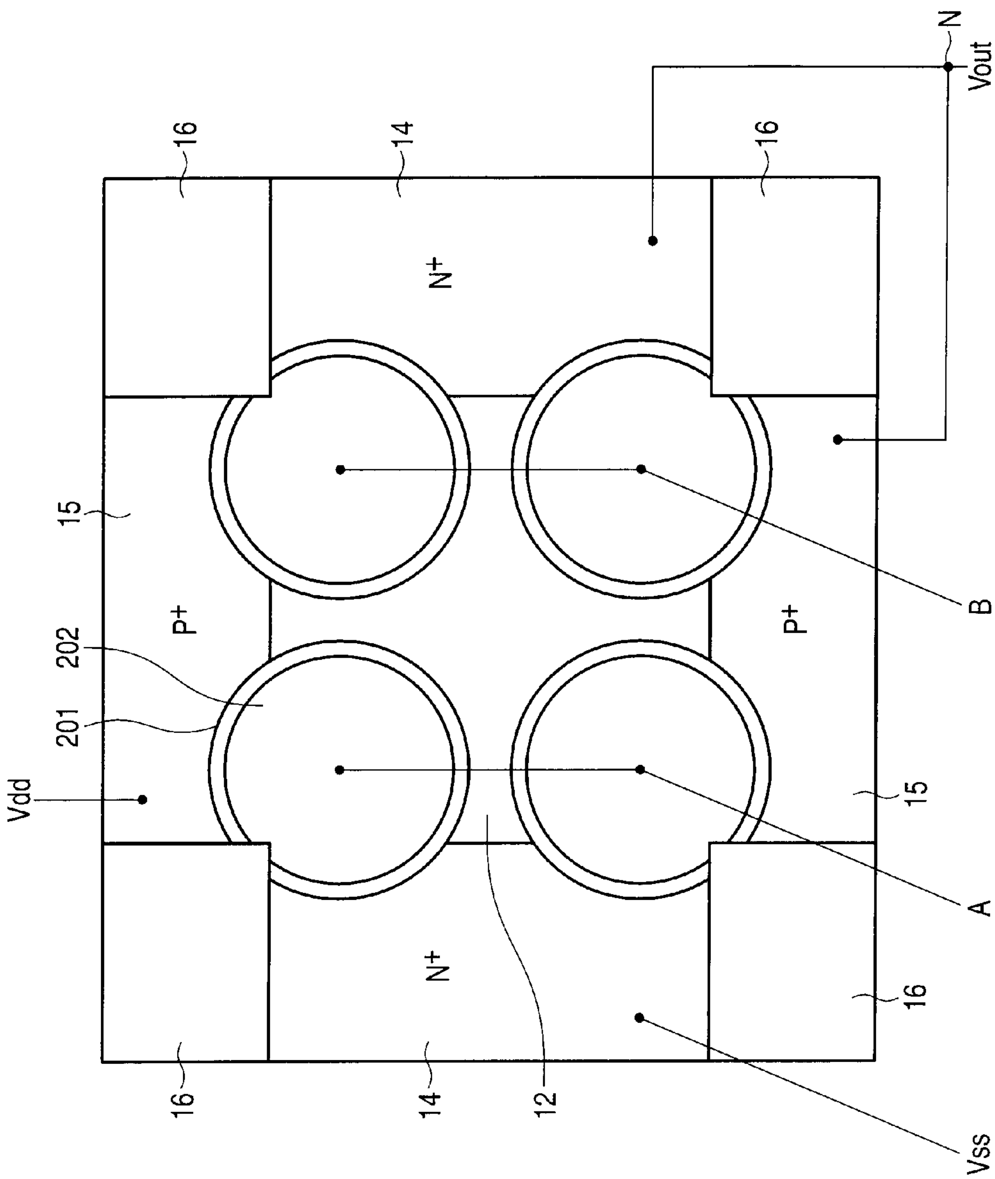
F I G. 3 7 6

| A | 0 | 1 | 0 | 1 |
|---|---|---|---|---|
| B | 0 | 0 | 1 | 1 |
| Vout | 1 | 1 | 1 | 0 |

| A | 0 | 1 | 0 | 1 |
|---|---|---|---|---|
| B | 0 | 0 | 1 | 1 |
| Vout | 1 | 1 | 1 | 0 |

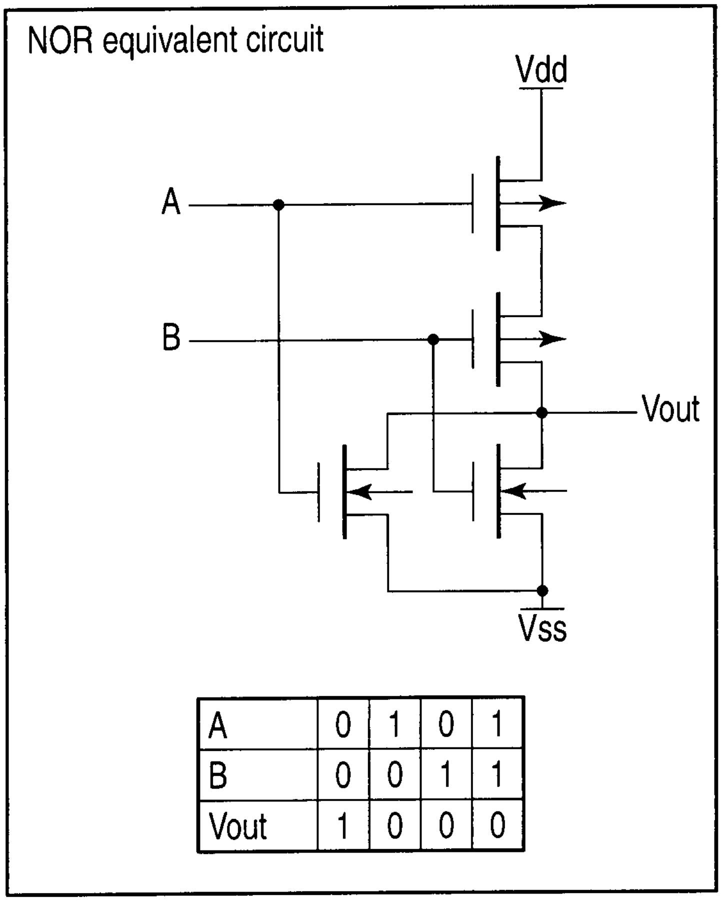
| A | 0 | 1 | 0 | 1 |
|---|---|---|---|---|
| B | 0 | 0 | 1 | 1 |
| Vout | 1 | 0 | 0 | 0 |
F I G. 3 7 9

| A | 0 | 1 | 0 | 1 |
|---|---|---|---|---|
| B | 0 | 0 | 1 | 1 |
| Vout | 1 | 0 | 0 | 0 |

CMOS equivalent circuit
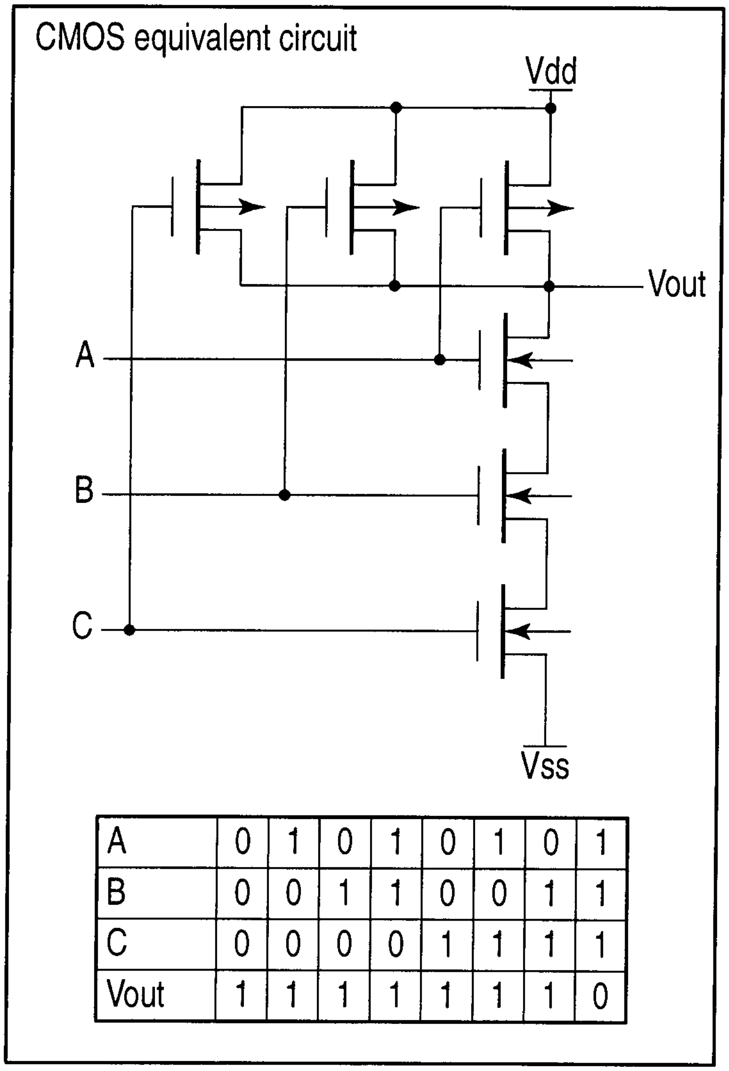
| A | 0 | 1 | 0 | 1 | 0 | 1 | 0 | 1 |
|---|---|---|---|---|---|---|---|---|
| B | 0 | 0 | 1 | 1 | 0 | 0 | 1 | 1 |
| C | 0 | 0 | 0 | 0 | 1 | 1 | 1 | 1 |
| Vout | 1 | 1 | 1 | 1 | 1 | 1 | 1 | 0 |
F I G. 3 8 3

CMOS equivalent circuit

| A | 0 | 1 | 0 | 1 | 0 | 1 | 0 | 1 |
|---|---|---|---|---|---|---|---|---|
| B | 0 | 0 | 1 | 1 | 0 | 0 | 1 | 1 |
| C | 0 | 0 | 0 | 0 | 1 | 1 | 1 | 1 |
| Vout | 1 | 0 | 0 | 0 | 0 | 0 | 0 | 0 |

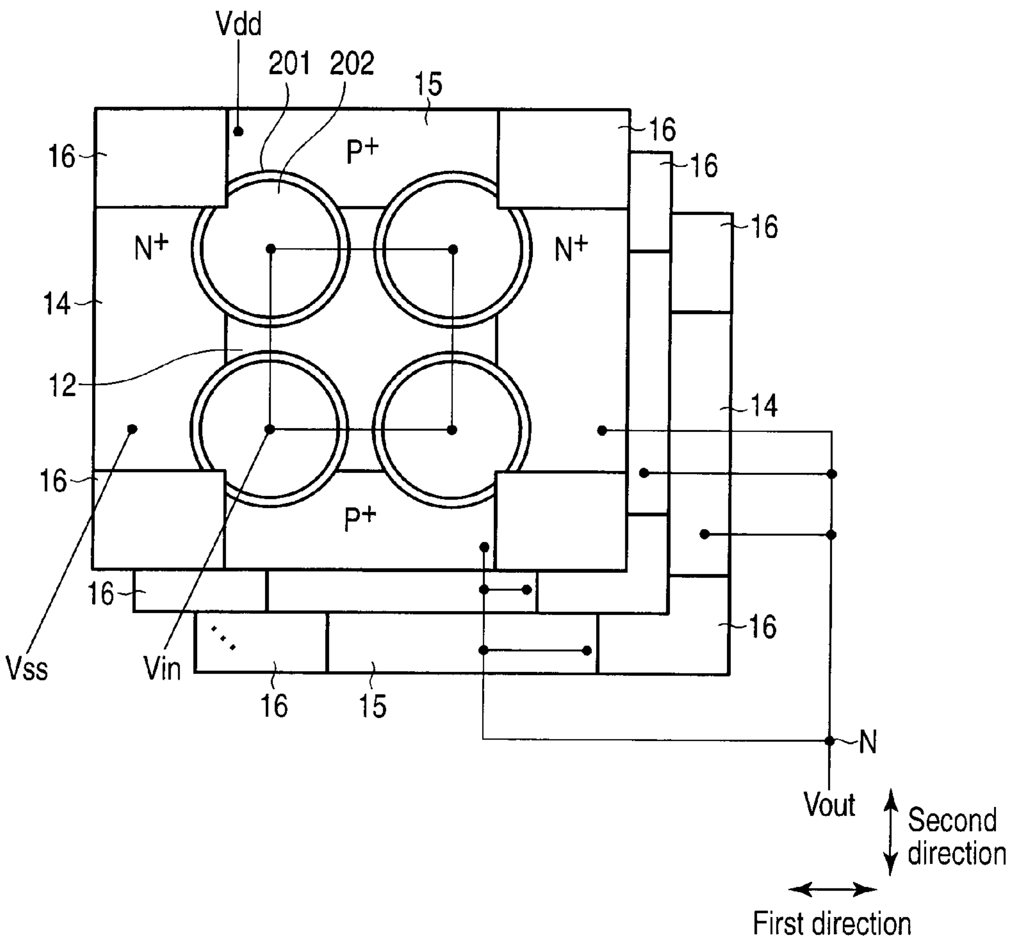
F I G. 3 8 7

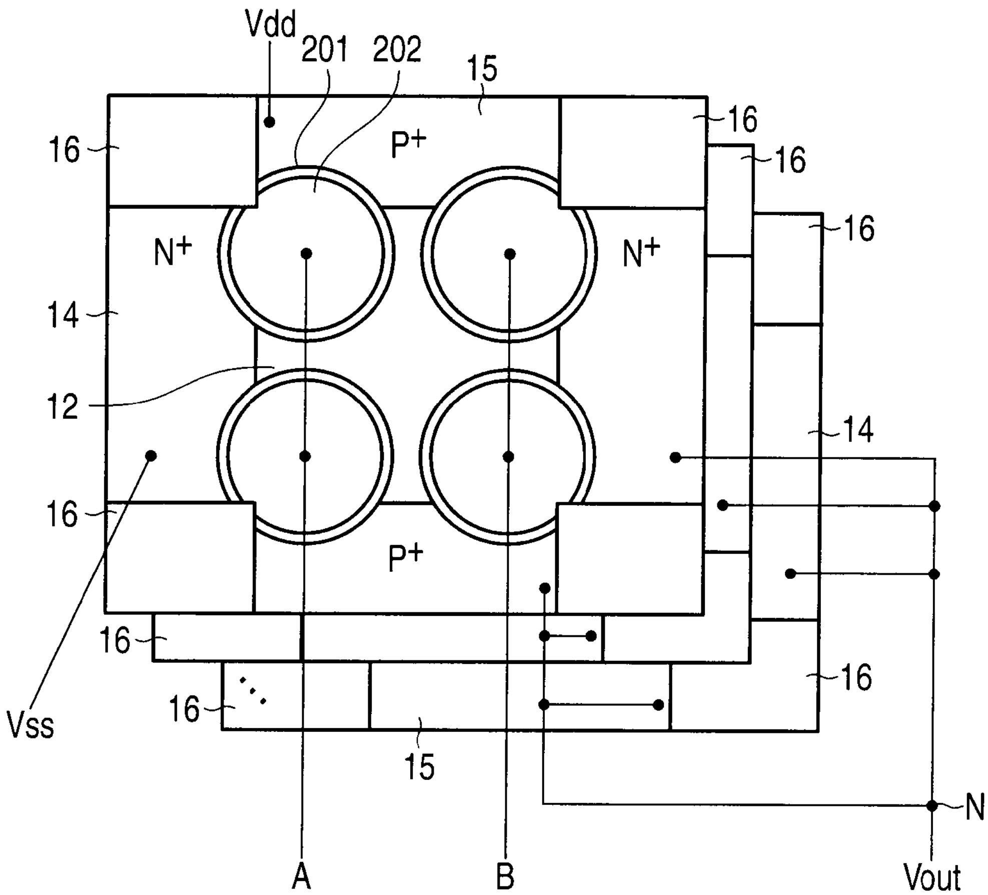
F I G. 3 8 8

NONVOLATILE SEMICONDUCTOR MEMORY

CROSS-REFERENCE TO RELATED APPLICATIONS

This application is based upon and claims the benefit of priority from Japanese Patent Application No. 2010-132366, filed Jun. 9, 2010; the entire contents of which are incorporated herein by reference.

FIELD

Embodiments described herein relate generally to a high-capacity nonvolatile semiconductor memory.

BACKGROUND

A NAND flash memory, being a nonvolatile semiconductor memory, has been used as a file memory, a mobile memory, and further in recent years has been used as a replacement (SSD: Solid State Drive) of HDD of a notebook personal computer. Under such a circumstance, a technique of achieving an increase in memory capacity by three-dimensionally constructing the NAND flash memory, has been developed.

A three-dimensional NAND flash memory which is known at present, is largely divided into a structure that NAND series (channel) is extended horizontally to a surface of a semiconductor substrate (such as VG-NAND: Vertical gate-NAND, S3-FLASH, VSAT: Vertical-stacked array-transistor), and a structure that NAND series is extended vertically to the surface of the semiconductor substrate (such as BiCS-NAND: Bit cost scalable-NAND, P-BiCS-NAND: Pipe shaped bit cost scalable-NAND, TCAT: Tera bit cell array transistor).

A common point of the former structure is that a stacked layer structure of an active area (or control gates) is processed into a line & space pattern, and further the control gates (or the active area) are processed into the line & space pattern formed across the aforementioned stacked layer structure. However, if the number of stacked layers is increased for increasing the memory capacity, there is a problem that processing of the control gates (or the active area) formed across the stacked layer structure is difficult.

Further, a common point of the latter structure is that a hole is formed in the stacked layer structure of the control gates (or an insulating layer), and a column-shaped active area is formed by embedding a semiconductor into the hole. However, BiCS-NAND has a problem that a contact resistance is great between the semiconductor substrate and the active area. Further, in structures of P-BiCS-NAND and TCAT, the stacked layer structure needs to be processed into the line & space pattern, and therefore if the number of stacked layers is increased, the processing thereof is difficult.

Therefore, it is required to provide an architectural concept different from such a conventional three-dimensional NAND flush memory.

BRIEF DESCRIPTION OF THE DRAWINGS

FIG. 2 is a cross-sectional view of FIG. 1 taken along the line II-II;

FIG. 3 is a cross-sectional view of FIG. 1 taken along the line III-III;

FIG. 4 is a cross-sectional view of FIG. 1 taken along the line IV-IV;

FIG. 5 is a view showing a second basic structure;

FIG. 6 is a cross-sectional view of FIG. 5 taken along the line VI-VI;

FIG. 9 is a view showing a connecting relation between word lines and control gates;

FIG. 14 is a view showing a system of controlling a basic operation;

FIG. 15 and FIG. 16 are views showing an equivalent circuit of a memory cell array, respectively;

FIG. 17 and FIG. 18 are views showing a first example of a potential relation during data writing, respectively;

FIG. 19 is a view showing an electric conduction path;

FIG. 20 is a view showing an injection of electrons into a data recording layer;

FIG. 24 and FIG. 25 are views showing a third example of the potential relation during data writing, respectively;

FIG. 27 and FIG. 28 are views showing a fourth example of the potential relation during data writing, respectively;

FIG. 31 and FIG. 32 are views showing a fifth example of the potential relation during data writing, respectively;

FIG. 36 is a view showing the electric conduction path;

FIG. 42 and FIG. 43 are views showing a first example of the potential relation in a second step of reading, respectively;

FIG. 44 and FIG. 45 are views showing the electric conduction path, respectively;

FIG. 47 is a view showing the second example of the potential relation in the first step of reading;

FIG. 48 and FIG. 49 are views showing the second example of the potential relation in the second step of reading, respectively;

FIG. 55 is a view showing the electric conduction path;

FIG. 59 is a view showing the electric conduction path;

FIG. 63 is a view showing a fourth example of the layout based on the first basic structure;

FIG. 64 is a view showing a structure of a memory cell array;

FIG. 65 and FIG. 66 are views showing a first example of the potential relation during data writing, respectively;

FIG. 68 and FIG. 69 are views showing a second example of the potential relation during data writing, respectively;

FIG. 70 is a view showing the electric conduction path;

FIG. 71 and FIG. 72 are views showing a third example of the potential relation during data writing, respectively;

FIG. 74 and FIG. 75 are views showing the potential relation in the first step of reading, respectively;

FIG. 76 and FIG. 77 are views showing the potential relation in the second step of reading, respectively;

FIG. 78 and FIG. 79 are views showing the electric conduction path, respectively;

FIG. 84 is a view showing a second example of a layout based on the second basic structure;

FIG. 85 is a view showing a third example of the layout based on the second basic structure;

FIG. 86 is a view showing a fourth example of the layout based on the second basic structure;

FIG. 87 is a view showing the structure of a memory cell array;

FIG. 88 and FIG. 89 are views showing a first example of the potential relation during data writing, respectively;

FIG. 94 and FIG. 95 are views showing a third example of the potential relation during data writing, respectively;

FIG. 100 and FIG. 101 are views showing the potential relation in the first step of reading, respectively;

FIG. 102 and FIG. 103 are views showing the potential relation in the second step of reading, respectively;

FIG. 107 and FIG. 108 are views showing a first example of the potential relation during data erasing, respectively;

FIG. 112 and FIG. 113 are views showing advantages of writing;

FIG. 114 and FIG. 115 are views showing advantages of reading;

FIG. 117 is a view showing a second example of writing of sequential data;

FIG. 119 and FIG. 120 are views showing removal of a channel inversion layer after reading;

FIG. 121 to FIG. 125 are views showing simultaneous writing of data;

FIG. 126 to FIG. 130 are views showing simultaneous reading of data;

FIG. 133 and FIG. 134 are views showing a write operation, respectively;

FIG. 135 and FIG. 136 are views showing a read operation, respectively;

FIG. 139 and FIG. 140 are views showing the write operation, respectively;

FIG. 143 is a view showing a first example of a memory cell array;

FIG. 144 is a view showing a second example of the memory cell array;

FIG. 145 is a view showing a third example of the memory cell array;

FIG. 146 is a view showing a fourth example of the memory cell array;

FIG. 148 is a plan view of a block of the memory cell array;

FIG. 149 is a cross-sectional view of FIG. 148 taken along the line CXLIX-CXLIX;

FIG. 150 is a cross-sectional view of FIG. 148 taken along the line CL-CL;

FIG. 151 is a cross-sectional view of FIG. 148 taken along the line CLI-CLI;

FIG. 152 is a view showing a modified example of FIG. 149;

FIG. 153 is a view showing a modified example of FIG. 150;

FIG. 154 is a view showing a modified example of FIG. 151;

FIG. 158 is a cross-sectional view of FIG. 157 taken along the line CLVIII-CLVIII;

FIG. 159 is a plan view showing a through-hole structure;

FIG. 161 is a view showing a modified example of FIG. 160;

FIG. 167 is a view showing a modified example of FIG. 166;

FIG. 168 is a plan view showing the through-hole structure;

FIG. 169 is a cross-sectional view of FIG. 168 taken along the line CLXIX-CLXIX;

FIG. 170 is a view showing a modified example of FIG. 169;

FIG. 171 to FIG. 186 are views showing a first example of a method of manufacturing a three-dimensional MaCS, respectively;

FIG. 187 to FIG. 220 are views showing a second example of the method of manufacturing the three-dimensional MaCS, respectively;

FIG. 221 to FIG. 242 are views showing a third examples of the method of manufacturing the three-dimensional MaCS, respectively;

FIG. 243 to FIG. 269 are views showing a fourth example of the method of manufacturing the three-dimensional MaCS, respectively;

FIG. 270 to FIG. 294 are views showing a fifth example of the method of manufacturing the three-dimensional MaCS, respectively;

FIG. 295 to FIG. 302 are views showing a sixth example of the method of manufacturing the three-dimensional MaCS, respectively;

FIG. 303 to FIG. 306 are views showing a seventh example of the method of manufacturing the three-dimensional MaCS, respectively;

FIG. 307 is a view showing a technique of selecting semiconductor layers of MaCS;

FIG. 308 is a view showing a principle of decoding;

Figure 310:
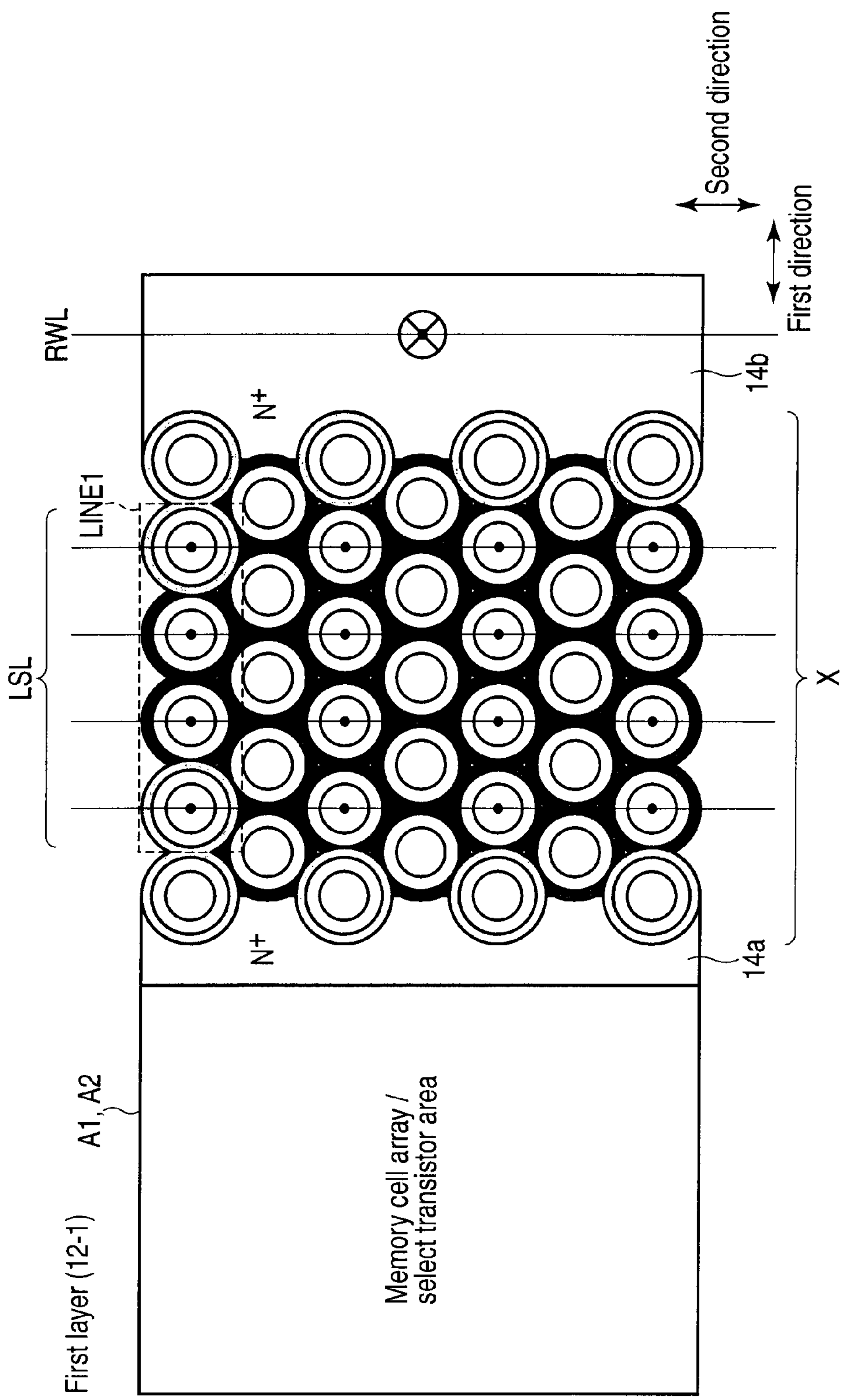
Figure 311:
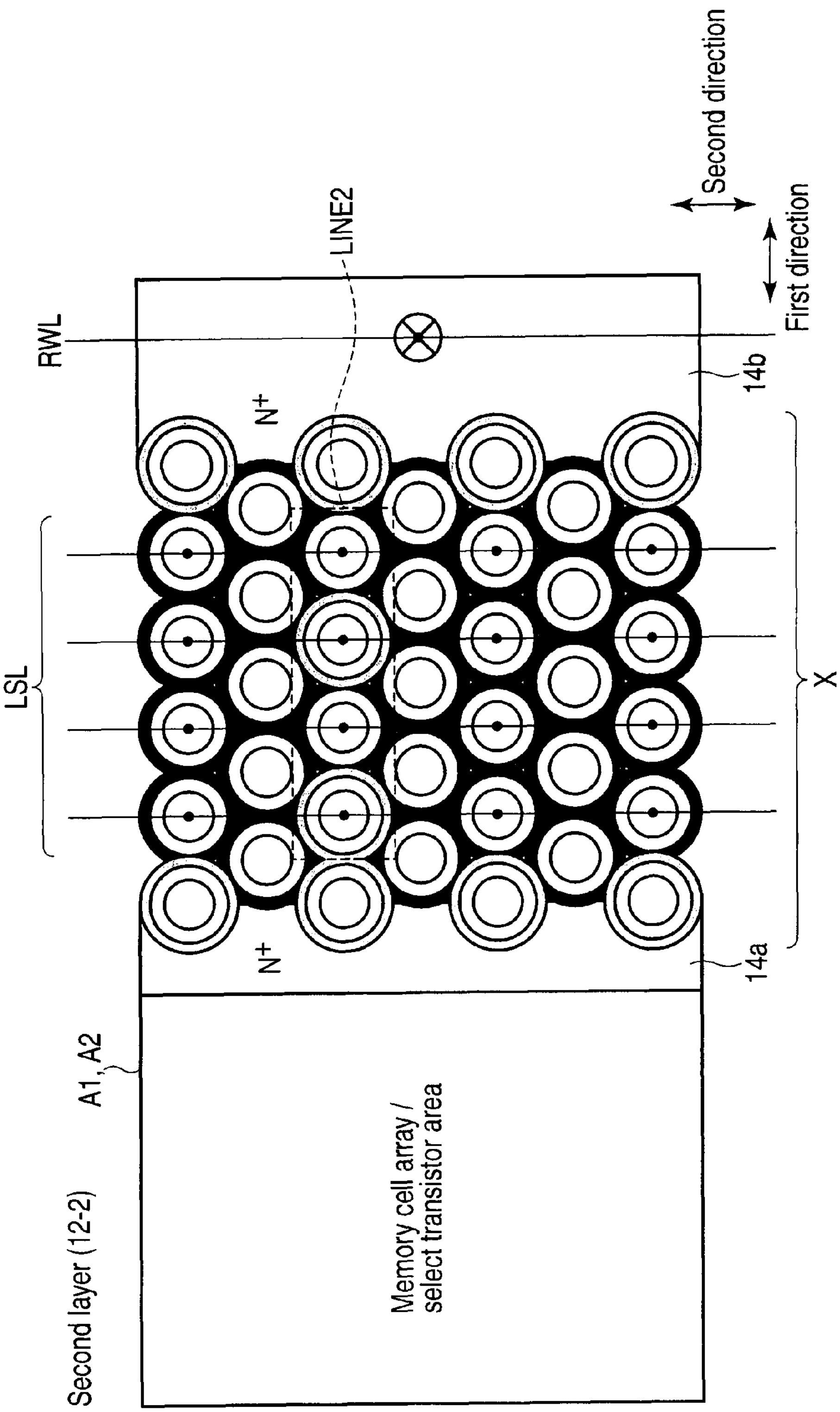
Figure 312:
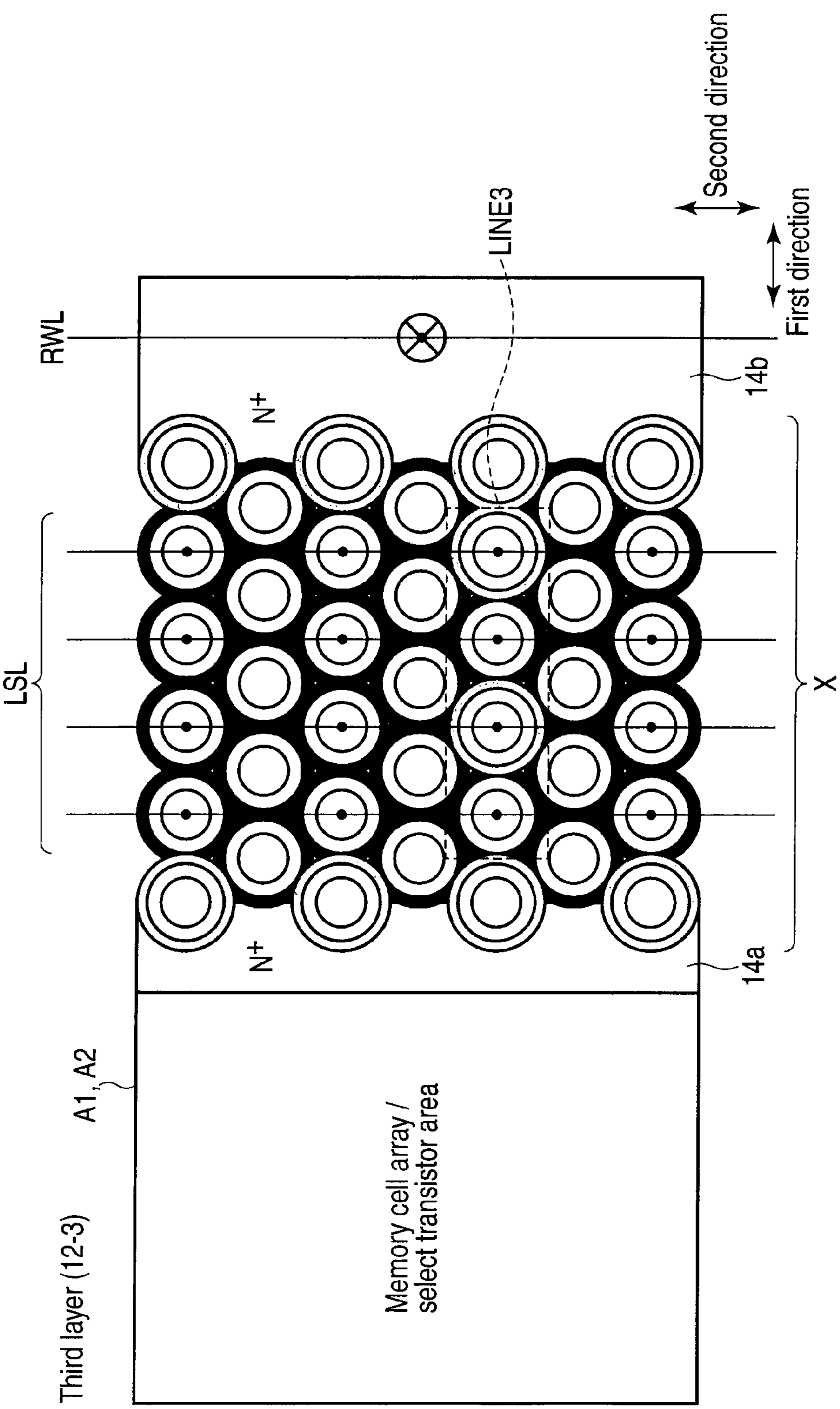
Figure 313:
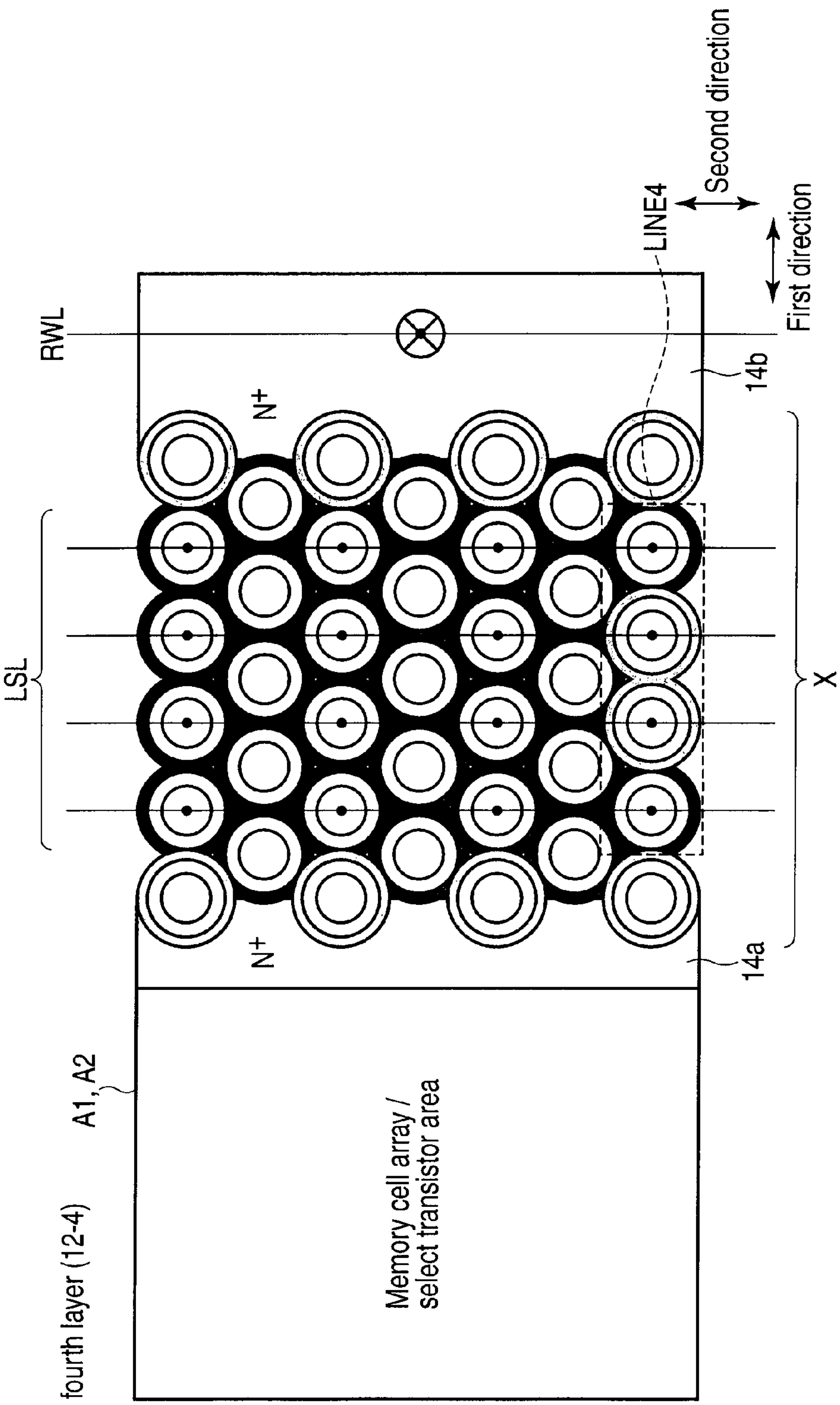
Figure 314:
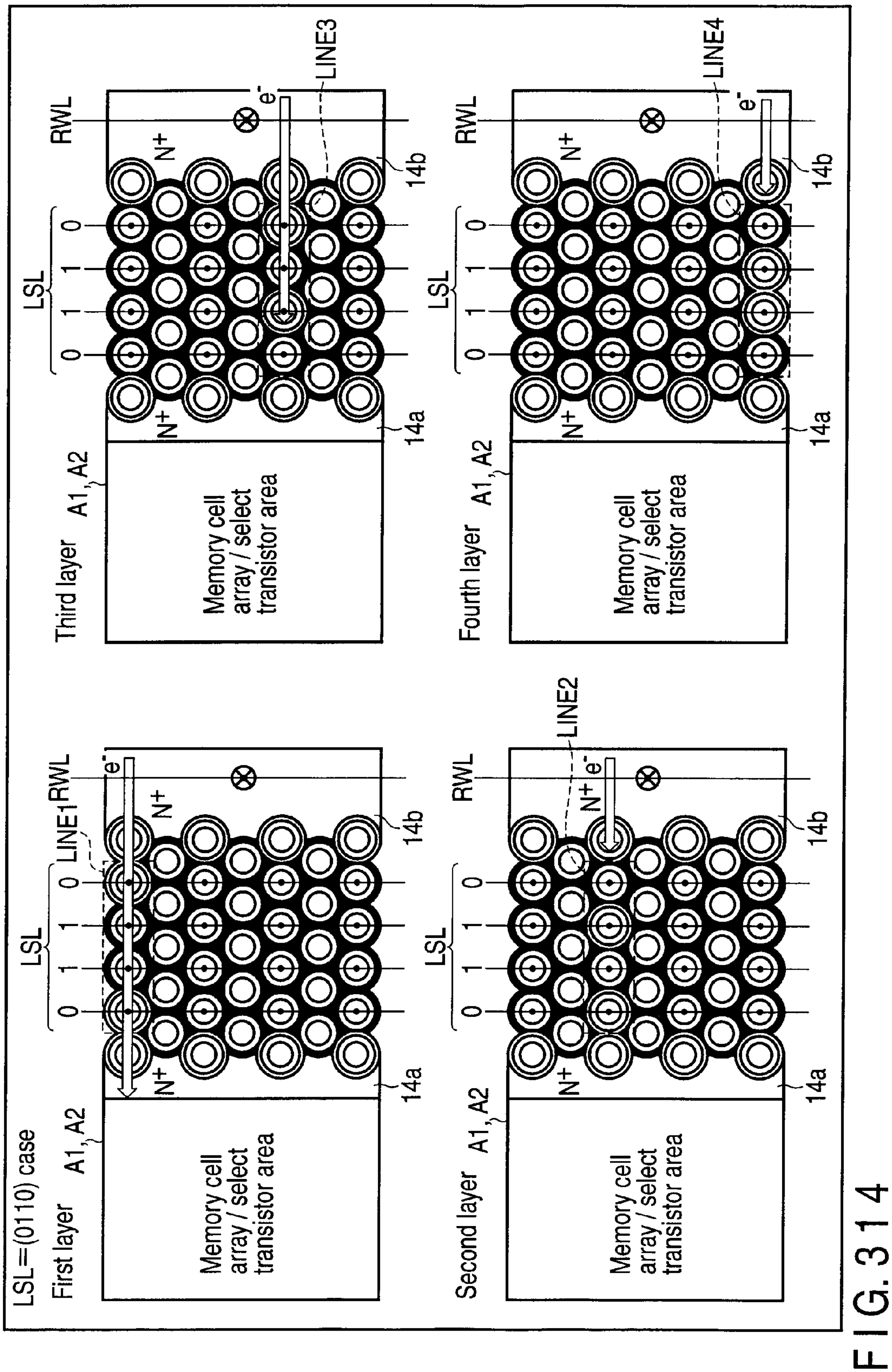
Figure 316:
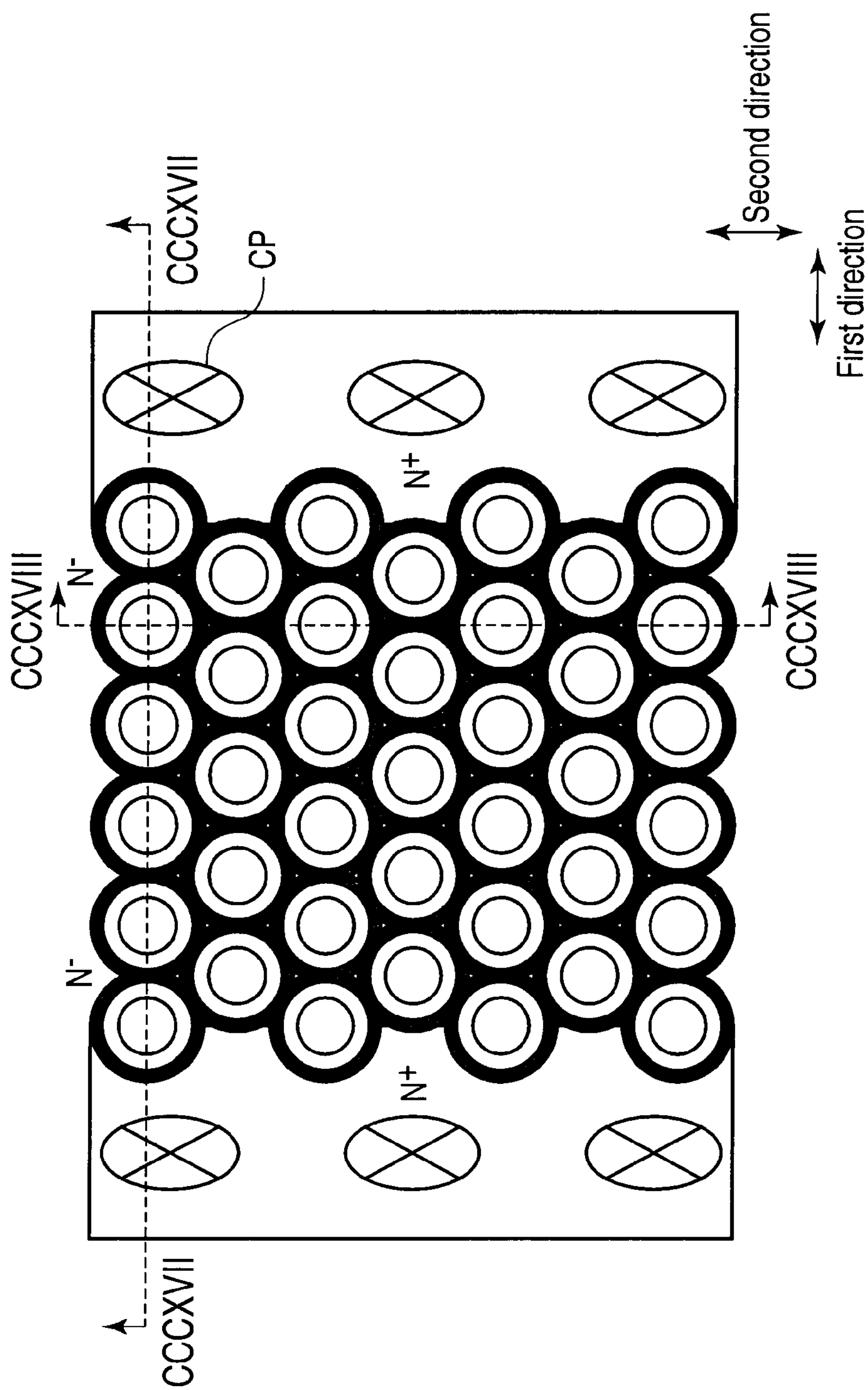
Figure 317:
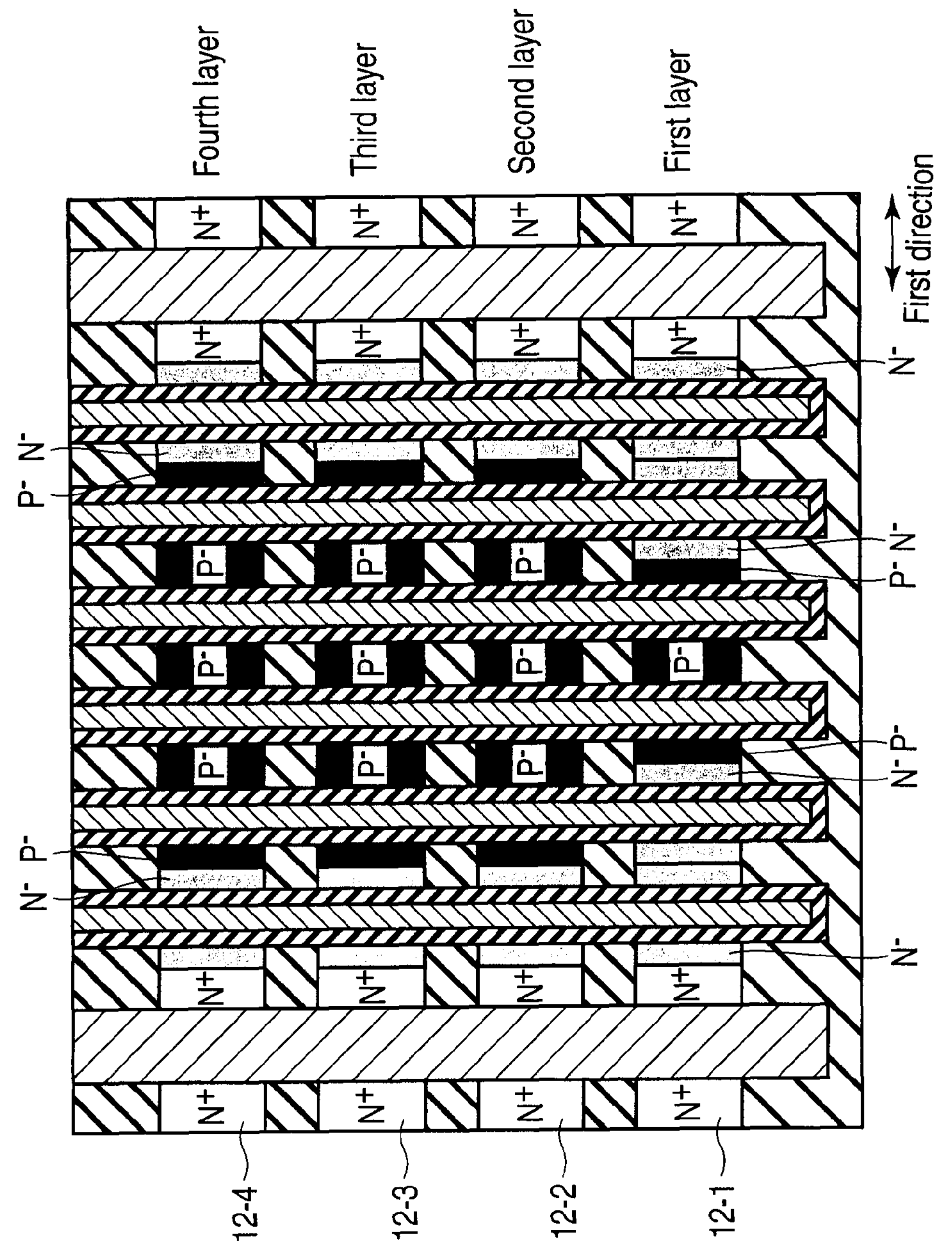
Figure 319:
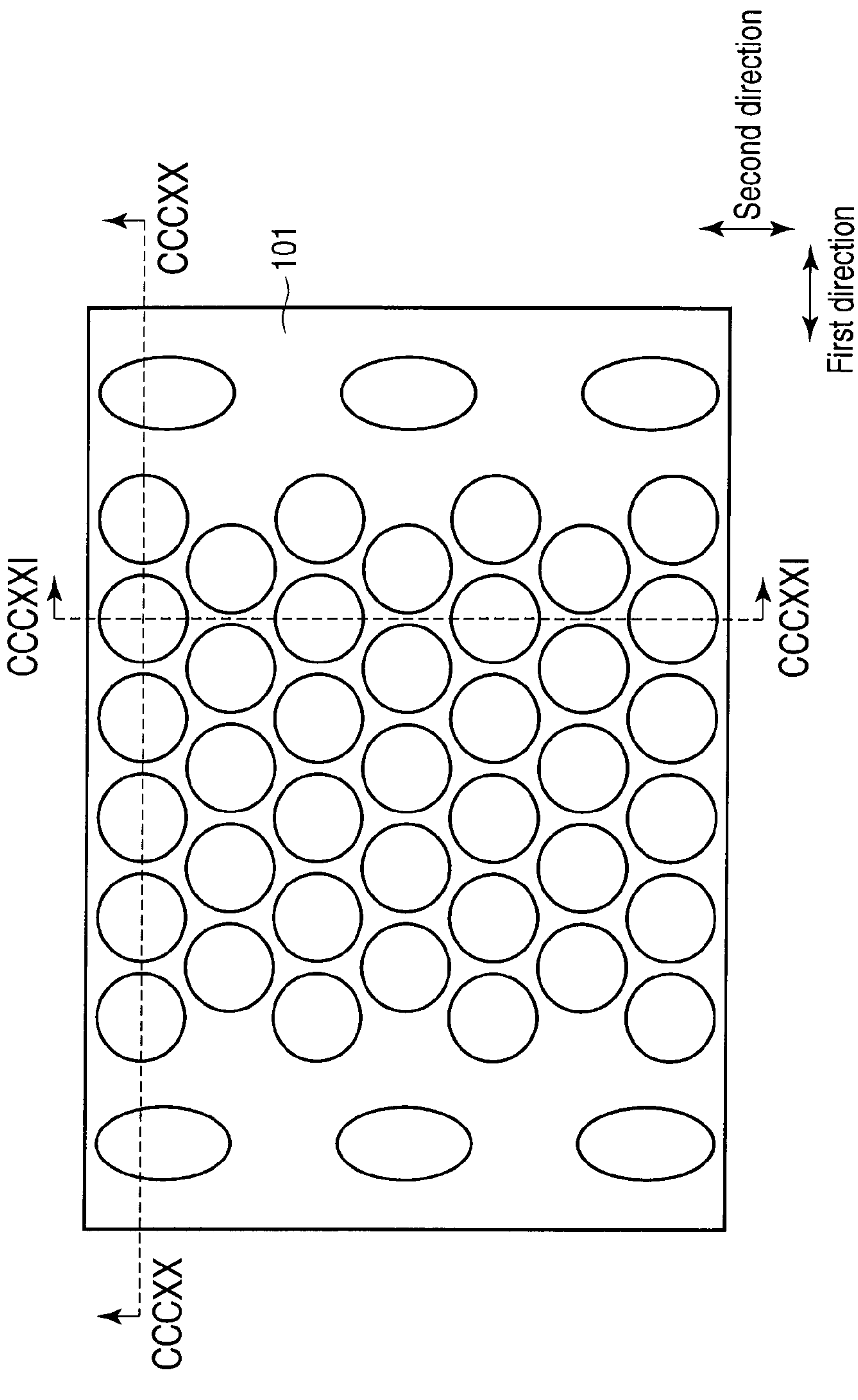
Figure 320:
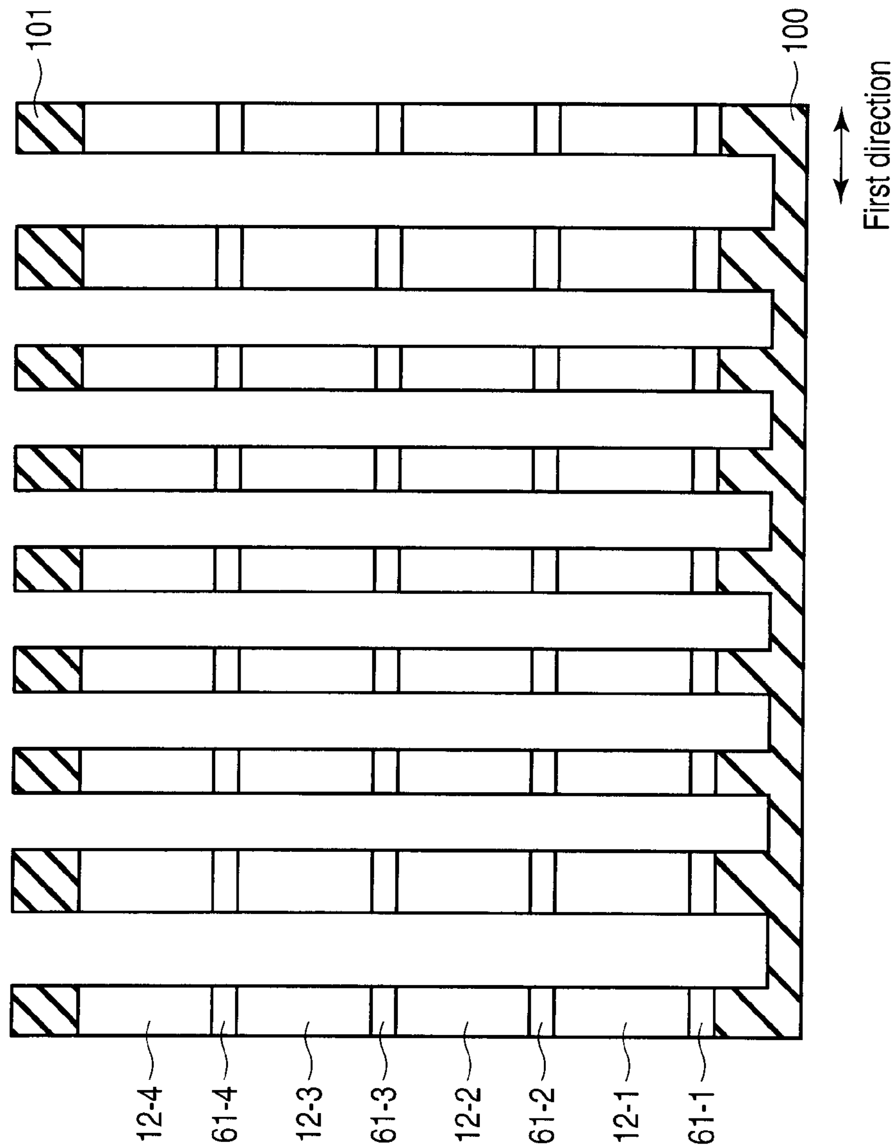
Figure 322:
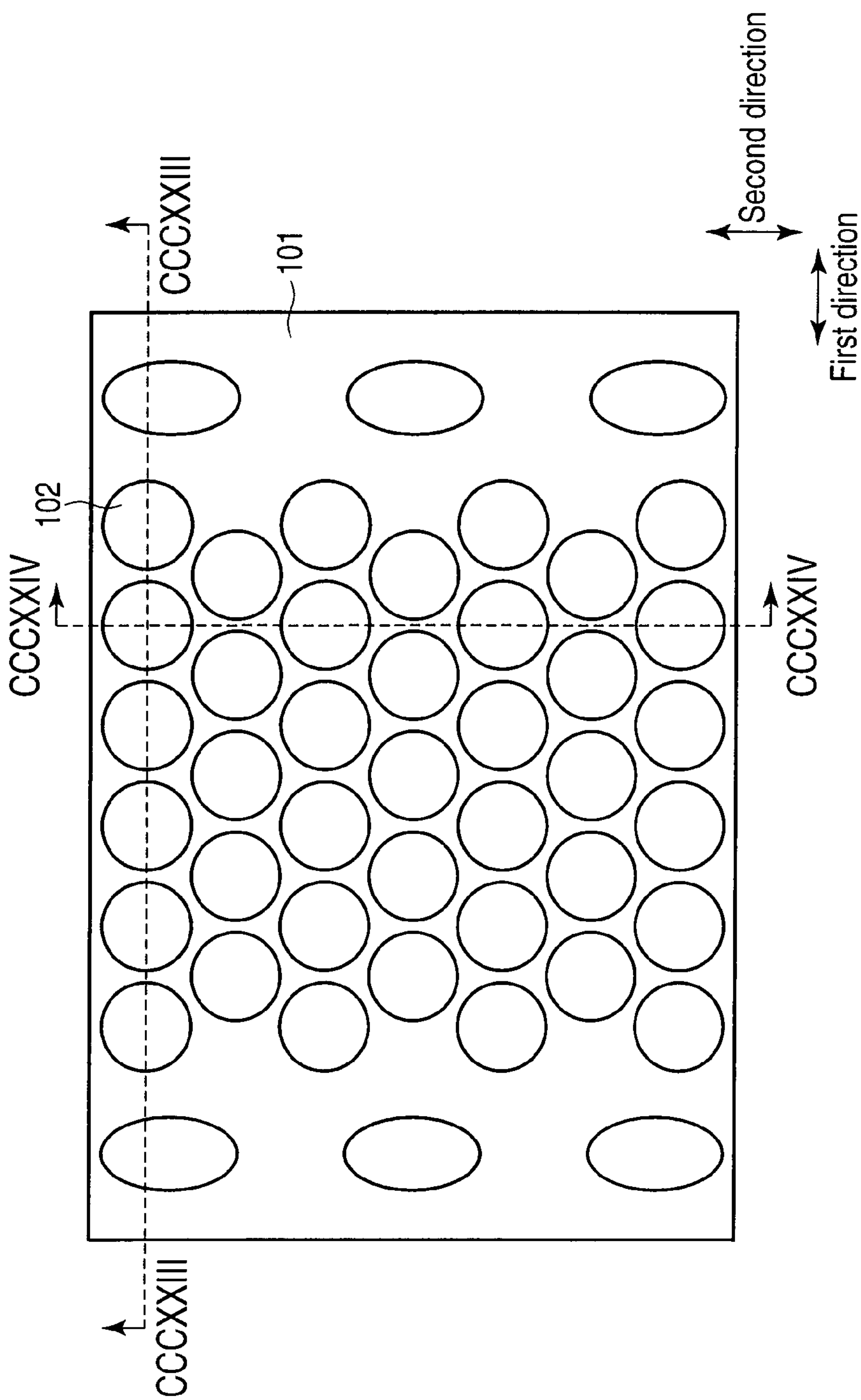
Figure 323:
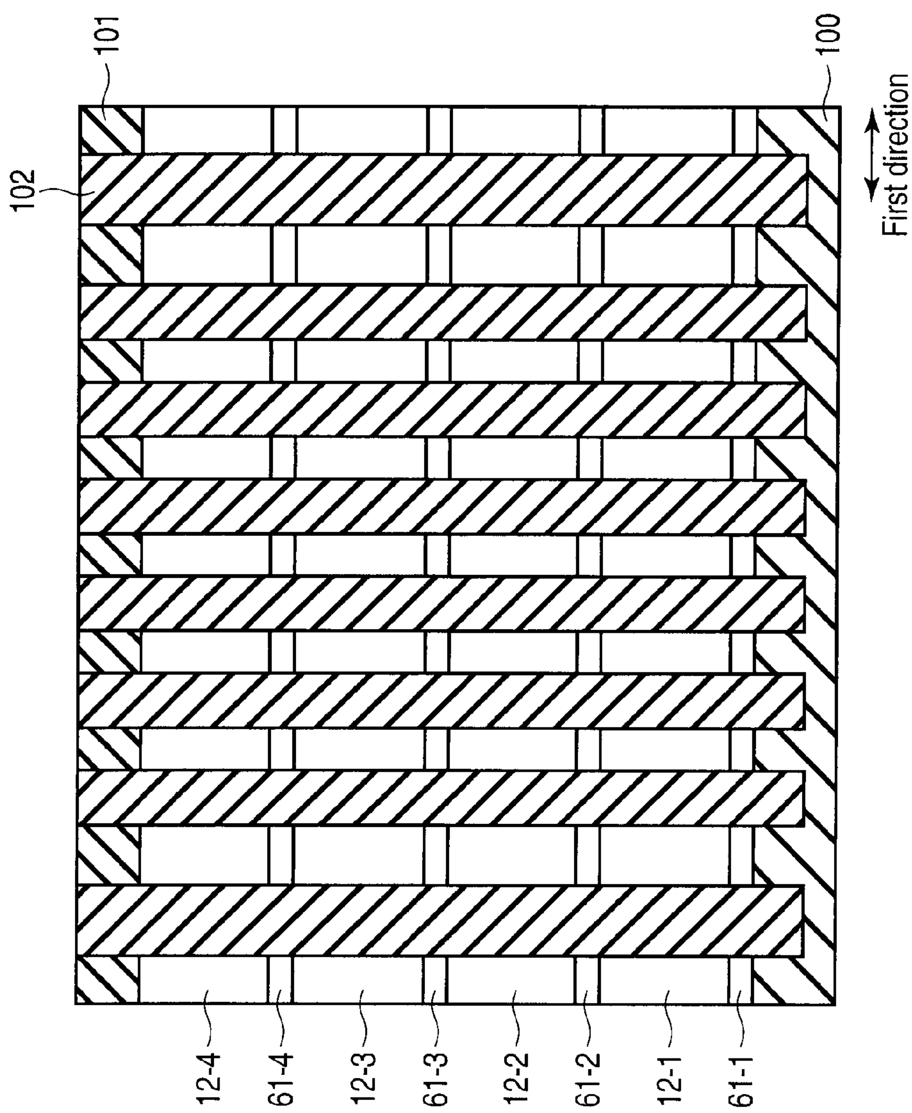
Figure 324:
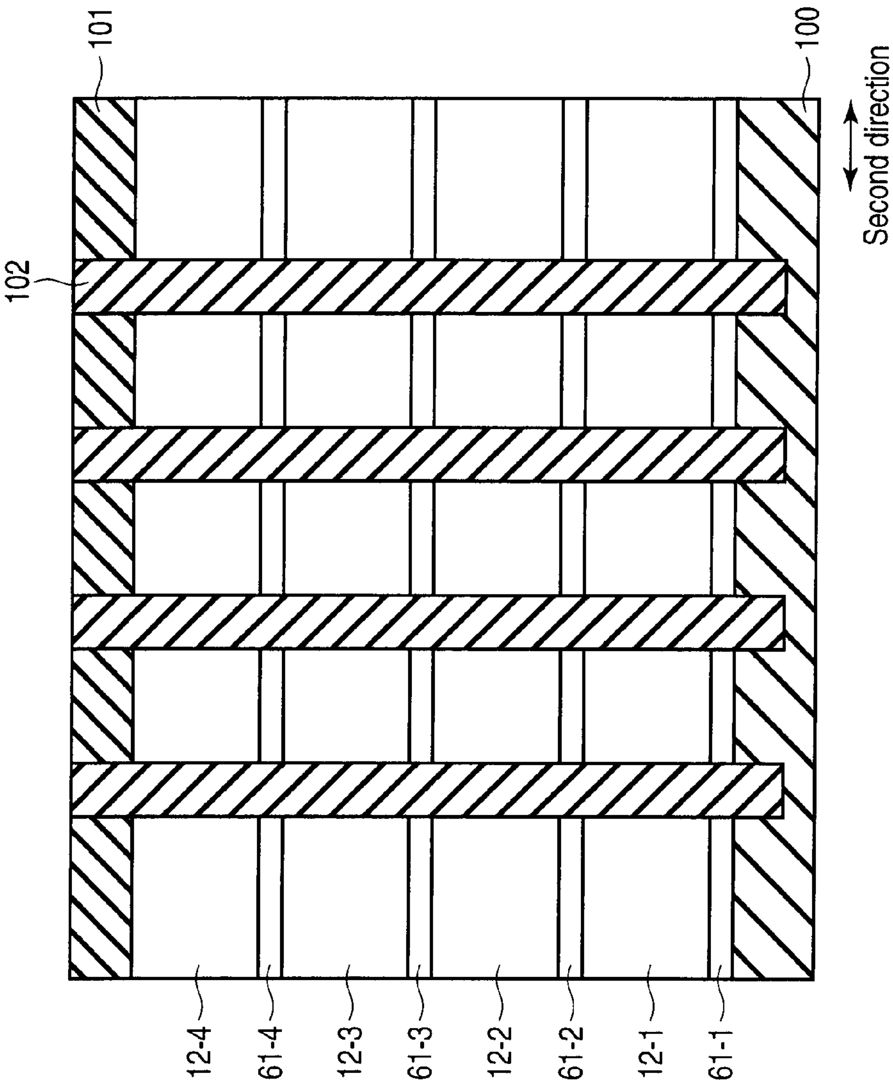
Figure 326:
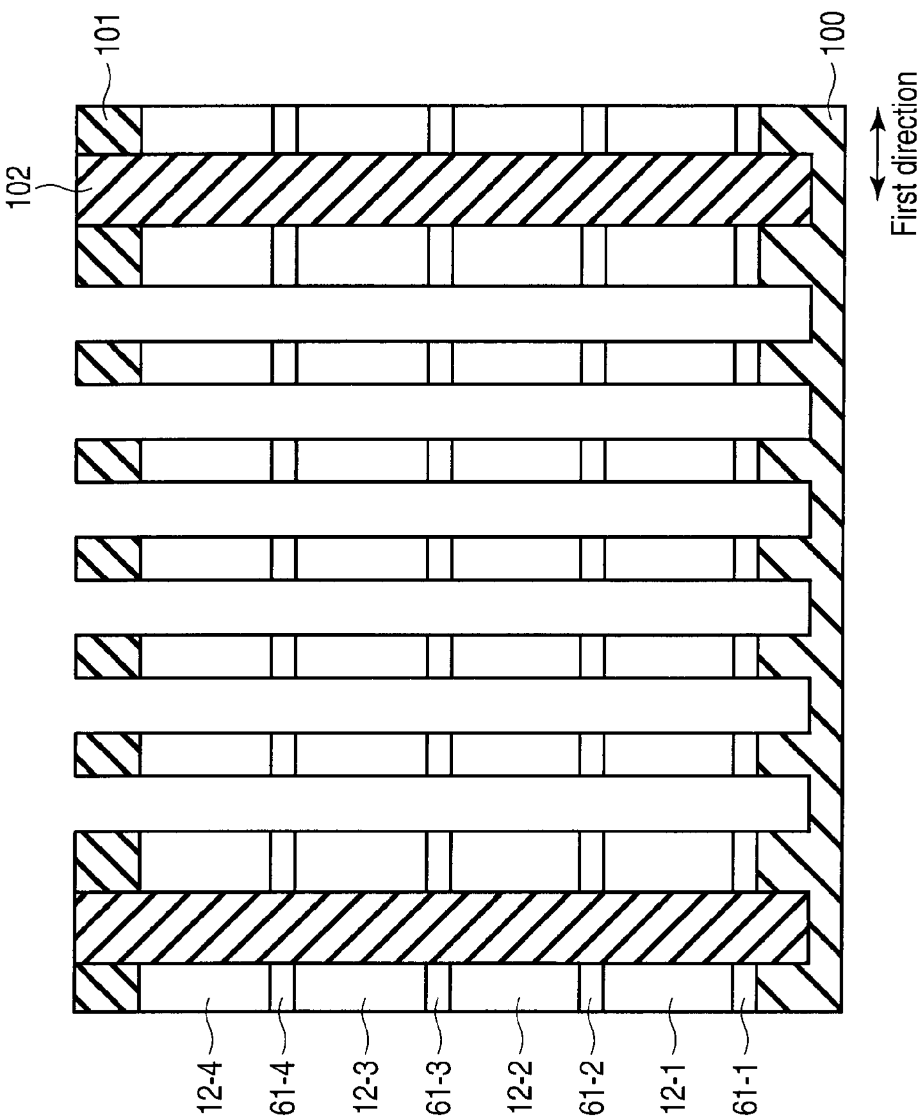
Figure 327:
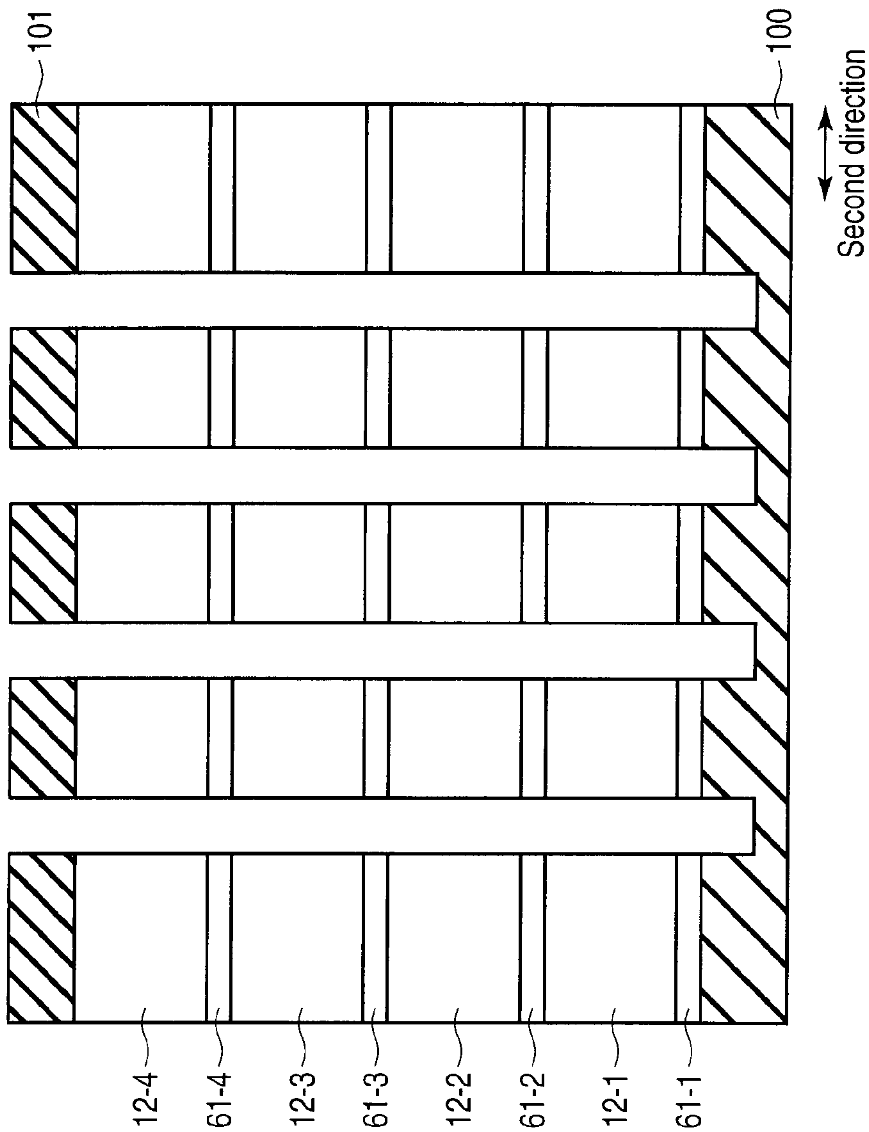
Figure 329:
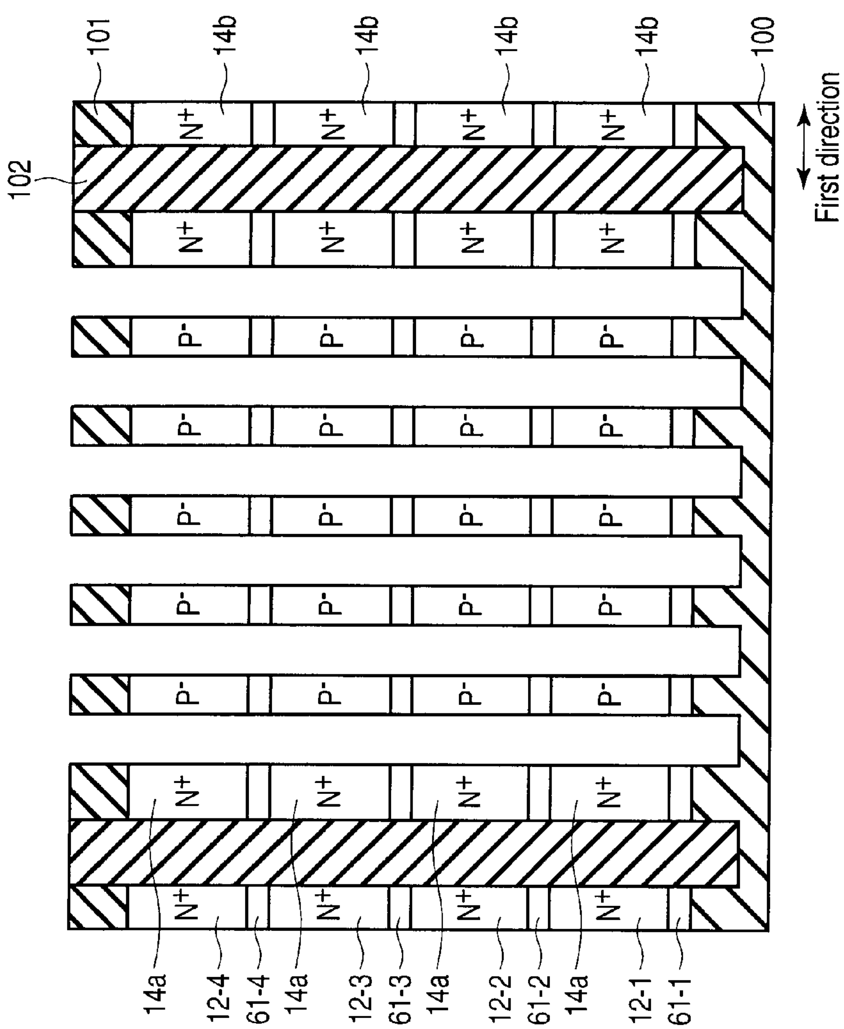
Figure 330:
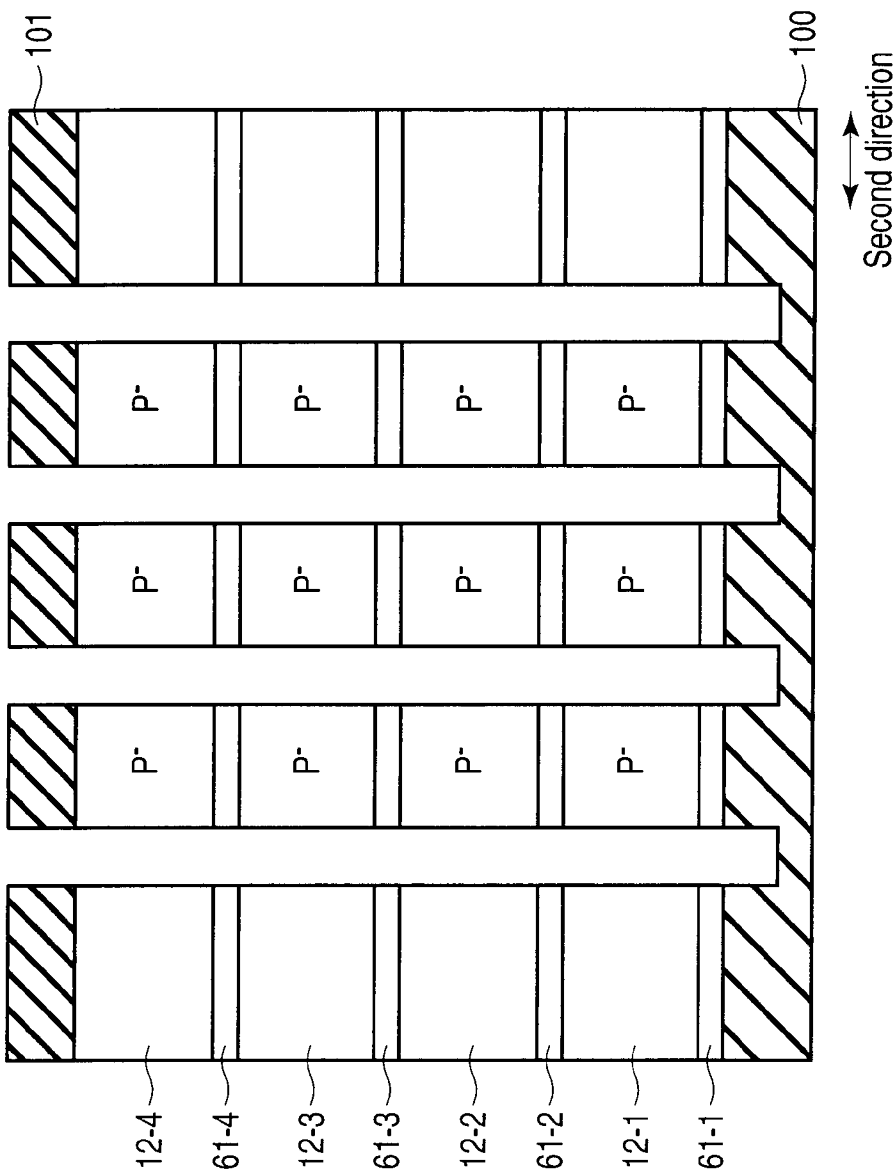
Figure 331:
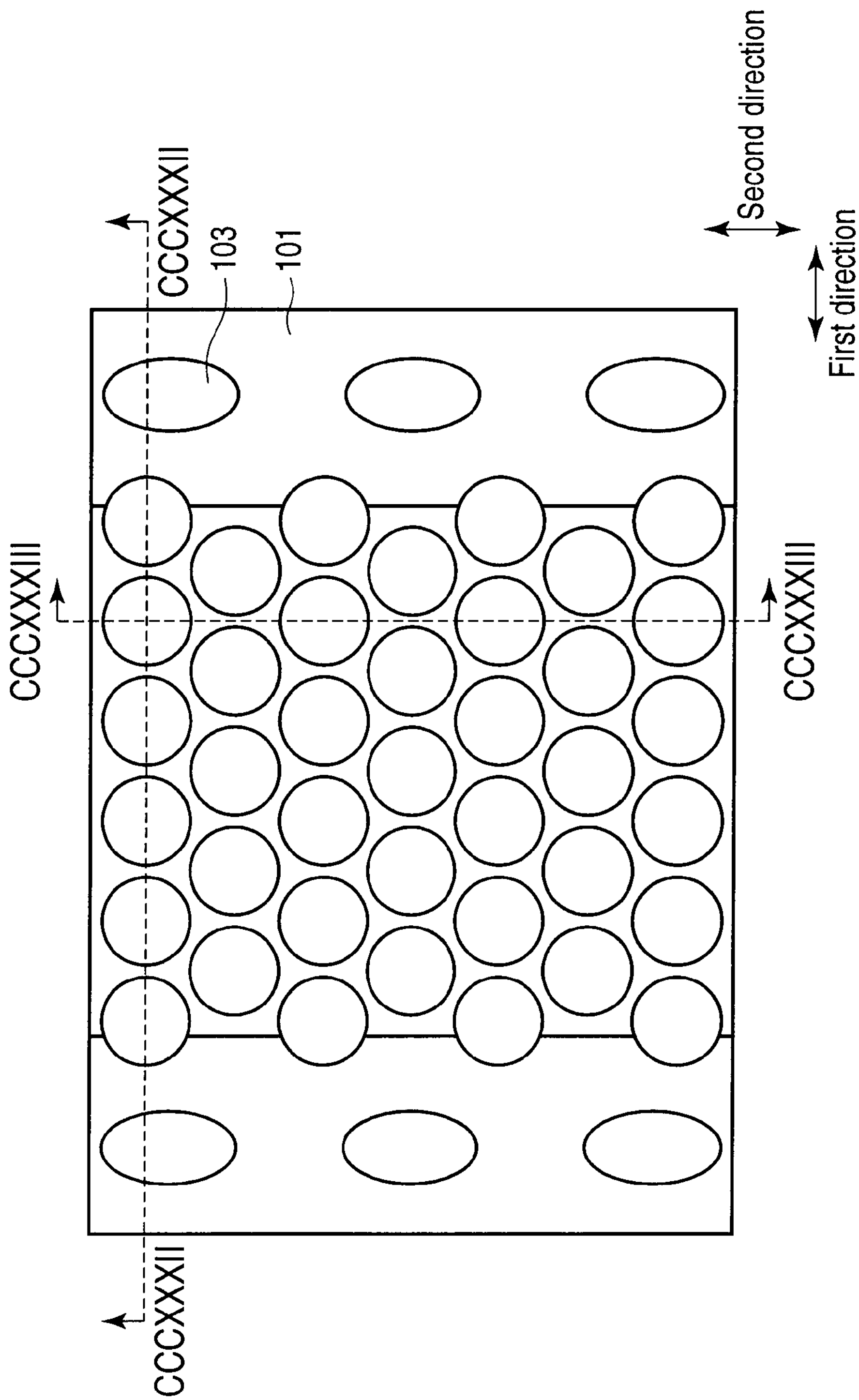
Figure 332:
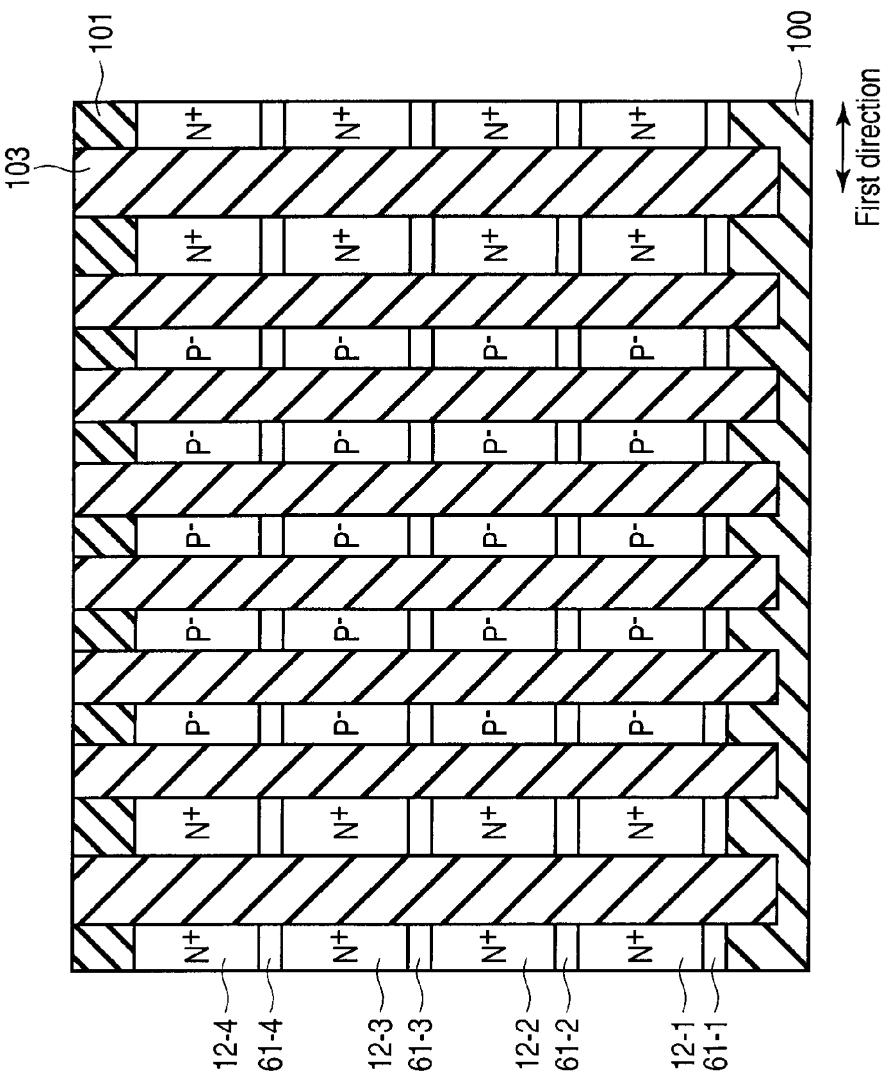
Figure 333:
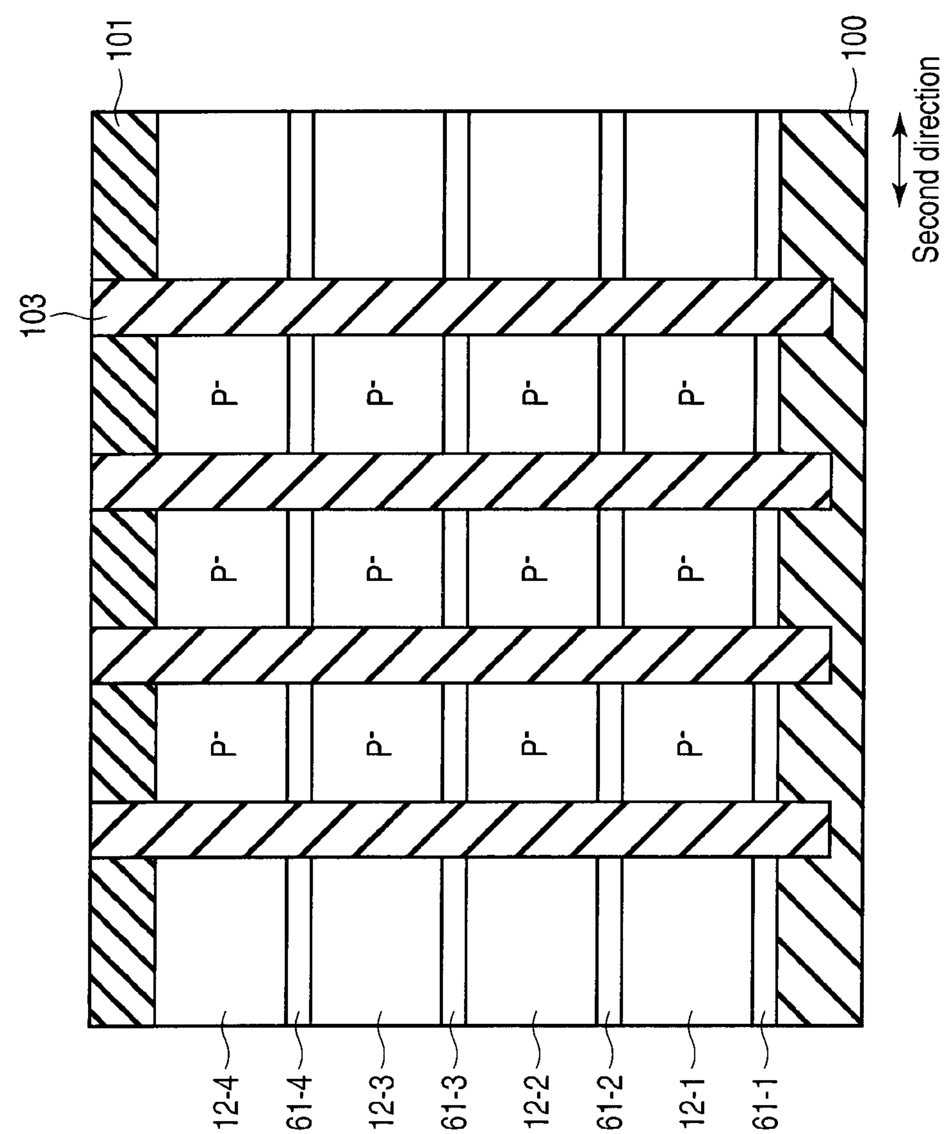
Figure 334:
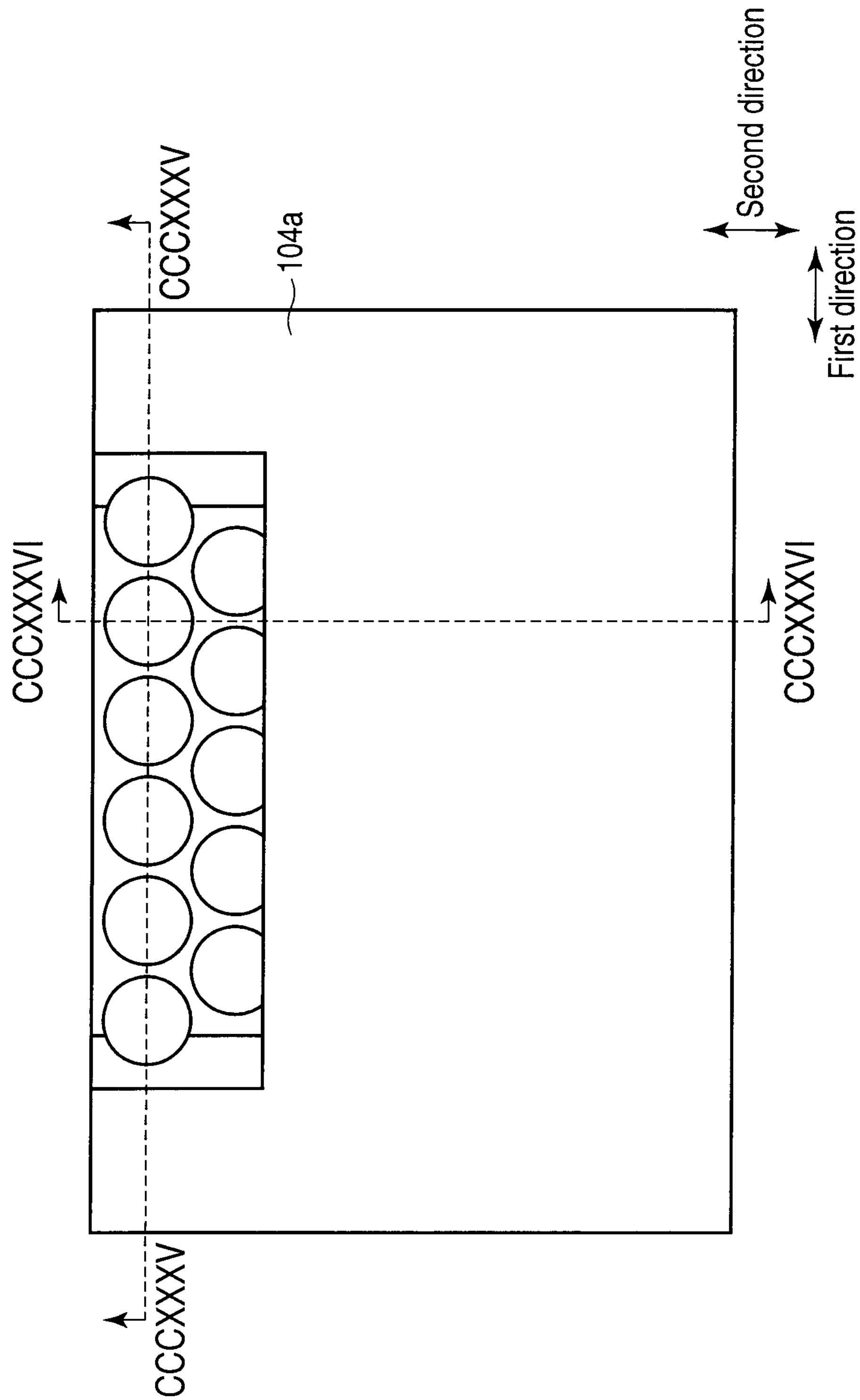
Figure 335:
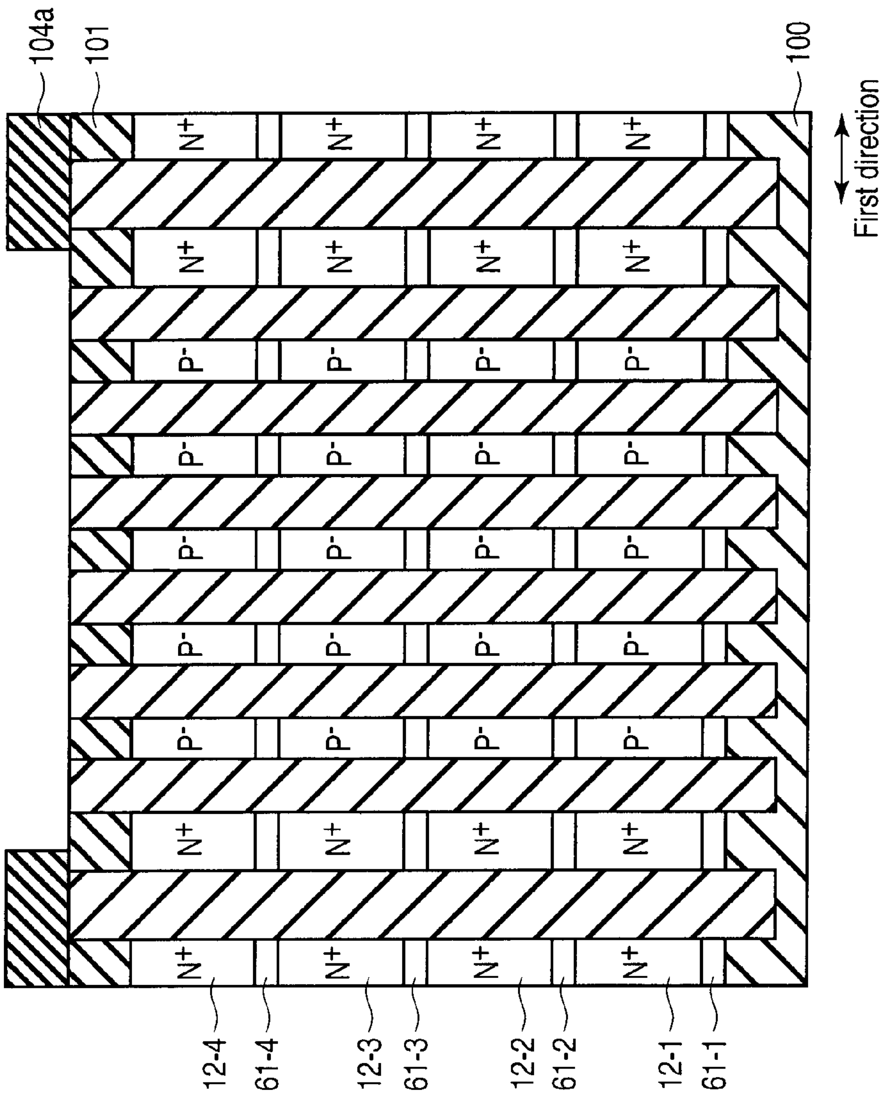
Figure 336:
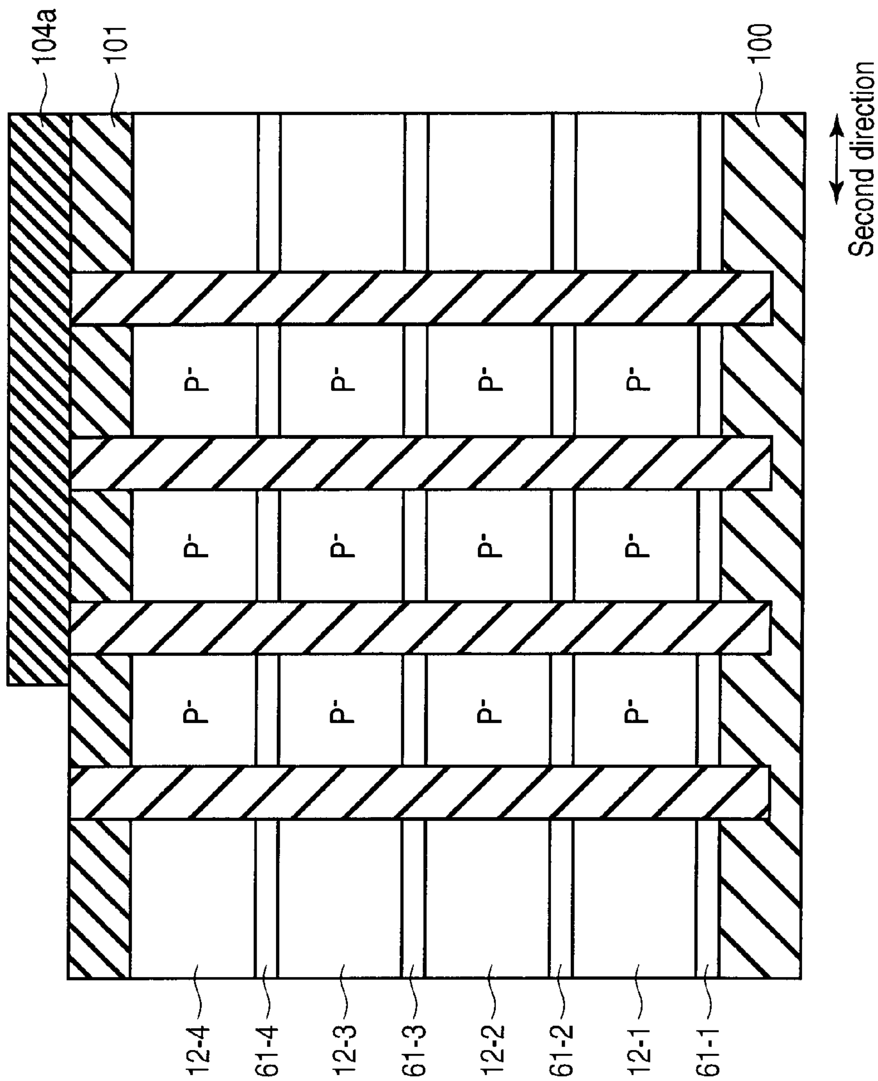
Figure 338:
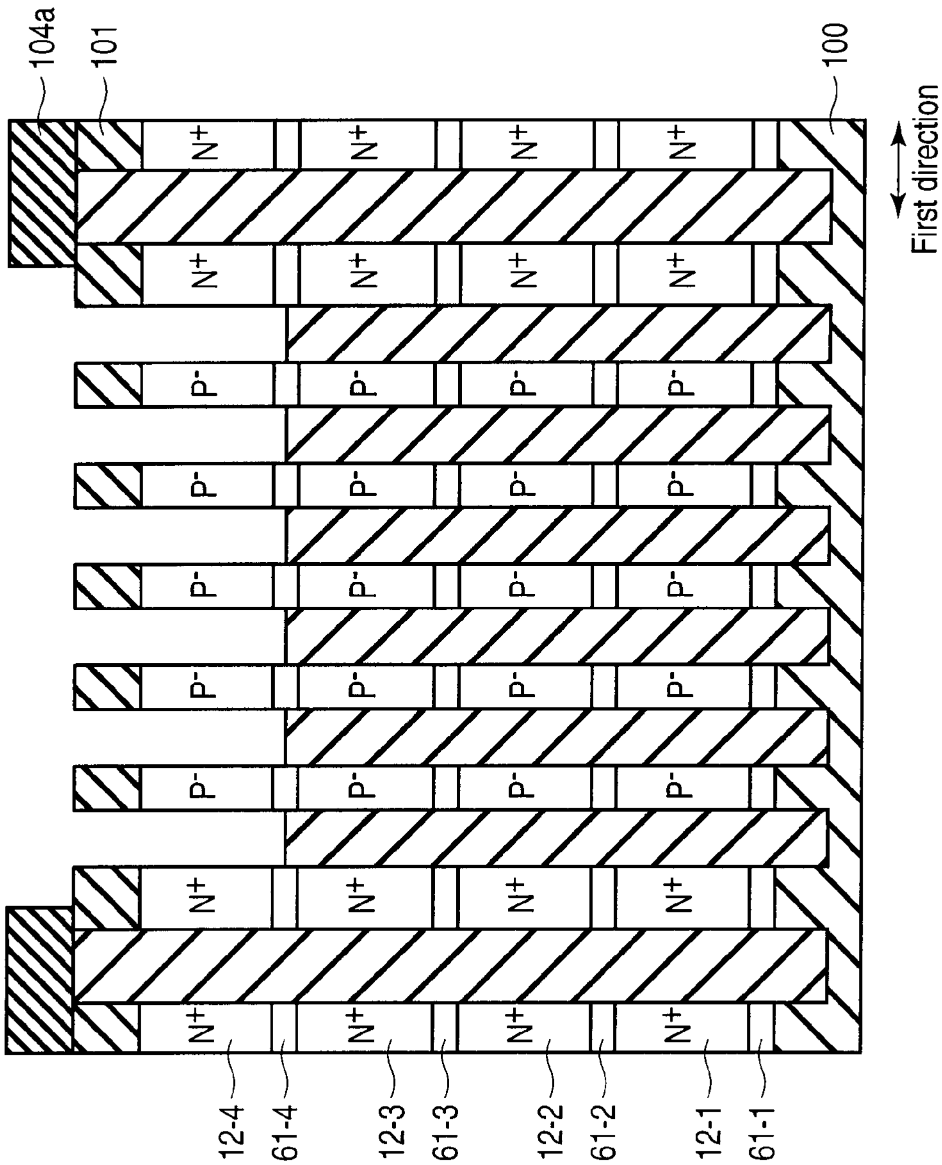
Figure 339:
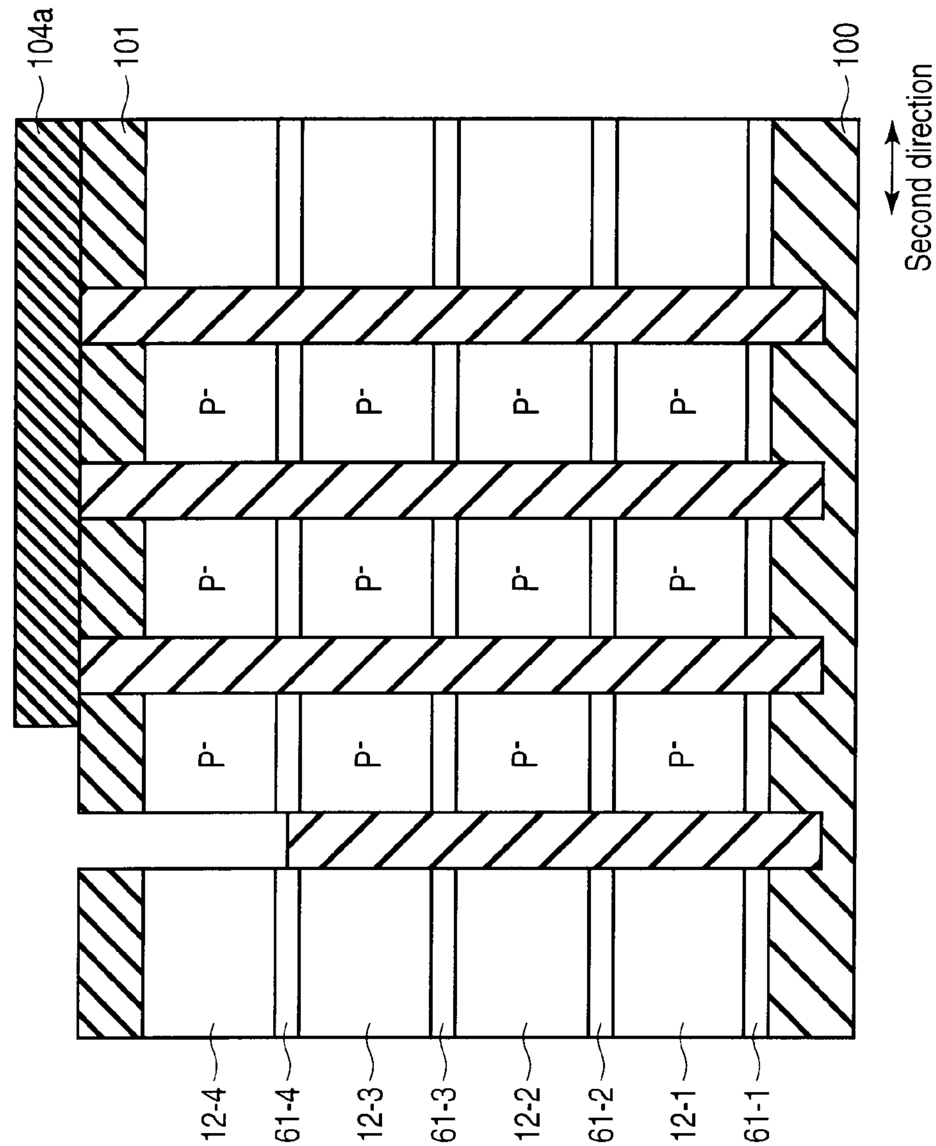
Figure 340:
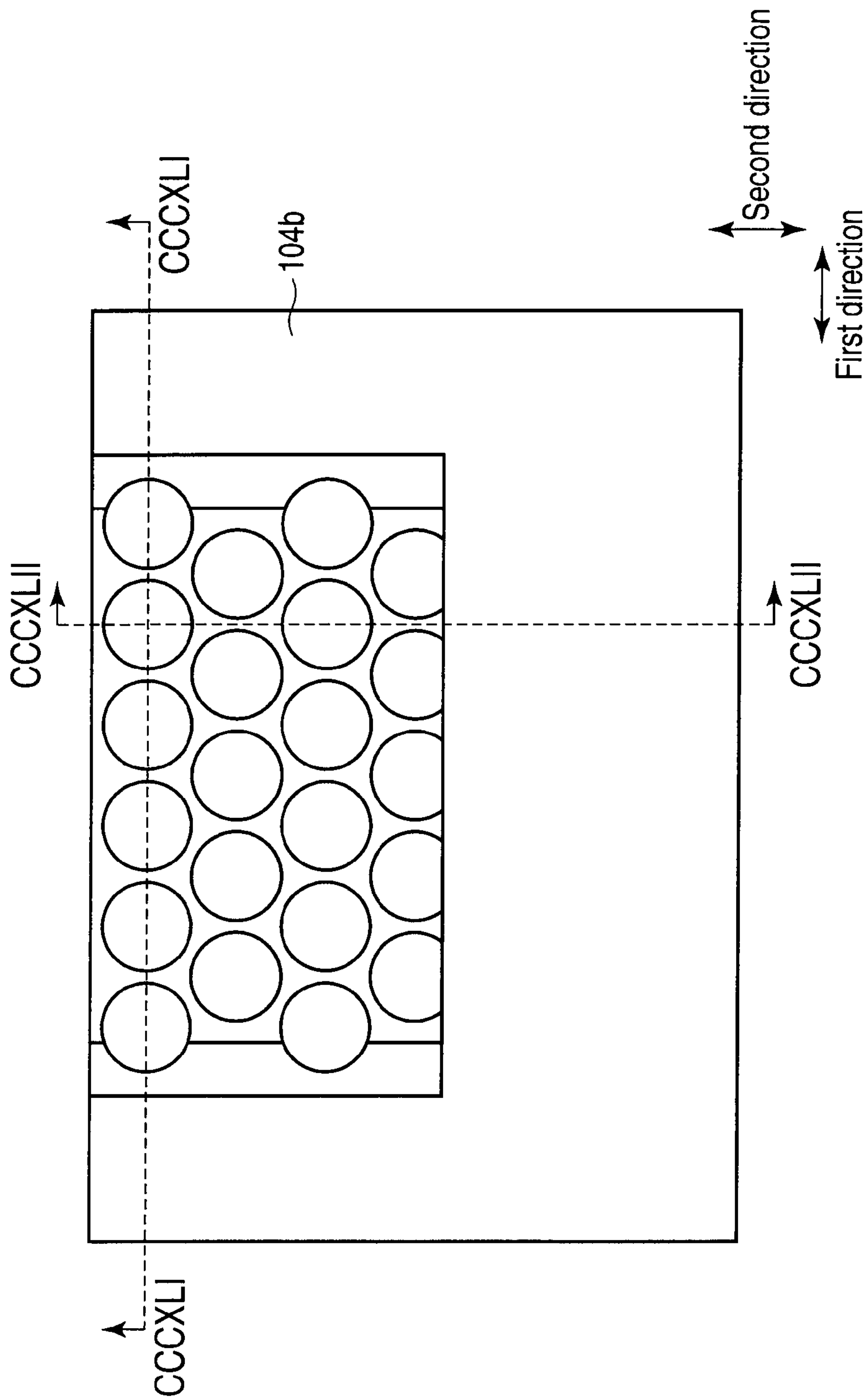
Figure 341:
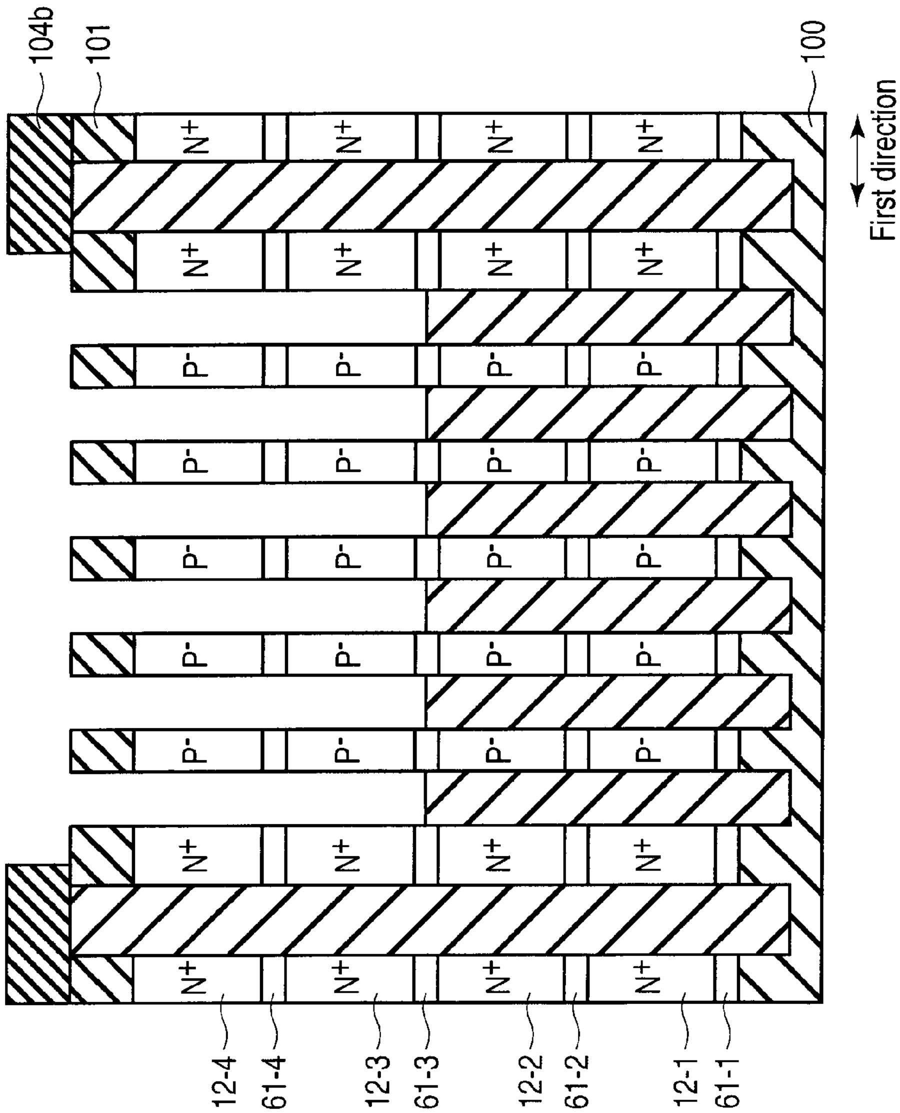
Figure 342:
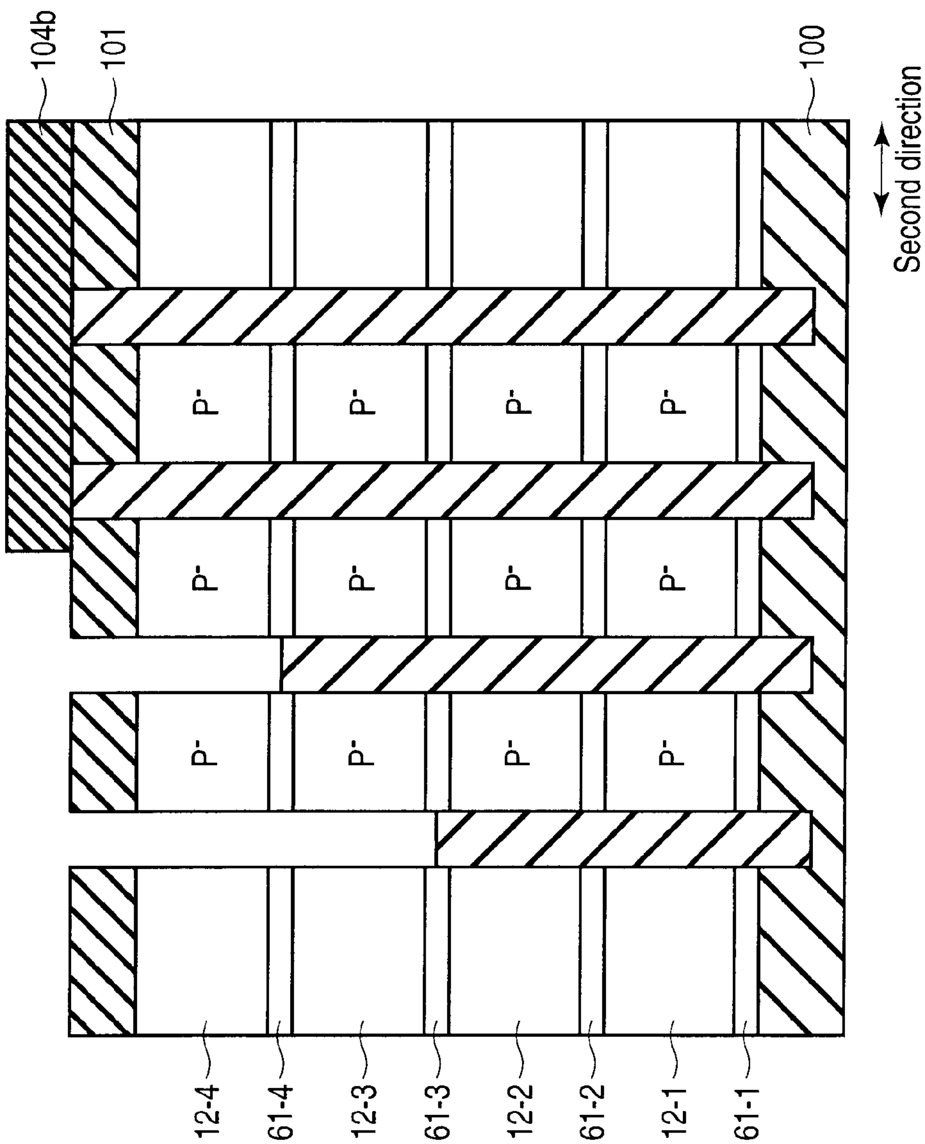
Figure 343:
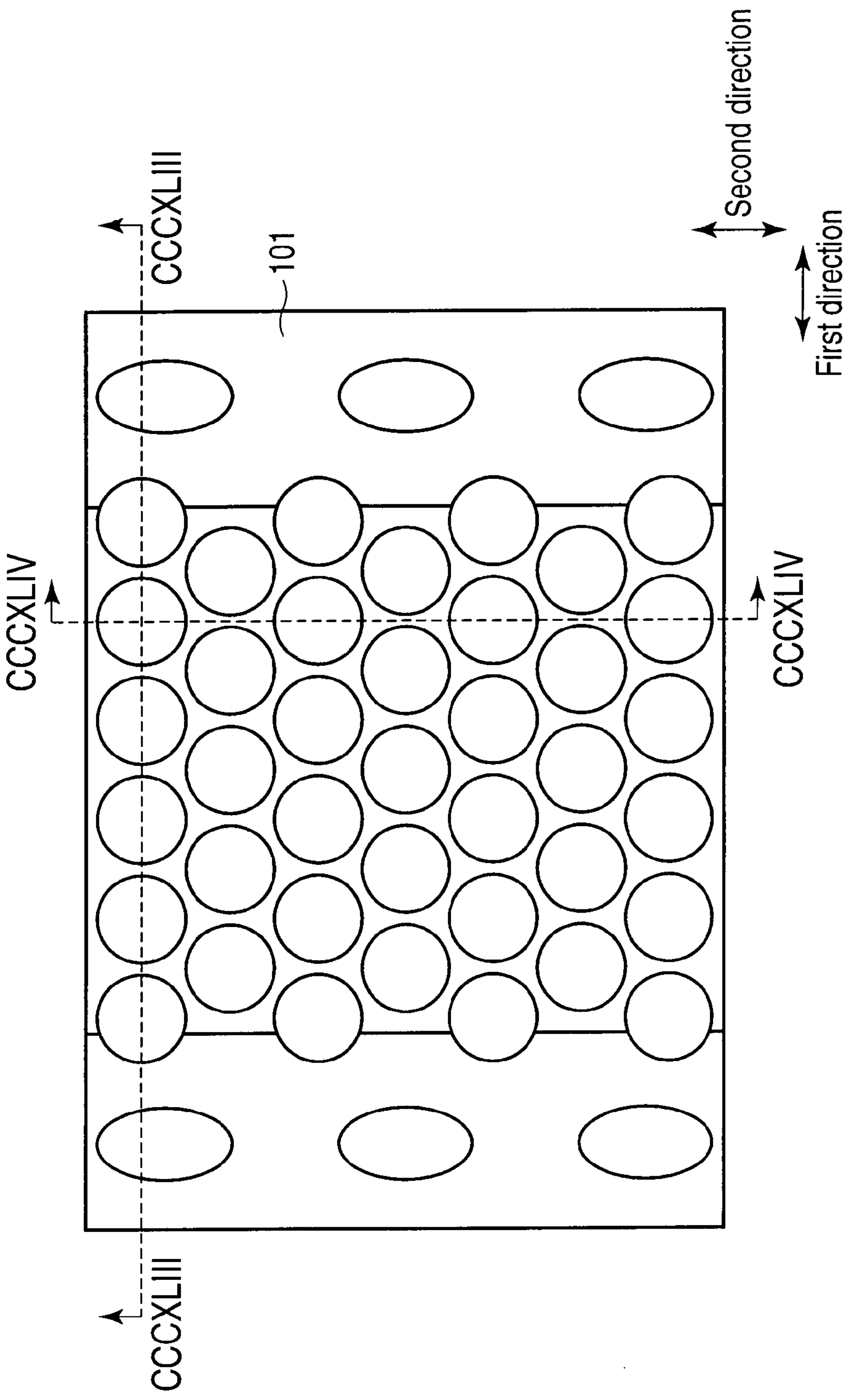
Figure 344:
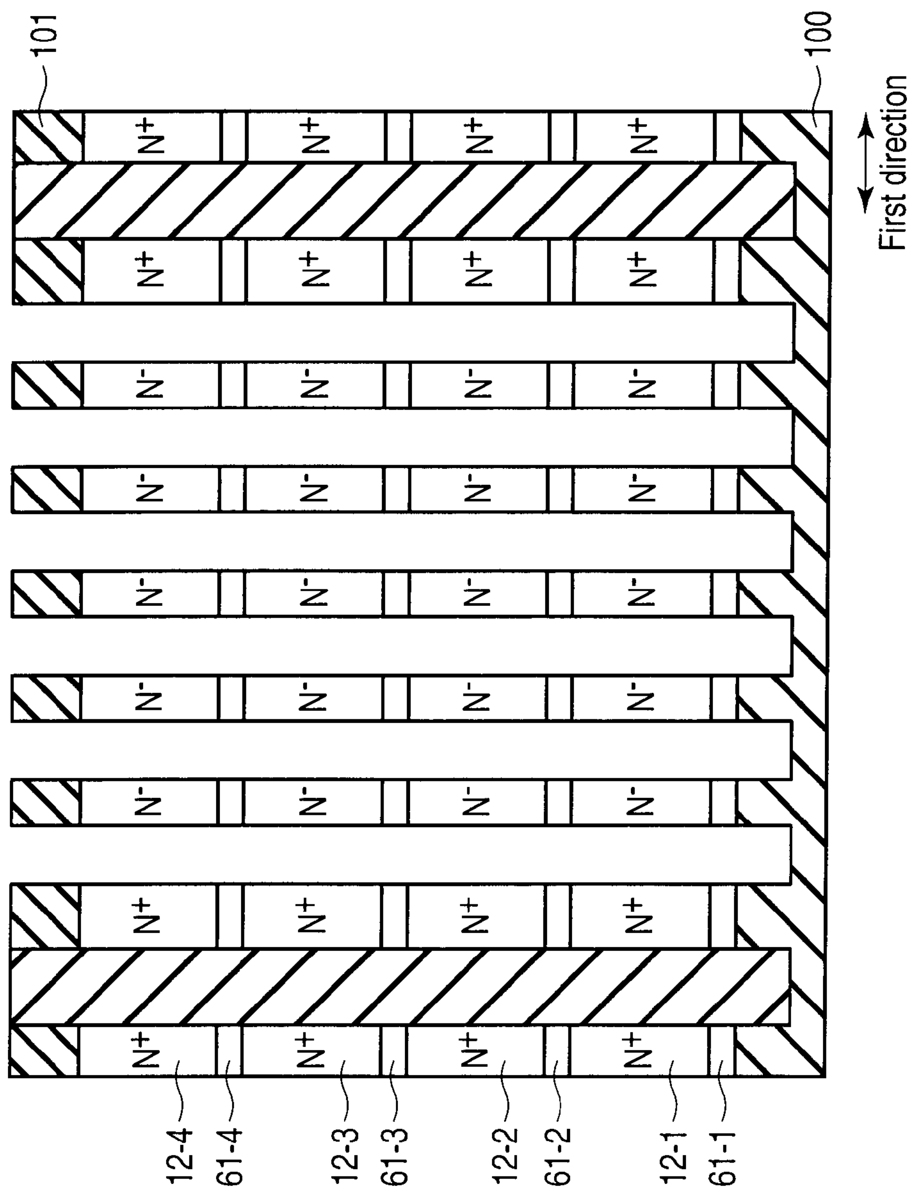
Figure 345:
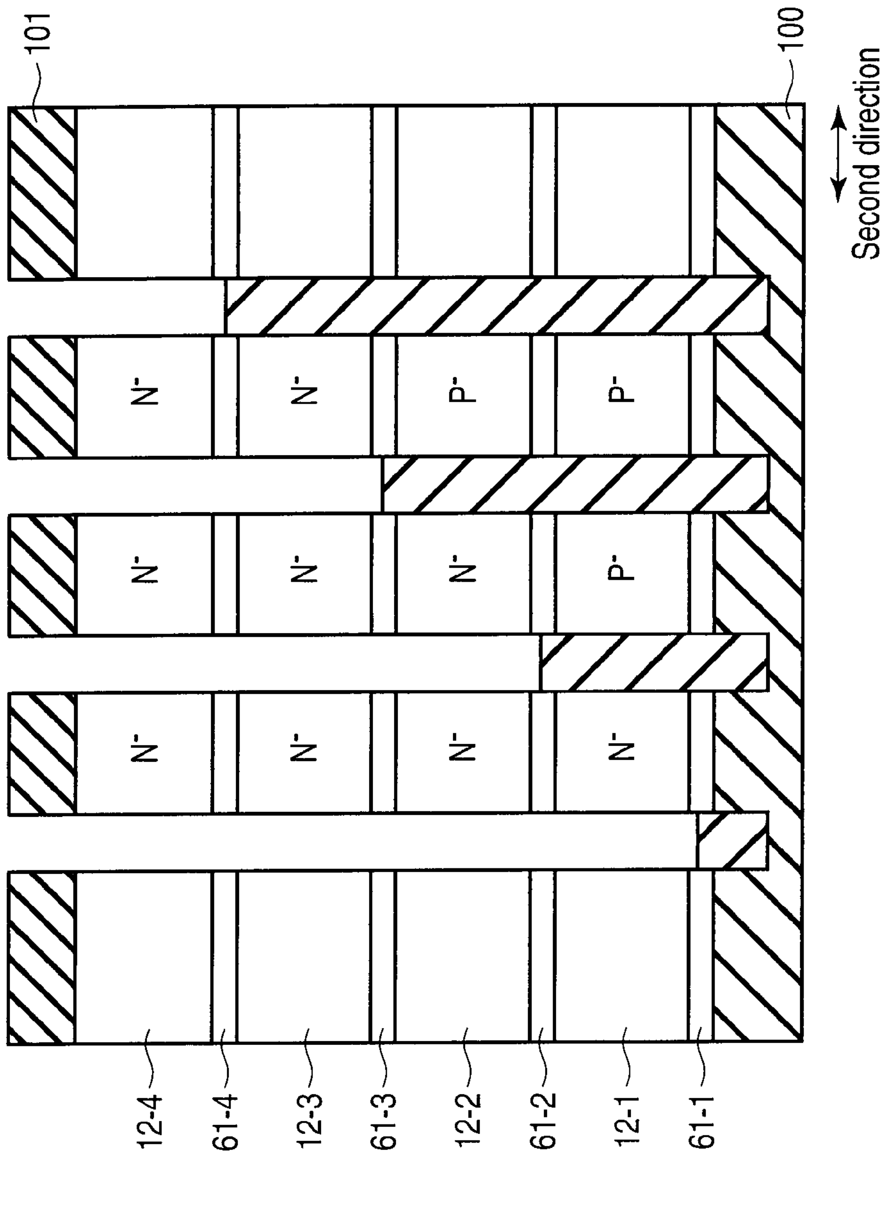
Figure 346:
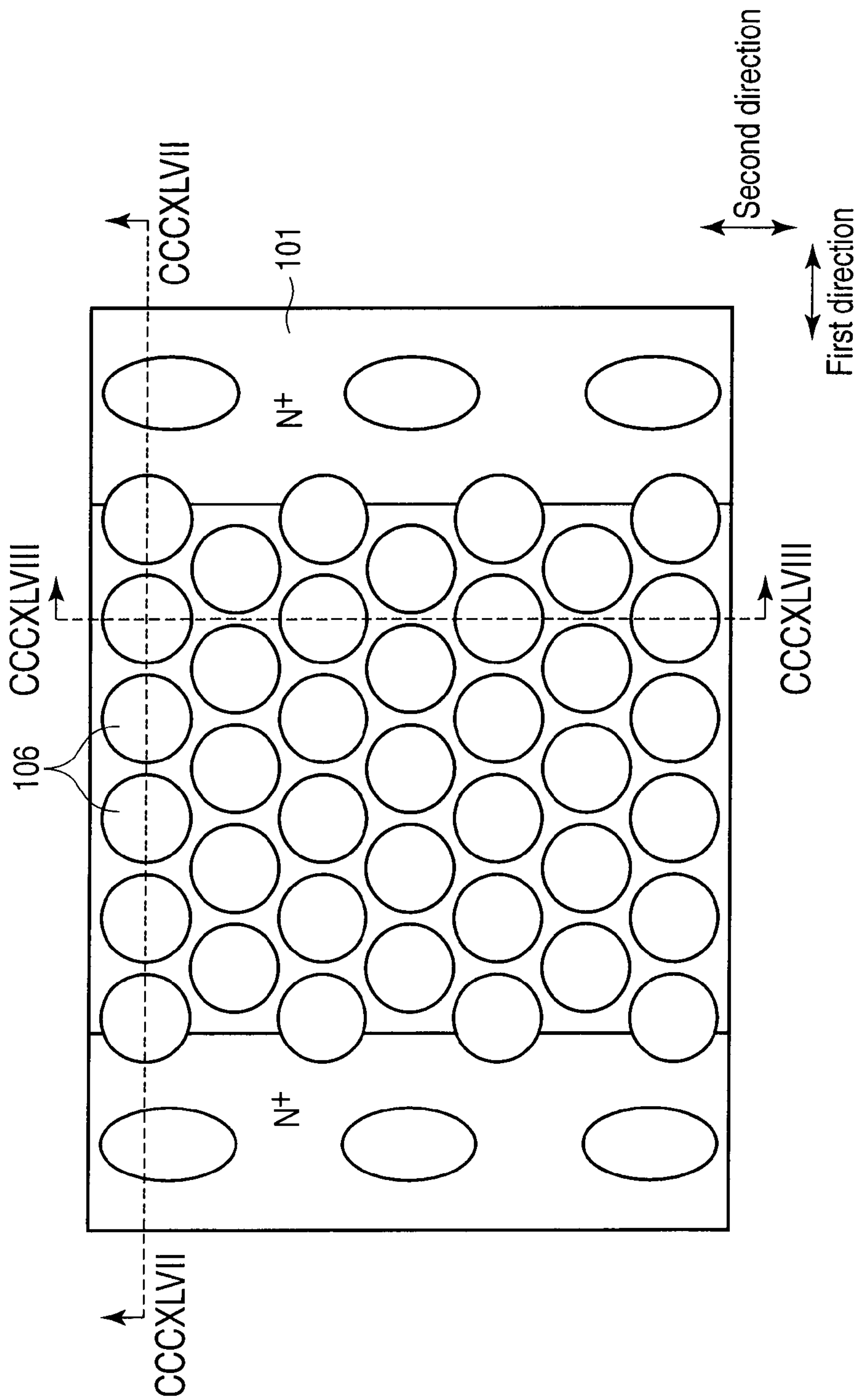
Figure 347:
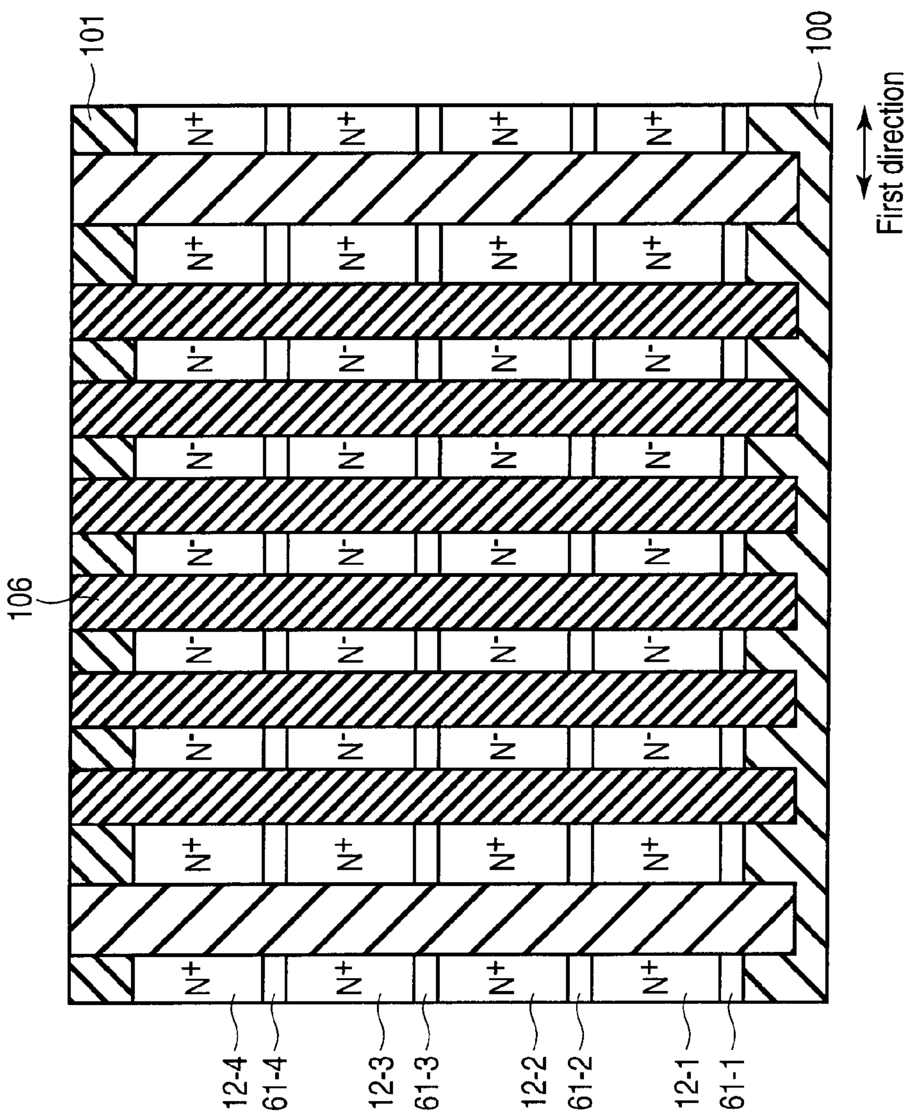
Figure 348:
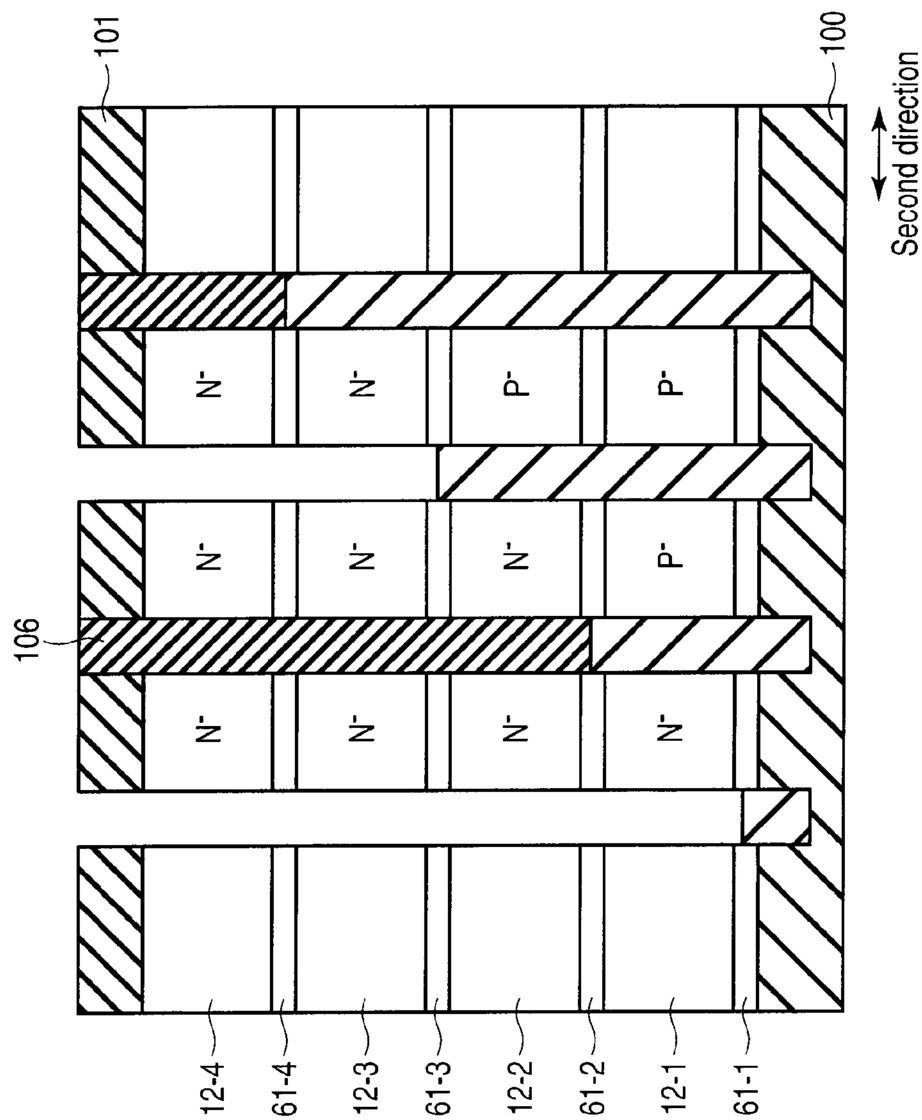
Figure 349:
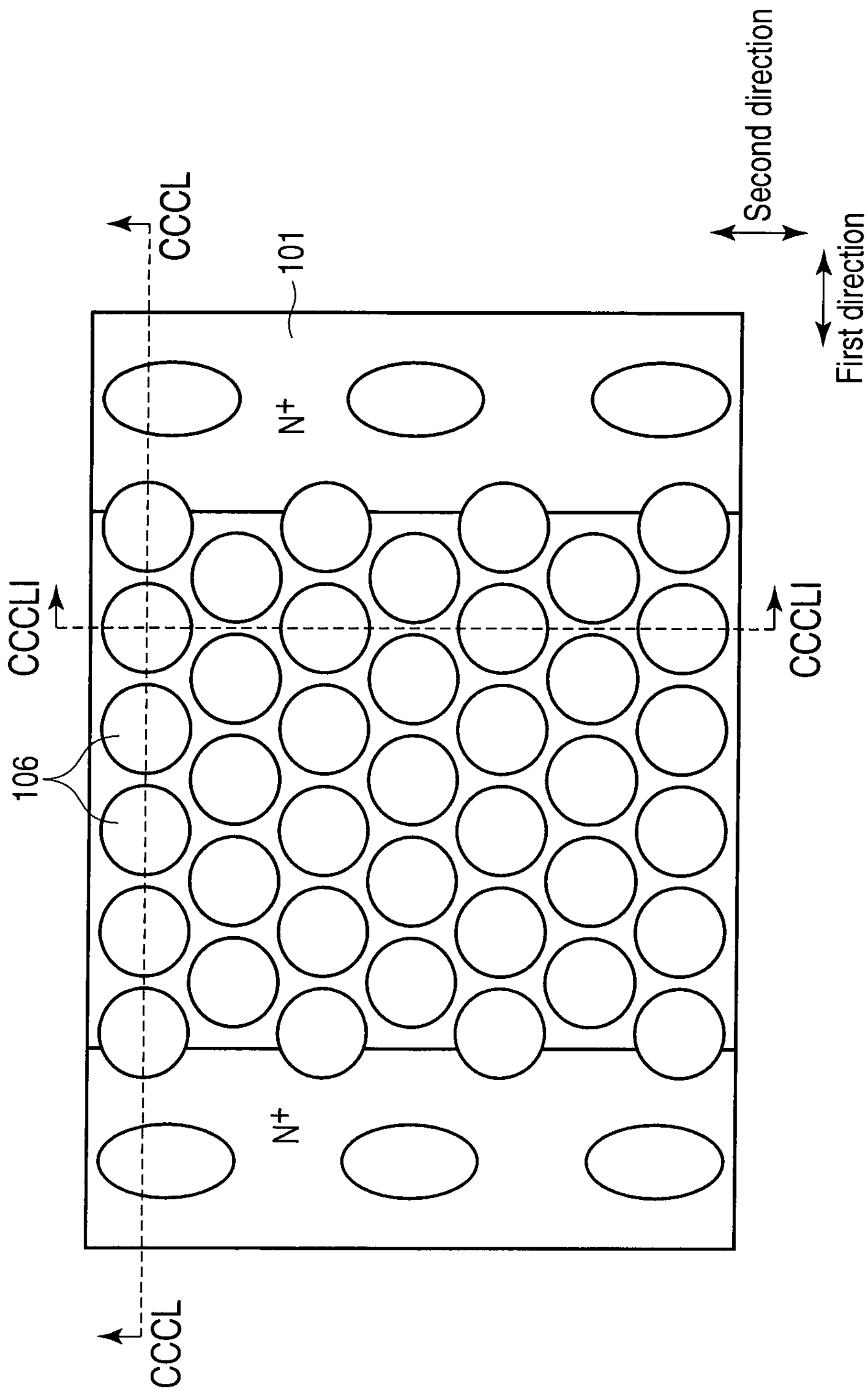
Figure 351:
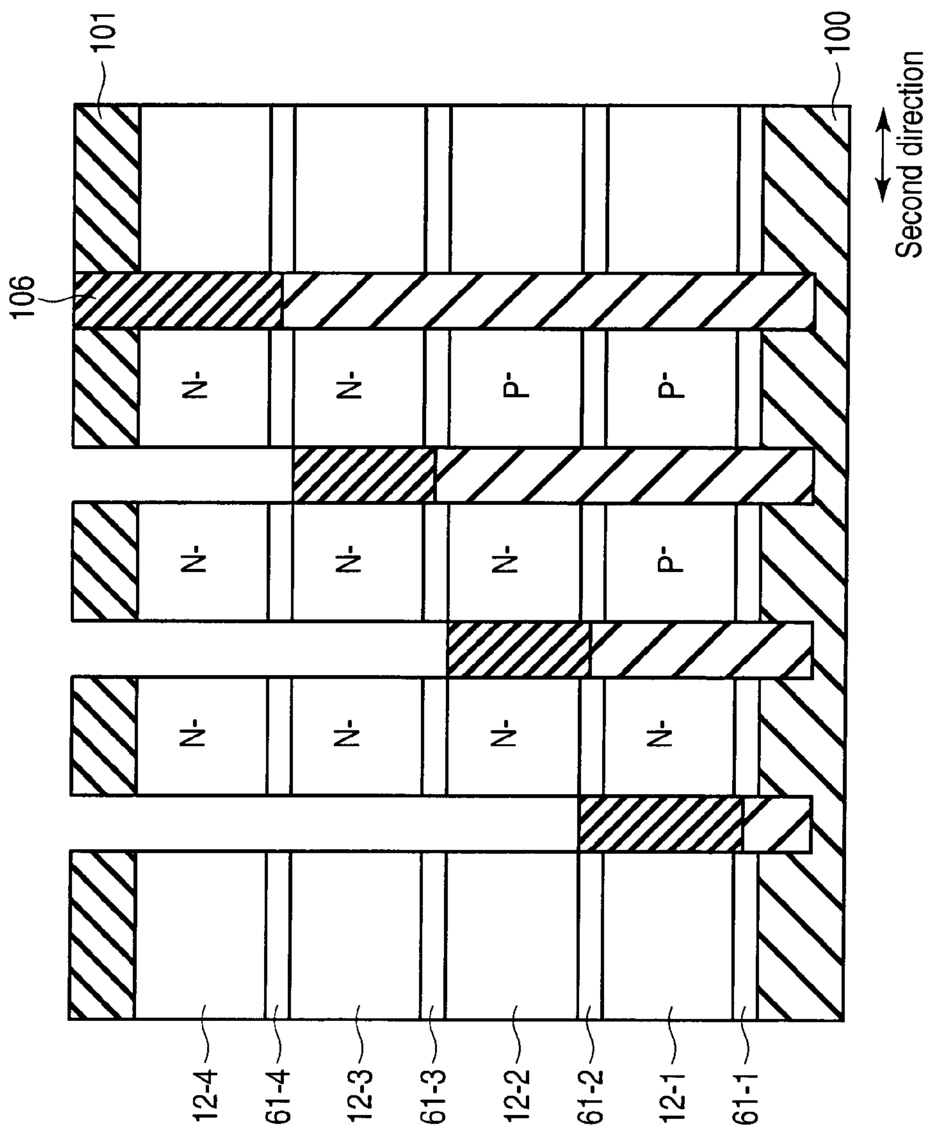
Figure 352:
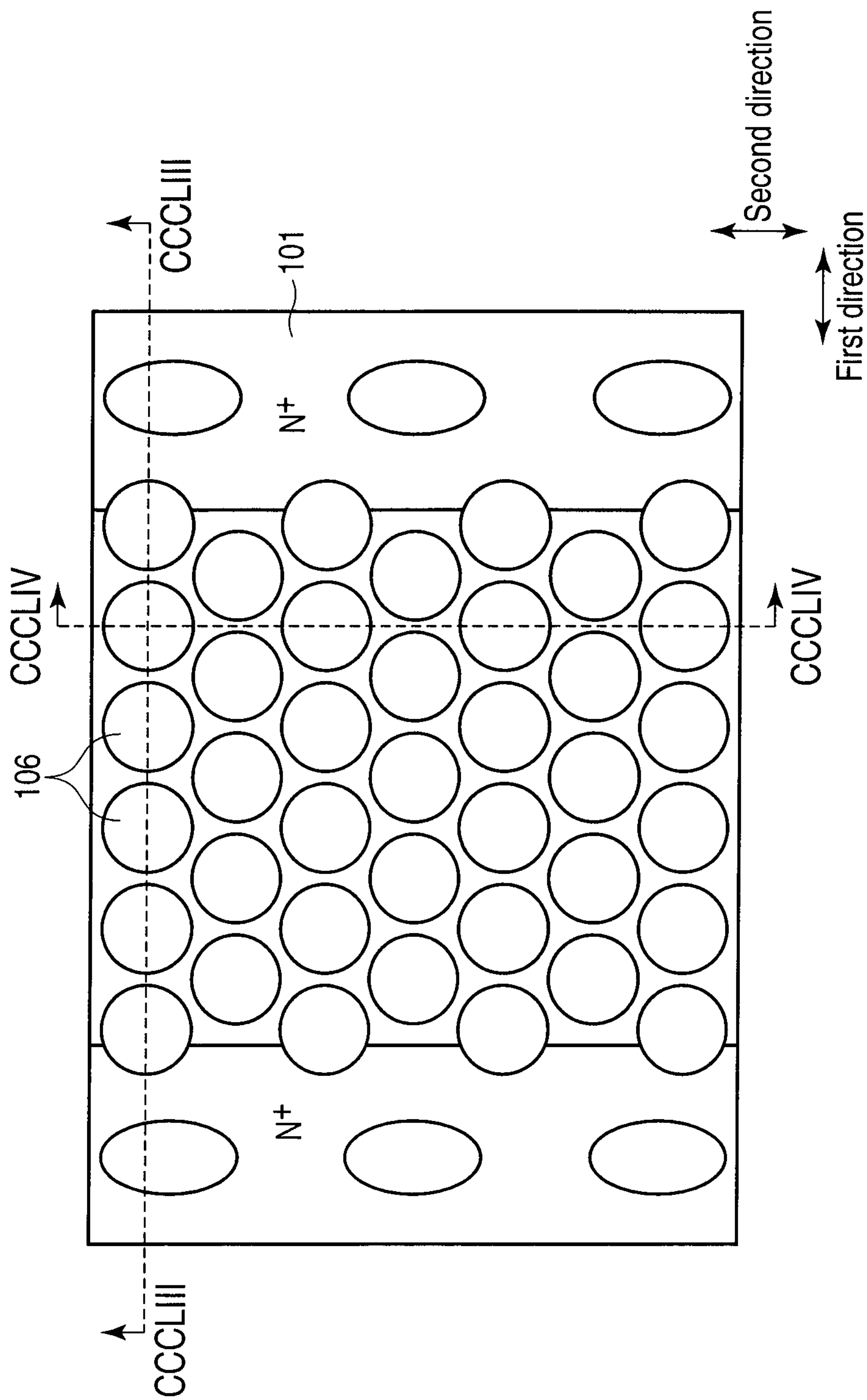
Figure 353:
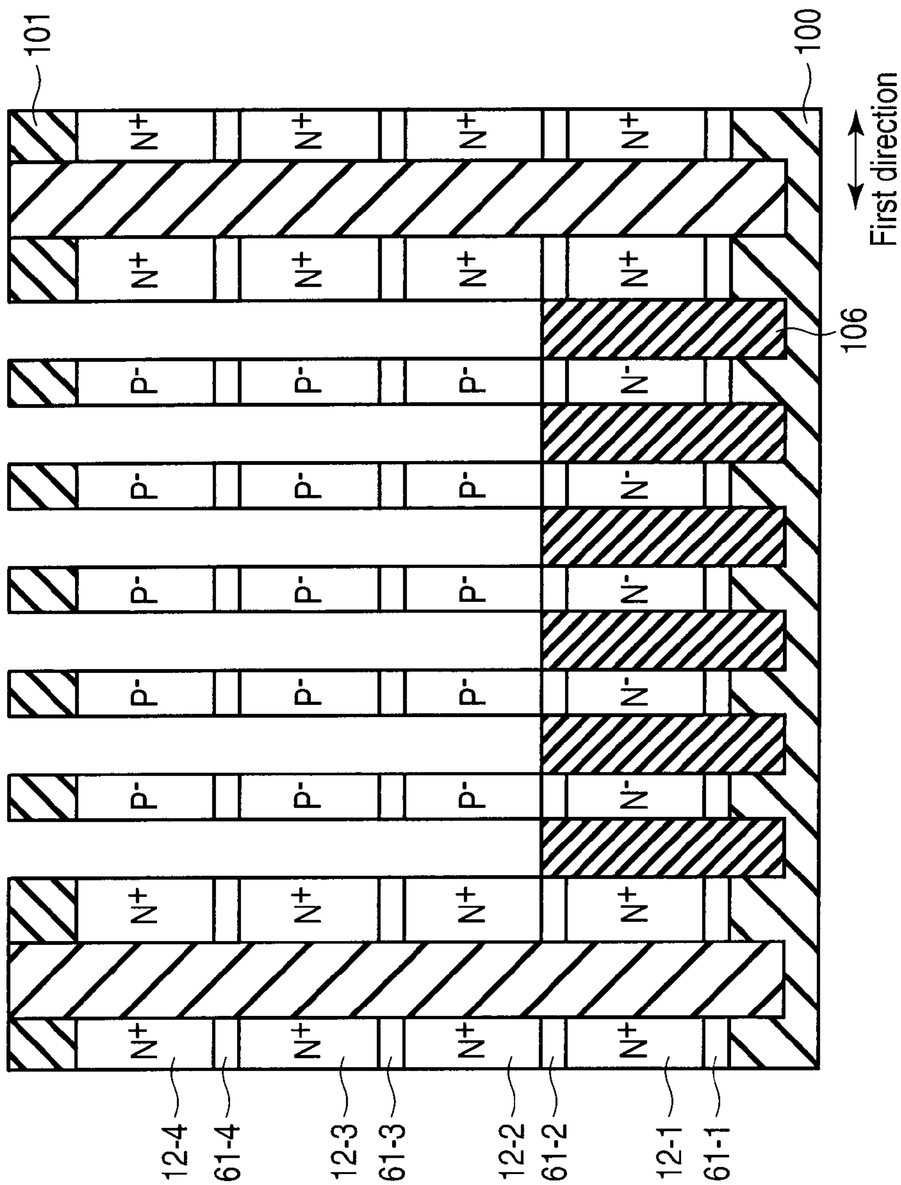
Figure 354:
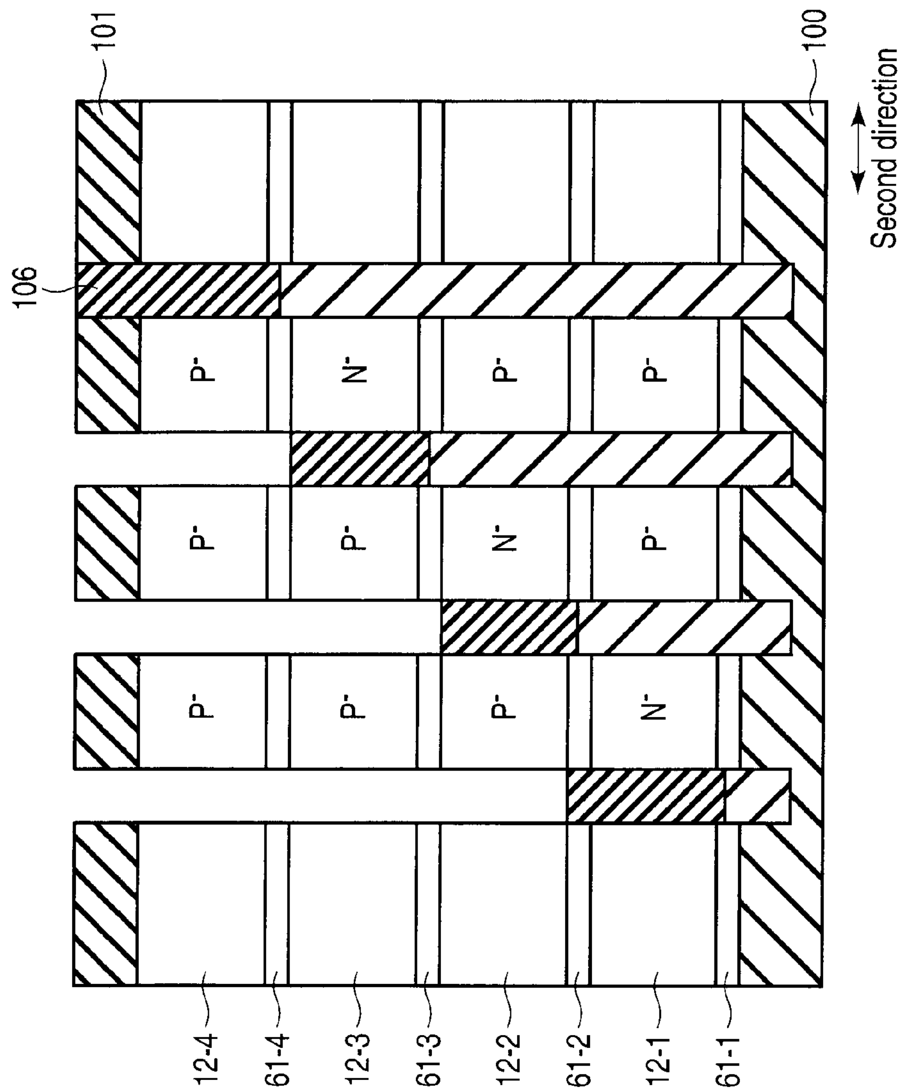
Figure 355:
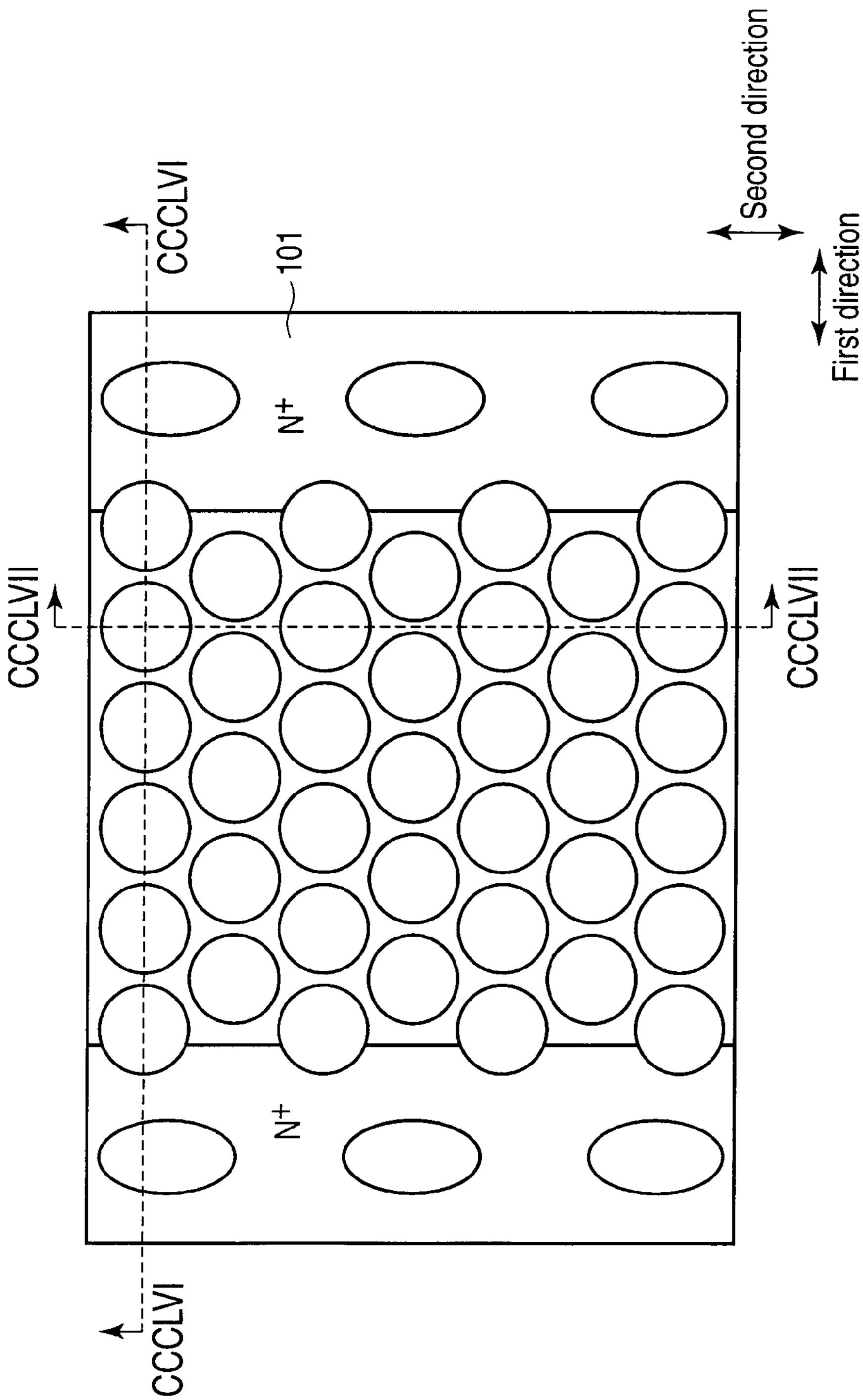
Figure 356:
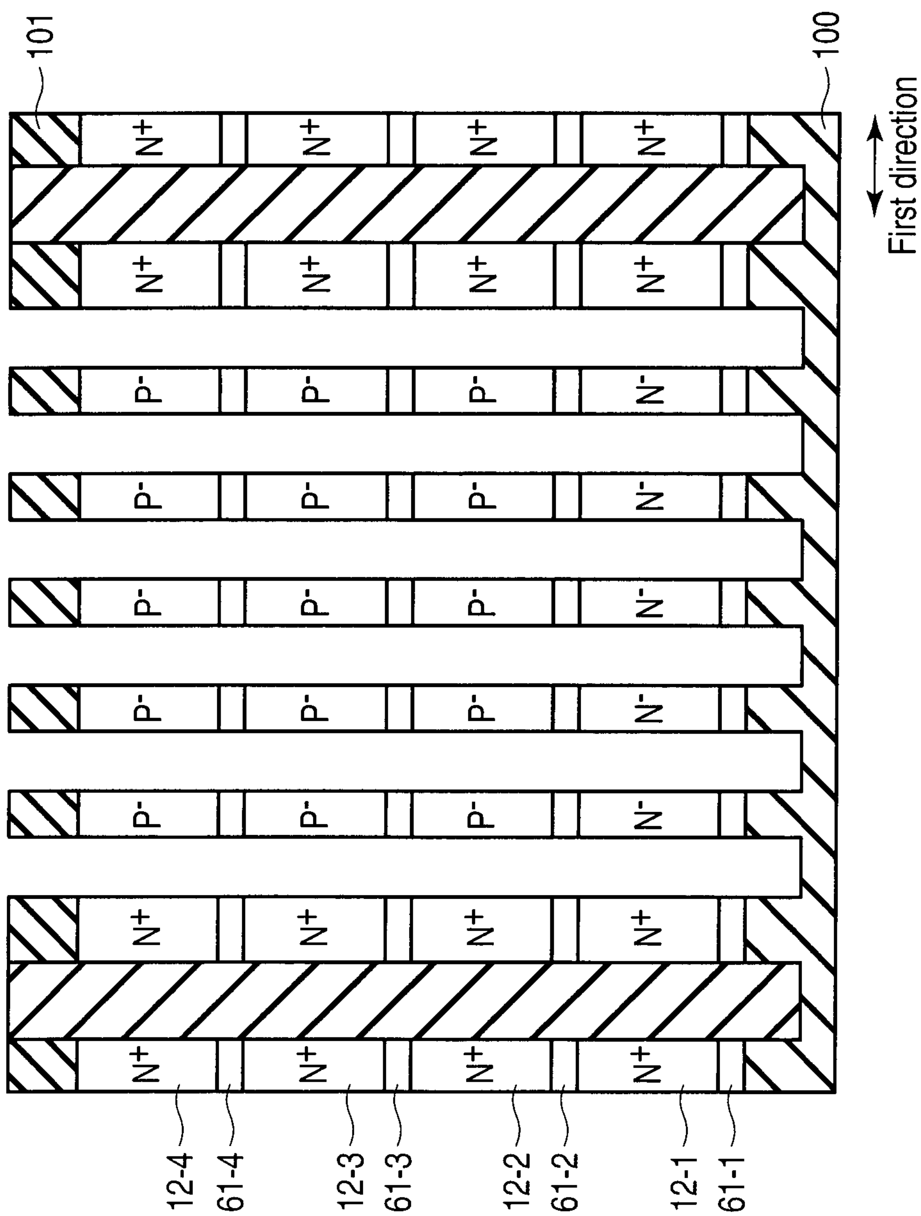
Figure 357:
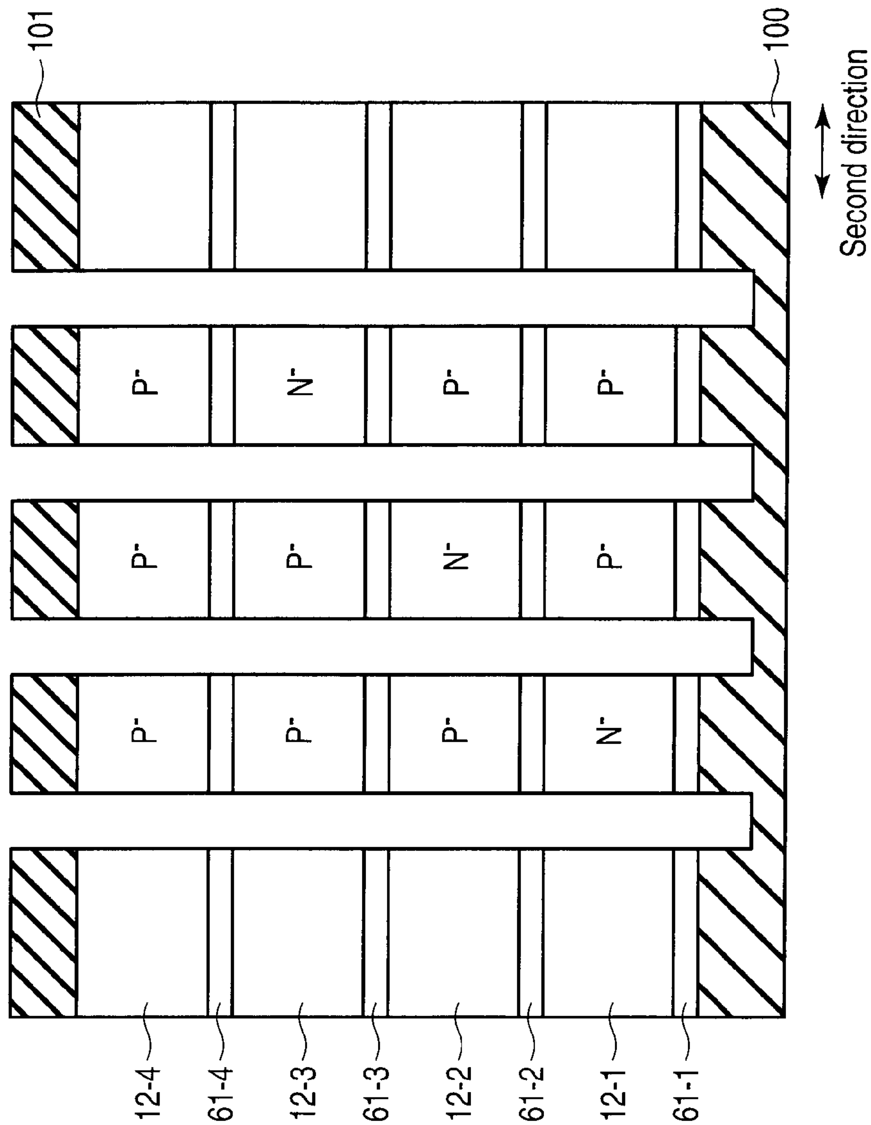
Figure 358:
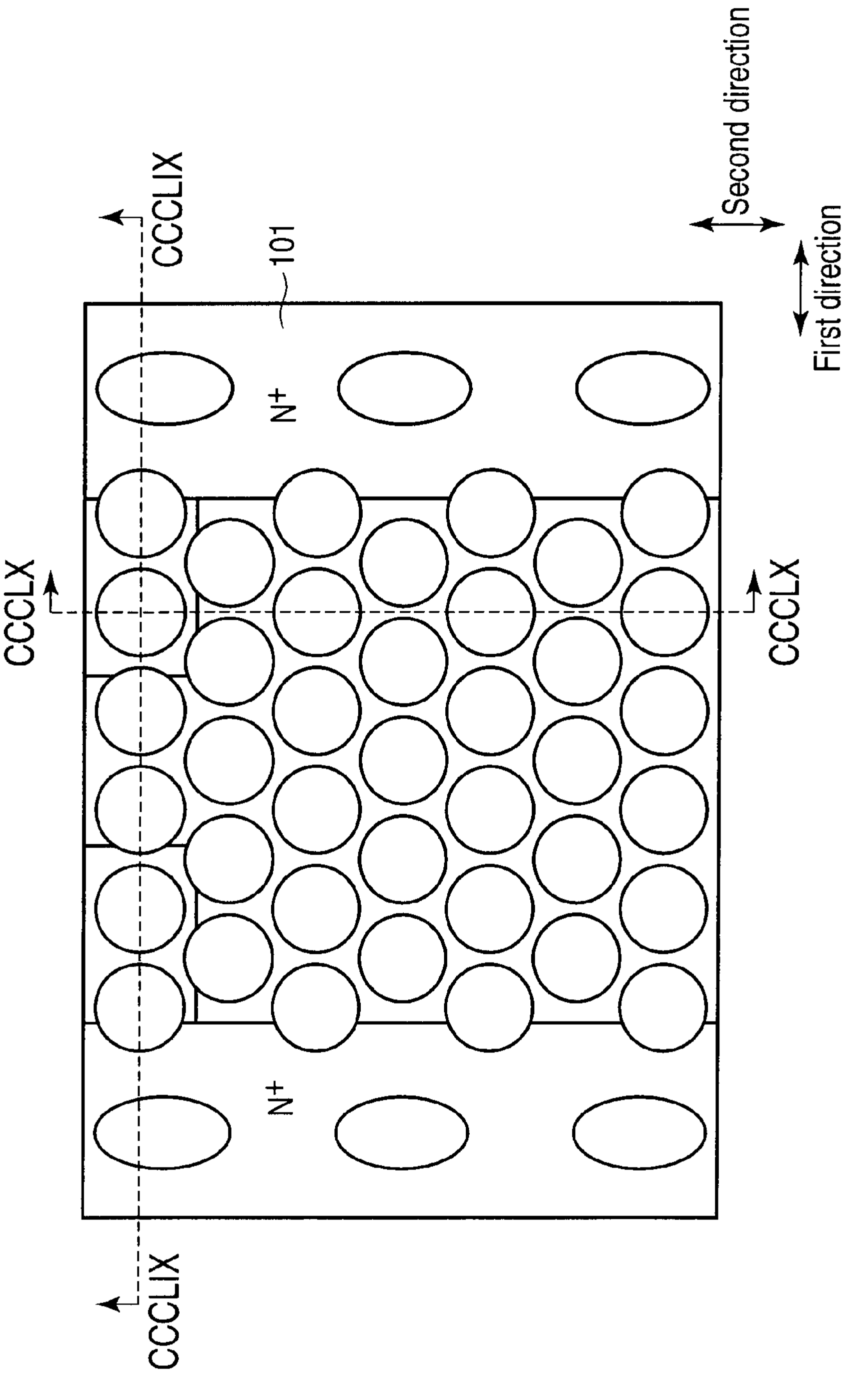
Figure 359:
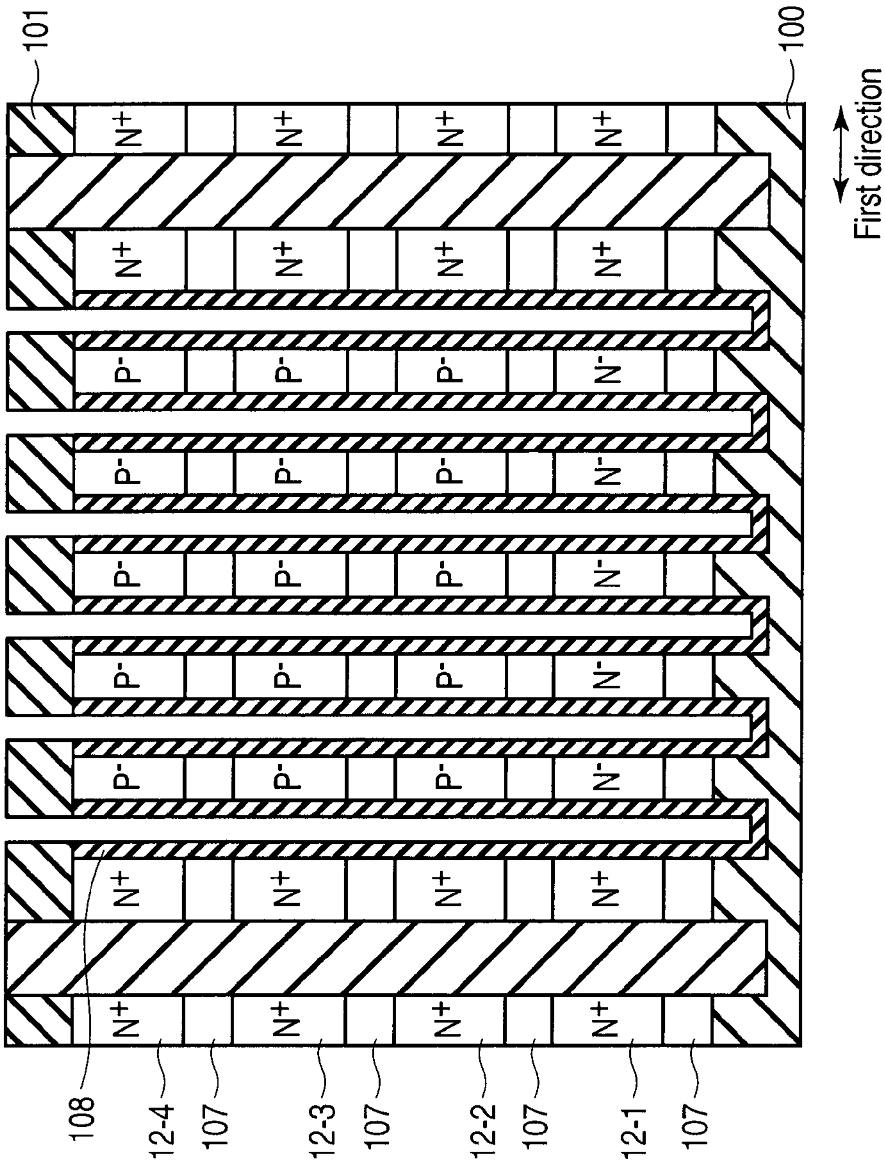
Figure 360:
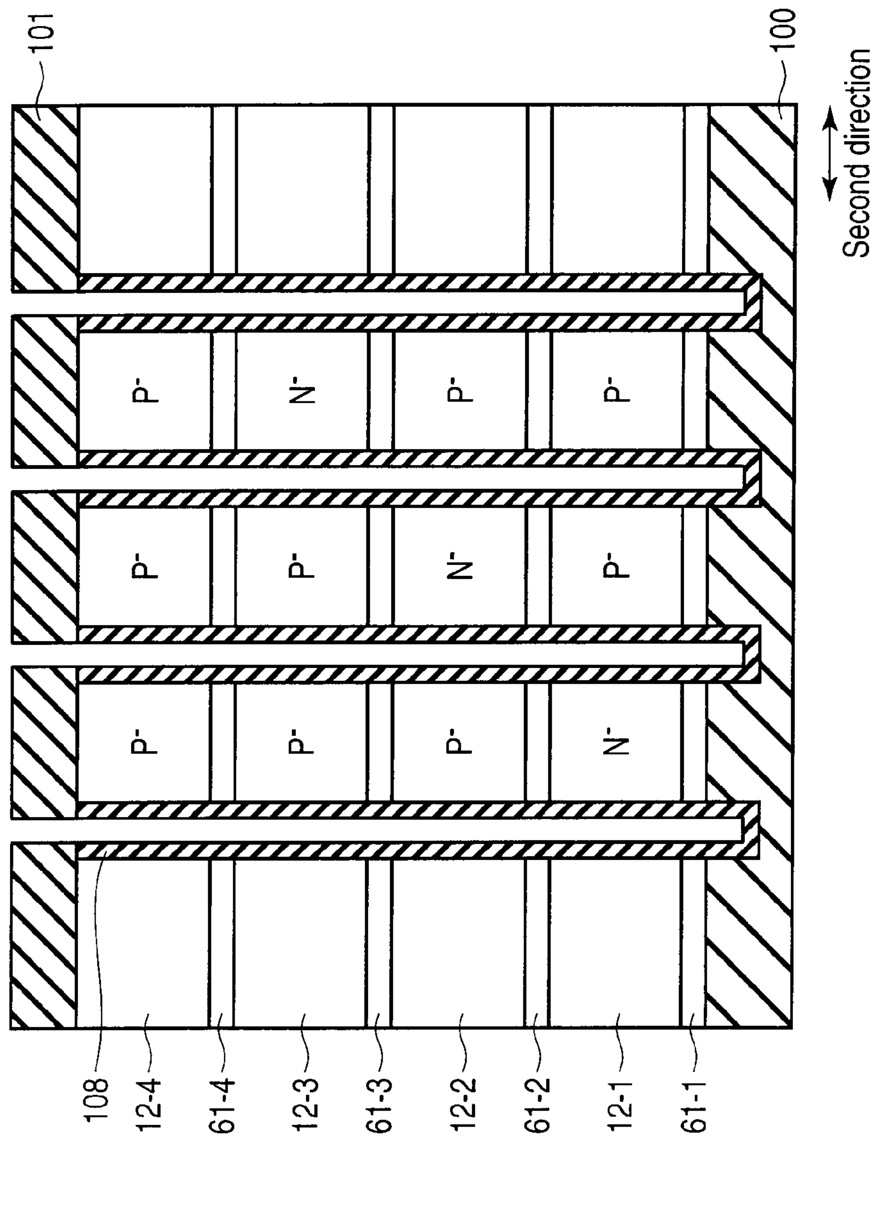
Figure 361:
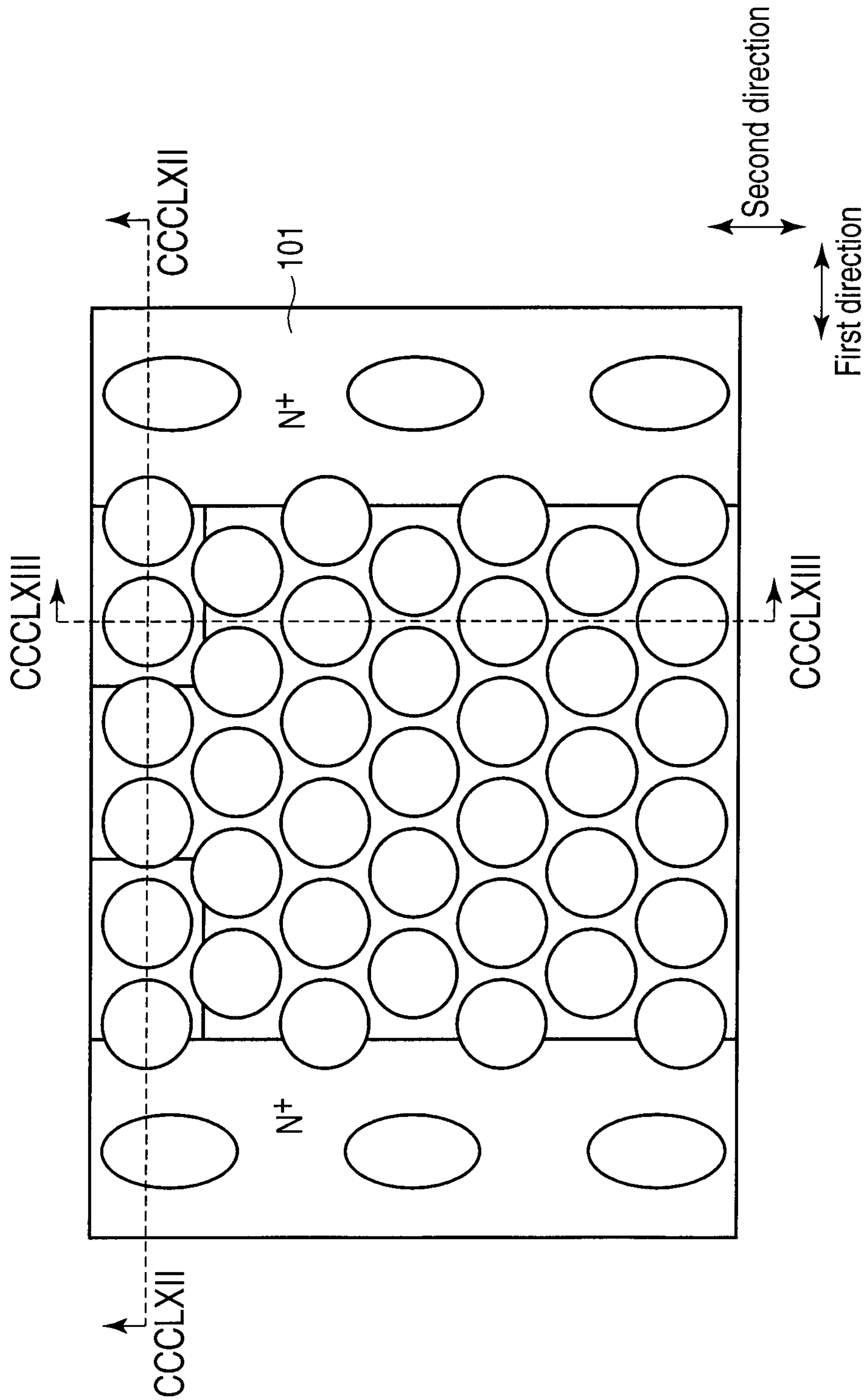
Figure 362:
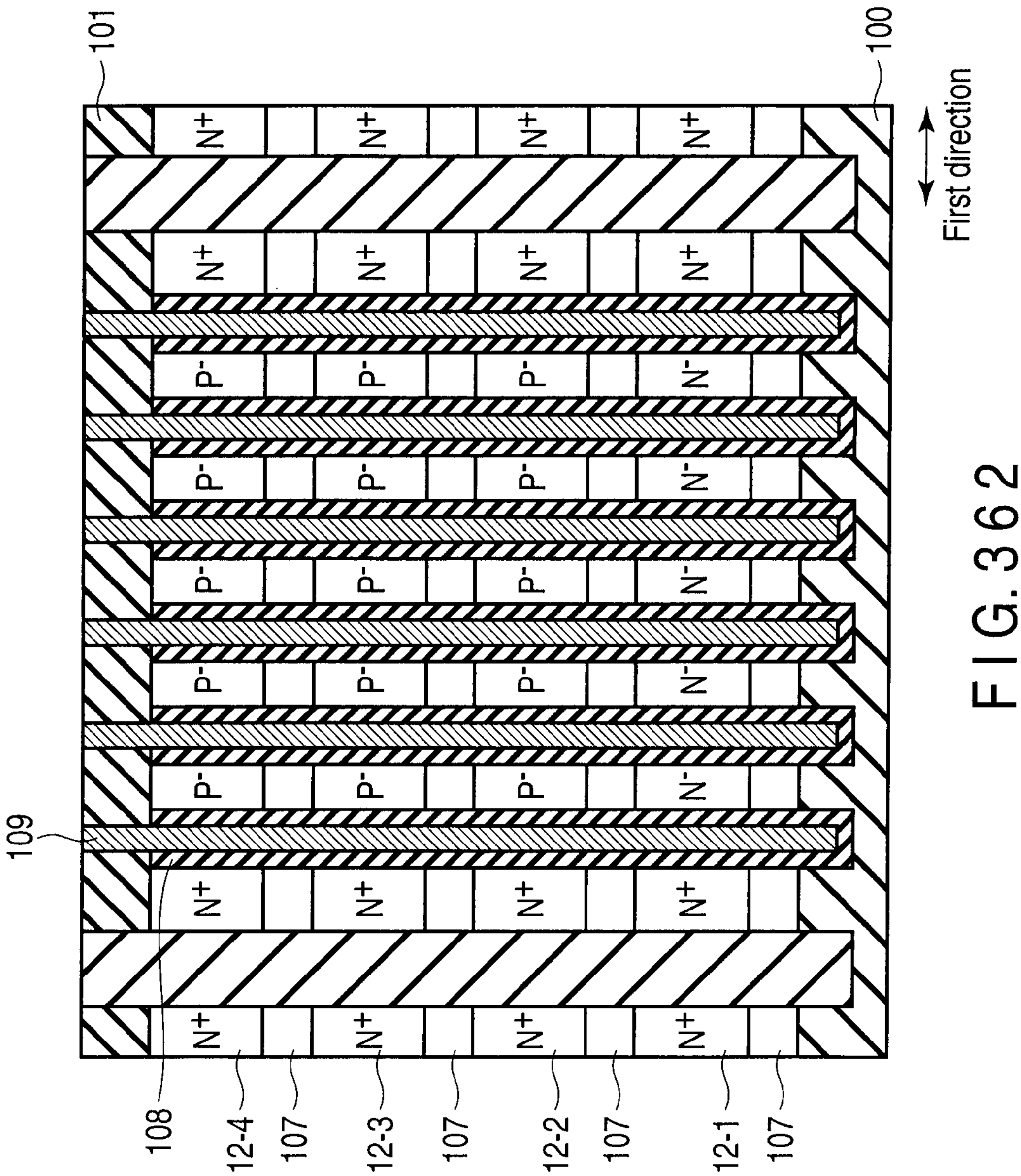
Figure 363:
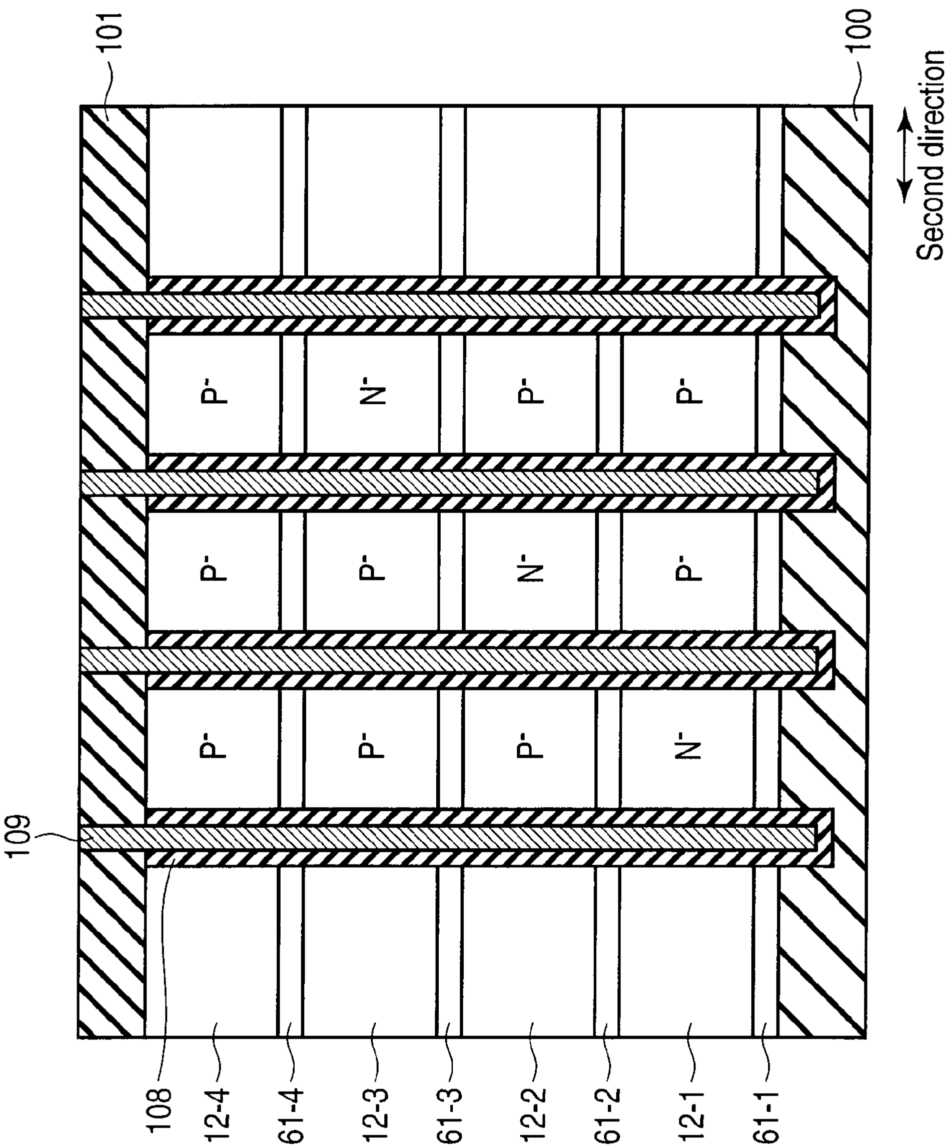
Figure 365:
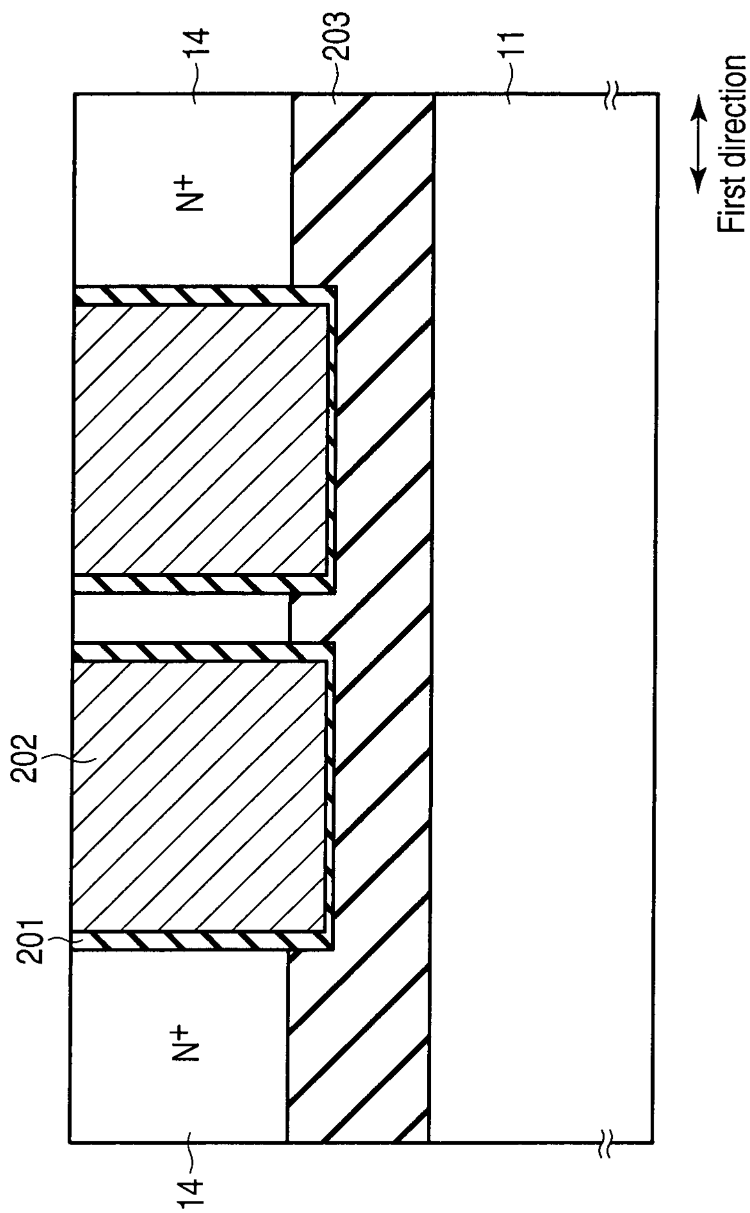
Figure 366:
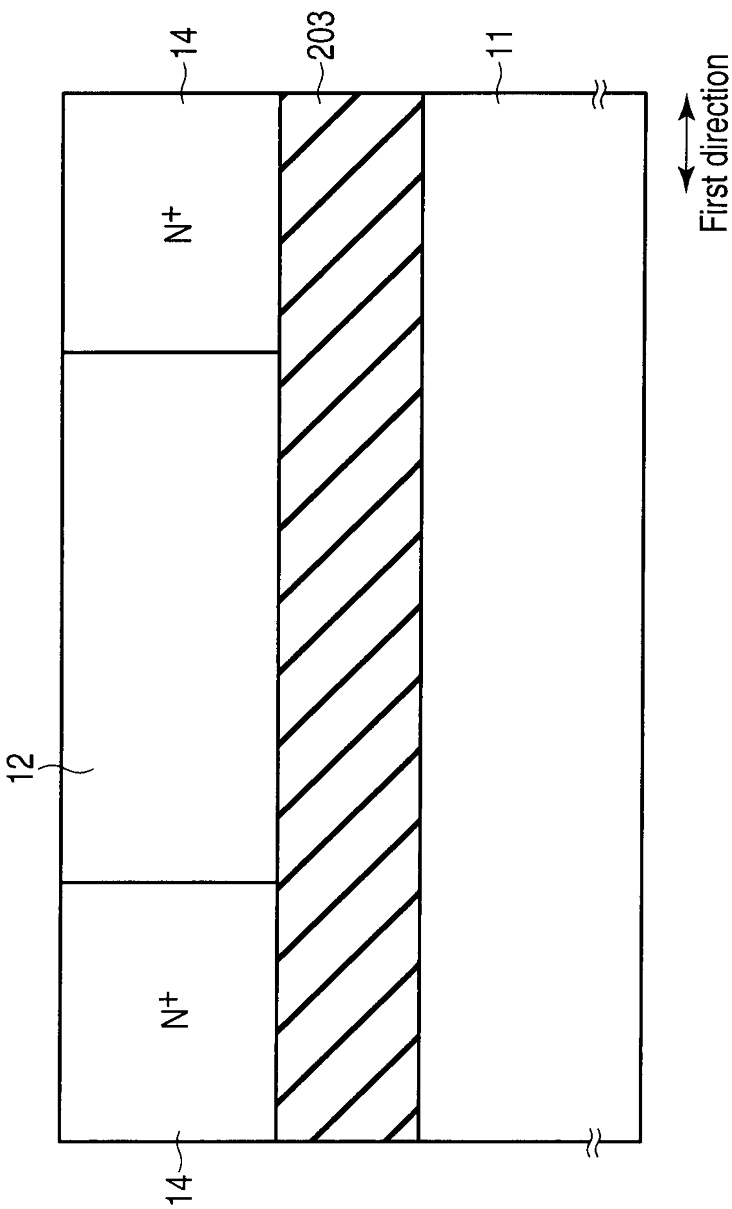
Figure 367:
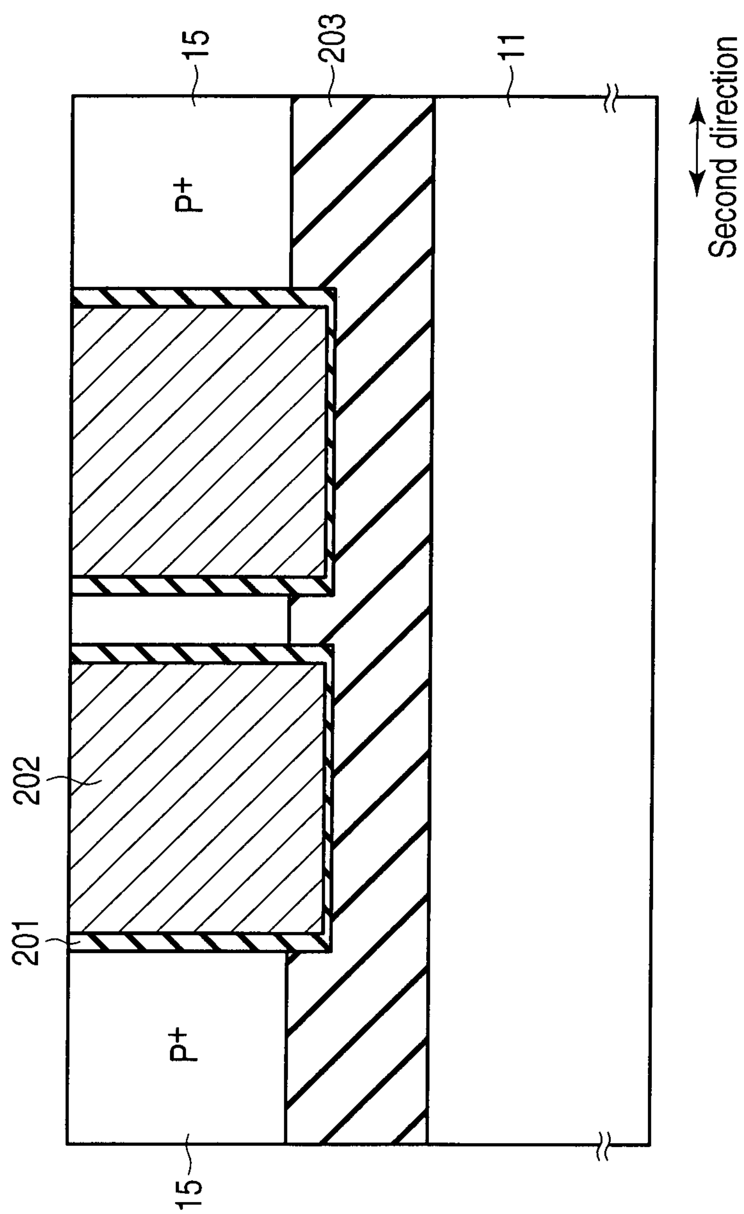
Figure 368:
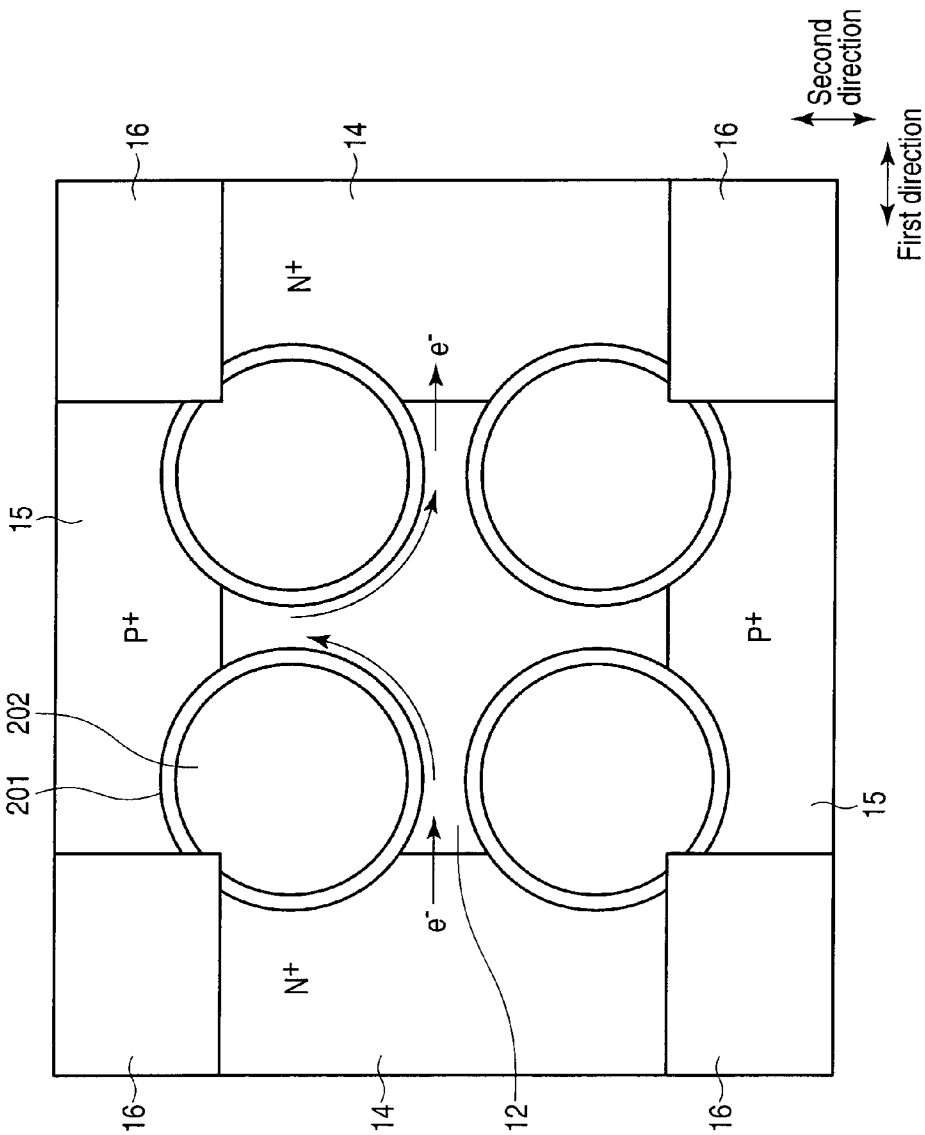
Figure 369:
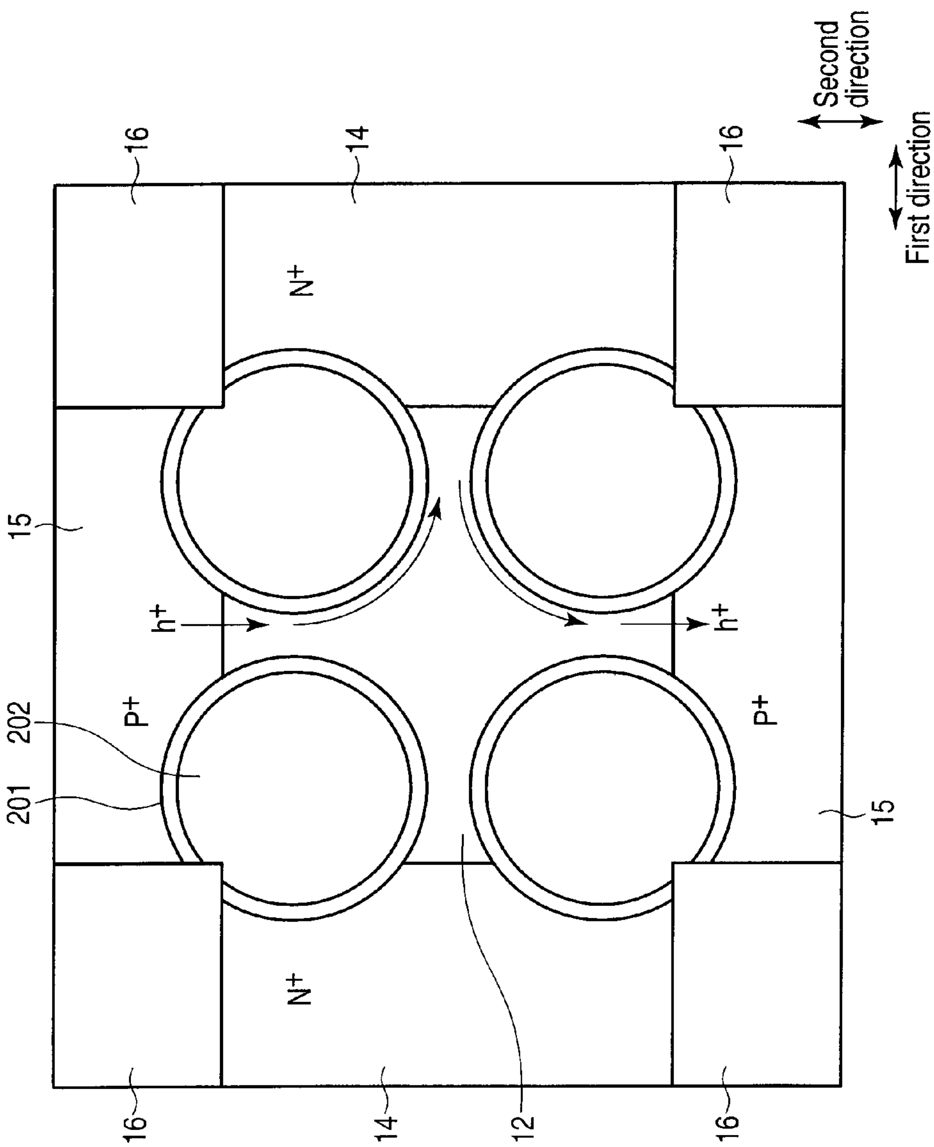
Figure 370:
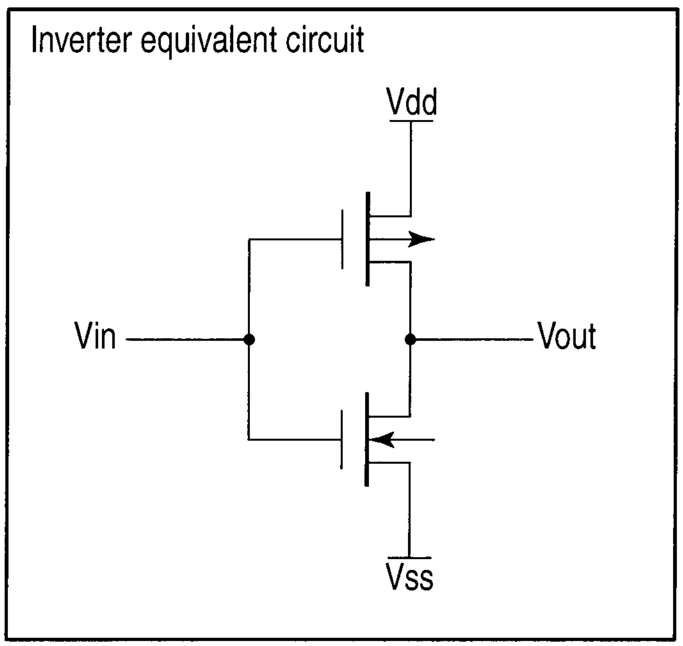
Figure 371:
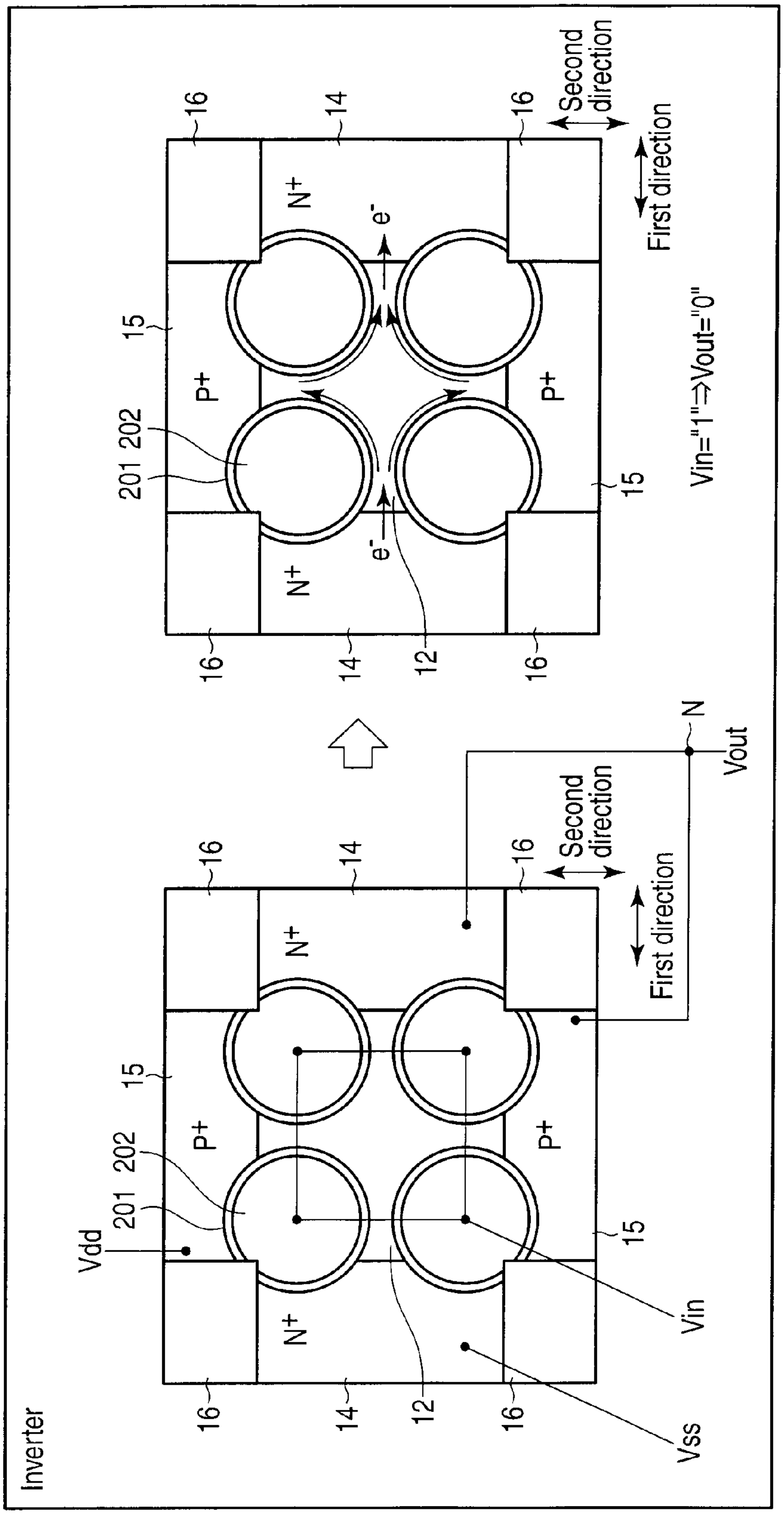
Figure 372:
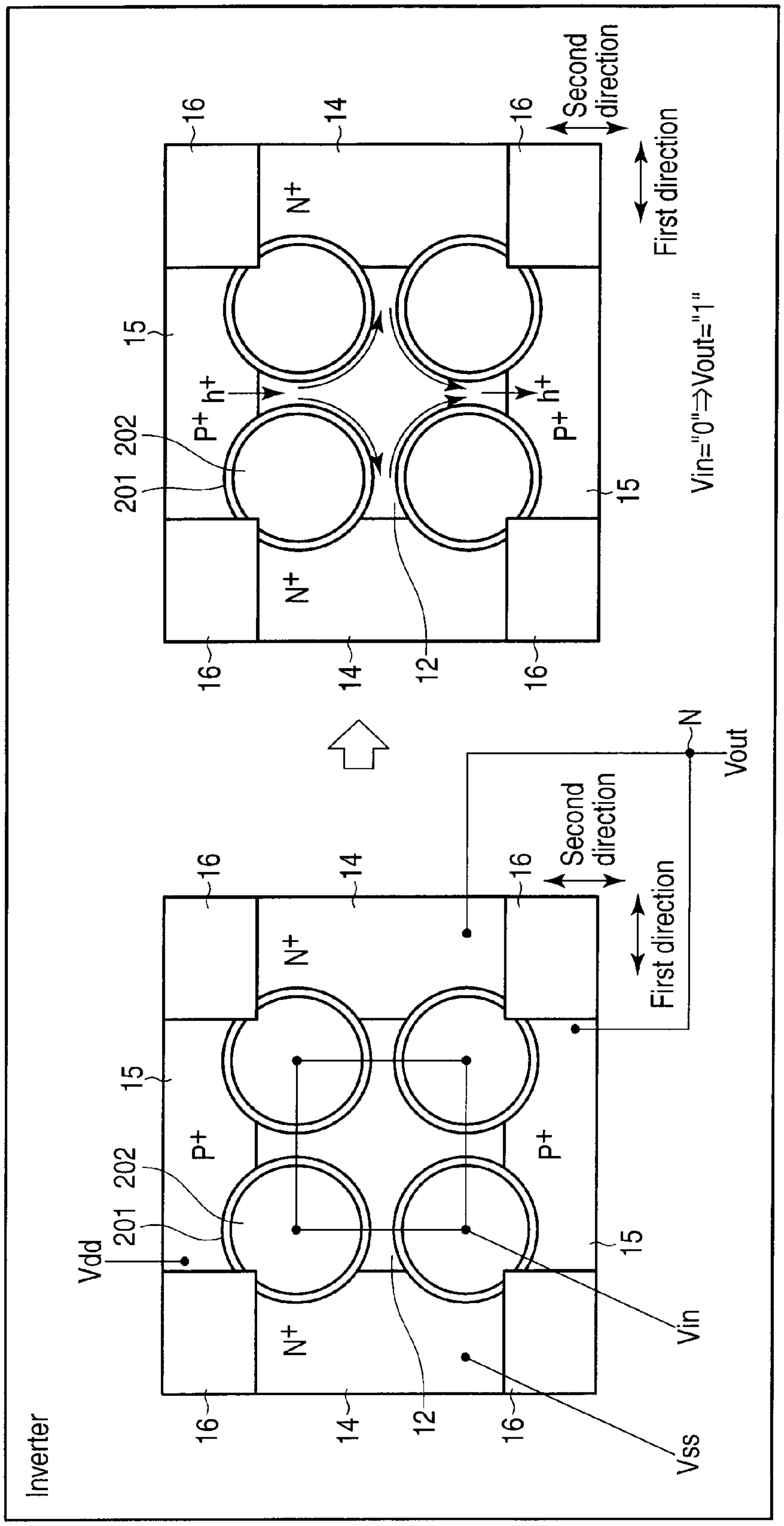
Figure 373:
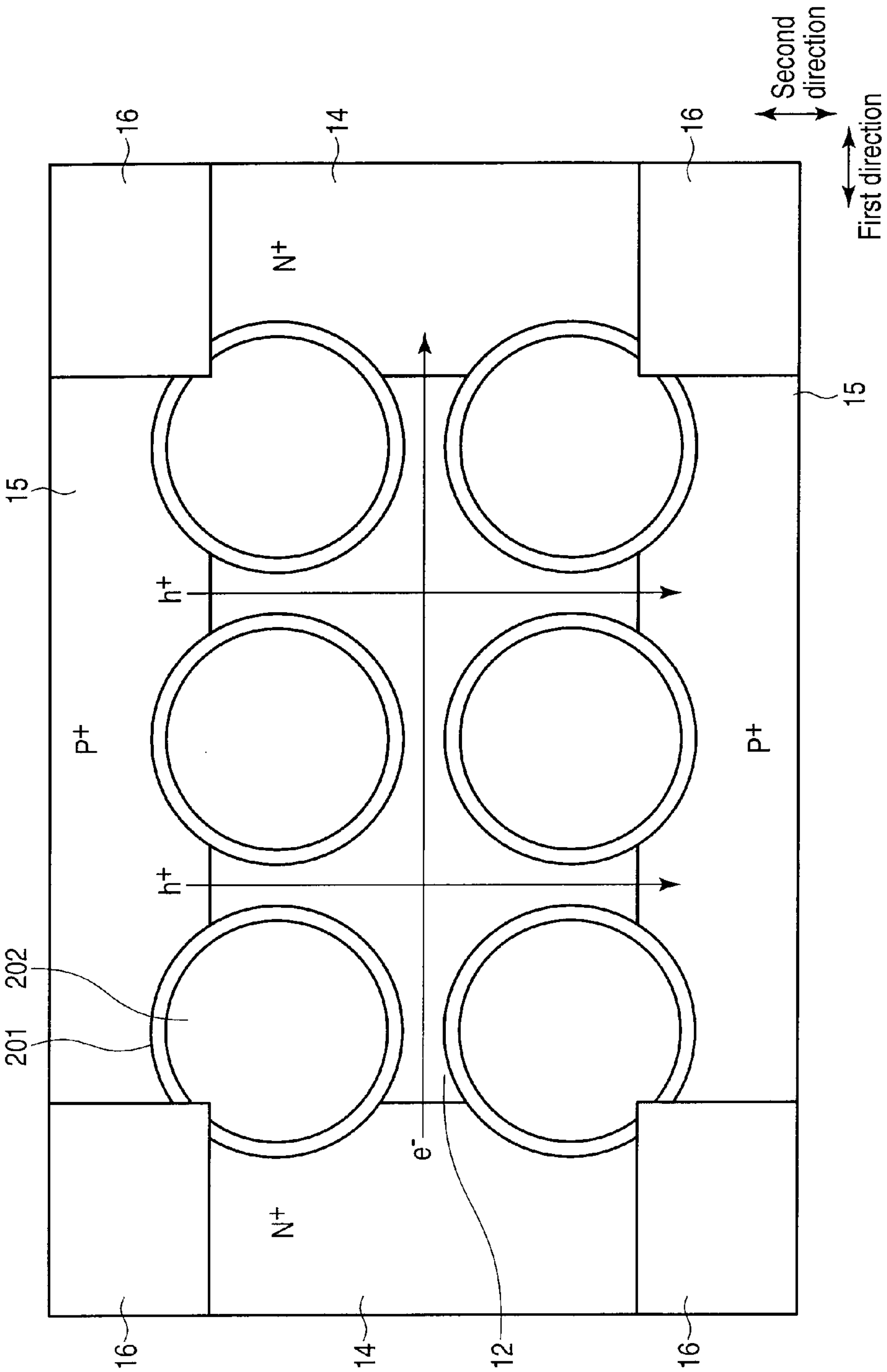
Figure 374:
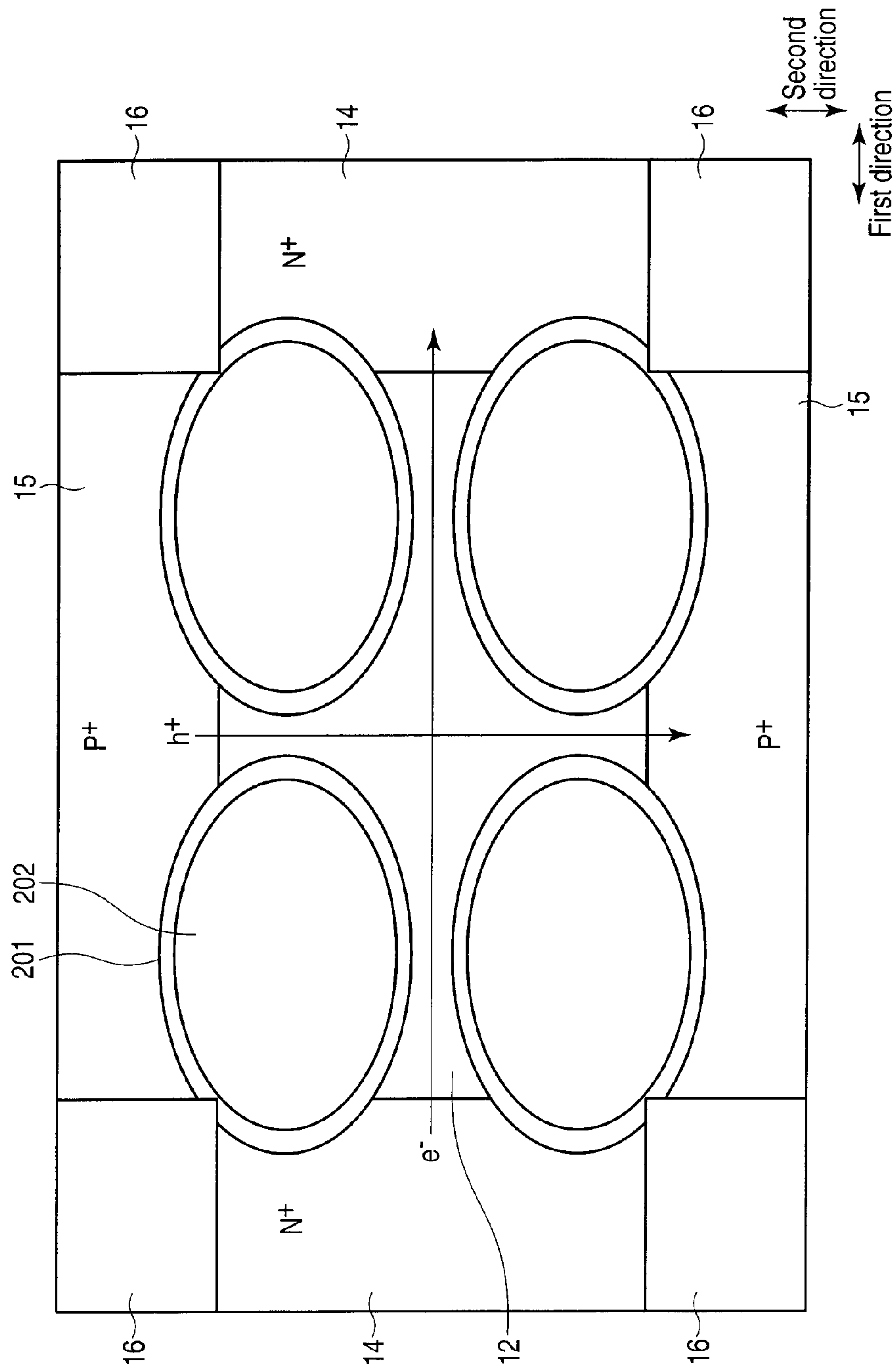
Figure 377:
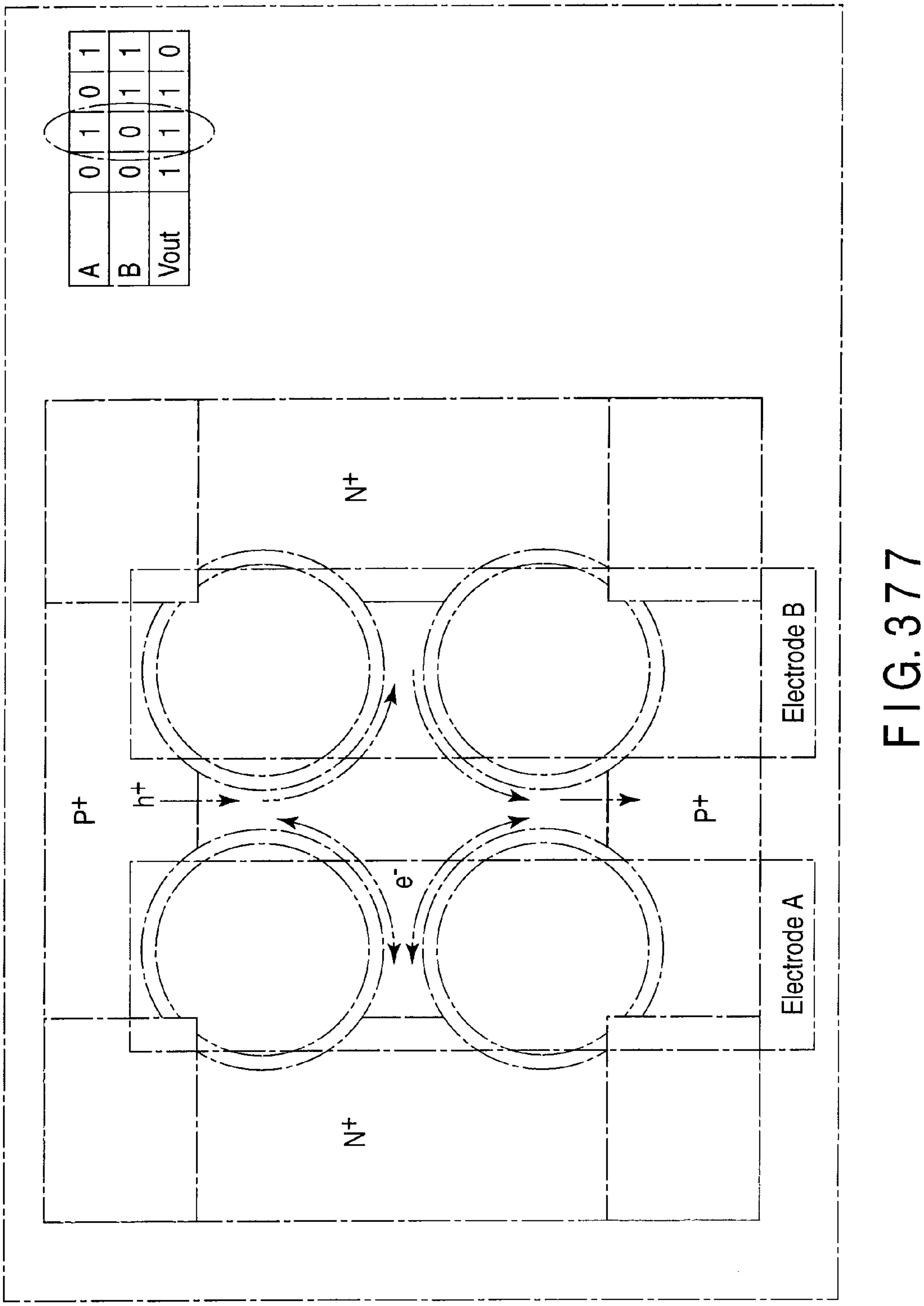
Figure 378:
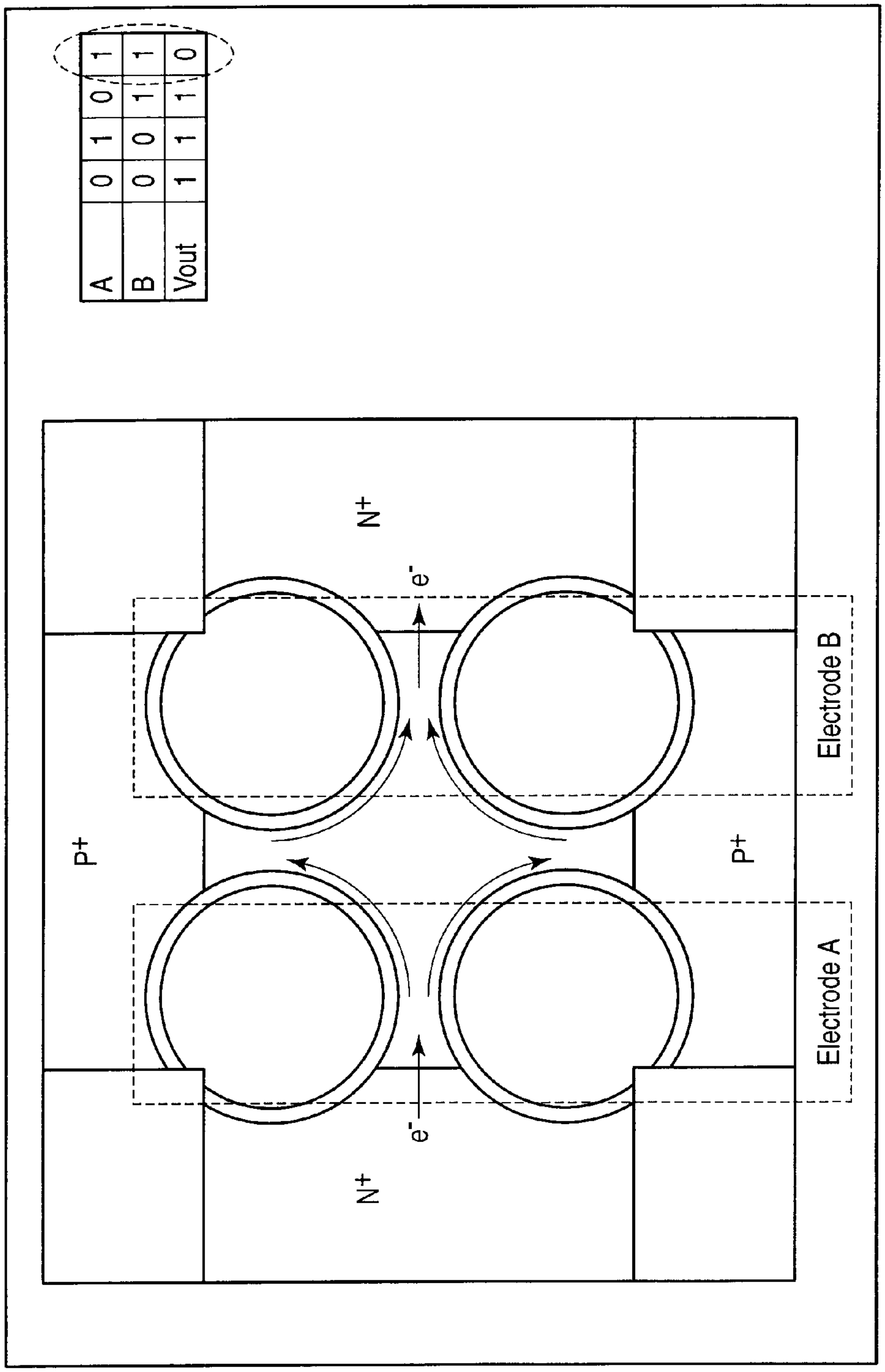
Figure 380:
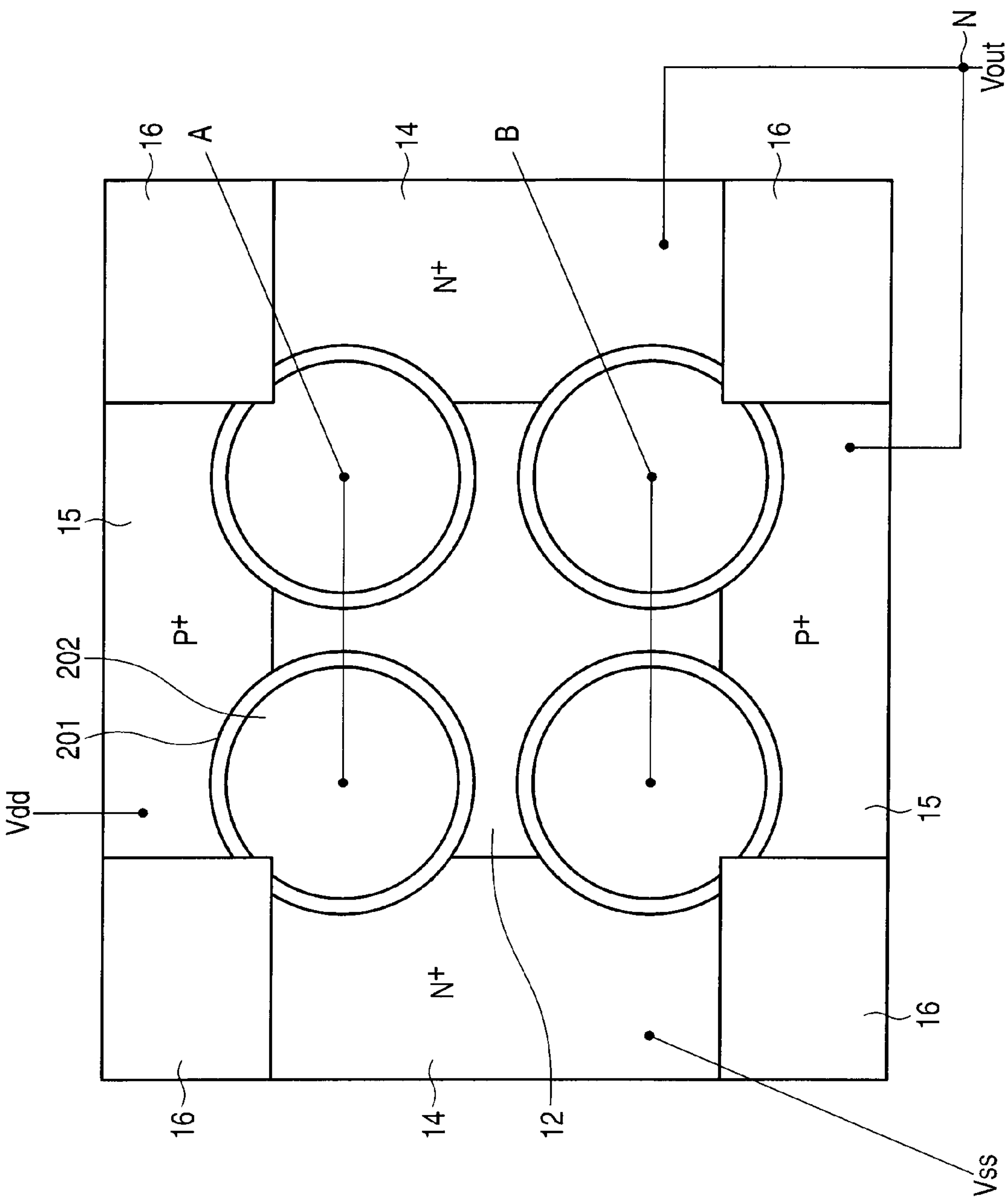
Figure 381:
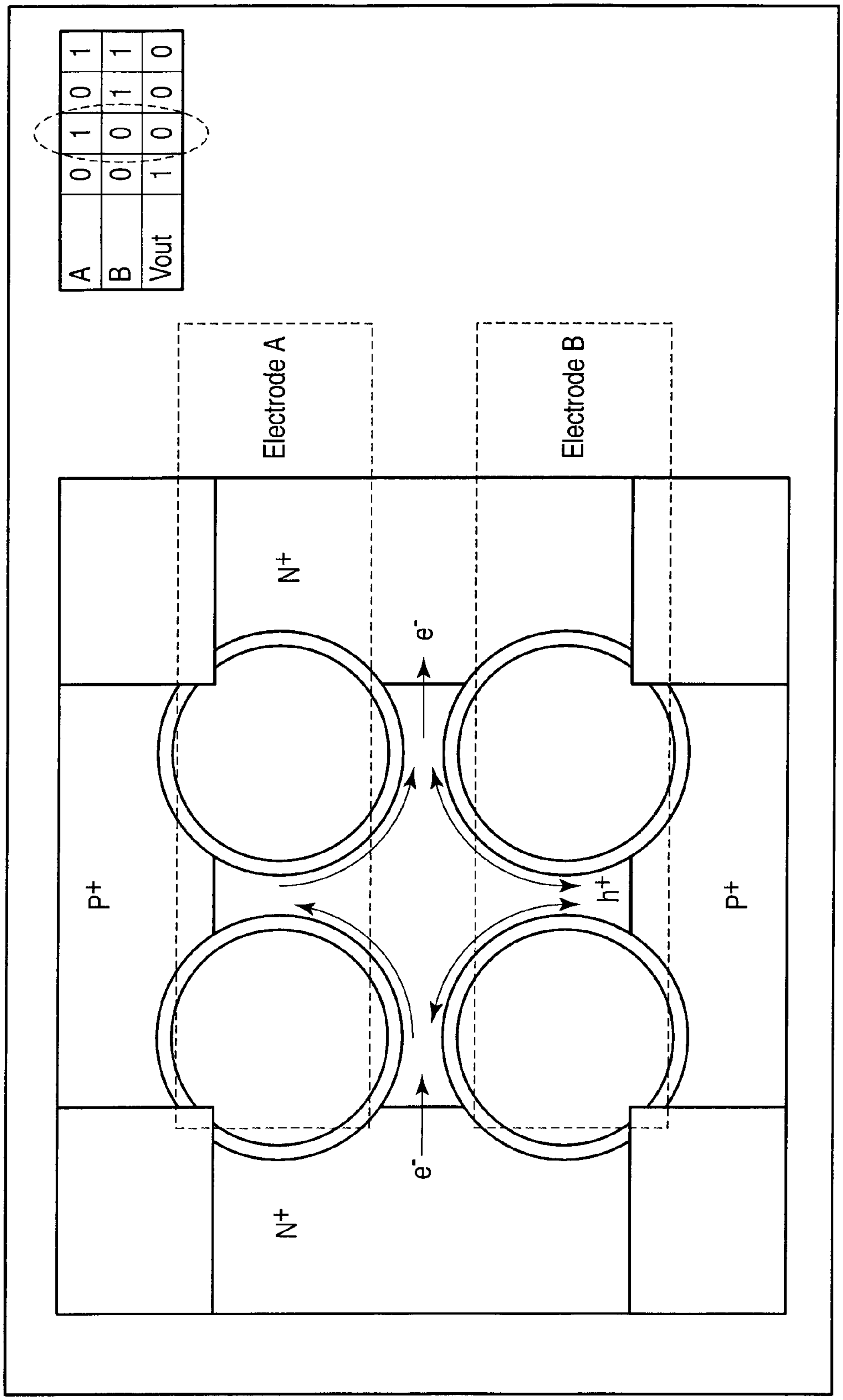
Figure 382:
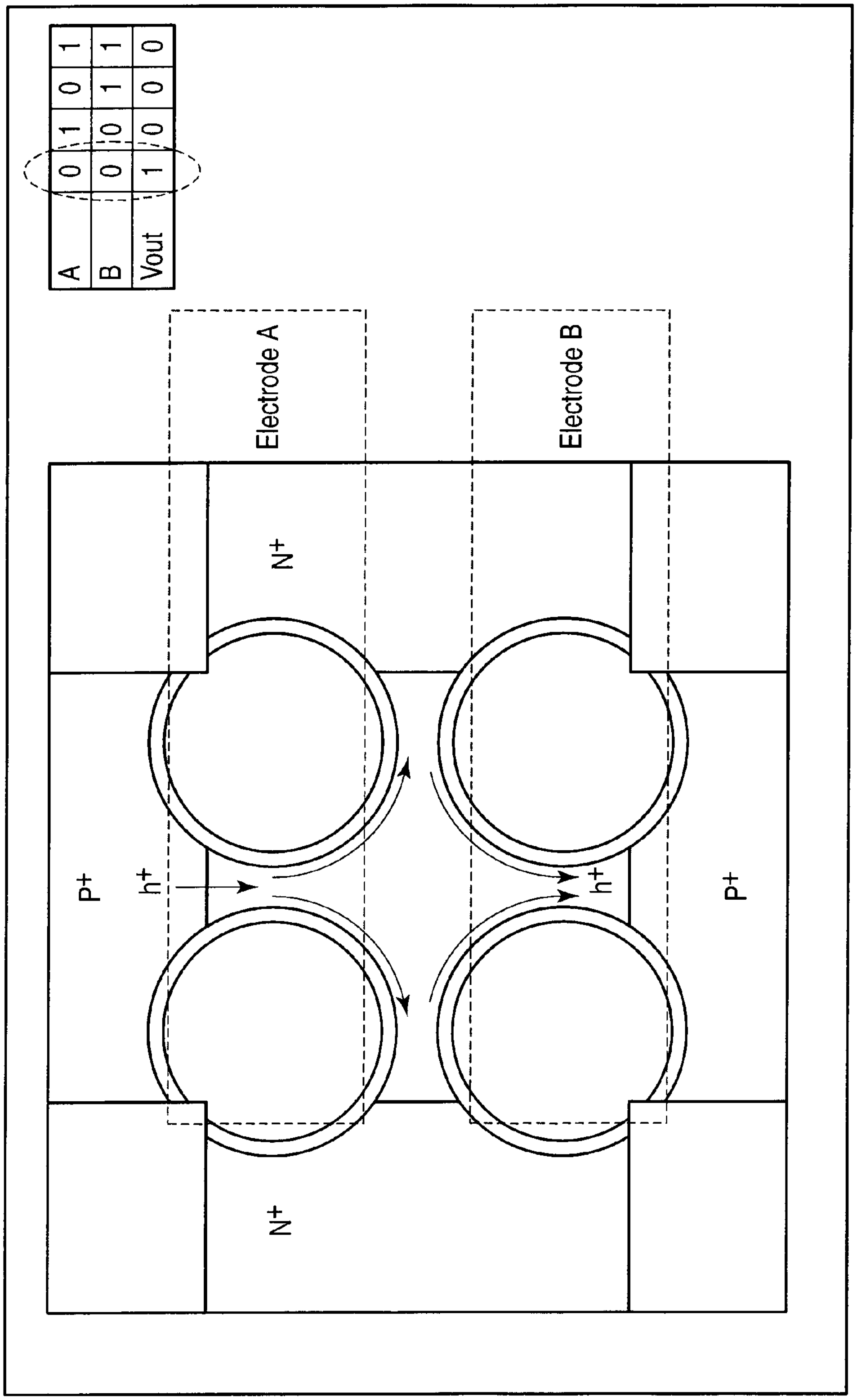
Figure 384:
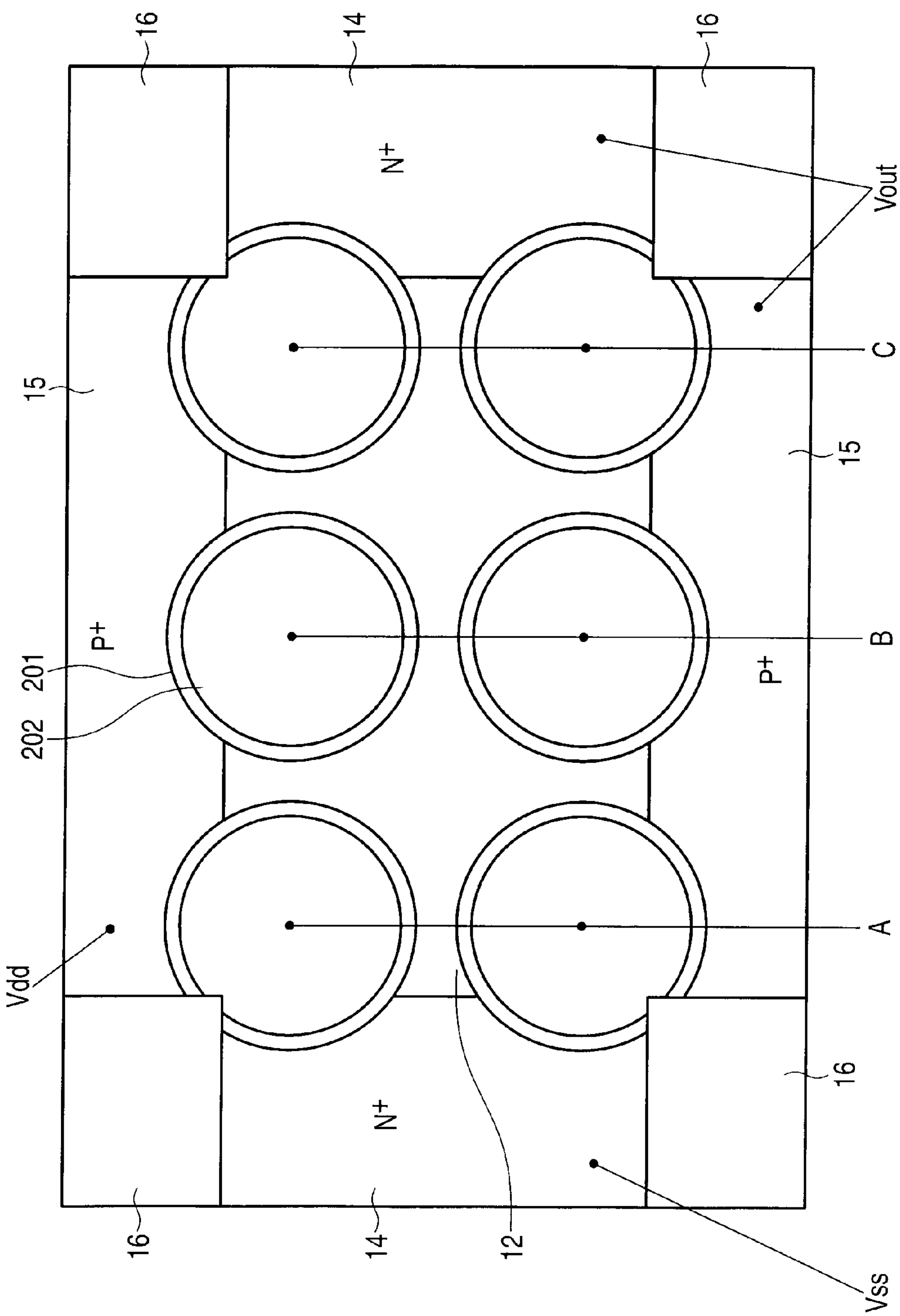
Figure 385:
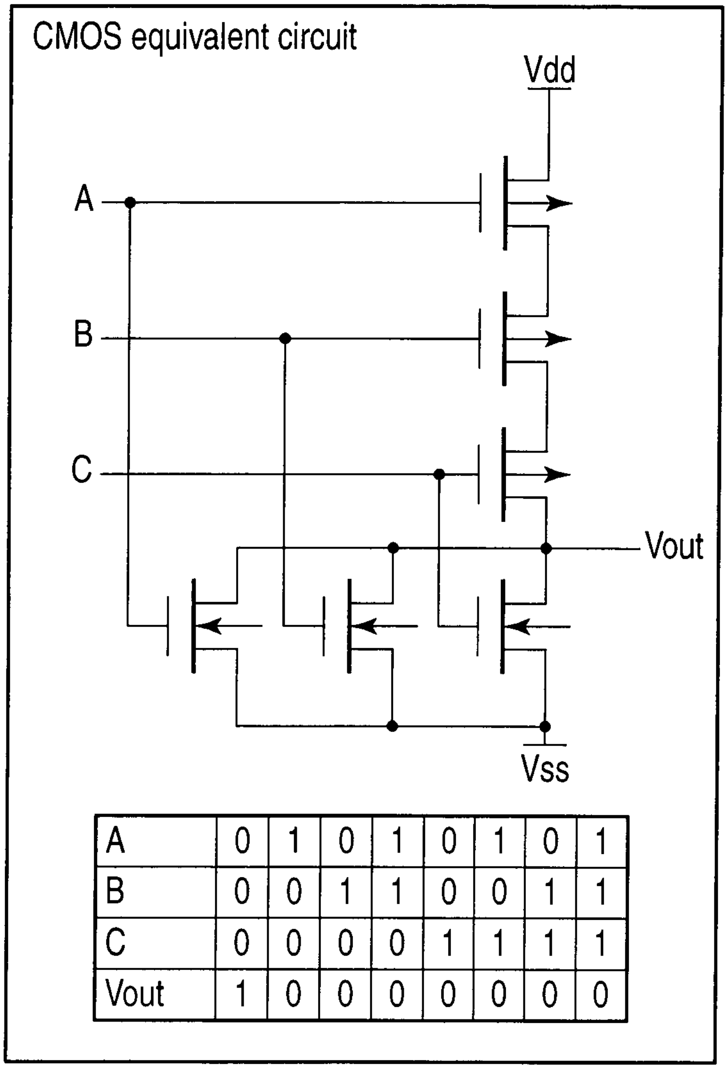
Figure 386:
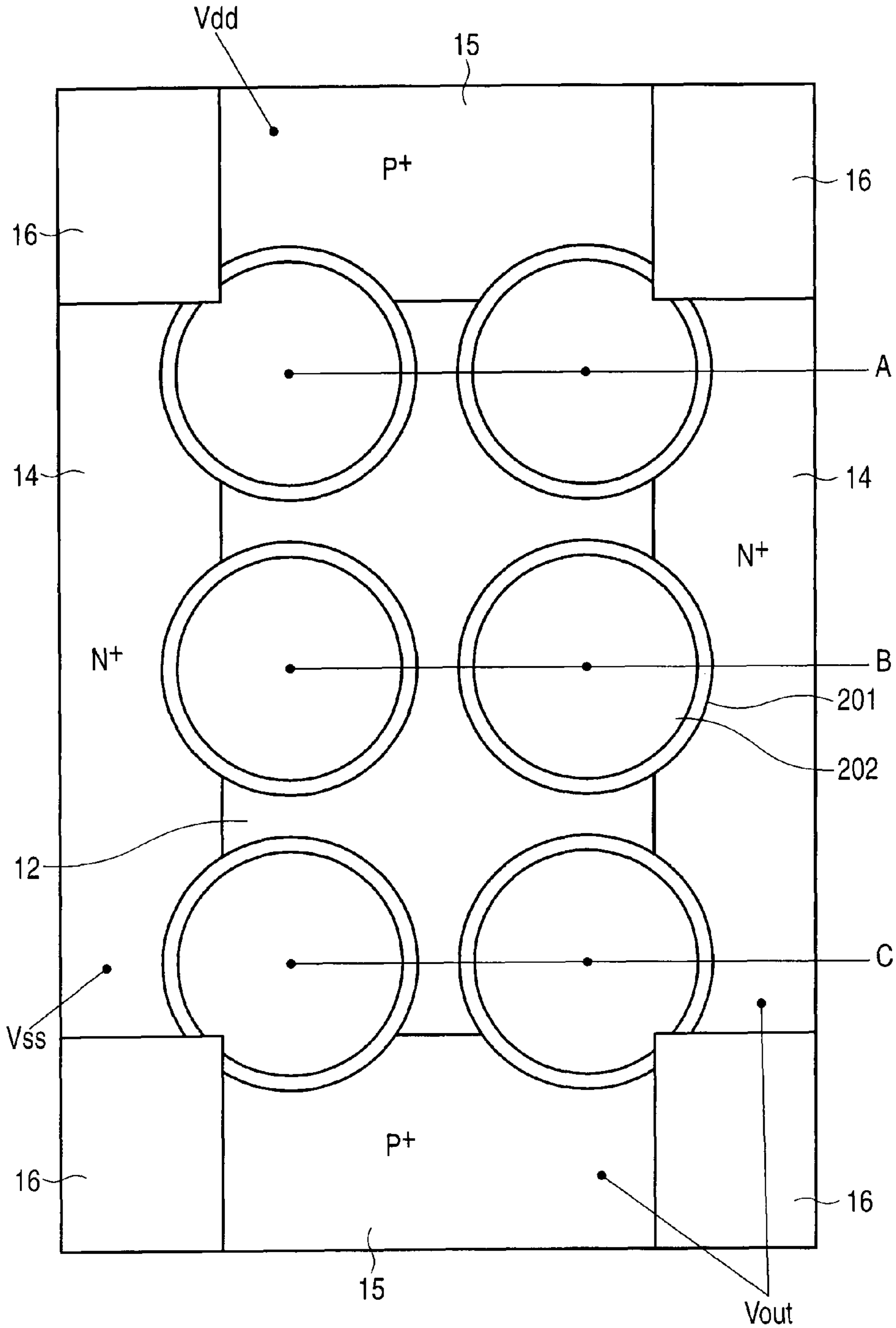
Figure 389:
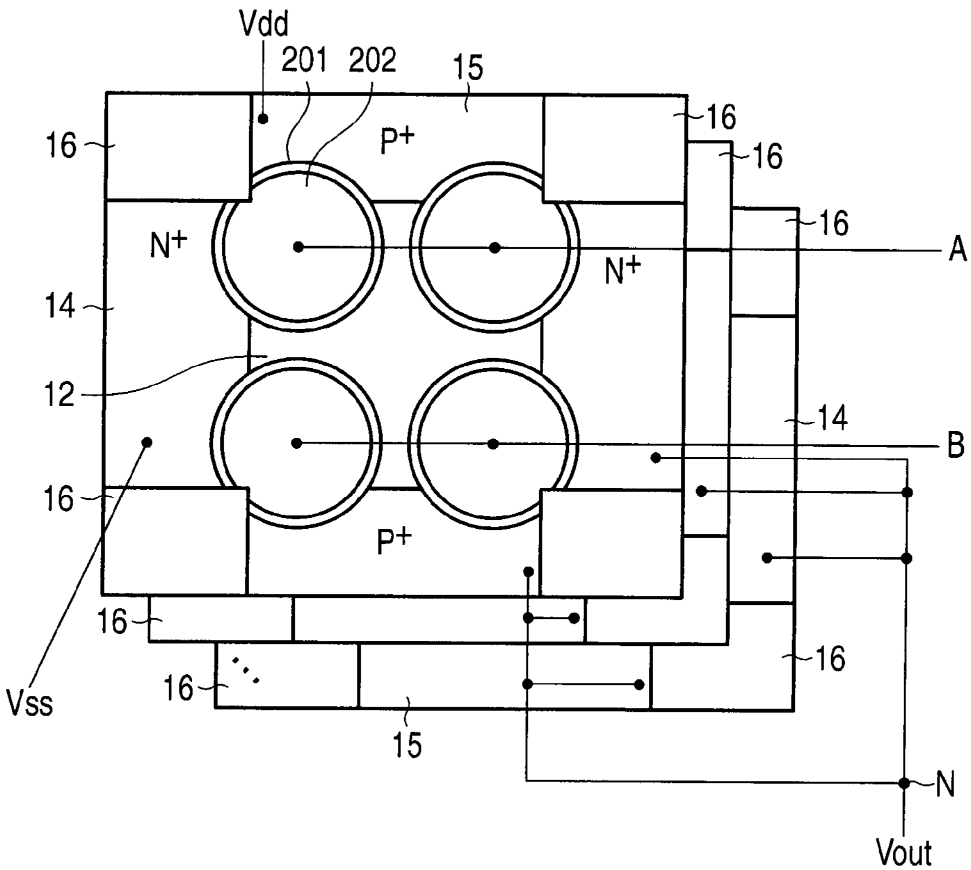
Figure 390:
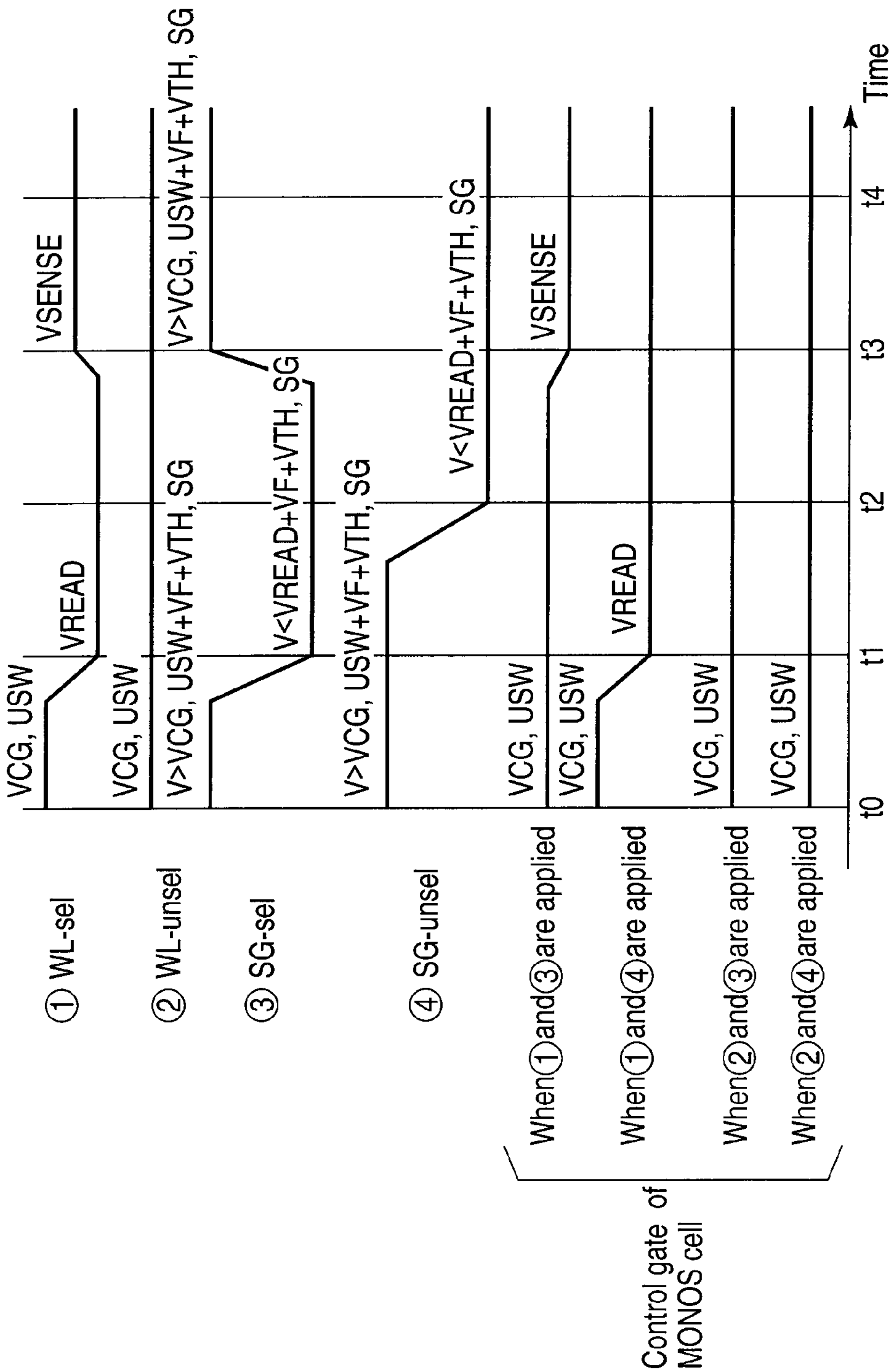

FIG. 309 is a view showing a select transistor array;

FIG. 310 is a view showing a first semiconductor layer;

FIG. 311 is a view showing a second semiconductor layer;

FIG. 312 is a view showing a third semiconductor layer;

FIG. 313 is a view showing a fourth semiconductor layer;

FIG. 314 is a view showing a state of inputting signals—(0110) case;

FIG. 315 is a view showing a relation between the number of semiconductor layers and an array size;

FIG. 316 is a plan view of a select transistor array;

FIG. 317 is a cross-sectional view of FIG. 316 taken along the line CCCXVII-CCCXVII;

FIG. 318 is a cross-sectional view of FIG. 316 taken along the line CCCXVIII-CCCXVIII;

FIG. 319 is a view showing a method of manufacturing the select transistor array;

FIG. 320 is a cross-sectional view of FIG. 319 taken along the line CCCXX-CCCXX;

FIG. 321 is a cross-sectional view of FIG. 319 taken along the line CCCXXI-CCCXXI;

FIG. 322 is a view showing the method of manufacturing the select transistor array;

FIG. 323 is a cross-sectional view of FIG. 322 taken along the line CCCXXIII-CCCXXIII;

FIG. 324 is a cross-sectional view of FIG. 322 taken along the line CCCXXIV-CCCXXIV;

FIG. 325 is a view showing the method of manufacturing the select transistor array;

FIG. 326 is a cross-sectional view of FIG. 325 taken along the line CCCXXVI-CCCXXVI;

FIG. 327 is a cross-sectional view of FIG. 325 taken along the line CCCXXVII-CCCXXVII;

FIG. 328 is a view showing the method of manufacturing the select transistor array;

FIG. 329 is a cross-sectional view of FIG. 328 taken along the line CCCXXIX-CCCXXIX;

FIG. 330 is a cross-sectional view of FIG. 328 taken along the line CCCXXX-CCCXXX;

FIG. 331 is a view showing the method of manufacturing the select transistor array;

FIG. 332 is a cross-sectional view of FIG. 331 taken along the line CCCXXXII-CCCXXXII;

FIG. 333 is a cross-sectional view of FIG. 331 taken along the line CCCXXXIII-CCCXXXIII;

FIG. 334 is a view showing the method of manufacturing the select transistor array;

FIG. 335 is a cross-sectional view of FIG. 334 taken along the line CCCXXXV-CCCXXXV;

FIG. 336 is a cross-sectional view of FIG. 334 taken along the line CCCXXXVI-CCCXXXVI;

FIG. 337 is a view showing the method of manufacturing the select transistor array;

FIG. 338 is a cross-sectional view of FIG. 337 taken along the line CCCXXXVIII-CCCXXXVIII;

FIG. 339 is a cross-sectional view of FIG. 337 taken along the line CCCXXXIX-CCCXXXIX;

FIG. 340 is a view showing the method of manufacturing the select transistor array;

FIG. 341 is a cross-sectional view of FIG. 340 taken along the line CCCXLI-CCCXLI;

FIG. 342 is a cross-sectional view of FIG. 340 taken along the line CCCXLII-CCCXLII;

FIG. 343 is a view showing the method of manufacturing the select transistor array;

FIG. 344 is a cross-sectional view of FIG. 343 taken along the line CCCXLIV-CCCXLIV;

FIG. 345 is a cross-sectional view of FIG. 343 taken along the line CCCXLV-CCCXLV;

FIG. 346 is a view showing the method of manufacturing the select transistor array;

FIG. 347 is a cross-sectional view of FIG. 346 taken along the line CCCXLVII-CCCXLVII;

FIG. 348 is a cross-sectional view of FIG. 346 taken along the line CCCXLVIII-CCCXLVIII;

FIG. 349 is a view showing the method of manufacturing the select transistor array;

FIG. 350 is a cross-sectional view of FIG. 349 taken along the line CCCL-CCCL;

FIG. 351 is a cross-sectional view of FIG. 349 taken along the line CCCLI-CCCLI;

FIG. 352 is a view showing the method of manufacturing the select transistor array;

FIG. 353 is a cross-sectional view of FIG. 352 taken along the line CCCLIII-CCCLIII;

FIG. 354 is a cross-sectional view of FIG. 352 taken along the line CCCLIV-CCCLIV;

FIG. 355 is a view showing the method of manufacturing the select transistor array;

FIG. 356 is a cross-sectional view of FIG. 355 taken along the line CCCLVI-CCCLVI;

FIG. 357 is a cross-sectional view of FIG. 355 taken along the line CCCLVII-CCCLVII;

FIG. 358 is a view showing the method of manufacturing the select transistor array;

FIG. 359 is a cross-sectional view of FIG. 358 taken along the line CCCLIX-CCCLIX;

FIG. 360 is a cross-sectional view of FIG. 358 taken along the line CCCLX-CCCLX;

FIG. 361 is a view showing the method of manufacturing the select transistor array;

FIG. 362 is a cross-sectional view of FIG. 361 taken along the line CCCLXII-CCCLXII;

FIG. 363 is a cross-sectional view of FIG. 361 taken along the line CCCLXIII-CCCLXIII;

FIG. 364 is a view showing a basic structure of matrix channel elements;

FIG. 365 is a cross-sectional view of FIG. 364 taken along the line CCCLXV-CCCLXV;

FIG. 366 is a cross-sectional view of FIG. 364 taken along the line CCCLXVI-CCCLXVI;

FIG. 367 is a cross-sectional view of FIG. 364 taken along the line CCCLXVII-CCCLXVII;

FIG. 368 and FIG. 369 are views showing operation principles;

FIG. 370 is a view showing an equivalent circuit of an inverter;

FIG. 371 and FIG. 372 are views showing a device structure of an inverter circuit, respectively;

FIG. 373 and FIG. 374 are views showing a modified example, respectively;

FIG. 375 is a view showing an equivalent circuit of NAND gate;

FIG. 376 is a view showing a device structure of NAND gate circuit;

FIG. 377 and FIG. 378 are views showing operation principles;

FIG. 379 is a view showing an equivalent circuit of NOR gate;

FIG. 380 is a view showing a device structure of NOR gate circuit;

FIG. 381 and FIG. 382 are views showing operation principles;

FIG. 383 is a view showing an equivalent circuit of 3-stage input NAND gate;

FIG. 384 is a view showing a device structure of 3-stage input NAND gate circuit;

FIG. 385 is a view showing an equivalent circuit of 3-stage input NOR gate;

FIG. 386 is a view showing a device structure of 3-stage input NOR gate circuit;

FIG. 387 to FIG. 389 are views showing multi-layer matrix channel elements; and FIG. 390 is a view showing a reading system.

DETAILED DESCRIPTION

In general, according to one embodiment, a nonvolatile semiconductor memory comprising: a semiconductor substrate; a first semiconductor layer on the semiconductor substrate; control gates provided in an array form in a first direction in parallel with a surface of the semiconductor substrate and in a second direction perpendicular thereto, the control gates passing through the first semiconductor layer in a third direction perpendicular to the first and second directions; data recording layers between the first semiconductor layer and the control gates; two first conductive-type diffusion layers at two ends in the first direction of the first semiconductor layer; two second conductive-type diffusion layers at two ends in the second direction of the first semiconductor layer; select gate lines extending in the first direction on the first semiconductor layer; and word lines extending in the second direction on the select gate lines, wherein the select gate lines function as select gates shared by select transistors connected between the control gates and the word lines arranged in the first direction, each of the word lines is commonly connected to the control gates arranged in the second direction, a first memory cell array comprises the first semiconductor layer, the control gates, and the data recording layers therebetween, and the first memory cell array has NAND series including memory cells connected in series in the first direction.

1. ARCHITECTURE CONCEPT

(1) Basic Outline

The present disclosure is based on BiCS-NAND structure of a three-dimensional NAND flush memory which is publicly-known at present, with lowest processing difficulties. However, BiCS-NAND structure has a problem that a contact resistance is large between a semiconductor substrate and a column-shaped active area. Therefore, the present disclosure proposes a structure that a semiconductor layer (active area) and control gates are replaced with each other in the BiCS-NAND structure.

In this structure, since semiconductor layers are stacked on each other, NAND series is extended horizontally to a surface of the semiconductor substrate. However, since this structure is based on the BiCS-NAND structure, the control gates are not processed into a line & space pattern in such a manner as being formed across a stacked layer structure. Further, column-shaped control gates are not necessarily brought into contact with the semiconductor substrate, and therefore a problem such as an increase in the contact resistance as shown in the BiCS-NAND structure, does not occur.

Accordingly, a large capacity nonvolatile semiconductor memory can be realized based on a new architectural concept which can solve the problem of a conventional three-dimensional NAND flush memory.

However, when the architectural concept is employed, NAND structure, being one of the requirements of large capacity, should be maintained. Namely, a structure of using unselected memory cells different from selected memory cells is used as an electric conduction path during data reading and data writing should be maintained.

Further, in order to ensure compatibility with a conventional NAND flush memory, it would be necessary to execute reading/writing/erasing similar to those of the conventional NAND flush memory, based on a new architectural concept.

Therefore, such reading/writing/erasing based on the new architectural concept will be described hereafter sequentially.

Note that the architectural concept of the present disclosure is completely different from that of the conventional three-dimensional NAND flush memory. Therefore, a nonvolatile semiconductor memory based on the architectural concept of the present disclosure is called MaCS (Matrix Channel Stacked memory).

(2) Memory Cell Array

First, a basic structure of the memory cell array based on the architectural concept of the present disclosure will be described. This basic structure is a minimal necessary condition of operating the memory cell array as a nonvolatile semiconductor memory.

A. First Basic Structure

Figure 1:
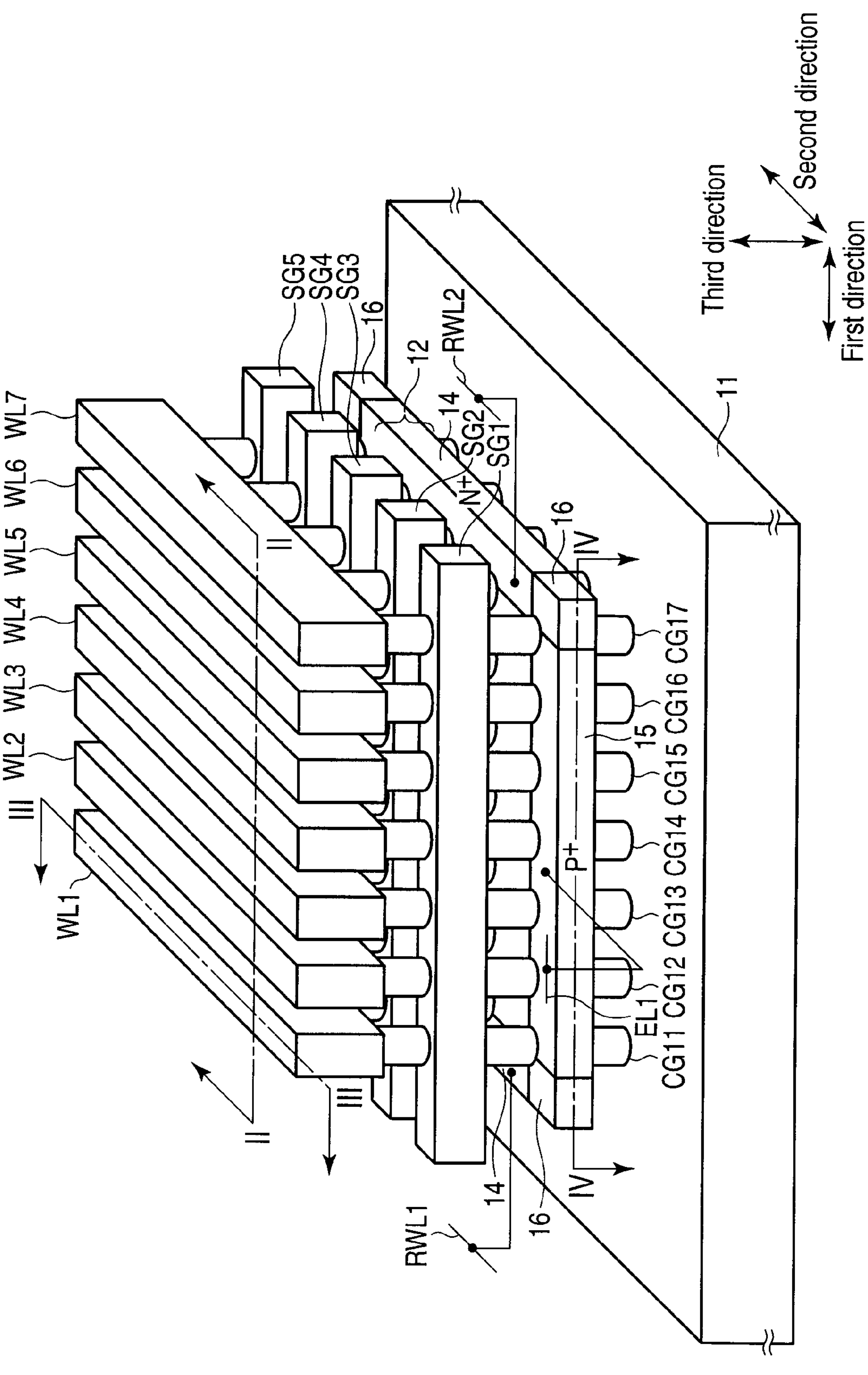
FIG. 1 is a view showing a first basic structure.

FIG. 1 shows a first basic structure of the memory cell array of the nonvolatile semiconductor memory based on the architectural concept of the present disclosure. FIG. 2 is a cross-sectional view of FIG. 1 taken along the line II-II, FIG. 3 is a cross-sectional view of FIG. 1 taken along the line III-III, and FIG. 4 is a cross-sectional view of FIG. 1 taken along the line IV-IV.

Semiconductor substrate 11 is constituted of a single crystal semiconductor formed of a crystal such as Si or Ge, and a compound semiconductor formed of crystals (mixed crystal). Semiconductor layer 12, being an active area, is disposed on semiconductor substrate 11. Semiconductor layer 12 is composed of an intrinsic semiconductor for example.

Control gates CG11 to CG57 are arranged in an array pattern in a first direction horizontal to a surface of semiconductor substrate 11 and in a second direction orthogonal thereto. In this example, control gates CG11 to CG57 have an array size with 5×7. However, the array size can be suitably changed.

Pitches Px in the first direction, and pitches Py in the second direction of control gates CG11 to CG57 are also set to be constant.

Widths Sx between control gates CG11 to CG57 in the first direction of semiconductor layer 12 are also set to be constant. The widths Sx are determined under a condition that the electric conduction path is generated in selected NAND series during reading/writing of data.

Widths Sy between control gates CG11 to CG57 in the second direction of semiconductor layer 12 are also set to be constant. The widths Sy are determined under a condition that the electric conduction path is generated in the memory cells arranged in rows in the second direction, during erasing of data.

Whether or not the electric conduction path is generated, depends on not only widths Sx and Sy, but also properties of semiconductor layer 12 (such as concentration of channel impurities), potentials applied to control gates CG11 to CG57, and stacked layer structure 13, etc. However, when scale-down of a semiconductor device and easier generation of the electric conduction path are taken into consideration, both of the widths Sx and Sy are set to 50 nm or less, preferably set to 20 nm or less, and further preferably set to 10 nm or less (excluding Sx=0).

Note that widths Sx and Sy may be equal to each other, or may be different from each other.

Further, control gates CG11 to CG57 pass through semiconductor layer 12 in a third direction orthogonal to the first and second directions. A lower surface (surface on the side of semiconductor substrate 11) of control gates CG11 to CG57 is set in an open state, and is not in contact with semiconductor substrate 11.

Each one of control gates CG11 to CG57 has a columnar shape extending in the third direction. Each sectional shape of column-shaped control gates CG11 to CG57 on a surface horizontal to the surface of semiconductor substrate 11 is not limited to a circular shape, and it may be an oval shape, a rectangular shape, or a polygonal shape, etc.

The control gates CG11 to CG57 are constituted of conductors such as electroconductive polysilicon, metal or metal silicide containing impurities.

A side face (face on the side of the first and second directions) of each one of control gates CG11 to CG57 is covered with stacked layer structure 13 including data recording layers. Namely, the data recording layers are disposed between semiconductor layer 12 and control gates CG11 to CG57.

NAND series NAND1 to NAND5 are constituted of semiconductor layer 12, control gates CG11 to CG57, and stacked layer structures 13 between them (including the data recording layers). Each one of NAND series NAND1 to NAND5 has memory cells (FET: Field effect transistor) connected in series in the first direction.

Two N+-type diffusion layers 14 are disposed in semiconductor layer 12 at two ends of control gates CG11 to CG57 in the first direction. Also, two P+-type diffusion layers 15 are disposed in semiconductor layer 12 at two ends of control gates CG11 to CG57 in the second direction.

The N+-type diffusion layers 14 and P+-type diffusion layers 15 are insulated from each other by element isolation insulating layer 16.

In this example, both ends of NAND series NAND1 to NAND5 are connected to N+-type diffusion layers 14. However, the present invention is not limited thereto. For example, N+-type diffusion layers 14 may be changed to P+-type diffusion layers, and P+-type diffusion layers 15 may be changed to N+-type diffusion layers, and the both ends of NAND series NAND1 to NAND5 may be connected to P+-type diffusion layers 4.

First read/write line RWL1 is connected to one of two N+-type diffusion layers 14, and second read/write line RWL2 is connected to the other one of two N+-type diffusion layers 14. First and second read/write lines RWL1, RWL2 are used for reading/writing of data from and into NAND series NAND1 to NAND5.

First erase line EL1 is connected to one of two P+-type diffusion layers 15, and second erase line EL2 is connected to the other one of two P+-type diffusion layers 15. First and second erase lines EL1, EL2 are used for erasing of data from NAND series NAND1 to NAND5.

Select gate lines SG1 to SG5 are extended on semiconductor layer 12 in the first direction.

Each one of select gate lines SG1 to SG5 functions as a select gate which is shared by select transistors STi1 to STi7 connected between control gates CGi1 to CGi7 (i is one of 1 to 5) arranged in the first direction, and word lines WL1 to WL7.

Namely, select gate line SGi functions as a select gate shared by select transistors STi1 to STi7 connected between control gates CGi1 to CGi7 and word lines WL1 to WL7.

Select gate lines SG1 to SG5 correspond to NAND series NAND1 to NAND5.

Word lines WL1 to WL7 are extended on select gate lines SG1 to SG5 in the second direction.

Each one of word lines WL1 to WL7 is connected commonly to control gates CG1*j* to CG5*j* (j is one of 1 to 7) arranged in the second direction. Namely, word line WLj is connected commonly to control gates CG1*j* to CG5*j*.

Here, select transistor STij has semiconductor layer 17 connected between control gate CGij and word line WLj; gate insulating layer 18 disposed on a side face of semiconductor layer 17; and P-channel region 19 disposed in an area of semiconductor layer 17 surrounded by select gate line SGi.

In this example, select transistor STij is an N-channel FET. However, the present invention is not limited thereto. Select transistor STij may be a switching element.

According to the first basic structure, it may be possible to realize a large capacity nonvolatile semiconductor memory having NAND structure in which the memory cell array is constituted of NAND series. Further, the NAND flush memory can be easily constructed three-dimensionally by forming a stacked layer structure in which semiconductor layers are stacked. Therefore the nonvolatile semiconductor memory of the present invention is very promising as a next generation semiconductor memory.

B. Second Basic Structure

Figure 7:
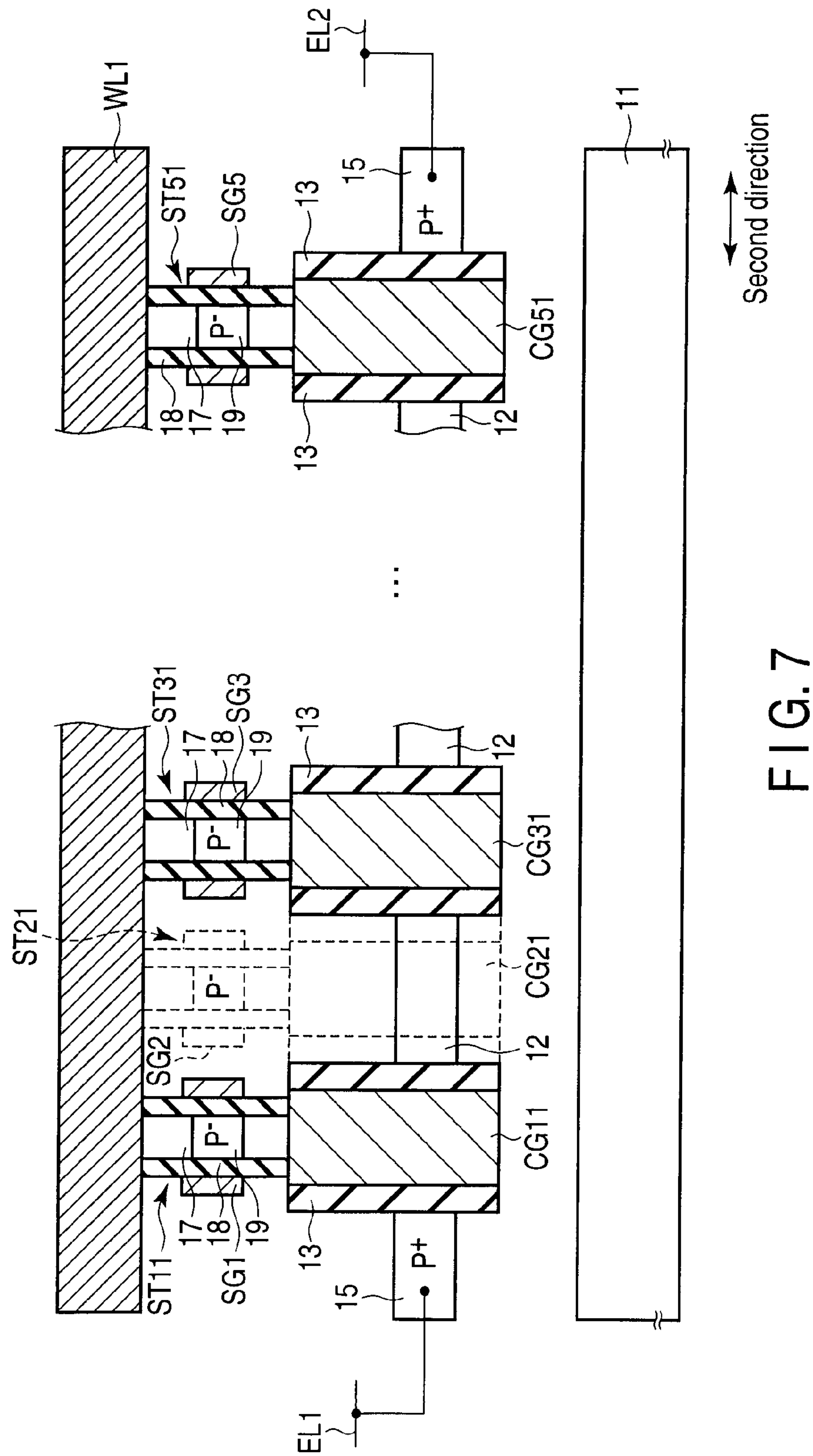
FIG. 7 is a cross-sectional view of FIG. 5 taken along the line VII-VII.
Figure 8:
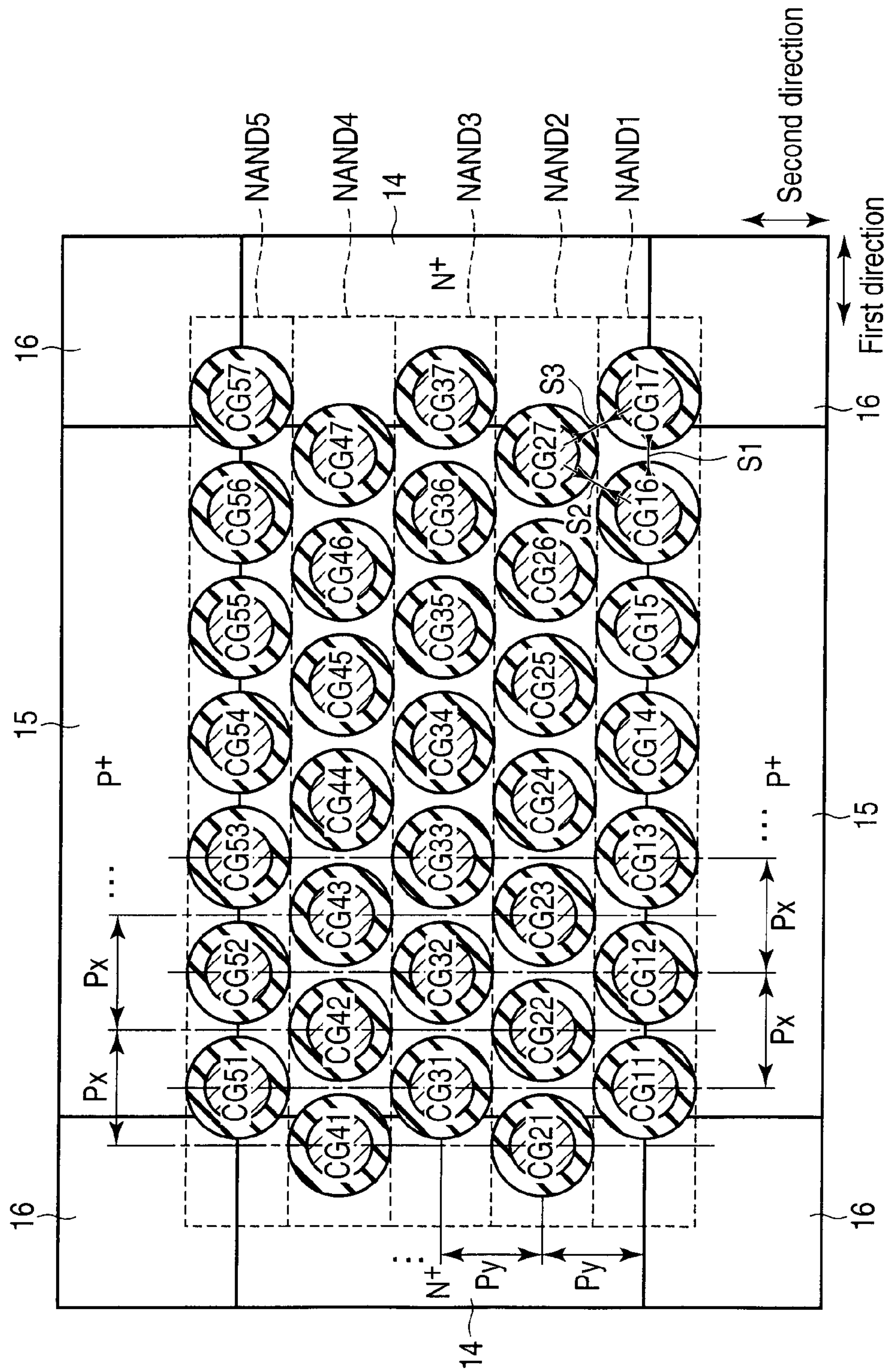
FIG. 8 is a cross-sectional view of FIG. 5 taken along the line VIII-VIII.

FIG. 5 shows a second basic structure of the memory cell array of the nonvolatile semiconductor memory based on the architectural concept of the present disclosure. FIG. 6 is a cross-sectional view of FIG. 5 taken along the line VI-VI; FIG. 7 is a cross-sectional view of FIG. 5 taken along the line VII-VII; FIG. 8 is a cross-sectional view of FIG. 5 taken along the line VIII-VIII; and FIG. 9 shows a connecting relation between word lines and control gates.

The second basic structure has a layout of control gates CG11 to CG57, compared with the first basic structure.

Specifically, in two NAND series adjacent to each other in the second direction out of NAND series NAND1 to NAND5, the control gates comprising one of the two NAND series are deviated from the control gates comprising the other one, in the first direction by a length (for example, Px/2) shorter than pitches Px of the control gates arranged in the first direction.

A specific structure will be described hereafter.

The semiconductor substrate 11 is constituted of a single crystal semiconductor formed of a crystal such as Si or Ge, and a compound semiconductor formed of crystals (mixed crystal). Semiconductor layer 12, being an active area, is disposed on semiconductor substrate 11. Semiconductor layer 12 is composed of an intrinsic semiconductor for example.

Control gates CG11 to CG57 are arranged in an array pattern in the first direction horizontal to the surface of semiconductor substrate 11 and in the second direction orthogonal thereto. In this example, control gates CG11 to CG57 have respectively an array size with 5×7. However, the array size can be suitably changed.

Pitches Px in the first direction, and pitches Py in the second direction of control gates CG11 to CG57 are also set to be constant.

In this example, in two NAND series adjacent to each other in the second direction out of NAND series NAND1 to NAND5, the control gates comprising one of the two NAND series are deviated from the control gates comprising the other one, in the first direction by a length (for example, Px/2) shorter than pitches Px of the control gates arranged in the first direction.

Therefore, control gates CG11 to CG57 have a hexagonal close-packed structure or a houndstooth check structure as a whole.

Widths S1 between control gates CG11 to CG57 in the first direction of semiconductor layer 12, are determined under a condition that the electric conduction path is generated in selected NAND series, during reading/writing of data. Further, widths S2 and S3 between control gates CG11 to CG57 in the second direction of semiconductor layer 12 are determined under a condition that the electric conduction path is generated in the memory cells arranged in rows in the second direction, during erasing of data.

Whether or not the electric conduction path is generated, depends on not only widths S1, S2, S3, but also properties of semiconductor layer 12 (such as concentration of channel impurities), the potentials applied to control gates CG11 to CG57, and stacked layer structure 13, etc. However, when scale-down of a semiconductor device and easier generation of the electric conduction path are taken into consideration, the widths S1, S2, S3 are set to 50 nm or less, preferably set to 20 nm or less, and further preferably set to 10 nm or less (excluding Sx=0).

Note that width S1 and widths S2, S3 may be equal to each other, or may be different from each other. Widths S2 and S3 are preferably equal to each other.

Further, control gates CG11 to CG57 pass through semiconductor layer 12 in the third direction orthogonal to the first and second directions. The lower surface (surface on the side of semiconductor substrate 11) of control gates CG11 to CG57 is set in an open state, and is not in contact with semiconductor substrate 11.

Each one of control gates CG11 to CG57 has a columnar shape extending in the third direction. Each sectional shape of control gates CG11 to CG57 on the surface horizontal to the surface of semiconductor substrate 11 is not limited to a circular shape, and it may be an oval shape, a rectangular shape, or a polygonal shape, etc.

The control gates CG11 to CG57 are constituted of conductors such as electroconductive polysilicon, metal or metal silicide containing impurities.

The side face (face on the side of the first and second directions) of each one of control gates CG11 to CG57 is covered with stacked layer structure 13 including data recording layers. Namely, the data recording layers are disposed between semiconductor layer 12 and control gates CG11 to CG57.

NAND series NAND1 to NAND5 are constituted of semiconductor layer 12, control gates CG11 to CG57, and stacked layer structures 13 between them (including the data recording layers). Each one of NAND series NAND1 to NAND5 has memory cells (FET) connected in series in the first direction.

Two N+-type diffusion layers 14 are disposed in semiconductor layer 12 at two ends of control gates CG11 to CG57 in the first direction. Also, two P+-type diffusion layers 15 are disposed in semiconductor layer 12 at two ends of control gates CG11 to CG57 in the second direction.

The N+-type diffusion layers 14 and P+-type diffusion layers 15 are insulated from each other by element isolation insulating layer 16.

In this example, both ends of NAND series NAND1 to NAND5 are connected to N+-type diffusion layers 14. However, the present invention is not limited thereto. For example, N+-type diffusion layers 14 may be changed to the P+-type diffusion layers, and P+-type diffusion layers 15 may be changed to the N+-type diffusion layers, and the both ends of NAND series NAND1 to NAND5 may be connected to P+-type diffusion layers 4.

First read/write line RWL1 is connected to one of two N+-type diffusion layers 14, and second read/write line RWL2 is connected to the other one of two N+-type diffusion layers 14. First and second read/write lines RWL1, RWL2 are used for reading/writing of data from and into NAND series NAND1 to NAND5.

First erase line EL1 is connected to one of two P+-type diffusion layers 15, and second erase line EL2 is connected to the other one of two P+-type diffusion layers 15. First and second erase lines EL1, EL2 are used for erasing of data from NAND series NAND1 to NAND5.

Select gate lines SG1 to SG5 are extended on semiconductor layer 12 in the first direction.

Each one of select gate lines SG1 to SG5 functions as the select gate which is shared by select transistors STi1 to STi7 connected between control gates CGi1 to CGi7 (i is one of 1 to 5) arranged in the first direction, and word lines WL1 to WL14.

Namely, select gate line SGi functions as the select gate shared by select transistors STi1 to STi7 connected between control gates CGi1 to CGi7 and word lines WL1 to WL7.

Select gate lines SG1 to SG5 correspond to NAND series NAND1 to NAND5.

Word lines WL1 to WL14 are extended on select gate lines SG1 to SG5 in the second direction. In this example, the layout of control gates CG11 to CG57 is made by the hexagonal close-packed structure, and therefore the number of the word lines is twice the number of the word lines according to the first basic structure.

Each one of odd-numbered word lines WL1, WL3, WL5, . . . WL13 of word lines WL1 to WL14 is connected commonly to control gates CG**2*j* and CG4*j*** (j is one of 1 to 7) arranged in the second direction.

Further, each one of even-numbered word lines WL2, WL4, WL6, . . . WL14 of word lines WL1 to WL14, is connected commonly to control gates CG**1*j*, CG3*j*, and CG5*j*** (j is one of 1 to 7) arranged in the second direction.

Here, select transistor STij has semiconductor layer 17 connected between control gate CGij and word line WLj; gate insulating layer 18 disposed on the side face of semiconductor layer 17; and P-type channel region 19 disposed in the area of semiconductor layer 17 surrounded by select gate line SGi.

In this example, select transistor STij is N-channel FET. However, the present invention is not limited thereto. Select transistor STij may be the switching element.

According to the second basic structure, it may be possible to realize the large capacity nonvolatile semiconductor memory having the NAND structure in which the memory cell array is constituted of NAND series, similarly to the first basic structure. Further, the NAND flush memory can be easily constructed three-dimensionally by forming a stacked layer structure in which semiconductor layers are stacked. Therefore the nonvolatile semiconductor memory of the present invention is very promising as the next generation semiconductor memory.

Further, the second basic structure has an advantage that a read operation can be stably executed, compared with the first basic structure. This point will be described later.

(3) Memory Cells

An example of the memory cells comprising the memory cell array of the first and second basic structures will be described.

The memory cells are respectively constituted of semiconductor layer 12, control gates CG11 to CG57, and stacked layer structures 13 between them (including the data recording layers), as shown in FIGS. 1 to 9.

Figure 10:
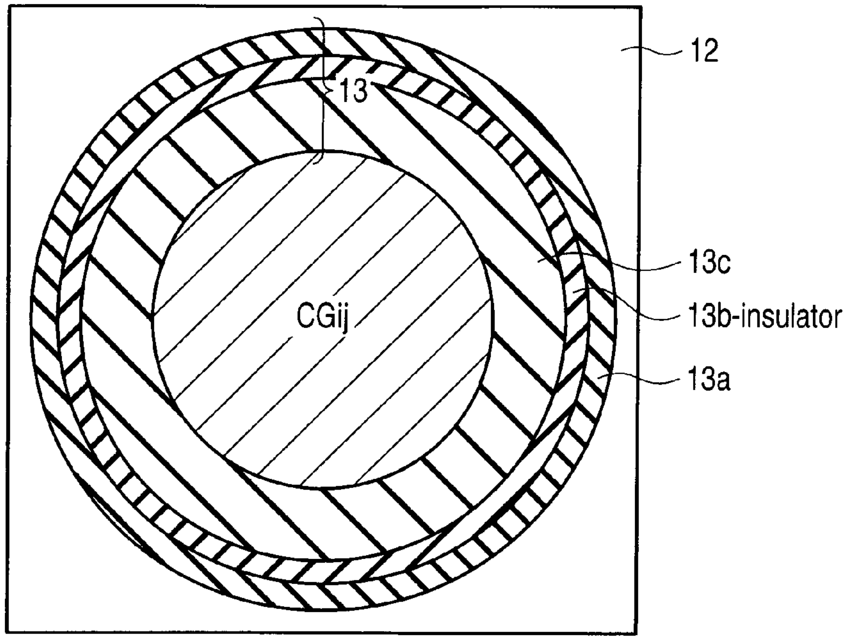
FIG. 10 to FIG. 13 are views showing an example of a memory cell, respectively.
Figure 11:
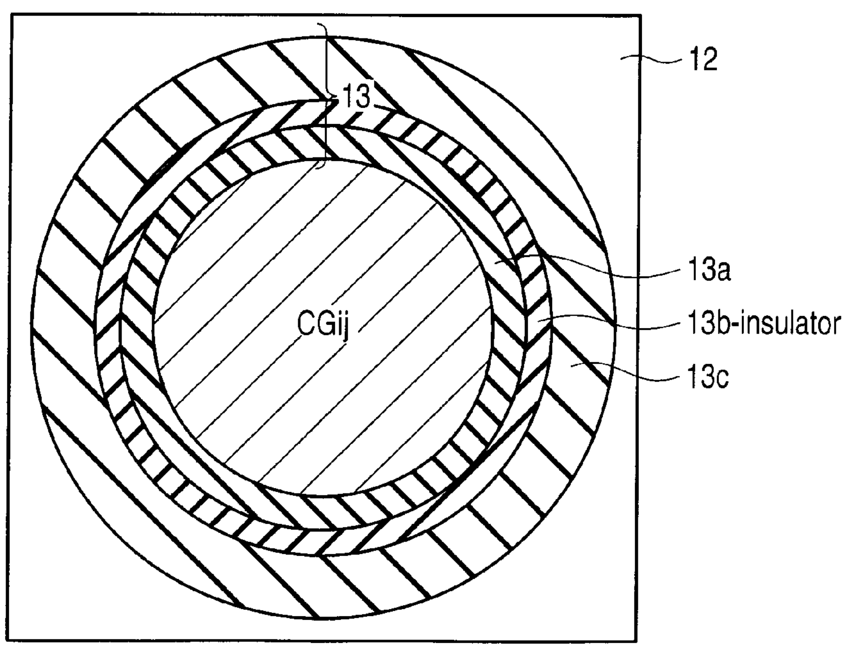

FIGS. 10 and 11 show an example of forming the data recording layers from an insulator.

The insulator of the data recording layer includes a variable resistance element.

Stacked layer structure 13 has gate insulating layer **13*a*, data recording layer 13*b*, being an insulator, and block insulating layer 13*c*. In an example of FIG. 10, gate insulating layer 13*a* is disposed at a position farthest from control gate CGij, namely, at a position in contact with semiconductor layer 12, being an active area (channel). In an example of FIG. 11, gate insulating layer 13*a*** is disposed at a position in contact with control gate CGij.

Any kind of data recording layer **13*b***, being the insulator, can be used, if having a function of varying the threshold of the respective memory cells by physical phenomenon.

For example, when data recording layer **13*b*, being the insulator, functions as a charge storage layer for accumulating electric charge (electrons or holes), the memory cells are SONOS-type or MONOS-type flush memory cells, and gate insulating layer 13*a*** is a tunnel insulating layer.

Further, data recording layer **13*b***, being the insulator, may be ferroelectrics wherein a direction of an electric dipole is varied depending on an electric field, or may be a variable resistance element (such as a phase change material, metal oxide) wherein a resistance value is varied depending on the electric field.

In any case, the threshold of the respective memory cells is varied in accordance with a state of data recording layer **13*b***, being the insulator.

Figure 12:
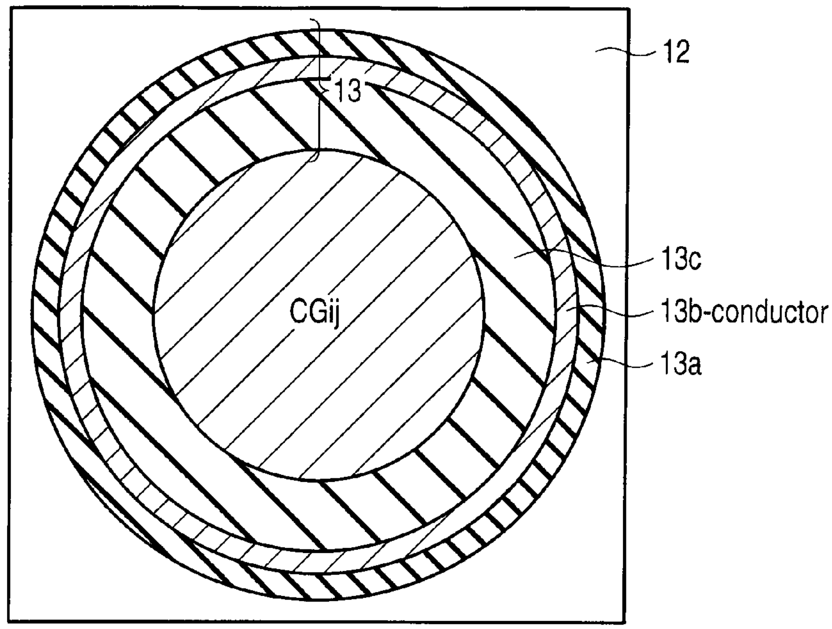
Figure 13:
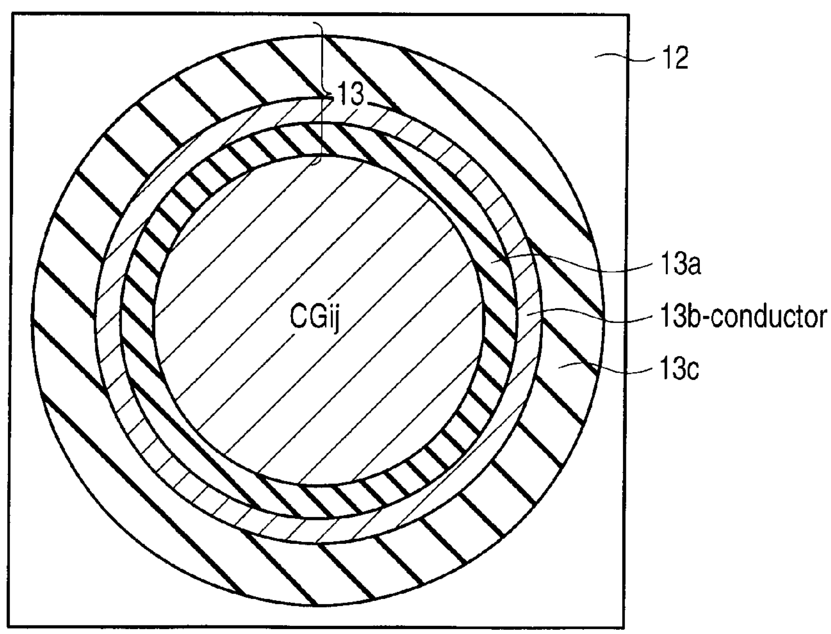

FIGS. 12 and 13 show examples of forming the data recording layer from an electroconductive material.

The stacked layer structure 13 has gate insulating layer **13*a*, data recording layer 13*b*, being the conductor, and inter-electrodes insulating layer 13*c*. In the example of FIG. 12, gate insulating layer 13*a* is disposed at a position furthest from control gate CGij, namely at a position in contact with semiconductor layer 12, being the active area (channel). In the example of FIG. 13, gate insulating layer 13*a*** is disposed at a position in contact with control gate CGij.

For example, when data recording layer **13*b*, being the conductor, functions as the charge storage layer for accumulating electric charge (electrons or holes), the memory cells are floating gate type flush memory cells, and gate insulating layer 13*a*** is the tunnel insulating layer.

(4) Basic Operation

The basic operation of the memory cell array having the first and second basic structures will be described.

First, a system for realizing the basic operation will be simply described.

Figure 16:
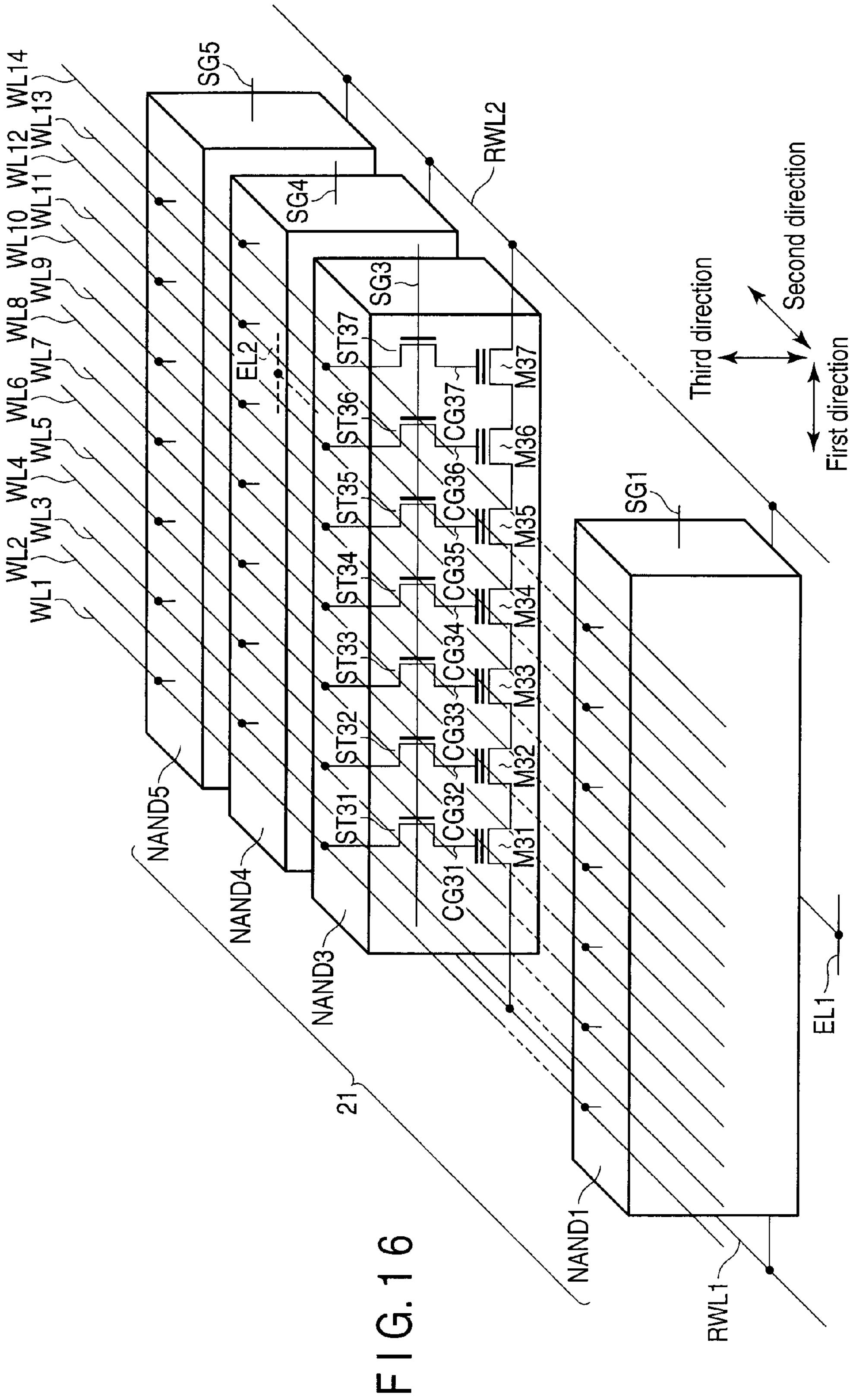

FIG. 14 shows a system of controlling the basic operation of the memory cell array. FIG. 15 and FIG. 16 show an equivalent circuit of the memory cell array, respectively.

Memory cell array 21 has the aforementioned first and second basic structures. FIG. 15 corresponds to an equivalent circuit of the first basic structure, and FIG. 16 corresponds to an equivalent circuit of the second basic structure.

Read/write line control circuit 22 controls potentials of first and second read/write lines RWL1, RWL2 in memory cell array 21. Select gate line control circuit 23 controls potentials of select gate lines SG1, SG2, . . . SG5 in memory cell array 21.

Word line control circuit 24 controls potentials of word lines WL1 to WL7, and WL1 to WL14 in memory cell array 21. Erase line control circuit 25 controls potentials of first and second erase lines EL1, EL2 in memory cell array 21.

Control circuit 26 controls an overall basic operation (reading/writing/erasing). Namely, control circuit 26 controls read/write line control circuit 22, select gate line control circuit 23, word line control circuit 24, and erase line control circuit 25, in accordance with an operation mode.

A. Write Operation

First, writing is defined as follows.

Two operations such as write execute and write inhibit are executed during data writing, in accordance with a value of writing data.

Therefore, when the operation is expressed simply as "writing", it means that the threshold of the selected memory cell is fluctuated (write execute), and for example, it means that the selected memory cell is changed to a writing state (high threshold) from an erasing state (low threshold).

The write operation is executed to a memory cell in the selected NAND series. Further, similarly to the conventional NAND flush memory, the write operation can be executed to the memory cells in the selected NAND series one by one, for example, from the memory cell of the first read/write line side to the memory cell of the second read/write line side sequentially.

In this example, explanation will be given for an example of executing data writing to memory cell MC34 in NAND series NAND3.

The following first to third examples show basic write operations of the memory cell array according to the first basic structure (FIGS. 1 to 4), and the following fourth to seventh examples show basic write operations of the memory cell array according to the second basic structure (FIG. 5 to FIG. 9).

A-1. First Example

Figure 18:
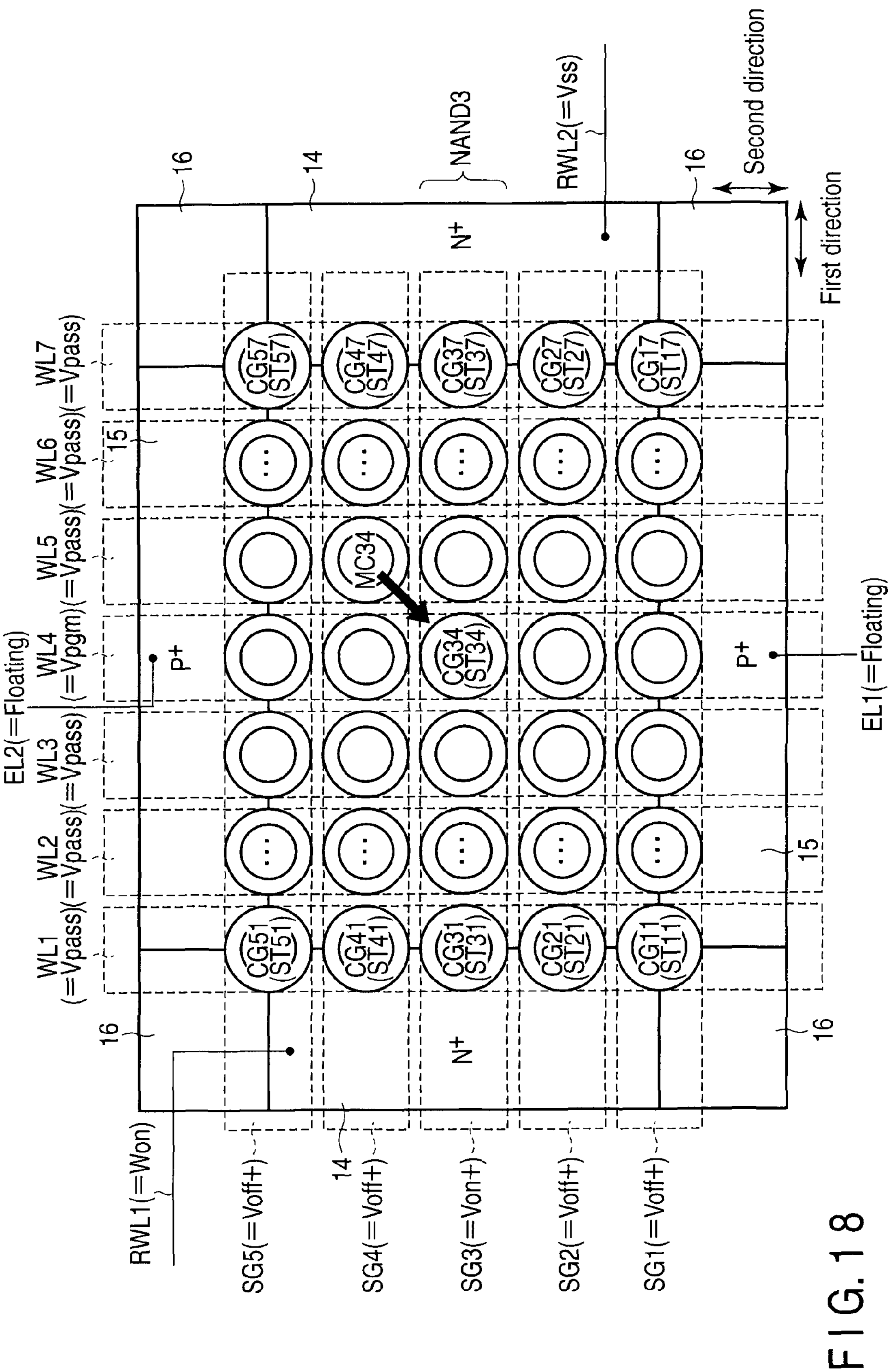

FIGS. 17 and 18 show a first example of a potential relation during data writing.

Selected word line WL4 is set to Vpgm, and unselected word lines WL1 to WL3, and WL5 to WL7 are set to Vpass. Vpass is the potential required for generating the electric conduction path in selected NAND series NAND3, and Vpgm is the potential required for writing, irrespective of the data (threshold) of the respective memory cells. In this example, Vpgm and Vpass are set to satisfy Vpgm>Vpass.

Selected select gate line SG3 is set to Von+, and unselected select gate lines SG1, SG2, SG4, and SG5 are set to Voff+. Von+ is the potential required for turning-on select transistors ST31 to ST37, and Voff+ is the potential required for turning-off select transistors ST11 to ST17, ST21 to ST27, ST41 to ST47, and ST51 to ST57. In this example, Von+ and Voff+ are set to satisfy Von+>Voff+.

First read/write line RWL1 is set to Won (for example, high potential side power supply potential Vdd), and second read/write line RWL2 is set to Vref (for example, low potential side power supply potential Vss). For example, Won and Vref are set to satisfy Won>Vref, so that a current (electrons) are flown to the selected NAND series NAND3, by generating a potential difference between first and second read/write lines RWL1 and RWL2.

First and second erase lines EL1, EL2 are set in a floating state, because they are not used during data writing.

Here, reference potential Vref is set as a center between the threshold of cell data "0" (maximum value of a threshold distribution), and the threshold of cell data "1" (minimum value of a threshold distribution), and specifically, Vref is set as Vss (for example, 0 V).

α1 is Vpass−Vref, being a value exceeding the threshold of the respective memory cells, α2 is Von+−Vpgm, being a value exceeding the threshold of the select transistor, and α3 is Vpgm−Won, being a value exceeding the potential required for fluctuating the threshold of selected memory cell MC34. For example, when the data recording layer is the charge storage layer, α3 is set to a sufficiently large value for injecting electrons into the data recording layer of selected memory cell MC34.

α4 is for example a difference between the threshold of cell data "0" (maximum value of the threshold distribution), and the threshold of cell data "1" (minimum value of the threshold distribution).

When the potential relation as described above is maintained, for example as shown in FIG. 19, the electric conduction path is generated in the selected NAND series NAND3, and electrons (e−) flow from second read/write line RWL2 to first read/write line RWL1. Further, in selected memory cell MC34, Vpgm−Won is applied between the control gate CG34 and the channel, and therefore for example as shown in FIG. 20, electrons are injected into the data recording layer (charge storage layer) 13*b* of selected memory cell MC34.

Accordingly, data is written into selected memory cell MC34.

A-2. Second Example

Figure 21:
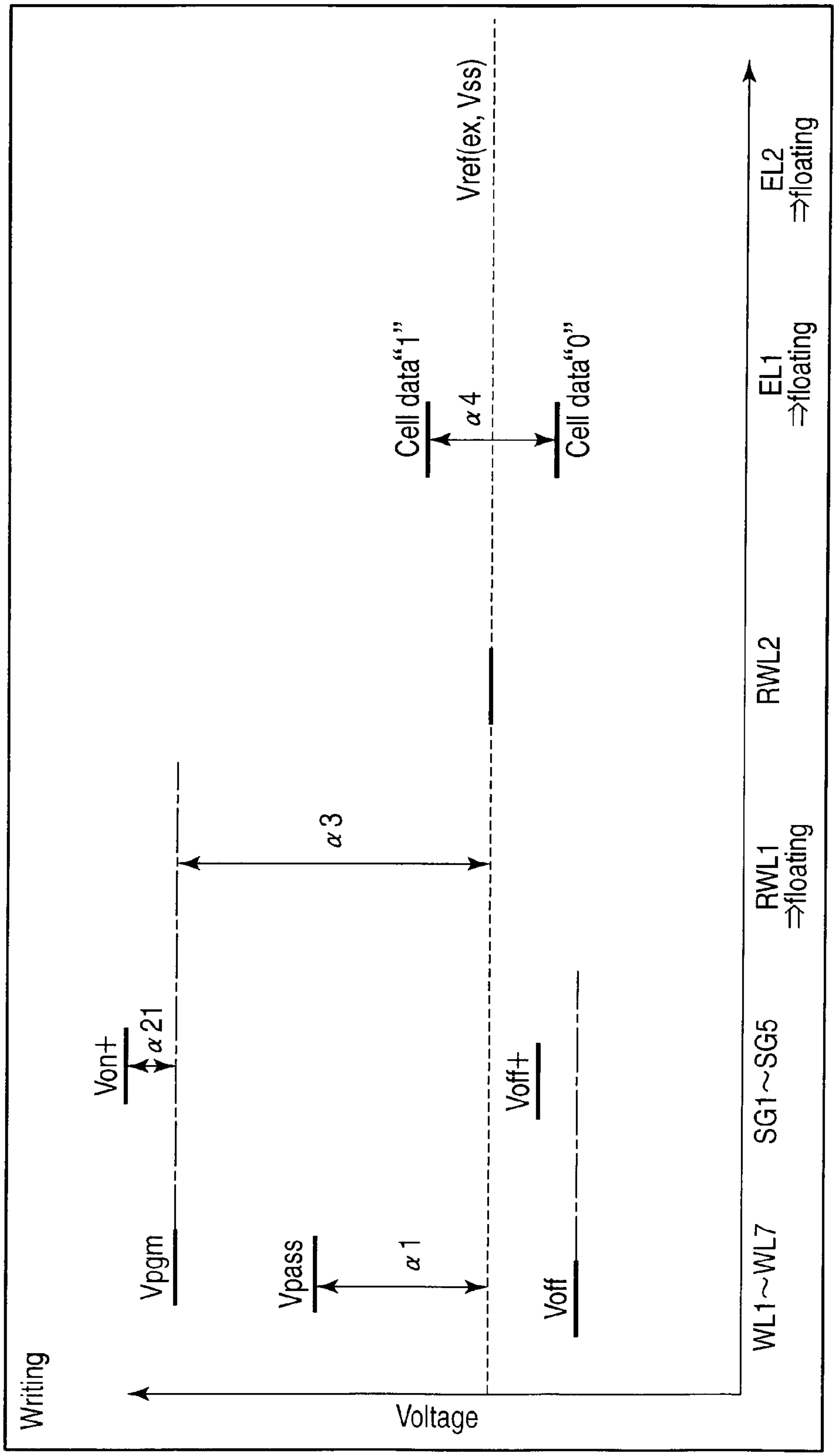
FIG. 21 and FIG. 22 are views showing a second example of the potential relation during data writing, respectively.
Figure 22:
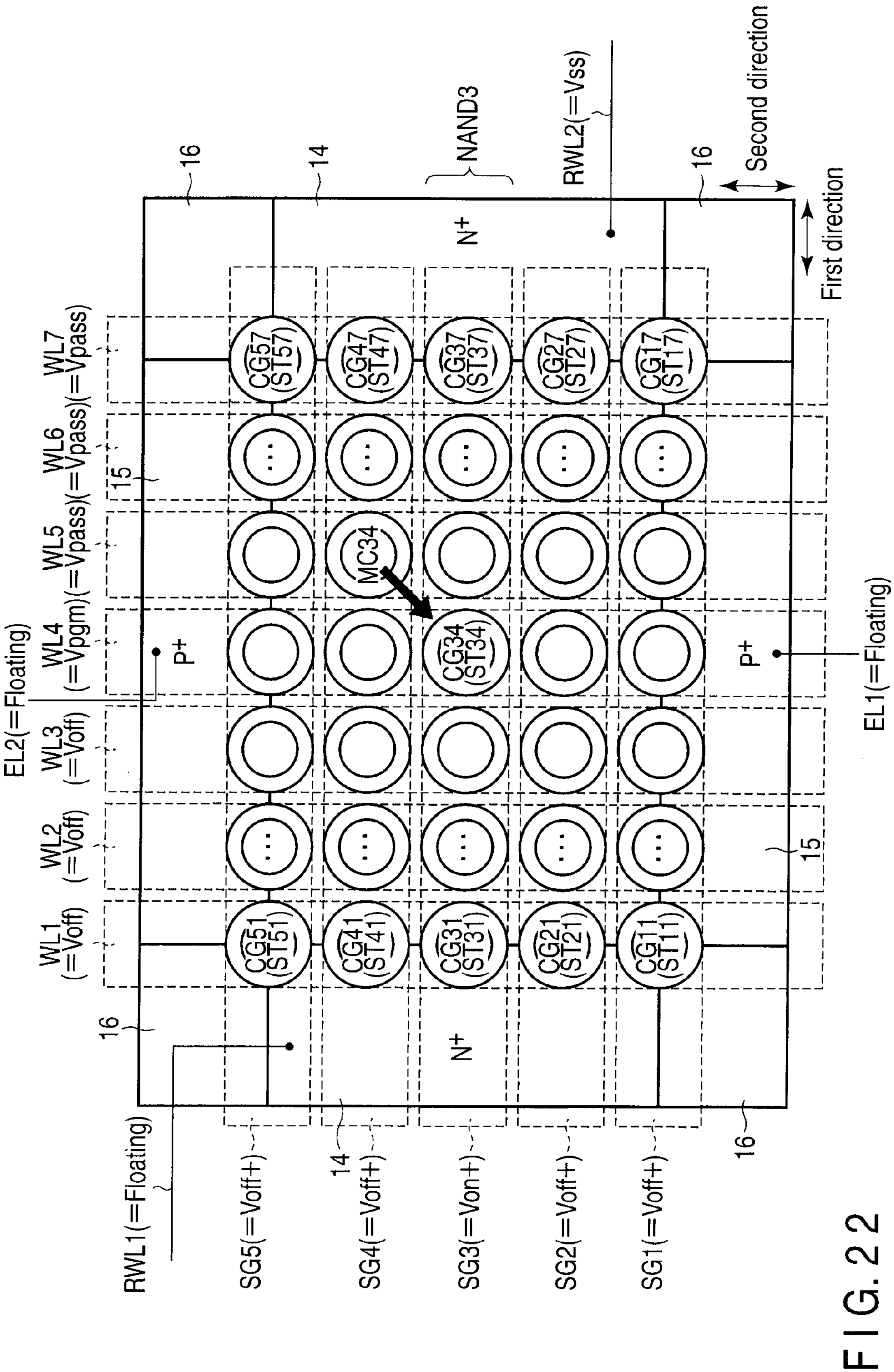

FIGS. 21 and 22 show a second example of the potential relation during data writing, respectively.

Selected word line WL4 is set to Vpgm, and unselected word lines WL1 to WL3 at the left side of the word line WL4 are set to Voff, and unselected word lines WL5 to WL7 at the right side of the word line WL4 are set to Vpass.

Voff is the potential required for turning-off memory cells MC31 to MC33, irrespective of the data (threshold) of the memory cells MC31 to MC33. Voff is a value lower than the threshold of cell data "0" (minimum value of the threshold distribution).

Vpass is the potential required for generating the electric conduction path in the selected NAND series NAND3 by turning-on the memory cells MC35 to MC37, irrespective of the data (threshold) of the memory cells MC35 to MC37. Vpgm is the potential required for writing data. In this example, Vpgm, Vpass, and Voff are set to satisfy Vpgm>Vpass>Voff.

Selected select gate line SG3 is set to Von+, and unselected select gate lines SG1, SG2, SG4, and SG5 are set to Voff+. Von+ is the potential required for turning-on select transistors ST31 to ST37, and Voff+ is the potential required for turning-off select transistors ST11 to ST17, ST21 to ST27, ST41 to ST47, and ST51 to ST57.

First read/write line RWL1 is set in a floating state, and second read/write line RWL2 is set to Vref (for example, low potential side power supply potential Vss). First and second erase lines EL1, EL2 are set in a floating state, because they are not used during data writing.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

α1 is Vpass−Vref, being a value exceeding the threshold of the respective memory cells, α21 is Von+−Vpgm, being a value exceeding the threshold of the select transistor, and α3 is Vpgm−Vref, being a value exceeding the potential required for fluctuating the threshold of selected memory cell MC34. For example, when the data recording layer is the charge storage layer, α3 is set to a sufficiently large value for injecting electrons into the data recording layer of selected memory cell MC34.

α4 is for example a difference between the threshold of cell data "0" (maximum value of the threshold distribution), and the threshold of cell data "1" (minimum value of the threshold distribution).

Figure 23:
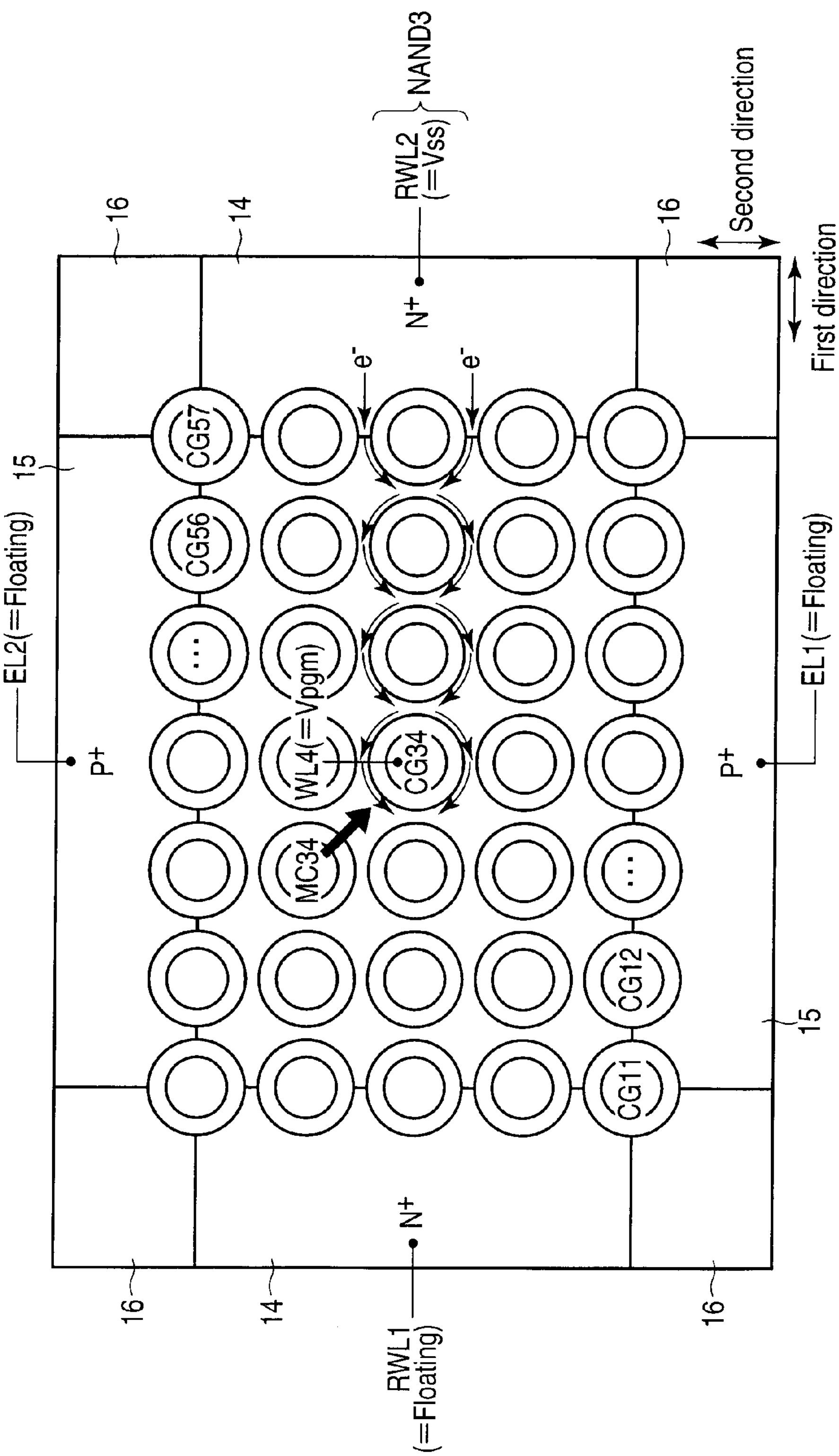
FIG. 23 is a view showing the electric conduction path.

When the potential relation as described above is maintained, for example as shown in FIG. 23, the electric conduction path is generated in the selected NAND series NAND3, and electrons (e−) flow from second read/write line RWL2 to selected memory cell MC34. Further, in selected memory cell MC34, Vpgm−Vref is applied between the control gate CG34 and the channel, and therefore for example as shown in FIG. 20, the electrons are injected into the data recording layer (charge storage layer) 13*b* of selected memory cell MC34.

Accordingly, data is written into selected memory cell MC34.

The second example has an advantage that the write operation can be executed with a low consumption current, because the electric current does not continue to flow to first read/write line RWL1 from second read/write line RWL2.

Further, in the example 2, similarly to the conventional NAND flush memory, writing data (electrons) is supplied to the memory cell MC34 from the second read/write line (corresponding to bit line) RWL2. Therefore, when a write inhibit state is set, for example, second read/write line RWL2 is set to Vinhibit (>Vref), or is set in a floating state, to thereby not allow the electrons to be injected into the data recording layer (charge storage layer) of the memory cell MC34.

A-3. Third Example

FIGS. 24 and 25 show a third example of the potential relation during data writing.

Selected word line WL4 is set to Vpgm, and unselected word lines WL1 to WL3 at the left side of the word line WL4 are set to Voff, and unselected word lines WL5 to WL7 at the right side of the word line WL4 are set to Vpass.

Voff is the potential required for turning-off memory cells MC31 to MC33, irrespective of the data (threshold) of the memory cells MC31 to MC33. Voff is a value lower than the threshold of cell data "0" (minimum value of the threshold distribution).

Vpass is the potential required for generating the electric conduction path in the selected NAND series NAND3 by turning-on the memory cells MC35 to MC37, irrespective of the data (threshold) of the memory cells MC35 to MC37. Vpgm is the potential required for writing data. In this example, Vpgm, Vpass, and Voff are set to satisfy Vpgm>Vpass>Voff.

Selected select gate line SG3 and unselected select gate lines SG2, SG4 at its both sides are set to Von+, and remaining unselected select gate lines SG1, SG5 are set to Voff+. Von+ is the potential required for turning-on select transistors ST21 to ST27, ST31 to ST37, ST41 to ST47, and Voff+ is the potential required for turning-off select transistors ST11 to ST17, and ST51 to ST57. In this example, Von+ and Voff+ are set to satisfy Von+>Voff+.

First read/write line RWL1 is set in a floating state, and second read/write line RWL2 is set to Vref (for example, low potential side power supply potential Vss). First and second erase lines EL1, EL2 are not used during data writing, and therefore are set in a floating state.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

$\alpha$1 is Vpass−Vref, being a value exceeding the threshold of the respective memory cells, $\alpha$21 is Von+−Vpgm, being a value exceeding the threshold of the select transistor, and $\alpha$3 is Vpgm−Vref, being a value exceeding the potential required for fluctuating the threshold of selected memory cell MC34. For example, when the data recording layer is the charge storage layer, $\alpha$3 is set to a sufficiently large value for injecting electrons into the data recording layer of selected memory cell MC34.

$\alpha$4 is for example a difference between the threshold of cell data "0" (maximum value of the threshold distribution), and the threshold of cell data "1" (minimum value of the threshold distribution).

Figure 26:
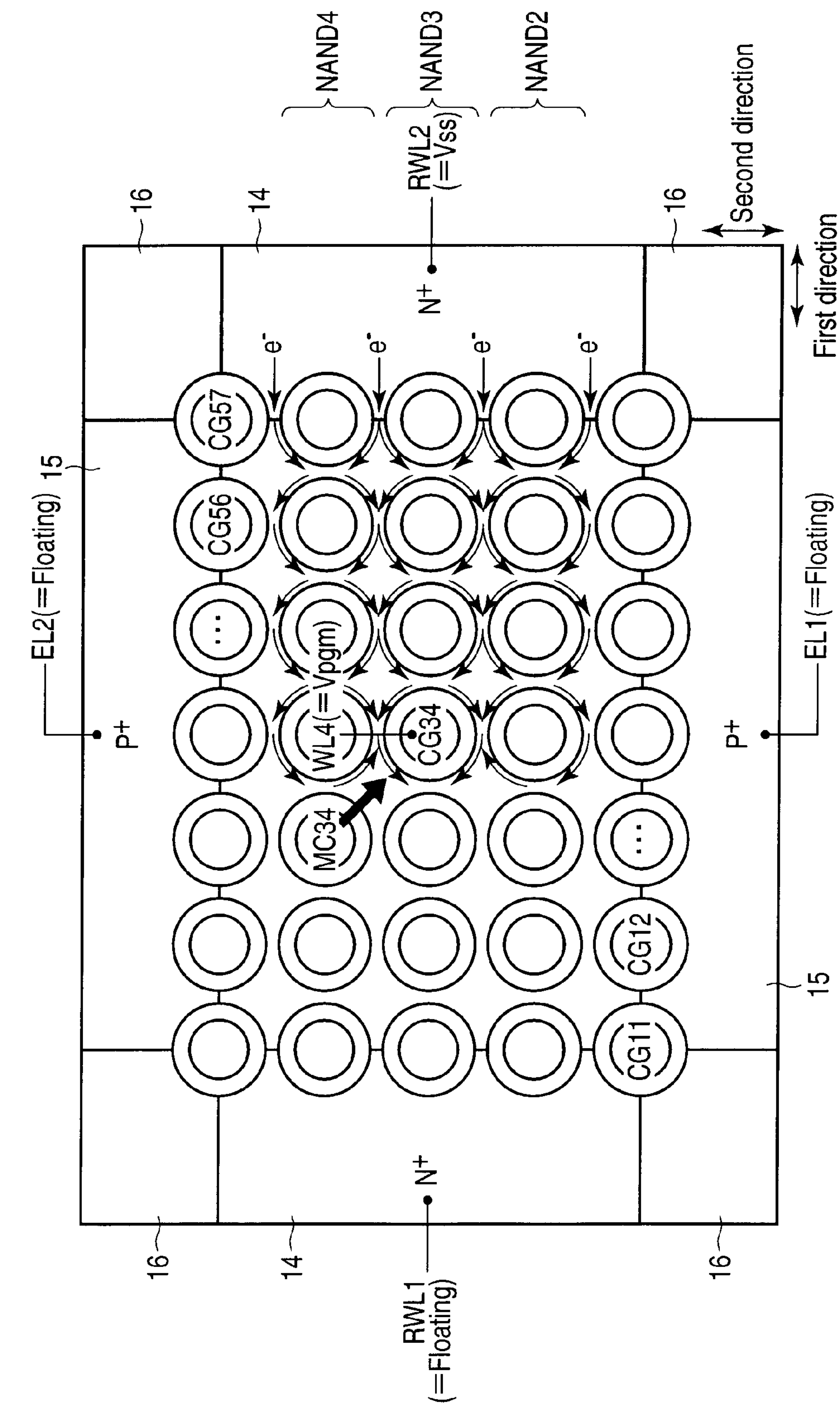
FIG. 26 is a view showing the electric conduction path.

When the potential relation as described above is maintained, for example as shown in FIG. 26, the electric conduction path is generated in the selected NAND series NAND3 and unselected NAND series NAND2, NAND4 at its both sides, and electrons (e−) flow from second read/write line RWL2 to selected memory cell MC34. Further, in selected memory cell MC34, Vpgm−Vref is applied between the control gate CG34 and the channel, and therefore for example as shown in FIG. 20, the electrons are injected into the data recording layer (charge storage layer) 13*b* of selected memory cell MC34.

Accordingly, data is written into selected memory cell MC34.

In the third example, writing data (electrons) is supplied to the memory cell MC34 from the second read/write line (corresponding to bit line) RWL2 through three NAND series NAND2, NAND3, and NAND4, compared with the second example. Therefore, the third example has an advantage that not only the low consumption current, but also a higher speed of writing can be realized, compared with the second example.

When a write inhibit state is set, for example, second read/write line RWL2 is set to Vinhibit (>Vref), or is set in a floating state, to thereby not allow the electrons to be injected into the data recording layer (charge storage layer) of the memory cell MC34.

A-4. Fourth Example

Figure 27:
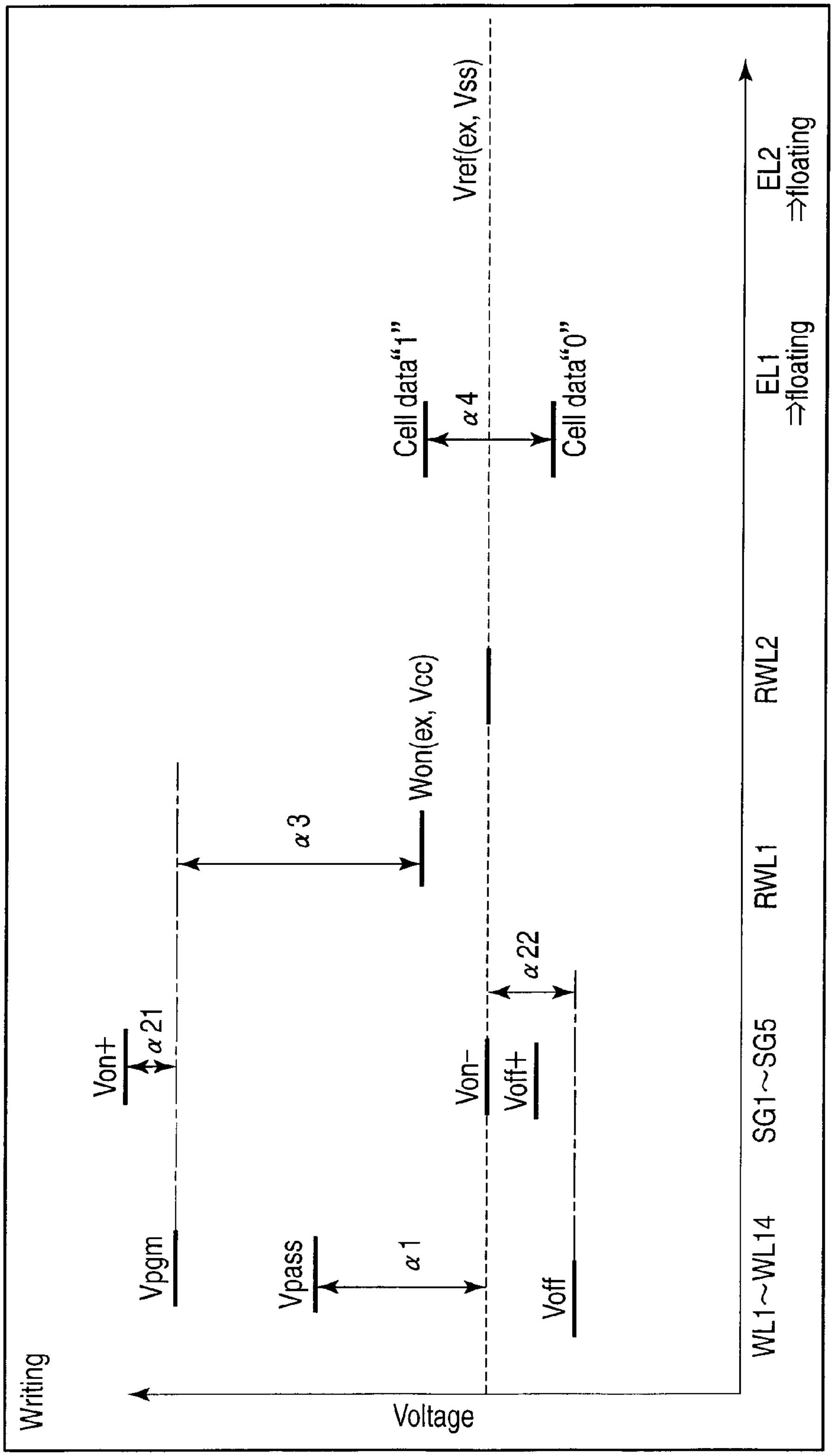

FIGS. 27 and 28 show a fourth example of the potential relation during data writing.

Selected word line WL7 is set to Vpgm, and since the selected word line WL7 is odd-numbered word line, odd-numbered unselected word lines WL1, WL3, WL5, WL9, WL11, WL13 are set to Vpass. Further, even-numbered unselected word lines WL2, WL4, WL6, WL8, WL10, WL12, and WL14 are set to Voff.

Irrespective of the data (threshold) of the respective memory cells, Vpass is the potential required for generating the electric conduction path in the selected NAND series NAND3, and Voff is the potential required for not allowing the electric conduction path to be generated in unselected NAND series NAND2, NAND4, irrespective of the data (threshold) of the respective memory cells. Vpgm is the potential required for writing data. In this example, Vpgm, Vpass, and Voff are set to satisfy Vpgm>Vpass>Voff.

Selected select gate line SG3 is set to Von+, and unselected select gate lines SG2, SG4 at its both sides are set to Von−, and remaining unselected select gate lines SG1, SG5 are set to Voff+.

Von+ is the potential required for turning-on select transistors ST31 to ST37, and Von− is the potential required for turning-on select transistors ST21 to ST27, and ST41 to ST47. Voff+ is the potential required for turning-off select transistors ST11 to ST17, and ST51 to ST57. In this example, Von+, Von−, and Voff+ are set to satisfy Von+>Von−>Voff+.

First read/write line RWL1 is set to Won (for example, high potential side power supply potential Vdd), and second read/write line RWL2 is set to Vref (for example, low potential side power supply potential Vss). For example, Won and Vref are set to satisfy Won>Vref, so that the electric current (electrons) flow to the selected NAND series NAND3, by generating a potential difference between first and second read/write lines RWL1 and RWL2.

The first and second erase lines EL1, EL2 are set in a floating state, because they are not used during data writing.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

$\alpha$1 is Vpass−Vref, being a value exceeding the threshold of the respective memory cells, $\alpha$21 is Von+−Vpgm, $\alpha$22 is Von−−Voff, and they are respectively values exceeding the threshold of the select transistor, and $\alpha$3 is Vpgm−Won, being a value exceeding the potential required for fluctuating the threshold of selected memory cell MC34. For example, when the data recording layer is the charge storage layer, $\alpha$3 is set to a sufficiently large value for injecting the electrons into the data recording layer of selected memory cell MC34.

α4 is a difference between the threshold of cell data "0" (maximum value of the threshold distribution) and the threshold of cell data "1" (minimum value of the threshold distribution).

Figure 29:
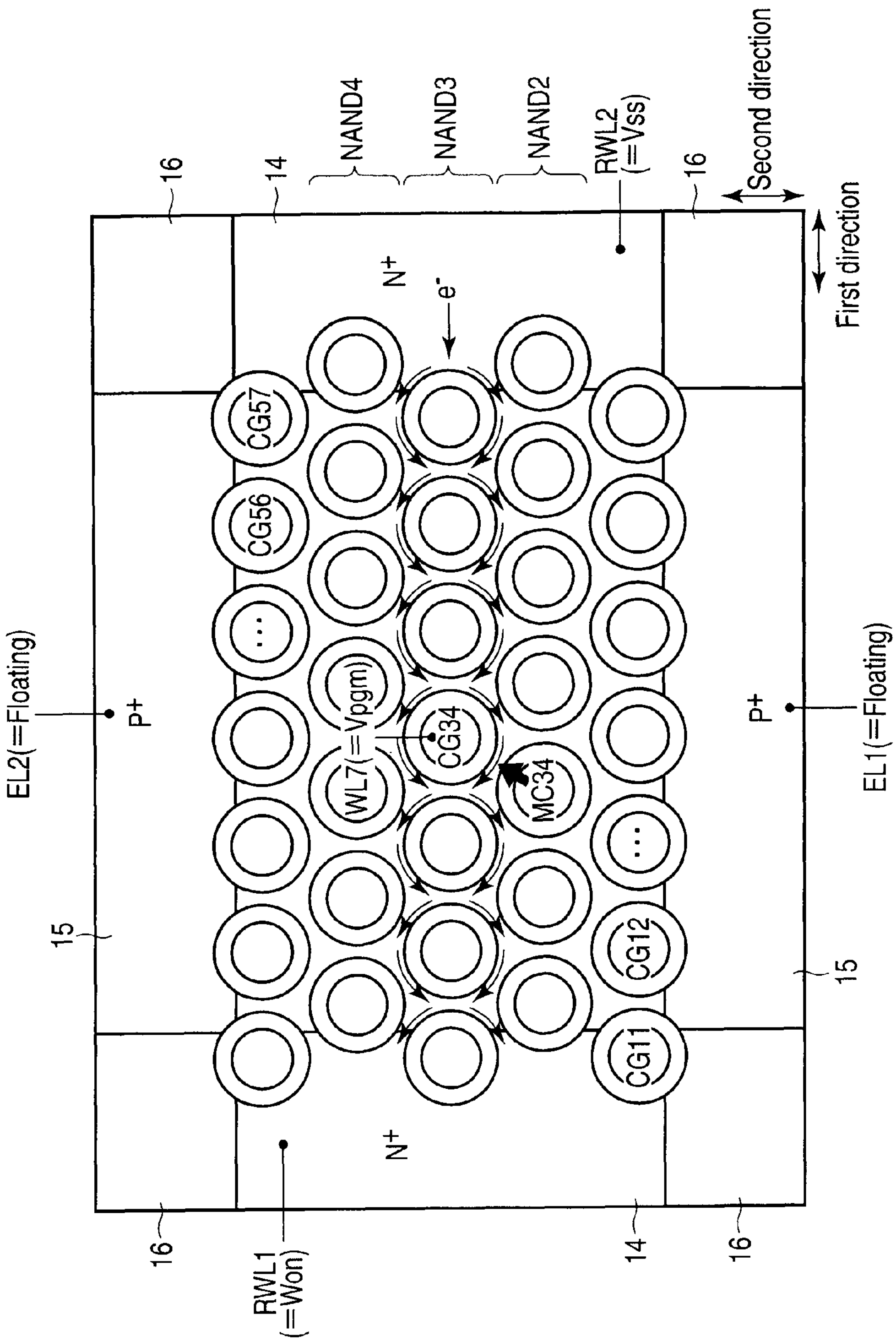
FIG. 29 is a view showing the electric conduction path.
Figure 30:
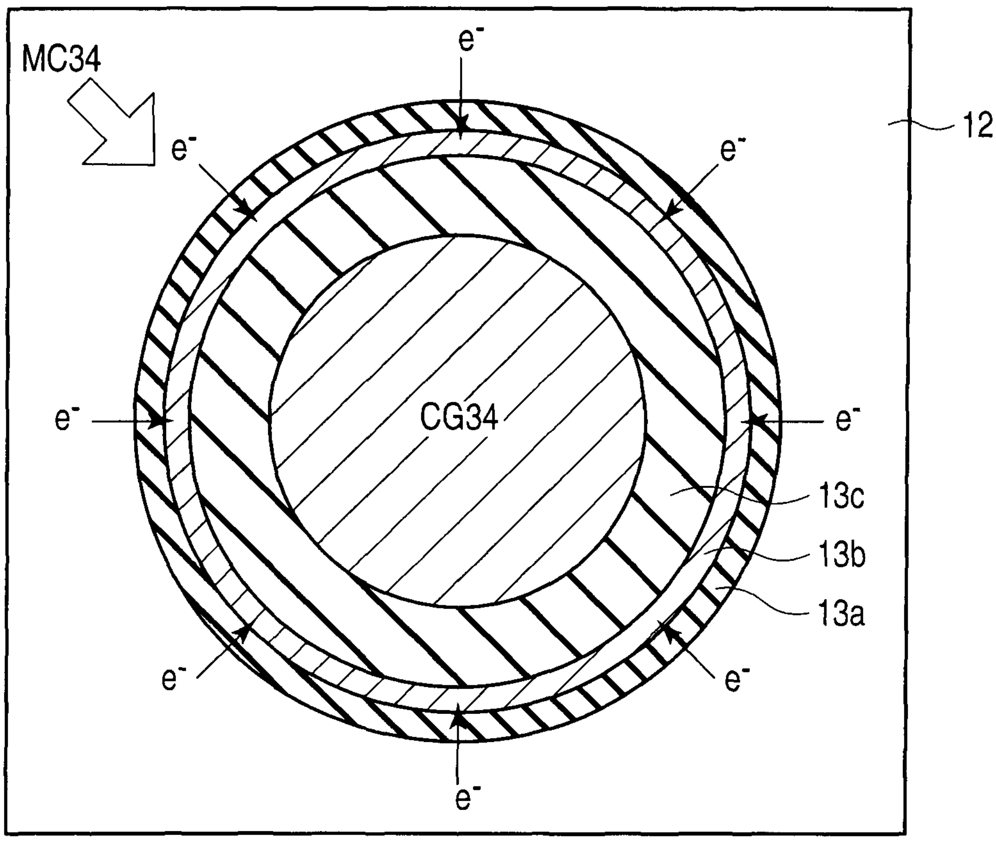
FIG. 30 is a view showing the injection of electrons into the data recording layer.

When the potential relation as described above is maintained, for example as shown in FIG. 29, the electric conduction path is generated in the selected NAND series NAND3, and electrons (e−) flow from second read/write line RWL2 to first read/write line RWL1. Further, in selected memory cell MC34, Vpgm−Won is applied between the control gate CG34 and the channel, and therefore as shown in FIG. 30, the electrons are injected into the data recording layer (charge storage layer) 13*b* of selected memory cell MC34.

Accordingly, data is written into selected memory cell MC34.

A-5. Fifth Example

Figure 31:
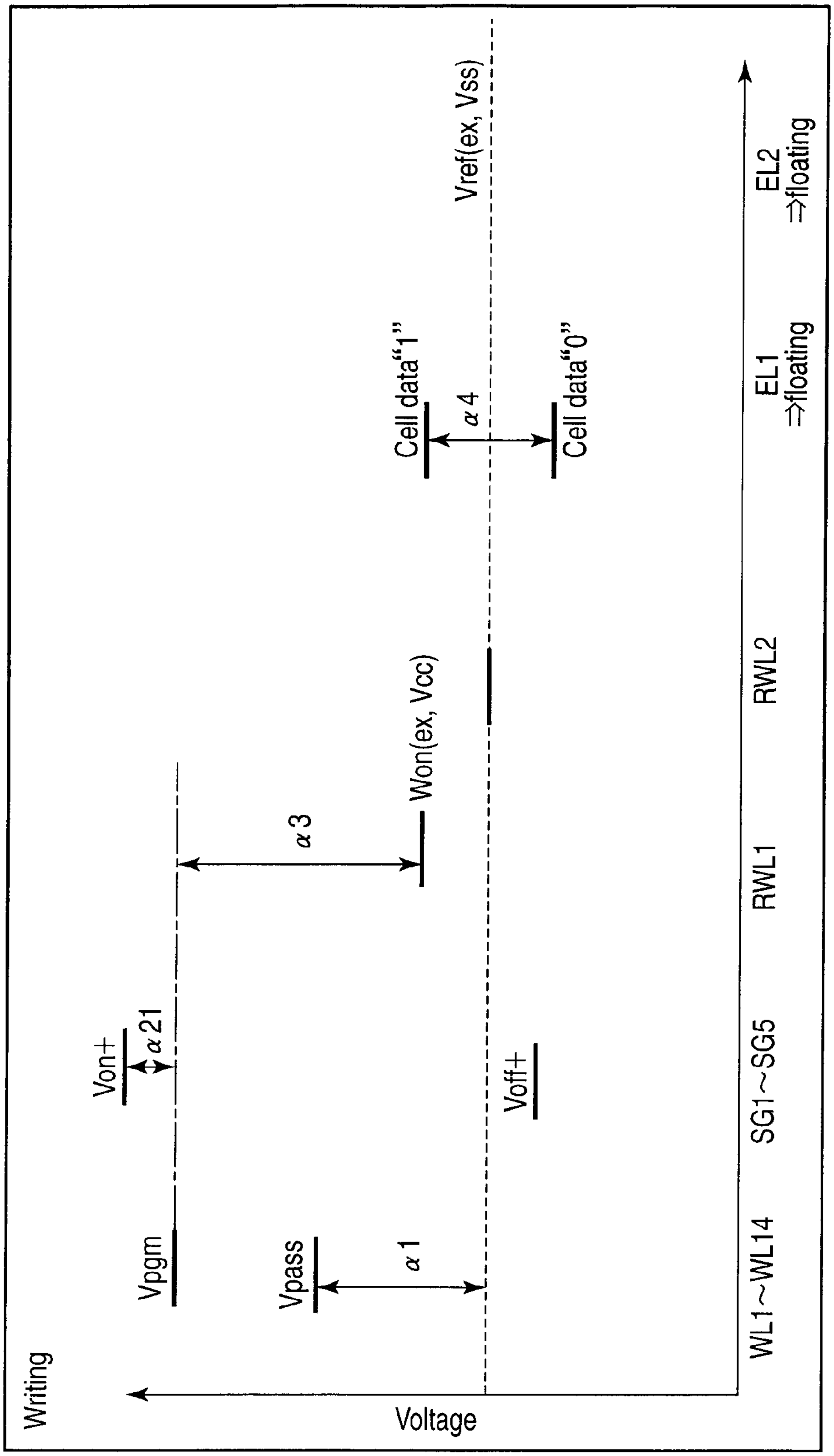

FIGS. 31 and 32 show a fifth example of the potential relation during data writing, respectively.

Selected word line WL7 is set to Vpgm, and unselected word lines WL1 to WL6, and WL8 to WL14 are set to Vpass. Vpass is the potential required for generating the electric conduction path in selected NAND series NAND3 and unselected NAND series NAND2, NAND4 at its both sides, irrespective of the data (threshold) of the memory cell. Vpgm is the potential required for writing data. In this example, Vpgm and Vpass are set to satisfy Vpgm>Vpass.

Selected select gate line SG3 and unselected select gate lines SG2, SG4 at its both sides are set to Von+, and remaining unselected select gate lines SG1, SG5 are set to Voff+. Von+ is the potential required for turning-on select transistors ST21 to ST27, ST31 to ST37, and ST41 to ST47, and Voff+ is the potential required for turning-off select transistors ST11 to ST17, and ST51 to ST57. In this example, Von+ and Voff+ are set to satisfy Von+>Voff+.

First read/write line RWL1 is set to Won, and second read/write line RWL2 is set to Vref. For example, Won and Vref are set to satisfy Won>Vref, so that the electric current (electrons) flow to the selected NAND series NAND3 and the unselected NAND series NAND2, NAND4 at its both sides, by generating the potential difference between first and second read/write lines RWL1 and RWL2.

First and second erase lines EL1, EL2 are set in a floating state, because they are not used during data writing.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

α1 is Vpass−Vref, being a value exceeding the threshold of the respective memory cells, α21 is Von+−Vpgm, being a value exceeding the threshold of the select transistor, and α3 is Vpgm−Won, being a value exceeding the potential required for fluctuating the threshold of selected memory cell MC34. For example, when the data recording layer is the charge storage layer, α3 is set to a sufficiently large value for injecting the electrons into the data recording layer of selected memory cell MC34.

α4 is a difference between the threshold of cell data "0" (maximum value of the threshold distribution) and the threshold of cell data "1" (minimum value of the threshold distribution).

Figure 33:
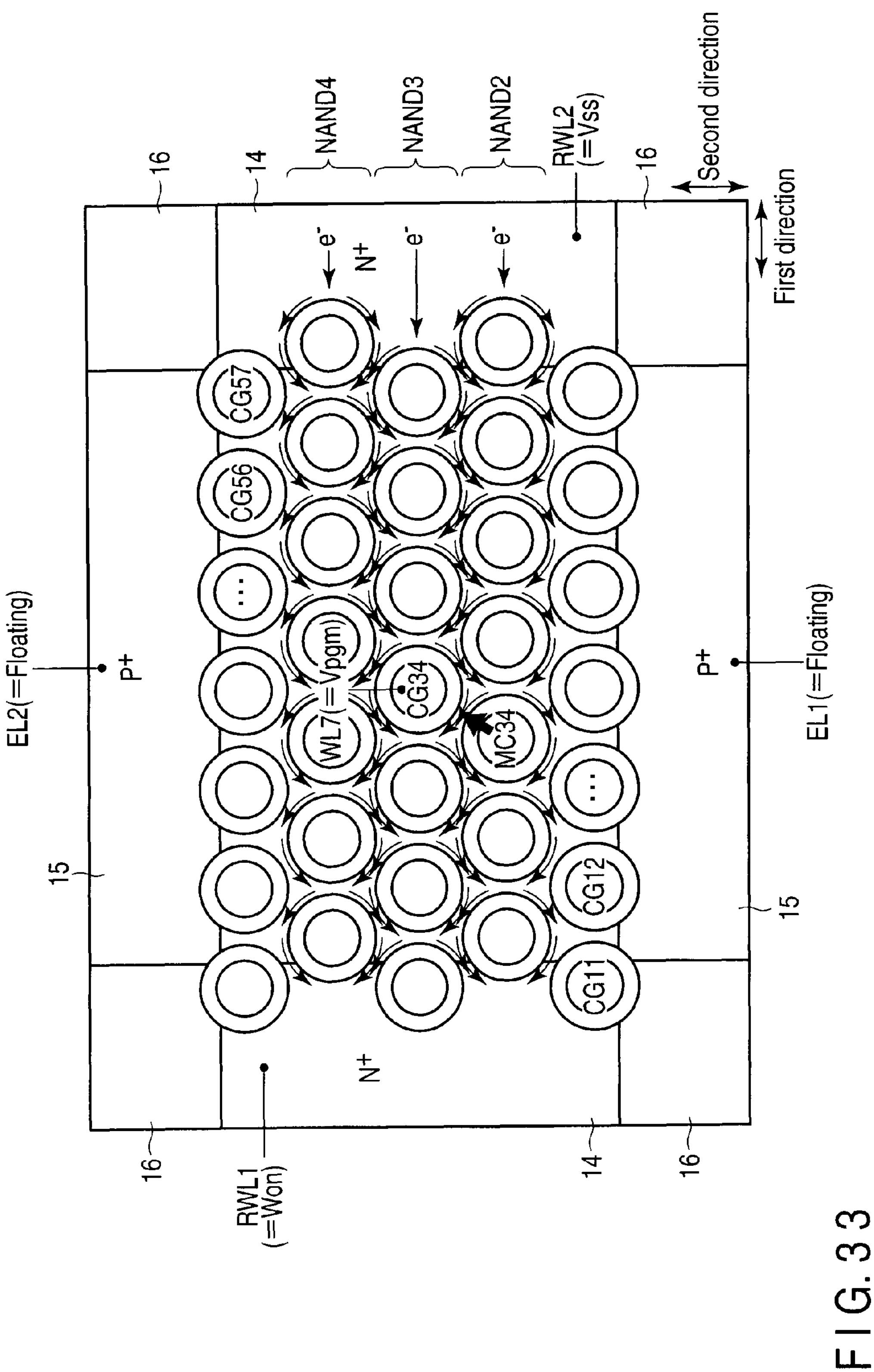
FIG. 33 is a view showing the electric conduction path.

When the potential relation as described above is maintained, for example as shown in FIG. 33, the electric conduction path is generated in the selected NAND series NAND3, and unselected NAND series NAND2, NAND4 at its both sides, and electrons (e−) flow from second read/write line RWL2 to first read/write line RWL1. Further, in selected memory cell MC34, Vpgm−Vref is applied between the control gate CG34 and the channels, and therefore for example, as shown in FIG. 30, the electrons are injected into the data recording layer (charge storage layer) 13*b* of selected memory cell MC34.

Accordingly, data is written into selected memory cell MC34.

The fifth example has an advantage as follows, compared with the fourth example. Namely, writing data (electrons) are supplied to the memory cell MC34 from the second read/write line (corresponding to bit line) RWL2, through three NAND series NAND2, NAND3, and NAND4. Therefore, according to the fifth example, write operation can be executed at a higher speed than the fourth example.

A-6. Sixth Example

Figure 34:
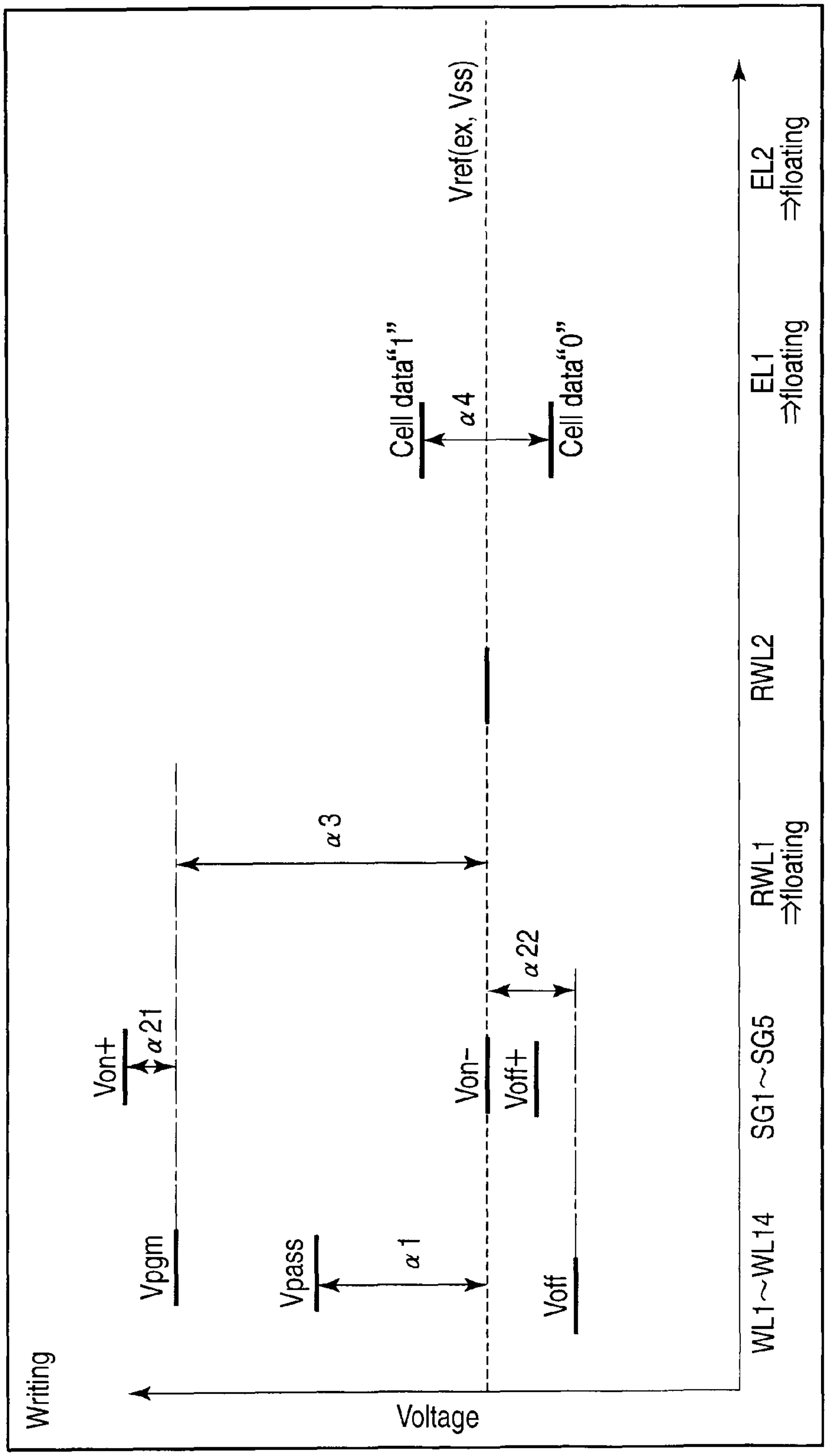
FIG. 34 and FIG. 35 are views showing a sixth example of the potential relation during data writing, respectively.
Figure 35:
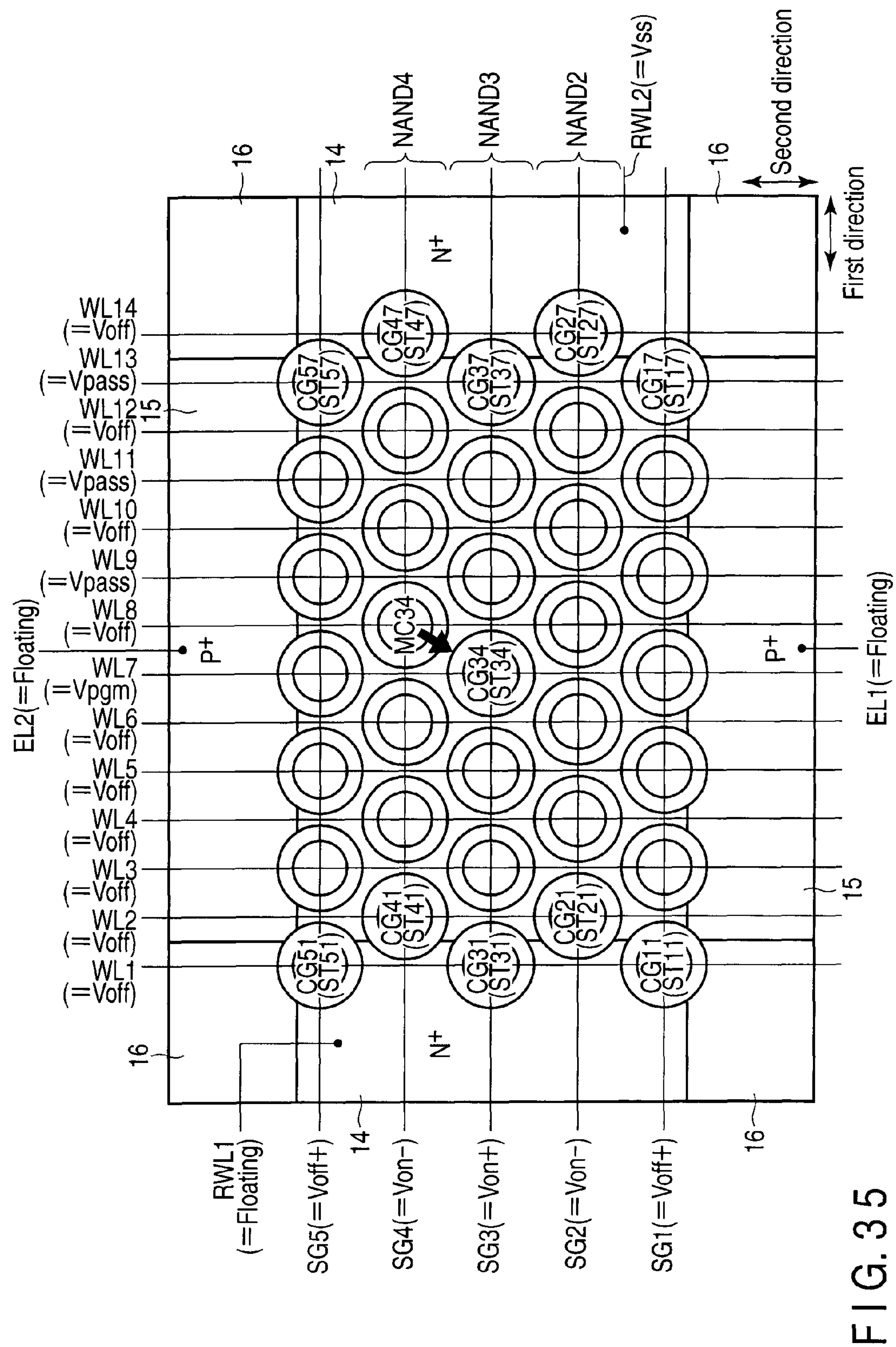

FIGS. 34 and 35 show a sixth example of the potential relation during data writing, respectively.

Selected word line WL7 is set to Vpgm, and unselected word lines WL1 to WL6 at the left side of the word line WL7 are set to Voff. Odd-numbered unselected word lines WL9, WL11, WL13 of the unselected word lines WL8 to WL14 at the right side of the word line WL7 are set to Vpass. Further, even-numbered unselected word lines WL8, WL10, WL12, WL14 of the unselected word lines WL8 to WL14 at the right side of the word line WL7 are set to Voff.

Irrespective of the data (threshold) of the respective memory cells, Vpass is the potential required for generating the electric conduction path in a right half of the selected NAND series NAND3, and Voff is the potential required for not generating the electric conduction path in a left half of the selected NAND series NAND3 and the unselected NAND series NAND2 and NAND4 at its both sides, irrespective of the data (threshold) of the memory cell. Vpgm is the potential required for writing data. In this example, Vpgm, Vpass, and Voff are set to satisfy Vpgm>Vpass>Voff.

Selected select gate line SG3 is set to Von+, and unselected select gate lines SG2, SG4 at its both sides are set to Von−, and remaining unselected select gate lines SG1, SG5 are set to Voff+.

Von+ is the potential required for turning-on the select transistors ST31 to ST37, and Von− is the potential required for turning-on the select transistors ST21 to ST27, and ST41 to ST47. Voff+ is the potential required for turning-off the select transistors ST11 to ST17, and ST51 to ST57. In this example, Von+, Von−, and Voff+ are set to satisfy Von+>Von−>Voff+.

First read/write line RWL1 is set in a floating state, and second read/write lien RWL2 is set to Vref. First and second erase lines EL1, EL2 are set in a floating state, because they are not used during data writing.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

α1 is Vpass−Vref, being a value exceeding the threshold of the memory cell, α21 is Von+−Vpgm, and α22 is Von−−Voff, and they are respectively a value exceeding the threshold of the select transistor, and α3 is Vpgm−Vref, being a value exceeding the potential required for fluctuating the threshold of selected memory cell MC34. For example, when the data recording layer is the charge storage layer, α3 is set to a sufficiently large value for injecting the electrons into the data recording layer of selected memory cell MC34.

α4 is a difference between the threshold of cell data “0” (maximum value of the threshold distribution) and the threshold of cell data “1” (minimum value of the threshold distribution).

When the potential relation as described above is maintained, for example as shown in FIG. 36, the electric conduction path is generated in the selected NAND series NAND3, and electrons (e−) flow from second read/write line RWL2 to selected memory cell MC34. Further, in selected memory cell MC34, Vpgm−Vref is applied between the control gate CG34 and the channel, and therefore for example as shown in FIG. 30, the electrons are injected into the data recording layer (charge storage layer) 13*b* of selected memory cell MC34.

Accordingly, data is written into selected memory cell MC34.

The sixth example has an advantage that data can be written with a low consumption current, because the electric current does not continuously flow from second read/write line RWL2 to first read/write line RWL1 during data writing.

Further, in the sixth example, similarly to the conventional NAND flush memory, writing data (electrons) is supplied to the memory cell MC34 from the second read/write line (corresponding to bit line) RWL2. Therefore, when the write inhibit state is set, for example, second read/write line RWL2 is set to Vinhibit (>Vref), or is set in a floating state, to thereby not allow the electrons to be injected into the data recording layer (charge storage layer) of the memory cell MC34.

A-7. Seventh Example

Figure 37:
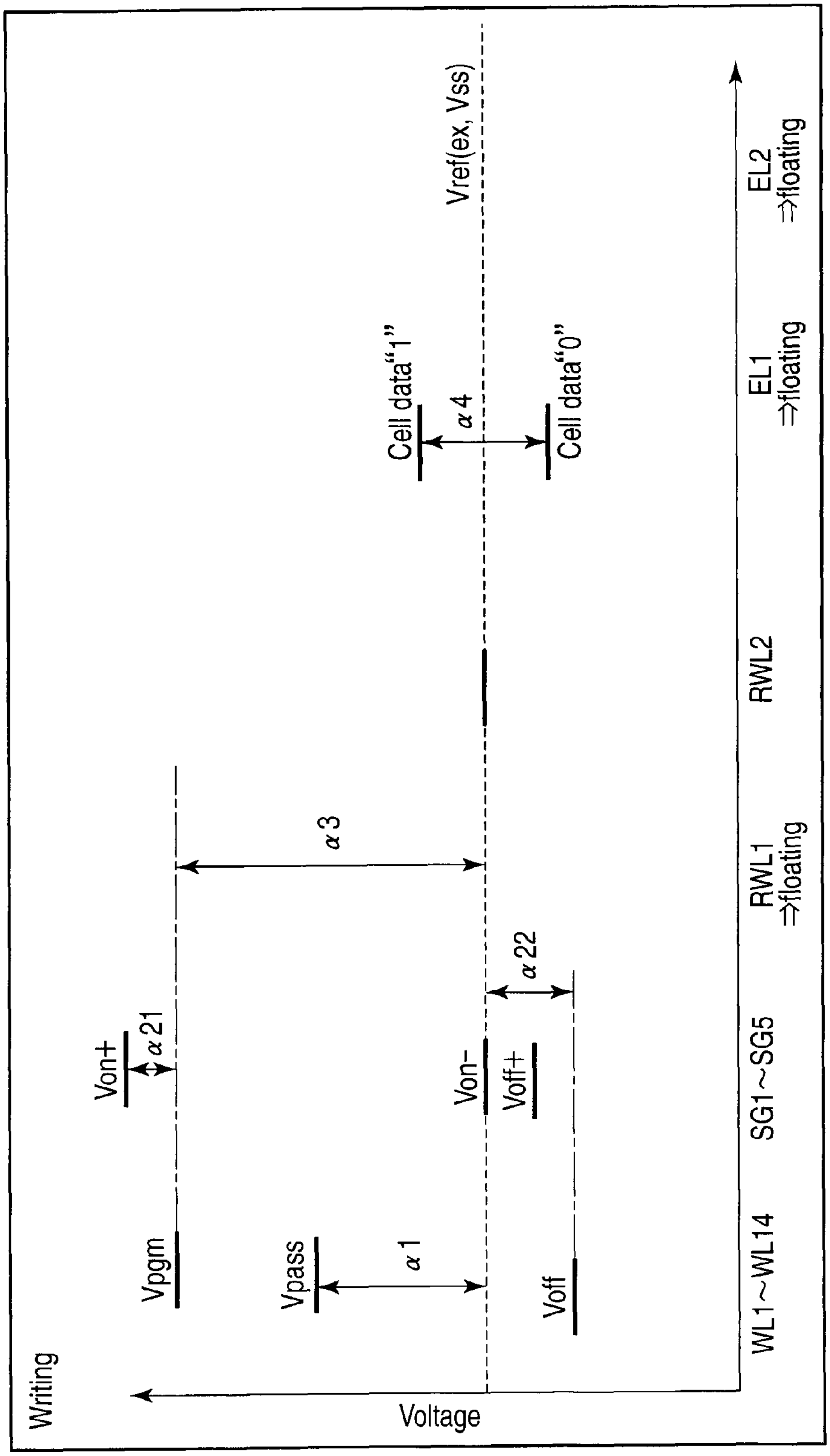
FIG. 37 and FIG. 38 are views showing a seventh example of the potential relation during data writing, respectively.
Figure 38:
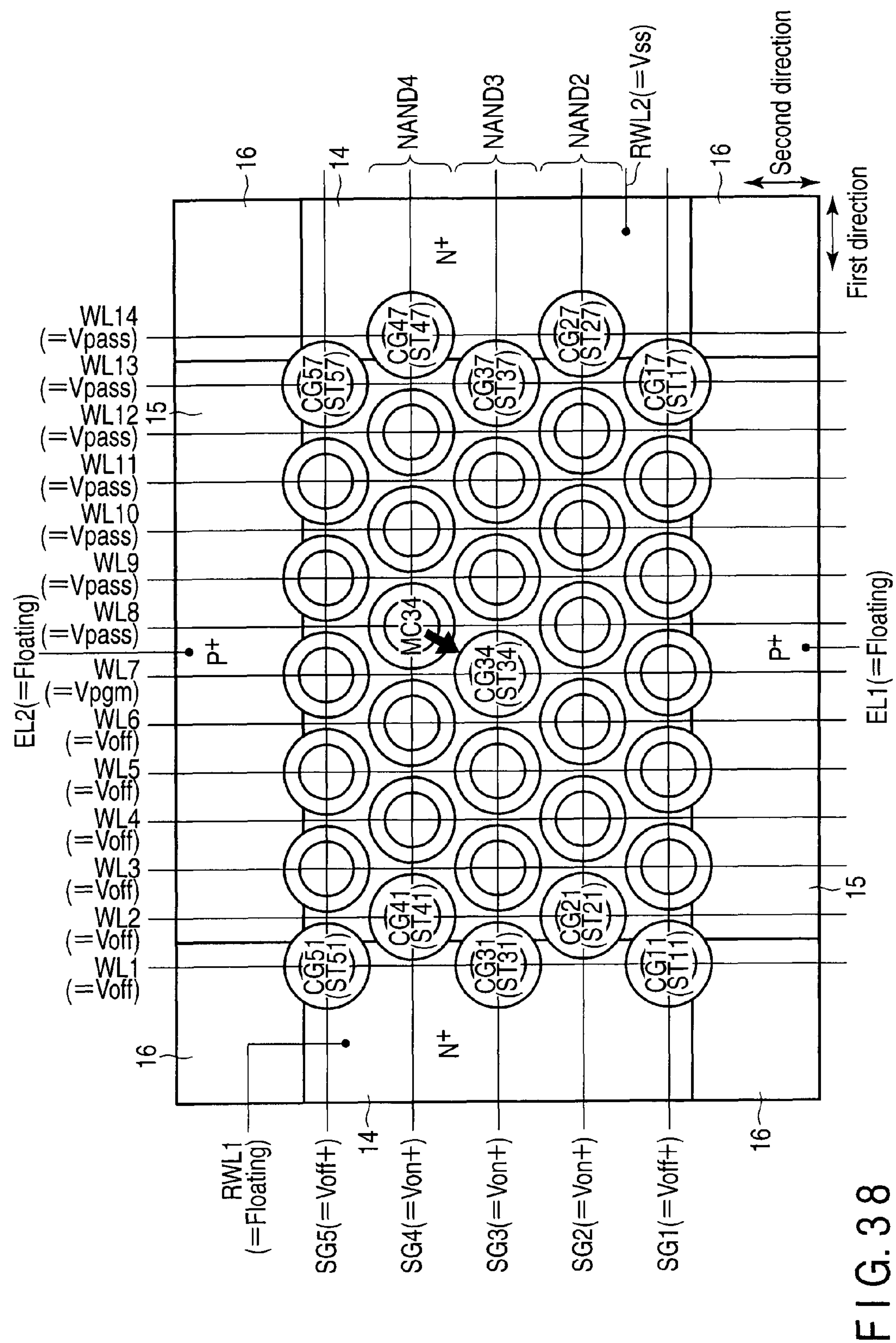

FIGS. 37 and 38 show a seventh example of the potential relation during data writing, respectively.

Selected word line WL7 is set to Vpgm, and unselected word lines WL1 to WL6 at the left side of the word line WL7 are set to Voff. Unselected word lines WL8 to WL14 at the right side of the word line WL7 are set to Vpass.

Irrespective of the data (threshold) of the respective memory cells, Vpass is the potential required for generating the electric conduction path in the right half of the selected NAND series NAND3 and the right half of the unselected NAND series NAND2, NAND4 at its both sides, and Voff is the potential required for not generating the electric conduction path in the left half of the selected NAND series NAND3 and the left half of the unselected NAND series NAND2, NAND4 at its both sides, irrespective of the data (threshold) of the memory cell. Vpgm is the potential required for writing. In this example, Vpgm, Vpass, and Voff are set to satisfy Vpgm>Vpass>Voff.

Selected select gate line SG3 is set to Von+, and unselected select gate lines SG2, SG4 at its both sides are set to Von−, and remaining unselected select gate lines SG1, SG5 are set to Voff+.

Von+ is the potential required for turning-on the select transistors ST31 to ST37, and Von− is the potential required for turning-on the select transistors ST21 to ST27, and ST41 to ST47. Voff+ is the potential required for turning-off the select transistors ST11 to ST17, and ST51 to ST57. In this example, Von+, Von−, and Voff+ are set to satisfy Von+>Von−>Voff+.

First read/write line RWL1 is set in a floating state, and second read/write line RWL2 is set to Vref. First and second erase lines EL1, EL2 are set in a floating state, because they are not used during data writing.

Here, reference potential Vref is set as the center between the threshold of cell data “0” (maximum value of the threshold distribution), and the threshold of cell data “1” (minimum value of the threshold distribution), and specifically, Vref is set as Vss (for example, 0 V).

α1 is Vpass−Vref, being a value exceeding the threshold of the memory cell, α21 is Von+−Vpgm, and α22 is Von−−Voff, and they are respectively a value exceeding the threshold of the select transistor, and α3 is Vpgm−Vref, being a value exceeding the potential required for fluctuating the threshold of selected memory cell MC34. For example, when the data recording layer is the charge storage layer, α3 is set to a sufficiently large value for injecting the electrons into the data recording layer of selected memory cell MC34.

α4 is a difference between the threshold of cell data “0” (maximum value of the threshold distribution) and the threshold of cell data “1” (minimum value of the threshold distribution).

Figure 39:
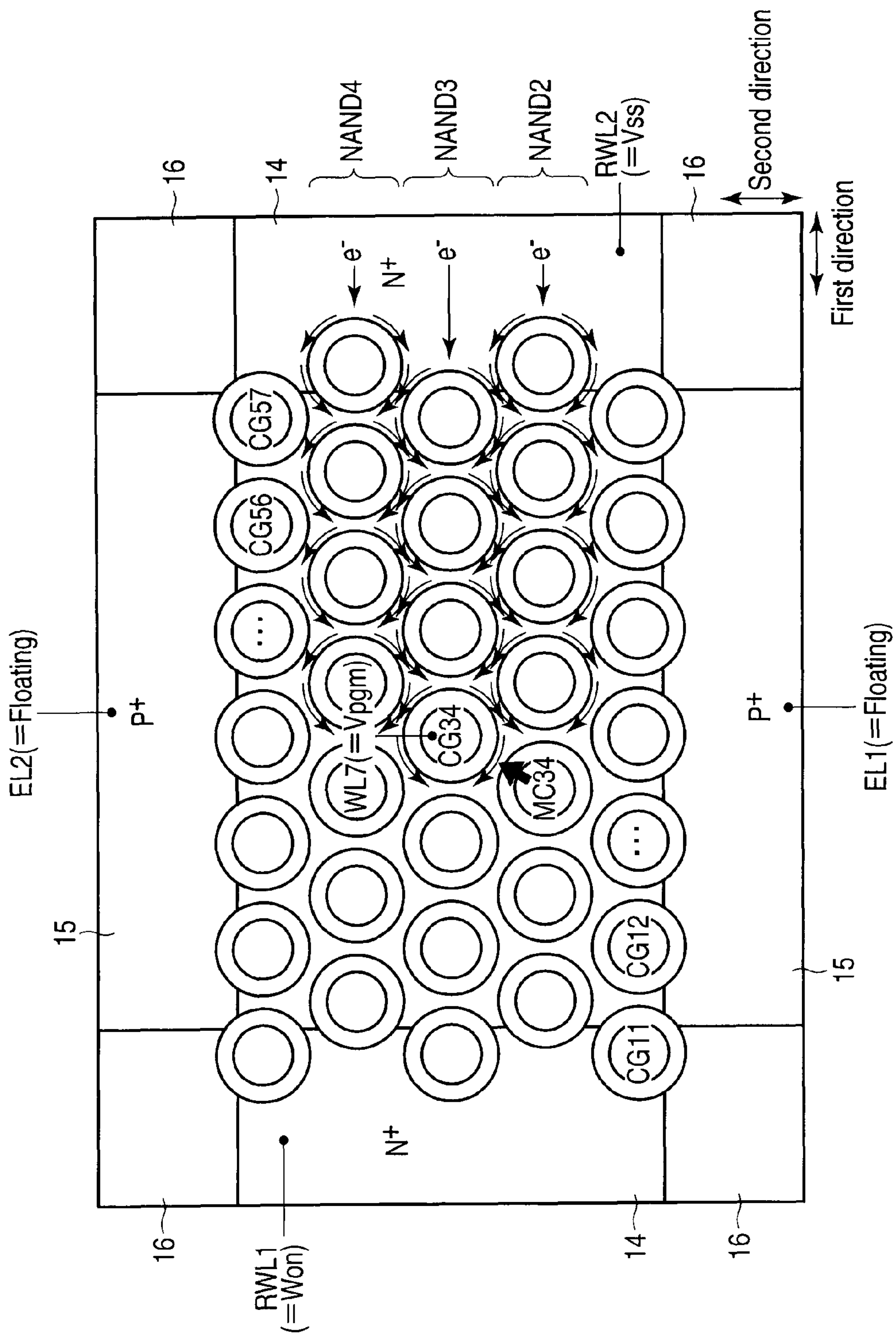
FIG. 39 is a view showing the electric conduction path.

When the potential relation as described above is maintained, for example as shown in FIG. 39, the electric conduction path is generated in the selected NAND series NAND3 and the unselected NAND series NAND2, NAND4 at its both sides, and electrons (e−) flow from second read/write line RWL2 to selected memory cell MC34. Further, in selected memory cell MC34, Vpgm−Vref is applied between the control gate CG34 and the channel, and therefore for example as shown in FIG. 30, the electrons are injected into the data recording layer (charge storage layer) 13*b* of selected memory cell MC34.

Accordingly, data is written into selected memory cell MC34.

The seventh example has an advantage as follows, compared with the sixth example. Namely, writing data (electrons) is supplied to the memory cell MC34 from the second read/write line (corresponding to bit line) RWL2, through three NAND series NAND2, NAND3, and NAND4. Therefore, according to the example 7, write operation can be executed at a higher speed than the sixth example.

Further, when the write inhibit state is set, for example, second read/write line RWL2 is set to Vinhibit (>Vref), or is set in a floating state, to thereby not allow the electrons to be injected into the data recording layer (charge storage layer) of the memory cell MC34.

B. Read Operation

Read operation is executed to one memory cell in the selected NAND series. In this example, explanation will be given for an example of executing data reading to the memory cell MC34 in the NAND series NAND3.

A first example given hereafter shows a basic read operation executed to the memory cell array according to a first basic structure (FIGS. 1 to 4), and a second example given hereafter shows a basic read operation executed to the memory cell array according to a second basic structure (FIG. 5 to FIG. 9).

B-1. First Example

FIGS. 40 to 45 show the read operation executed to the memory cell array according to the first basic structure. The read operation is executed by first and second steps as described below.

B-1-1. First Step

Figure 40:
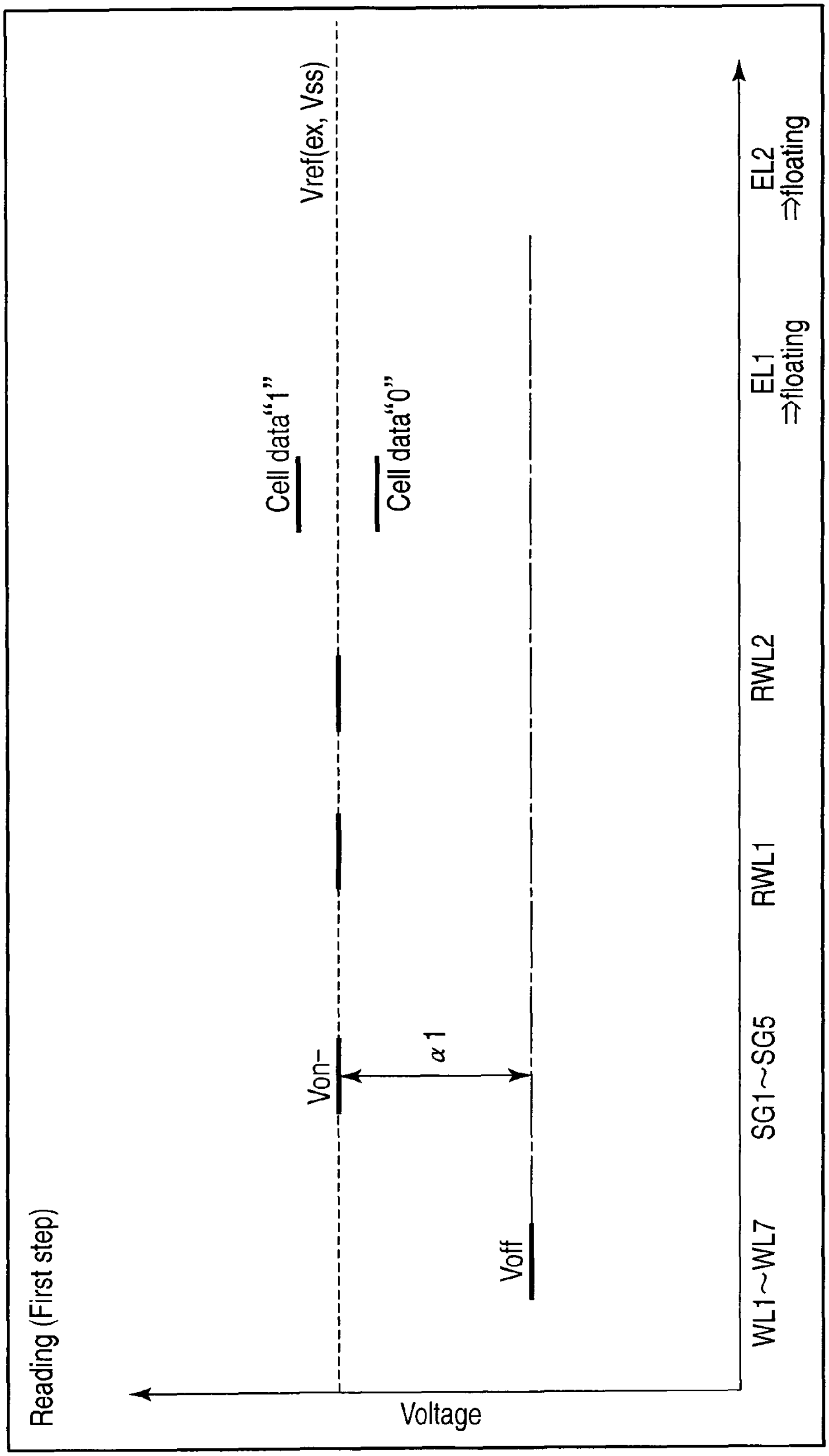
FIG. 40 and FIG. 41 are views showing a first example of the potential relation in a first step of reading, respectively.
Figure 41:
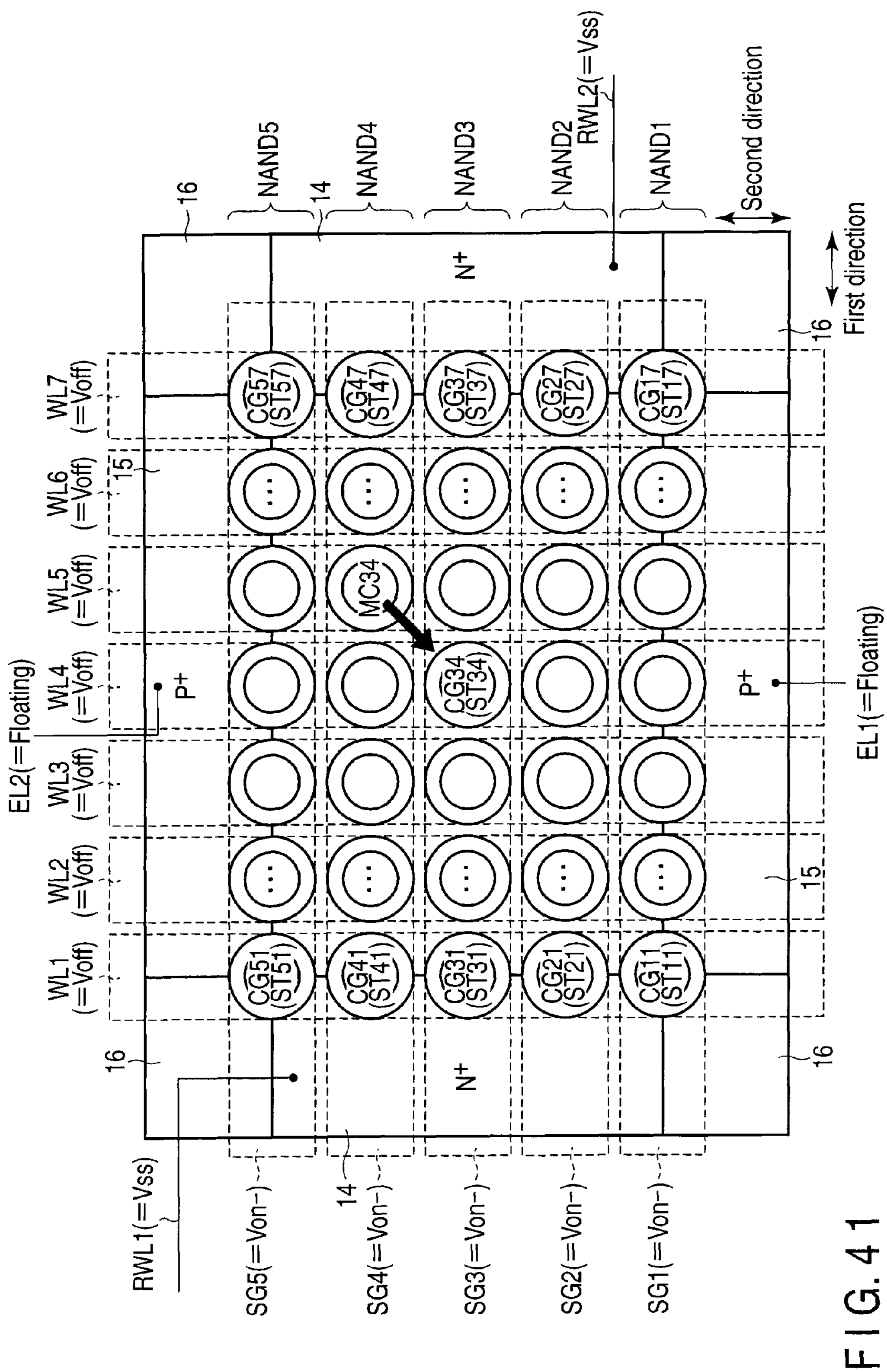

FIGS. 40 and 41 show the potential relation of the first step, respectively.

The first step is executed for the purpose of setting the control gates of all memory cells in the unselected NAND series, to potential Voff for not executing the read operation to the unselected NAND series.

All word lines WL1 to WL7 are set to Voff. Voff is the potential required for not generating the electric conduction path in the unselected NAND series NAND1, NAND2, NAND4, and NAND5, irrespective of the data (threshold) of the memory cell.

All select gate lines SG1 to SG5 are set to Von−. Von− is the potential required for turning-on all select transistors ST11 to ST57. Namely, α1 (=Von−−Voff) is a value exceeding the threshold of the select transistor. Von− is equal to Vref for example, and Voff is a minus potential for example.

First read/write line RWL1 is set to Vref (for example, low potential side power supply potential Vss). First and second erase lines EL1, EL2 are set in a floating state, because they are not used during data reading.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

When the potential relation as described above is maintained, control gates CG11 to CG57 of all memory cells in all NAND series NAND1 to NAND5 are set to potential Voff for not generating the electric conduction path in the NAND series NAND1 to NAND5.

B-1-2. Second Step

FIGS. 42 and 43 show the potential relation of the second step.

In the second step, data read operation is executed to selected memory cell MC34 in the selected NAND series NAND3.

Selected word line WL4 is set to Vref, and unselected word lines WL1 to WL3, and WL5 to WL7 are set to Vread.

Vref is the potential required for discriminating the data of the memory cell MC34, by turning-on/off the memory cell MC34, in accordance with the data (threshold) of selected memory cell MC34. Vread is the potential required for turning-on the unselected memory cell, irrespective of the data (threshold) of the unselected memory cell in the selected NAND series NAND3.

Namely, α1 (=Vread−Ron) is set to a value exceeding the threshold of the memory cell. Further, in this example, Vread and Vref are set to satisfy Vread>Vref.

Selected select gate line SG3 is set to Von+, and remaining unselected select gate lines SG1, SG2, SG4, and SG5 are set to Voff+.

Von+ is the potential required for turning-on the select transistors ST31 to ST37. Namely, α2 (=Von+−Ron) is set to a value exceeding the threshold of the select transistor. Voff+ is the potential required for turning-off select transistors ST11 to ST17, ST21 to ST27, ST41 to ST47, and ST51 to ST57. In this example, Von+ and Voff+ are set to satisfy Von+>Voff+.

First read/write line RWL1 is set to Ron (for example, high potential side power supply potential Vdd), and second read/write line RWL2 is set to Vref (for example, low potential side power supply potential Vss). In this example, Ron and Vref are set to satisfy Ron>Vref. First and second erase lines EL1, EL2 are set in a floating state, because they are not used during data reading.

When the above-described potential relation is maintained, control gates CG11 to CG27, and CG41 to CG57 of the memory cells in the unselected NAND series NAND1, NAND2, NAND4, and NAND5 are set to Voff and in a floating state. Therefore, the electric conduction path is not generated in the unselected NAND series NAND1, NAND2, NAND4, and NAND5.

Further, control gates CG31 to CG33, and CG35 to CG37 of the unselected memory cell in the selected NAND series NAND3 are set to Vread, being the potential required for generating the electric conduction path in the NAND series NAND3. Therefore, whether or not the electric conduction path is formed from second read/write line RWL2 to first read/write line RWL1, is determined by turning on/off selected memory cell MC34.

Figure 44:
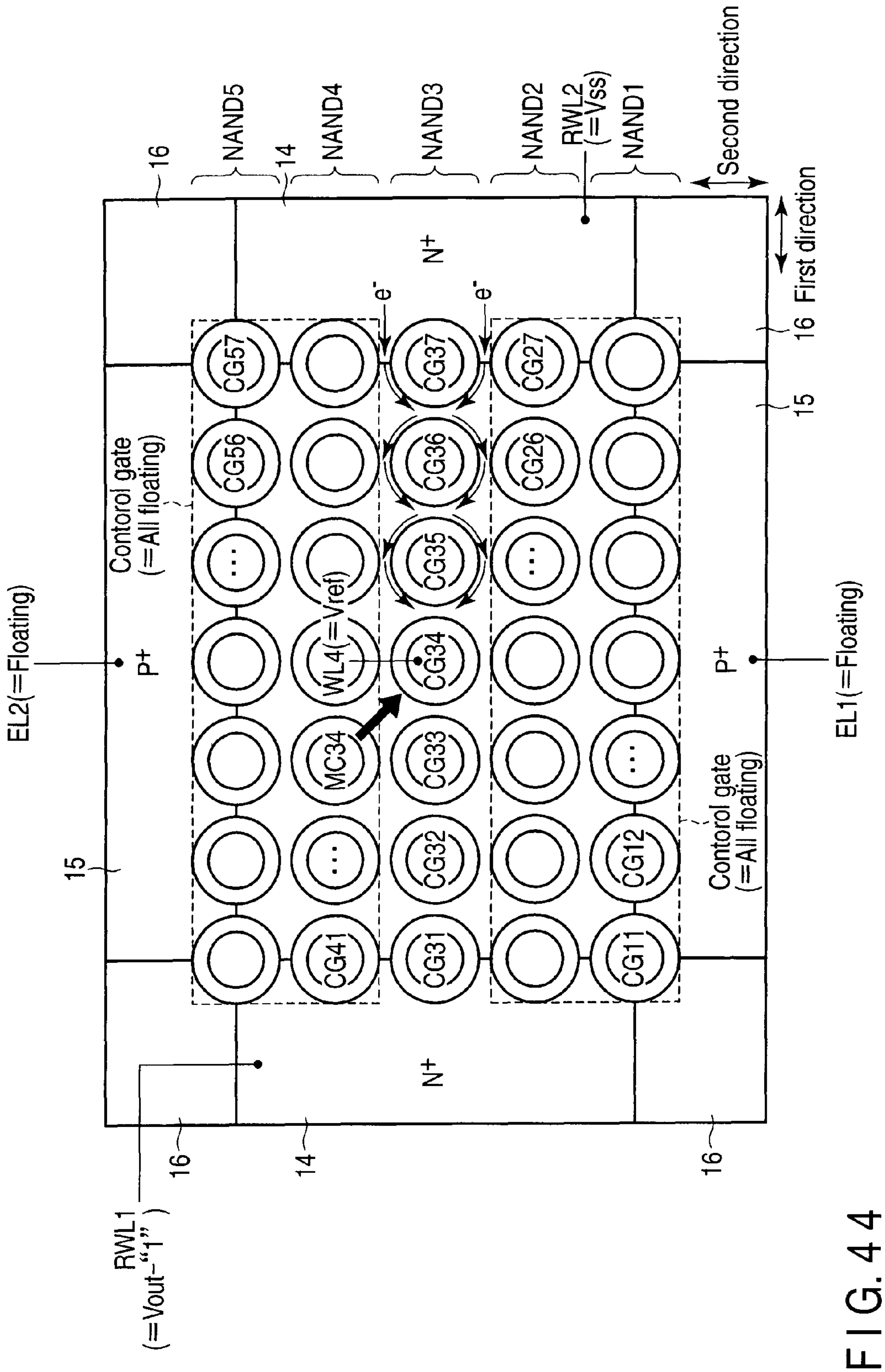

For example, when the data of the memory cell MC34 is "1" (high threshold), the memory cell MC34 is set in OFF state. Therefore, for example, as shown in FIG. 44, the electric conduction path of electrons from second read/write line RWL2 to first read/write line RWL1 is cut by the memory cell MC34. Accordingly, Ron (=Rout−"1") is maintained as the potential of first read/write line RWL1.

Accordingly, when the data of the memory cell MC34 is "0" (low threshold), the memory cell MC34 is set in ON state. Therefore, for example as shown in FIG. 45, the electric conduction path of electrons from second read/write line RWL2 to first read/write line RWL1 is generated in the selected NAND series NAND3. Accordingly, the potential of first read/write line RWL1 is changed from Ron to Vref (=Rout−"0").

Thus, when a potential change of first read/write line RWL1 is sensed by a sense amplifier, the data of the memory cell MC34 can be discriminated.

B-2. Second Example

FIGS. 46 to 52 show a read operation executed to the memory cell array according to a second basic structure. The read operation is executed by the following first and second steps.

B-2-1. First Step

Figure 46:
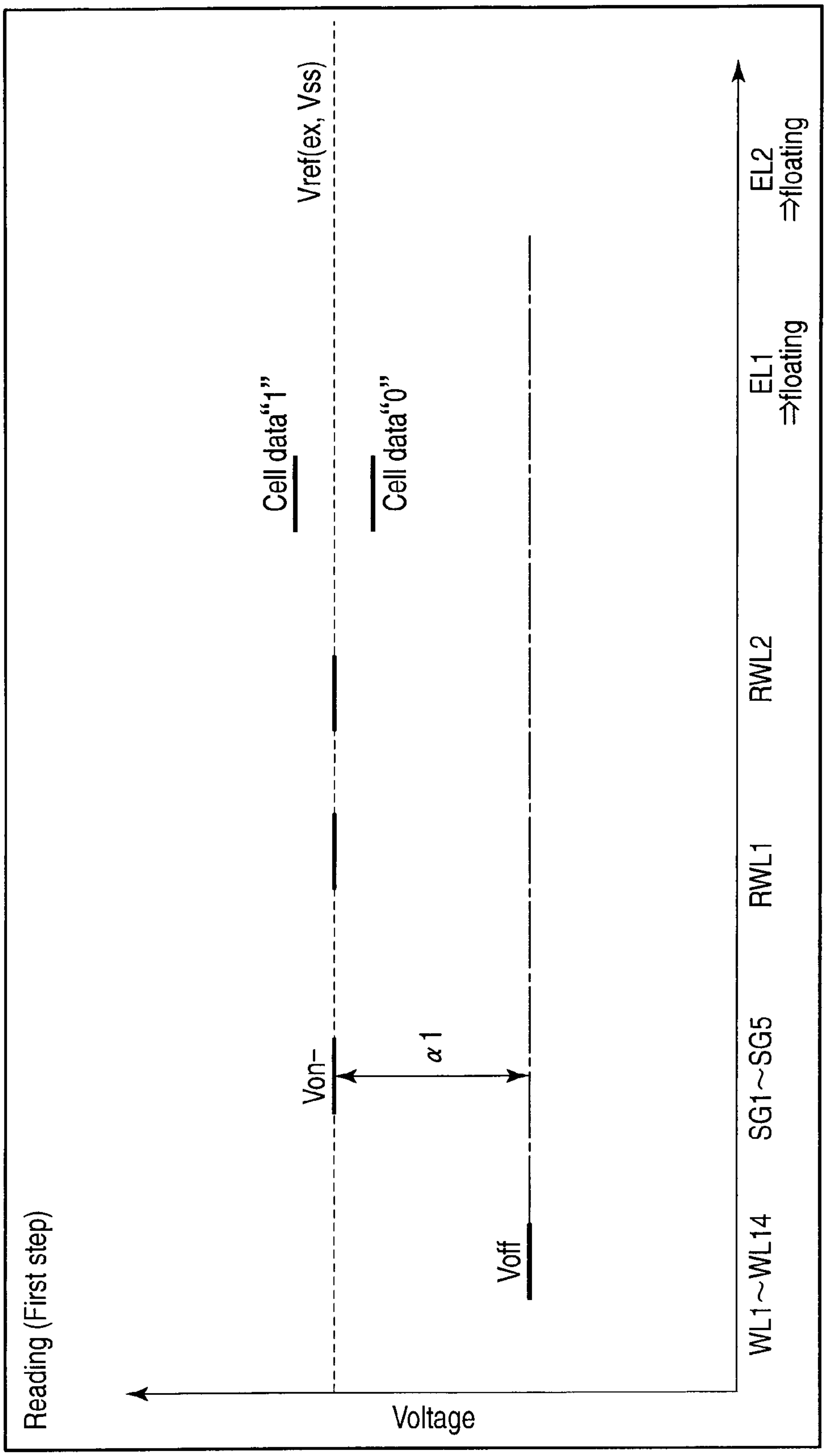
FIG. 46 is a view showing a second example of the potential relation in the first step of reading.

FIGS. 46 and 47 show the potential relation of the first step.

The first step is executed for the purpose of setting the control gates of all memory cells in the unselected NAND series, to potential Voff for not executing the read operation to the unselected NAND series.

All word lines WL1 to WL14 are set to Voff. Voff is the potential required for not generating the electric conduction path in the unselected NAND series NAND1, NAND2, NAND4, and NAND5, irrespective of the data (threshold) of the memory cell.

All select gate lines SG1 to SG5 are set to Von−. Von− is the potential required for turning-on all select transistors ST11 to ST57. Namely, α1 (=Von−−Voff) is a value exceeding the threshold of the select transistor. Von− is equal to Vref for example, and Voff is a minus potential for example.

First read/write line RWL1 is set to Vref (for example, low potential side power supply potential Vss). First and second erase lines EL1 and EL2 are set in a floating state, because they are not used during data reading.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

When the above-described potential relation is maintained, control gates CG11 to CG57 of all memory cells in all NAND series NAND1 to NAND5 are set to potential Voff for not generating the electric conduction path in the NAND series NAND1 to NAND5.

B-2-2. Second Step

FIGS. 48 and 49 show the potential relation of a second step.

In the second step, data reading is executed to selected memory cell MC34 in the selected NAND series NAND3.

Selected word line WL7 is set to Vref. Further, since the selected word line WL7 is the odd-numbered word line, the odd-numbered unselected word lines WL1, WL3, WL5, WL9, WL11, WL13 are set to Vread. Further, the even-numbered unselected word lines WL2, WL4, WL6, WL8, WL10, WL12, and WL14 are set to Voff.

Vref is the potential required for discriminating the data of the memory cell MC34 by turning on/off the memory cell MC34, in accordance with the data (threshold) of selected memory cell MC34. Vread is the potential required for turning-on the unselected memory cell, irrespective of the data (threshold) of the unselected memory cell in the selected NAND series NAND3.

Namely, $\alpha 1$ (=Vread−Ron) is set to a value exceeding the threshold of the memory cell.

Voff is the potential required for turning-off the unselected memory cell, irrespective of the data (threshold) of the unselected memory cell in two unselected NAND series NAND2, NAND4 at both sides of the selected NAND series NAND3.

Further, in this example, Vread, Vref, and Voff are set to satisfy Vread>Vref>Voff.

Selected select gate line SG3 is set to Von+, and unselected select gate lines SG2, SG4 at its both sides are set to Von−, and remaining unselected select gate lines SG1, SG5 are set to Voff+.

Von+ is the potential required for turning-on the select transistors ST31 to ST37. Namely, $\alpha 2$ (=Von+−Vread) is set to a value exceeding the threshold of the select transistor. Von− is the potential required for turning-on the select transistors ST21 to ST27, and ST41 to ST47. Namely, $\alpha 3$ (=Von−−Voff) is set to a value exceeding the threshold of the select transistor.

Voff+ is the potential required for turning-off the select transistors ST11 to ST17, and ST51 to ST57. In this example, Von+, Von−, and Voff+ are set to satisfy Von+>Von−>Voff+.

First read/write line RWL1 is set to Ron (for example, high potential side power supply potential Vdd), and second read/write line RWL2 is set to Vref (for example, low potential side power supply potential Vss). In this example, Ron and Vref are set to satisfy Ron>Vref. First and second erase lines EL1 and EL2 are set in a floating state, because they are not used during data reading.

When the above-described potential relation is maintained, control gates CG11 to CG17, and CG51 to CG57 of the memory cells in the unselected NAND series NAND1, NAND5 are set to Voff and in a floating state. Therefore, the electric conduction path is not generated in the unselected NAND series NAND1 and NAND5.

Further, Voff is continued to be applied to the control gates CG21 to CG27, and CG41 to CG47 of the memory cells in two unselected NAND series NAND2 and NAND4 at both sides of the selected NAND series NAND3. Therefore, the electric conduction path is not generated in the unselected NAND series NAND2 and NAND4.

Further, control gates CG31 to CG33, and CG35 to CG37 of the unselected memory cell in the selected NAND series NAND3 are set to potential Vread for generating the electric conduction path in the NAND series NAND3. Therefore, whether or not the electric conduction path is formed from second read/write line RWL2 to first read/write line RWL1, is determined by turning-on/off selected memory cell MC34.

Figure 50:
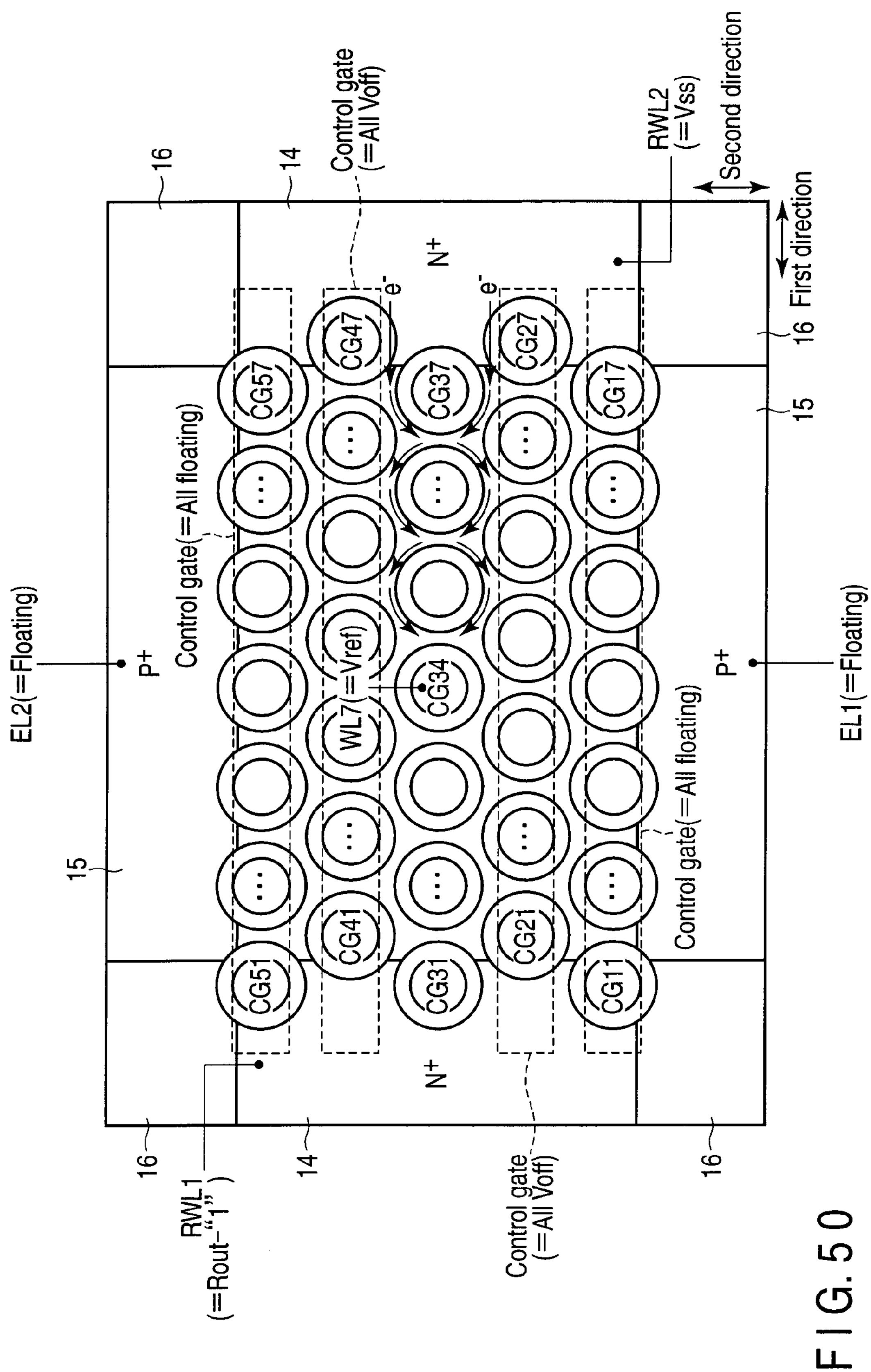
FIG. 50 and FIG. 51 are views showing the electric conduction path, respectively.

For example, when the data of the memory cell MC34 is "1" (high threshold), the memory cell MC34 is set in OFF state. Therefore, as shown in FIG. 50, the electric conduction path of electrons from second read/write line RWL2 to first read/write line RWL1 is cut by the memory cell MC34. Accordingly, Ron (−Rout−"1") is maintained as the potential of first read/write line RWL1.

Figure 51:
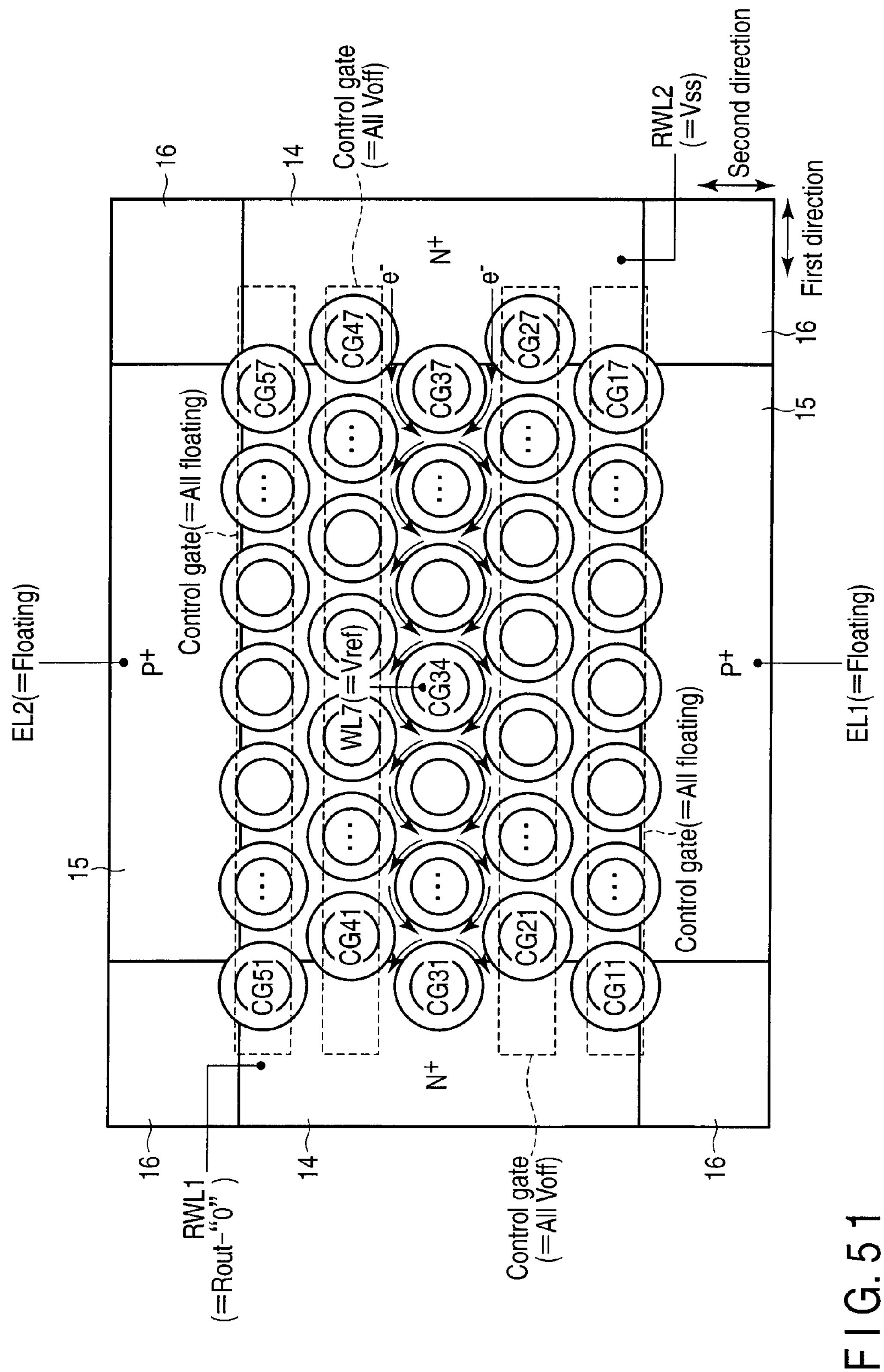

Further, when the data of the memory cell MC34 is "0" (low threshold), the memory cell MC34 is set in ON state. Therefore, for example as shown in FIG. 51, the electric conduction path of electrons from second read/write line RWL2 to first read/write line RWL1 is generated in the selected NAND series NAND3. Accordingly, the potential of first read/write line RWL1 is changed from Ron to Vref (=Rout−"0").

Thus, if the potential change of first read/write line RWL1 is sensed by the sense amplifier, the data of the memory cell MC34 can be discriminated.

An important point here is that Voff is continued to be applied to the control gates CG21 to CG27, and CG41 to CG47 of the memory cells in the unselected NAND series NAND2, NAND4 at both sides of the selected NAND series NAND3, during data reading.

In the first basic structure, control gates CG21 to CG27, and CG41 to CG47 of the memory cells in the unselected NAND series NAND2, NAND4 at both sides of the selected NAND series NAND3 are set in a floating state, and therefore the potential rises from Voff to a larger potential by capacity coupling, thus possibly having an adverse influence on the reading from the selected NAND series NAND3.

Figure 52:
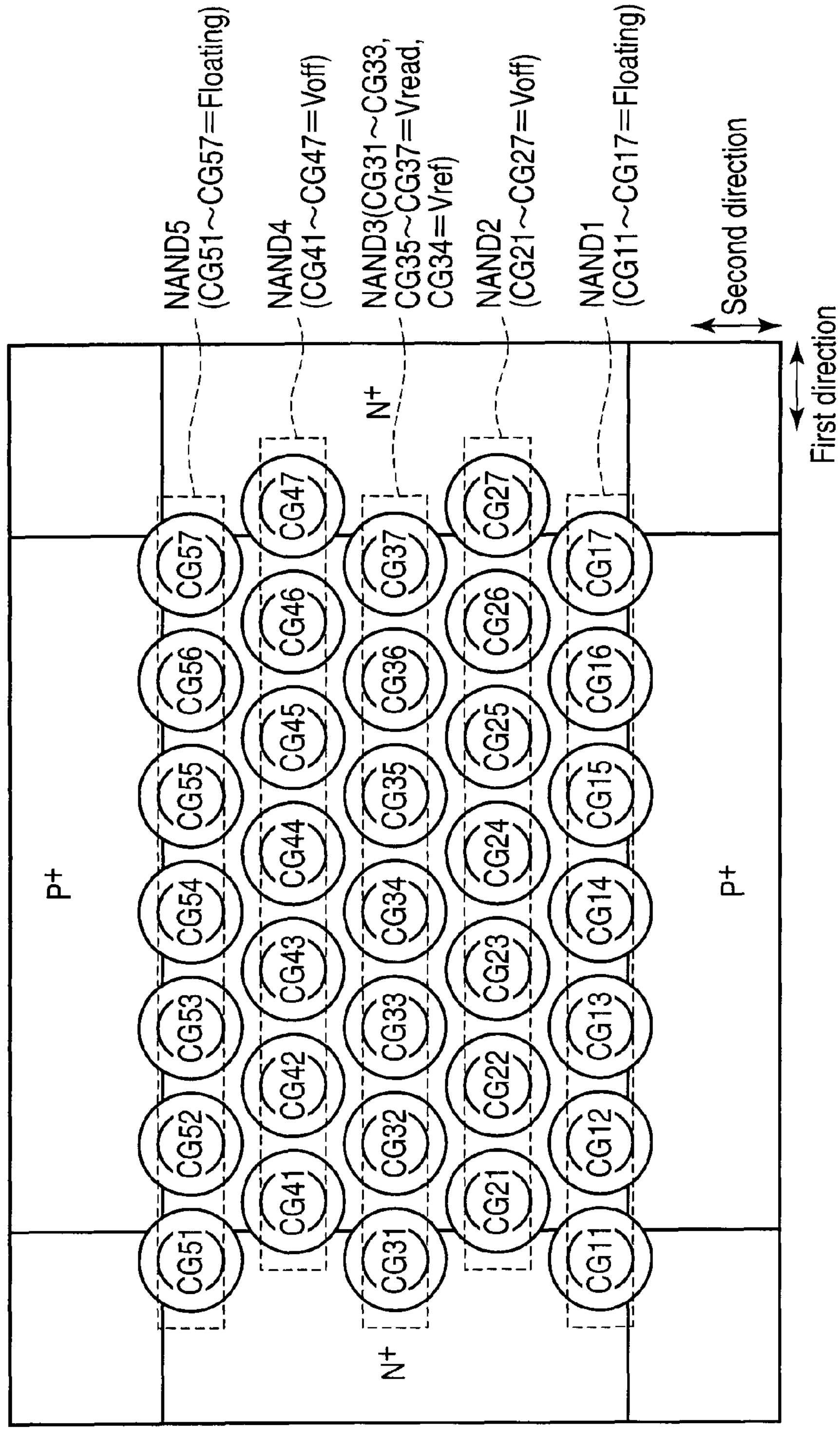
FIG. 52 is a view showing potentials of the control gates during data reading.

Meanwhile, in the second basic structure, as shown in FIG. 52, control gates CG21 to CG27, and CG41 to CG47 of the memory cells in the unselected NAND series NAND2, NAND4 at both sides of the selected NAND series NAND3 are fixed to Voff. Therefore, unselected NAND series NAND2, NAND4 have no adverse influence on the reading from the selected NAND series NAND3.

C. Erase Operation

Erasing is an operation of returning a state from a writing state to an initial state (erasing state). The erase operation is simultaneously executed to all NAND series for example (chip erasing/block erasing).

In this example, explanation will be given for an example of executing data erasing to the memory cells in all NAND series NAND1 to NAND5.

A first example as described below shows a basic erase operation of the memory cell array according to the first basic structure (FIGS. 1 to 4), and a second example as described below shows a basic erase operation of the memory cell array according to the second basic structure (FIG. 5 to FIG. 9).

C-1. First Example

Figure 53:
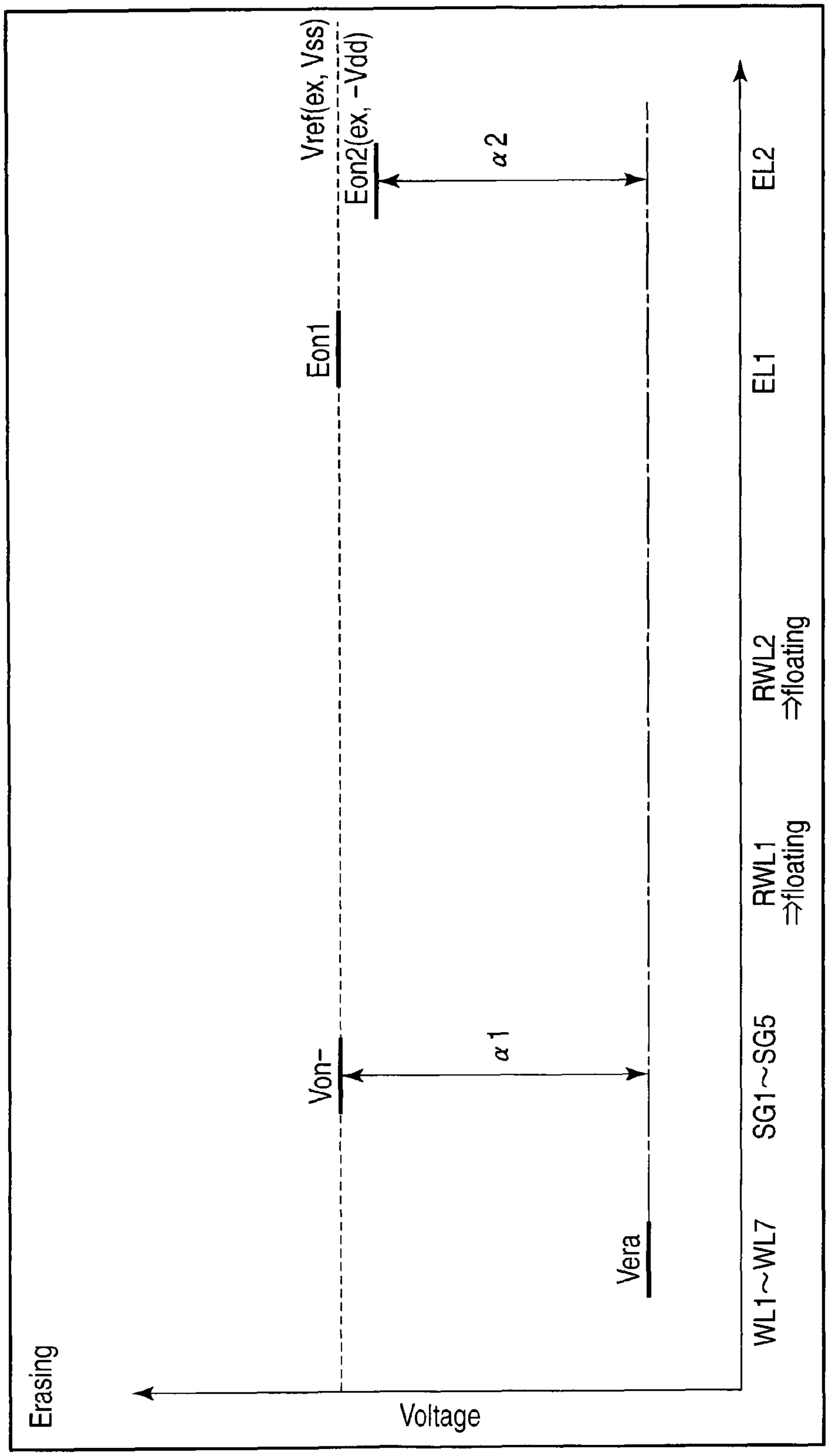
FIG. 53 and FIG. 54 are views showing a first example of the potential relation during data erasing, respectively.
Figure 54:
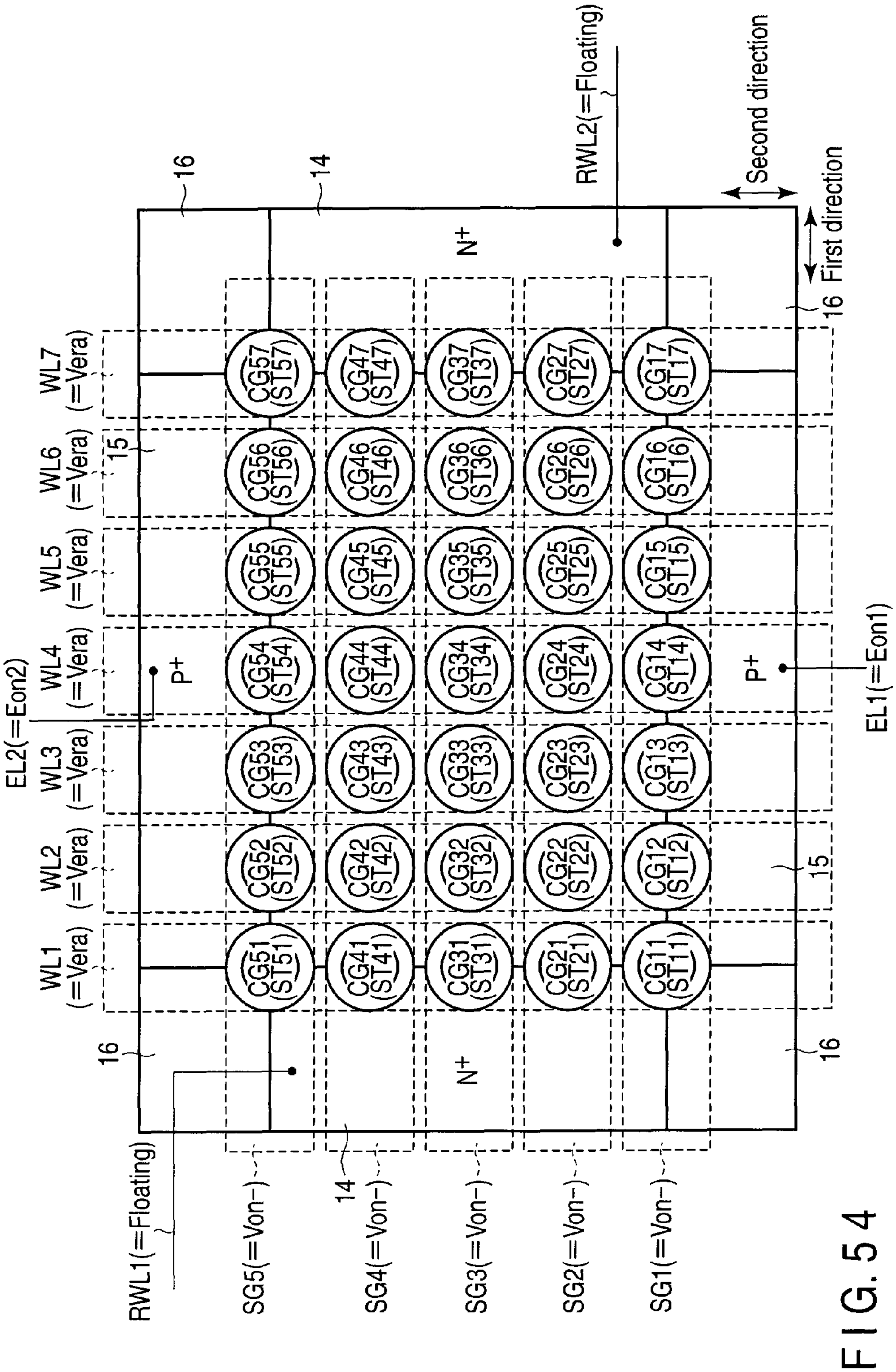

FIGS. 53 and 54 show the first example of the potential relation during data erasing.

All word lines WL1 to WL7 are set to Vera (for example, minus potential), and all select gate lines SG1 to SG5 are set to Von− (for example, Vref).

First erase line EL1 is set to Eon1 (for example Vref), and second erase line EL2 is set to Eon2 (for example, −Vdd). Vdd is the high potential side power supply potential.

In this example, for example Eon1 and Eon2 are set to satisfy Eon1>Eon2, so that holes (positive holes) flow to all NAND series NAND1 to NAND5, by generating the potential difference between the first and second erase lines EL1 and EL2.

First and second read/write lines RWL1, RWL2 are set in a floating state, because they are not used during data erasing.

Here, reference potential Vref is set as Vss (for example, 0 V).

α1 (=Von−−Vera) is the potential required for turning-on the select transistors ST11 to ST57.

α2 is Eon2−Vera being a value exceeding the potential required for fluctuating the threshold of the memory cells in all NAND series NAND1 to NAND5. For example, when the data recording layer is the charge storage layer, α2 is set to a sufficiently large value for injecting the holes into the data recording layer of all memory cells.

Figure 56:
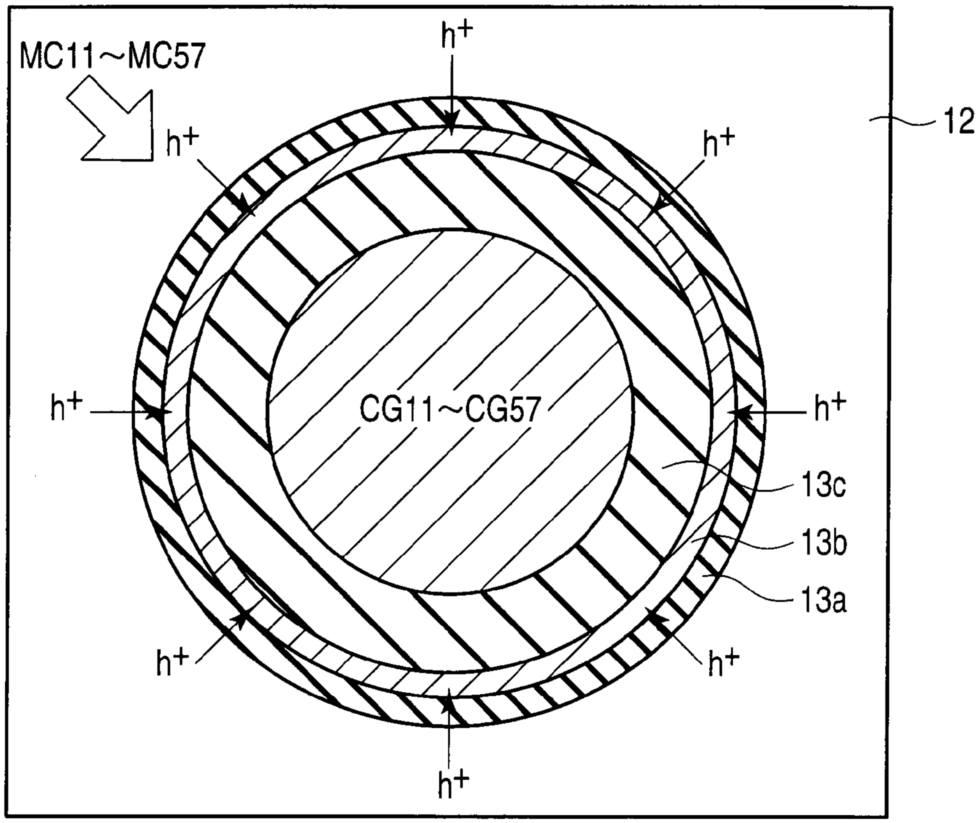
FIG. 56 is a view showing the injection of positive holes into the data recording layer.

When the above-described potential relation is maintained, for example as shown in FIG. 55, the electric conduction path is generated in all NAND series NAND1 to NAND5, and holes (h+) flow from the first erase line EL1 to the second erase line EL2. Further, in all memory cells, α2 (=Eon2−Vera) is applied between the control gates CG11 to CG57 and the channels, and therefore for example as shown in FIG. 56, the holes (h+) are injected into the data recording layers (charge storage layers) 13*b* of all memory cells MC11 to MC57.

Accordingly, data erasing is executed to all memory cells.

C-2. Second Example

Figure 57:
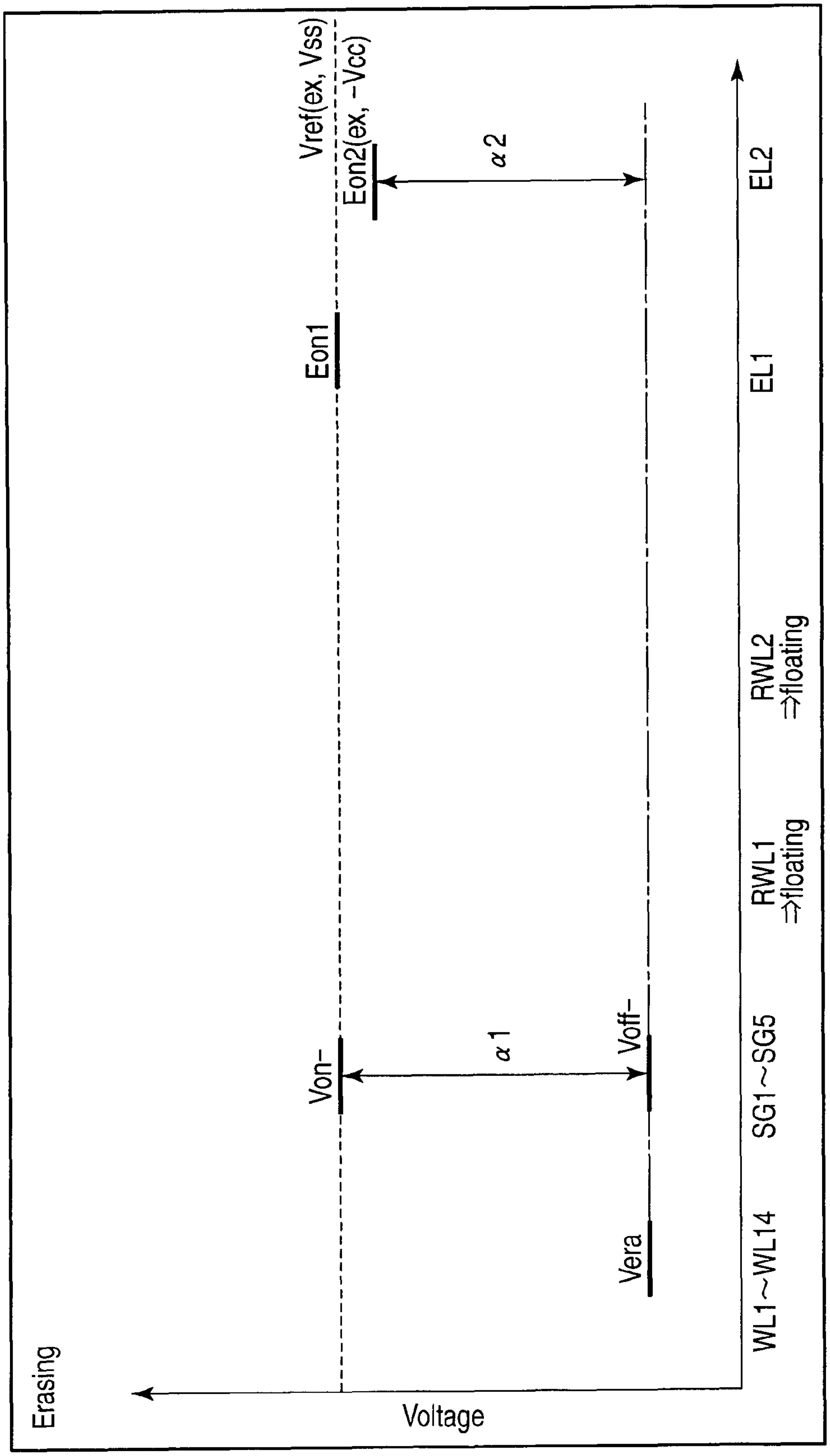
FIG. 57 and FIG. 58 are views showing a second example of the potential relation during data erasing, respectively.
Figure 58:
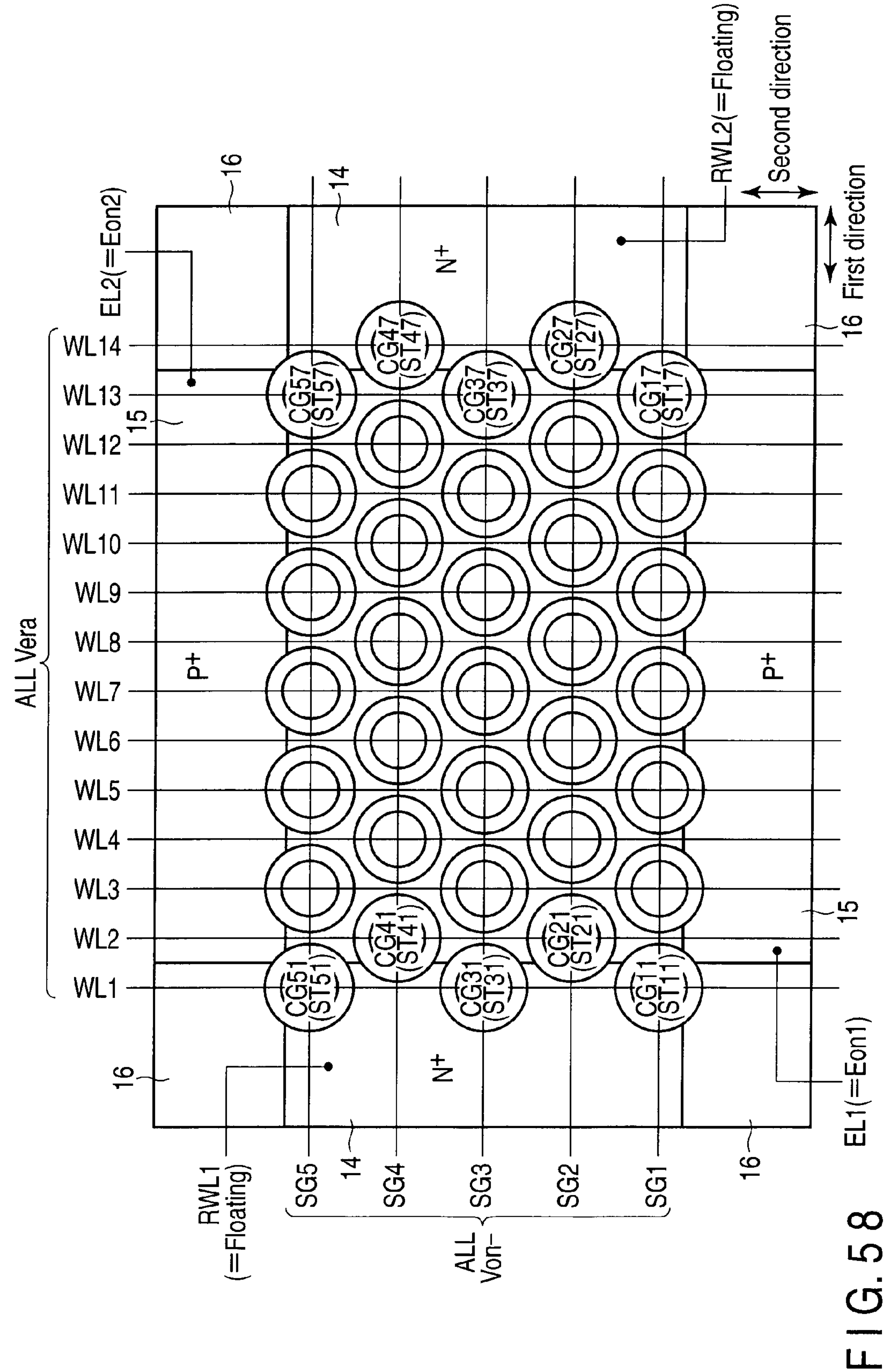

FIGS. 57 and 58 show a second example of the potential relation during data erasing.

All word lines WL1 to WL14 are set to Vera (for example, minus potential), and all select gate lines SG1 to SG5 are set to Von−(for example, Vref).

First erase line EL1 is set to Eon1 (for example, Vref), and second erase line EL2 is set to Eon2 (for example, −Vdd). Vdd is the high potential side power supply potential.

In this example, for example Eon1 and Eon2 are set to satisfy Eon1>Eon2, so that holes (positive holes) flow to all NAND series NAND1 to NAND5, by generating the potential difference between the first and second erase lines EL1 and EL2.

First and second read/write lines RWL1, RWL2 are set in a floating state, because they are not used during data erasing.

Here, reference potential Vref is set as Vss (for example, 0 V).

α1 (=Von−−Vera) is the potential required for turning-on the select transistors ST11 to ST57.

α2 is Eon2−Vera, and is a value exceeding the potential required for fluctuating the threshold of the respective memory cells in all NAND series NAND1 to NAND5. For example, when the data recording layer is the charge storage layer, α2 is set to a sufficiently large value for injecting the holes into the data recording layers of all memory cells.

When the above-described potential relation is maintained, for example as shown in FIG. 59, the electric conduction path is generated in all NAND series NAND1 to NAND5, and the holes (h+) flow from the first erase line EL1 to the second erase line EL2. Further, in all memory cells, α2 (=Eon2−Vera) is applied between the control gates CG11 to CG57 and the channels, and therefore for example as shown in FIG. 56, the holes (h+) are injected into the data recording layers (charge storage layers) 13*b* of all memory cells MC11 to MC57.

Accordingly, data erasing is executed to the all memory cells.

(5) Conclusion

As described above, according to the present disclosure, a large capacity nonvolatile semiconductor memory can be realized, by the memory cell array based on a new architectural concept, and by the basic operation for operating the memory cell array.

Further, the operation speed can be improved by dividing the memory cell array into blocks as will be described later, and a further large capacity can be realized by three-dimensionally constructing the memory cell array.

2. DIVIDING THE MEMORY CELL ARRAY INTO BLOCKS

Dividing the memory cell array into blocks is effective for improving the operation speed, etc.

Here, explanation will be given for an example as follows. Namely, the memory cell array is constituted of blocks, and one block is constituted of the memory cell array having the first basic structure (FIGS. 1 to 4) or the second basic structure (FIG. 5 to FIG. 9).

In this example, for simplifying the explanation, the memory cell array is constituted of nine blocks. However, as a matter of course, the present invention is not limited thereto. The number of blocks may be two or more. Further, the number of word lines and select gate lines is not limited to an example as described below. The number of them may be two or more.

(1) Layout Based on the First Basic Structure

Examples and operations of the layout based on the first basic structure will be sequentially described.

A. First Example

Figure 60:
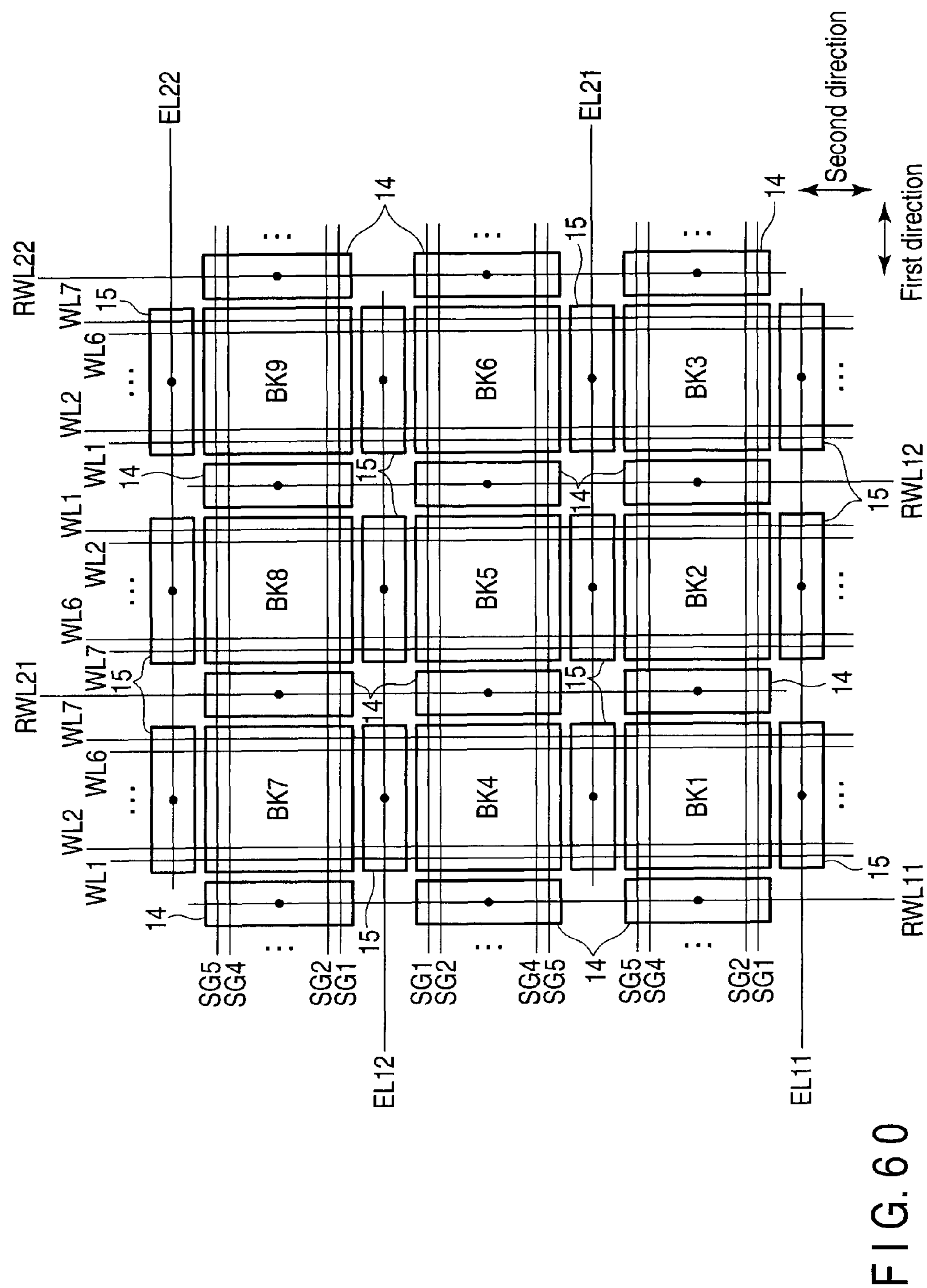
FIG. 60 is a view showing a first example of a layout based on a first basic structure.

FIG. 60 shows a first example of the layout based on the first basic structure.

Blocks BK1 to BK9 have respectively the first basic structure (FIGS. 1 to 4). Select gate lines SG1 to SG5 are extended on the memory cell array in the first direction, and word lines WL1 to WL7 are extended on the memory cell array in the second direction.

Select gate lines SG1 to SG5 are shared by the blocks, such as three blocks BK1, BK2, and BK3, arranged in the first direction. Word lines WL1 to WL7 are shared by the blocks, such as three blocks BK1, BK4, and BK7, arranged in the second direction.

Read/write lines RWL11, RWL12 correspond to the read/write line RWL1 of the first basic structure (FIGS. 1 to 4). Read/write lines RWL21, RWL22 correspond to the read/write line RWL2 of the first basic structure (FIGS. 1 to 4).

Read/write lines RWL11, RWL12, RWL21, and RWL22 are shared by N+-type diffusion layers 14 arranged in the second direction. One of the N+-type diffusion layers 14 is disposed between two blocks such as blocks BK1 and BK2. Namely, each one of the N+-type diffusion layers 14 is shared by the two blocks disposed at its both sides.

Erase lines EL11 and EL12 correspond to the erase line EL1 of the first basic structure (FIGS. 1 to 4). Erase lines EL21 and EL22 correspond to the erase line EL2 of the first basic structure (FIGS. 1 to 4).

Erase lines EL11, EL12, EL21, and EL22 are shared by P+-type diffusion layers 15 arranged in the first direction.

One of the P+-type diffusion layers 15 is disposed between two blocks such as blocks BK1 and BK4. Namely, each one of the P+-type diffusion layers 15 is respectively shared by the two blocks disposed at its both sides.

According to the layout of the first example, an improvement of a memory performance such as an improvement of the operation speed, can be realized by dividing the memory cell array into blocks.

B. Second Example

Figure 61:
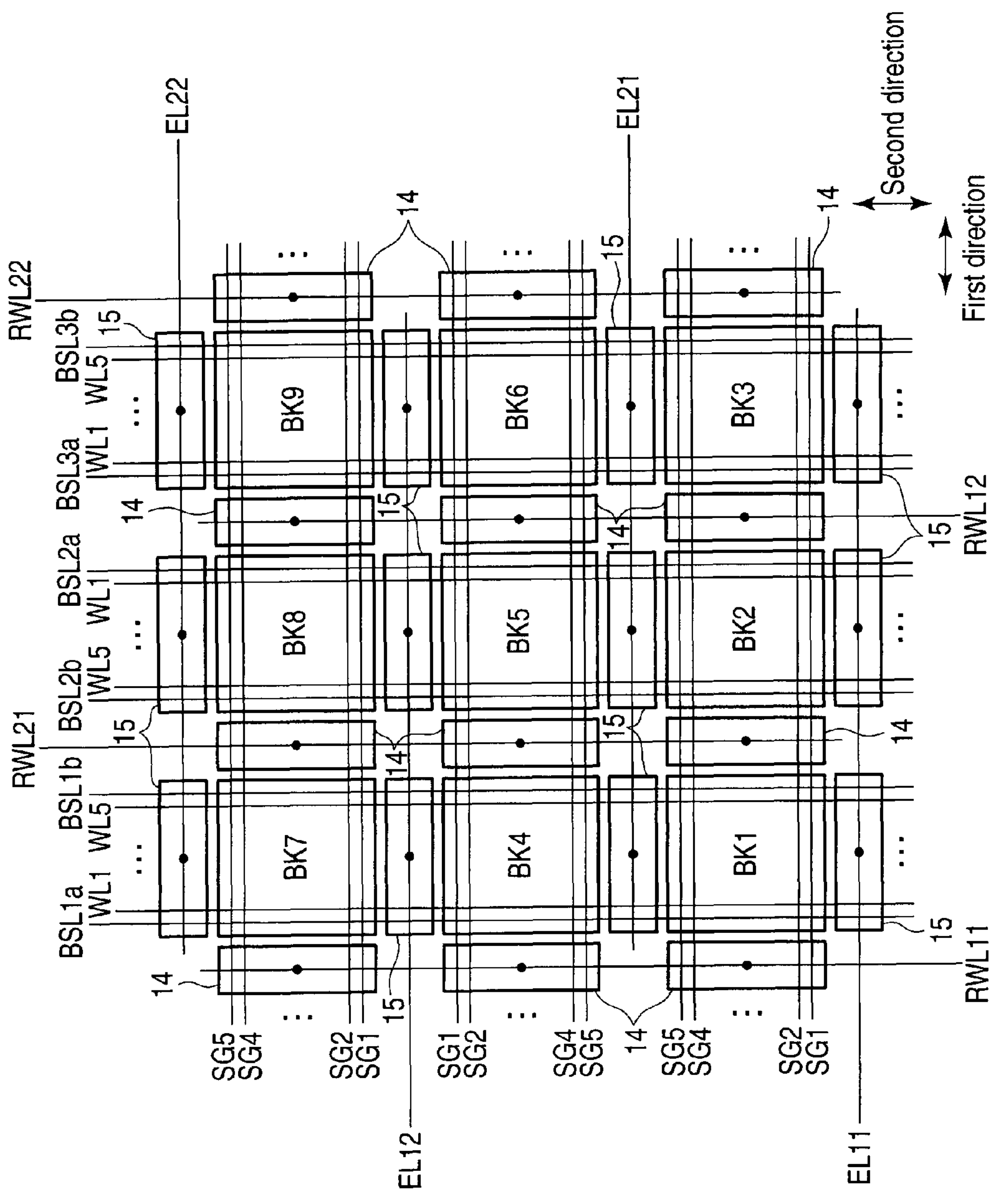
FIG. 61 is a view showing a second example of the layout based on the first basic structure.

FIG. 61 shows a second example of the layout based on the first basic structure.

The second example has a characteristic compared with the first example, such that read/write block select lines BSL1*a*, BSL1*b*, BSL2*a*, BSL2*b*, BSL3*a*, and BSL3*b* are newly provided in the memory cell array.

Each one of the blocks BK1 to BK9 has the first basic structure (FIGS. 1 to 4). Select gate lines SG1 to SG5 are extended on the memory cell array in the first direction, and word lines WL1 to WL5 are extended on the memory cell array in the second direction.

Select gate lines SG1 to SG5 are shared by the blocks such as three blocks BK1, BK2, BK3 arranged in the first direction. Word lines WL1 to WL5 are shared by the blocks such as three blocks BK1, BK4, BK7 arranged in the second direction.

Read/write block select lines BSL1*a*, BSL1*b*, BSL2*a*, BSL2*b*, BSL3*a*, and BSL3*b* are disposed at both ends of word lines WL1 to WL5 in the first direction. The read/write block select lines BSL1*a*, BSL1*b*, BSL2*a*, BSL2*b*, BSL3*a*, and BSL3*b* are also shared by the blocks such as three blocks BK1, BK4, BK7 arranged in the second direction, similarly to word lines WL1 to WL5.

Read/write block select lines BSL1*a*, BSL1*b*, BSL2*a*, BSL2*b*, BSL3*a*, and BSL3*b* are used for selecting one or more blocks which are objects to be read/written during reading/writing of data.

Read/write lines RWL11, RWL12 correspond to the read/write line RWL1 of the first basic structure (FIGS. 1 to 4). Read/write lines RW21, RW22 correspond to the read/write line RWL2 of the first basic structure (FIGS. 1 to 4).

Read/write lines RWL11, RWL12, RWL21, and RWL22 are shared by the N+-type diffusion layers 14 arranged in the second direction. One of the N+-type diffusion layers 14 is disposed between two blocks such as blocks BK1 and BK2. Namely, each one of the N+-type diffusion layers 14 is shared by the two blocks disposed at its both sides.

Erase lines EL11 and EL12 correspond to the erase line EL1 of the first basic structure (FIGS. 1 to 4). Erase lines EL21 and EL22 correspond to the erase line EL2 of the first basic structure (FIGS. 1 to 4).

Erase lines EL11, EL12, EL21, and EL22 are shared by the P+-type diffusion layers 15 arranged in the first direction. One of the P+-type diffusion layers 15 is disposed between two blocks such as blocks BK1 and BK4. Namely, each one of the P+-type diffusion layers 15 is shared by the two blocks disposed at its both sides.

In the layout of the second example as well, similarly to the first example, the improvement of the memory performance such as operation speed can be realized by dividing the memory cell array into blocks.

C. Third Example

Figure 62:
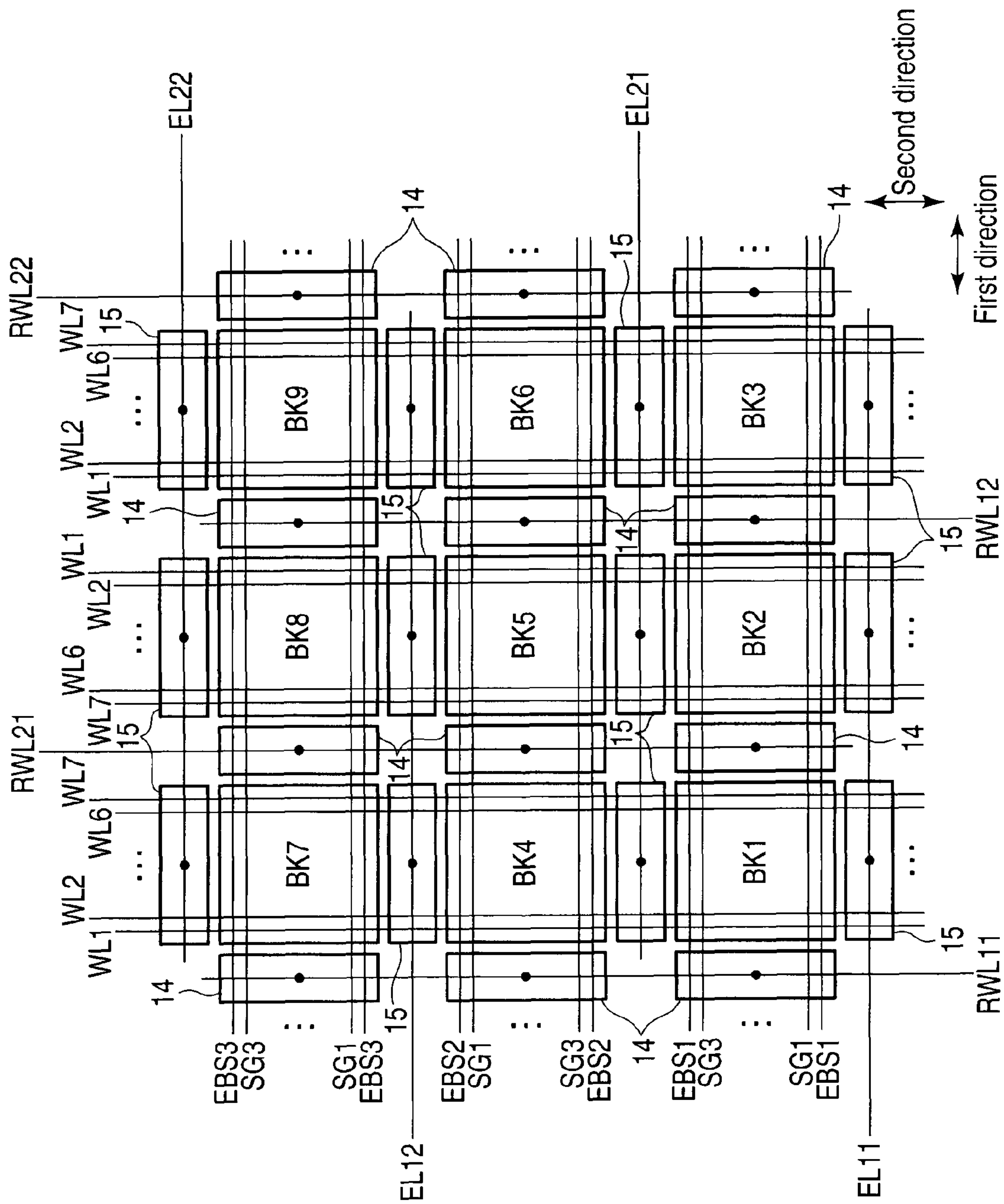
FIG. 62 is a view showing a third example of the layout based on the first basic structure.

FIG. 62 shows a third example of the layout based on the first basic structure.

The third example has a characteristic compared with the first example, such that erase block select lines EBS1, EBS2, and EBS3 are newly provided in the memory cell array.

Each one of the blocks BK1 to BK9 has the first basic structure (FIGS. 1 to 4). Select gate lines SG1 to SG3 are extended on the memory cell array in the first direction, and word lines WL1 to WL7 are extended on the memory cell array in the second direction.

Select gate lines SG1 to SG3 are shared by the blocks such as three blocks BK1, BK2, BK3 arranged in the first direction. Word lines WL1 to WL7 are shared by the blocks such as three blocks BK1, BK4, BK7 arranged in the second direction.

Erase block select lines EBS1, EBS2, and EBS3 are disposed at both ends of select gate lines SG1 to SG3 in the second direction. Erase block select lines EBS1, EBS2, and EBS3 are also shared by the blocks such as three blocks BK1, BK2, BK3 arranged in the first direction, similarly to select gate lines SG1 to SG3.

Erase block select lines EBS1, EBS2, and EBS3 are used for selecting one or more blocks which are the objects to be erased, during data erasing.

Read/write lines RWL11, RWL12 correspond to the read/write line RWL1 of the first basic structure (FIGS. 1 to 4). Read/write lines RWL21, RLL22 correspond to the read/write line RWL2 of the first basic structure (FIGS. 1 to 4).

Read/write lines RWL11, RWL12, RWL21, and RWL22 are shared by the N+-type diffusion layers 14 arranged in the second direction. One of the N+-type diffusion layers 14 is disposed between two blocks such as blocks BK1 and BK2. Namely, each one of the N+-type diffusion layers 14 is shared by two blocks disposed at its both sides.

Erase lines EL11, EL12 correspond to the erase line EL1 of the first basic structure (FIGS. 1 to 4). Erase lines EL21, EL22 correspond to the erase line EL2 of the first basic structure (FIGS. 1 to 4).

Erase lines EL11, EL12, EL21, and EL22 are shared by the P+-type diffusion layers 15 arranged in the first direction. One of the P+-type diffusion layers 15 is disposed between two blocks such as blocks BK1 and BK4. Namely, each one of the P+-type diffusion layers 15 is shared by two blocks disposed at its both sides.

In the layout of the third example as well, similarly to the first example, the improvement of the memory performance such as improvement of the operation speed, can be realized by dividing the memory cell array into blocks.

D. Fourth Example

FIG. 63 shows a fourth example of the layout based on the first basic structure.

The fourth example has a characteristic that the second example and the third example are combined, namely, has a characteristic such that read/write block select lines BSL1*a*, BSL1*b*, BSL2*a*, BSL2*b*, BSL3*a*, and BSL3*b*, and erase block select lines EBS1, EBS2, and EBS3 are provided in the memory cell array.

Each one of the blocks BK1 to BK9 has the first basic structure (FIGS. 1 to 4). Select gate lines SG1 to SG3 are extended on the memory cell array in the first direction, and word lines WL1 to WL5 are extended on the memory cell array in the second direction.

Select gate lines SG1 to SG3 are shared by the blocks such as three blocks BK1, BK2, BK3 arranged in the first direction. Word lines WL1 to WL5 are shared by the blocks such as three blocks BK1, BK4, BK7 arranged in the second direction.

Read/write block select lines BSL1*a*, BSL1*b*, BSL2*a*, BSL2*b*, BSL3*a*, BSL3*b* are disposed at both ends of word lines WL1 to WL5 in the first direction. Read/write block select lines BSL1*a*, BSL1*b*, BSL2*a*, BSL2*b*, BSL3*a*, BSL3*b* are also shared by the blocks such as three blocks BK1, BK4, BK7 arranged in the second direction, similarly to word lines WL1 to WL5.

Read/write block select lines BSL1*a*, BSL1*b*, BSL2*a*, BSL2*b*, BSL3*a*, BSL3*b* are used for selecting one or more blocks which are the objects to be read/written, during reading/writing of data.

Erase block select lines EBS1, EBS2, EBS3 are disposed at both ends of select gate lines SG1 to SG3 in the second direction. Erase block select lines EBS1, EBS2, EBS3 are also shared by the blocks such as three blocks BK1, BK2, BK3 arranged in the first direction, similarly to select gate lines SG1 to SG3.

Erase block select lines EBS1, EBS2, EBS3 are used for selecting one or more blocks which are the objects to be erased, during data erasing.

Read/write lines RWL11, RWL12 correspond to the read/write line RWL1 of the first basic structure (FIGS. 1 to 4). Read/write lines RWL21, RWL22 correspond to the read/write line RWL2 of the first basic structure (FIGS. 1 to 4).

Read/write lines RWL11, RWL12, RWL21, and RWL22 are shared by the N+-type diffusion layers 14 arranged in the second direction. One of the N+-type diffusion layers 14 is disposed between two blocks such as blocks BK1 and BK2. Namely, each one of the N+-type diffusion layers 14 is shared by two blocks disposed at its both sides.

Erase lines EL11, EL12 correspond to the erase line EL1 of the first basic structure (FIGS. 1 to 4). Erase lines EL21, EL22 correspond to the erase line EL2 of the first basic structure (FIGS. 1 to 4).

Erase lines EL11, EL12, EL21, and EL22 are shared by the P+-type diffusion layers 15 arranged in the first direction. One of the P+-type diffusion layers 15 is disposed between two blocks such as blocks BK1 and BK4. Namely, each one of the P+-type diffusion layers 15 is shared by two blocks disposed at its both sides.

In the layout of the fourth example as well, similarly to the first example, the improvement of the memory performance such as improvement of the operation speed can be realized by dividing the memory cell array into blocks.

E. Write Operation

The potential relation during data writing will be described by using the fourth example.

First, explanation will be given for a structure of the memory cell array when the first basic structure (FIGS. 1 to 4) is applied to the fourth example.

FIG. 64 shows the structure of the memory cell array.

This figure corresponds to the block BK1 of FIG. 63. Note that remaining blocks BK2 to BK9 of FIG. 63 also have the same structure as the structure of the block BK1.

Characteristics of this structure are shown in the layout of the memory cell.

Memory cells MC11 to MC35 (control gates CG11 to CG35) are disposed at intersections of word lines WL1 to WL5, and select gate lines SG1 to SG3. Similarly, select transistors ST11 to ST35 are also disposed at intersections of word lines WL1 to WL5, and select gate lines SG1 to SG3.

Accordingly, the memory cell array has an array size with 3×5.

Further, in this example, first and second select transistors SGT are newly disposed in the memory cell array.

First select transistor SGT (select gates Ga, Gb) correspond to the select transistor connected to the NAND series of the conventional NAND flush memory. The first select transistor SGT is disposed at both ends of the NAND series NAND1, NAND2, NAND3 in the first direction, namely is disposed at intersections of the read/write block select lines BSL1*a*, BSL1*b*, and select gate lines SG1 to SG3.

Select transistors Sa, Sb are connected between the select gates Ga, Gb, and the read/write block select lines BSL1*a*, BSL1*b*.

Second select transistor SGT (select gates Gc, Gd) does not exist in the conventional NAND flush memory. The second select transistor SGT is disposed at both ends of the NAND series NAND1, NAND2, NAND3 in the second direction, namely, is disposed at intersections of the erase block select line EBS1 and word lines WL1 to WL5.

Select transistors Sc, Sd are connected between the select gates Gc, Gd, and word lines WL1 to WL5.

Read/write lines RWL1, RWL2 are connected to the N+-type diffusion layers 14, and erase liens EL1, EL2 are connected to the P+-type diffusion layers 15. The N+-type diffusion layers 14 and the P+-type diffusion layers 15 are insulated from each other by element isolation insulating layer 16.

In this structure, explanation will be given for an example of executing data writing to the memory cell M23 in the NAND series NAND2.

E-1. First Example

FIGS. 65 and 66 show a first example of the potential relation during data writing, respectively.

When the block BK1 is the object to be written, read/write block select lines BSL1*a*, BSL1*b* are set to Von. Von is the potential required for turning-on the first select transistor SGT at both ends of the NAND series, and for example Von is equal to Vpass.

When the block BK1 is not the object to be written, read/write block select lines BSL1*a*, BSL1*b* are set to Voff. Voff is the potential required for turning-off the first select transistor SGT at both ends of the NAND series, and Voff is for example a minus potential.

Selected word line WL3 is set to Vpgm, and unselected word lines WL1, WL2, WL4, WL5 are set to Vpass. Vpass is the potential required for generating the electric conduction path in the selected NAND series NAND3, irrespective of the data (threshold) of the memory cell, and Vpgm is the potential required for write operation. In this example, Vpgm and Vpass are set to satisfy Vpgm>Vpass.

Selected gate line SG2 is set to Von+, and unselected select gate lines SG1, SG3 are set to Voff+. Von+ is the potential required for turning-on the select transistor, and Voff+ is the potential required for turning-off the select transistor. In this example, Von+ and Voff+ are set to satisfy Von+>Voff+.

Erase block select line EBS1 is set to Voff+.

First read/write line RWL1 is set to Won (for example, high potential side power supply potential Vdd), and second read/write line RWL2 is set to Vref (for example, low potential side power supply potential Vss). For example, Won and Vref are set to satisfy Won>Vref so that the electric current (electrons) flow to the selected NAND series NAND2, by generating the potential difference between first and second read/write lines RWL1 and RWL2.

First and second erase lines EL1, EL2 are set in a floating state, because they are not used during data writing.

Here, reference potential Vref is set as the center between the threshold of cell data "0" (maximum value of a threshold distribution), and the threshold of cell data "1" (minimum value of a threshold distribution), and specifically, Vref is set as Vss (for example, 0 V).

Figure 67:
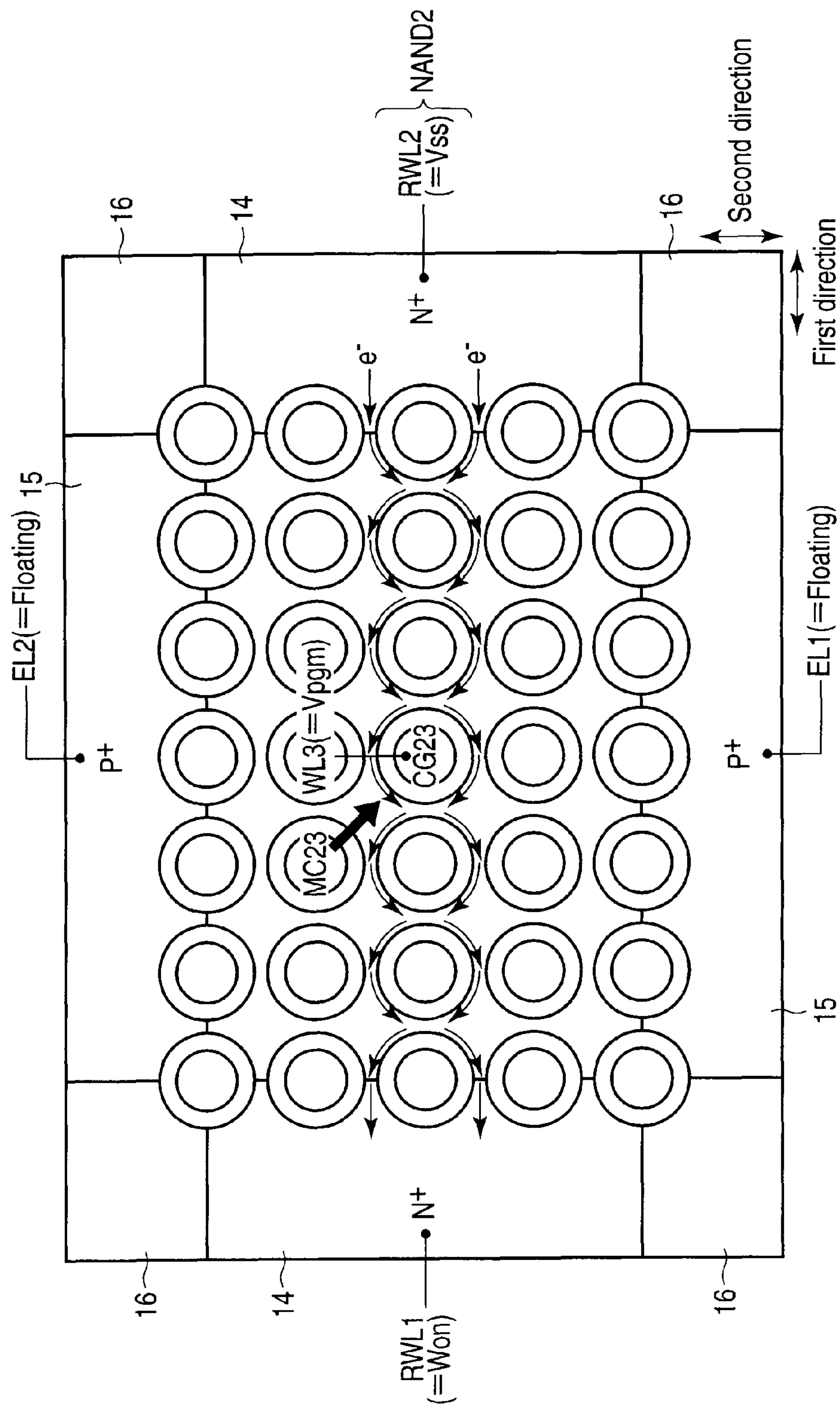
FIG. 67 is a view showing the electric conduction path.

When the block BK1 is the object to be written, for example as shown in FIG. 67, the electric conduction path is generated in the selected NAND series NAND2, and electrons (e−) flow from second read/write line RWL2 to first read/write line RWL1. Further, in selected memory cell MC23, Vpgm—Won is applied between the control gate CG23 and the channel, and therefore the electrons are injected into the data recording layer (charge storage layer) of selected memory cell MC23.

Accordingly, data is written into selected memory cell MC23.

E-2. Second Example

Figure 68:
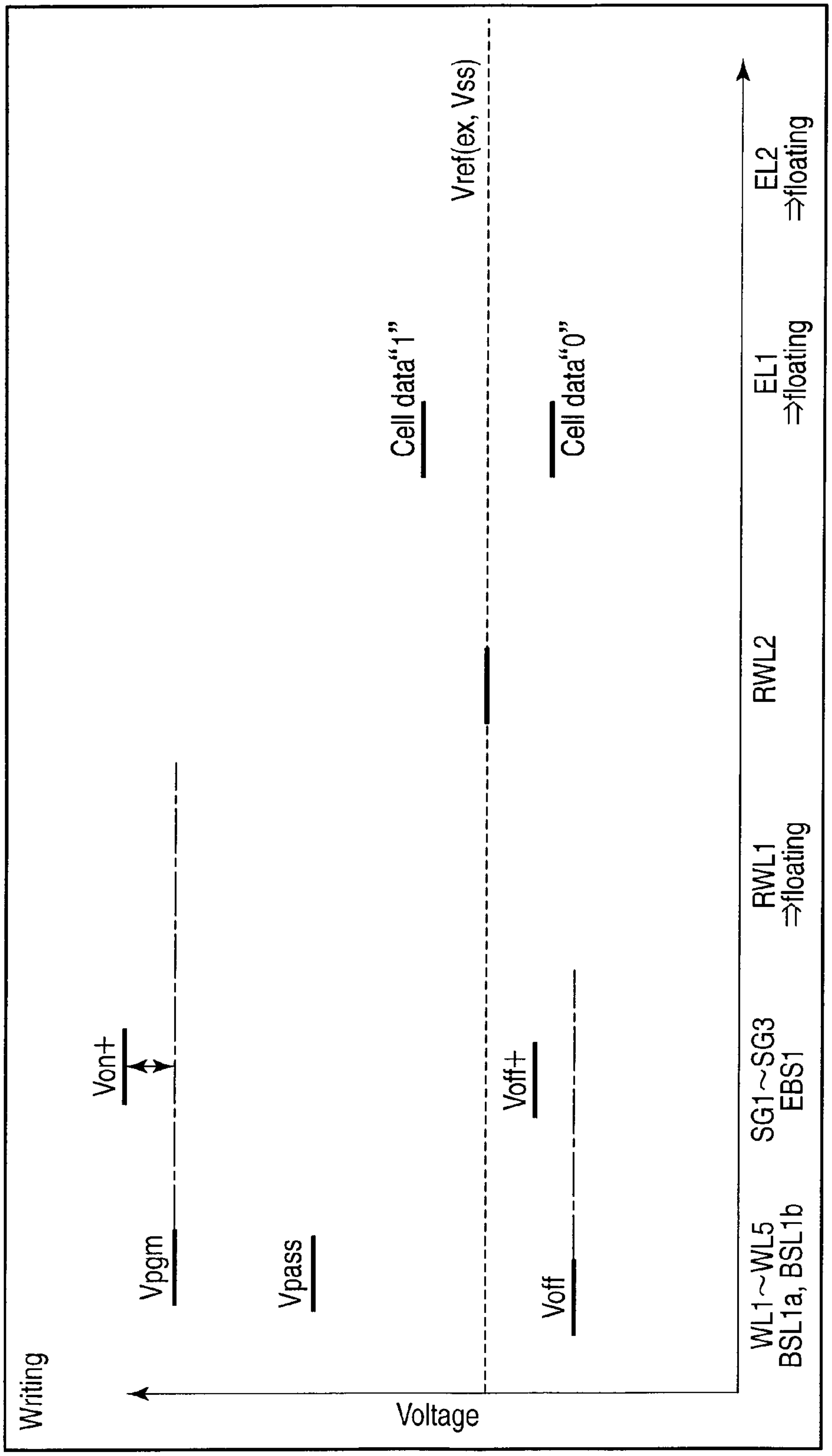

FIGS. 68 and 69 show a second example of the potential relation during data writing, respectively.

When the block BK1 is the object to be written, read/write block select lines BSL1a, BSL1b are set to Von. Von is the potential required for turning-on the first select transistor SGT at both ends of the NAND series, and is equal to Vpass for example.

When the block BK1 is not the object to be written, read/write block select lines BSL1a, BSL1b are set to Voff. Voff is the potential required for turning-off the first select transistor SGT at both ends of the NAND series, and Voff is a minus potential for example.

Selected word line WL3 is set to Vpgm, and unselected word lines WL1, WL2 at the left side of the word line WL3 are set to Voff, and unselected word lines WL4, WL5 at the right side of the word line WL3 are set to Vpass.

Vpass is the potential required for generating the electric conduction path in the selected NAND series NAND2, by turning-on the memory cell, irrespective of the data (threshold) of the memory cell. Vpgm is the potential required for writing of data. In this example, Vpgm, Vpass, and Voff are set to satisfy Vpgm>Vpass>Voff.

Selected select gate line SG2 is set to Von+, and unselected select gate lines SG1, SG3 are set to Voff+. Von+ is the potential required for turning-on the select transistor, and Voff+ is the potential required for turning-off the select transistor. In this example, Von+ and Voff+ are set to satisfy Von+>Voff+.

Erase block select line EBS1 is set to Voff+.

First read/write line RWL1 is set in a floating state, and second read/write line RWL2 is set to Vref (for example, low potential side power supply potential Vss). First and second erase lines EL1, EL2 are set in a floating state, because they are not used during data writing.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

When the block BK1 is the object to be written, for example as shown in FIG. 70, the electric conduction path is generated in the selected NAND series NAND2, and electrons (e−) flow from second read/write line RWL2 to selected memory cell MC23. Further, in selected memory cell MC23, Vpgm−Vref is applied between the control gate CG23 and the channel, and therefore the electrons are injected into the data recording layer (charge storage layer) of selected memory cell MC23.

Accordingly, data is written into selected memory cell MC23.

E-3. Third Example

Figure 71:
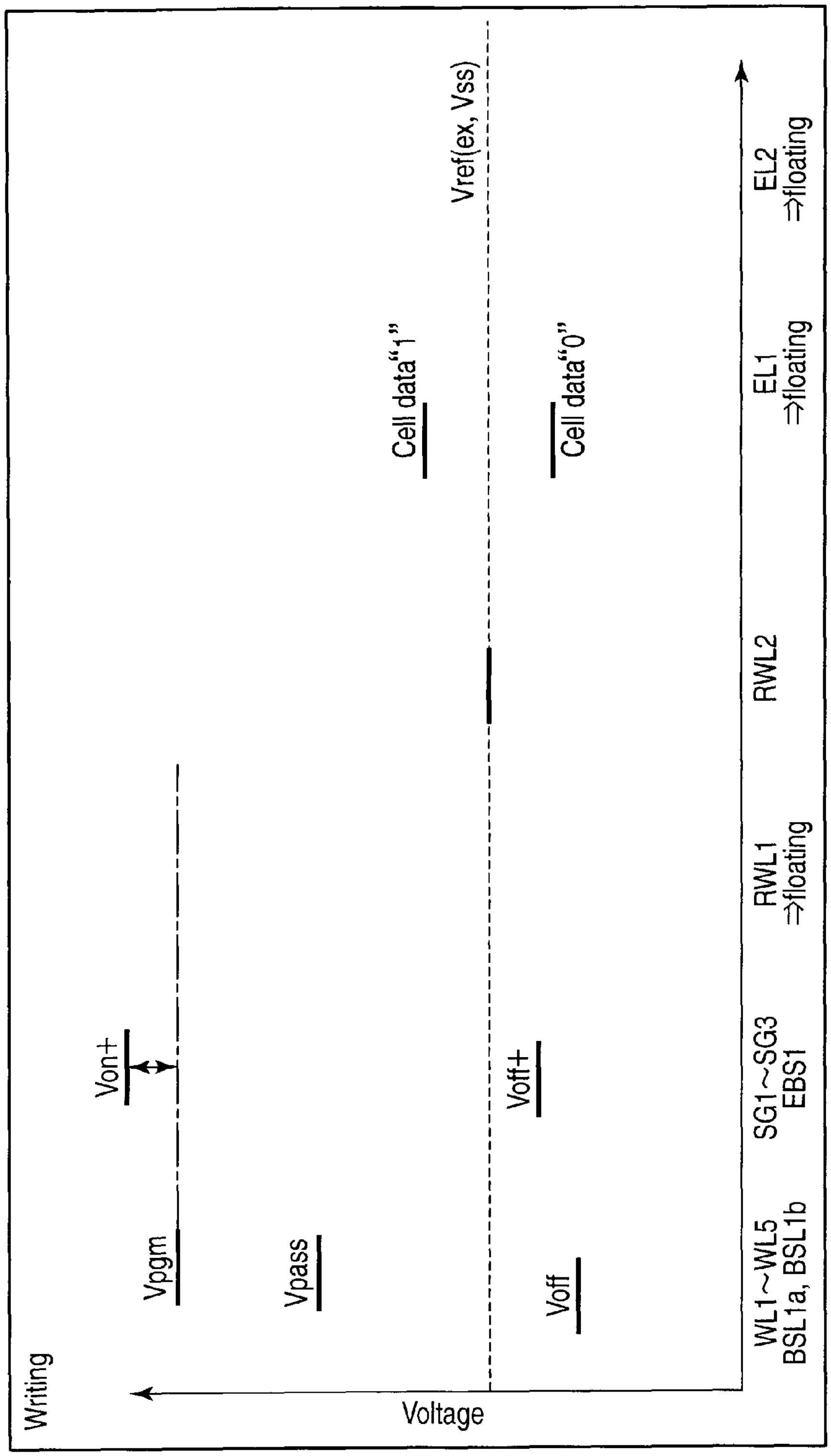

FIGS. 71 and 72 show a third example of the potential relation during data writing, respectively.

When the block BK1 is the object to be written, read/write block select lines BSL1a, BSL1b are set to Von. Von is the potential required for turning-on the first select transistor SGT at both ends of the NAND series, and Von is equal to Vpass for example.

When the block BK1 is not the object to be written, read/write block select lines BSL1a, BSL1b are set to Voff. Voff is the potential required for turning-off the first select transistor SGT at both ends of the NAND series, and Voff is a minus potential for example.

Selected word line WL3 is set to Vpgm, and unselected word lines WL1, WL2 at the left side of the word line WL3 are set to Voff, and unselected word lines WL4, WL5 at the right side of the word line WL3 are set to Vpass.

Vpass is the potential required for generating the electric conduction path in the selected NAND series NAND2, by turning-on the memory cell, irrespective of the data (threshold) of the memory cell. Vpgm is the potential required for write operation. In this example, Vpgm, Vpass, and Voff are set to satisfy Vpgm>Vpass>Voff.

Selected select gate line SG2 and unselected select gate lines SG1, SG3 at its both sides are set to Von+, and remaining unselected select gate line is set to Voff+. Von+ is the potential required for turning-on the select transistor, and Voff+ is the potential required for turning-off the select transistor. In this example, Von+ and Voff+ are set to satisfy Von+>Voff+.

Erase block select line EBS1 is set to Voff+.

First read/write line RWL1 is set in a floating state, and second read/write line RWL2 is set to Vref (for example, low potential side power supply potential Vss). First and second erase lines EL1, EL2 are set in a floating state, because they are not used during data writing.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

Figure 73:
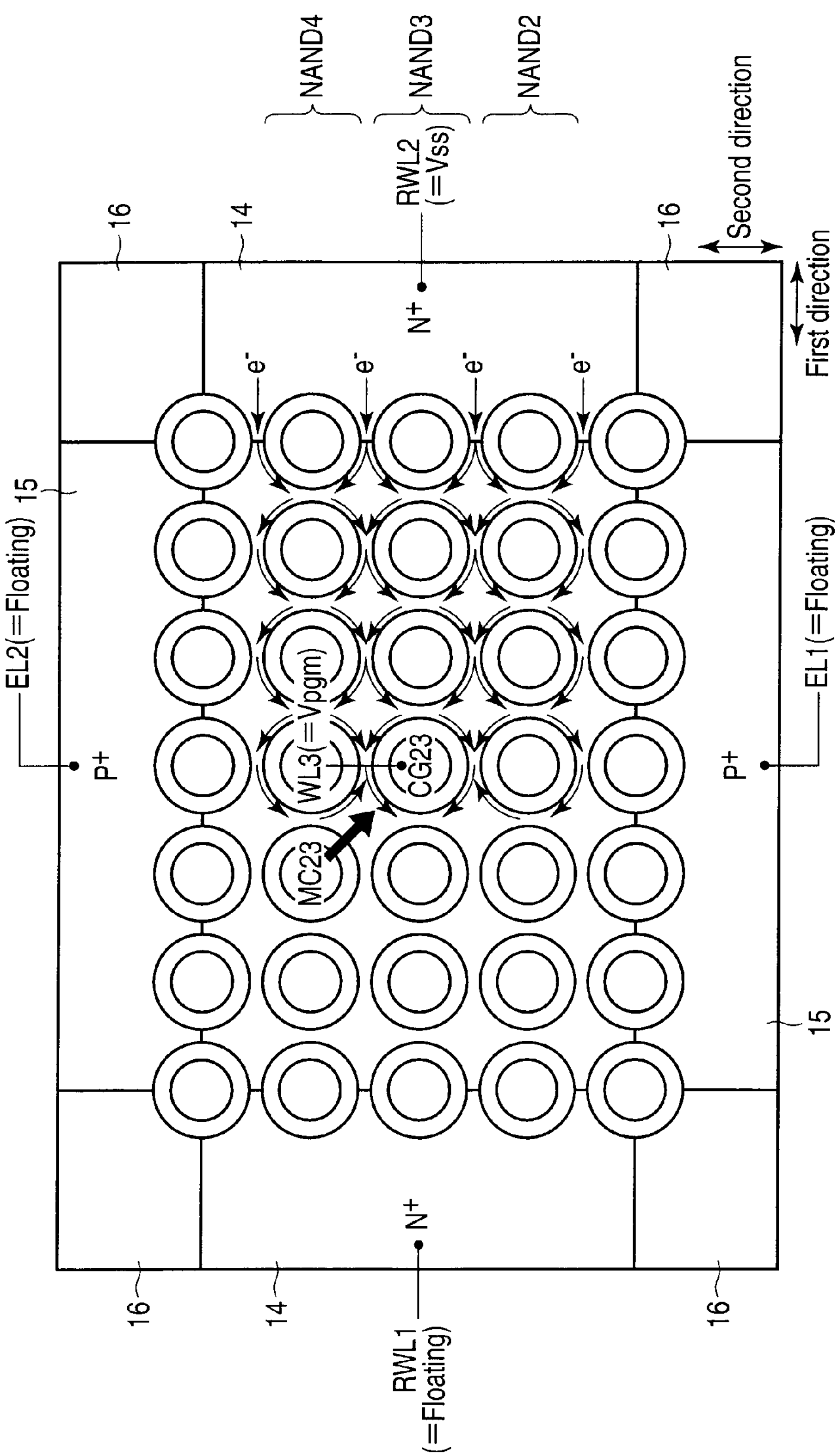
FIG. 73 is a view showing the electric conduction path.

When the block BK1 is the object to be written, for example as shown in FIG. 73, the electric conduction path is generated in the selected NAND series NAND2 and the unselected NAND series NAND1, NAND3 at its both sides, and electrons (e−) flow from second read/write line RWL2 to selected memory cell MC23. Further, in selected memory cell MC23, Vpgm−Vref is applied between the control gate CG23 and the channels, and therefore the electrons are injected into the data recording layer (charge storage layer) of selected memory cell MC23.

Accordingly, data is written into selected memory cell MC23.

F. Read Operation

In the structure of FIG. 64, explanation will be given for an example of executing data reading to the memory cell M23 in the NAND series NAND2.

FIGS. 74 to 79 show the read operation executed to the memory cell array according to the first basic structure. The read operation is executed by first and second steps as described below.

F-1. First Step

Figure 74:
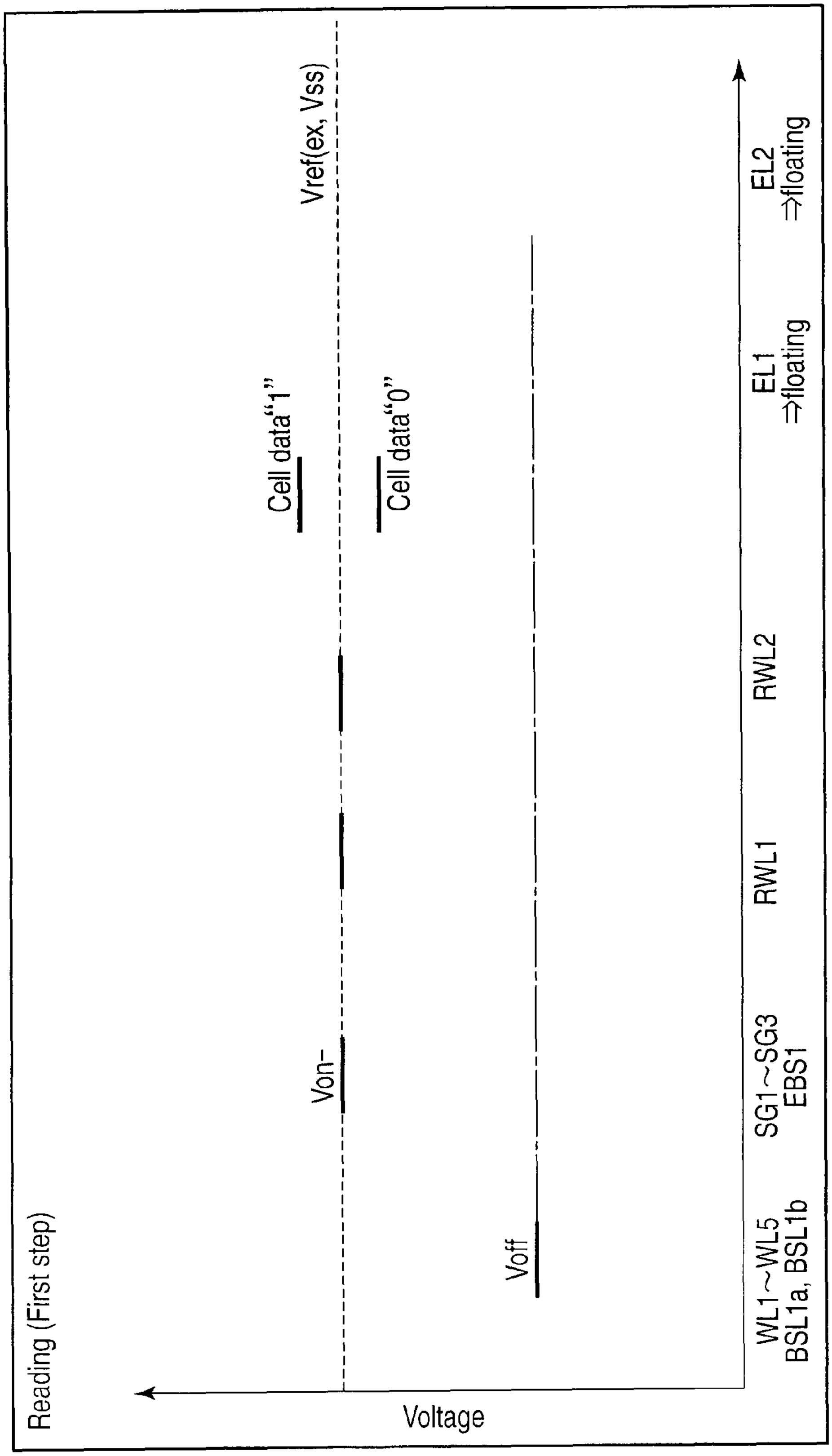

FIGS. 74 and 75 show the potential relation of the first step.

The first step is executed for the purpose of setting the control gate of all memory cells in the unselected NAND series, to potential Voff for not executing data reading to the unselected NAND series.

All word lines WL1 to WL5 and read/write block select lines BSL1a and BSL1b are set to Voff. Voff is the potential required for not generating the electric conduction path in the NAND series irrespective of the data (threshold) of the memory cell.

All select gate lines SG1 to SG3 and erase block select line EBS1 are set to Von−. Von− is the potential required for turning-on all select transistors. Von− is equal to Vref, and Voff is a minus potential for example.

First read/write line RWL1 is set to Vref (for example, low potential side power supply potential Vss). First and second erase lines EL1, EL2 are set in a floating state, because they are not used during data reading.

Here, reference potential Vref is set as the center between the threshold of cell data "0" (maximum value of the threshold distribution), and the threshold of cell data "1" (minimum value of the threshold distribution), and specifically, Vref is set as Vss (for example, 0 V).

When the potential relation is maintained, control gates CG11 to CG35 of all memory cells in all NAND series NAND1 to NAND3 are set to potential Voff for not generating the electric conduction path in the NAND series NAND1 to NAND3.

F-2. Second Step

Figure 76:
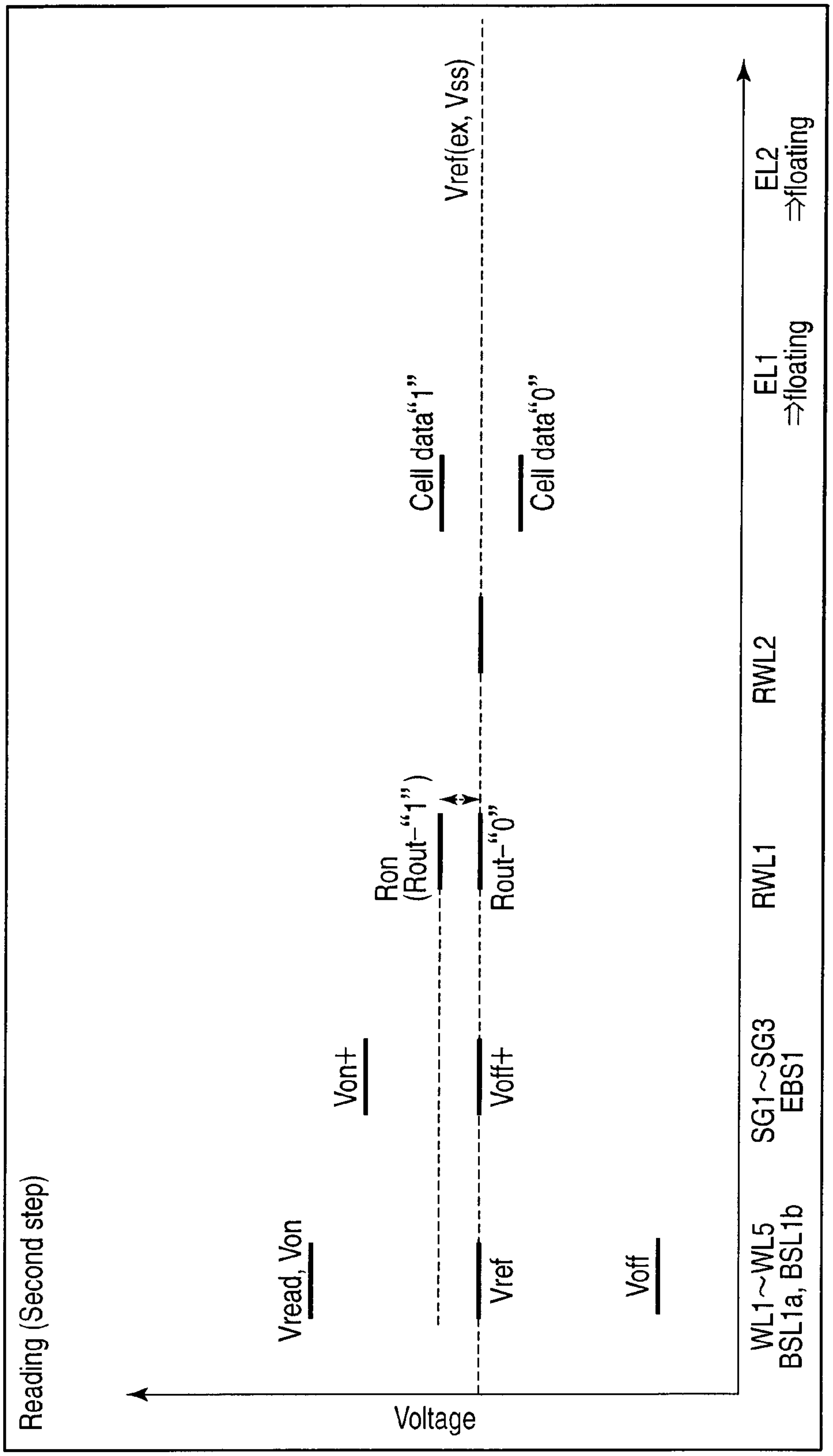

FIGS. 76 and 77 show the potential relation of a second step.

In the second step, data reading is executed to selected memory cell MC23 in the selected NAND series NAND2.

When the block BK1 is the object to be read, read/write block select lines BSL1*a*, BSL1*b* are set to Von (=Vread). Von is the potential required for turning-on the first select transistor SGT at both ends of the NAND series.

When the block BK1 is not the object to be read, read/write block select lines BSL1*a* and BSL1*b* are set to Voff. Voff is the potential required for turning-off the first select transistor SGT at both ends of the NAND series, and Voff is a minus potential for example.

Selected word line WL3 is set to Vref, and unselected word lines WL1, WL2, WL4, and WL5 are set to Vread.

Vref is the potential required for discriminating the data of the memory cell MC23 by turning-on/off the memory cell MC23, in accordance with the data (threshold) of selected memory cell MC23. Vread is the potential required for turning-on the unselected memory cell, irrespective of the data (threshold) of the unselected memory cell in the selected NAND series NAND2.

Selected select gate line SG2 is set to Von+, and remaining unselected select gate lines SG1, SG3 are set to Voff+.

Von+ is the potential required for turning-on the select transistors ST21 to ST25. Voff+ is the potential required for turning-off the select transistors ST11 to ST15, and ST31 to ST35. In this example, Von+ and Voff+ are set to satisfy Von+>Voff+.

First read/write line RWL1 is set to Ron (for example, high potential side power supply potential Vdd), and second read/write line RWL2 is set to Vref (for example, low potential side power supply potential Vss). In this example, Ron and Vref are set to satisfy Ron>Vref. First and second erase lines EL1, EL2 are set in a floating state, because they are not used during data reading.

When the block BK1 is the object to be read, control gates CG11 to CG15, and CG31 to CG35 of the memory cells in the unselected NAND series NAND1 and NAND3 are set to Voff and in a floating state. Therefore, the electric conduction path is not generated in the unselected NAND series NAND1 and NAND3.

Further, control gates CG21, CG22, CG24, CG25 of the unselected memory cell in the selected NAND series NAND2 have potential Vread for generating the electric conduction path in the NAND series NAND2. Therefore, whether or not the electric conduction path is formed from second read/write line RWL2 to first read/write line RWL1, is determined by turning-on/off selected memory cell MC23.

For example, when the data of the memory cell MC23 is "1" (high threshold), the memory cell MC23 is set in OFF state. Therefore, for example as shown in FIG. 78, the electric conduction path of electrons from second read/write line RWL2 to first read/write line RWL1 is cut by the memory cell MC23. Accordingly, Ron (=Rout−"1") is maintained, as the potential of first read/write line RWL1.

Figure 79:
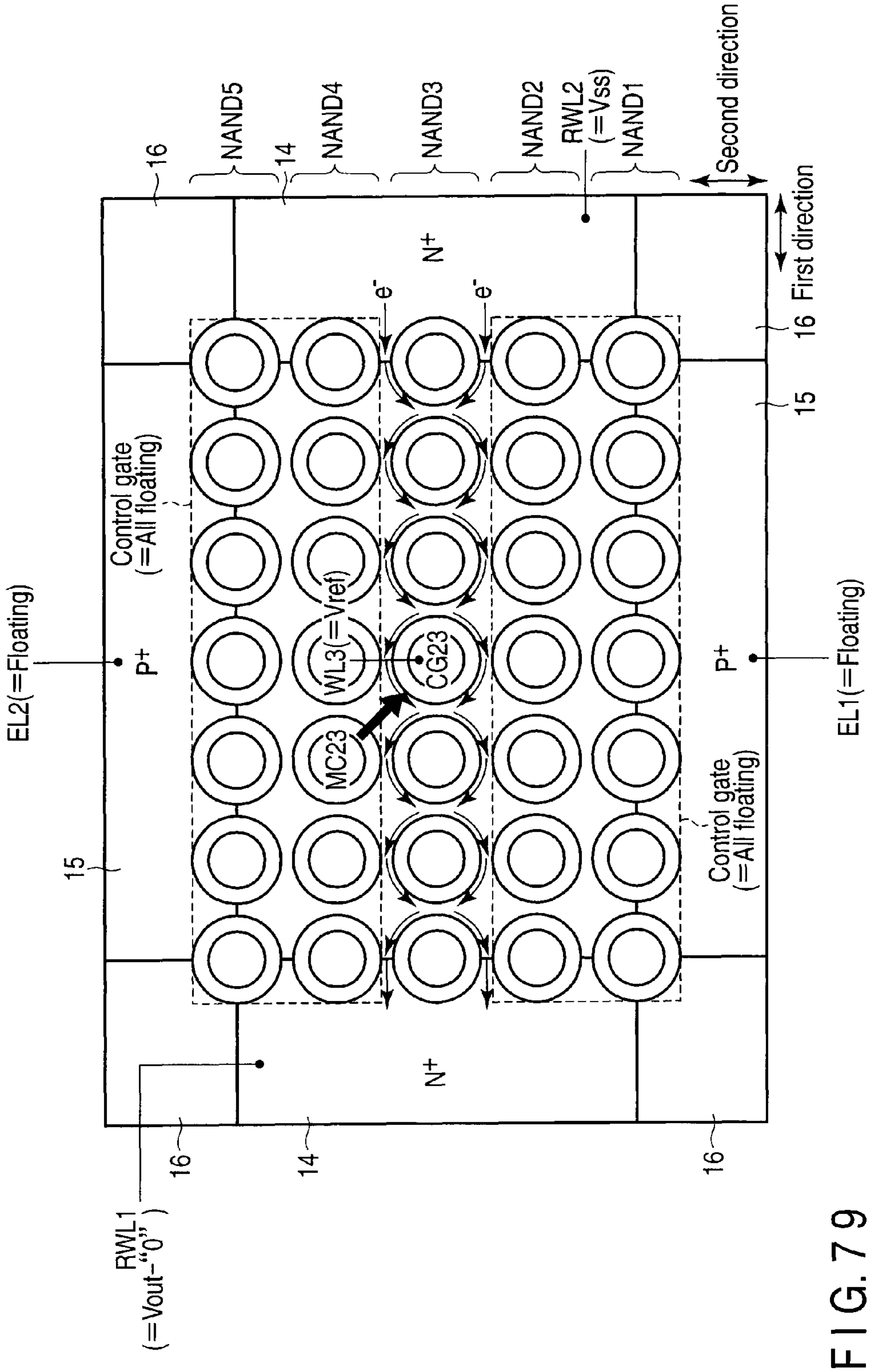

Further, when the data of the memory cell MC23 is "0" (low threshold), the memory cell MC23 is set in ON state. Therefore, for example as shown in FIG. 79, the electric conduction path of electrons from second read/write line RWL2 to first read/write line RWL1 is generated in the selected NAND series NAND2. Accordingly, the potential of first read/write line RWL1 is changed from Ron to Vref (=Rout−"0").

Thus, if the potential change of first read/write line RWL1 is sensed by the sense amplifier, the data of the memory cell MC23 can be discriminated.

G. Erase Operation

In the structure of FIG. 64, explanation will be given for an example of executing data erasing to the memory cells in all NAND series NAND1 to NAND3.

Figure 80:
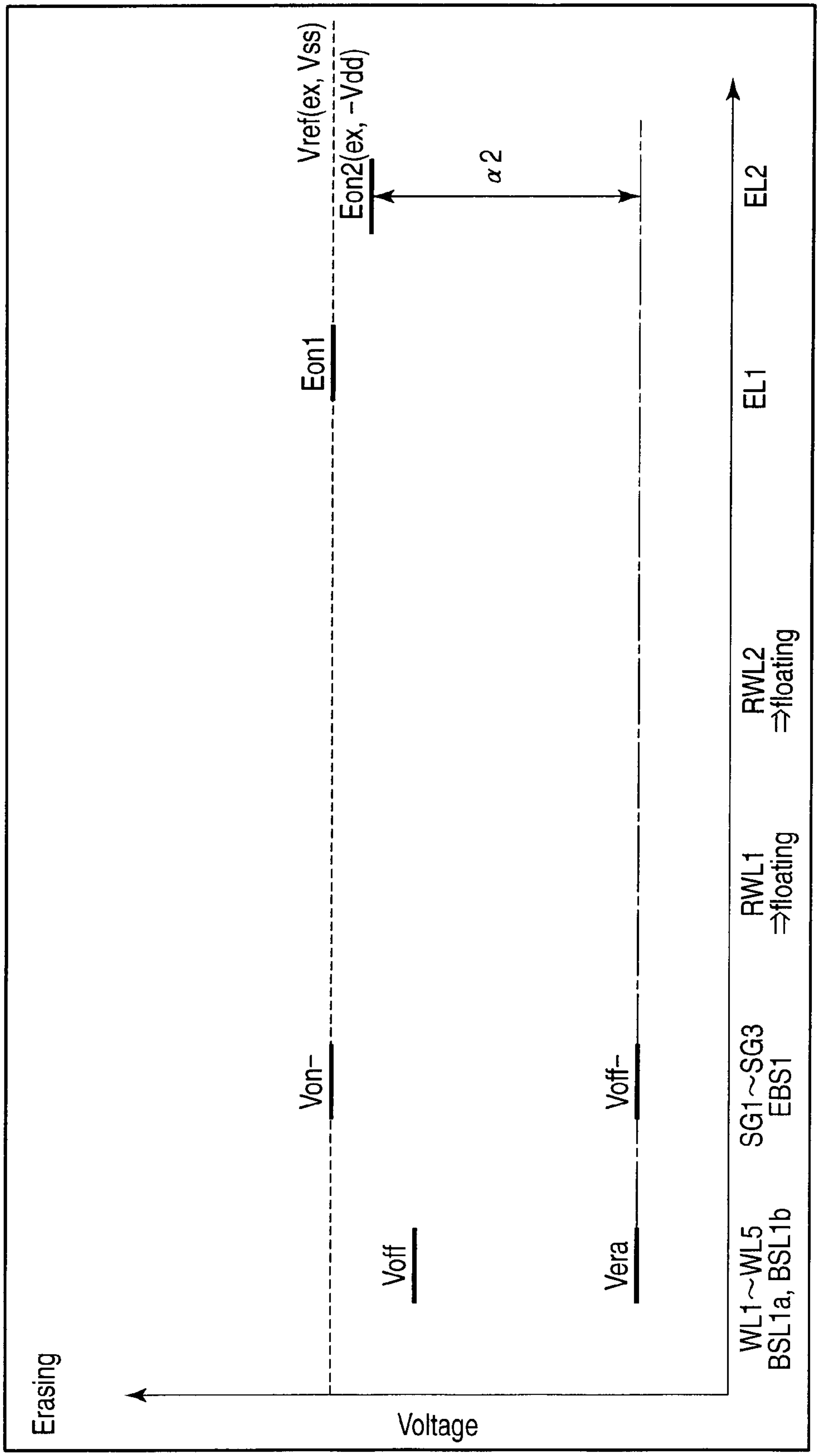
FIG. 80 and FIG. 81 are views showing the potential relation during data erasing, respectively.
Figure 81:
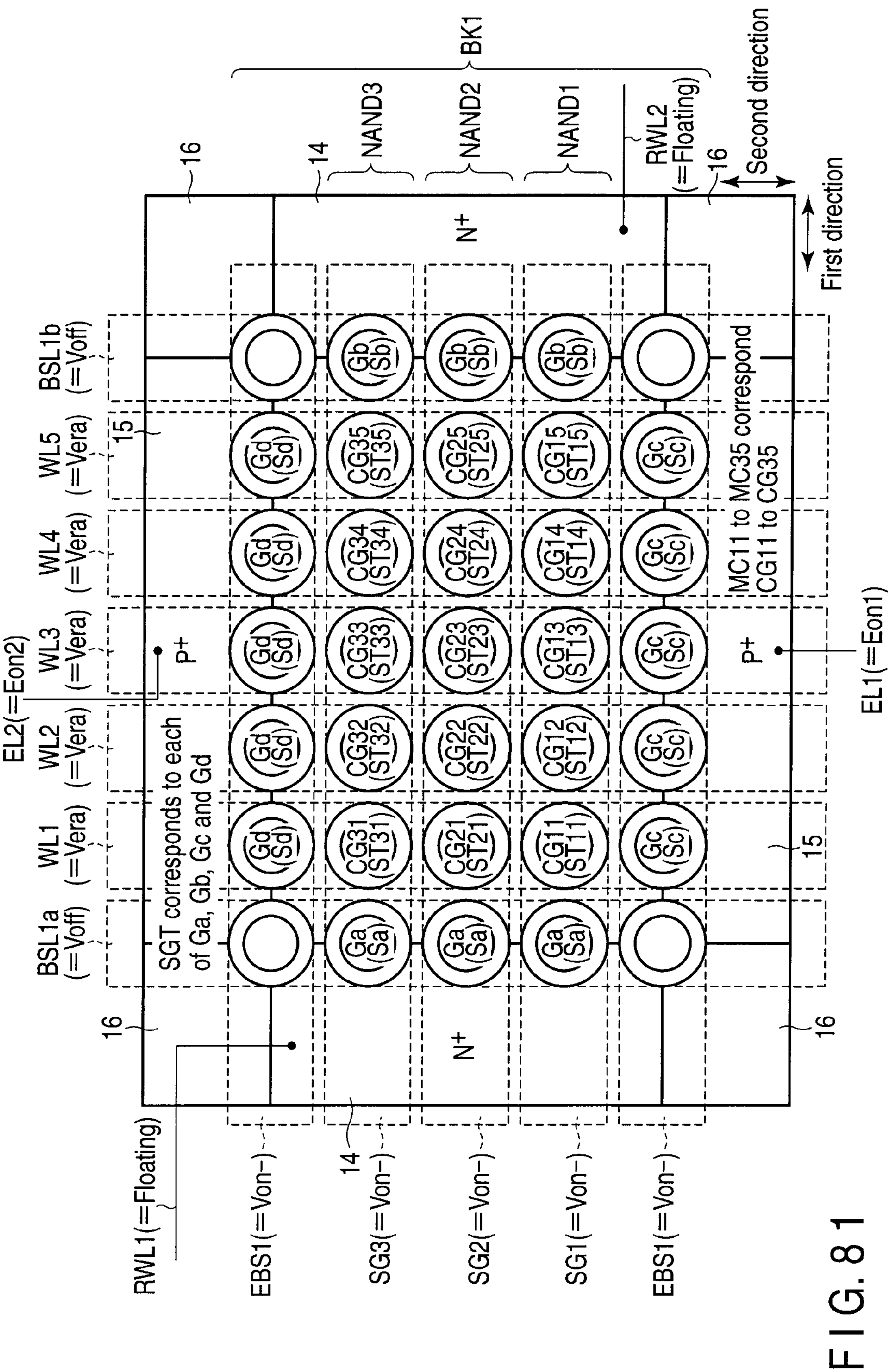

FIGS. 80 and 81 show the potential relation during data erasing.

When the block BK1 is the object to be erased, erase block select line EBS1 is set to Von−. Von− is the potential required for turning-on the second select transistor SGT at both ends of the memory cells MC11 to MC35 in the second direction.

When the block BK1 is not the object to be erased, erase block select line EBS1 is set to Voff−. Voff− is the potential required for turning-off the second select transistor SGT at both ends of the memory cells MC11 to MC35 in the second direction, and Voff− is equal to Vera for example.

All word lines WL1 to WL5 are set to Vera (for example, minus potential), and all select gate lines SG1 to SG3 are set to Von− (for example, Vref).

Read/write block select lines BSL1*a*, BSL1*b* are set to Voff.

First erase line EL1 is set to Eon1 (for example, Vref), and second erase line EL2 is set to Eon2 (for example, −Vdd). Vdd is the high potential side power supply potential.

In this example, for example Eon1 and Eon2 are set to satisfy Eon1>Eon2, so that holes (positive holes) flow to all NAND series NAND1 to NAND3, by generating the potential difference between the first and second erase lines EL1 and EL2.

First and second read/write lines RWL1 and RWL2 are set in a floating state, because they are not used during data erasing.

Here, reference potential Vref is set as Vss (for example, 0 V).

Figure 82:
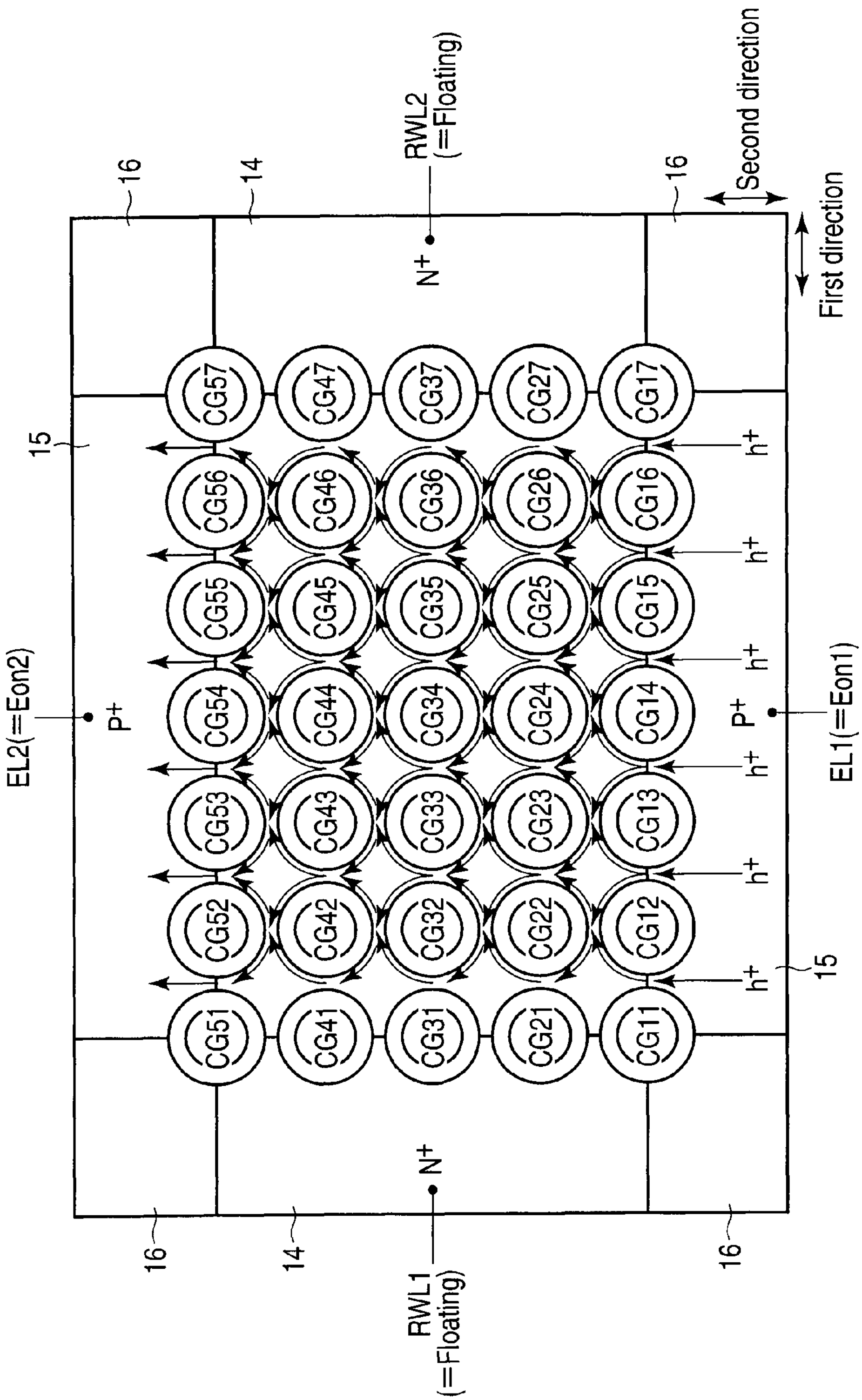
FIG. 82 is a view showing the electric conduction path.

When the above-described potential relation is maintained, for example as shown in FIG. 82, the electric conduction path is generated in all NAND series NAND1 to NAND3, to thereby allow holes (h+) to flow from the first erase line EL1 to the second erase line EL2. Further, in all memory cells, Eon2−Vera is applied between the control gates CG11 to CG35 and the channels, and therefore the holes (h+) are injected into the data recording layers (charge storage layers) of all memory cells MC11 to MC35.

Accordingly, data erasing is executed to all memory cells.

(2) Layout Based on the Second Basic Structure

Examples and operations of layout based on the second basic structure will be described in succession.

A. First Example

Figure 83:
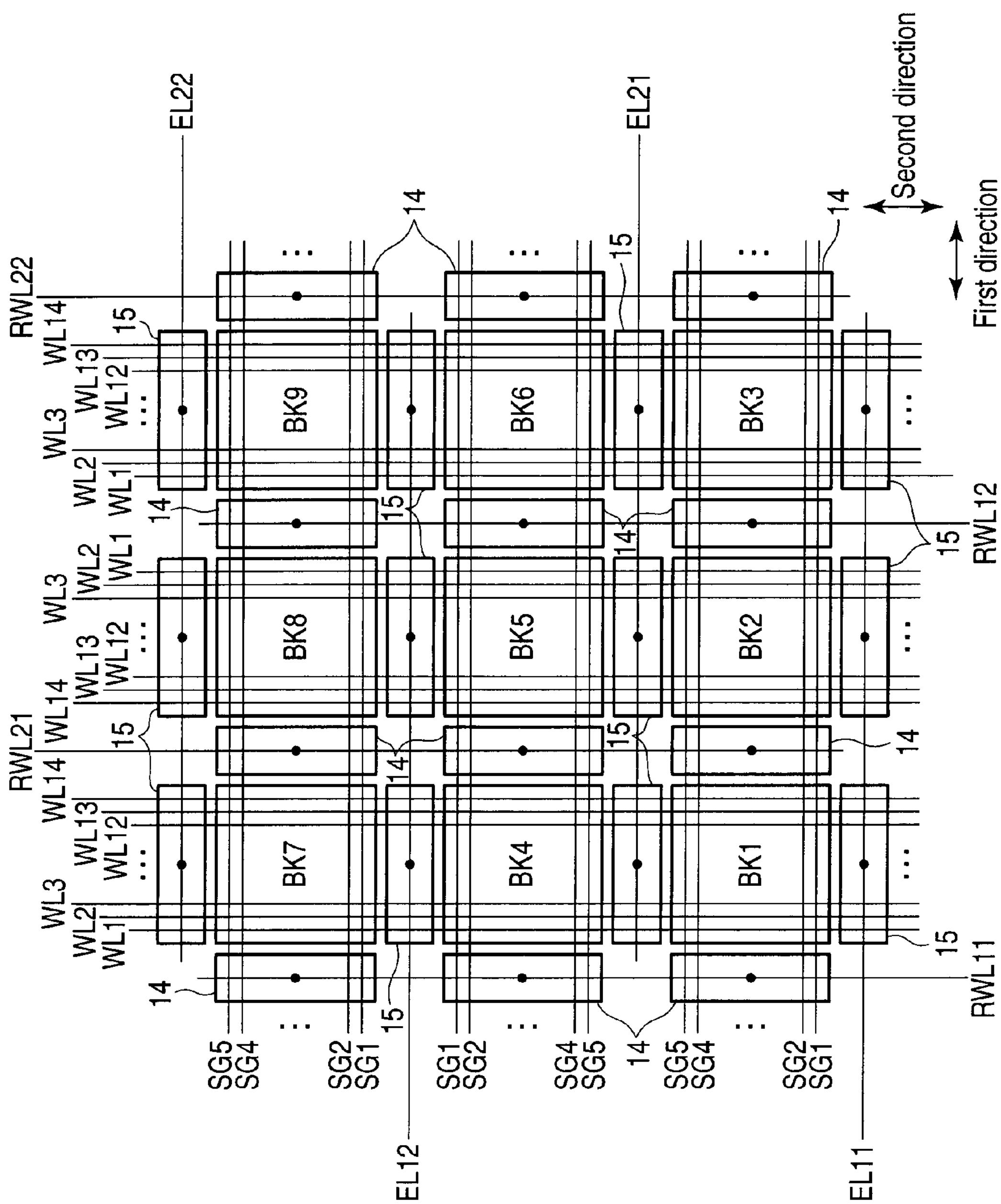
FIG. 83 is a view showing a first example of a layout based on a second basic structure.

FIG. 83 shows a first example of layout based on the second basic structure.

Each of blocks BK1 to BK9 has the second basic structure (FIGS. 5 to 9). Select gate lines SG1 to SG5 extend in the first direction on a memory cell array and word lines WL1 to WL14 extend in the second direction on the memory cell array.

Select gate lines SG1 to SG5 are shared by blocks, for example, three blocks BK1, BK2, BK3 arranged in the first direction. Word lines WL1 to WL14 are shared by blocks, for example, three blocks BK1, BK4, BK7 arranged in the second direction.

Read/write lines RWL11, RWL12 correspond to read/write line RWL1 in the second basic structure (FIGS. 5 to 9). Read/write lines RWL21, RWL22 correspond to read/write line RWL2 in the second basic structure (FIGS. 5 to 9).

Read/write lines RWL11, RWL12, RWL21, RWL22 are shared by N+-type diffusion layers 14 arranged in the second direction. One N+-type diffusion layer 14 is arranged between two blocks, for example, blocks BK1, BK2. That is, each of N+-type diffusion layers 14 is shared by two blocks arranged on both sides thereof.

Erase lines EL11, EL12 correspond to erase line EL1 in the second basic structure (FIGS. 5 to 9). Erase lines EL21, EL22 correspond to erase line EL2 in the second basic structure (FIGS. 5 to 9).

Erase lines EL11, EL12, EL21, EL22 are shared by P+-type diffusion layers 15 arranged in the first direction. One P+-type diffusion layer 15 is arranged between two blocks, for example, blocks BK1, BK4. That is, each of P+-type diffusion layers 15 is shared by two blocks arranged on both sides thereof.

According to the layout in the first example, improvement in memory performance such as the improved operating speed can be realized by blocking the memory cell array.

B. Second Example

FIG. 84 shows a second example of layout based on the second basic structure.

The second example is characterized, when compared with the first example, in that read/write block select lines BSL-odd1*a*, BSL-odd1*b*, BSL-odd2*a*, BSL-odd2*b*, BSL-odd3*a*, BSL-odd3*b*, BSL-even1*a*, BSL-even1*b*, BSL-even2*a*, BSL-even2*b*, BSL-even3*a*, BSL-even3*b* are newly provided in the memory cell array.

Each of blocks BK1 to BK9 has the second basic structure (FIGS. 5 to 9). Select gate lines SG1 to SG5 extend in the first direction on the memory cell array and word lines WL1 to WL10 extend in the second direction on the memory cell array.

Select gate lines SG1 to SG5 are shared by blocks, for example, three blocks BK1, BK2, BK3 arranged in the first direction. Word lines WL1 to WL10 are shared by blocks, for example, three blocks BK1, BK4, BK7 arranged in the second direction.

Read/write block select lines BSL-odd1*a*, BSL-odd1*b*, BSL-odd2*a*, BSL-odd2*b*, BSL-odd3*a*, BSL-odd3*b*, BSL-even1*a*, BSL-even1*b*, BSL-even2*a*, BSL-even2*b*, BSL-even3*a*, BSL-even3*b* are arranged at both ends of word lines WL1 to WL10 in the first direction. Like word lines WL1 to WL10, read/write block select lines BSL-odd1*a*, BSL-odd1*b*, BSL-odd2*a*, BSL-odd2*b*, BSL-odd3*a*, BSL-odd3*b*, BSL-even1*a*, BSL-even1*b*, BSL-even2*a*, BSL-even2*b*, BSL-even3*a*, BSL-even3*b* are shared by blocks, for example, three blocks BK1, BK4, BK7 arranged in the second direction.

Read/write block select lines BSL-odd1*a*, BSL-odd1*b*, BSL-odd2*a*, BSL-odd2*b*, BSL-odd3*a*, BSL-odd3*b*, BSL-even1*a*, BSL-even1*b*, BSL-even2*a*, BSL-even2*b*, BSL-even3*a*, BSL-even3*b* are used to select one block or more to be read/written at time of reading/writing.

Read/write lines RWL11, RWL12 correspond to read/write line RWL1 in the second basic structure (FIGS. 5 to 9). Read/write lines RWL21, RWL22 correspond to read/write line RWL2 in the second basic structure (FIGS. 5 to 9).

Read/write lines RWL11, RWL12, RWL21, RWL22 are shared by N+-type diffusion layers 14 arranged in the second direction. One N+-type diffusion layer 14 is arranged between two blocks, for example, blocks BK1, BK2. That is, each of N+-type diffusion layers 14 is shared by two blocks arranged on both sides thereof.

Erase lines EL11, EL12 correspond to erase line EL1 in the second basic structure (FIGS. 5 to 9). Erase lines EL21, EL22 correspond to erase line EL2 in the second basic structure (FIGS. 5 to 9).

Erase lines EL11, EL12, EL21, EL22 are shared by P+-type diffusion layers 15 arranged in the first direction. One P+-type diffusion layer 15 is arranged between two blocks, for example, blocks BK1, BK4. That is, each of P+-type diffusion layers 15 is shared by two blocks arranged on both sides thereof.

Also in the layout of the second example, like in the first example, improvement in memory performance such as the improved operating speed can be realized by blocking the memory cell array.

C. Third Example

FIG. 85 shows a third example of layout based on the second basic structure.

The third example is characterized, when compared with the first example, in that erase block select lines EBS1, EBS2, EBS3 are newly provided in the memory cell array.

Each of blocks BK1 to BK9 has the second basic structure (FIGS. 5 to 9). Select gate lines SG1 to SG3 extend in the first direction on the memory cell array and word lines WL1 to WL14 extend in the second direction on the memory cell array.

Select gate lines SG1 to SG3 are shared by blocks, for example, three blocks BK1, BK2, BK3 arranged in the first direction. Word lines WL1 to WL14 are shared by blocks, for example, three blocks BK1, BK4, BK7 arranged in the second direction.

Erase block select lines EBS1, EBS2, EBS3 are arranged at both ends of select gate lines SG1 to SG3 in the second direction. Like select gate lines SG1 to SG3, erase block select lines EBS1, EBS2, EBS3 are shared by blocks, for example, three blocks BK1, BK2, BK3 arranged in the first direction.

Erase block select lines EBS1, EBS2, EBS3 are used to select one block or more to be erased at time of erasing.

Read/write lines RWL11, RWL12 correspond to read/write line RWL1 in the second basic structure (FIGS. 5 to 9).

Read/write lines RWL21, RWL22 correspond to read/write line RWL2 in the second basic structure (FIGS. 5 to 9).

Read/write lines RWL11, RWL12, RWL21, RWL22 are shared by N+-type diffusion layers 14 arranged in the second direction. One N+-type diffusion layer 14 is arranged between two blocks, for example, blocks BK1, BK2. That is, each of N+-type diffusion layers 14 is shared by two blocks arranged on both sides thereof.

Erase lines EL11, EL12 correspond to erase line EL1 in the second basic structure (FIGS. 5 to 9). Erase lines EL21, EL22 correspond to erase line EL2 in the second basic structure (FIGS. 5 to 9).

Erase lines EL11, EL12, EL21, EL22 are shared by P+-type diffusion layers 15 arranged in the first direction. One P+-type diffusion layer 15 is arranged between two blocks, for example, blocks BK1, BK4. That is, each of P+-type diffusion layers 15 is shared by two blocks arranged on both sides thereof.

Also in the layout of the third example, like in the first example, improvement in memory performance such as the improved operating speed can be realized by blocking the memory cell array.

D. Fourth Embodiment

FIG. 86 shows a fourth example of layout based on the second basic structure.

The fourth example is characterized in that a combination of the second example and the third example, that is, read/write block select lines BSL-odd1*a*, BSL-odd1*b*, BSL-odd2*a*, BSL-odd2*b*, BSL-odd3*a*, BSL-odd3*b*, BSL-even1*a*, BSL-even1*b*, BSL-even2*a*, BSL-even2*b*, BSL-even3*a*, BSL-even3*b* and erase block select lines EBS1, EBS2, EBS3 are provided in the memory cell array.

Each of blocks BK1 to BK9 has the second basic structure (FIGS. 5 to 9). Select gate lines SG1 to SG3 extend in the first direction on the memory cell array and word lines WL1 to WL10 extend in the second direction on the memory cell array.

Select gate lines SG1 to SG3 are shared by blocks, for example, three blocks BK1, BK2, BK3 arranged in the first direction. Word lines WL1 to WL10 are shared by blocks, for example, three blocks BK1, BK4, BK7 arranged in the second direction.

Read/write block select lines BSL-odd1*a*, BSL-odd1*b*, BSL-odd2*a*, BSL-odd2*b*, BSL-odd3*a*, BSL-odd3*b*, BSL-even1*a*, BSL-even1*b*, BSL-even2*a*, BSL-even2*b*, BSL-even3*a*, BSL-even3*b* are arranged at both ends of word lines WL1 to WL10 in the first direction. Like word lines WL1 to WL10, read/write block select lines BSL-odd1*a*, BSL-odd1*b*, BSL-odd2*a*, BSL-odd2*b*, BSL-odd1*a*, BSL-odd3*b*, BSL-even1*a*, BSL-even1*b*, BSL-even2*a*, BSL-even2*b*, BSL-even3*a*, BSL-even3*b* are shared by blocks, for example, three blocks BK1, BK4, BK7 arranged in the second direction.

Read/write block select lines BSL-odd1*a*, BSL-odd1*b*, BSL-odd2*a*, BSL-odd2*b*, BSL-odd3*a*, BSL-odd3*b*, BSL-even1*a*, BSL-even1*b*, BSL-even2*a*, BSL-even2*b*, BSL-even3*a*, BSL-even3*b* are used to select one block or more to be read/written at time of reading/writing.

Erase block select lines EBS1, EBS2, EBS3 are arranged at both ends of select gate lines SG1 to SG3 in the second direction. Like select gate lines SG1 to SG3, erase block select lines EBS1, EBS2, EBS3 are shared by blocks, for example, three blocks BK1, BK2, BK3 arranged in the first direction.

Erase block select lines EBS1, EBS2, EBS3 are used to select one block or more to be erased at time of erasing.

Read/write lines RWL11, RWL12 correspond to read/write line RWL1 in the second basic structure (FIGS. 5 to 9). Read/write lines RWL21, RWL22 correspond to read/write line RWL2 in the second basic structure (FIGS. 5 to 9).

Read/write lines RWL11, RWL12, RWL21, RWL22 are shared by N+-type diffusion layers 14 arranged in the second direction. One N+-type diffusion layer 14 is arranged between two blocks, for example, blocks BK1, BK2. That is, each of N+-type diffusion layers 14 is shared by two blocks arranged on both sides thereof.

Erase lines EL11, EL12 correspond to erase line EL1 in the second basic structure (FIGS. 5 to 9). Erase lines EL21, EL22 correspond to erase line EL2 in the second basic structure (FIGS. 5 to 9).

Erase lines EL11, EL12, EL21, EL22 are shared by P+-type diffusion layers 15 arranged in the first direction. One P+-type diffusion layer 15 is arranged between two blocks, for example, blocks BK1, BK4. That is, each of P+-type diffusion layers 15 is shared by two blocks arranged on both sides thereof.

Also in the layout of the fourth example, like in the first example, improvement in memory performance such as the improved operating speed can be realized by blocking the memory cell array.

E. Write Operation

Potential relations at time of writing will be described using the fourth example.

First, the structure of a memory cell array when the second basic structure (FIGS. 5 to 9) is applied to the fourth example will be described.

FIG. 87 shows the structure of a memory cell array.

FIG. 87 corresponds to block BK1 in FIG. 86. Other blocks BK2 to BK9 in FIG. 86 also have the same structure as that of block BK1.

The structure is characterized by the memory cell layout.

Memory cells MC11 to MC35 (control gates CG11 to CG35) are arranged in intersections of word lines WL1 to WL10 and select gate lines SG1 to SG3. Similarly, select transistors ST11 to ST35 are also arranged in intersections of word lines WL1 to WL10 and select gate lines SG1 to SG3.

Thus, the memory cell array has an array size with 3×5.

In the present example, first and second select transistors SGT are newly arranged inside the memory cell array.

First select transistor SGT (select gates Ga, Gb) corresponds to a select transistor connected to a NAND series of a conventional NAND flash memory. First select transistor SGT is arranged at both ends in the first direction of NAND series NAND1, NAND2, NAND3, that is, in intersections of read/write block select lines BSL-odd1*a*, BSL-odd1*b*, BSL-even1*a*, BSLeven1*b* and select gate lines SG1 to SG3.

Select transistors Sa, Sb are connected between select gates Ga, Gb and read/write block select lines BSL-odd1*a*, BSL-odd1*b*, BSL-even1*a*, BSLeven1*b*.

Second select transistor SGT (select gates Gc, Gd) is not present in a conventional NAND flash memory. Second select transistor SGT is arranged at both ends in the second direction of NAND series NAND1, NAND2, NAND3, that is, in intersections of erase block select line EBS1 and word lines WL1 to WL10.

Select transistors Sc, Sd are connected between select gates Gc, Gd and word lines WL1 to WL10.

Read/write lines RWL1, RWL2 are connected to N+-type diffusion layer 14 and erase lines EL1, EL2 are connected to P+-type diffusion layer 15. N+-type diffusion layer 14 and P+-type diffusion layer 15 are insulated from each other by element isolation insulating layer 16.

An example in which data is written into memory cell M23 in NAND series NAND2 in the structure will be described.

E-1. First Example

Figure 88:
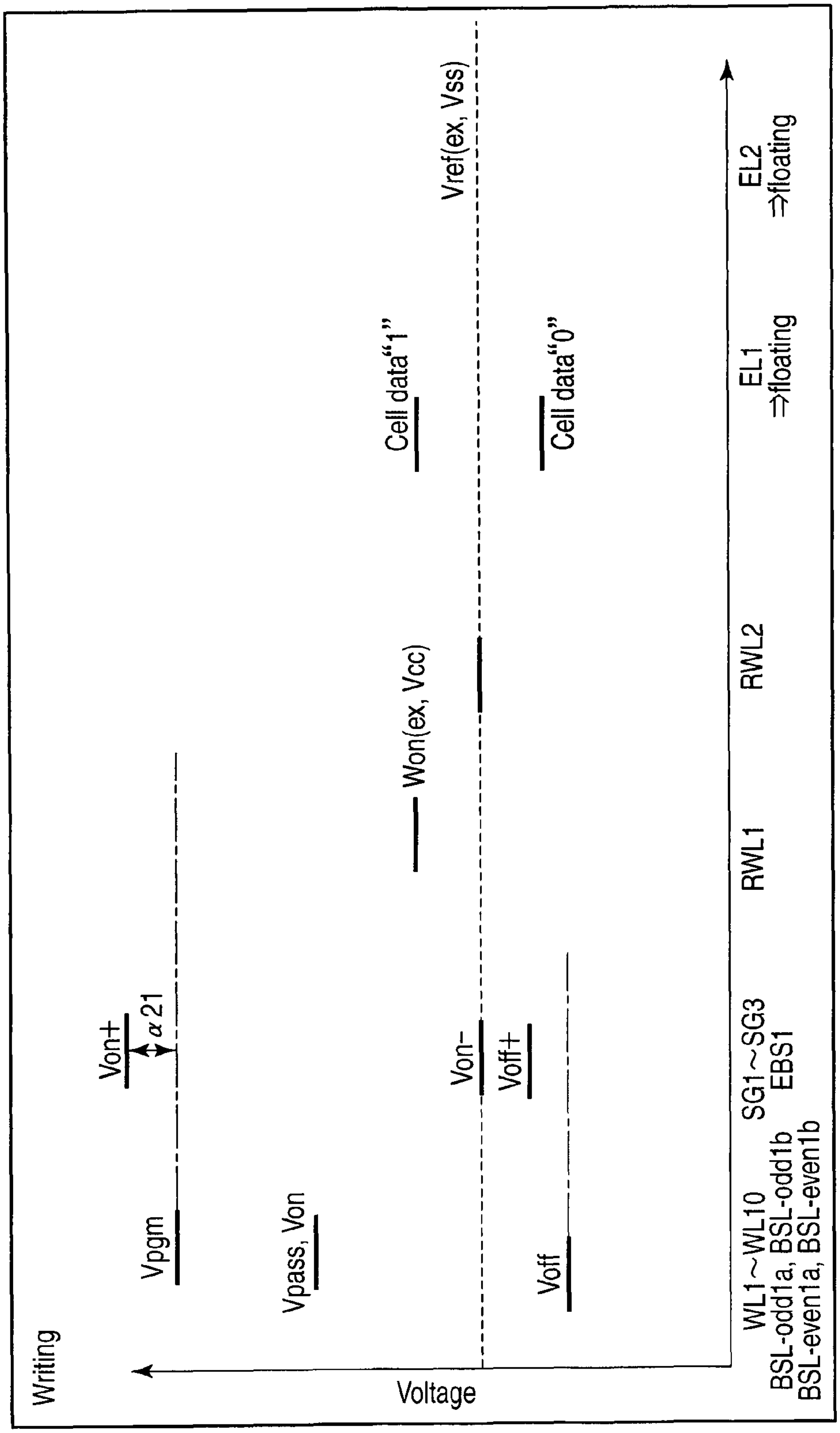

FIGS. 88 and 89 show a first example of potential relations at time of writing.

When block BK1 is to be written into, the selected NAND series is NAND2 and thus, read/write block select lines BSL-even1*a*, BSL-even1*b* are set to Von and read/write block select lines BSL-odd1*a*, BSL-odd1*b* are set to Voff.

In general, when the selected NAND series containing a memory cell to be written into is odd-numbered (NAND1, NAND3, . . . ), read/write block select lines BSL-odd1*a*, BSL-odd1*b* are set to Von.

When the selected NAND series containing a memory cell to be written into is even-numbered (NAND2, . . . ), read/write block select lines BSL-even1*a*, BSL-even1*b* are set to Von.

When block BK1 is not to be written into, read/write block select lines BSL-odd1*a*, BSL-odd1*b*, BSL-even1*a*, BSL-even1*b* are set to Voff.

Von is a potential necessary to turn on first select transistors SGT at both ends of the NAND series and is made equal to, for example, Vpass. Voff is a potential necessary to turn off first select transistors SGT at both ends of the NAND series and, for example, a minus potential.

Selected word line WL5 is set to Vpgm. Selected word line WL5 is an odd-numbered word line and thus, odd-numbered unselected word lines WL1, WL3, WL7, WL9 are set to Vpass. Even-numbered unselected word lines WL2, WL4, WL6, WL8, WL10 are set to Voff.

Vpass is a potential necessary to generate an electric conduction path in selected NAND series NAND2 irrespective of memory cell data (threshold) and Voff is a potential necessary to prevent generation of an electric conduction path in unselected NAND series NAND1, NAND3 irrespective of memory cell data (threshold). Vpgm is a potential necessary for writing. In the present example, Vpgm>Vpass>Voff.

Selected select gate line SG2 is set to Von+, unselected select gate lines SG1, SG3 on both sides thereof are set to Von−, and other unselected select gate lines are set to Voff+.

Erase block select line EBS1 is set to Voff+.

Von+ is a potential necessary to turn on select transistors ST21 to ST25, Sa, Sb and Von− is a potential necessary to turn on select transistors ST11 to ST15, ST31 to ST35, Sa, Sb. Voff+ is a potential necessary to turn off select transistors Sc, Sd. In the present example, Von+>Von−>Voff+.

First read/write line RWL1 is set to Won (for example, high-potential side power supply potential Vdd) and second read/write line RWL2 is set to Vref (for example, low-potential side power supply potential Vss). To cause a current (electrons) to flow to selected NAND series NAND3 by causing a potential difference between first and second read/write lines RWL1, RWL2, it is necessary to set, for example, Won>Vref.

First and second erase lines EL1, EL2 are not used at time of writing and thus set to floating.

Reference potential Vref is defined, for example, as a center between the threshold (maximum value of threshold distribution) of cell data "0" and the threshold (minimum value of threshold distribution) of cell data "1" and more specifically, set to Vss (for example, 0 V).

Figure 90:
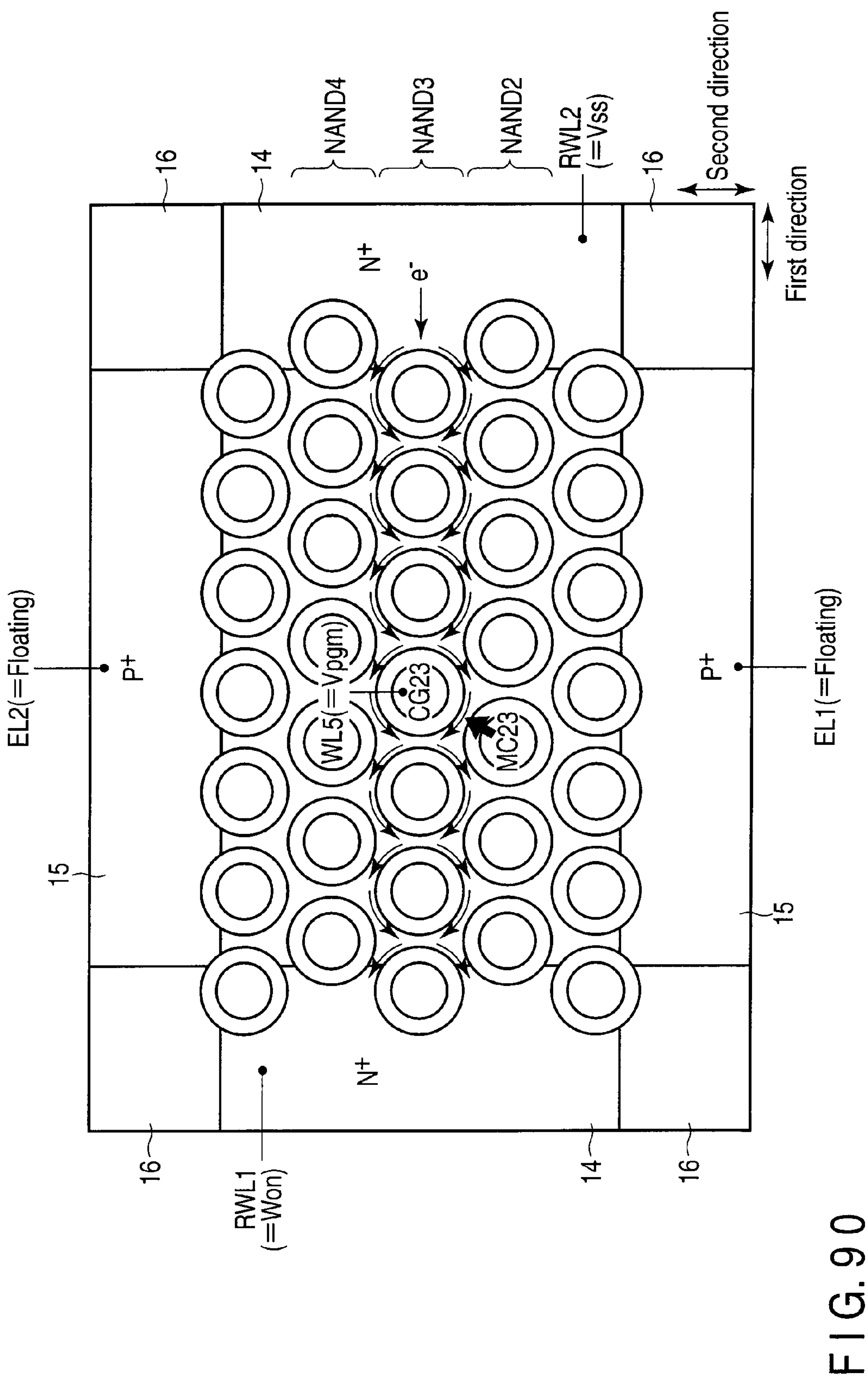
FIG. 90 is a view showing the electric conduction path.

When block BK1 is to be written into, for example, as shown in FIG. 90, an electric conduction path is generated in selected NAND series NAND2 and electrons (e−) flow from second read/write line RWL2 toward first read/write line RWL1. In selected memory cell MC23, Vpgm−Won is applied to between control gate CG23 and a channel and thus, electrons are injected into a data recording layer (charge storage layer) of selected memory cell MC23.

Therefore, a data write operation into selected memory cell MC23 is executed.

E-2. Second Example

Figure 91:
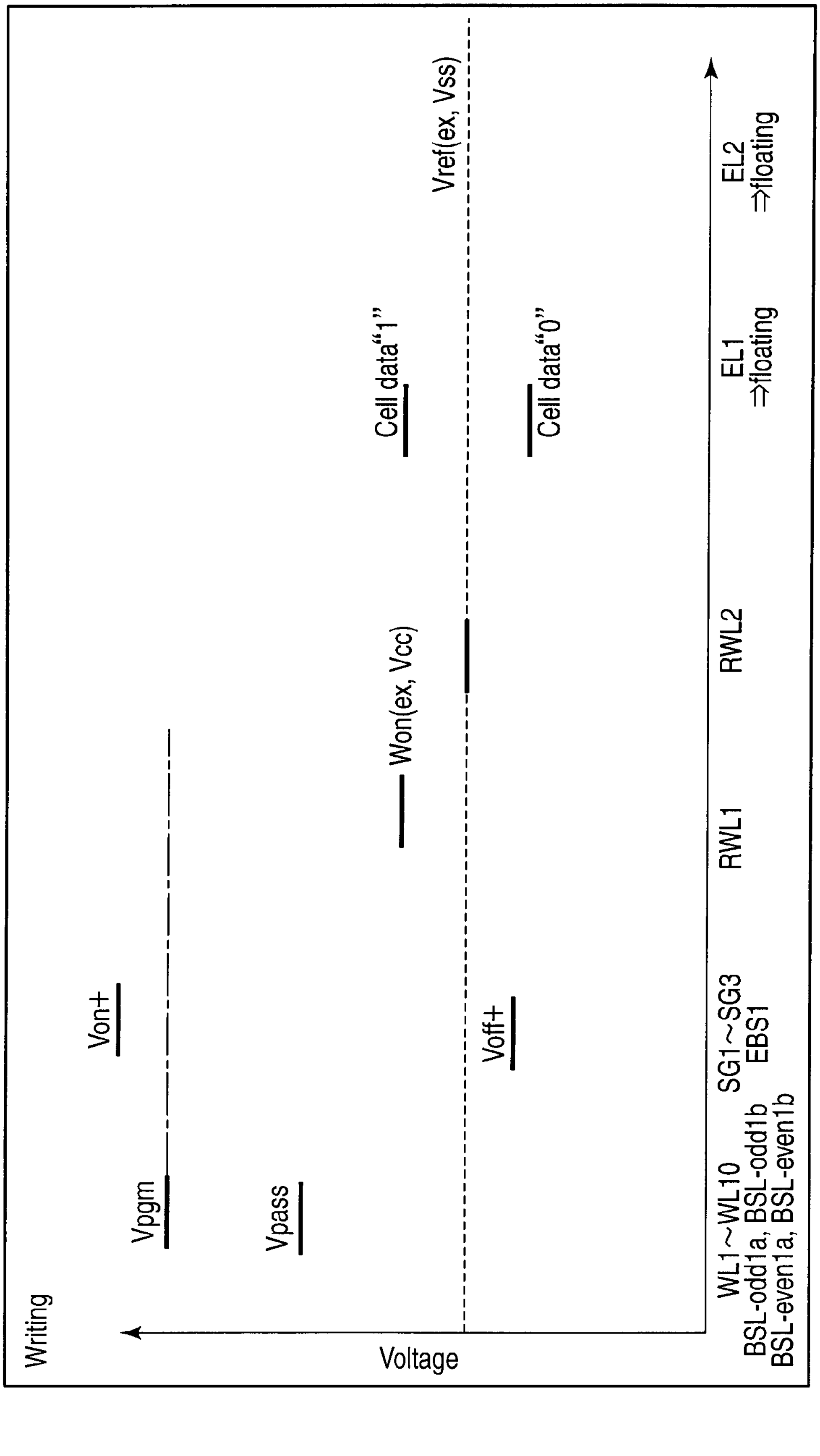
FIG. 91 and FIG. 92 are views showing a second example of the potential relation during data writing, respectively.
Figure 92:
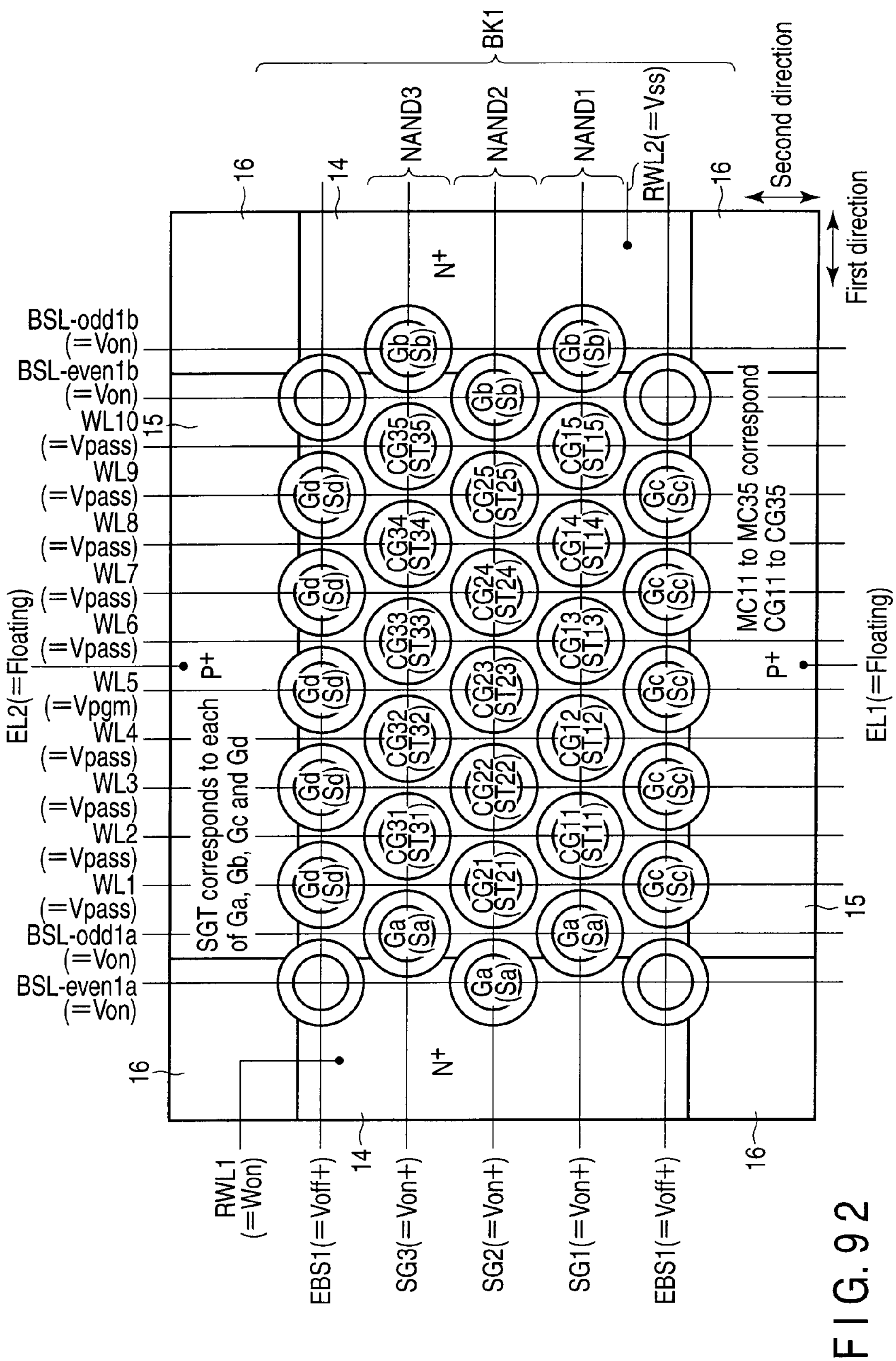

FIGS. 91 and 92 show a second example of potential relations at time of writing.

When block BK1 is to be written into, read/write block select lines BSL-odd1*a*, BSL-odd1*b*, BSL-even1*a*, BSL-even1*b* are set to Von. When block BK1 is not to be written into, read/write block select lines BSL-odd1*a*, BSL-odd1*b*, BSL-even1*a*, BSL-even1*b* are set to Voff.

Von is a potential necessary to turn on first select transistors SGT at both ends of the NAND series and is made equal to, for example, Vpass. Voff is a potential necessary to turn off first select transistors SGT at both ends of the NAND series and, for example, a minus potential.

Selected word line WL5 is set to Vpgm and unselected word lines WL1 to WL4, WL6 to WL10 are set to Vpass. Vpass is a potential necessary to generate an electric conduction path in selected NAND series NAND2 and unselected NAND series NAND1, NAND3 on both sides thereof irrespective of memory cell data (threshold). Vpgm is a potential necessary for writing. In the present example, Vpgm>Vpass.

Selected select gate line SG2 and unselected select gate lines SG1, SG3 on both sides thereof are set to Von+ and other unselected select gate lines are set to Voff+.

Erase block select line EBS1 is set to Voff+.

Von+ is a potential necessary to turn on select transistors ST11 to ST15, ST21 to ST25, ST31 to ST35, Sa, Sb and Voff+ is a potential necessary to turn off select transistors Sc, Sd. In the present example, Von+>Voff+.

First read/write line RWL1 is set to Won, and second read/write line RWL2 is set to Vref. To cause a current (electrons) to flow to selected NAND series NAND2 and unselected NAND series NAND1, NAND3 on both sides thereof by causing a potential difference between first and second read/write lines RWL1, RWL2, it is necessary to set, for example, Won>Vref.

First and second erase lines EL1, EL2 are not used at time of writing and thus set to floating.

Reference potential Vref is defined, for example, as a center between the threshold (maximum value of threshold distribution) of cell data "0" and the threshold (minimum value of threshold distribution) of cell data "1" and more specifically, set to Vss (for example, 0 V).

Figure 93:
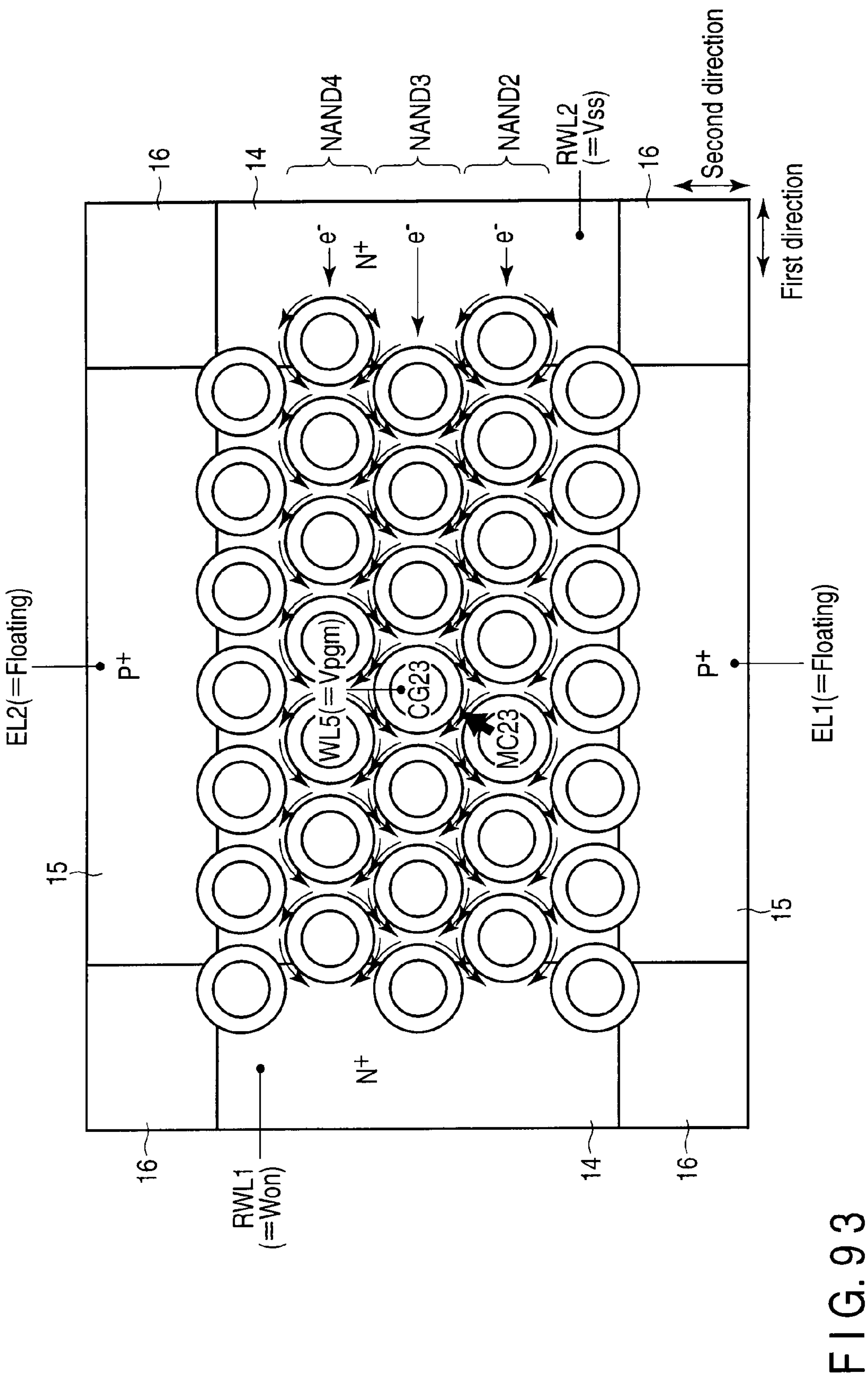
FIG. 93 is a view showing the electric conduction path.

When block BK1 is to be written into, for example, as shown in FIG. 93, an electric conduction path is generated in selected NAND series NAND2 and unselected NAND series NAND1, NAND3 on both sides thereof and electrons (e−) flow from second read/write line RWL2 toward first read/write line RWL1. In selected memory cell MC23, Vpgm−Vref is applied to between control gate CG23 and a channel and thus, electrons are injected into the data recording layer (charge storage layer) of selected memory cell MC23.

Therefore, a data write operation into selected memory cell MC23 is executed.

E-3. Third Example

Figure 95:
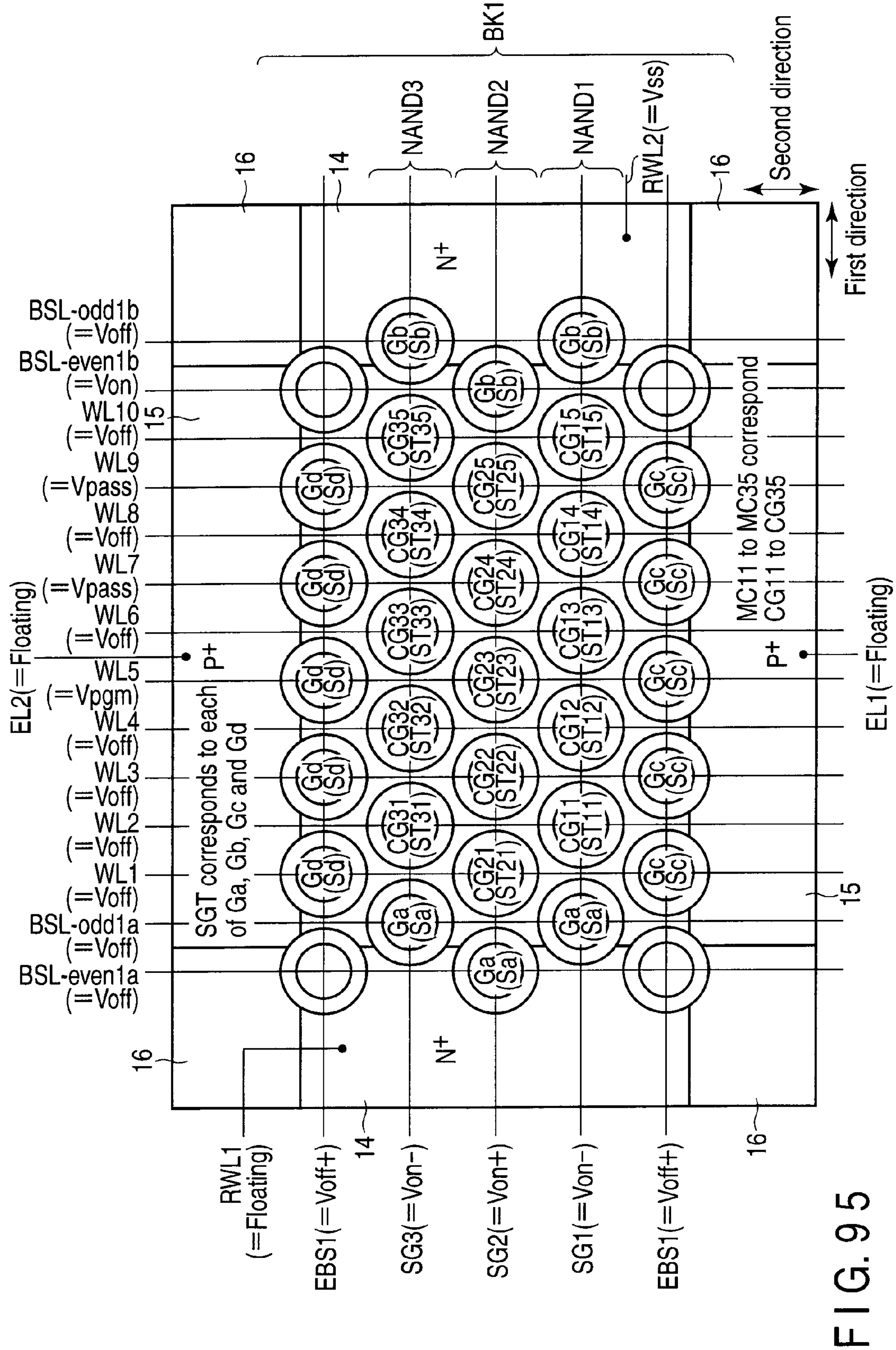

FIGS. 94 and 95 show a third example of potential relations at time of writing.

When block BK1 is to be written into, the selected NAND series is NAND2 and thus, read/write block select line BSL-even1*b* is set to Von and read/write block select lines BSL-even1*a*, BSL-odd1*a*, BSL-odd1*b* are set to Voff.

In general, when the selected NAND series containing a memory cell to be written into is odd-numbered (NAND1, NAND3, . . . ), read/write block select line BSL-odd1*b* is set to Von.

When the selected NAND series containing a memory cell to be written into is even-numbered (NAND2, . . . ), read/write block select line BSL-even1*b* is set to Von.

When block BK1 is not to be written into, read/write block select lines BSL-odd1*a*, BSL-odd1*b*, BSL-even1*a*, BSL-even1*b* are set to Voff.

Von is a potential necessary to turn on first select transistors SGT at both ends of the NAND series and is made equal to, for example, Vpass. Voff is a potential necessary to turn off first select transistors SGT at both ends of the NAND series and, for example, a minus potential.

Selected word line WL5 is set to Vpgm and unselected word lines WL1 to WL4 on the left side of word line WL5 are set to Voff. Odd-numbered unselected word lines WL7, WL9 of unselected word lines WL6 to WL10 on the right side of word line WL5 are set to Vpass. Even-numbered unselected word lines WL6, WL8, WL10 of unselected word lines WL6 to WL10 on the right side of word line WL5 are set to Voff.

Vpass is a potential necessary to generate an electric conduction path in the right half of selected NAND series NAND2 irrespective of memory cell data (threshold) and Voff is a potential necessary to prevent generation of an electric conduction path in the left half of selected NAND series NAND2 and unselected NAND series NAND1, NAND3 irrespective of memory cell data (threshold). Vpgm is a potential necessary for writing. In the present example, Vpgm>Vpass>Voff.

Selected select gate line SG2 is set to Von+, unselected select gate lines SG1, SG3 on both sides thereof are set to Von−, and other unselected select gate lines are set to Voff+.

Erase block select line EBS1 is set to Voff+.

Von+ is a potential necessary to turn on select transistors ST21 to ST25, Sa, Sb and Von− is a potential necessary to turn on select transistors ST11 to ST15, ST31 to ST35, Sa, Sb. Voff+ is a potential necessary to turn off select transistors Sc, Sd. In the present example, Von+>Von−>Voff+.

First read/write line RWL1 is set to floating and second read/write line RWL2 is set to Vref. First and second erase lines EL1, EL2 are not used at time of writing and thus set to floating.

Reference potential Vref is defined, for example, as a center between the threshold (maximum value of threshold distribution) of cell data "0" and the threshold (minimum value of threshold distribution) of cell data "1" and more specifically, set to Vss (for example, 0 V).

Figure 96:
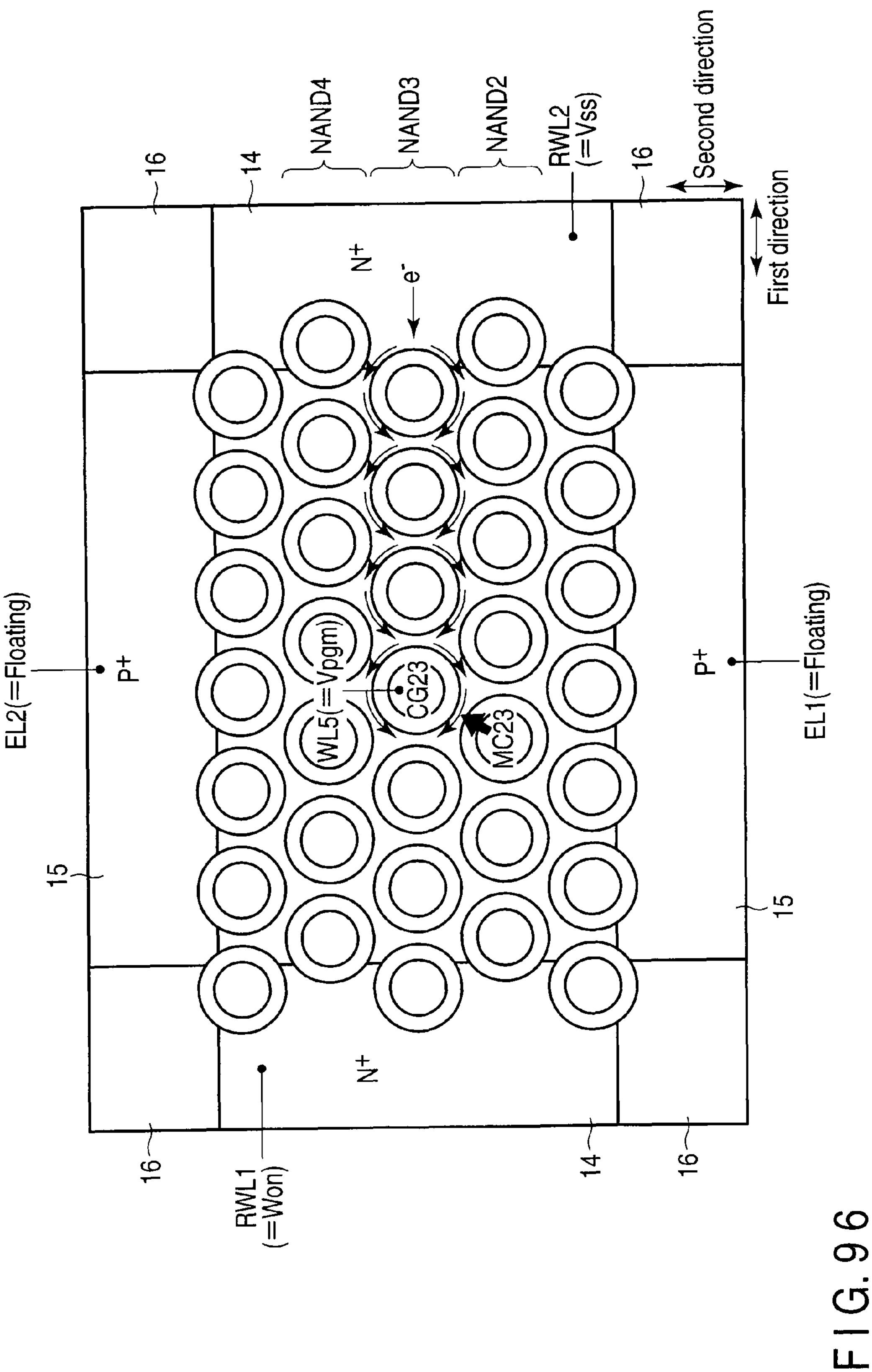
FIG. 96 is a view showing the electric conduction path.

When block BK1 is to be written into, for example, as shown in FIG. 96, an electric conduction path is generated in selected NAND series NAND2 and electrons (e−) flow from second read/write line RWL2 toward selected memory cell MS23. In selected memory cell MC23, Vpgm−Vref is applied to between control gate CG23 and a channel and thus, electrons are injected into the data recording layer (charge storage layer) of selected memory cell MC23.

Therefore, a data write operation into selected memory cell MC23 is executed.

E-4. Fourth Example

Figure 97:
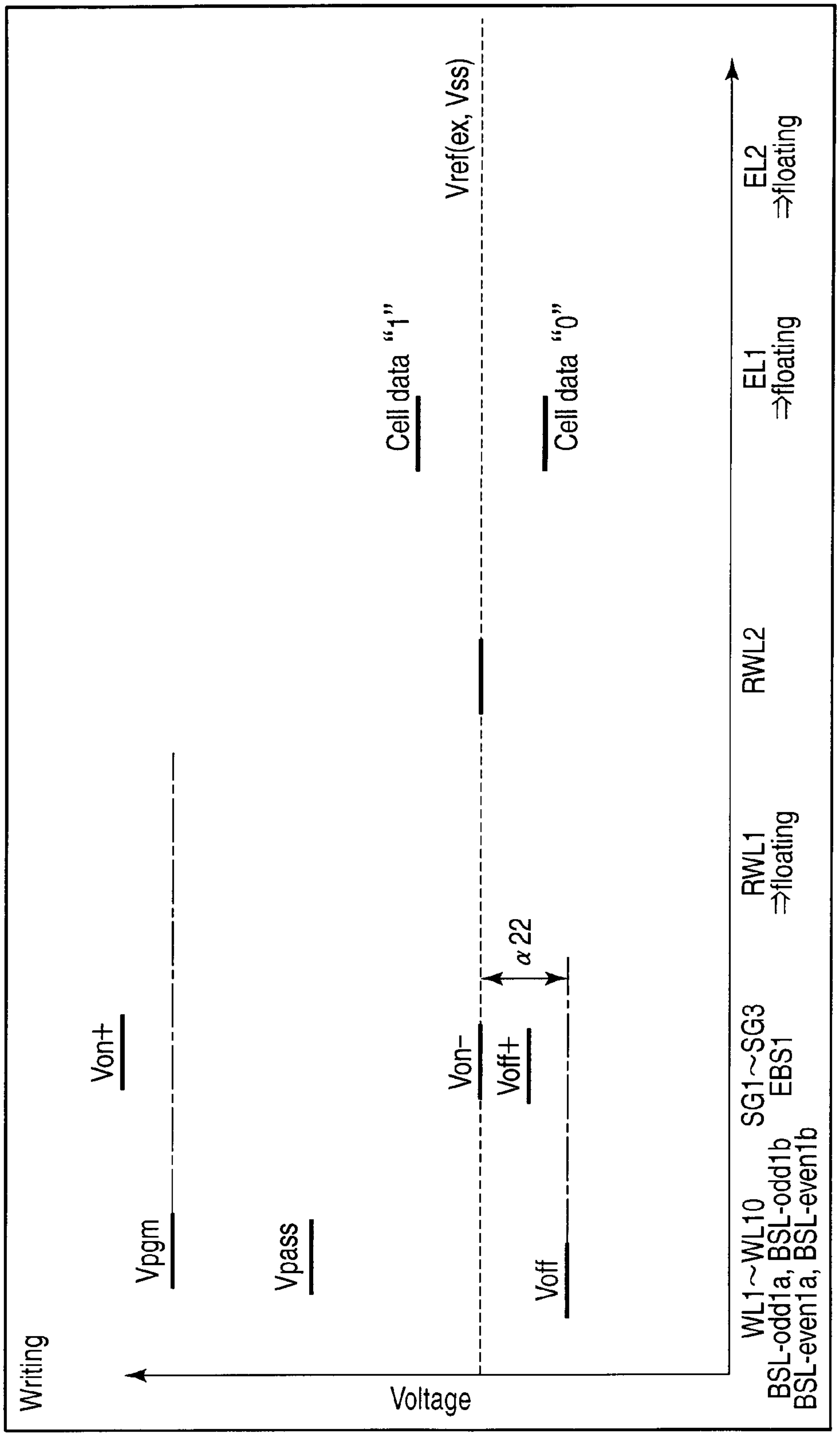
FIG. 97 and FIG. 98 are views showing a fourth example of the potential relation during data writing, respectively.
Figure 98:
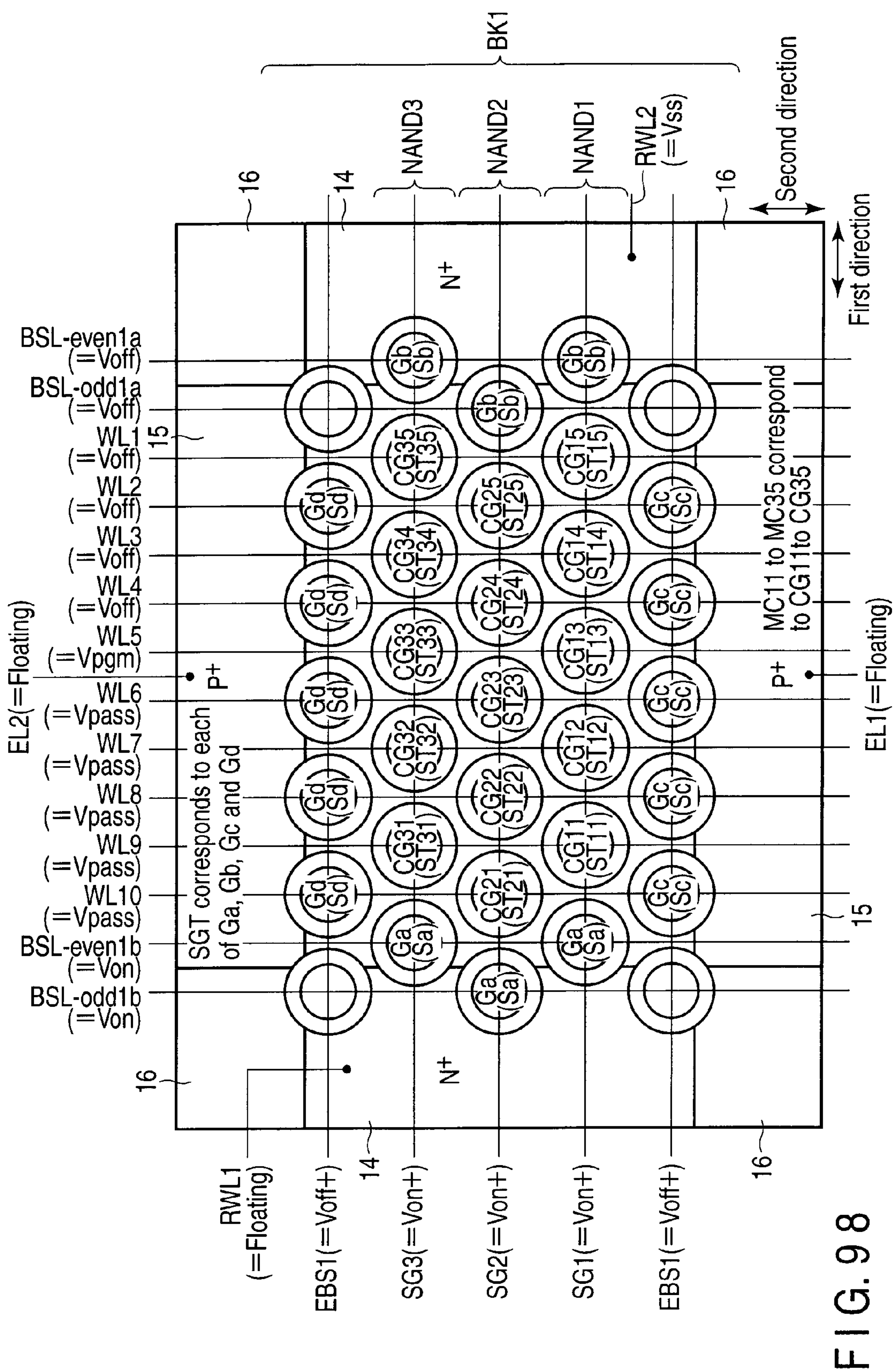

FIGS. 97 and 98 show a fourth example of potential relations at time of writing.

When block BK1 is to be written into, read/write block select lines BSL-odd1*b*, BSL-even1*b* are set to Von and read/write block select lines BSL-odd1*a*, BSL-even1*a* are set to Voff.

When block BK1 is not to be written into, read/write block select lines BSL-odd1*a*, BSL-odd1*b*, BSL-even1*a*, BSL-even1*b* are set to Voff.

Von is a potential necessary to turn on first select transistors SGT at both ends of the NAND series and is made equal to, for example, Vpass. Voff is a potential necessary to turn off first select transistors SGT at both ends of the NAND series and, for example, a minus potential.

Selected word line WL5 is set to Vpgm and unselected word lines WL1 to WL4 on the left side of word line WL5 are set to Voff. Unselected word lines WL6 to WL10 on the right side of word line WL5 are set to Vpass.

Vpass is a potential necessary to generate an electric conduction path in the right half of selected NAND series NAND2 and the right half of unselected NAND series NAND1, NAND3 on both sides thereof irrespective of memory cell data (threshold) and Voff is a potential necessary to prevent generation of an electric conduction path in the left half of selected NAND series NAND2 and the left half of unselected NAND series NAND1, NAND3 on both sides thereof irrespective of memory cell data (threshold). Vpgm is a potential necessary for writing. In the present example, Vpgm>Vpass>Voff.

Selected select gate line SG2 is set to Von+, unselected select gate lines SG1, SG3 on both sides thereof are set to Von−, and other unselected select gate lines are set to Voff+.

Erase block select line EBS1 is set to Voff+.

Von+ is a potential necessary to turn on select transistors ST21 to ST25, Sa, Sb and Von− is a potential necessary to turn on select transistors ST11 to ST15, ST31 to ST35, Sa, Sb. Voff+ is a potential necessary to turn off select transistors Sc, Sd. In the present example, Von+>Von−>Voff+.

First read/write line RWL1 is set to floating and second read/write line RWL2 is set to Vref. First and second erase lines EL1, EL2 are not used at time of writing and thus set to floating.

Reference potential Vref is defined, for example, as a center between the threshold (maximum value of threshold distribution) of cell data "0" and the threshold (minimum value of threshold distribution) of cell data "1" and more specifically, set to Vss (for example, 0 V).

Figure 99:
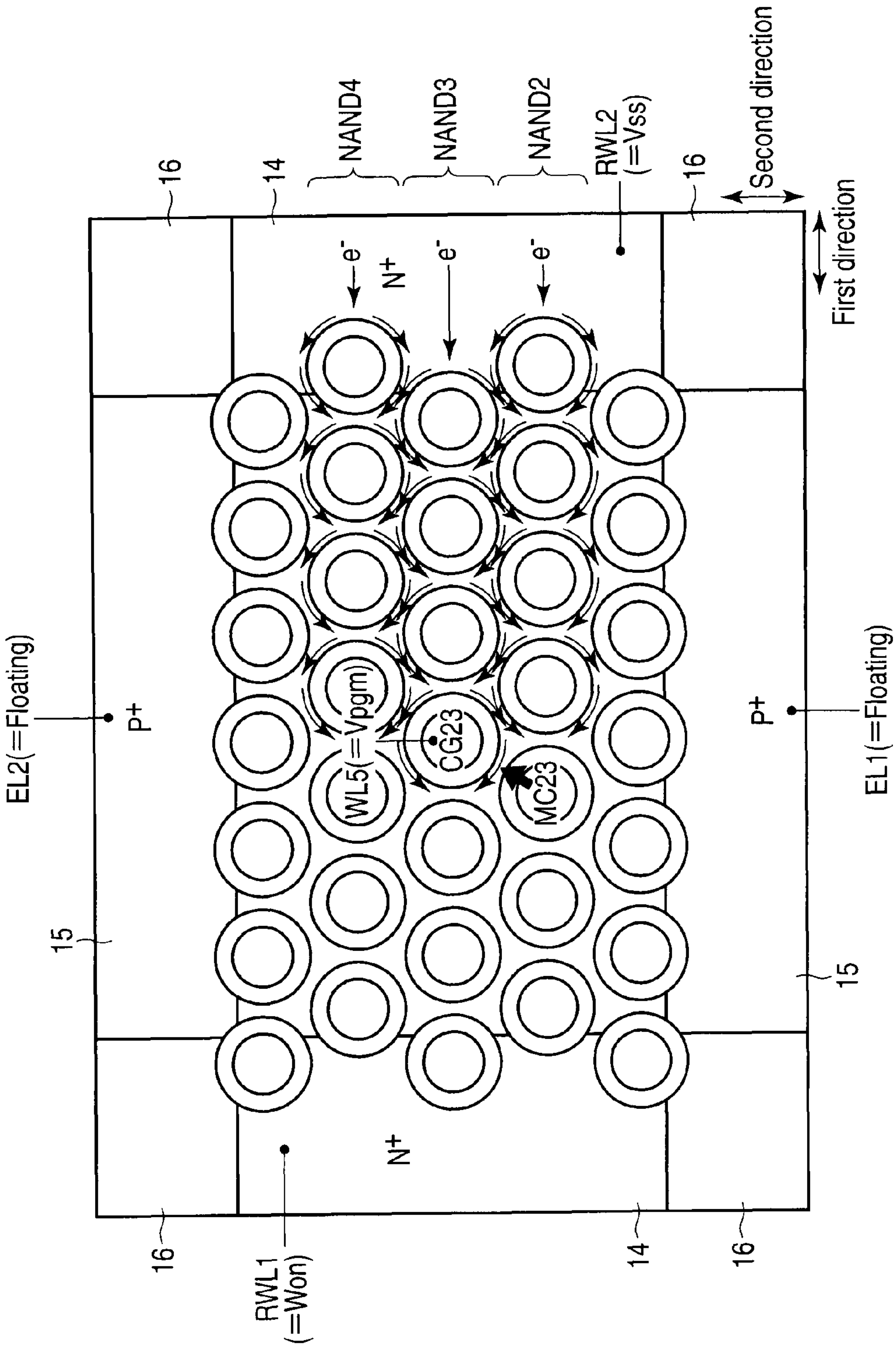
FIG. 99 is a view showing the electric conduction path.

When block BK1 is to be written into, for example, as shown in FIG. 99, an electric conduction path is generated in selected NAND series NAND2 and unselected NAND series NAND1, NAND3 on both sides thereof and electrons (e−) flow from second read/write line RWL2 toward selected memory cell MS23. In selected memory cell MC23, Vpgm−Vref is applied to between control gate CG23 and a channel and thus, electrons are injected into the data recording layer (charge storage layer) of selected memory cell MC23.

Therefore, a data write operation into selected memory cell MC23 is executed.

F. Read Operation

An example in which data is read from memory cell M23 in NAND series NAND2 in the structure shown in FIG. 87 will be described.

FIGS. 100 to 106 show a read operation in a memory cell array according to the second basic structure. The read operation is executed in first and second steps shown below.

F-1. First Step

Figure 101:
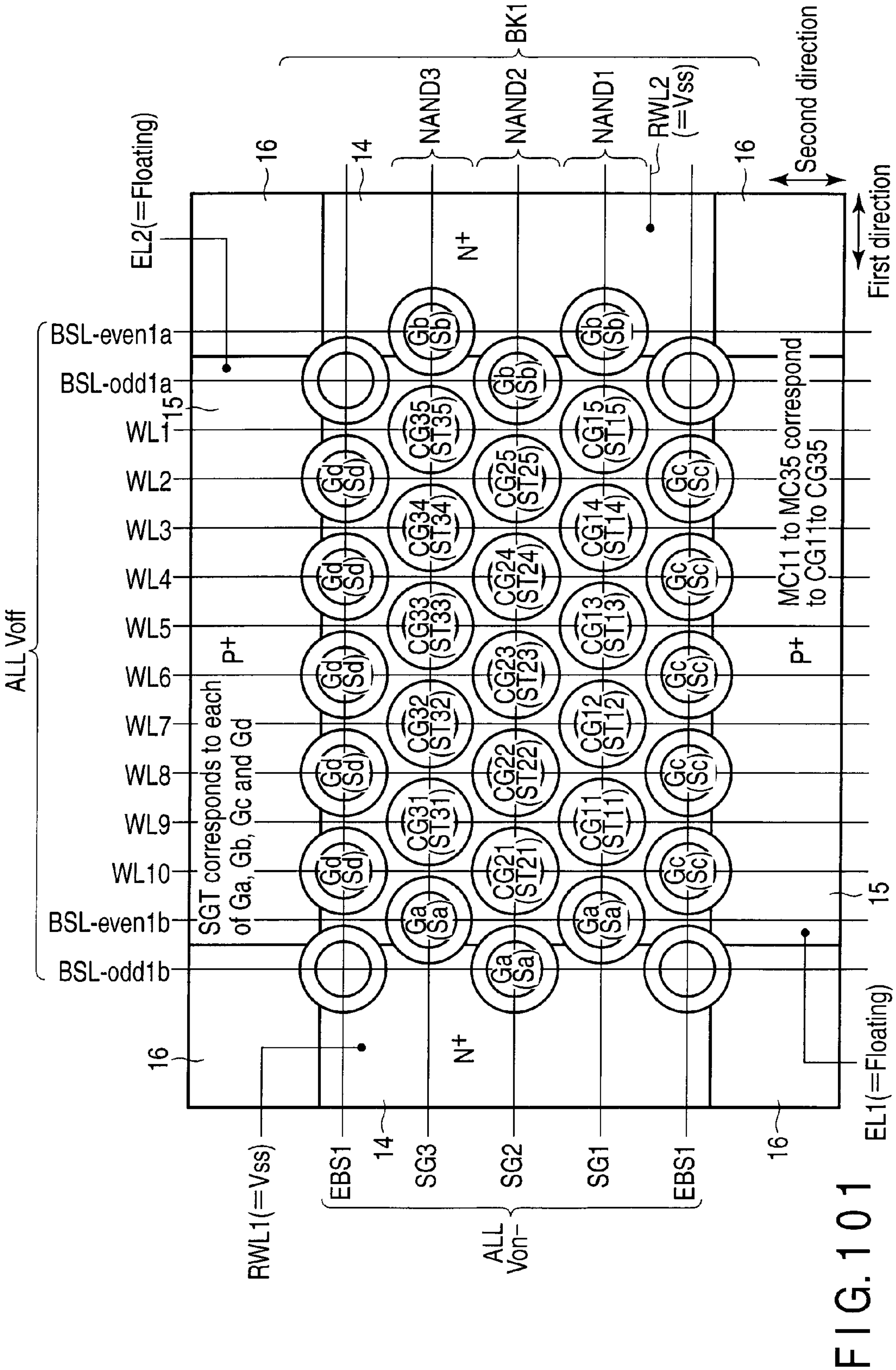
Figure 104:
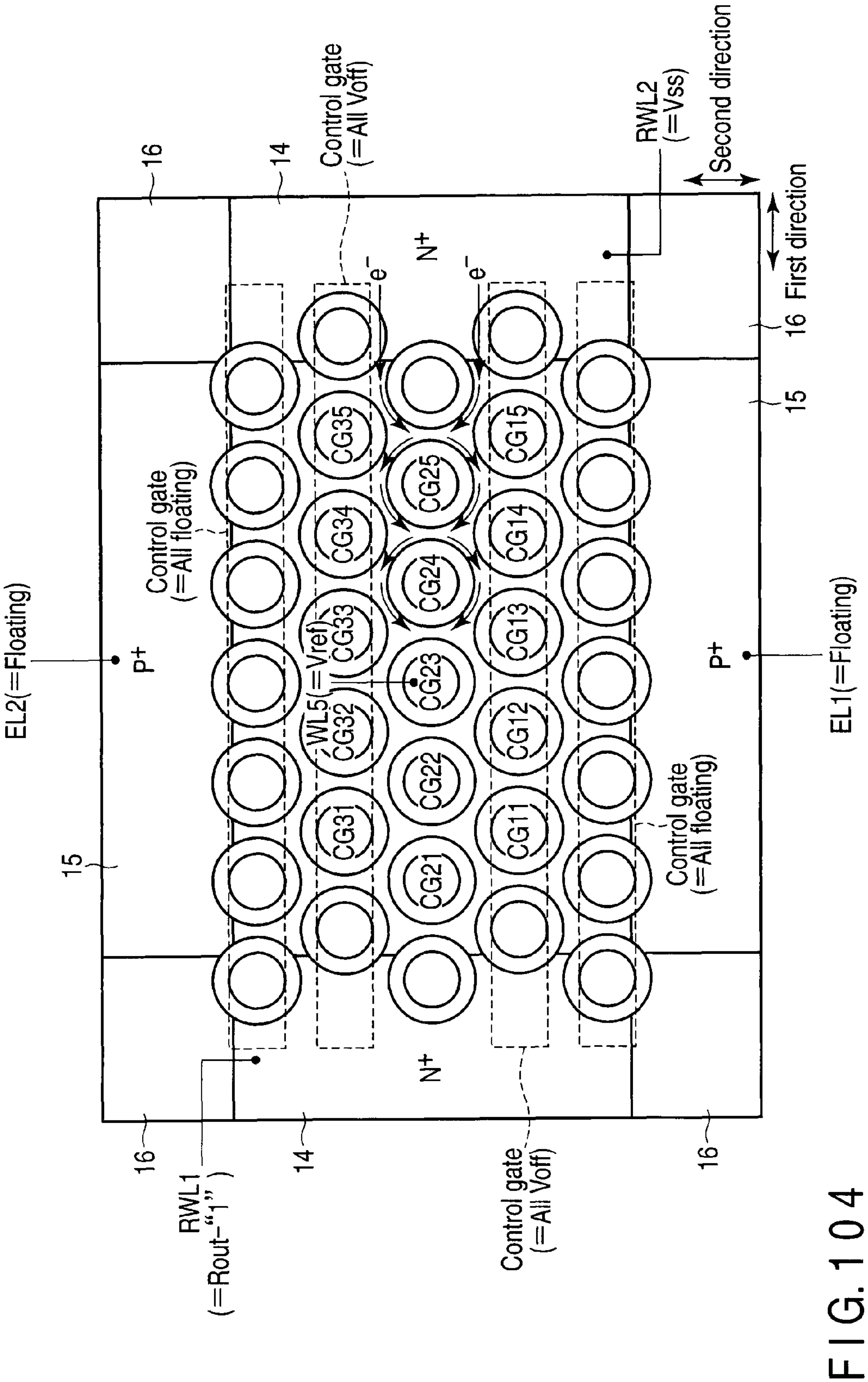
FIG. 104 and FIG. 105 are views showing the electric conduction path, respectively.
Figure 105:
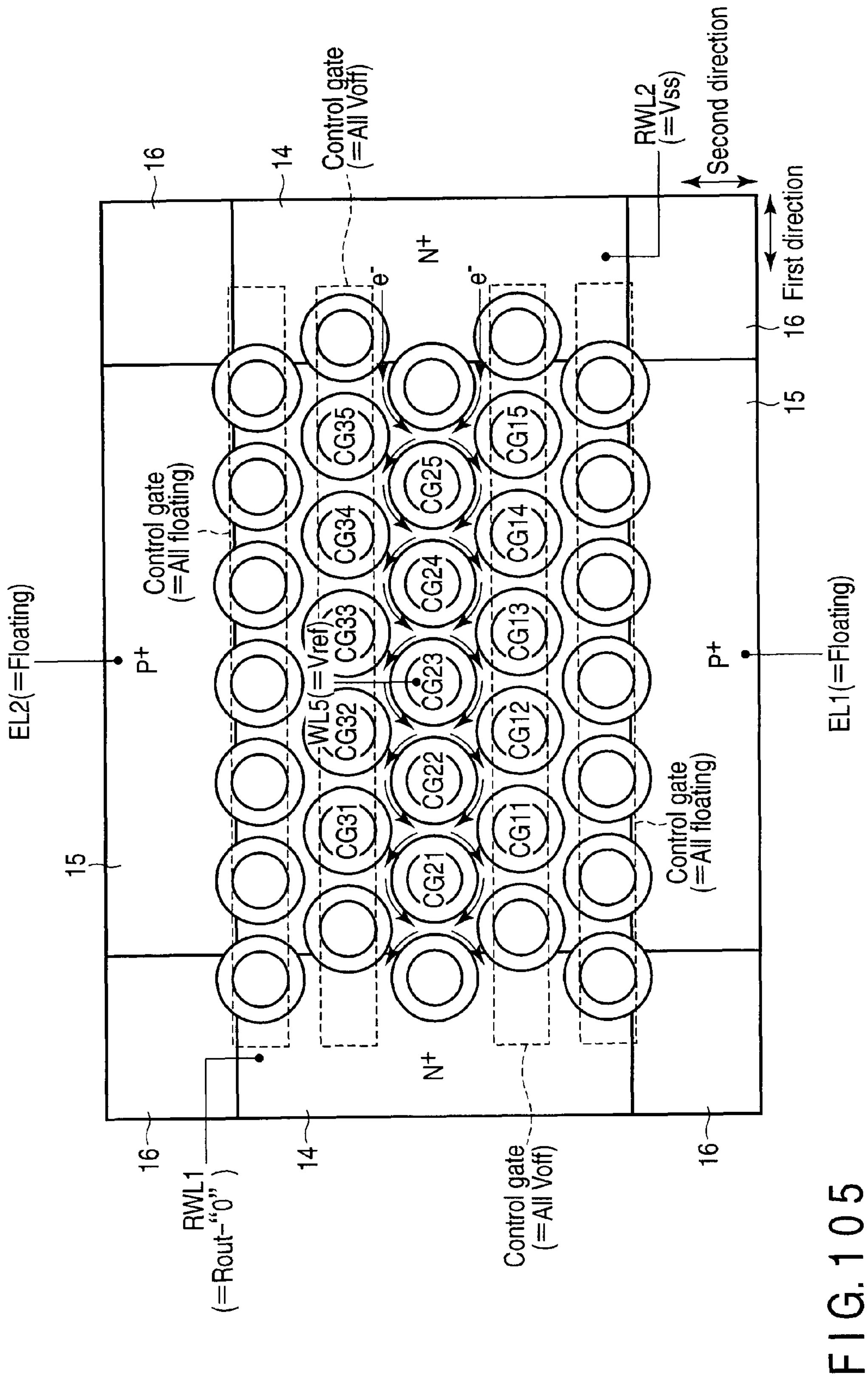

FIGS. 100 and 101 show potential relations in first step.

First step is intended to set control gates of all memory cells in unselected NAND series to potential Voff at which unselected NAND series is not read.

All word lines WL1 to WL10 and read/write block select lines BSL-odd1*a*, BSL-odd1*b*, BSL-even1*a*, BSL-even1*b* are set to Voff. Voff is a potential necessary to prevent generation of an electric conduction path in unselected NAND series NAND1, NAND3.

All select gate lines SG1 to SG3 and erase block select line EBS1 are set to Von−. Von− is a potential necessary to turn on all select transistors. Von− is equal to, for example, Vref and Voff is, for example, a minus potential.

First read/write lines RWL1 are both set to Vref (for example, low-potential side power supply potential Vss). First and second erase lines EL1, EL2 are not used at time of reading and thus set to floating.

Reference potential Vref is defined, for example, as a center between the threshold (maximum value of threshold distribution) of cell data “0” and the threshold (minimum value of threshold distribution) of cell data “1” and more specifically, set to Vss (for example, 0 V).

When the above potential relations are maintained, control gates CG11 to CG35 of all memory cells in all NAND series NAND1 to NAND3 are set to potential Voff at which no electric conduction path is generated in NAND series NAND1 to NAND3.

F-2. Second Step

FIGS. 102 and 103 show potential relations in second step.

In second step, data is read from selected memory cell MC23 in selected NAND series NAND2.

When block BK1 is to be read, read/write block select lines BSL-even1*a*, BSL-even1*b* are set to Von (=Vread) and read/write block select lines BSL-odd1*a*, BSL-odd1*b* are set to Voff.

Von is a potential necessary to turn on first select transistors SGT at both ends of the NAND series and Voff is a potential necessary to turn off first select transistors SGT at both ends of the NAND series.

In general, when the selected NAND series containing a memory cell to be read is odd-numbered (NAND1, NAND3, . . . ), read/write block select lines BSL-odd1*a*, BSL-odd1*b* are set to Von.

When the selected NAND series containing a memory cell to be read is even-numbered (NAND2, . . . ), read/write block select lines BSL-even1*a*, BSL-even1*b* are set to Von.

When block BK1 is not to be read, read/write block select lines BSL-odd1*a*, BSL-odd1*b*, BSL-even1*a*, BSL-even1*b* are set to Voff.

Selected word line WL5 is set to Vref. Selected word line WL5 is an odd-numbered word line and thus, odd-numbered unselected word lines WL1, WL3, WL7, WL9 are set to Vread. Even-numbered unselected word lines WL2, WL4, WL6, WL8, WL10 are set to Voff.

Vref is a potential necessary to turn on/off memory cell MC23 in accordance with data (threshold) of selected memory cell MC23 and to discriminate data of memory cell MC23. Vread is a potential necessary to turn on an unselected memory cell irrespective of data (threshold) of the unselected memory cell in selected NAND series NAND2.

Voff is a potential necessary to turn off an unselected memory cell irrespective of data (threshold) of the unselected memory cell in selected NAND series NAND2 and two unselected NAND series NAND1, NAND3 on both sides thereof.

In the present example, Vread>Vref>Voff.

Selected select gate line SG2 is set to Von+, unselected select gate lines SG1, SG3 on both sides thereof are set to Von−, and other unselected select gate lines are set to Voff+.

Erase block select line EBS1 is set to Voff+.

Von+ is a potential necessary to turn on select transistors ST21 to ST25, Sa, Sb and Von− is a potential necessary to turn on select transistors ST11 to ST15, ST31 to ST35, Sa, Sb. Voff+ is a potential necessary to turn off select transistors Sc, Sd. In the present example, Von+>Von−>Voff+.

First read/write line RWL1 is set to Ron (for example, high-potential side power supply potential Vdd) and second read/write line RWL2 is set to Vref (for example, low-potential side power supply potential Vss). In the present example, Ron>Vref. First and second erase lines EL1, EL2 are not used at time of reading and thus set to floating.

When block BK1 is to be read, select gates Gc, Gd of second select transistor SGT at ends of NAND series NAND1 to NAND3 in the second direction are at Voff and floating. Thus, second select transistor SGT is off.

Voff continues to be applied to control gates CG11 to CG15, CG31 to CG35 of memory cells in two unselected NAND series NAND1, NAND3 on both sides of selected NAND series NAND2. Thus, no electric conduction path is generated in unselected NAND series NAND1, NAND3.

Further, control gates CG21 to CG22, CG24 to CG25 of unselected memory cells in selected NAND series NAND2 are at potential Vread that causes NAND series NAND2 to generate an electric conduction path. Thus, whether an electric conduction path from second read/write line RWL2 to first read/write line RWL1 is formed is determined depending on ON/OFF of selected memory cell MC23.

For example, if data of memory cell MC23 is “1” (high threshold), memory cell MC23 is OFF. Thus, as shown, for example, in FIG. 104, an electric conduction path of electrons from second read/write line RWL2 to first read/write line RWL1 is blocked by memory cell MC23. Therefore, the potential of first read/write line RWL1 is maintained at Ron (=Rout−“1”).

If data of memory cell MC23 is “0” (low threshold), memory cell MC23 is ON. Thus, as shown, for example, in FIG. 105, an electric conduction path of electrons from second read/write line RWL2 to first read/write line RWL1 is generated in selected NAND series NAND2. Therefore, the potential of first read/write line RWL1 changes from Ron to Vref (=Rout−“0”).

Consequently, data of memory cell MC23 can be judged by sensing a potential change of first read/write line RWL1 through a sense amplifier.

An important point here is that Voff continues to be applied to control gates CG11 to CG15, CG31 to CG35 of memory cells in unselected NAND series NAND1, NAND3 on both sides of selected NAND series NAND2 when data is read.

In the first basic structure, control gates CG11 to CG15, CG31 to CG35 of memory cells in unselected NAND series NAND1, NAND3 on both sides of selected NAND series NAND2 are floating and thus, the potential may rise from Voff due to capacitive coupling to adversely affect reading from selected NAND series NAND2.

Figure 106:
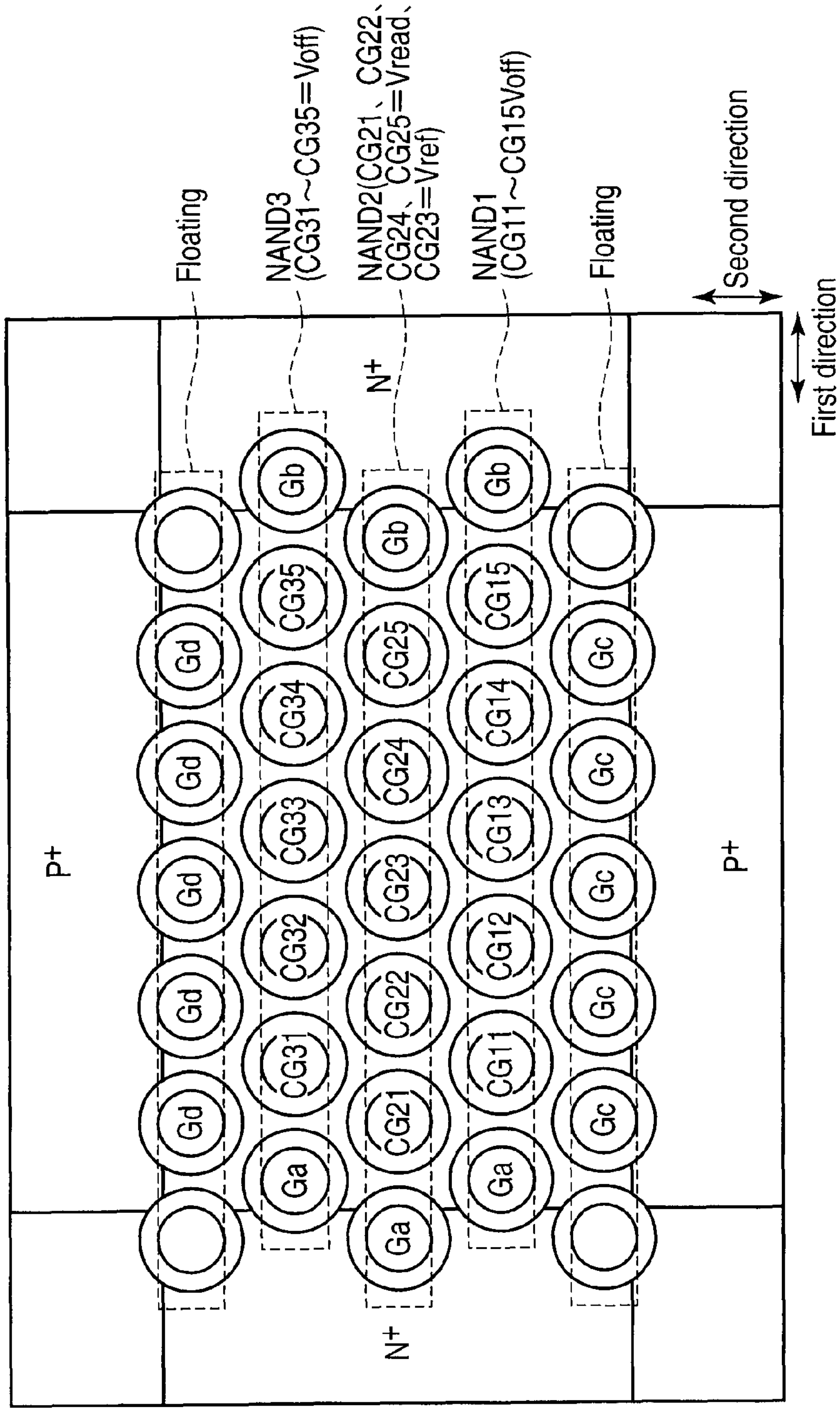
FIG. 106 is a view showing the potentials of the control gates.

In the second basic structure, by contract, as shown in FIG. 106, control gates CG11 to CG15, CG31 to CG35 of memory cells in unselected NAND series NAND1, NAND3 on both sides of selected NAND series NAND2 are fixed to Voff.

Therefore, reading from selected NAND series NAND2 is not adversely affected by unselected NAND series NAND1, NAND3.

G. Erase Operation

Examples in which data is erased from all memory cells in NAND series NAND1 to NAND3 in the structure shown in FIG. 87 will be described.

G-1. First Example

Figure 107:
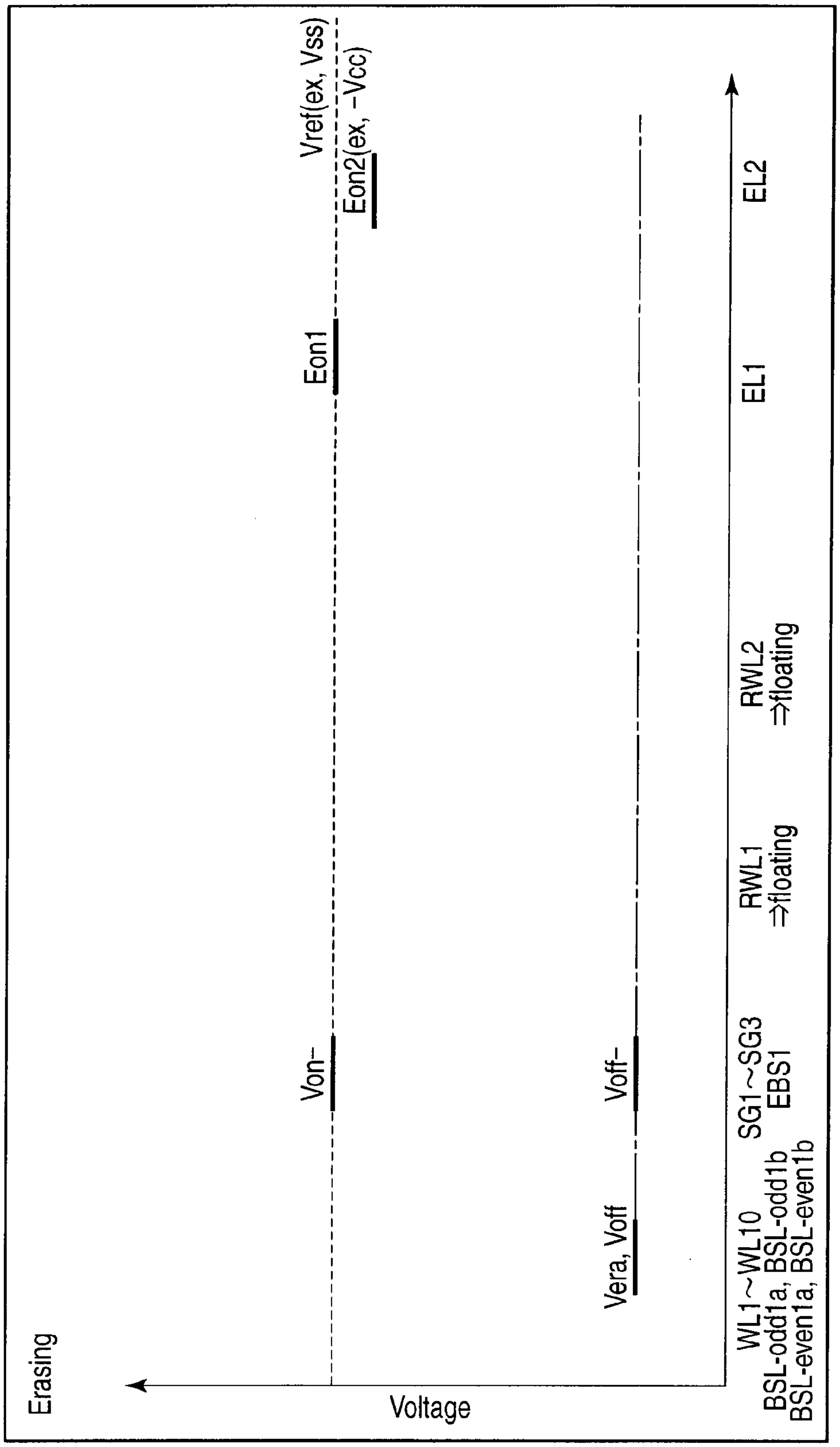

FIGS. 107 and 108 show a first example of potential relations at time of erasing.

When block BK1 is to be erased, erase block select line EBS1 is set to Von−. Von− is a potential necessary to turn on second select transistor SGT at both ends of memory cells MC11 to MC35 in the second direction.

When block BK1 is to be erased, first erase line EL1 is set to Eon1 (for example, Vref) and second erase line EL2 is set to Eon2 (for example, −Vdd). Vdd is a high-potential side power supply potential. In the present example, to cause holes (positive holes) to flow through all NAND series NAND1 to NAND3 by generating a potential difference between first and second erase lines EL1, EL2, it is necessary to set, for example, Eon1>Eon2.

When block BK1 is not to be erased, erase block select line EBS1 is set to Voff−. Voff− is a potential necessary to turn off second select transistor SGT at both ends of memory cells MC11 to MC35 in the second direction and is equal to, for example, Vera.

When block BK1 is not to be erased, first and second erase lines EL1, EL2 are set to floating (for example, Vss).

All word lines WL1 to WL10 are set to Vera (for example, a minus potential) and all select gate lines SG1 to SG3 are set to Von−(for example, Vref).

Read/write block select lines BSL-odd1*a*, BSL-odd1*b*, BSL-even1*a*, BSL-even1*b* are set to Voff. Voff is a potential necessary to protect first select transistor SGT at ends of NAND series NAND1 to NAND3 in the first direction and is equal to, for example, Vera.

First and second read/write lines RWL1, RWL2 are not used at time of erasing and thus set to floating.

Reference potential Vref is set to Vss (for example, 0 V).

Figure 109:
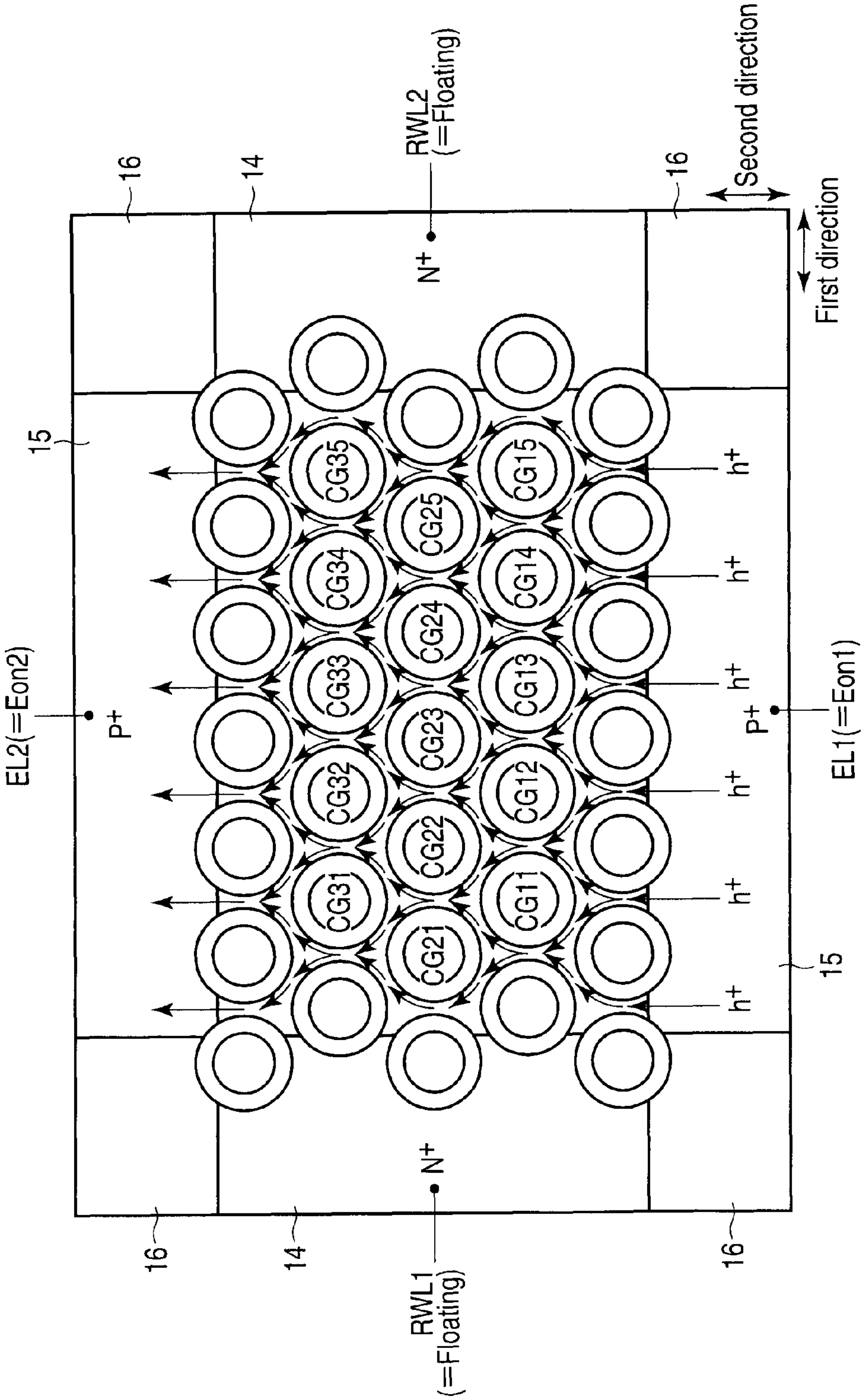
FIG. 109 is a view showing the electric conduction path.

When the above potential relations are maintained, as shown, for example, FIG. 109, an electric conduction path is generated in all NAND series NAND1 to NAND3 and holes (h+) flow from first erase line EL1 toward second erase line EL2. Eon2−Vera is applied to between control gates CG11 to CG35 and a channel in all memory cells and thus, holes (h+) are injected into the data recording layer (charge storage layer) of all memory cells MC11 to MC35.

Therefore, a data erase operation from all memory cells is executed.

While in the present example, only one erase block select line EBS1 is provided at an end of NAND series NAND1 to NAND3 in the second direction, providing two erase block select lines EBS1 or more is more effective in preventing erroneous erasing of an unselected block at time of erasing.

G-2. Second Example

Figure 110:
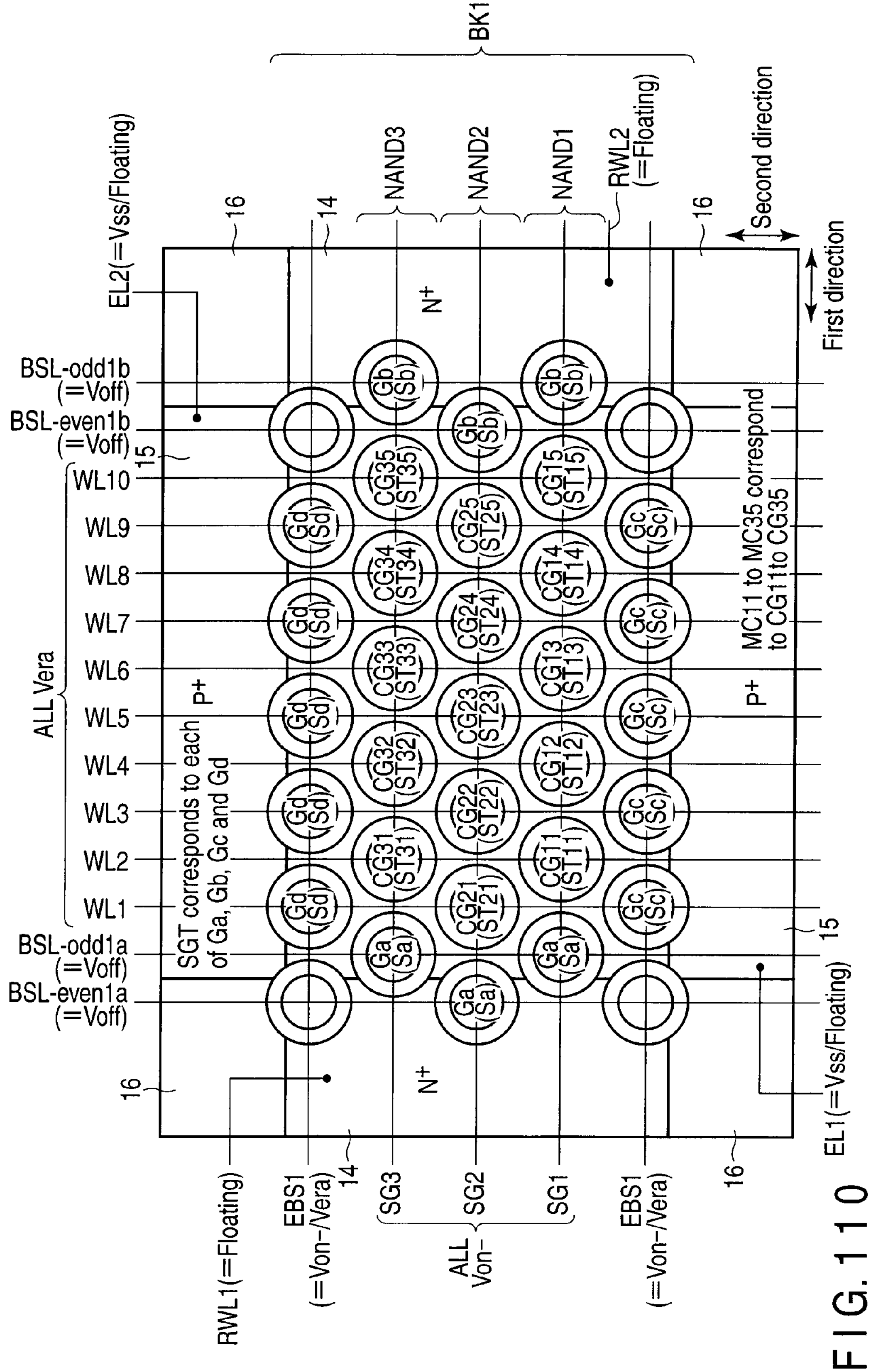
FIG. 110 is a view showing a second example of the potential relation during data erasing.

FIG. 110 shows a second example of potential relations at time of erasing.

The second example is different from the first example in that first and second erase lines EL1, EL2 are both set to Vref (for example, Vss).

Figure 111:
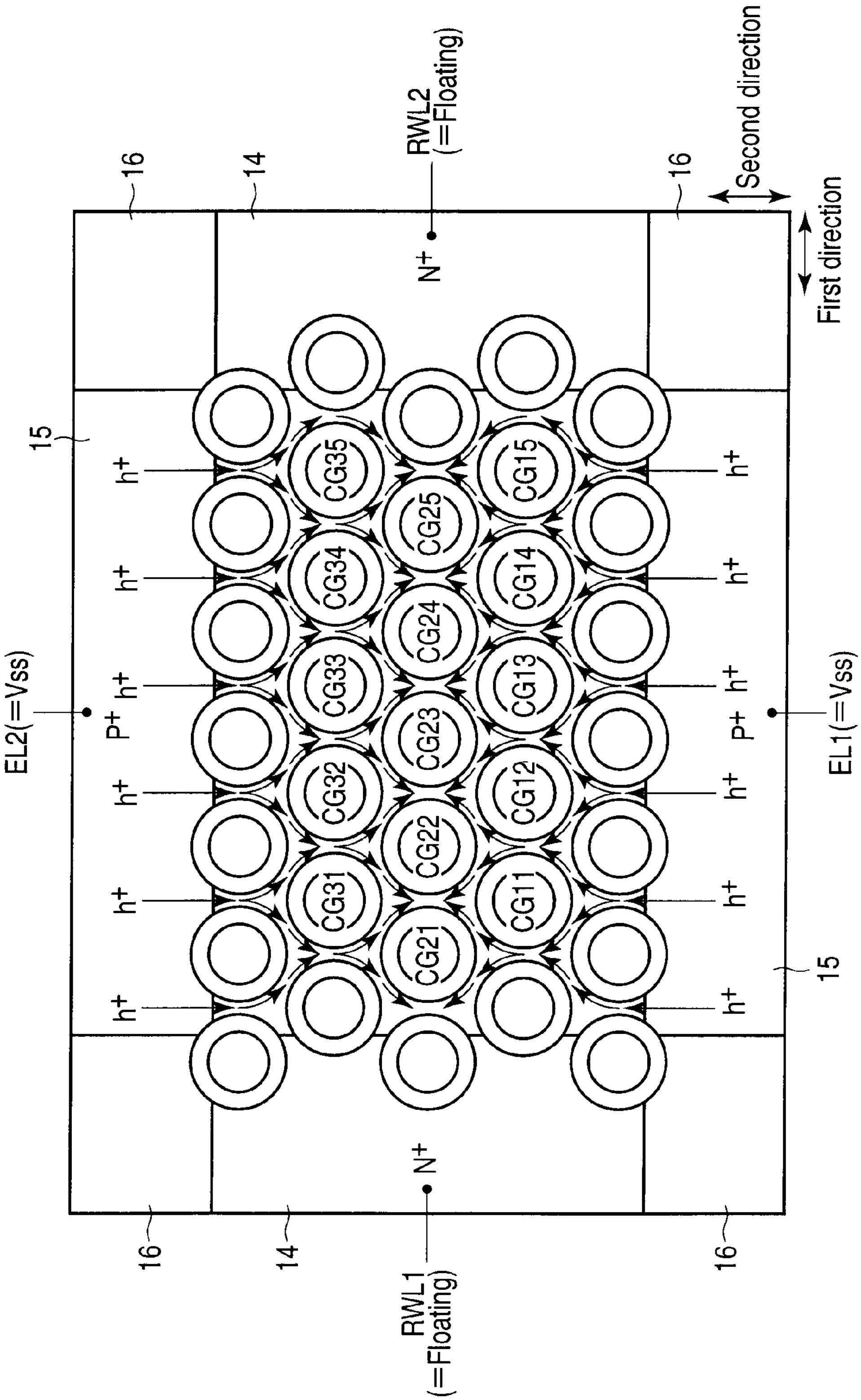
FIG. 111 is a view showing the electric conduction path.

As shown, for example, FIG. 111, an electric conduction path is generated in all NAND series NAND1 to NAND3 and holes (h+) flow from both first and second erase lines EL1, EL2 toward NAND series NAND1 to NAND3.

Vref−Vera is applied to between control gates CG11 to CG35 and a channel in all memory cells and thus, holes (h+) are injected into the data recording layer (charge storage layer) of all memory cells MC11 to MC35.

Therefore, a data erase operation from all memory cells is executed.

When compared with the first example, the second example achieves an effect of improving erasing efficiency.

3. ADVANTAGES OF THE SECOND BASIC STRUCTURE

Advantages concerning reading/writing of the second basic structure will be described.

While advantages will be described by taking an example in which a memory cell array is blocked, but the advantages can also be obtained when a memory cell array is not blocked.

(1) Advantages of Writing

Figure 112:
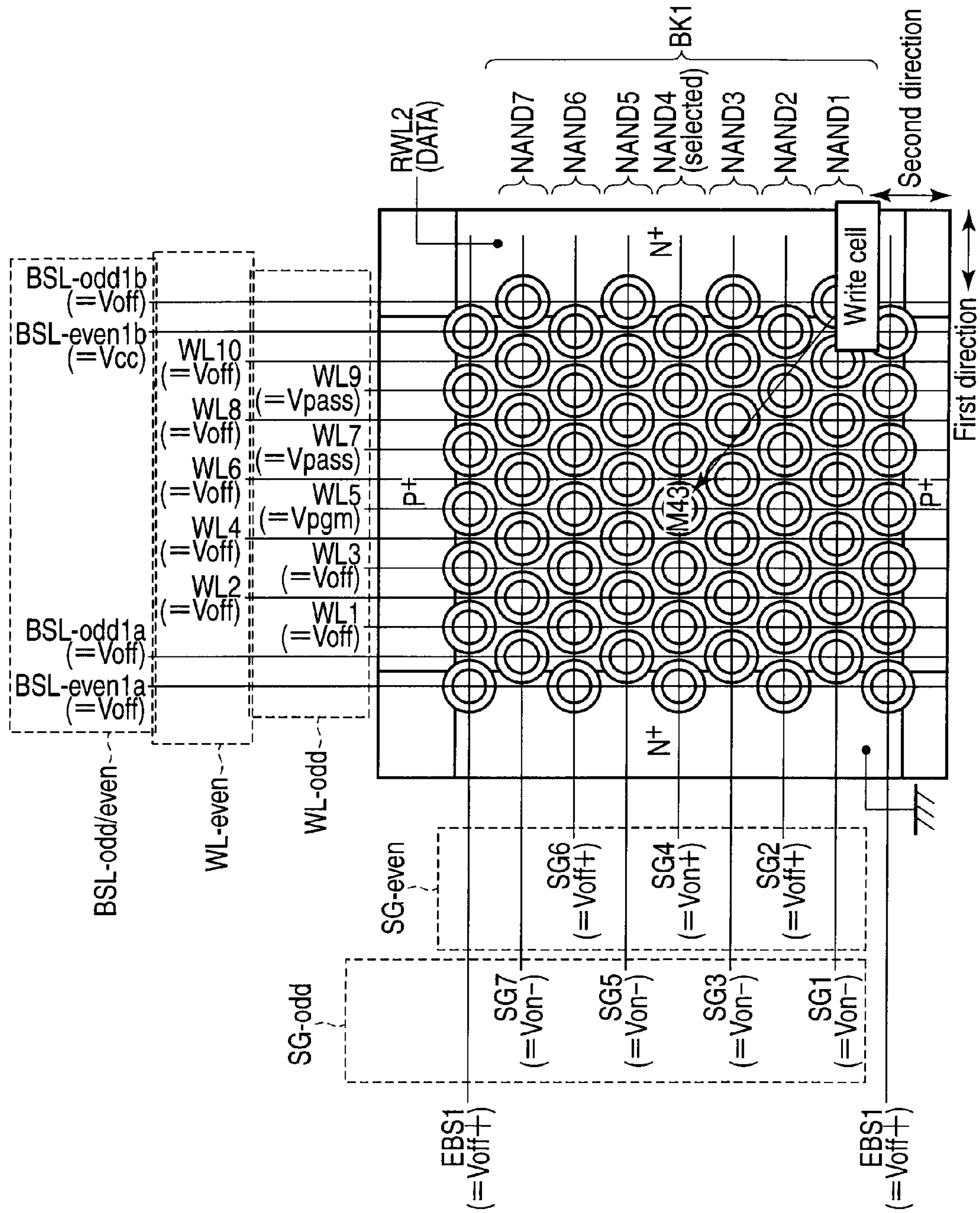

FIGS. 112 and 113 show potential relations at time of writing.

The potential relations correspond to the third example of writing of the blocked second basic structure shown in FIGS. 94 and 95.

A. Writing into an Even-Numbered NAND Series

Writing into an even-numbered NAND series looks like as shown in FIG. 112.

If the cell to be written into is M43 in NAND series NAND4 (selected), read/write block select line BSL-even1*b* is set to Von and read/write block select lines BSL-even1*a*, BSL-odd1*a*, BSL-odd1*b* are set to Voff.

Selected word line WL5 is set to Vpgm and unselected word lines WL1 to WL4 on the left side of word line WL5 are set to Voff. Odd-numbered unselected word lines WL7, WL9 of unselected word lines WL6 to WL10 on the right side of word line WL5 are set to Vpass. Even-numbered unselected word lines WL6, WL8, WL10 of unselected word lines WL6 to WL10 on the right side of word line WL5 are set to Voff.

In this case, selected word line WL5 is odd-numbered and thus, even-numbered word lines WL-even (WL2, WL4, WL6, WL8, WL10) are all set to Voff. Therefore, an advantage of peripheral circuits such as a driver/decoder connected to word lines WL1 to WL10 being simplified is obtained.

Odd-numbered word lines WL-odd (WL1, WL3, WL5, WL7, WL9) and read/write block select lines BSL-odd/even (BSL-odd1*a*, BSL-odd1*b*, BSL-even1*a*, BSL-even1*b*) are set to predetermined potentials (Vpgm, Vpass, Voff, Vcc).

Selected select gate line SG4 is set to Von+ and unselected select gate lines SG3, SG5 on both sides thereof are set to Von−.

Selected select gate line SG4 is even-numbered and thus, other even-numbered select gate lines SG2, SG6 than selected select gate line SG4 are set to Voff+. Accordingly, control gates of memory cells in NAND series NAND2, NAND4 are electrically cut off from word lines so that speedup of writing (speedup of charging) can be realized by the reduction of parasitic capacity generated in word lines.

In the example shown in FIGS. 94 and 95, odd-numbered unselected select gate lines SG1, SG7 other than unselected select gate lines SG3, SG5 on both sides of selected select gate line SG4 are set to Voff+ to reduce parasitic capacity generated in word lines.

In the present example, by contrast, unselected select gate lines SG1, SG7 are set to Von−. In this case, the charging speed of word lines is slightly delayed, but odd-numbered unselected select gate lines SG-odd (SG1, SG3, SG5, SG7) are all set to Von− and thus, an advantage of peripheral circuits such as a driver/decoder being simplified is obtained.

Even-numbered select gate lines SG-even (SG2, SG4, SG6) are set to predetermined potentials (Von+, Voff+).

Erase block select line EBS1 is set to Voff+.

Program data DATA is transferred to second read/write line RWL2.

For example, if a write operation (threshold lifting) should be executed when program data DATA is "1", second read/write line RWL2 is set to Vss (DATA="1"). At this point, a data write operation is executed by applying a high voltage to between control gates and a channel in selected memory cell MC45.

Writing is inhibited when program data DATA is "0" and thus, second read/write line RWL2 is set to Vdd (DATA="0"). At this point, no high voltage is applied to between control gates and a channel in selected memory cell MC45 and thus, data writing is inhibited.

B. Writing into Odd-Numbered NAND Series

Writing into an odd-numbered NAND series looks like as shown in FIG. 113.

If the cell to be written into is M33 in NAND series NAND3 (selected), read/write block select line BSL-even1$b$ is set to Von and read/write block select lines BSL-even1$a$, BSL-odd1$a$, BSL-odd1$b$ are set to Voff.

Selected word line WL6 is set to Vpgm and unselected word lines WL1 to WL5 on the left side of word line WL6 are set to Voff. Even-numbered unselected word lines WL8, WL10 of unselected word lines WL7 to WL10 on the right side of word line WL6 are set to Vpass. Odd-numbered unselected word lines WL7, WL9 of unselected word lines WL7 to WL10 on the right side of word line WL6 are set to Voff.

In this case, selected word line WL6 is even-numbered and thus, odd-numbered word lines WL-odd (WL1, WL3, WL5, WL7, WL9) are all set to Voff. Therefore, an advantage of peripheral circuits such as a driver/decoder connected to word lines WL1 to WL10 being simplified is obtained.

Even-numbered word lines WL-even (WL2, WL4, WL6, WL8, WL10) and read/write block select lines BSL-odd/even (BSL-odd1$a$, BSL-odd1$b$, BSL-even1$a$, BSL-even1$b$) are set to predetermined potentials (Vpgm, Vpass, Voff, Vcc).

Selected select gate line SG3 is set to Von+ and unselected select gate lines SG2, SG4 on both sides thereof are set to Von−.

Selected select gate line SG3 is odd-numbered and thus, other odd-numbered select gate lines SG1, SG5, SG7 than selected select gate line SG3 are set to Voff+. Accordingly, control gates of memory cells in NAND series NAND1, NAND5, NAND7 are electrically cut off from word lines so that speedup of writing (speedup of charging) can be realized by the reduction of parasitic capacity generated in word lines.

In the example shown in FIGS. 94 and 95, even-numbered unselected select gate line SG6 other than unselected select gate lines SG2, SG4 on both sides of selected select gate line SG3 is set to Voff+ to reduce parasitic capacity generated in word lines.

In the present example, by contrast, unselected select gate line SG6 is set to Von−. In this case, the charging speed of word lines is slightly delayed, but even-numbered unselected select gate lines SG-even (SG2, SG4, SG6) are all set to Von− and thus, an advantage of peripheral circuits such as a driver/decoder being simplified is obtained.

Odd-numbered select gate lines SG-odd (SG1, SG3, SG5, SG7) are set to predetermined potentials (Von+, Voff+).

Erase block select line EBS1 is set to Voff+.

Program data DATA is transferred to second read/write line RWL2.

For example, if a write operation (threshold lifting) should be executed when program data DATA is "1", second read/write line RWL2 is set to Vss (DATA="1"). At this point, a data write operation is executed by applying a high voltage to between control gates and a channel in selected memory cell MC36.

Writing is inhibited when program data DATA is "0" and thus, second read/write line RWL2 is set to Vdd (DATA="0"). At this point, no high voltage is applied to between control gates and a channel in selected memory cell MC36 and thus, data writing is inhibited.

(2) Advantages of Reading

Figure 115:
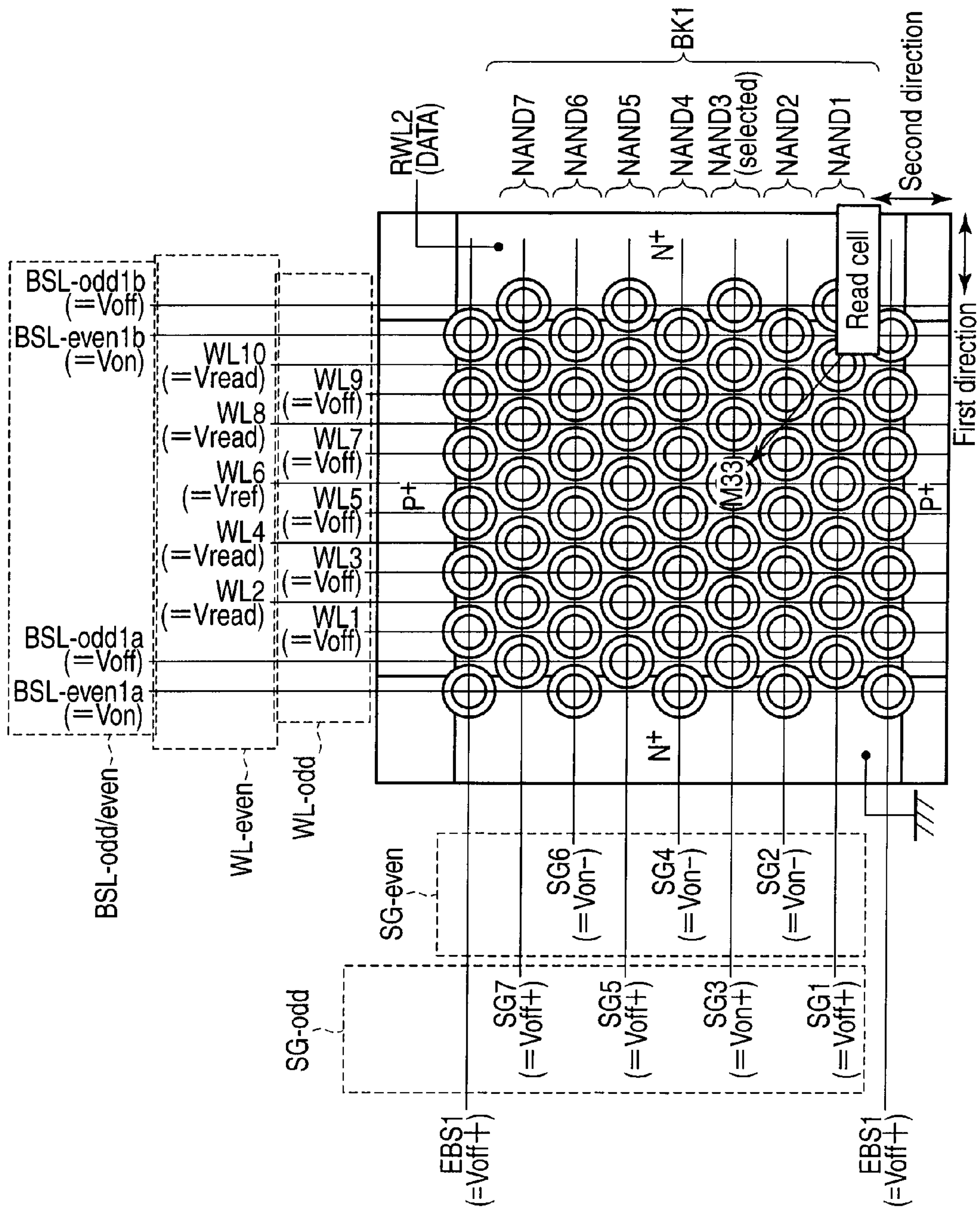

FIGS. 114 and 115 show potential relations at time of reading.

The potential relations correspond to second step of reading of the second basic structure shown in FIGS. 100 to 106.

A. Reading from an Even-Numbered NAND Series

Reading from an even-numbered NAND series looks like as shown in FIG. 114.

If the cell to be read from is M43 in NAND series NAND4 (selected), read/write block select lines BSL-even1$a$, BSL-even1$b$ are set to Von (for example, Vread) and read/write block select lines BSL-odd1$a$, BSL-odd1$b$ are set to Voff.

Selected word line WL5 is set to Vref and odd-numbered unselected word lines WL-odd (WL1, WL3, WL7, WL9) other than word line WL5 are set to Vread. Even-numbered unselected word lines WL-even (WL2, WL4, WL6, WL8, WL10) are set to Voff.

In this case, selected word line WL5 is odd-numbered and thus, even-numbered word lines WL-even (WL2, WL4, WL6, WL8, WL10) are all set to Voff. Therefore, an advantage of peripheral circuits such as a driver/decoder connected to word lines WL1 to WL10 being simplified is obtained.

Odd-numbered word lines WL-odd (WL1, WL3, WL5, WL7, WL9) and read/write block select lines BSL-odd/even (BSL-odd1$a$, BSL-odd1$b$, BSL-even1$a$, BSL-even1$b$) are set to predetermined potentials (Vref, Vread, Von, Voff).

Selected select gate line SG4 is set to Von+ and unselected select gate lines SG3, SG5 on both sides thereof are set to Von−.

Selected select gate line SG4 is even-numbered and thus, other even-numbered select gate lines SG2, SG6 than selected select gate line SG4 are set to Voff+. Accordingly, control gates of memory cells in NAND series NAND2, NAND4 are electrically cut off from word lines so that speedup of reading (speedup of charging) can be realized by the reduction of parasitic capacity generated in word lines.

In the example shown in FIGS. 94 and 95, odd-numbered unselected select gate lines SG1, SG7 other than unselected select gate lines SG3, SG5 on both sides of selected select gate line SG4 are set to Voff+ to reduce parasitic capacity generated in word lines.

In the present example, by contrast, unselected select gate lines SG1, SG7 are set to Von−. In this case, the charging speed of word lines is slightly delayed, but odd-numbered unselected select gate lines SG-odd (SG1, SG3, SG5, SG7) are all set to Von− and thus, an advantage of peripheral circuits such as a driver/decoder being simplified is obtained.

Even-numbered select gate lines SG-even (SG2, SG4, SG6) are set to predetermined potentials (Von+, Voff+).

Erase block select line EBS1 is set to Voff+.

Read data DATA is transferred to second read/write line RWL2. Second read/write line RWL2 is charged to a predetermined potential, for example, before read data DATA being transferred to second read/write line RWL2.

If, for example, read data DATA is "1", memory cell M43 that stores the data is OFF. Thus, second read/write line RWL2 remains charged and DATA="1" is read. If read data DATA is "0", memory cell M43 that stores the data is ON. Thus, second read/write line RWL2 is discharged and DATA="0" is read.

B. Reading from Odd-Numbered NAND Series

Reading from an odd-numbered NAND series looks like as shown in FIG. 115.

If the cell to be read from is M33 in NAND series NAND3 (selected), read/write block select lines BSL-even1*a*, BSL-even1*b* is set to Von and read/write block select lines BSL-odd1*a*, BSL-odd1*b* are set to Voff.

Selected word line WL6 is set to Vref and even-numbered unselected word lines WL-even (WL2, WL4, WL8, WL10) other than word line WL6 are set to Vread. Odd-numbered unselected word lines WL-odd (WL1, WL3, WL5, WL7, WL9) are set to Voff.

In this case, selected word line WL6 is even-numbered and thus, odd-numbered word lines WL-odd (WL1, WL3, WL5, WL7, WL9) are all set to Voff. Therefore, an advantage of peripheral circuits such as a driver/decoder connected to word lines WL1 to WL10 being simplified is obtained.

Even-numbered word lines WL-even (WL2, WL4, WL6, WL8, WL10) and read/write block select lines BSL-odd/even (BSL-odd1*a*, BSL-odd1*b*, BSL-even1*a*, BSL-even1*b*) are set to predetermined potentials (Vref, Vread, Von, Voff).

Selected select gate line SG3 is set to Von+ and unselected select gate lines SG2, SG4 on both sides thereof are set to Von−.

Selected select gate line SG3 is odd-numbered and thus, other odd-numbered select gate lines SG1, SG5, SG7 than selected select gate line SG3 are set to Voff+. Accordingly, control gates of memory cells in NAND series NAND1, NAND5, NAND7 are electrically cut off from word lines so that speedup of reading (speedup of charging) can be realized by the reduction of parasitic capacity generated in word lines.

In the example shown in FIGS. 94 and 95, even-numbered unselected select gate line SG6 other than unselected select gate lines SG2, SG4 on both sides of selected select gate line SG3 is set to Voff+ to reduce parasitic capacity generated in word lines.

In the present example, by contrast, unselected select gate line SG6 is set to Von−. In this case, the charging speed of word lines is slightly delayed, but even-numbered unselected select gate lines SG-even (SG2, SG4, SG6) are all set to Von− and thus, an advantage of peripheral circuits such as a driver/decoder being simplified is obtained.

Odd-numbered select gate lines SG-odd (SG1, SG3, SG5, SG7) are set to predetermined potentials (Von+, Voff+).

Erase block select line EBS1 is set to Voff+.

Read data DATA is transferred to second read/write line RWL2. Second read/write line RWL2 is charged to a predetermined potential, for example, before read data DATA being transferred to second read/write line RWL2.

If, for example, read data DATA is "1", memory cell M33 that stores the data is OFF. Thus, second read/write line RWL2 remains charged and DATA="1" is read. If read data DATA is "0", memory cell M33 that stores the data is ON. Thus, second read/write line RWL2 is discharged and DATA="0" is read.

4. SEQUENTIAL DATA READING/WRITING

Sequential data reading/writing in one block will be described.

(1) Sequential Data Writing

According to the first and second basic structures, like a conventional NAND flash memory, a data program can sequentially be executed from a memory cell on a source line (for example, first read/write line RWL1) side for which the potential is fixed toward a memory cell on a bit line (for example, second read/write line RWL2) side into which data is input of memory cells in one NAND series.

Also according to the first and second basic structures, when data is sequentially written in one block, the write operation can be executed by a new procedure that is different from a procedure for a conventional NAND flash memory.

The write operation will be described by taking the second basic structure as an example.

A. First Example

Figure 116:
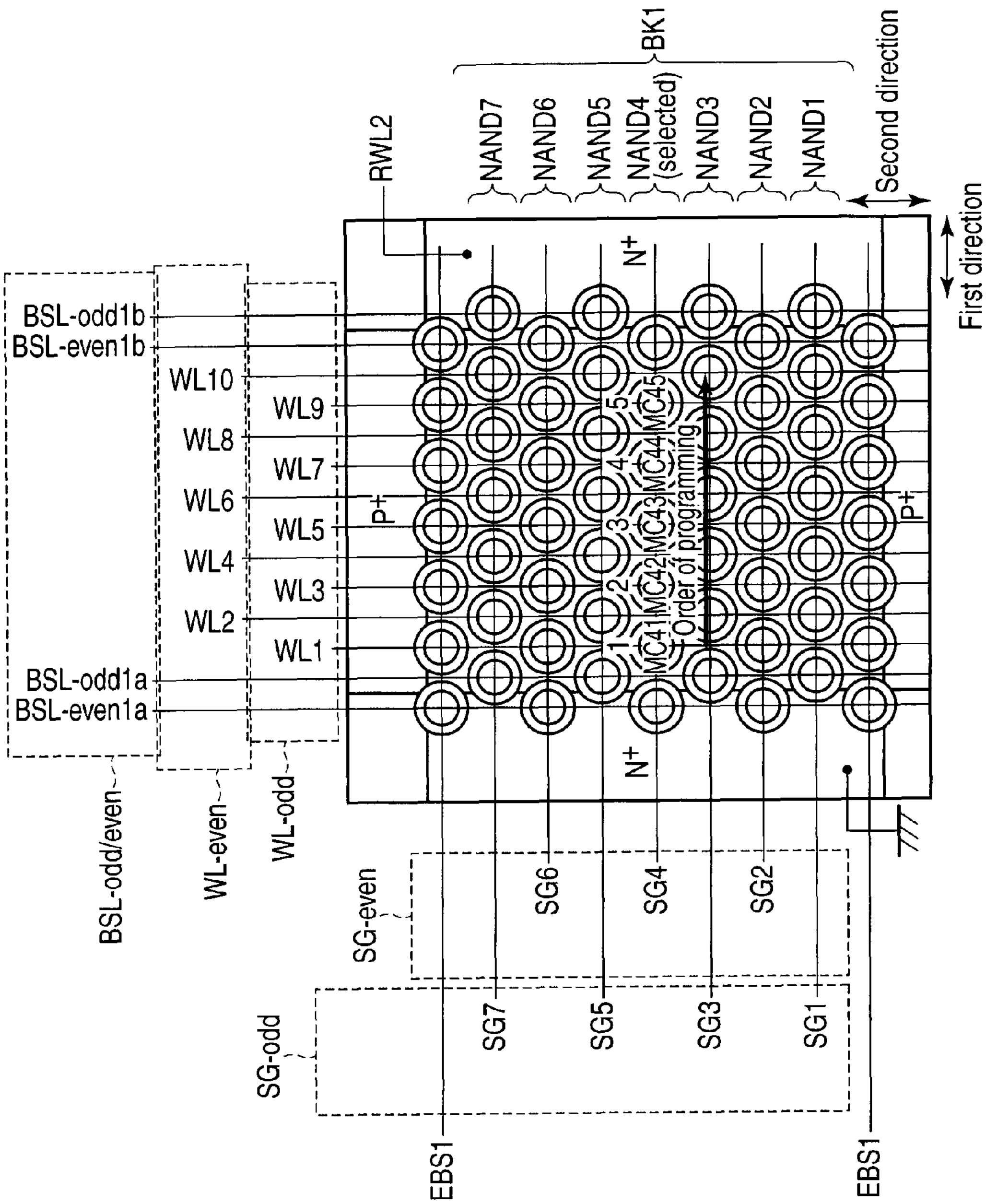
FIG. 116 is a view showing a first example of writing of sequential data.

FIG. 116 shows a first example of sequential data writing.

The NAND series selected for writing is assumed to be NAND4 (selected). Data is sequentially written into memory cells M41, M42, M43, M44, M45 in NAND series NAND4.

First, memory cell M41 closest to first read/write line RWL1 side is programmed (write execute/inhibit). Next, memory cells M42, M43, M44 are sequentially programmed. Lastly, memory cell M45 closest to second read/write line RWL2 side is programmed.

Program data is sequentially input into second read/write line RWL2 from outside a chip. After each of memory cells M41, M42, M43, M44, M45 being programmed, each memory cell may be verified whether data is correctly programmed.

B. Second Example

FIG. 117 shows a second example of sequential data writing.

The NAND series selected for writing are assumed to be NAND4 (selected), NAND5 (selected). Data is sequentially written into memory cells M41, M42, M43, M44, M45 in NAND series NAND4 and memory cells M51, M52, M53, M54, M55 in NAND series NAND5.

First, memory cell M41 in NAND series NAND4 closest to first read/write line RWL1 side is programmed (write execute/inhibit). Next, memory cell M51 in NAND series NAND5 closest to first read/write line RWL1 side is programmed.

Subsequently, memory cells are programmed in the order of M42->M52->M43->M53->M44->M54.

Also, memory cell M45 in NAND series NAND4 closest to second read/write line RWL2 side is programmed. Lastly, memory cell M55 in NAND series NAND5 closest to second read/write line RWL2 side is programmed.

Program data is sequentially input into second read/write line RWL2 from outside a chip. After each of memory cells M41 to M45, M51 to M55 being programmed, each memory cell may be verified whether data is correctly programmed.

(2) Sequential Data Reading

According to the first and second basic structures, when data is sequentially read in one block, the read operation can be executed by a new procedure that is different from a procedure for a conventional NAND flash memory.

The read operation will be described by taking the second basic structure as an example.

A. Read Operation

Figure 118:
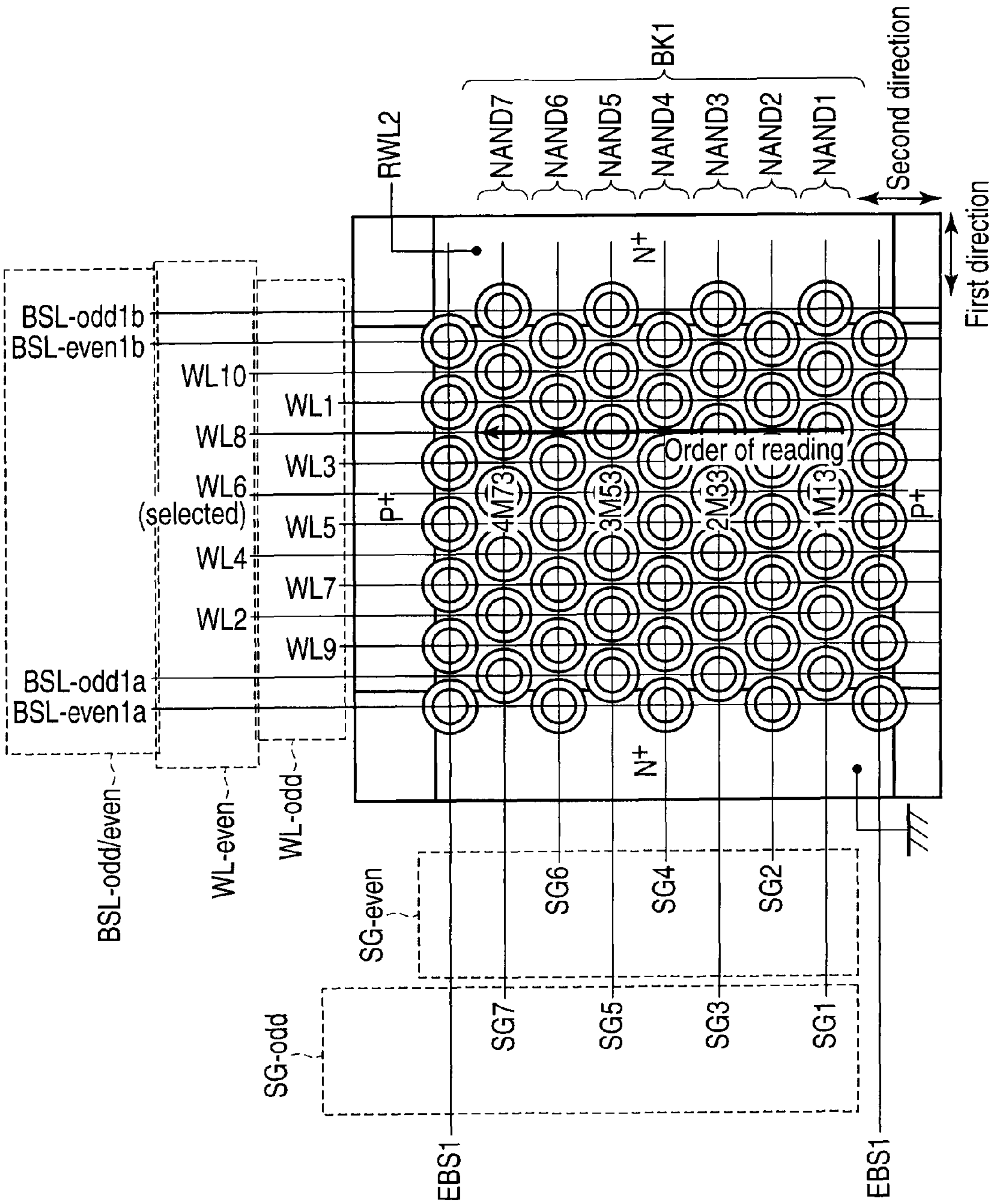
FIG. 118 is a view showing reading of sequential data.

FIG. 118 shows sequential data reading.

Sequential data is read from memory cells connected to the same word line and the word line selected for reading is assumed to be word line WL6 (selected). Data is sequentially read from memory cells M13, M33, M53, M73 in block BK1 connected to word line WL6.

Memory cells M13, M33, M53, M73 in NAND series NAND1, NAND3, NAND5, NAND7 are connected to selected word line WL6.

First, data is read from memory cell M13 in NAND series NAND1. Then, data is sequentially read from memory cell M33 in NAND series NAND3 and memory cell M53 in NAND series NAND5. Lastly, data is read from memory cell M73 in NAND series NAND7.

Read data is sequentially output to second read/write line RWL2. The value of read data is determined by a sense amplifier connected to second read/write line RWL2.

In the present example, if the selected word line is even-numbered, data is read from memory cells in odd-numbered NAND series NAND1, NAND3, NAND5, NAND7. If the selected word line is odd-numbered, data is read from memory cells in even-numbered NAND series NAND2, NAND4, NAND6.

B. Erasing of a Channel Inversion Layer after Reading

Vpass is applied to the control gate of an unselected memory cell in a selected NAND series at time of reading. At this point, a channel inversion layer is formed in the unselected memory cell and the unselected memory cell is turned on.

Vref is applied to the control gate of a selected memory cell. At this point, if data of the selected memory cell is "0" (low threshold), a channel inversion layer is formed in the selected memory cell and the selected memory cell is turned on.

In this manner, a channel inversion layer is formed in a memory cell in a selected NAND series after data is read.

Thus, in preparation for the next reading, for example, third step shown below is added to the read operation (first and second steps) in FIGS. 100 to 106.

Figure 119:
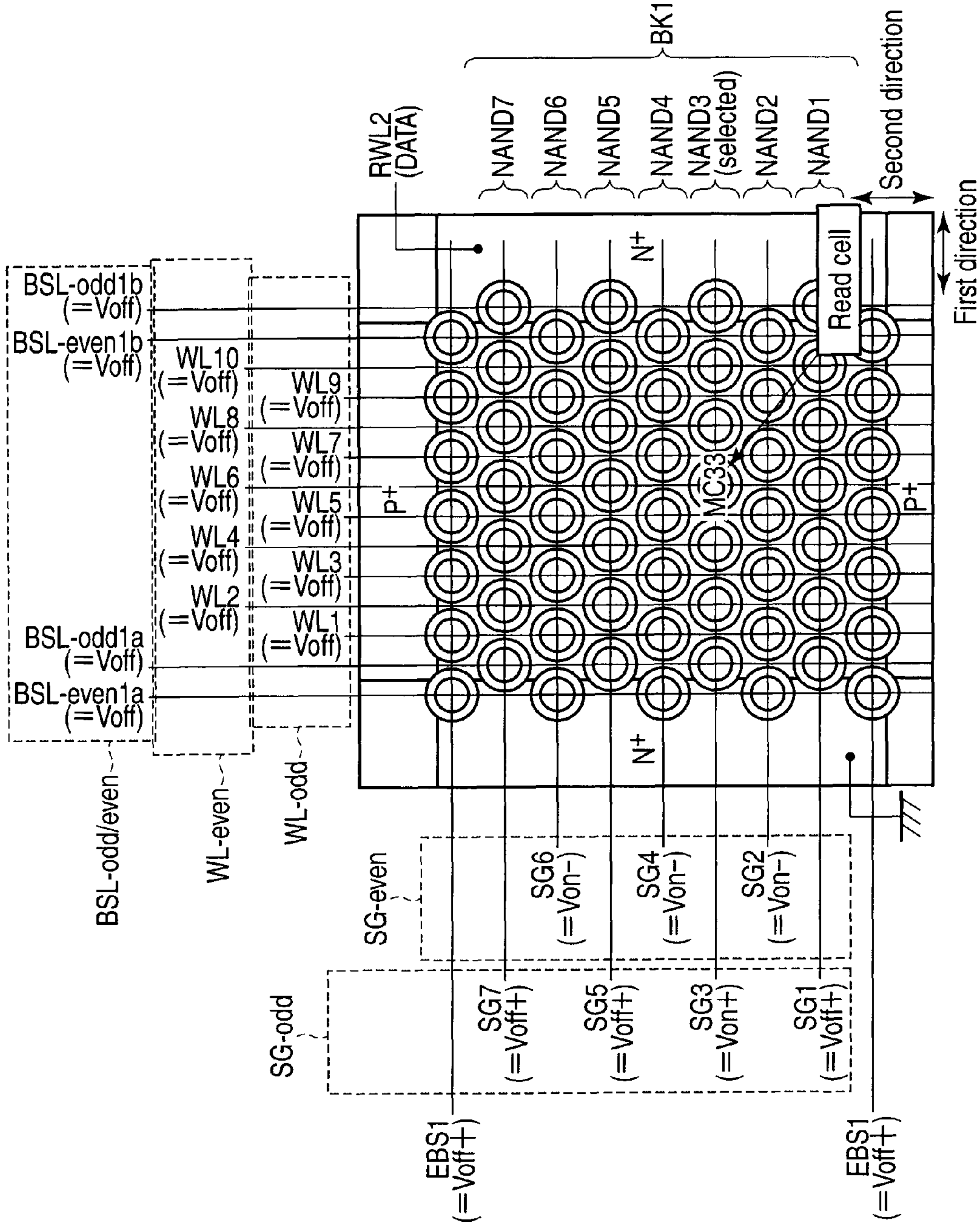

FIG. 119 shows potential relations of third step of the read operation.

Third step is intended to prepared for the next reading by erasing a channel inversion layer (electrons) by applying Voff to control gates of all memory cells in the selected NAND series.

If the cell to be read from is M33 in NAND series NAND3 (selected), read/write block select lines BSL-odd1*a*, BSL-odd1*b*, BSL-even1*a*, BSL-even1*b* and all word lines WL1 to WL10 are set to Voff.

Select gate lines SG1 to SG7 and erase block select line EBS1 are set as in second step of the read operation. That is, there is no need to change potentials of select gate lines SG1 to SG7 and erase block select line EBS1 from second step to third step.

More specifically, also in third step, selected select gate line SG3 is set to Von+ and unselected select gate lines SG2, SG4 on both sides thereof is set to Von−.

Selected select gate line SG3 is odd-numbered and thus, other odd-numbered select gate lines SG1, SG5, SG7 than selected select gate line SG3 are set to Voff+. Other even-numbered unselected select gate line SG6 than unselected select gate lines SG2, SG4 on both sides of selected select gate line SG3 is set to Von−.

Erase block select line EBS1 is set to Voff+.

When the above potential relations are maintained, Voff is applied to all control gates in selected NAND series NAND4 (selected). Thus, channel inversion layers (electrons) in all memory cells in selected NAND series NAND4 are erased so that the next reading can be prepared for.

Third step is added to prevent operations from being more complex by repeating first step and second step. Thus, the purpose of erasing channel inversion layers in all memory cells in selected NAND series can also be achieved by repeating first step and second step.

FIG. 120 shows a flow chart of reading.

In first step, Voff is applied to all control gates to erase channel inversion layers (electrons) in all memory cells and to block an electric conduction path (current path) of the NAND series.

In second step, data of the memory cell to be read is read.

In third step, Voff is applied to all control gates in the selected NAND series to erase channel inversion layers (electrons) in all memory cells in the selected NAND series. As a result, an electric conduction path in the selected NAND series is blocked.

Then, sequential data is read by changing the NAND series while the selected word line is fixed and repeating second and third steps.

After sequential data reading is completed, the result is one of 1. the block is changed, 2. the selected word line is changed, and 3. reading is completed.

If the position of word line is shifted only by one unit when the selected word line is changed, a NAND series that is different from the NAND series read immediately before is selected (with an even/odd change).

If the position of word line is shifted only by two units when the selected word line is changed, the same NAND series as the NAND series read immediately before is selected again (with no even/odd change).

5. SIMULTANEOUS DATA READING/WRITING

Simultaneous data reading/writing from/into blocks when a memory cell array is blocked will be described.

(1) Simultaneous Data Writing

Figure 121:
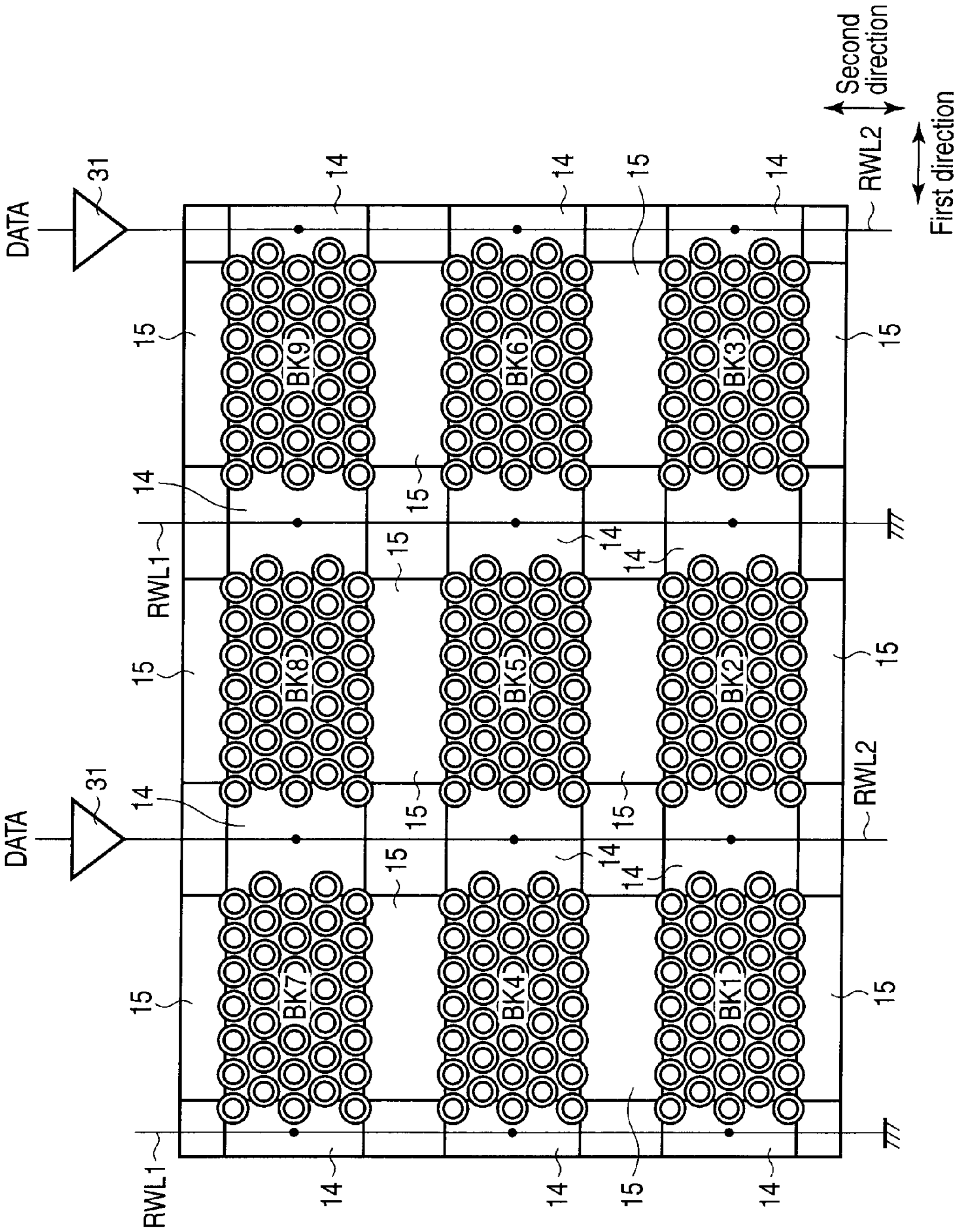

FIG. 121 shows an equivalent circuit of the memory cell array at time of writing.

Regarding blocks BK1, BK4, BK7 in the first column, first read/write line RWL1 is arranged on the left side of blocks BK1, BK4, BK7 and second read/write line RWL2 is arranged on the right side of blocks BK1, BK4, BK7.

Regarding blocks BK2, BK5, BK8 in the second column, first read/write line RWL1 is arranged on the right side of blocks BK2, BK5, BK8 and second read/write line RWL2 is arranged on the left side of blocks BK2, BK5, BK8.

Regarding blocks BK3, BK6, BK9 in the third column, first read/write line RWL1 is arranged on the left side of blocks BK3, BK6, BK9 and second read/write line RWL2 is arranged on the right side of blocks BK3, BK6, BK9.

In the present example, program data DATA is transferred from write buffer 31 to blocks BK1 to BK9 via second read/write line RWL2.

A case when data is written simultaneously in the above configuration will be described below.

FIG. 122 is a simplified diagram of the circuit in FIG. 121. However, the number of blocks increases from 9 to 24.

Write buffer 31 is arranged in read/write line control circuit 22.

Data is simultaneously written into odd-numbered column blocks or even-numbered column blocks. It is impossible to write data into odd-numbered column blocks and even-numbered column blocks simultaneously.

First, a case when data is simultaneously written into memory cells of three odd-numbered column blocks BK1, BK3, BK5 will be described.

In this case, as shown, for example, in FIG. 123, program data DATA is transferred from write buffer 31 to three odd-numbered column blocks BK1, BK3, BK5 via second read/write line RWL2.

Next, a case when data is simultaneously written into memory cells of three even-numbered column blocks BK2, BK4, BK6 will be described.

In this case, as shown, for example, in FIG. 124, program data DATA is transferred from write buffer 31 to three even-numbered column blocks BK2, BK4, BK6 via second read/write line RWL2.

Incidentally, write buffer 31 may be arranged, as shown, for example, in FIG. 125, at both ends of the memory cell array in the second direction.

(2) Simultaneous Data Reading

Figure 126:
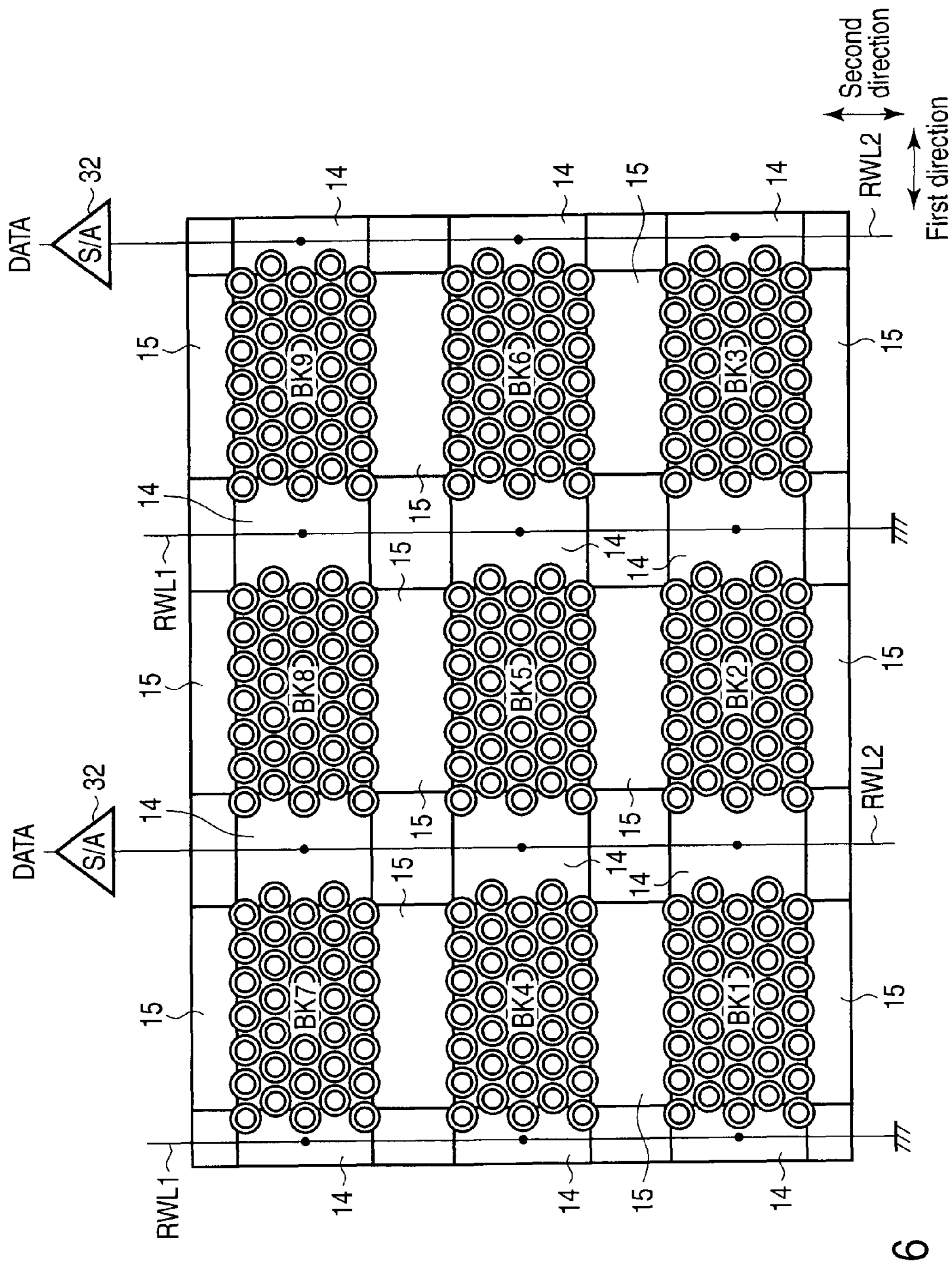

FIG. 126 shows an equivalent circuit of the memory cell array at time of reading.

Regarding blocks BK1, BK4, BK7 in the first column, first read/write line RWL1 is arranged on the left side of blocks BK1, BK4, BK7 and second read/write line RWL2 is arranged on the right side of blocks BK1, BK4, BK7.

Regarding blocks BK2, BK5, BK8 in the second column, first read/write line RWL1 is arranged on the right side of blocks BK2, BK5, BK8 and second read/write line RWL2 is arranged on the left side of blocks BK2, BK5, BK8.

Regarding blocks BK3, BK6, BK9 in the third column, first read/write line RWL1 is arranged on the left side of blocks BK3, BK6, BK9 and second read/write line RWL2 is arranged on the right side of blocks BK3, BK6, BK9.

In the present example, read data DATA is transferred from blocks BK1 to BK9 to sense amplifier (read buffer) 32 via second read/write line RWL2.

A case when data is read simultaneously in the above configuration will be described below.

Figure 127:
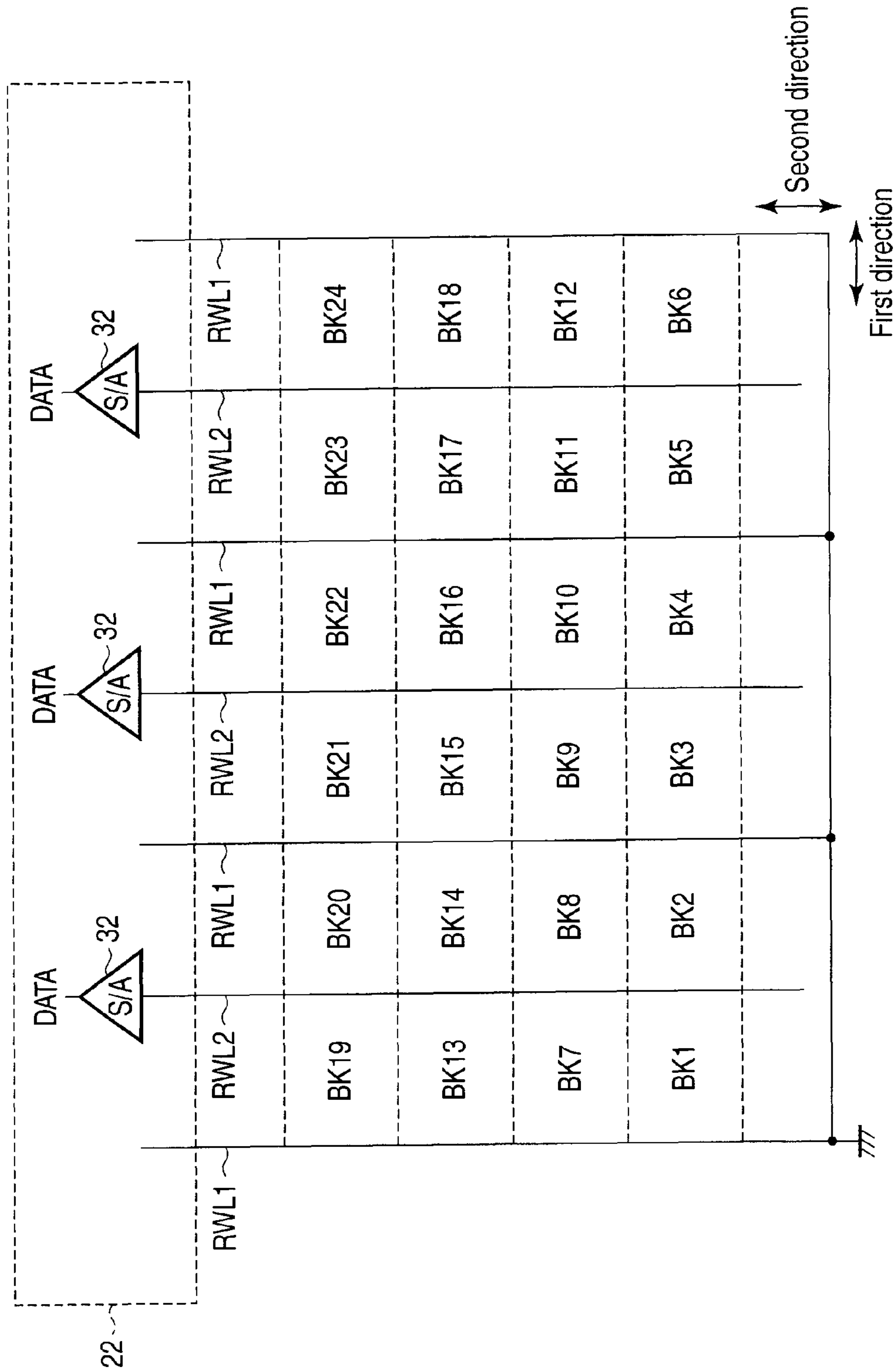

FIG. 127 is a simplified diagram of the circuit in FIG. 126. However, the number of blocks increases from 9 to 24.

Sense amplifier 32 is arranged in read/write line control circuit 22.

Data is simultaneously read from odd-numbered column blocks or even-numbered column blocks. It is impossible to read data from odd-numbered column blocks and even-numbered column blocks simultaneously.

First, a case when data is simultaneously read from memory cells of three odd-numbered column blocks BK1, BK3, BK5 will be described.

In this case, as shown, for example, in FIG. 128, read data DATA is transferred from three odd-numbered column blocks BK1, BK3, BK5 to sense amplifier 32 via second read/write line RWL2.

Next, a case when data is simultaneously read from memory cells of three even-numbered column blocks BK2, BK4, BK6 will be described.

In this case, as shown, for example, in FIG. 129, read data DATA is transferred from three even-numbered column blocks BK2, BK4, BK6 to sense amplifier 32 via second read/write line RWL2.

Incidentally, sense amplifier 32 may be arranged, as shown, for example, in FIG. 130, at both ends of the memory cell array in the second direction.

6. MEMORY CELL ARRAY IN THREE DIMENSIONS

Embodiments of the memory cell array in three dimensions based on the first and second basic structures concerning the present disclosure will be described.

(1) Memory Cell Array in Three Dimensions Based on the First Basic Structure

A. Device Structure

Figure 131:
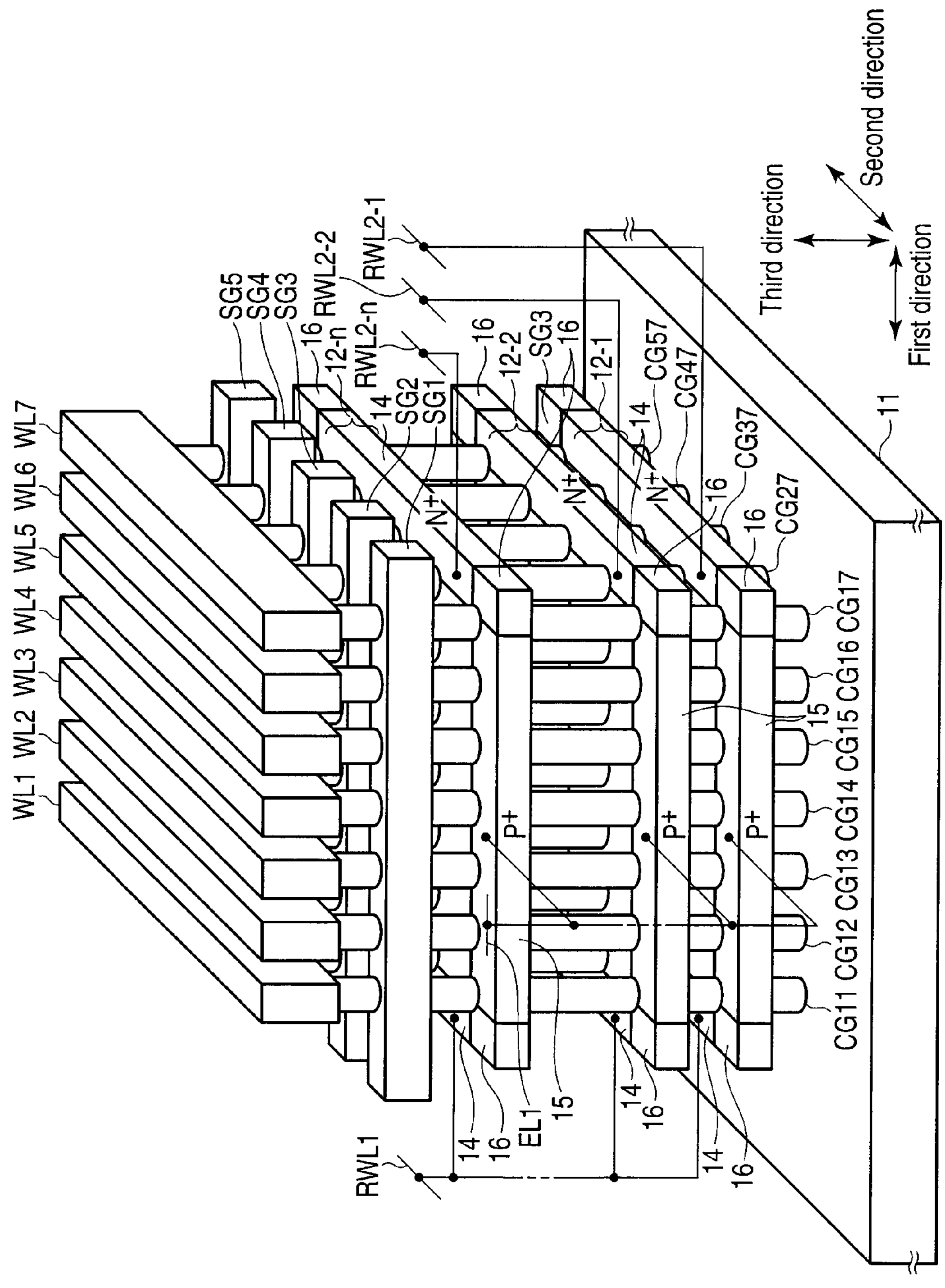
FIG. 131 is a view showing three-dimensional MaCS based on the first basic structure.
Figure 132:
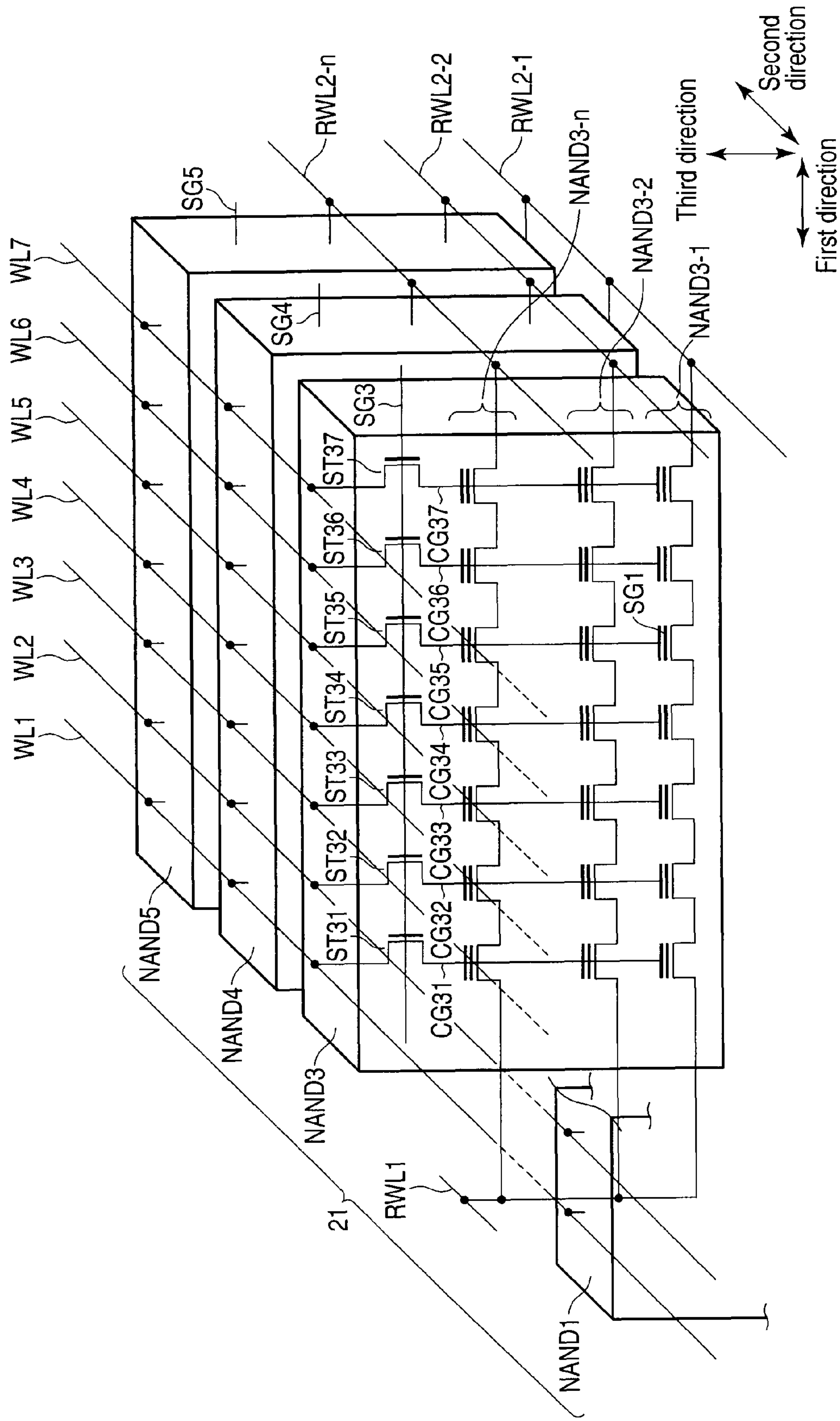
FIG. 132 is a view showing an equivalent circuit of three-dimensional MaCS.

FIG. 131 shows three-dimensional MaCS (non-volatile semiconductor memory) based on the first basic structure. FIG. 132 shows an equivalent circuit of the memory cell array in FIG. 131.

Semiconductor substrate 11 is constituted of a single crystal semiconductor formed of one crystal such as Si and Ge or a compound semiconductor formed of crystals (mixed crystal). n (n is a natural number of 2 or greater) semiconductor layers 12-1, 12-2, . . . , **12-*n* as active areas are arranged on semiconductor substrate 11. Each of n semiconductor layers 12-1, 12-2, . . . , 12-*n*** is constituted of, for example, an intrinsic semiconductor.

Control gates CG11 to CG57 are arranged in an array shape in the first direction parallel to the surface of semiconductor substrate 11 and in the second direction perpendicular to the first direction. Control gates CG11 to CG57 have an array size with 5×7 in the present example, but the array size can be changed when necessary.

The pitch of control gates CG11 to CG57 and the width in the first direction of semiconductor layers 12-1, 12-2, . . . , **12-*n* between control gates CG11 to CG57** are the same as those in the first basic structure and a detailed description thereof is not repeated here.

Control gates CG11 to CG57 pass through semiconductor layers 12-1, 12-2, . . . , **12-*n* in a third direction perpendicular to the first and second directions. The lower surface (surface on the semiconductor substrate 11 side) of control gates CG11 to CG57 is open and is not in contact with semiconductor substrate 11**.

Control gates CG11 to CG57 have a columnar shape extending in the third direction. The sectional shape of control gates CG11 to CG57 in the surface parallel to the surface of semiconductor substrate 11 is not limited to circular and may be elliptic, rectangular, or polygonal.

Control gates CG11 to CG57 are constituted of a conductor, for example, conductive polysilicon containing impurities, metal, or metal silicide.

Each side (sides in the first and second directions) of control gates CG11 to CG57 is covered with a stacked layer structure containing a data recording layer. NAND series NAND1 to NAND5 are constituted of semiconductor layers 12-1, 12-2, . . . , 12-*n*, control gates CG11 to CG57, and stacked layer structures (containing the data recording layer) therebetween.

The stacked layer structure containing the data recording layer and the structure of NAND series NAND1 to NAND5 are the same as those in the first basic structure and a detailed description thereof is not repeated here.

Two N+-type diffusion layers 14 are arranged in semiconductor layers 12-1, 12-2, . . . , 12-*n* at two ends of control gates CG11 to CG57 in the first direction. Two P+-type diffusion layers 15 are arranged in semiconductor layers 12-1, 12-2, . . . , 12-*n* at two ends of control gates CG11 to CG57 in the second direction.

N+-type diffusion layers 14 and P+-type diffusion layers 15 are insulated from each other by element isolation insulating layer 16.

First read/write line RWL1 is connected to one of two N+-type diffusion layers 14 and second read/write lines RWL2-1, RWL2-2, . . . , RWL2-*n* are connected to the other of two N+-type diffusion layers 14.

First read/write line RWL1 is provided in n semiconductor layers 12-1, 12-2, . . . , 12-*n* in common. In contrast, second read/write lines RWL2-1, RWL2-2, . . . , RWL2-*n* are provided independently of each other corresponding to n semiconductor layers 12-1, 12-2, . . . , 12-*n*.

First and second read/write lines RWL1, RWL2-1, RWL2-2, . . . , RWL2-*n* are used to read/write data from/into NAND series NAND1 to NAND5.

First erase line EL1 is connected to one of two P+-type diffusion layers 15 and second erase line EL2 is connected to the other of two P+-type diffusion layers 15. First and second erase lines EL1, EL2 are used to erase data from NAND series.

Select gate lines SG1 to SG5 extend in the first direction on semiconductor layers 12-1, 12-2, . . . , 12-*n*.

Each of select gate lines SG1 to SG5 functions as a select gate shared by select transistors STi1 to STi7 connected to between control gates CGi1 to CGi7 (i is one of 1 to 5) arranged in the first direction and word lines WL1 to WL7.

That is, select gate line SGi functions as a select gate shared by select transistors STi1 to STi7 connected to between control gates CGi1 to CGi7 and word lines WL1 to WL7.

Select gate lines SG1 to SG5 correspond to NAND series NAND1 to NAND5.

Word lines WL1 to WL7 extend in the second direction on select gate lines SG1 to SG5.

Each of word lines WL1 to WL7 is connected to control gates CG1*j* to CG5*j* (j is one of 1 to 7) arranged in the second direction in common. That is, word line WLj is connected to control gates CG1*j* to CG5*j* in common.

In this manner, a large-capacity next generation semiconductor memory can be realized as a memory cell array in three dimensions based on the first basic structure.

B. Basic Operation

B.-1. Write Operation

FIG. 133 shows an equivalent circuit of the memory cell array at time of writing.

A data write operation into each of n semiconductor layers 12-1, 12-2, . . . , 12-*n* is executed based on the basic operation of the first basic structure described in the architecture concept.

By providing n write buffers 31 corresponding to n semiconductor layers 12-1, 12-2, . . . , 12-*n*, simultaneous data writing into n semiconductor layers 12-1, 12-2, . . . , 12-*n* is enabled. Also, data can be written into at least one selected semiconductor layer of n semiconductor layers 12-1, 12-2, . . . , 12-*n*.

For example, if, as shown in FIG. 134, each of n semiconductor layers L1, L2, . . . , Ln (12-1, 12-2, . . . , 12-*n*) is constituted of 24 blocks (6 block columns) BK1 to BK24 and read/write line control circuits 22 are provided corresponding to n semiconductor layers L1, L2, . . . , Ln, up to 3n bits of data can be written simultaneously.

In general, if n semiconductor layers L1, L2, . . . , Ln are stacked and each semiconductor layer has P (P is an even number) block columns, up to (P/2)×n bits of data can be written simultaneously.

B.-2 Read Operation

Figure 135:
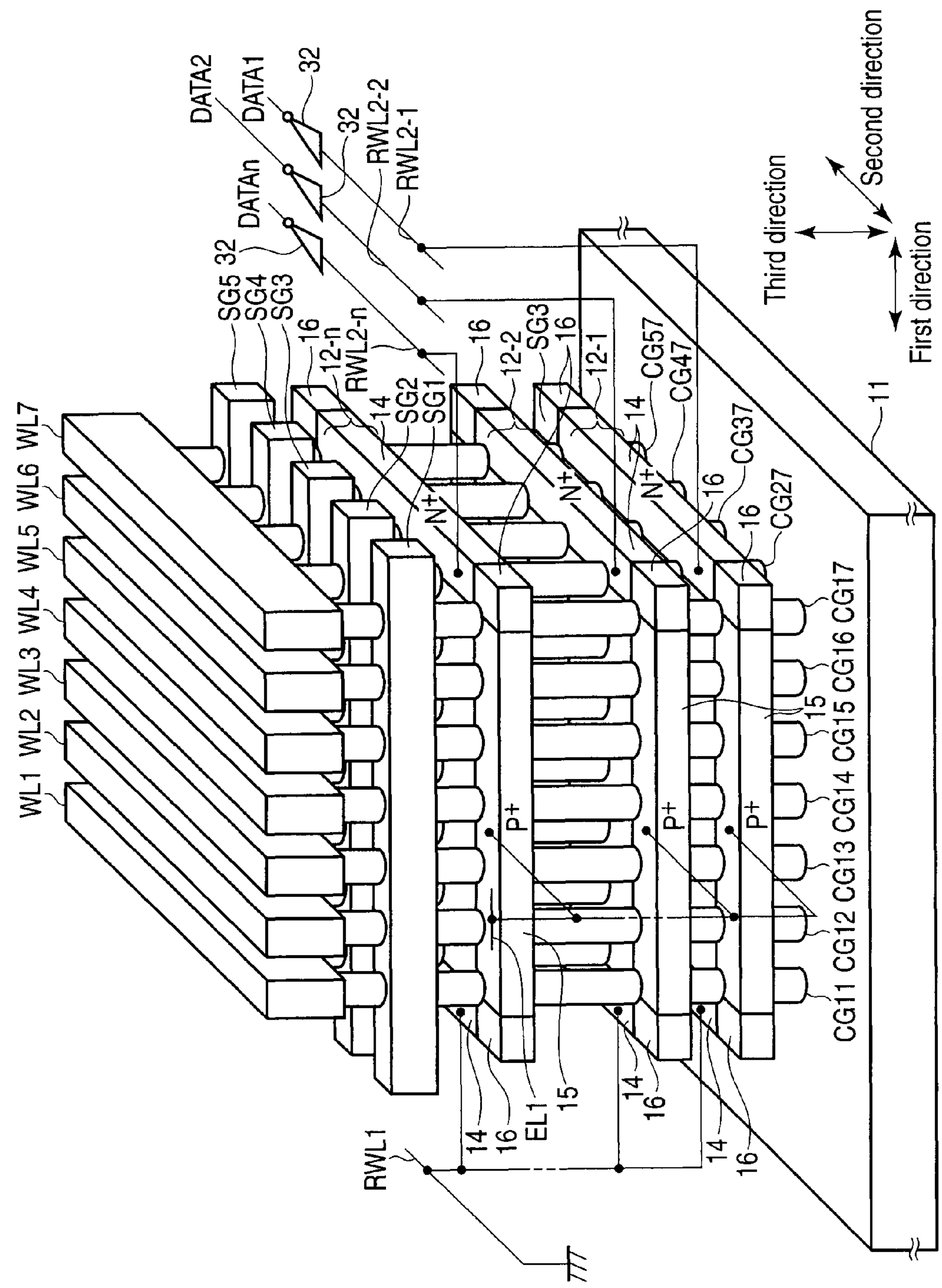

FIG. 135 shows an equivalent circuit of the memory cell array at time of reading.

A data read operation from each of n semiconductor layers 12-1, 12-2, . . . , 12-*n* is executed based on the basic operation of the first basic structure described in the architecture concept.

By providing n sense amplifiers 32 corresponding to n semiconductor layers 12-1, 12-2, . . . , 12-*n*, simultaneous data reading from n semiconductor layers 12-1, 12-2, . . . , 12-*n* is enabled. Also, data can be read from at least one selected semiconductor layer of n semiconductor layers 12-1, 12-2, . . . , 12-*n*.

For example, if, as shown in FIG. 136, each of n semiconductor layers L1, L2, . . . , Ln (12-1, 12-2, . . . , 12-*n*) is constituted of 24 blocks (6 block columns) BK1 to BK24 and read/write line control circuits 22 are provided corresponding to n semiconductor layers L1, L2, . . . , Ln, up to 3n bits of data can be read simultaneously.

In general, if n semiconductor layers L1, L2, . . . , Ln are stacked and each semiconductor layer has P (P is an even number) block columns, up to (P/2)×n bits of data can be read simultaneously.

B.-3 Erase Operation

An erase operation can be executed on n semiconductor layers 12-1, 12-2, . . . , 12-*n* simultaneously or at least one selected semiconductor layer of n semiconductor layers in the structure in FIG. 131.

(2) Memory Cell Array in Three Dimensions Based on the Second Basic Structure

A. Device Structure

Figure 137:
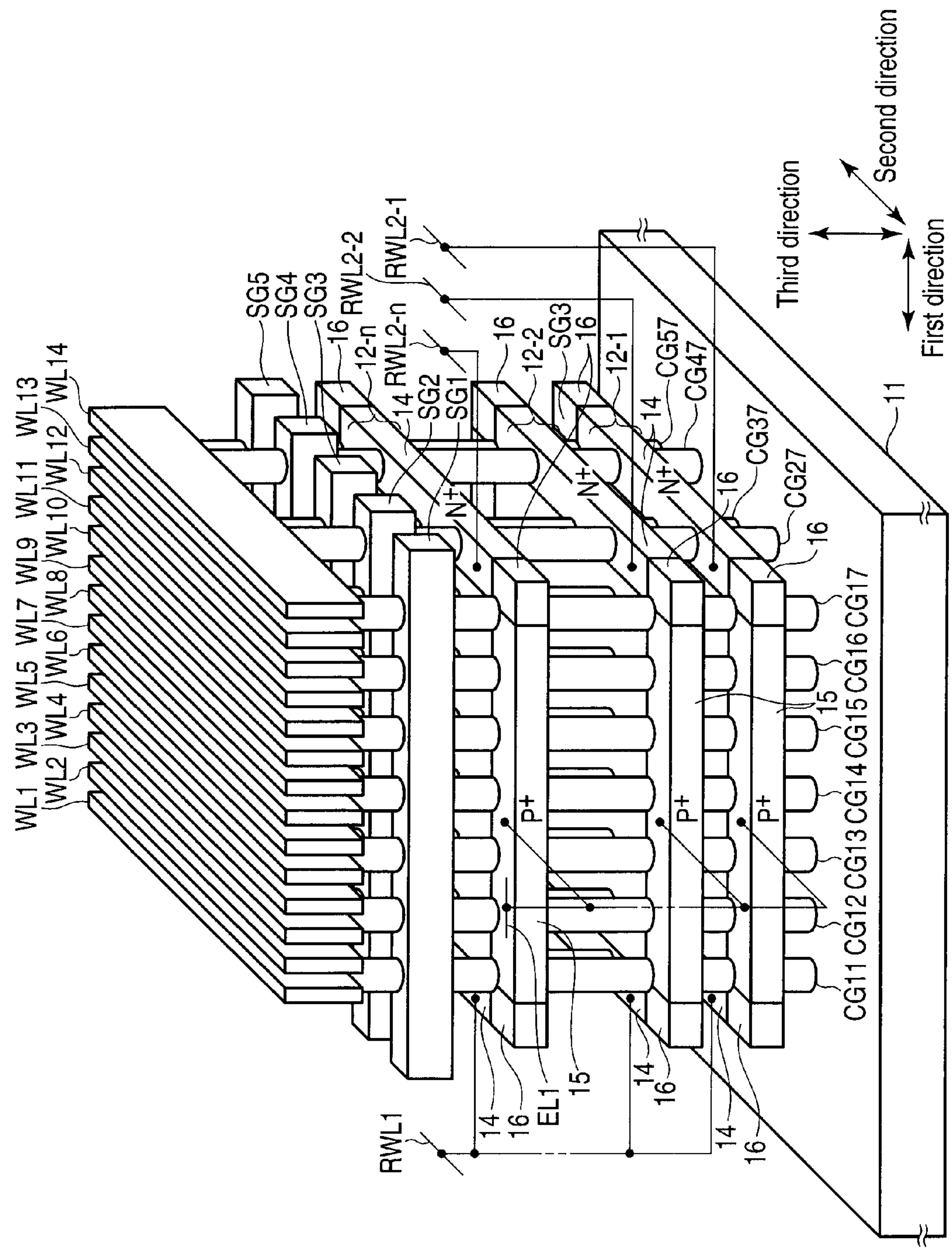
FIG. 137 is a view showing three-dimensional MaCS based on the second basic structure.
Figure 138:
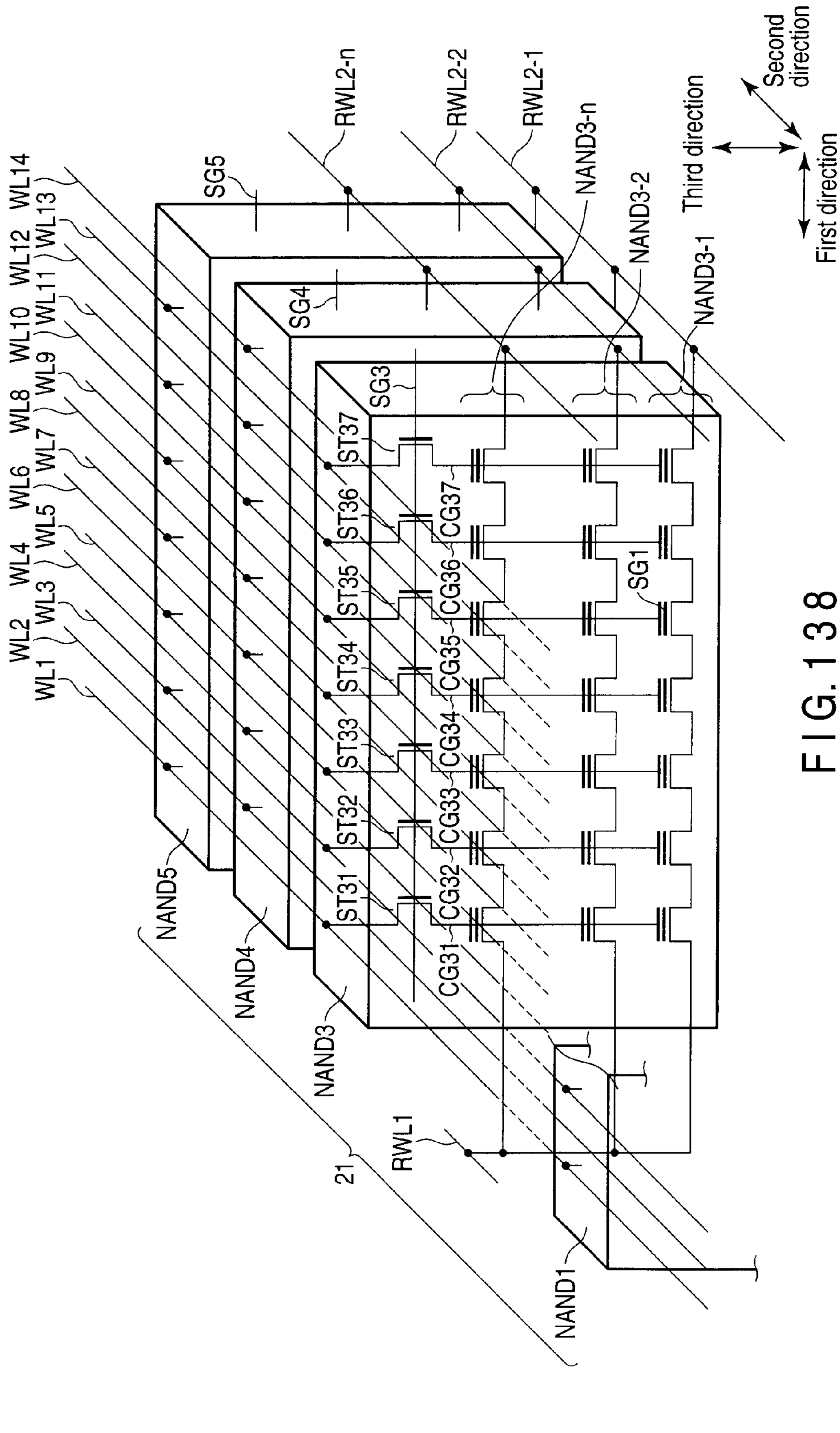
FIG. 138 is a view showing the equivalent circuit of three-dimensional MaCS.

FIG. 137 shows three-dimensional MaCS (non-volatile semiconductor memory) based on the second basic structure. FIG. 138 shows an equivalent circuit of the memory cell array in FIG. 137.

Semiconductor substrate 11 is constituted of a single crystal semiconductor formed of one crystal such as Si and Ge or a compound semiconductor formed of crystals (mixed crystal). n (n is a natural number of 2 or greater) semiconductor layers 12-1, 12-2, . . . , 12-*n* as active areas are arranged on semiconductor substrate 11. Each of n semiconductor layers 12-1, 12-2, . . . , **12-*n*** is constituted of, for example, an intrinsic semiconductor.

Control gates CG11 to CG57 are arranged in an array shape in the first direction parallel to the surface of semiconductor substrate 11 and in the second direction perpendicular to the first direction. Control gates CG11 to CG57 have an array size with 5×7 in the present example, but the array size can be changed when necessary.

Control gates CG11 to CG57 have a hexagonal close-packed structure or houndstooth check structure as a whole. The pitch of control gates CG11 to CG57 and the width in the first direction of semiconductor layers 12-1, 12-2, . . . , **12-*n* between control gates CG11 to CG57** are the same as those in the second basic structure and a detailed description thereof is not repeated here.

Control gates CG11 to CG57 pass through semiconductor layers 12 in the third direction perpendicular to the first and second directions. The lower surface (surface on the semiconductor substrate 11 side) of control gates CG11 to CG57 is open and is not in contact with semiconductor substrate 11.

Control gates CG11 to CG57 have a columnar shape extending in the third direction. The sectional shape of column-shaped control gates CG11 to CG57 in the surface parallel to the surface of semiconductor substrate 11 is not limited to circular and may be elliptic, rectangular, or polygonal.

Control gates CG11 to CG57 are constituted of a conductor, for example, conductive polysilicon containing impurities, metal, or metal silicide.

Each side (sides in the first and second directions) of control gates CG11 to CG57 is covered with a stacked layer structure containing a data recording layer. NAND series NAND1 to NAND5 are constituted of semiconductor layers 12-1, 12-2, . . . , **12-*n*, control gates CG11 to CG57**, and stacked layer structures (containing the data recording layer) therebetween.

The stacked layer structure containing the data recording layer and the structure of NAND series NAND1 to NAND5 are the same as those in the second basic structure and a detailed description thereof is not repeated here.

Two N+-type diffusion layers 14 are arranged in semiconductor layers 12-1, 12-2, . . . , **12-*n* at two ends of control gates CG11 to CG57 in the first direction. Two P+-type diffusion layers 15 are arranged in semiconductor layers 12-1, 12-2, . . . , 12-*n* at two ends of control gates CG11 to CG57 in the second direction. N+-type diffusion layers 14 and P+-type diffusion layers 15 are insulated from each other by element isolation insulating layer 16**.

First read/write line RWL1 is connected to one of two N+-type diffusion layers 14 and second read/write lines RWL2-1, RWL2-2, . . . , RWL**2-*n* are connected to the other of two N+-type diffusion layers 14**.

First read/write line RWL1 is provided in n semiconductor layers 12-1, 12-2, . . . , **12-*n* in common. In contrast, second read/write lines RWL2-1, RWL2-2, . . . , RWL2-*n* are provided independently of each other corresponding to n semiconductor layers 12-1, 12-2, . . . , 12-*n***.

First and second read/write lines RWL1, RWL2-1, RWL2-2, . . . , RWL**2-*n* are used to read/write data from/into NAND series NAND1 to NAND5**.

First erase line EL1 is connected to one of two P+-type diffusion layers 15 and second erase line EL2 is connected to the other of two P+-type diffusion layers 15. First and second erase lines EL1, EL2 are used to erase data from NAND series.

Select gate lines SG1 to SG5 extend in the first direction on semiconductor layers 12-1, 12-2, . . . , **12-*n***.

Each of select gate lines SG1 to SG5 functions as a select gate shared by select transistors STi1 to STi7 connected to between control gates CGi1 to CGi7 (i is one of 1 to 5) arranged in the first direction and word lines WL1 to WL14.

That is, select gate line SGi functions as a select gate shared by select transistors STi1 to STi7 connected to between control gates CGi1 to CGi7 and word lines WL1 to WL14.

Select gate lines SG1 to SG5 correspond to NAND series NAND1 to NAND5.

Word lines WL1 to WL14 extend in the second direction on select gate lines SG1 to SG5. Control gates CG11 to CG57 are laid out as a hexagonal close-packed structure in the present example and thus, the number of word lines is twice that in the first basic structure.

Of word lines WL1 to WL14, each of odd-numbered word lines WL-odd (WL1, WL3, WL5, . . . , WL13) is connected to control gates CG**2*j*, CG4*j*** (j is one of 1 to 7) arranged in the second direction in common.

Of word lines WL1 to WL14, each of even-numbered word lines WL-even (WL2, WL4, WL6, . . . , WL14) is connected to control gates CG**1*j*, CG3*j*, CG5*j*** (j is one of 1 to 7) arranged in the second direction in common.

In this manner, a large-capacity next generation semiconductor memory can be realized as a memory cell array in three dimensions based on the second basic structure.

B. Basic Operation

B.-1. Write Operation

FIG. 139 shows an equivalent circuit of the memory cell array at time of writing.

A data write operation into each of n semiconductor layers 12-1, 12-2, . . . , **12-*n*** is executed based on the basic operation of the second basic structure described in the architecture concept.

By providing n write buffers 31 corresponding to n semiconductor layers 12-1, 12-2, . . . , **12-*n*, simultaneous data writing into n semiconductor layers 12-1, 12-2, . . . , 12-*n* is enabled. Also, data can be written into at least one selected semiconductor layer of n semiconductor layers 12-1, 12-2, . . . , 12-*n***.

For example, if, as shown in FIG. 140, each of n semiconductor layers L1, L2, . . . , Ln (12-1, 12-2, . . . , **12-*n*) is constituted of 24 blocks (6 block columns) BK1 to BK24 and read/write line control circuits 22 are provided corresponding to n semiconductor layers L1, L2**, . . . , Ln, up to 3n bits of data can be written simultaneously.

In general, if n semiconductor layers L1, L2, . . . , Ln are stacked and each semiconductor layer has P (P is an even number) block columns, up to (P/2)×n bits of data can be written simultaneously.

B.-2 Read Operation

Figure 141:
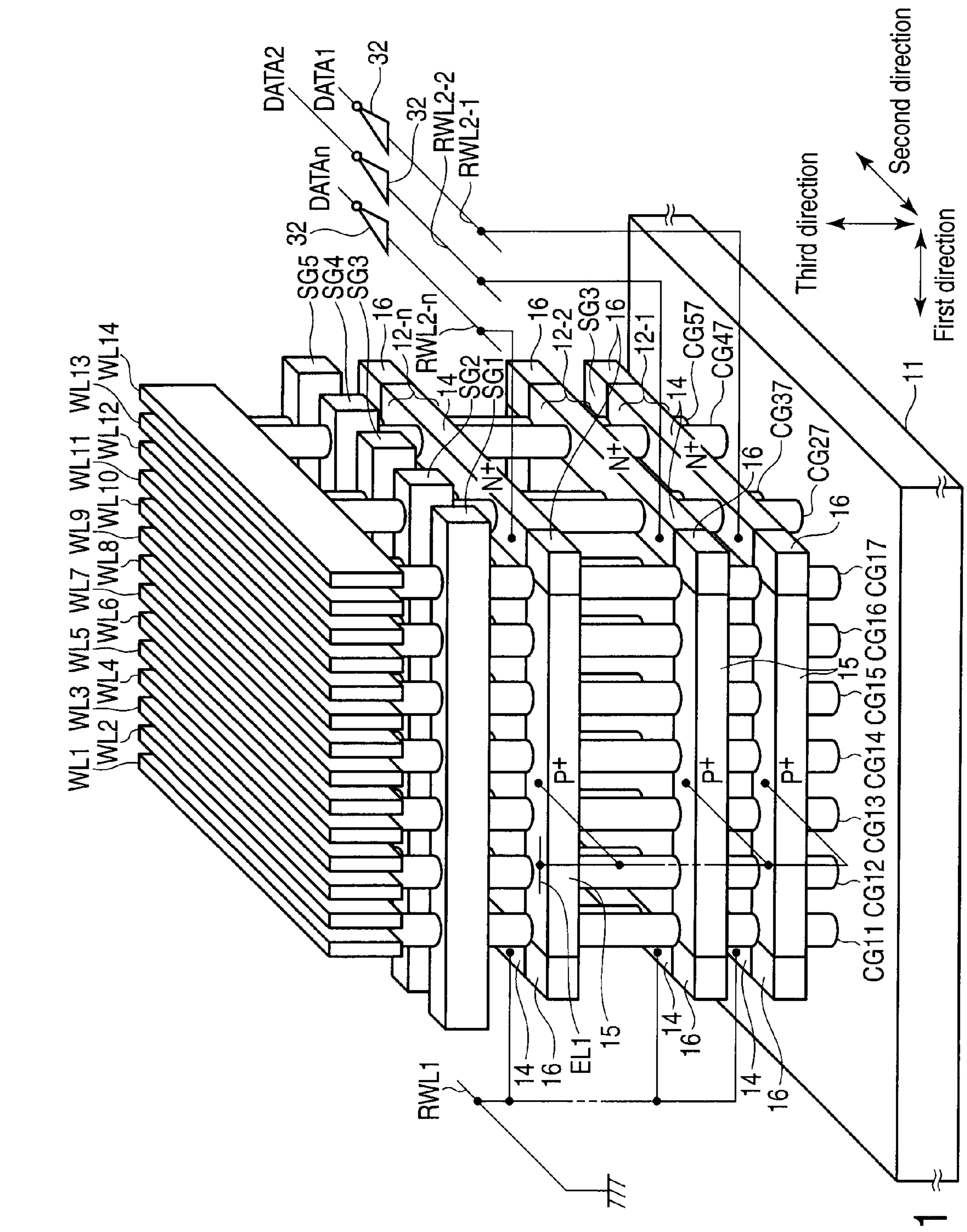
FIG. 141 and FIG. 142 are views showing the read operation, respectively.

FIG. 141 shows an equivalent circuit of the memory cell array at time of reading.

A data read operation from each of n semiconductor layers 12-1, 12-2, . . . , **12-*n*** is executed based on the basic operation of the second basic structure described in the architecture concept.

By providing n sense amplifiers 32 corresponding to n semiconductor layers 12-1, 12-2, . . . , **12-*n*, simultaneous data reading from n semiconductor layers 12-1, 12-2, . . . , 12-*n* is enabled. Also, data can be read from at least one selected semiconductor layer of n semiconductor layers 12-1, 12-2, . . . , 12-*n***.

Figure 142:
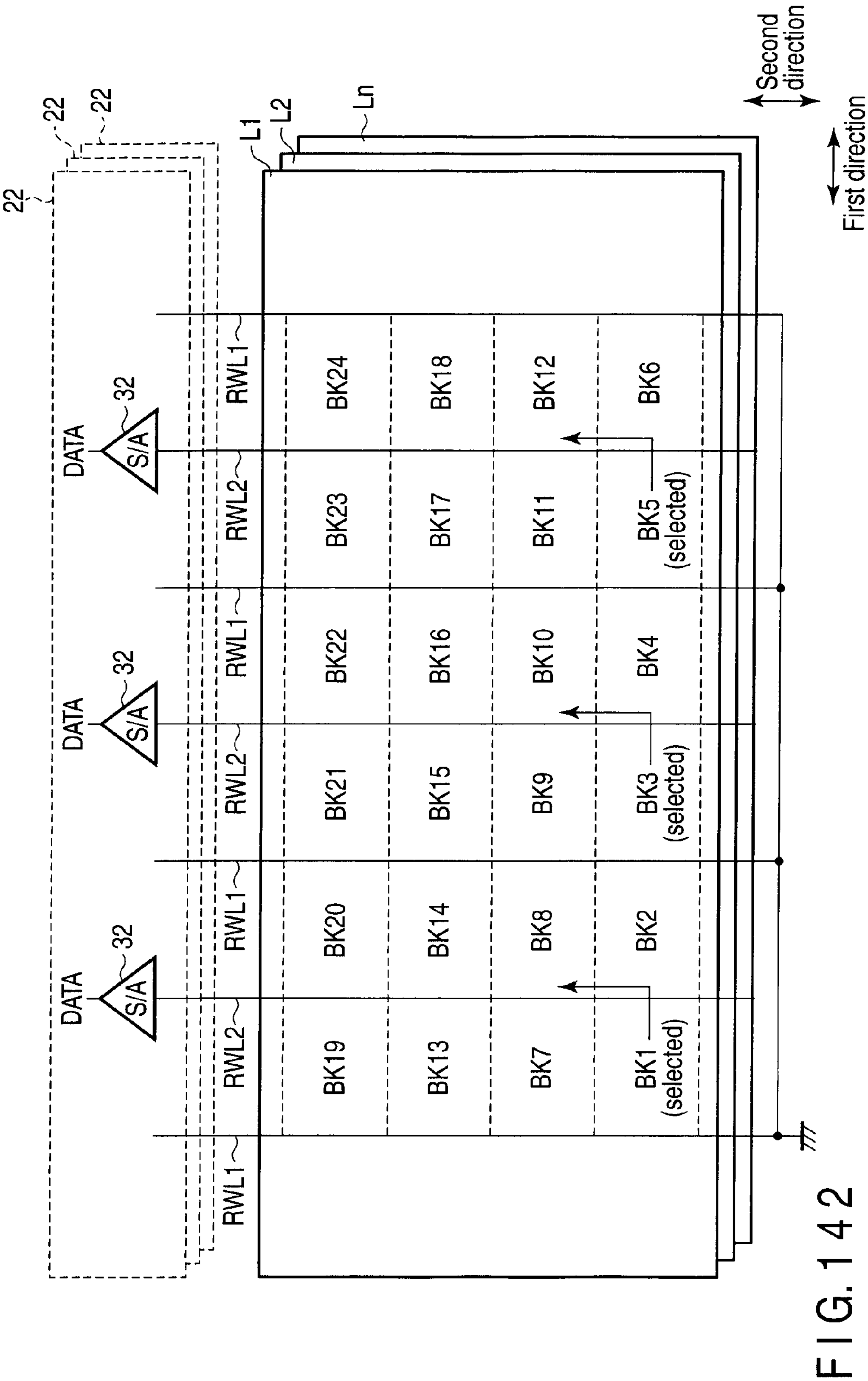

For example, if, as shown in FIG. 142, each of n semiconductor layers L1, L2, . . . , Ln (12-1, 12-2, . . . , 12-*n*) is constituted of 24 blocks (6 block columns) BK1 to BK24 and read/write line control circuits 22 are provided corresponding to n semiconductor layers L1, L2, . . . , Ln, up to 3n bits of data can be read simultaneously.

In general, if n semiconductor layers L1, L2, . . . , Ln are stacked and each semiconductor layer has P (P is an even number) block columns, up to (P/2)×n bits of data can be read simultaneously.

B.-3 Erase Operation

An erase operation can be executed on n semiconductor layers 12-1, 12-2, . . . , 12-*n* simultaneously or at least one selected semiconductor layer of n semiconductor layers in the structure in FIG. 137.

(3) Memory Cell

A memory cell of three-dimensional MaCS (non-volatile semiconductor memory) will be described.

FIG. 143 shows a first example of the memory cell array. Control gate CGij extends in the third direction perpendicular to the semiconductor substrate and is surrounded by stacked layer structure 13.

Stacked layer structure 13 includes gate insulating layer 13*a*, data recording layer 13*b*, and block insulating layer (or inter-electrode insulating layer) 13*c*. Gate insulating layer 13*a* is arranged in a position farthest apart from control gate CGij, that is, in a position in contact with semiconductor layers 12-1, 12-2, 12-3, . . . , 12-*n* as active areas (channels).

Memory cell MCij is formed between control gate CGij and respective semiconductor layers 12-1, 12-2, 12-3, . . . , 12-*n*. In the present example, data recording layers 13*b* of memory cells MCij sharing control gate CGij are connected and integrated.

Data recording layer 13*b* may be an insulator or conductor.

If data recording layer 13*b* is constituted of an insulator, the memory cell is, for example, a SONOS type or MONOS type flash memory cell.

If data recording layer 13*b* is constituted of an insulator, data recording layer 13*b* may be, for example, a ferroelectric in which the direction of an electric dipole changes depending on an electric field or a variable resistive element (such as a phase change material and metallic oxide) whose resistance changes depending on an electric field.

If data recording layer 13*b* is constituted of a conductor, the memory cell is, for example, a floating gate type flash memory cell.

Control gate CGij is connected to word line WLj via select transistor STij. Select transistor STij includes semiconductor layer 17, gate insulating layer 18 surrounding semiconductor layer 17, P-type channel region 19 in semiconductor layer 17, and select gate line SGi.

FIG. 144 shows a second example of the memory cell array.

Control gate CGij extends in the third direction perpendicular to the semiconductor substrate and is surrounded by stacked layer structure 13.

Stacked layer structure 13 includes gate insulating layer 13*a*, data recording layer 13*b*, and block insulating layer (or inter-electrode insulating layer) 13*c*. Gate insulating layer 13*a* is arranged in a position farthest apart from control gate CGij, that is, in a position in contact with semiconductor layers 12-1, 12-2, . . . , 12-*n* as active areas (channels).

Memory cell MCij is formed between control gate CGij and respective semiconductor layers 12-1, 12-2, 12-3, . . . , 12-*n*. In the present example, data recording layers 13*b* of memory cells MCij sharing control gate CGij are separated from each other.

Data recording layer 13*b* may be an insulator or conductor.

If data recording layer 13*b* is constituted of an insulator, the memory cell is, for example, a SONOS type or MONOS type flash memory cell.

If data recording layer 13*b* is constituted of an insulator, data recording layer 13*b* may be, for example, a ferroelectric in which the direction of an electric dipole changes depending on an electric field or a variable resistive element (such as a phase change material and metallic oxide) whose resistance changes depending on an electric field.

If data recording layer 13*b* is constituted of a conductor, the memory cell is, for example, a floating gate type flash memory cell.

Control gate CGij is connected to word line WLj via select transistor STij. Select transistor STij includes semiconductor layer 17, gate insulating layer 18 surrounding semiconductor layer 17, P-type channel region 19 in semiconductor layer 17, and select gate line SGi.

FIG. 145 shows a third example of the memory cell array. Control gate CGij extends in the third direction perpendicular to the semiconductor substrate and is surrounded by stacked layer structure 13.

Stacked layer structure 13 includes gate insulating layer 13*a*, data recording layer 13*b*, and block insulating layer (or inter-electrode insulating layer) 13*c*. Gate insulating layer 13*a* is arranged in a position in contact with control gate CGij, that is, in a position farthest apart from semiconductor layers 12-1, 12-2, 12-3, . . . , 12-*n* as active areas (channels).

Memory cell MCij is formed between control gate CGij and respective semiconductor layers 12-1, 12-2, 12-3, . . . , 12-*n*. In the present example, data recording layers 13*b* of memory cells MCij sharing control gate CGij are connected and integrated.

Data recording layer 13*b* may be an insulator or conductor.

If data recording layer 13*b* is constituted of an insulator, the memory cell is, for example, a SONOS type or MONOS type flash memory cell.

If data recording layer 13*b* is constituted of an insulator, data recording layer 13*b* may be, for example, a ferroelectric in which the direction of an electric dipole changes depending on an electric field or a variable resistive element (such as a phase change material and metallic oxide) whose resistance changes depending on an electric field.

If data recording layer 13*b* is constituted of a conductor, the memory cell is, for example, a floating gate type flash memory cell.

Control gate CGij is connected to word line WLj via select transistor STij. Select transistor STij includes semiconductor layer 17, gate insulating layer 18 surrounding semiconductor layer 17, P-type channel region 19 in semiconductor layer 17, and select gate line SGi.

FIG. 146 shows a fourth example of the memory cell array.

Control gate CGij extends in the third direction perpendicular to the semiconductor substrate and is surrounded by stacked layer structure 13.

Stacked layer structure 13 includes gate insulating layer 13*a*, data recording layer 13*b*, and block insulating layer (or inter-electrode insulating layer) 13*c*. Gate insulating layer 13*a* is arranged in a position in contact with control gate CGij, that is, in a position farthest apart from semiconductor layers 12-1, 12-2, 12-3, . . . , 12-*n* as active areas (channels).

Memory cell MCij is formed between control gate CGij and respective semiconductor layers 12-1, 12-2, 12-3, . . . , 12-*n*. In the present example, data recording layers 13*b* of memory cells MCij sharing control gate CGij are separated from each other.

Data recording layer 13*b* may be an insulator or conductor.

If data recording layer 13*b* is constituted of an insulator, the memory cell is, for example, a SONOS type or MONOS type flash memory cell.

If data recording layer 13*b* is constituted of an insulator, data recording layer 13*b* may be, for example, a ferroelectric in which the direction of an electric dipole changes depending on an electric field or a variable resistive element (such as a phase change material and metallic oxide) whose resistance changes depending on an electric field.

If data recording layer 13*b* is constituted of a conductor, the memory cell is, for example, a floating gate type flash memory cell.

Control gate CGij is connected to word line WLj via select transistor STij. Select transistor STij includes semiconductor layer 17, gate insulating layer 18 surrounding semiconductor layer 17, P-type channel region 19 in semiconductor layer 17, and select gate line SGi.

(4) Structure of a Contact Area

The structure of a contact area of three-dimensional MaCS (non-volatile semiconductor memory) will be described.

In the description below, the device structure in FIG. 137 is assumed for three-dimensional MaCS.

A. Overview

Figure 147:
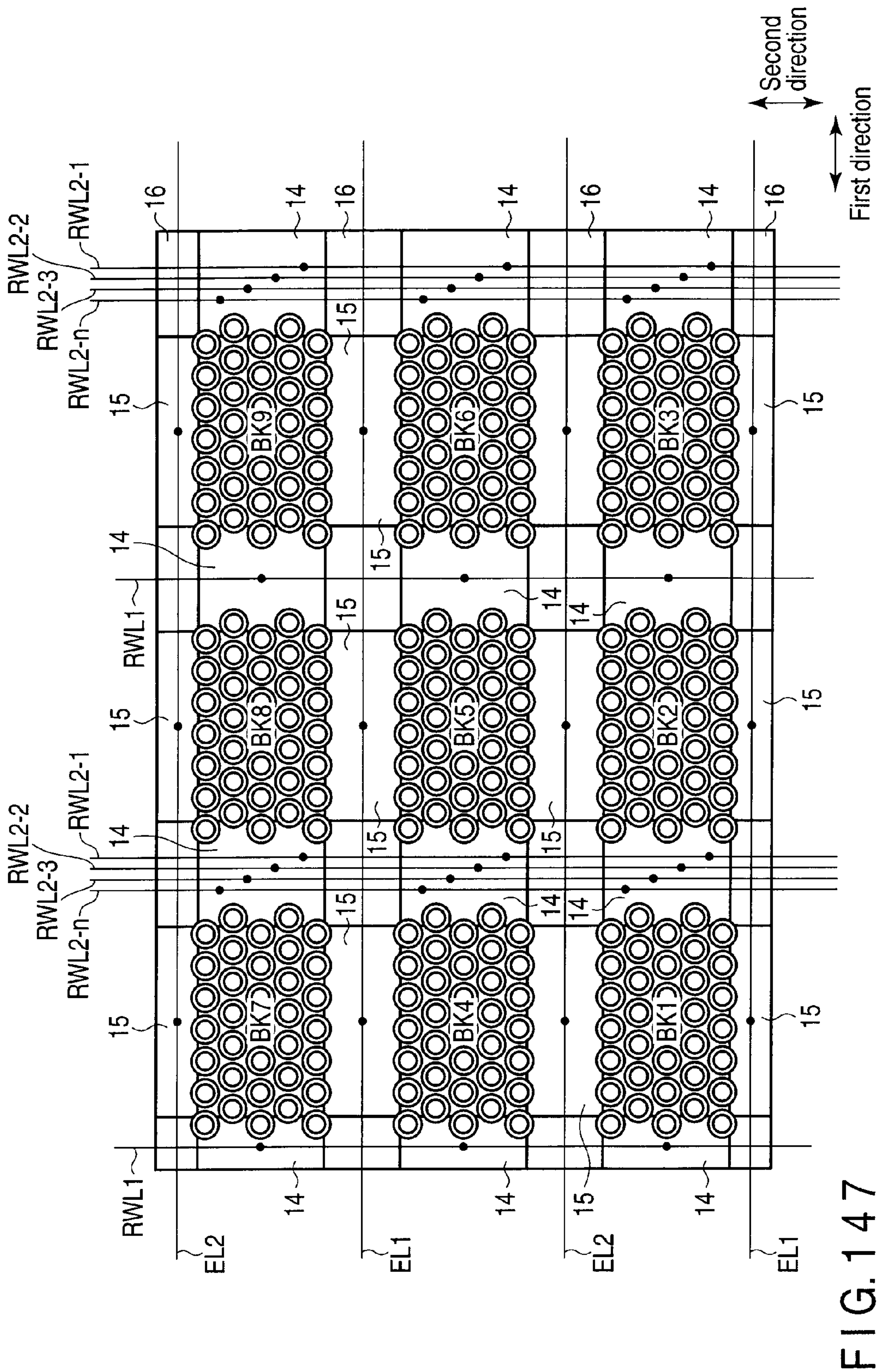
FIG. 147 is a plan view of the memory cell array of three-dimensional MaCS.

FIG. 147 shows a plan view of a memory cell array of three-dimensional MaCS.

Regarding blocks BK1, BK4, BK7 in the first column, first read/write line RWL1 is arranged on the left side of blocks BK1, BK4, BK7 and second read/write lines RWL2-1, RWL2-2, RWL2-3, . . . , RWL2-*n* are arranged on the right side of blocks BK1, BK4, BK7.

Regarding blocks BK2, BK5, BK8 in the second column, first read/write line RWL1 is arranged on the right side of blocks BK2, BK5, BK8 and second read/write lines RWL2-1, RWL2-2, RWL2-3, . . . , RWL2-*n* are arranged on the left side of blocks BK2, BK5, BK8.

Regarding blocks BK3, BK6, BK9 in the third column, first read/write line RWL1 is arranged on the left side of blocks BK3, BK6, BK9 and second read/write lines RWL2-1, RWL2-2, RWL2-3, . . . , RWL2-*n* are arranged on the right side of blocks BK3, BK6, BK9.

First read/write line RWL1 is connected to n semiconductor layers 12-1, 12-2, . . . , 12-*n* in common in FIG. 137. Similarly, first and second erase lines EL1, EL2 are connected to n semiconductor layers 12-1, 12-2, . . . , 12-*n* in common in FIG. 137.

Second read/write lines RWL2-1, RWL2-2, RWL2-3, . . . , RWL2-*n* correspond to n semiconductor layers 12-1, 12-2, . . . , 12-*n* in FIG. 137. That is, second read/write line RWL2-1 is connected to semiconductor layer 12-1 in FIG. 137, second read/write line RWL2-2 is connected to semiconductor layer 12-2 in FIG. 137, and second read/write line RWL2-*n* is connected to semiconductor layer 12-*n* in FIG. 137.

B. First Read/Write Line and First and Second Erase Lines

FIG. 148 shows block BK1 in FIG. 147. FIG. 149 is a sectional view along a CXLIX-CXLIX line in FIG. 148, FIG. 150 is a sectional view along a CL-CL line in FIG. 148, and FIG. 151 is a sectional view along a CLI-CLI line in FIG. 148.

In the present example, first read/write line RWL1 and first and second erase lines EL1, EL2 are shared by n semiconductor layers 12-1, 12-2, . . . , 12-*n* stacked on semiconductor substrate 11.

Contact plug CPrwl1 extends in the third direction and passes through n semiconductor layers 12-1, 12-2, . . . , 12-*n* stacked on semiconductor substrate 11. One end (upper end) of contact plug CPrwl1 is connected to first read/write line RWL1 and the other end (lower end) is open.

Contact plug CPrwl1 electrically connects first read/write line RWL1 and semiconductor layers 12-1, 12-2, . . . , 12-*n*.

Contact plug CPel1 extends in the third direction and passes through n semiconductor layers 12-1, 12-2, . . . , 12-*n* stacked on semiconductor substrate 11. One end (upper end) of contact plug CPel1 is connected to first erase line EL1 and the other end (lower end) is open.

Contact plug CPel1 electrically connects first erase line EL1 and semiconductor layers 12-1, 12-2, . . . , 12-*n*.

Contact plug CPel2 extends in the third direction and passes through n semiconductor layers 12-1, 12-2, . . . , 12-*n* stacked on semiconductor substrate 11. One end (upper end) of contact plug CPel2 is connected to second erase line EL2 and the other end (lower end) is open.

Contact plug CPel2 electrically connects second erase line EL2 and semiconductor layers 12-1, 12-2, . . . , 12-*n*.

In the examples in FIGS. 149 to 151, first read/write line RWL1 and first and second erase lines EL1, EL2 are connected to the upper end (end on the opposite side of semiconductor substrate 11 side) of contact plugs CPrwl1, CPel1, and CPel2.

As shown, for example, in FIGS. 152 to 154, by contrast, first read/write line RWL1 and first and second erase lines EL1, EL2 may be connected to the lower end (end on the side of semiconductor substrate 11) of contact plugs CPrwl1, CPel1, and CPel2.

C. Second Read/Write Line

A contact structure of a second read/write line and n semiconductor layers will be described.

In the present example, the second read/write line is independently provided in each of n semiconductor layers stacked on semiconductor substrate.

C.-1 Staircase Structure

Figure 155:
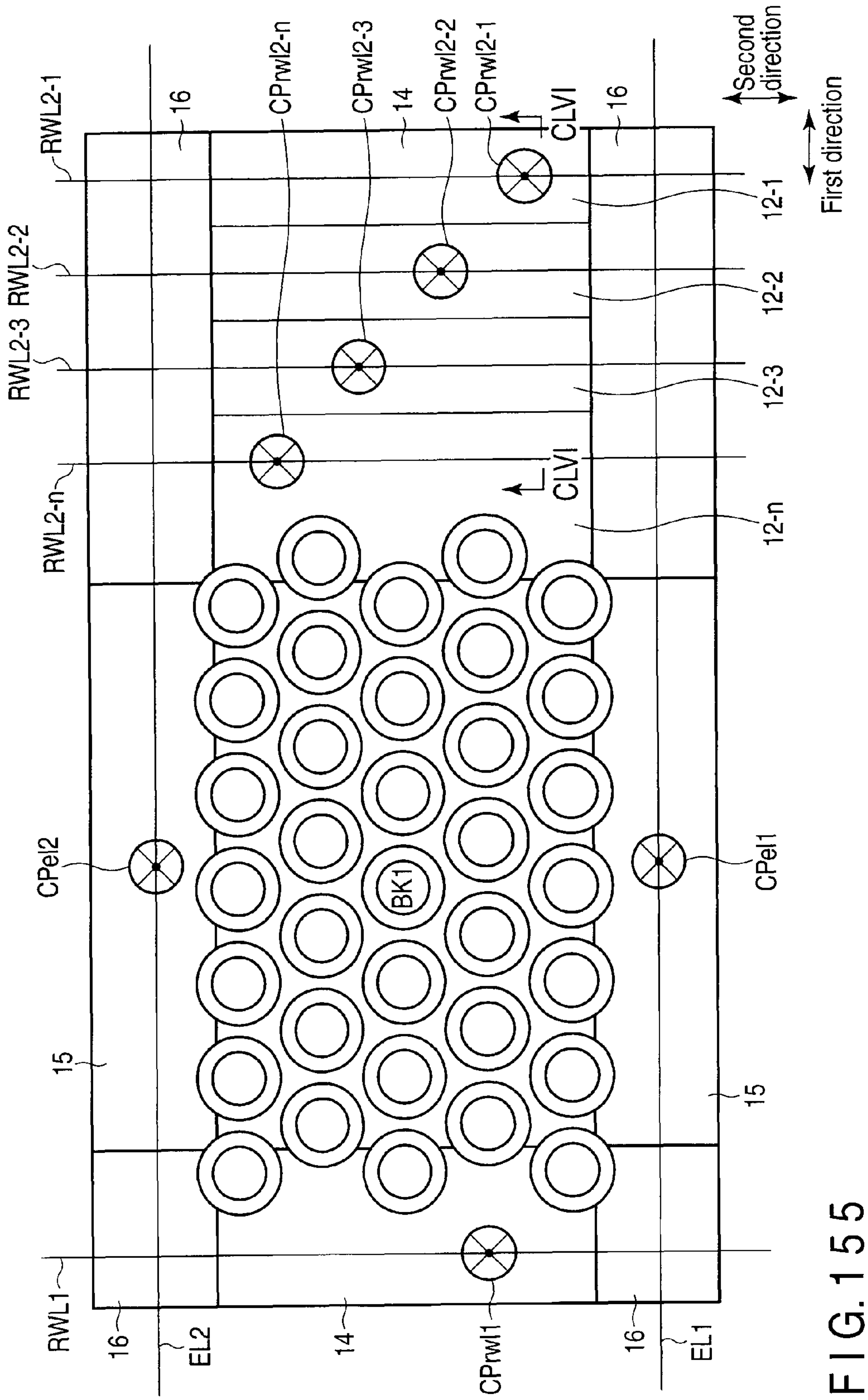
FIG. 155 is a plan view showing a staircase structure.
Figure 156:
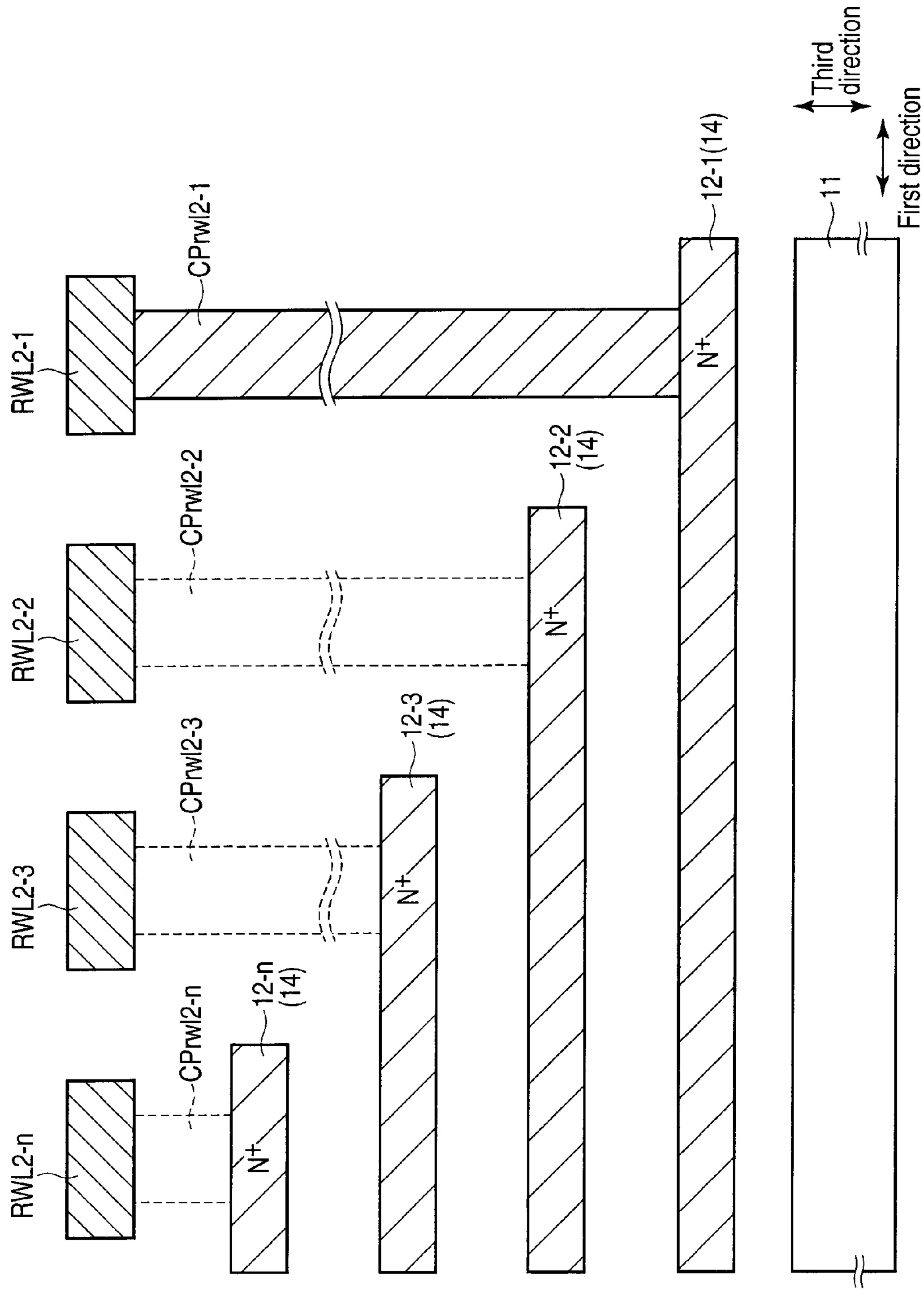
FIG. 156 is a cross-sectional view of FIG. 155 taken along the line CLVI-CLVI.

FIG. 155 shows block BK1 in FIG. 147. FIG. 156 is a sectional view along a CXVI-CLVI line in FIG. 155.

One end of semiconductor layers 12-1, 12-2, . . . , 12-*n* on semiconductor substrate 11 in the first direction has a staircase structure. That is, one end of k (k=2, 3, . . . , n)-th semiconductor layer 12-*k* in the first direction recedes toward the inner (semiconductor layers 12-1, 12-2, . . . , 12-*n* side) from one end of (k−1)-th semiconductor layer 12-(*k*−1) in the first direction.

One end (upper end) of contact plug CPrwl2-1 is connected to second read/write line RWL2-1 extending in the second direction and the other end (lower end) thereof is connected to semiconductor layer 12-1. Similarly, one end of contact plug CPrwl2-2 is connected to second read/write line RWL2-2 and the other end thereof is connected to semiconductor layer 12-2 and one end of contact plug CPrwl2-3 is connected to second read/write line RWL2-3 and the other end thereof is connected to semiconductor layer 12-3.

One end of contact plug CPrwl2-*n* is connected to second read/write line RWL2-*n* extending in the second direction and the other end thereof is connected to semiconductor layer 12-*n*.

In the present example, the depth of contact plugs CPrwl2-1, CPrwl2-2, CPrwl2-3, CPrwl2-*n* is different from contact plug to contact plug.

C.-2 Curvature Structure

Figure 157:
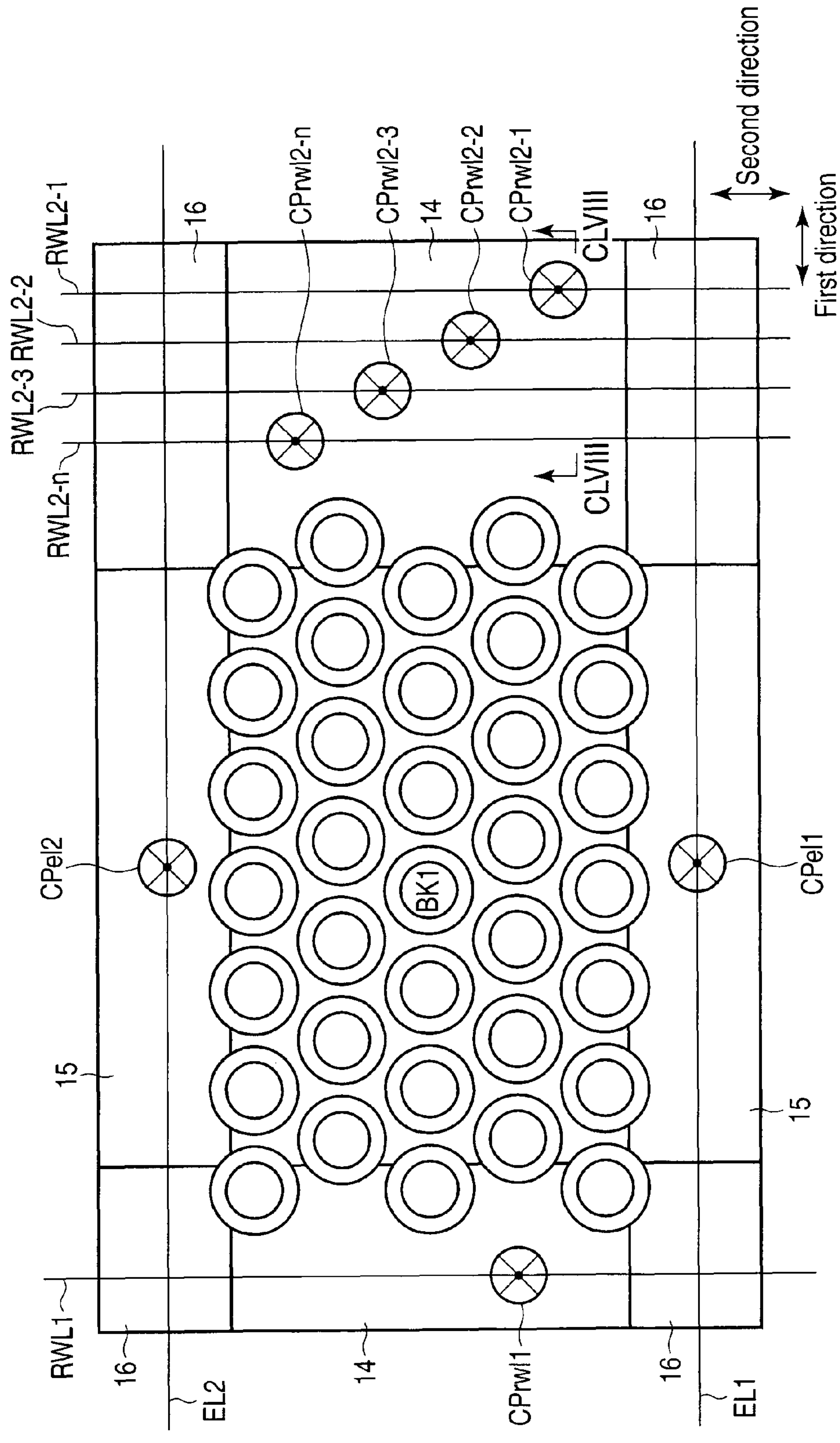
FIG. 157 is a plan view showing a flexural structure.

FIG. 157 shows block BK1 in FIG. 147. FIG. 158 is a sectional view along a CLVIII-CLVIII line in FIG. 157.

One end of semiconductor layers 12-1, 12-2, . . . , 12-*n* on semiconductor substrate 11 in the first direction has a curvature structure. That is, by being stacked in a recess, one end of n semiconductor layers 12-1, 12-2, . . . , 12-*n* in the first direction is curved in the third direction.

In this structure, a portion of semiconductor layers 12-1, 12-2, . . . , 12-*n* functions as contact plugs CPrwl2-1, CPrwl2-2, CPrwl2-3, . . . , CPrwl2-*n*.

One end (upper end of a portion extending in the third direction) of semiconductor layer 12-1 in the first layer (lowest layer) is connected to second read/write line RWL2-1. Similarly, one end (upper end of a portion extending in the third direction) of semiconductor layer 12-2 in the second layer is connected to second read/write line RWL2-2 and one end (upper end of a portion extending in the third direction) of semiconductor layer 12-3 in the third layer is connected to second read/write line RWL2-3.

One end (upper end of a portion extending in the third direction) of semiconductor layer 12-*n* in the n-th layer (top layer) is connected to second read/write line RWL2-*n*.

C.-3 Through-Structure

Figure 160:
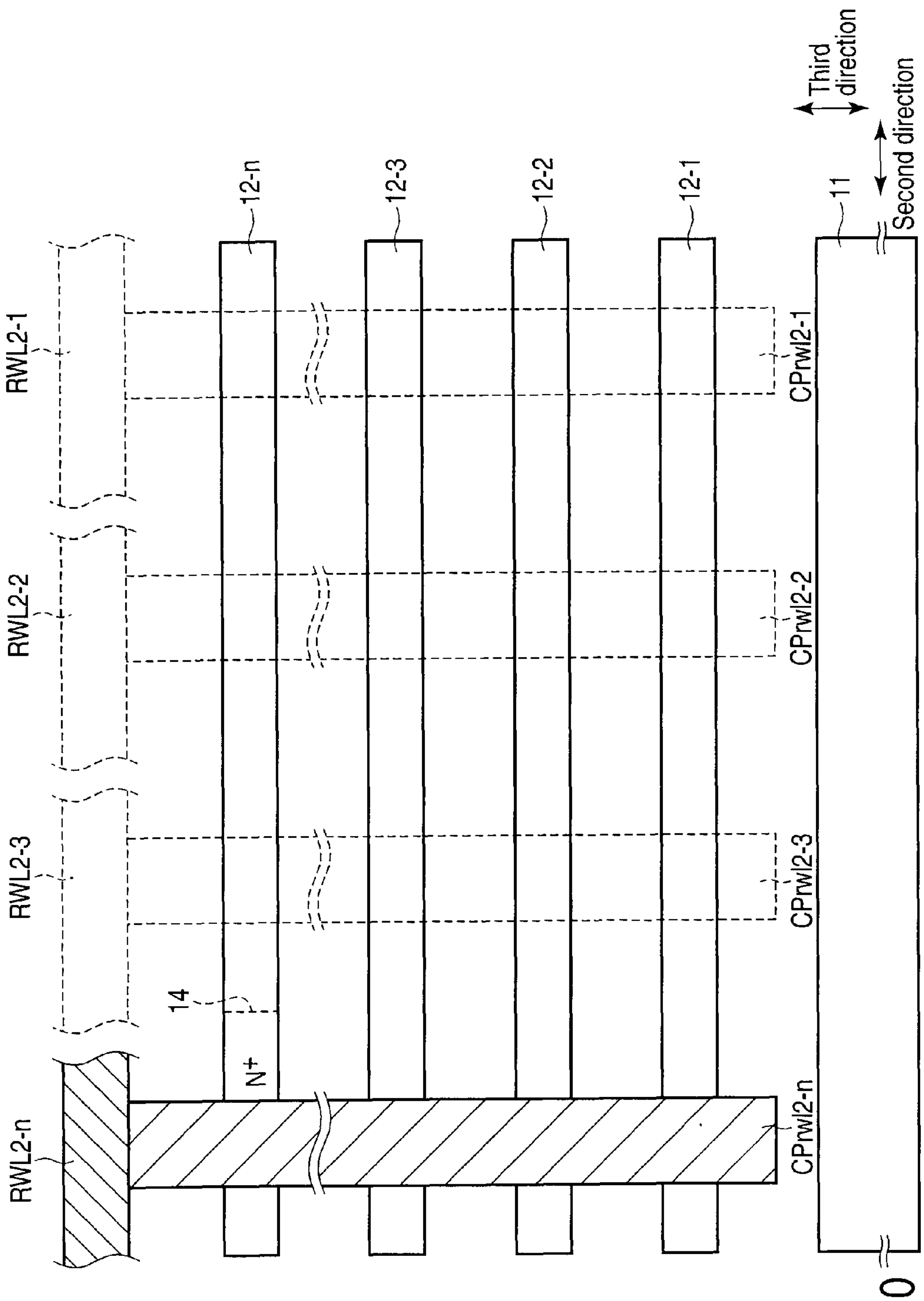
FIG. 160 is a cross-sectional view of FIG. 159 taken along the line CLX-CLX.
Figure 162:
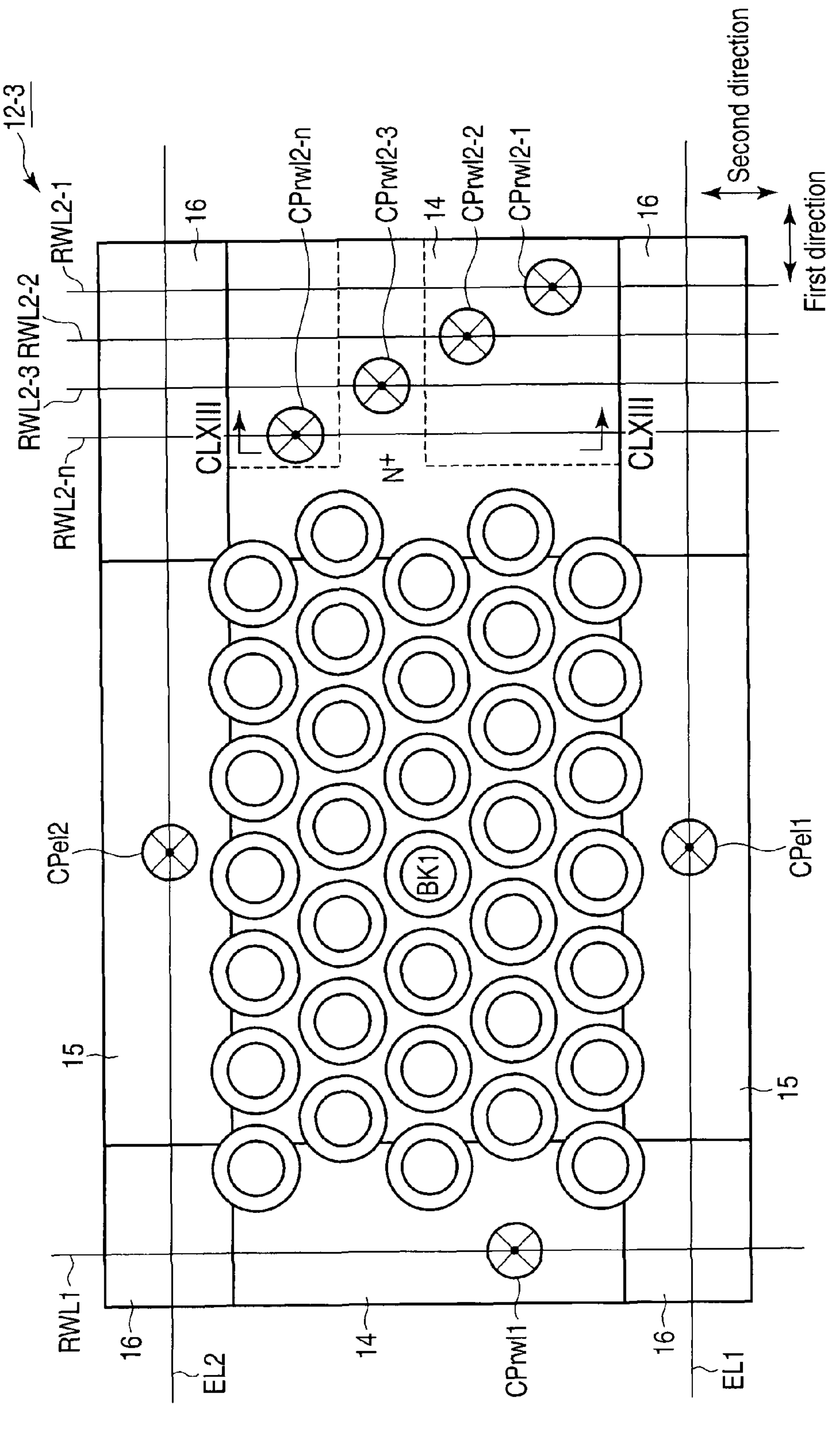
FIG. 162 is a plan view showing the through-hole structure.
Figure 163:
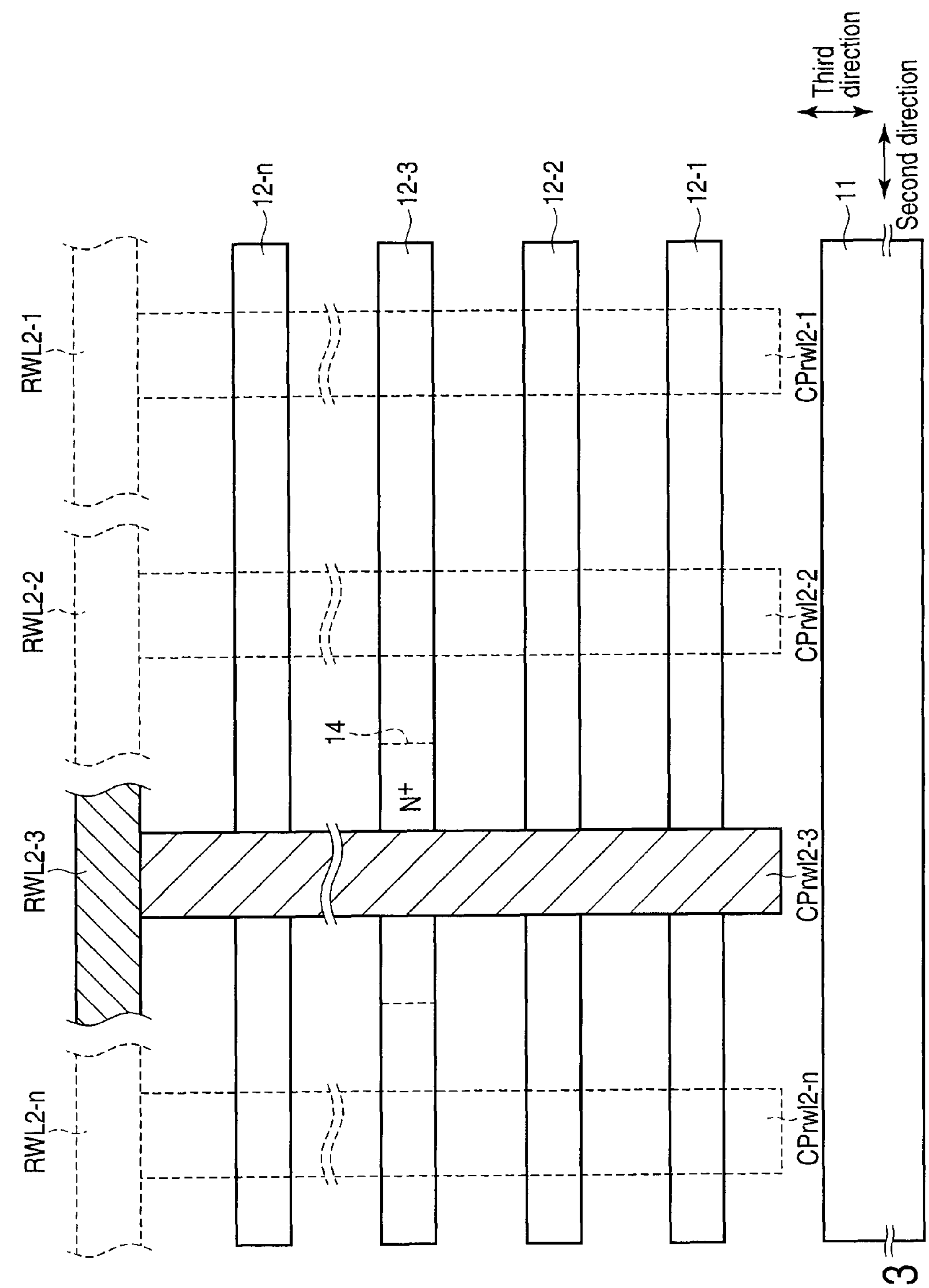
FIG. 163 is a cross-sectional view of FIG. 162 taken along the line CLXIII-CLXIII.
Figure 164:
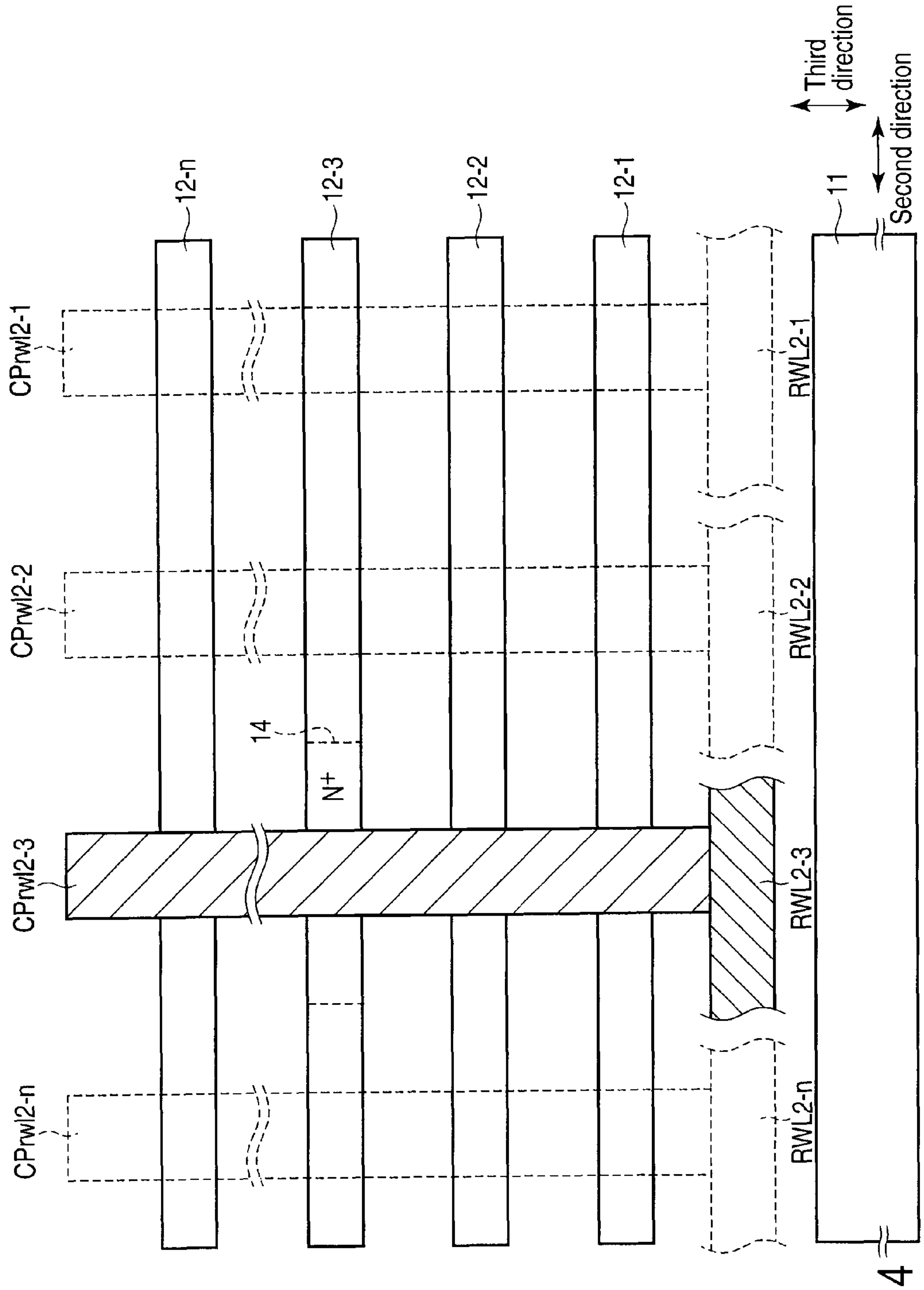
FIG. 164 is a view showing a modified example of FIG. 163.
Figure 165:
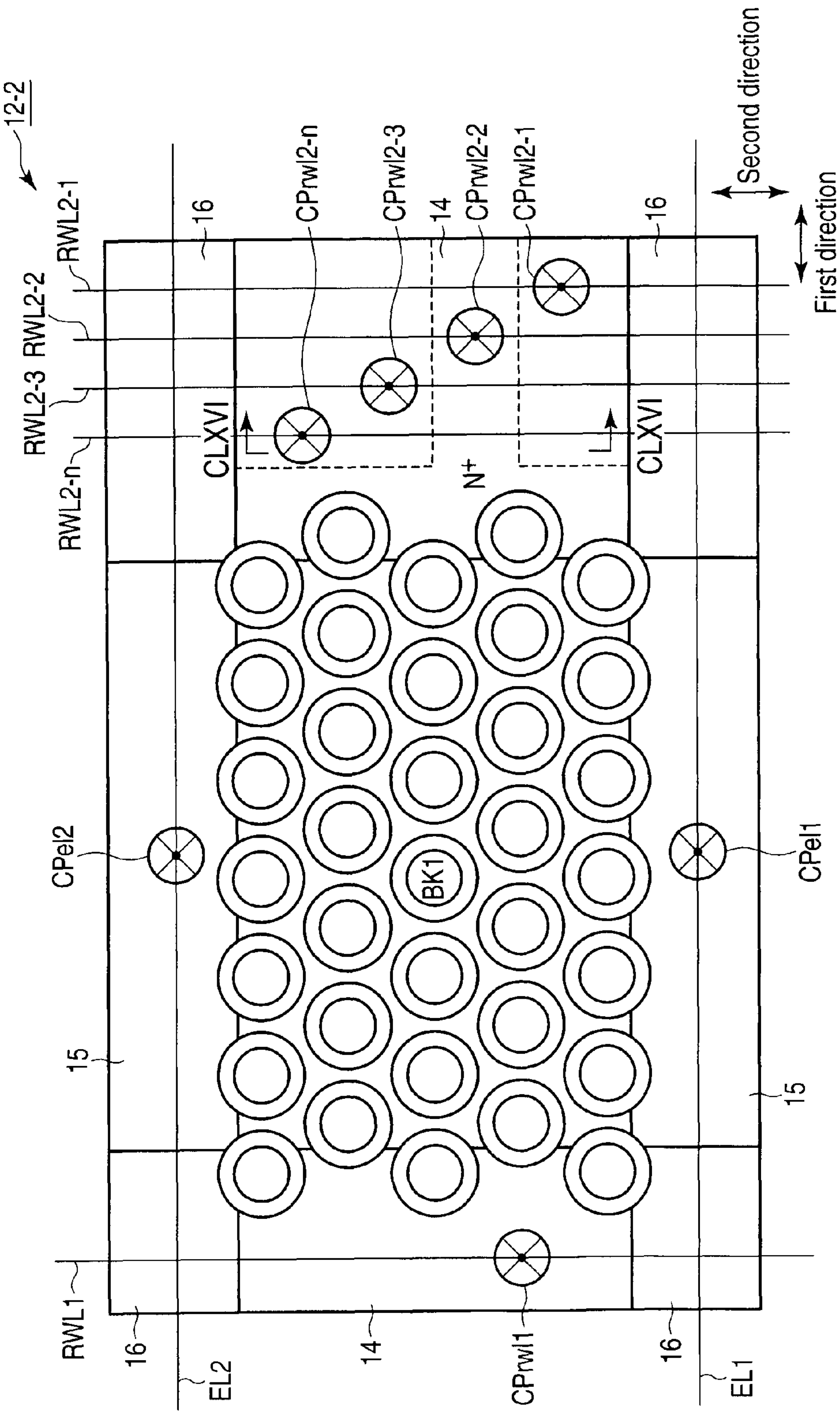
FIG. 165 is a plan view showing the through-hole structure.
Figure 166:
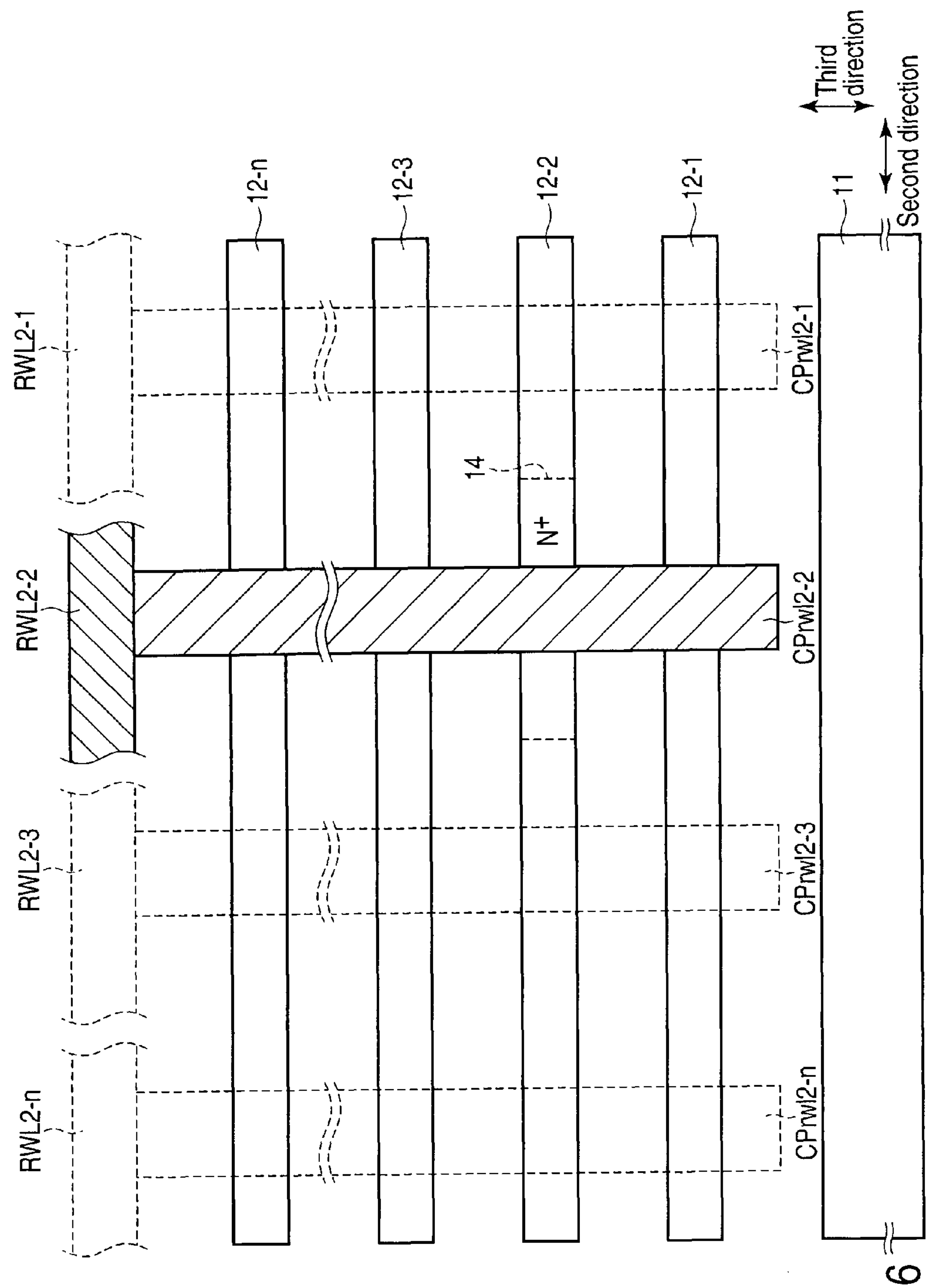
FIG. 166 is a cross-sectional view of FIG. 165 taken along the line CLXVI-CLXVI.

FIGS. 159, 162, 165, 168 show block BK1 in FIG. 147. FIG. 160 is a sectional view along a CLX-CLX line in FIG. 159, FIG. 163 is a sectional view along a CLXIII-CLXIII line in FIG. 162, FIG. 166 is a sectional view along a CLXVI-CLXVI line in FIG. 165, and FIG. 169 is a sectional view along a CLXIX-CLXIX line in FIG. 168.

One end of semiconductor layers 12-1, 12-2, 12-3, . . . , 12-*n* on semiconductor substrate 11 in the first direction has a through-structure. That is, contact plugs CPrwl2-1, CPrwl2-2, CPrwl2-3, . . . , CPrwl2-*n* pass through n semiconductor layers 12-1, 12-2, 12-3, . . . , 12-*n*.

As shown in FIGS. 159 and 160, one end (upper end) of contact plug CPrwl2-*n* is connected to second read/write line RWL2-*n* extending in the second direction and the other end (lower end) thereof is electrically connected to N+-type diffusion layer 14 in semiconductor layer 12-*n*.

Contact plug CPrwl2-*n* is also connected to other semiconductor layers 12-1, 12-2, 12-3 than semiconductor layer 12-*n*, but is not electrically connected to N+-type diffusion layer 14 in semiconductor layers 12-1, 12-2, 12-3.

As shown in FIGS. 162 and 163, one end (upper end) of contact plug CPrwl2-3 is connected to second read/write line RWL2-3 extending in the second direction and the other end (lower end) thereof is electrically connected to N+-type diffusion layer 14 in semiconductor layer 12-3.

Contact plug CPrwl2-3 is also connected to other semiconductor layers 12-1, 12-2, 12-*n* than semiconductor layer 12-3, but is not electrically connected to N+-type diffusion layer 14 in semiconductor layers 12-1, 12-2, 12-*n*.

As shown in FIGS. 165 and 166, one end (upper end) of contact plug CPrwl2-2 is connected to second read/write line RWL2-2 extending in the second direction and the other end (lower end) thereof is electrically connected to N+-type diffusion layer 14 in semiconductor layer 12-2.

Contact plug CPrwl2-2 is also connected to other semiconductor layers 12-1, 12-3, 12-*n* than semiconductor layer 12-2, but is not electrically connected to N+-type diffusion layer 14 in semiconductor layers 12-1, 12-3, 12-*n*.

Figure 168:
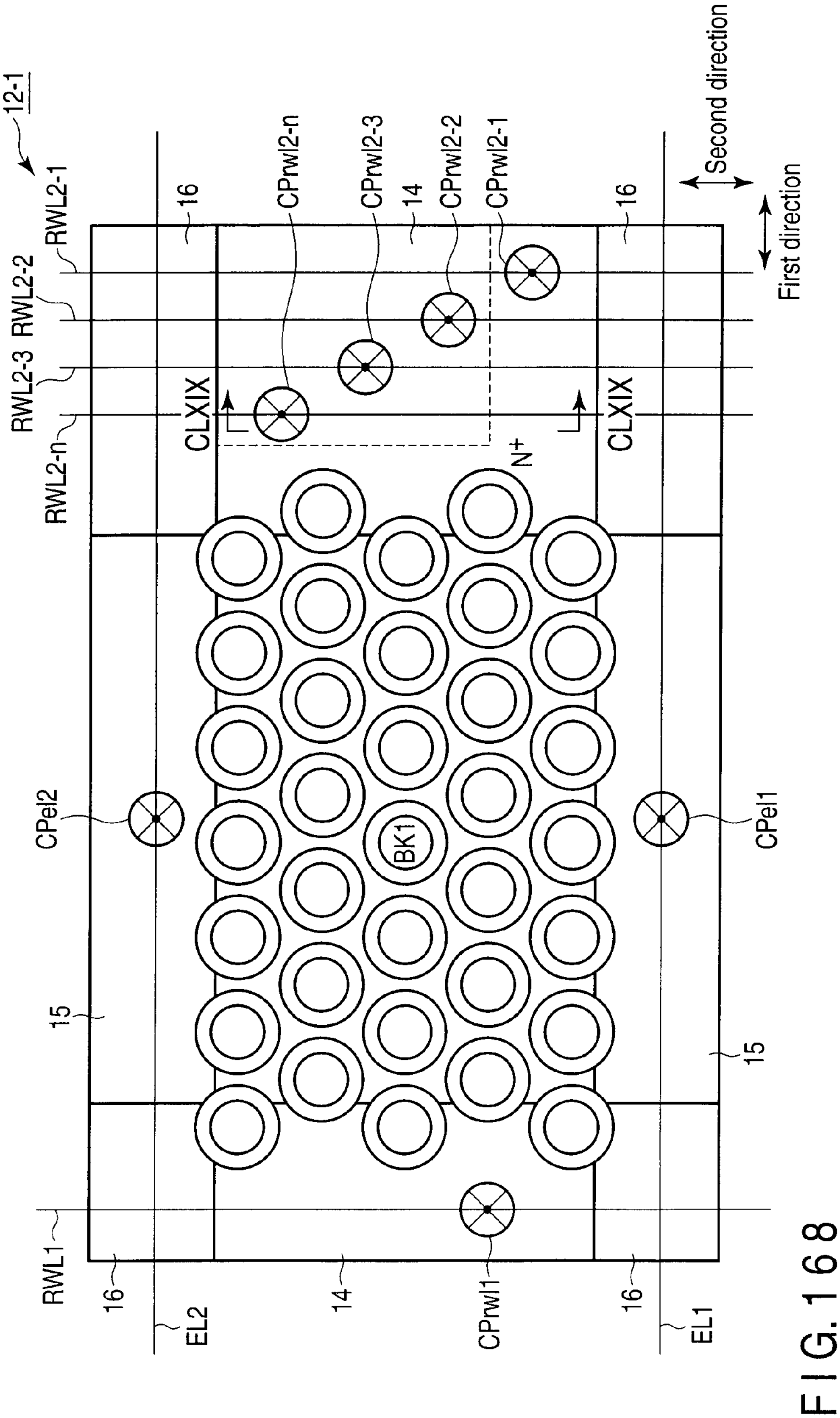
Figure 169:
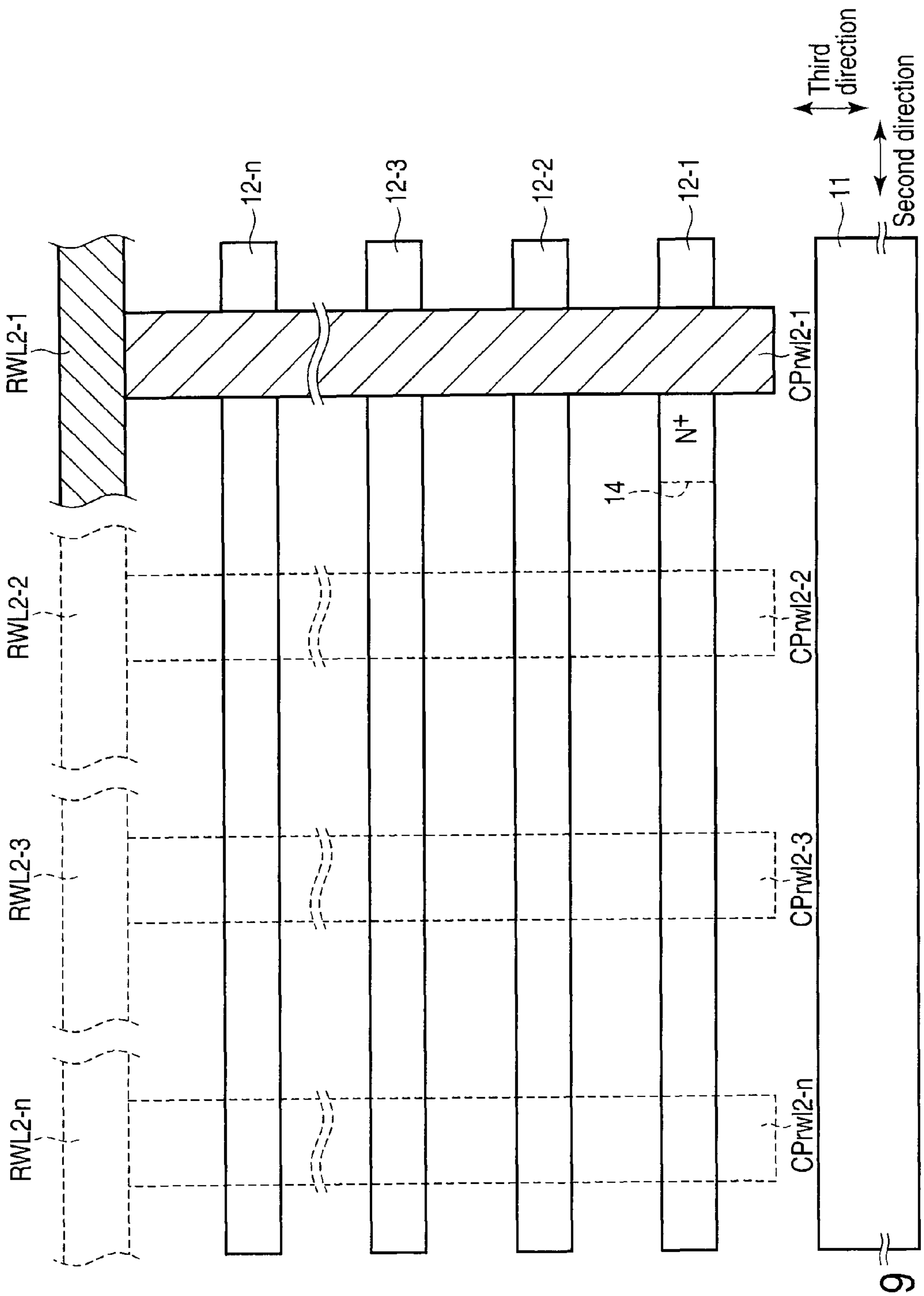

As shown in FIGS. 168 and 169, one end (upper end) of contact plug CPrwl2-1 is connected to second read/write line RWL2-1 extending in the second direction and the other end (lower end) thereof is electrically connected to N+-type diffusion layer 14 in semiconductor layer 12-1.

Contact plug CPrwl2-1 is also connected to other semiconductor layers 12-2, 12-3, 12-*n* than semiconductor layer 12-1, but is not electrically connected to N+-type diffusion layer 14 in semiconductor layers 12-2, 12-3, 12-*n*.

In the present example, the depth of contact plugs CPrwl2-1, CPrwl2-2, CPrwl2-3, . . . , CPrwl2-*n* can be made equal to each other.

In the examples in FIGS. 160, 163, 166, and 169, second read/write line RWL2-1, RWL2-2, RWL2-3, . . . , RWL2-*n* are connected to the upper end (end on the opposite side of semiconductor substrate 11) of contact plugs CPrwl2-1, CPrwl2-2, CPrwl2-3, . . . , CPrwl2-*n*.

As shown, for example, in FIGS. 161, 164, 167, and 170, by contrast, second read/write line RWL2-1, RWL2-2, RWL2-3, . . . , RWL2-*n* may be connected to the lower end (end on the side of semiconductor substrate 11) of contact plugs CPrwl2-1, CPrwl2-2, CPrwl2-3, . . . , CPrwl2-*n*.

7. PRODUCTION METHOD

A method for manufacturing a non-volatile semiconductor memory (MaCS) according to the present disclosure will be explained.

All of the examples below relate to MaCS with a three-dimensional memory cell array. The first and second basic structure can be easily manufactured by applying the following production method.

(1) First Example

FIGS. 171 to 186 illustrate the first example of method for producing a three-dimensional MaCS.

The first example relates to a production method for independently forming N+/P+-type diffusion layers and element isolation insulating layers for each of stacked semiconductor layers.

Figure 171:
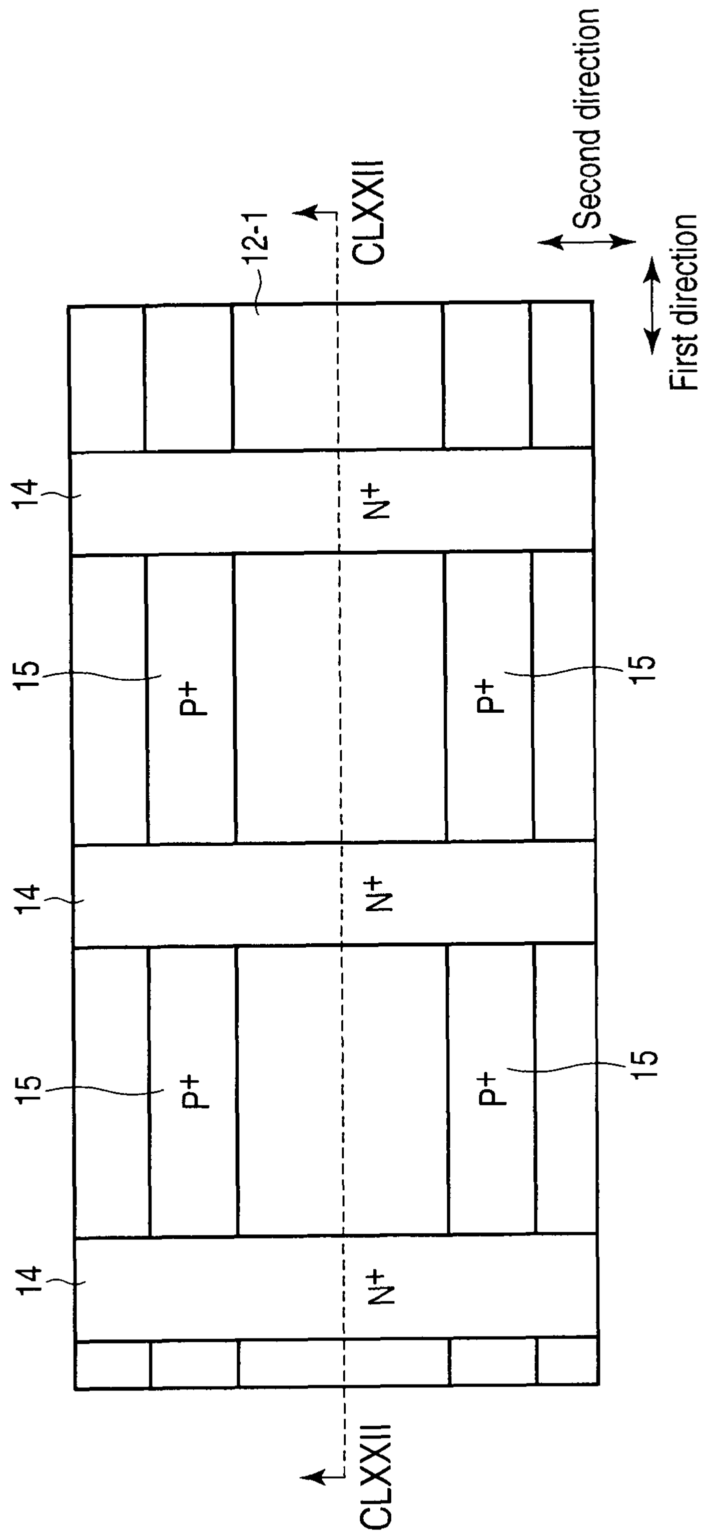
Figure 172:
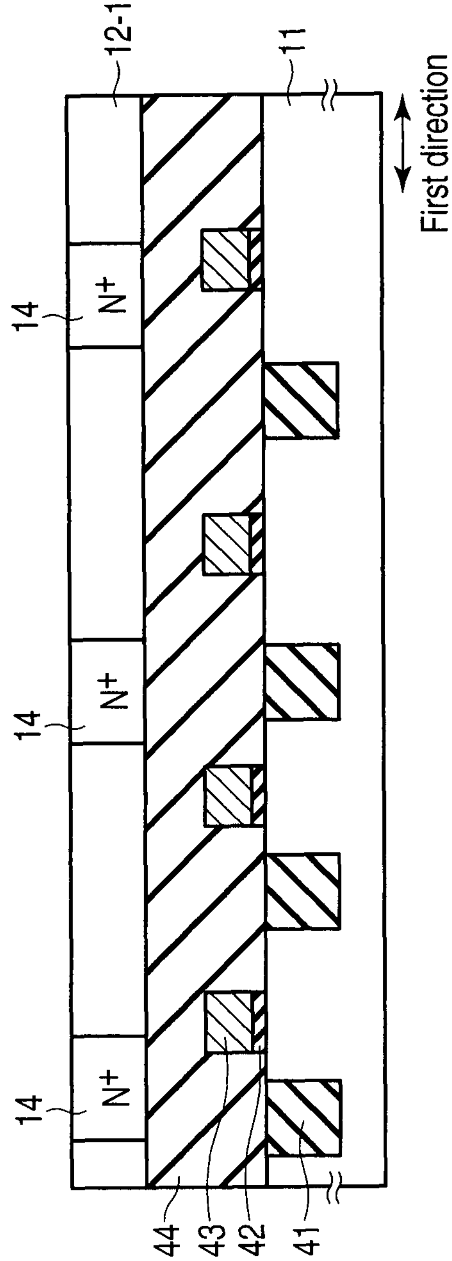

First, as shown in FIGS. 171 and 172, element isolation insulating layers 41 having STI (shallow trench isolation) structure are formed in semiconductor substrate 11. In each device region (active area) surrounded by element isolation insulating layers 41, an FET (field effect transistor) having gate insulating layer 42 and gate electrode 43 is formed. Further, inter-layer insulating layer 44 is formed on semiconductor substrate 11, and the upper surface of inter-layer insulating layer 44 is smoothed.

Thereafter, first semiconductor layer (for example, polysilicon layer) 12-1 is formed on inter-layer insulating layer 44.

Further, a resist pattern is formed by PEP (photo engraving process). Using the formed resist pattern as a mask, N-type impurities (for example, P and As) are injected into first semiconductor layer 12-1 by ion implantation. Thereafter, the resist pattern is removed.

Then, a resist pattern is formed again by PEP. While this formed resist pattern is used as a mask, P-type impurities (for example, B) are injected into first semiconductor layer 12-1 by ion implantation. Thereafter, the resist pattern is removed.

As a result, N+-type diffusion layers 14 and P+-type diffusion layers 15 are formed in first semiconductor layer 12-1.

Figure 174:
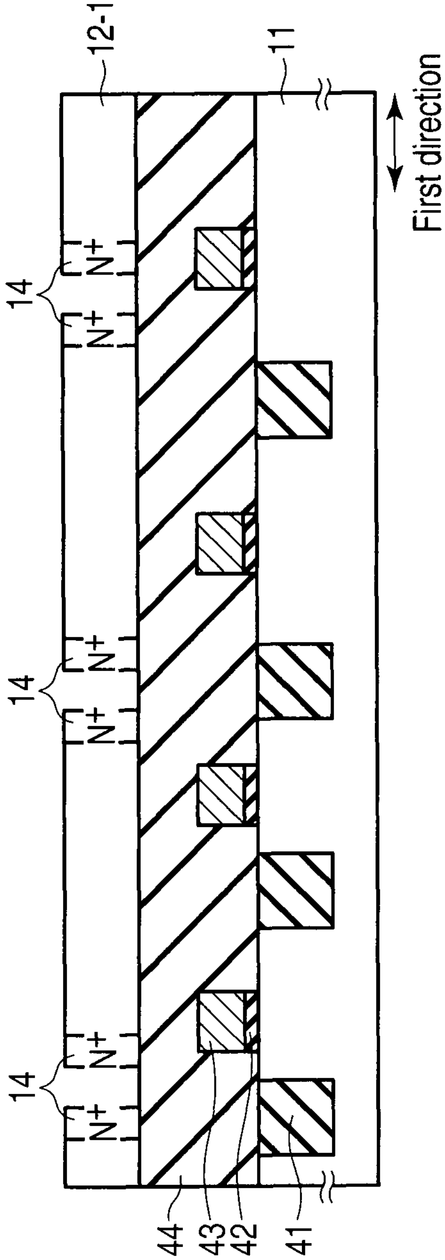

Subsequently, as shown in FIGS. 173 and 174, a resist pattern is formed by PEP. Using the formed resist pattern as a mask, first semiconductor layer 12-1 is patterned by RIE (reactive ion etching). This patterning process is done for the purpose of isolating N+-type diffusion layer 14 and P+-type diffusion layer 15 from each other.

Figure 175:
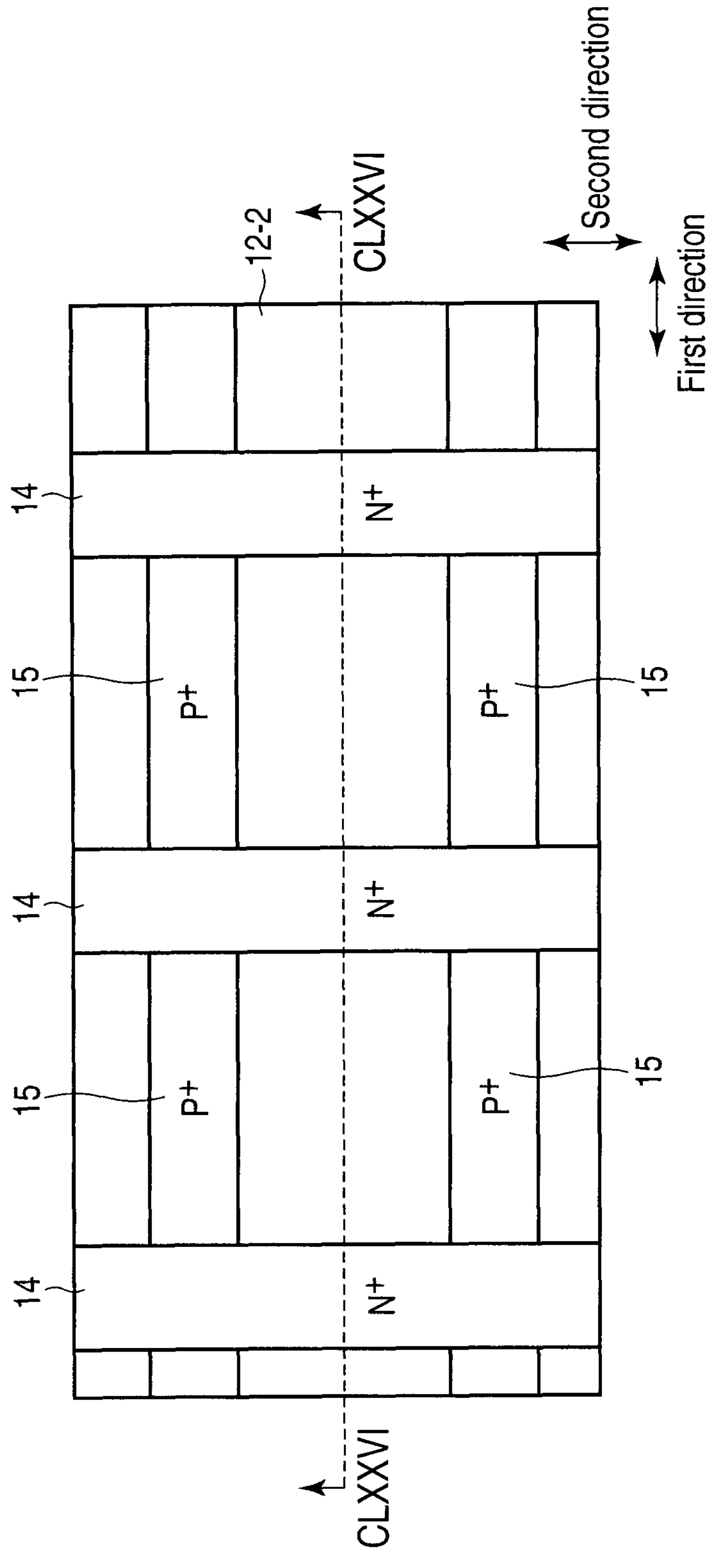
Figure 176:
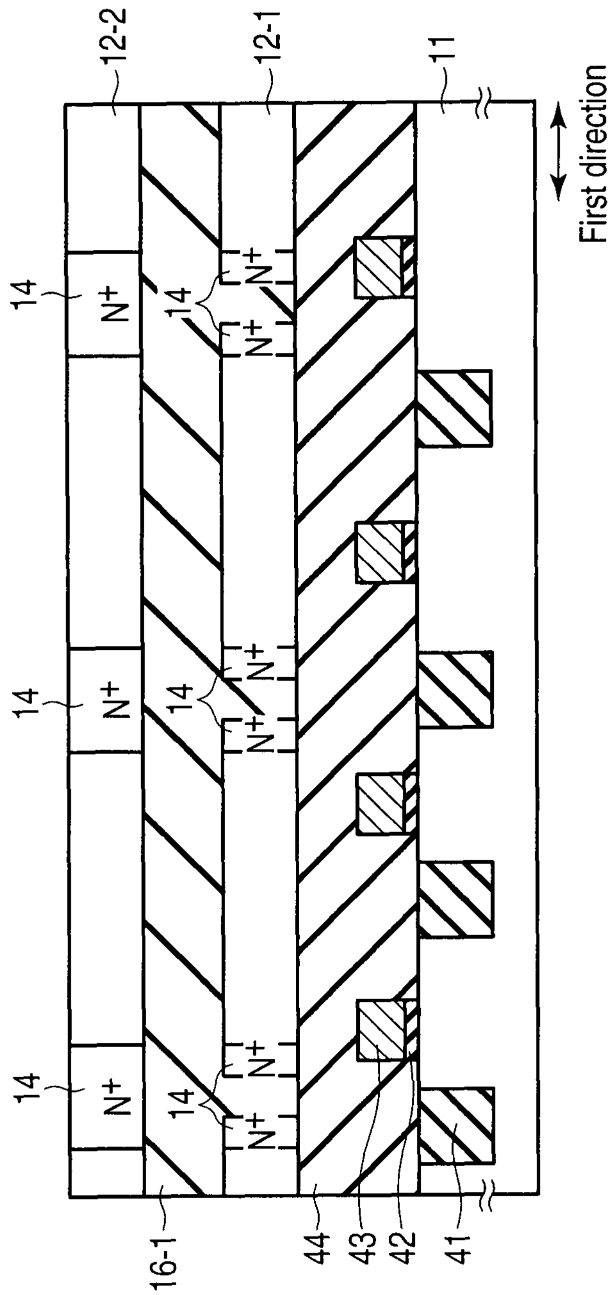

Subsequently, as shown in FIGS. 175 and 176, inter-layer insulating layer (element isolation insulating layer) 16-1 is formed using a method such as LPCVD. Inter-layer insulating layer (element isolation insulating layer) 16-1 fills grooves formed in first semiconductor layer 12-1 and covers first semiconductor layer 12-1. Then, the upper surface of inter-layer insulating layer 16-1 is smoothed.

Thereafter, second semiconductor layer (for example, polysilicon layer) 12-2 is formed on inter-layer insulating layer 16-1.

Then, a resist pattern is formed by PEP. Using the formed resist pattern as a mask, N-type impurities (for example, P and As) are injected into second semiconductor layer 12-2 by ion implantation. Thereafter, the resist pattern is removed.

Then, a resist pattern is formed again by PEP. Using the formed resist pattern as a mask, P-type impurities (for example, B) are injected into second semiconductor layer 12-2 by ion implantation. Thereafter, the resist pattern is removed.

As a result, N+-type diffusion layers 14 and P+-type diffusion layers 15 are formed in second semiconductor layer 12-2.

Figure 177:
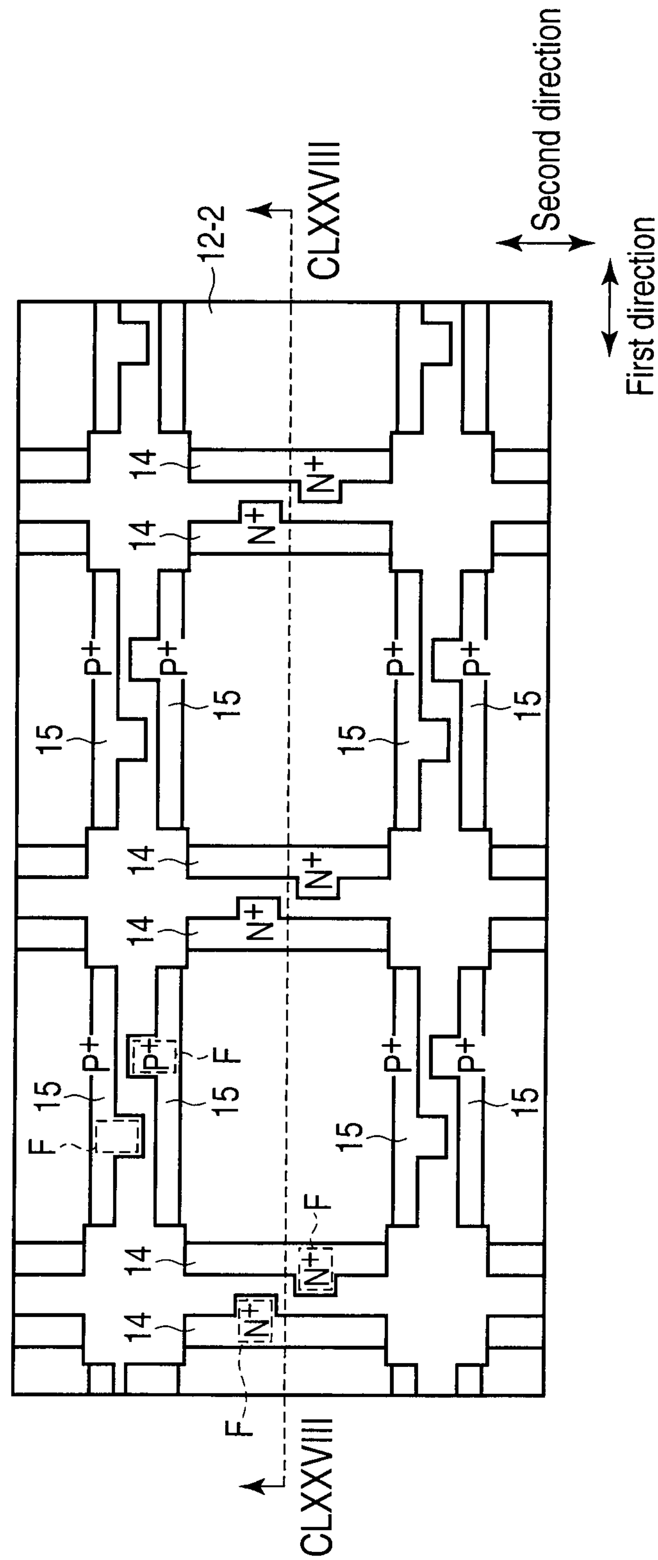
Figure 178:
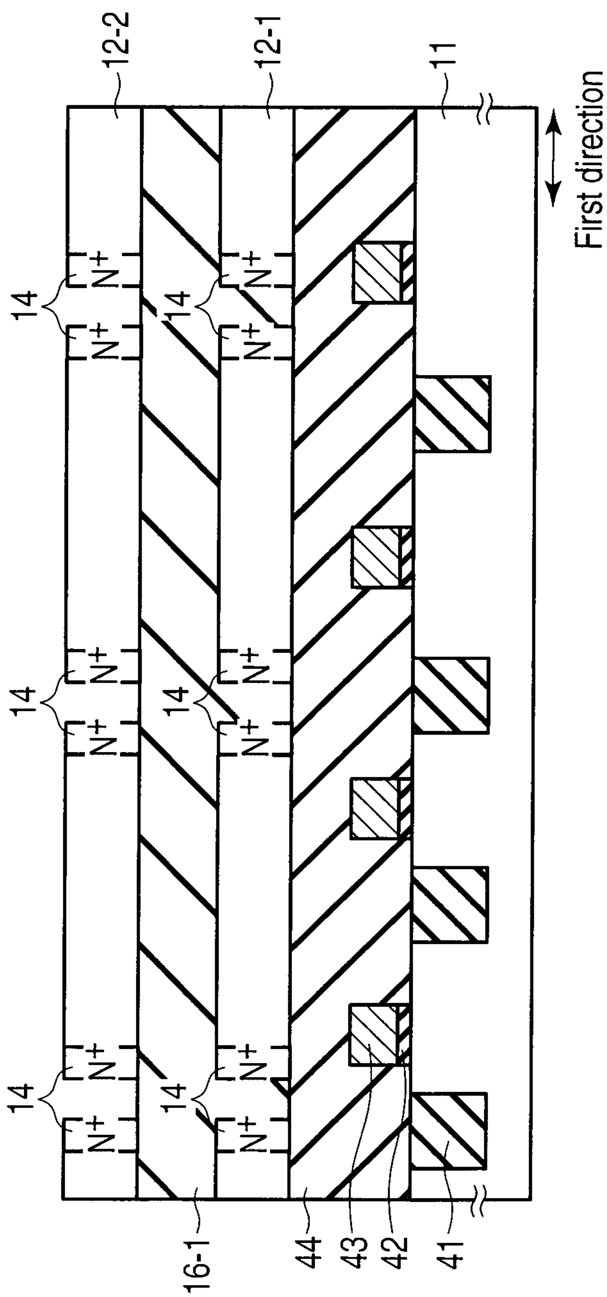

Subsequently, as shown in FIGS. 177 and 178, a resist pattern is formed by PEP. Using the formed resist pattern as a mask, second semiconductor layer 12-2 is patterned by RIE. This patterning process is done for the purpose of isolating N+-type diffusion layer 14 and P+-type diffusion layer 15.

In this example, fringe areas (contact areas) F of N+/P+-type diffusion layers 14, 15 in second semiconductor layer 12-2 do not overlap fringe areas (contact areas) F of N+/P+-type diffusion layers 14, 15 in first semiconductor layer 12-1 as shown in FIG. 173. This configuration allows vias to be independently in contact with respective semiconductor layers.

Figure 179:
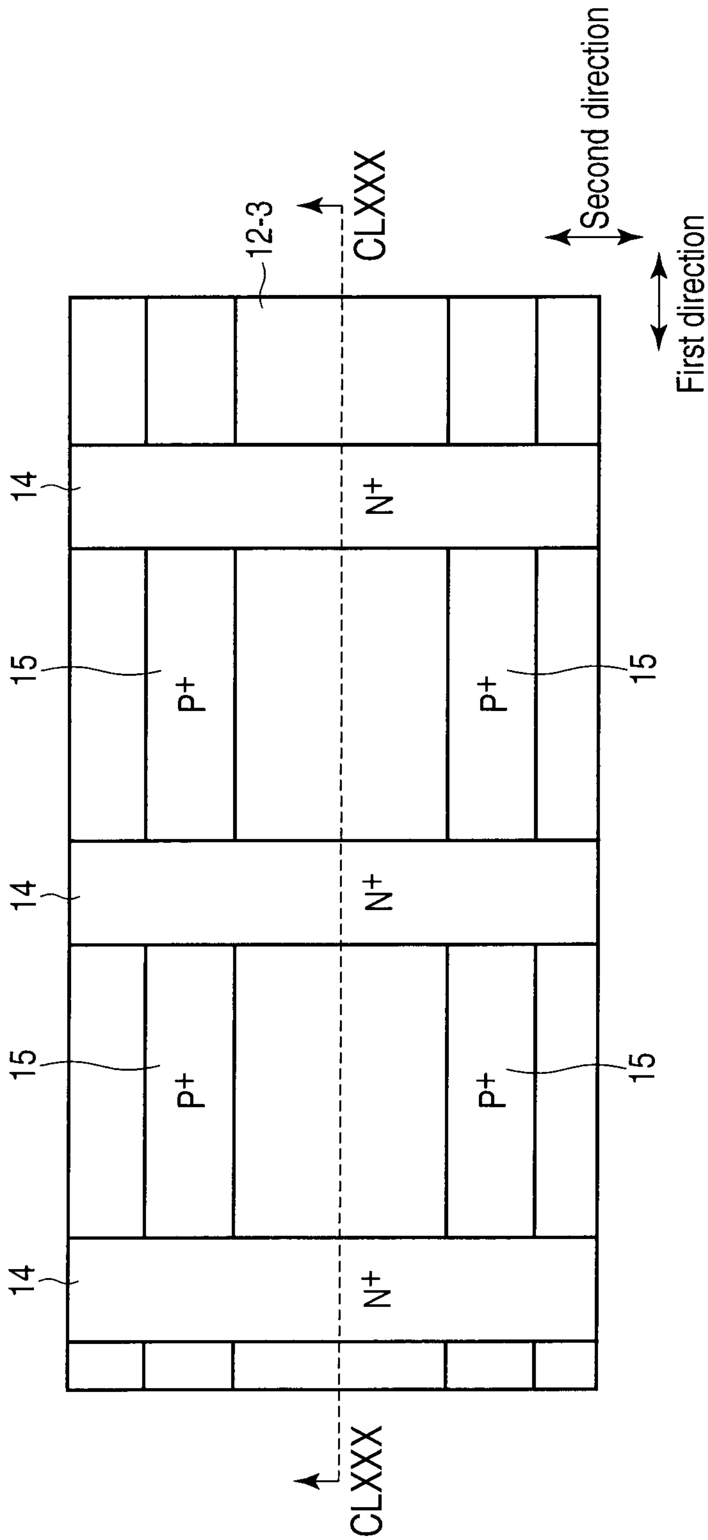
Figure 180:
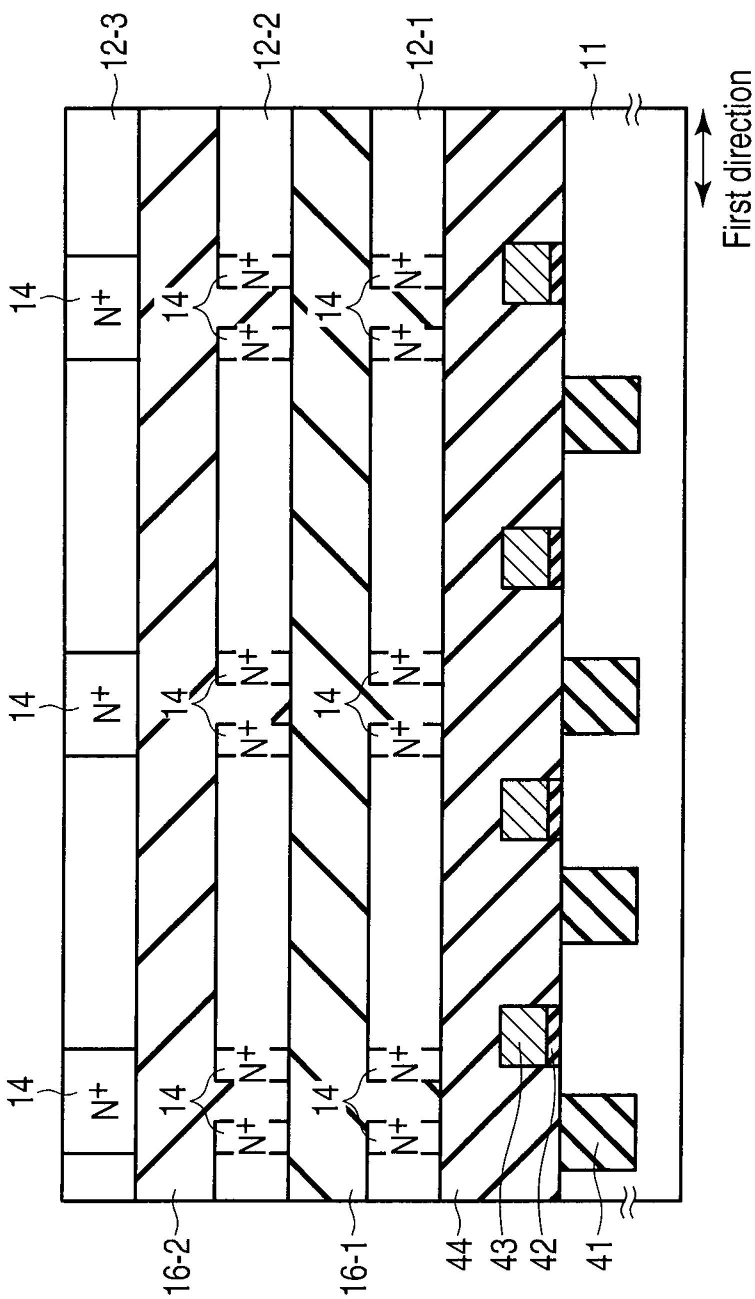

Subsequently, as shown in FIGS. 179 and 180, inter-layer insulating layer (element isolation insulating layer) 16-2 is formed using a method such as LPCVD. Inter-layer insulating layer (element isolation insulating layer) 16-2 fills grooves formed in second semiconductor layer 12-2 and covers second semiconductor layer 12-2. Then, the upper surface of inter-layer insulating layer 16-2 is smoothed.

Thereafter, third semiconductor layer (for example, polysilicon layer) 12-3 is formed on inter-layer insulating layer 16-2.

Then, a resist pattern is formed by PEP. Using the formed resist pattern as a mask, N-type impurities (for example, P and As) are injected into third semiconductor layer 12-3 by ion implantation. Thereafter, the resist pattern is removed.

Then, a resist pattern is formed again by PEP. Using the formed resist pattern as a mask, P-type impurities (for example, B) are injected into third semiconductor layer 12-3 by ion implantation. Thereafter, the resist pattern is removed.

As a result, N+-type diffusion layers 14 and P+-type diffusion layers 15 are formed in third semiconductor layer 12-3.

Figure 181:
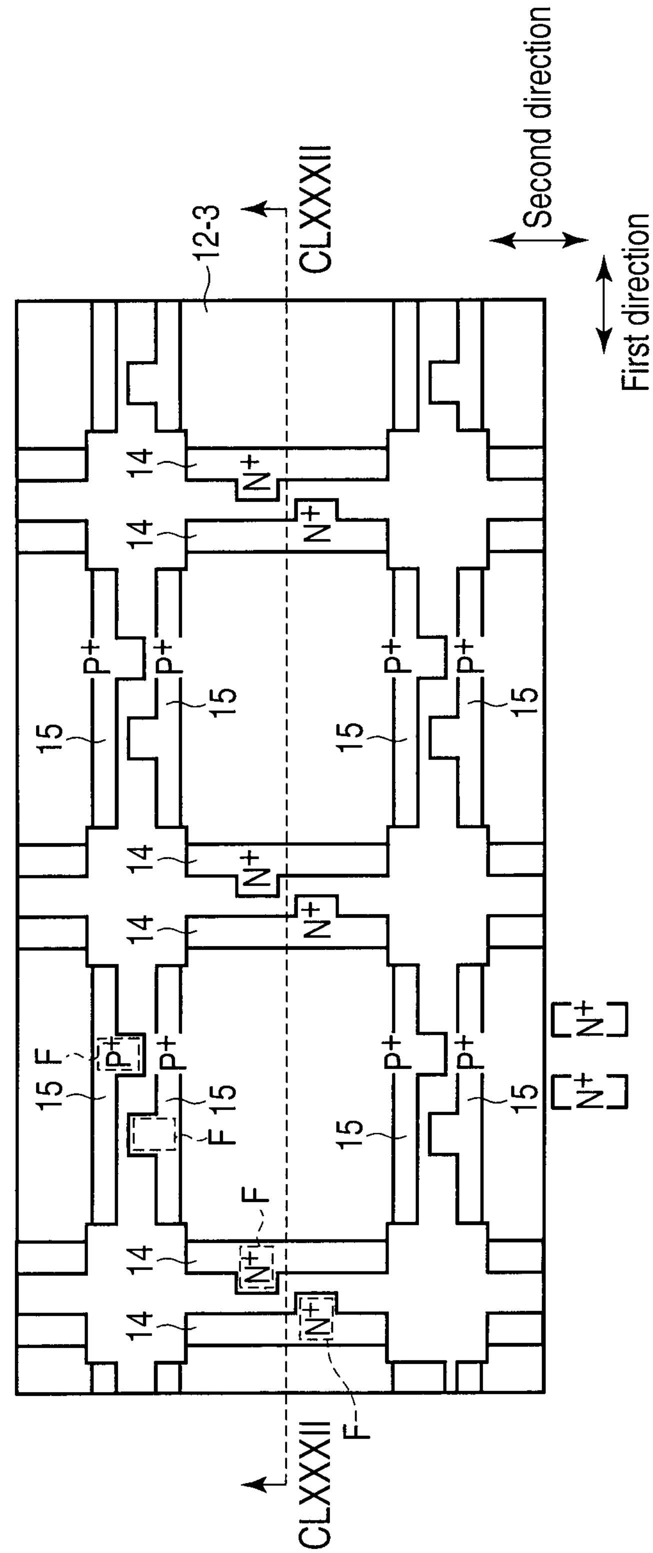
Figure 182:
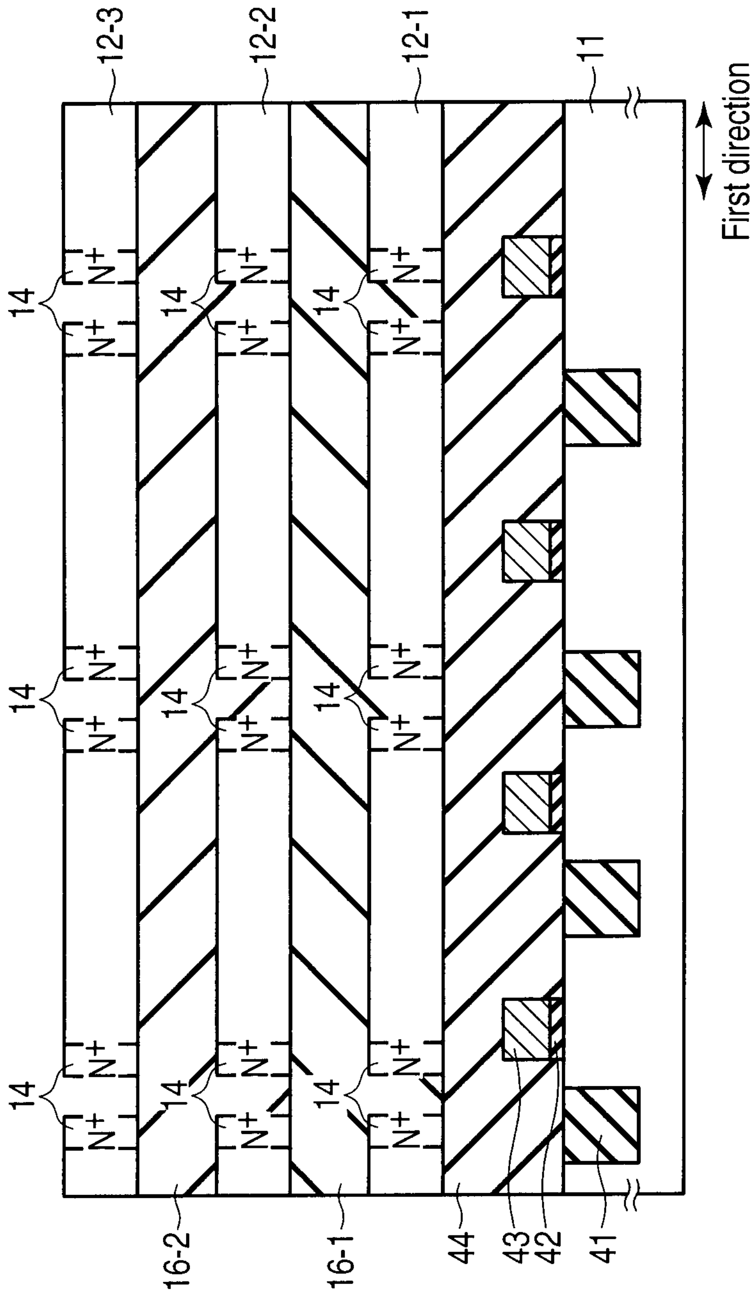

Subsequently, as shown in FIGS. 181 and 182, a resist pattern is formed by PEP. Using the formed resist pattern as a mask, third semiconductor layer 12-3 is patterned by RIE. This patterning process is done for the purpose of isolating N+-type diffusion layer 14 and P+-type diffusion layer 15 from each other.

In this example, fringe areas (contact areas) F of N+/P+-type diffusion layers 14, 15 in third semiconductor layer 12-3 do not overlap fringe areas (contact areas) F of N+/P+-type diffusion layers 14, 15 in first semiconductor layer 12-1 as shown in FIG. 173 and fringe areas (contact areas) F of N+/P+-type diffusion layers 14, 15 in second semiconductor layer 12-2 as shown in FIG. 177. This configuration allows vias to be independently in contact with respective semiconductor layers.

Figure 183:
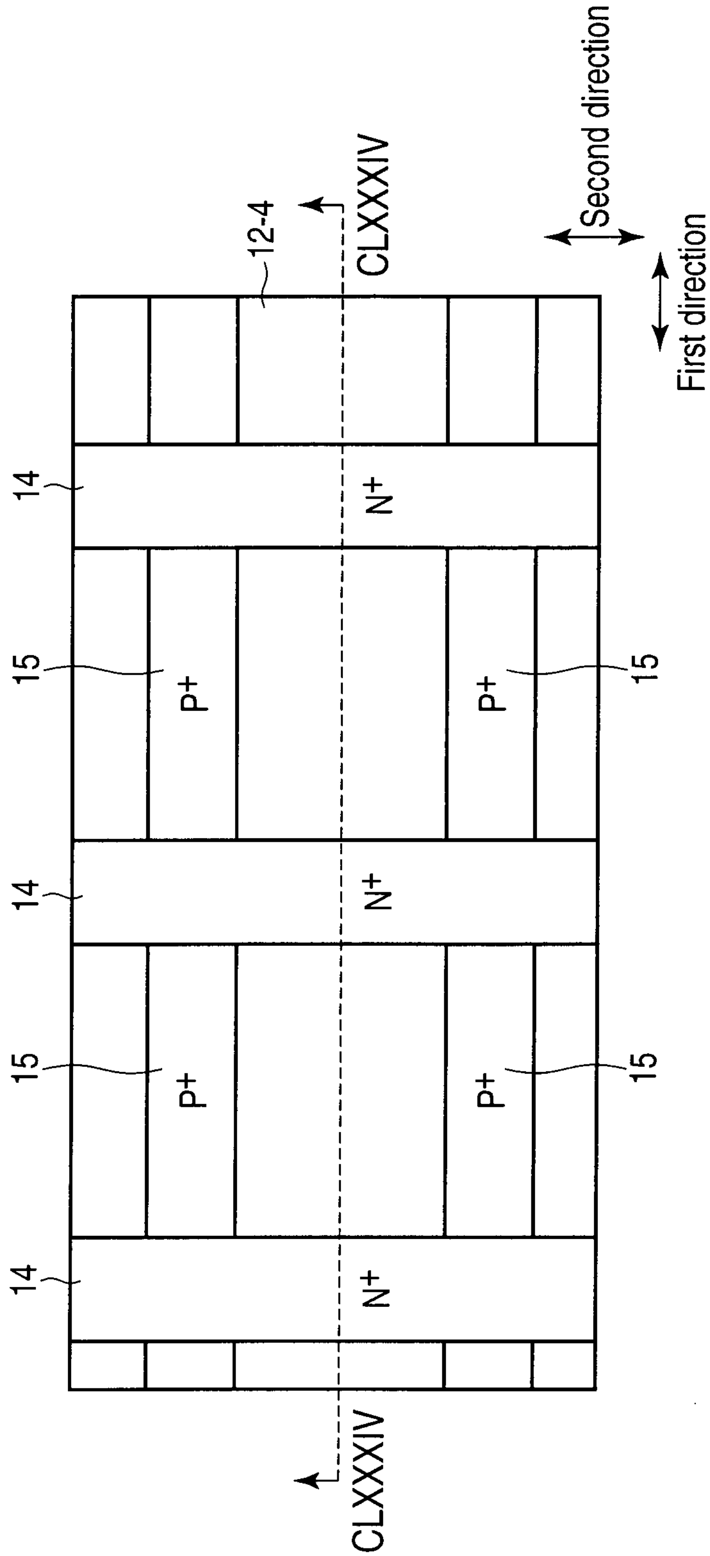
Figure 184:
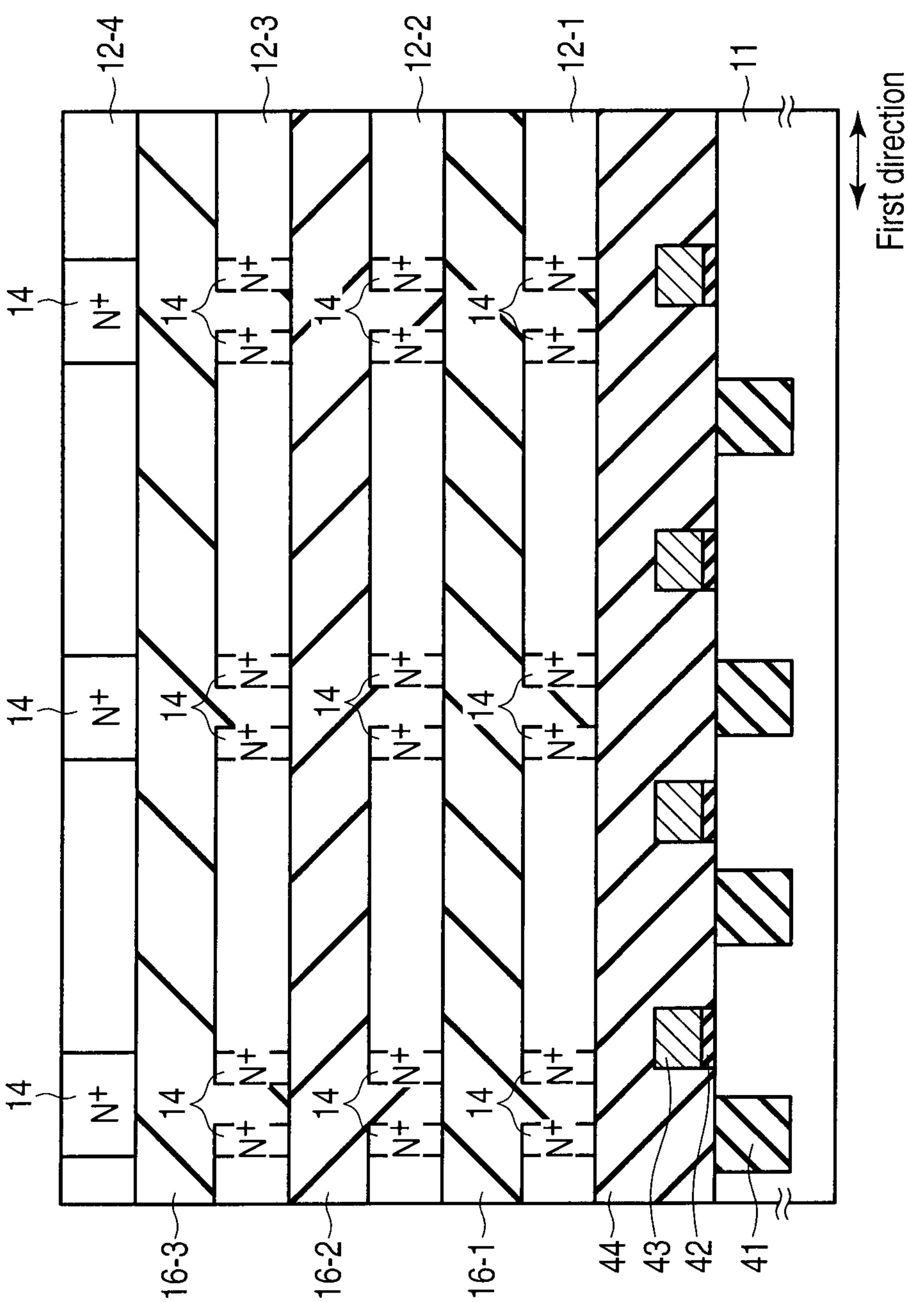

Subsequently, as shown in FIGS. 183 and 184, inter-layer insulating layer (element isolation insulating layer) 16-3 is formed using a method such as LPCVD. Inter-layer insulating layer (element isolation insulating layer) 16-3 fills grooves formed in third semiconductor layer 12-3 and covers third semiconductor layer 12-3. Then, the upper surface of inter-layer insulating layer 16-3 is smoothed.

Thereafter, fourth semiconductor layer (for example, polysilicon layer) 12-4 is formed on inter-layer insulating layer 16-3.

Then, a resist pattern is formed by PEP. Using the formed resist pattern as a mask, N-type impurities (for example, P and As) are injected into fourth semiconductor layer 12-4 by ion implantation. Thereafter, the resist pattern is removed.

Then, a resist pattern is formed again by PEP. Using the formed resist pattern as a mask, P-type impurities (for example, B) are injected into fourth semiconductor layer 12-4 by ion implantation. Thereafter, the resist pattern is removed.

As a result, N+-type diffusion layers 14 and P+-type diffusion layers 15 are formed in fourth semiconductor layer 12-4.

Figure 185:
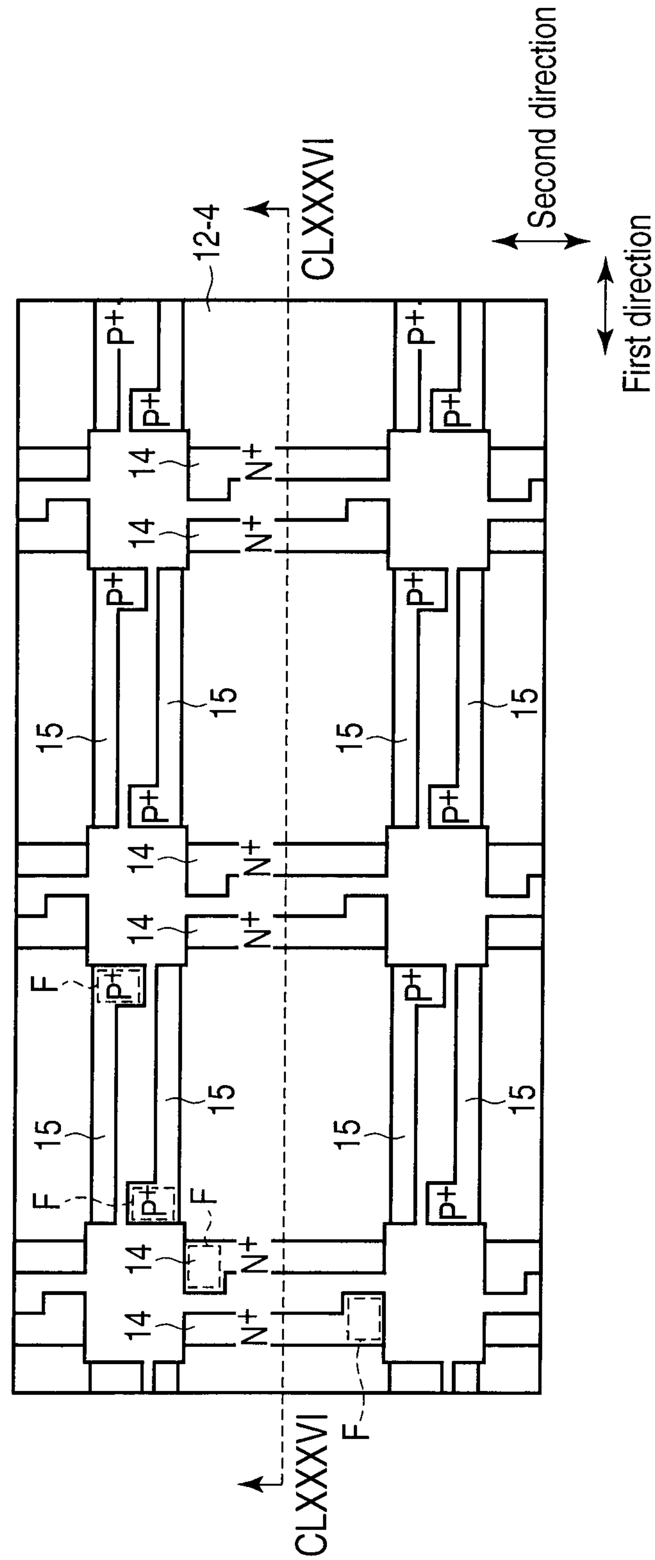
Figure 186:
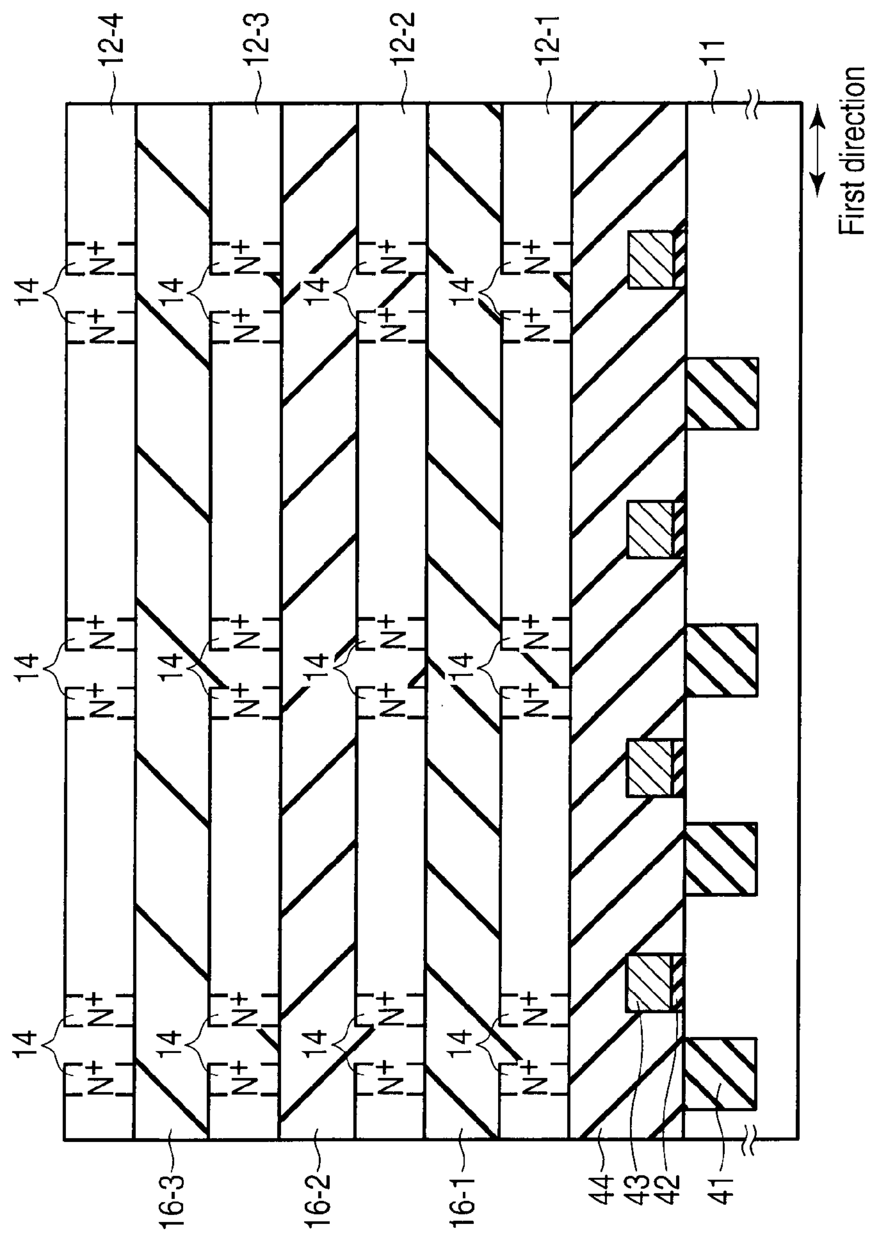

Subsequently, as shown in FIGS. 185 and 186, a resist pattern is formed by PEP. Using the formed resist pattern as a mask, fourth semiconductor layer 12-4 is patterned by RIE. This patterning process is done for the purpose of isolating N+-type diffusion layer 14 and P+-type diffusion layer 15 from each other.

In this example, fringe areas (contact areas) F of N+/P+-type diffusion layers 14, 15 in fourth semiconductor layer 12-4 do not overlap fringe areas (contact areas) F of N+/P+-type diffusion layers 14, 15 in first semiconductor layer 12-1 as shown in FIG. 173, fringe areas (contact areas) F of N+/P+-type diffusion layers 14, 15 in second semiconductor layer 12-2 as shown in FIG. 177, and fringe areas (contact areas) F of N+/P+-type diffusion layers 14, 15 in third semiconductor layer 12-3 as shown in FIG. 181. This configuration allows vias to be independently in contact with respective semiconductor layers.

As a result of the above steps, semiconductor layers 12-1, 12-2, 12-3, 12-4 are stacked and formed on semiconductor substrate 11. Thereafter, control gates are formed to pass through semiconductor layers 12-1, 12-2, 12-3, 12-4, and select transistors and word lines are respectively formed on the control gates. In addition, vias are formed to be independently connected to respective n+/p+-type diffusion layers 14, 15 in semiconductor layers 12-1, 12-2, 12-3, 12-4.

A step of forming a memory cell array (control gates), a step of forming N+/P+-type diffusion layers, a step of forming vias, a step of forming select transistors, and a step of forming word lines are common in all the examples of methods for producing the MaCS. Therefore, the explanation about these steps is not repeated here, and will be explained in order in the following examples.

(2) Second Example

FIGS. 187 to 220 illustrate the second example of method for producing a three-dimensional MaCS.

In the first example, the N+/P+-type diffusion layers and the element isolation insulating layers are independently formed for each of stacked semiconductor layers. In this method, however, the production cost may increase due to the increase of the number of PEPs.

To prevent the increase of the production cost, the second example is suggested. In the second example, first, semiconductor layers are stacked on a semiconductor substrate, and a memory cell array is formed. Thereafter, N+/P+-type diffusion layer are formed in the semiconductor layers at a time. Therefore, the number of PEPS is reduced, so that the production cost is reduced.

In the explanation about the first example, it is assumed that there are four semiconductor layers. In the explanation about the second example, it is assumed that there are three semiconductor layers.

A. Method for Forming Memory Cell Array

FIGS. 187 to 192 illustrate a method for forming a memory cell array.

Figure 187:
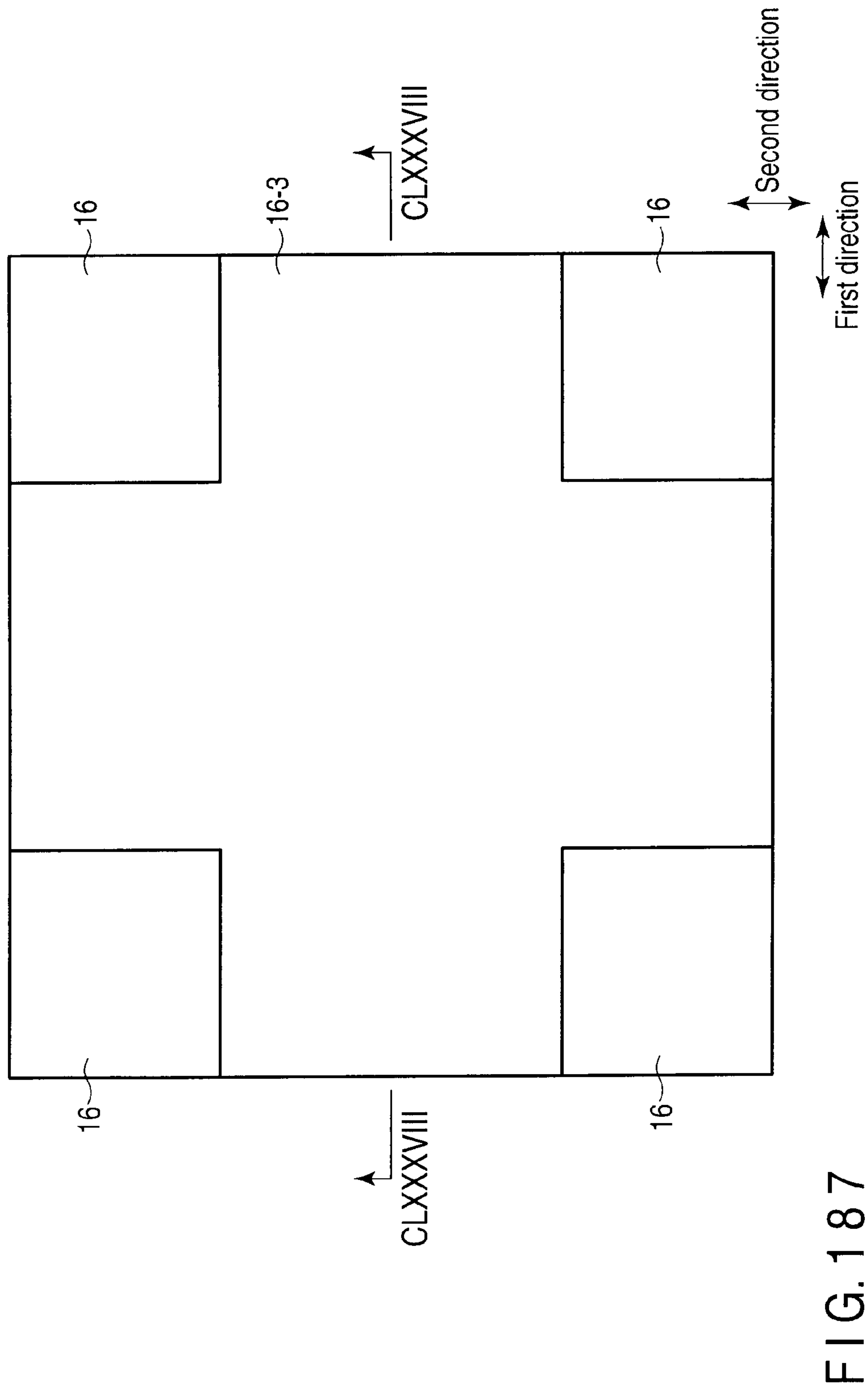
Figure 188:
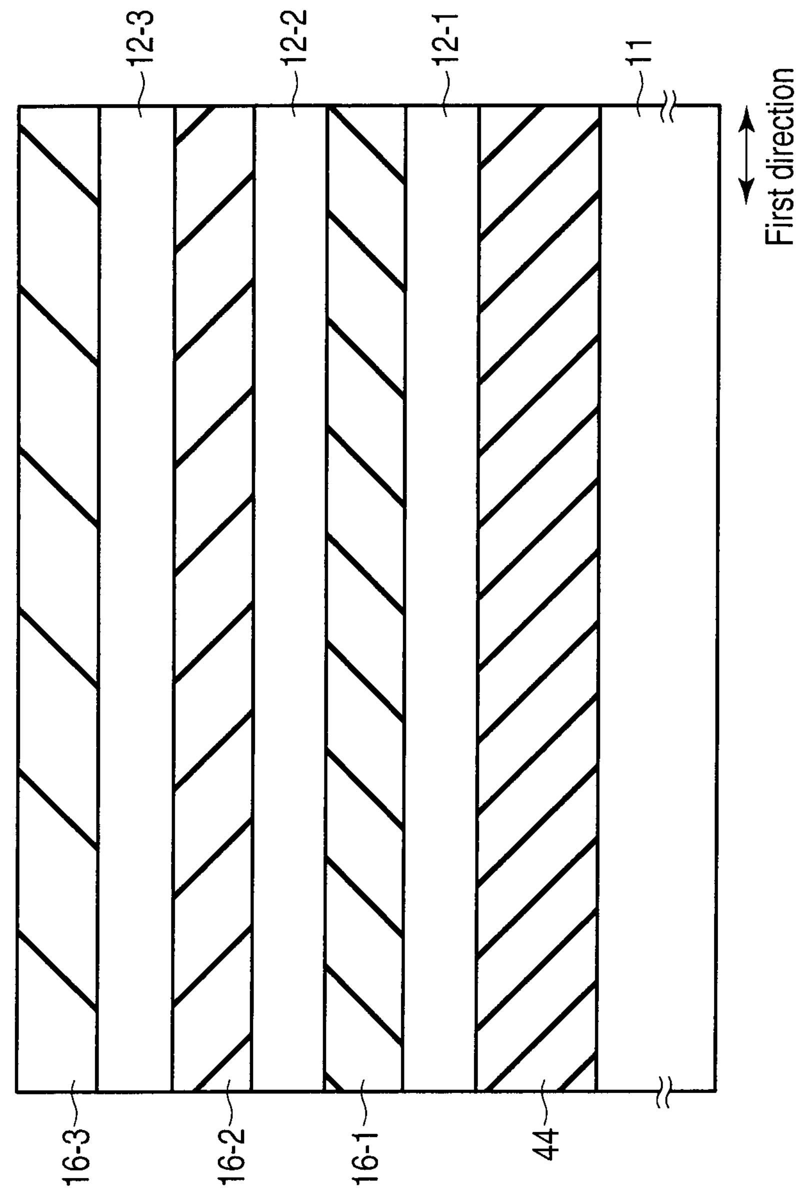

First, as shown in FIGS. 187 and 188, inter-layer insulating layer 44, first semiconductor layer 12-1, inter-layer insulating layer 16-1, second semiconductor layer 12-2, inter-layer insulating layer 16-2, third semiconductor layer 12-3, and inter-layer insulating layer 16-3 are formed on semiconductor substrate 11 in order.

Inter-layer insulating layer 44, 16-1, 16-2, 16-3 are, for example, oxide silicon layers. First to third semiconductor layers 12-1, 12-2, 12-3 are, for example, polysilicon layers.

Thereafter, a hard mask (for example, silicon nitride layer) is formed on inter-layer insulating layer 16-3. Using a resist pattern as a mask, the hard mask is patterned by RIE. Subsequently, the resist pattern is removed. Using the hard mask as a mask, inter-layer insulating layer 16-3, third semiconductor layer 12-3, inter-layer insulating layer 16-2, second semiconductor layer 12-2, inter-layer insulating layer 16-1, and first semiconductor layer 12-1 are etched by RIE in order.

As a result, device isolating trenches for isolating N+/P+-type diffusion layers are formed.

An insulating layer (for example, oxide silicon layer) is formed in each of the device isolating trenches, and this is adopted as element isolation insulating layer 16.

Thereafter the hard mask is removed.

Alternatively, the hard mask may not be removed, and may be left there as it is.

Figure 190:
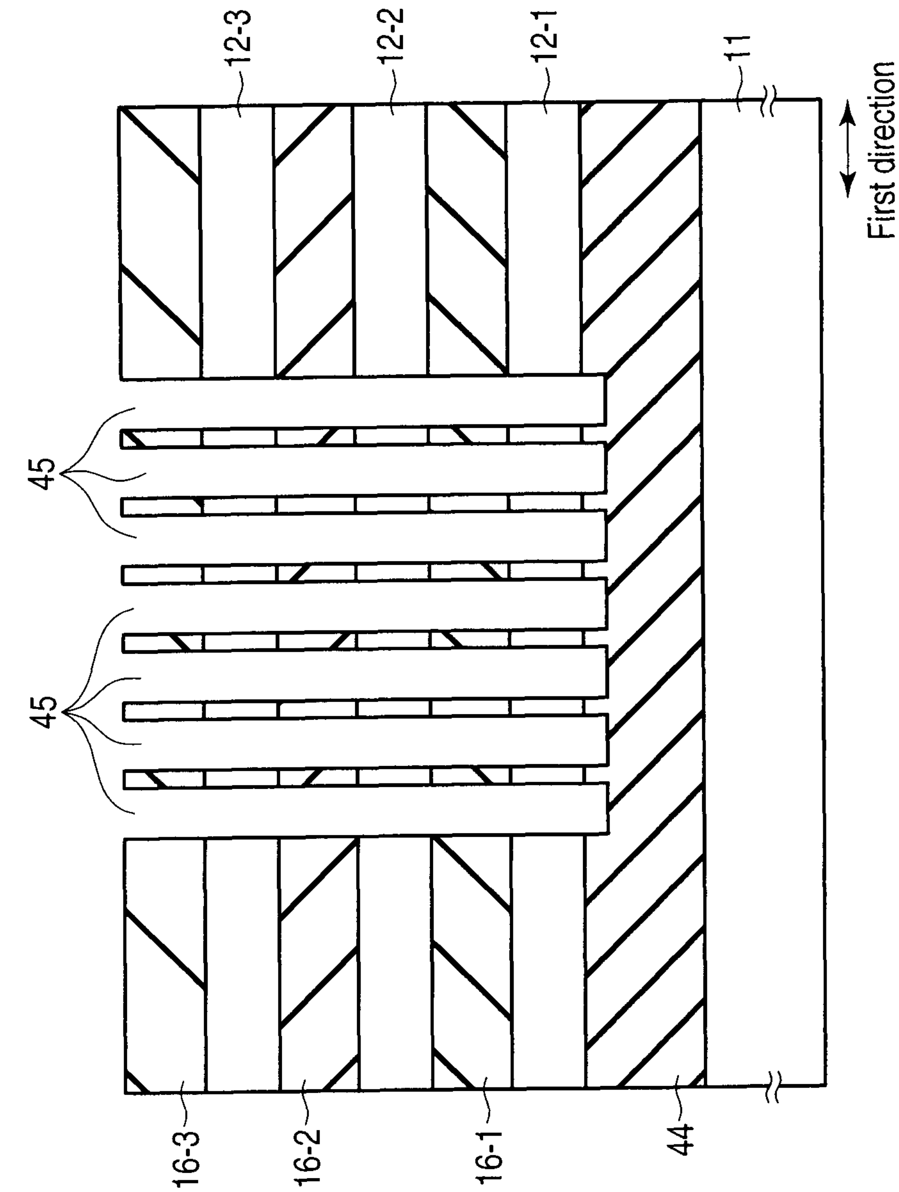

Subsequently, as shown in FIGS. 189 and 190, trenches 45 are formed in an array form. The trenches 45 are used to form control gates and select gates of MaCS.

Trenches 45 are respectively formed in memory cell array area A1 and select transistor areas A2. In this case, areas A3 and A4 are hook up areas. For example, N+-type diffusion layer is arranged in hook up areas A3, and P+-type diffusion layer is arranged in hook up area A4.

Trenches 45 pass through first to third semiconductor layers 12-1, 12-2, 12-3, and the bottom surfaces of trenches 45 reach inter-layer insulating layer 44.

Figure 191:
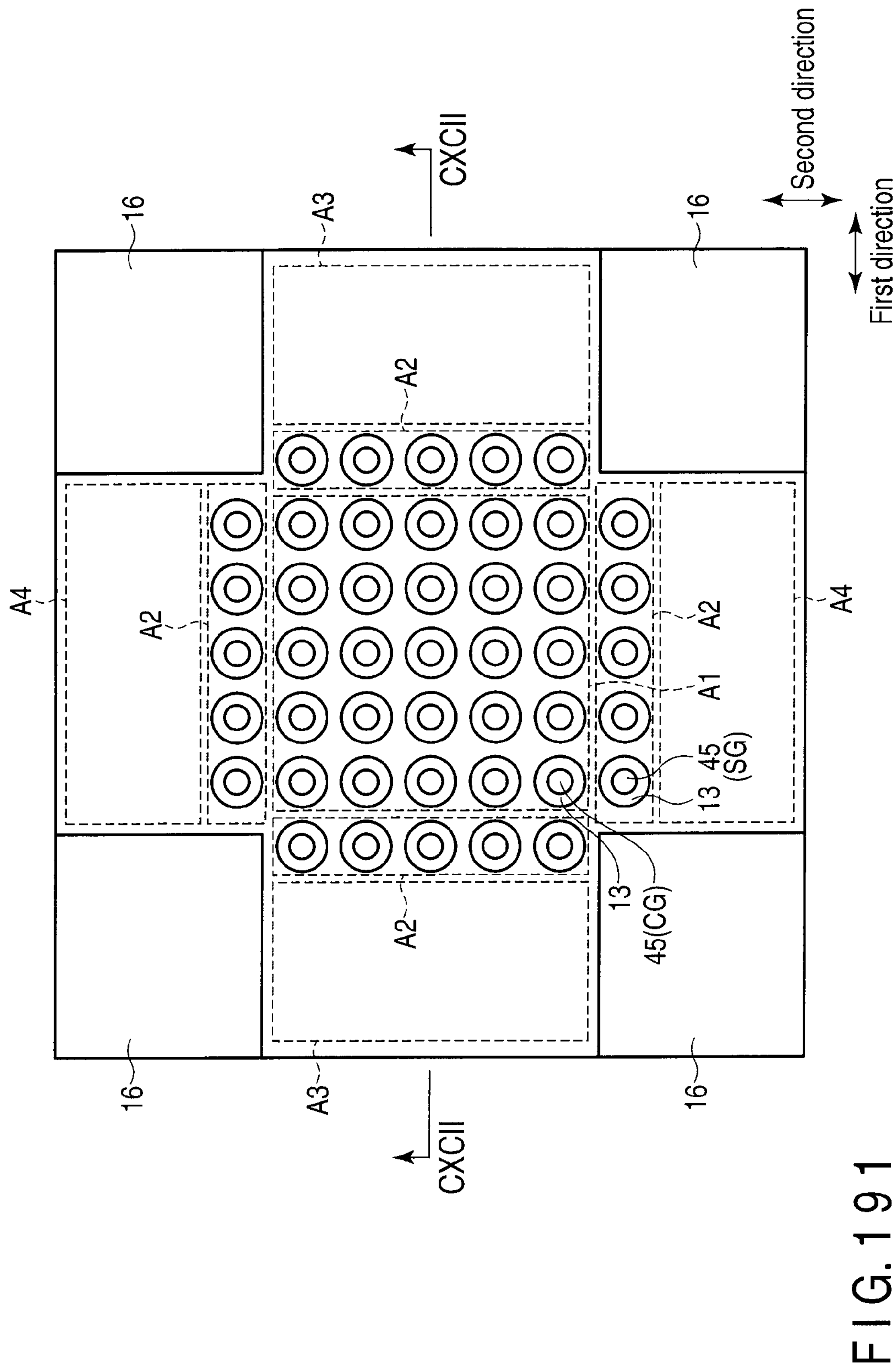
Figure 192:
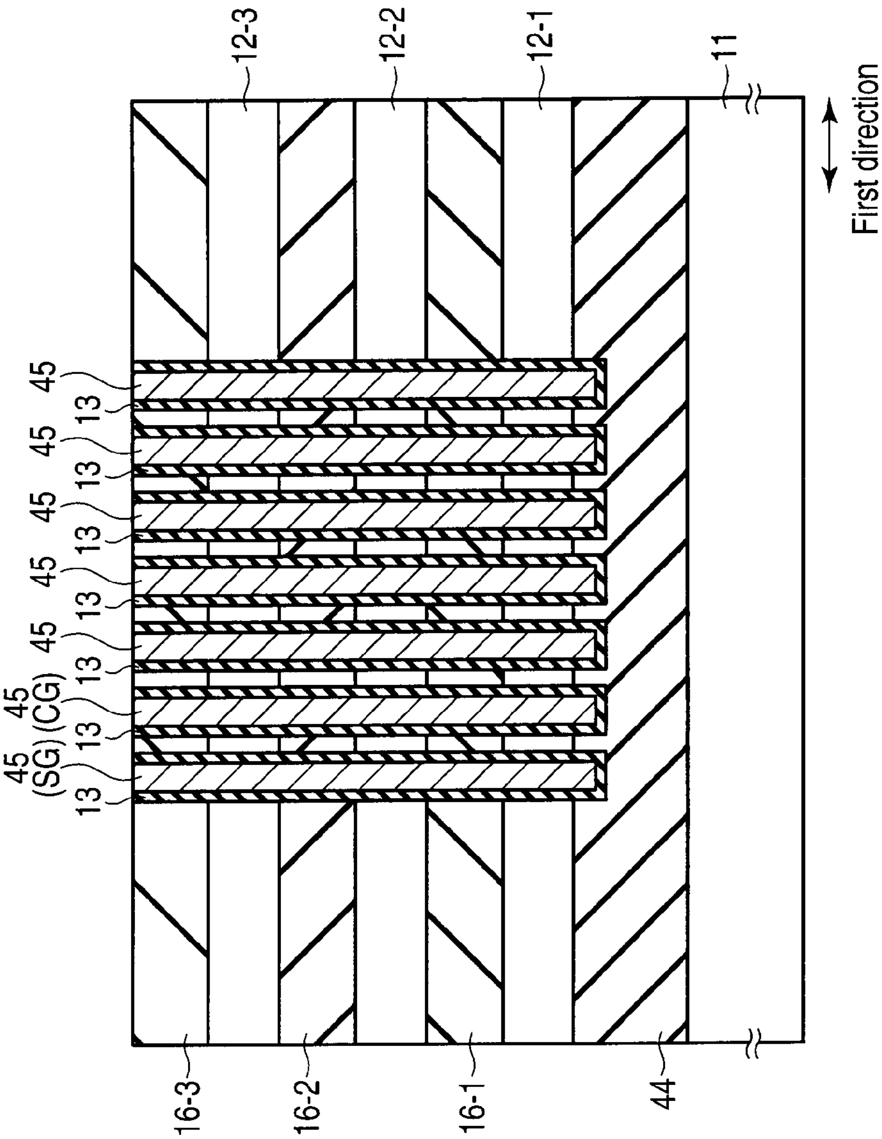

Subsequently, as shown in FIGS. 191 and 192, stacked layer structures 13 are respectively formed on the inner surfaces of trenches 45. For example, when memory cells as shown in FIGS. 10 and 11 are employed, stacked layer structure 13 includes a gate insulating layer, a data recording layer, and a block insulating layer. For example, when memory cells as shown in FIGS. 12 and 13 are employed, stacked layer structure 13 includes a gate insulating layer, a data recording layer, and an inter-electrode insulating layer.

Stacked layer structures 13 are formed on the inner surfaces of trenches 45 without filling trenches 45.

Thereafter, conductive layers (for example, polysilicon layer including impurities and metal layer such as TaN) 45 filling trenches 45 are formed. Conductive layers 45 filling trenches 45 in memory cell array area A1 are control gates CG. Conductive layers 45 filling trenches 45 in select transistor areas A2 are select gates SG.

As a result of the above steps, the memory cell array is formed.

B. Method for Forming N+/P+-Type Diffusion Layers

FIGS. 193 to 207 illustrate a method for forming N+/P+-type diffusion layers.

The following two methods are suggested as methods for forming N+/P+-type diffusion layer.

B.-1. Method Using Plasma Doping

Figure 194:
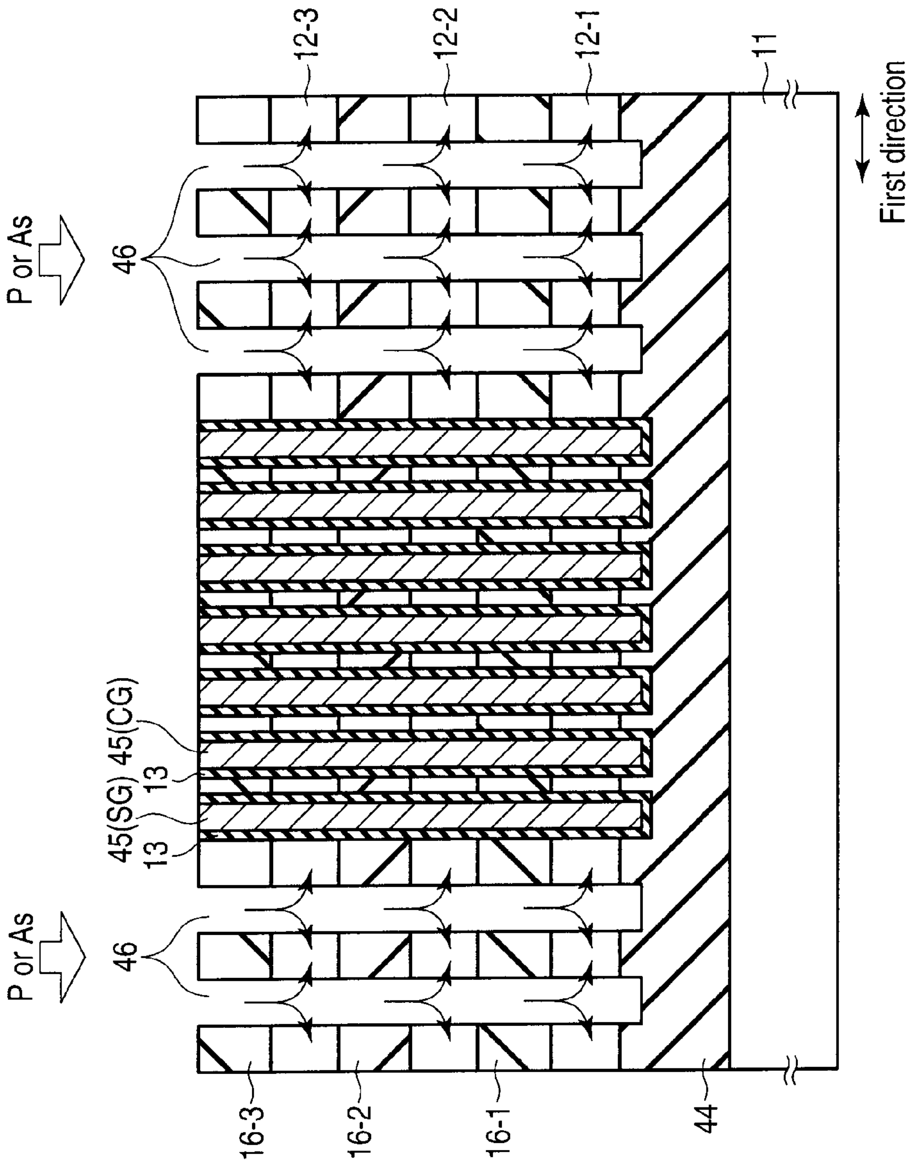

First, as shown in FIGS. 193 and 194, trenches 46 are formed in an array form in hook up areas A3. Trenches 46 pass through first to third semiconductor layers 12-1, 12-2, 12-3, and the bottom surfaces of trenches 46 reach inter-layer insulating layer 44.

Figure 195:
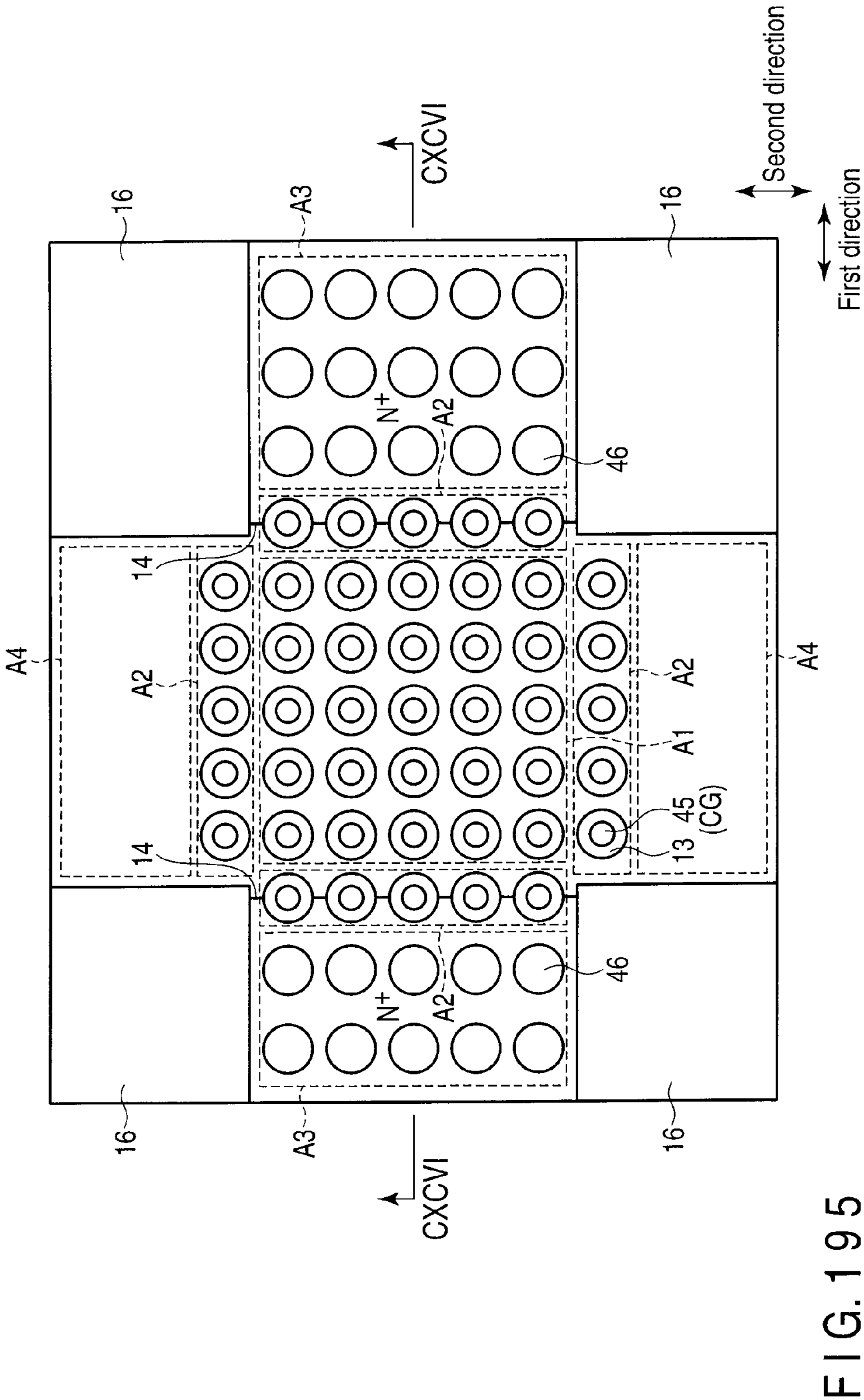
Figure 196:
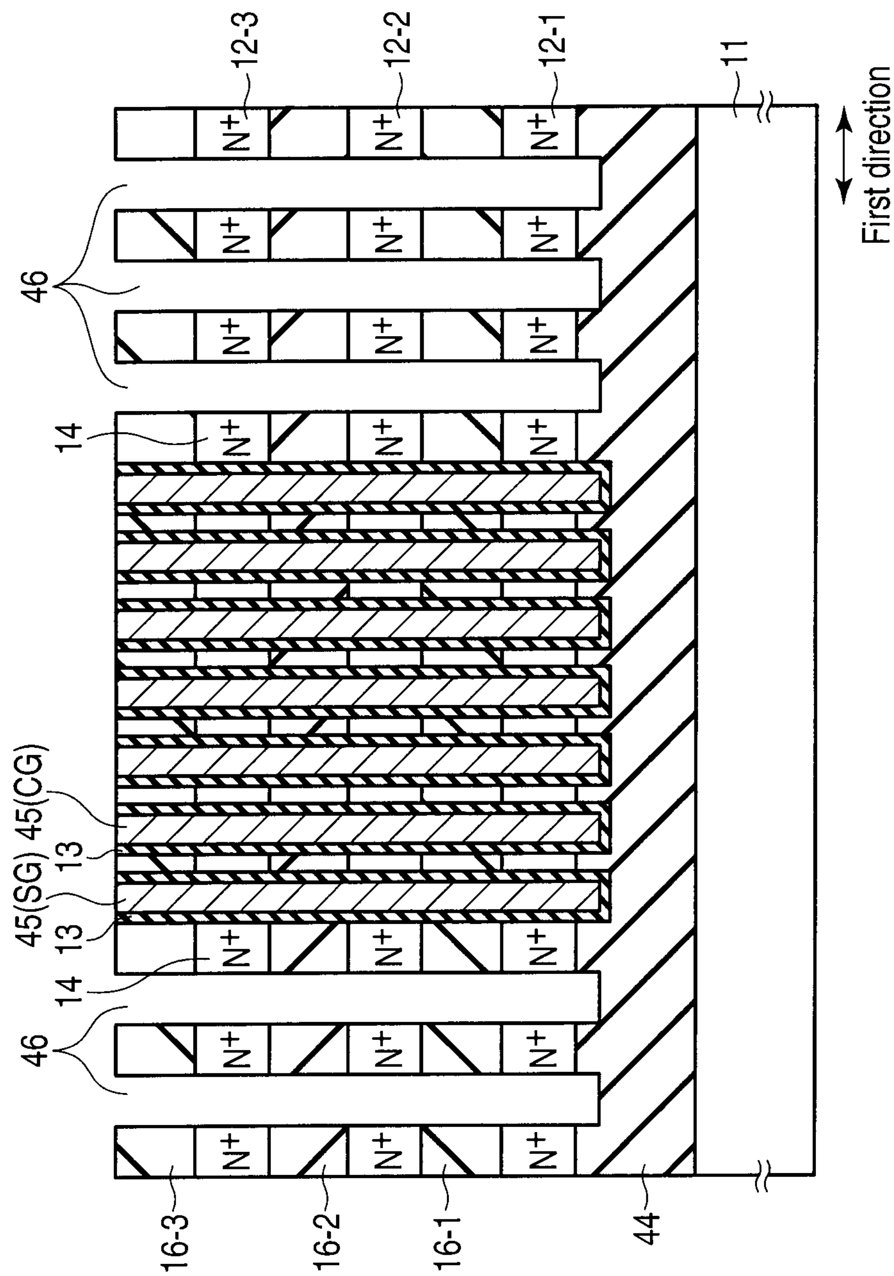
Figure 198:
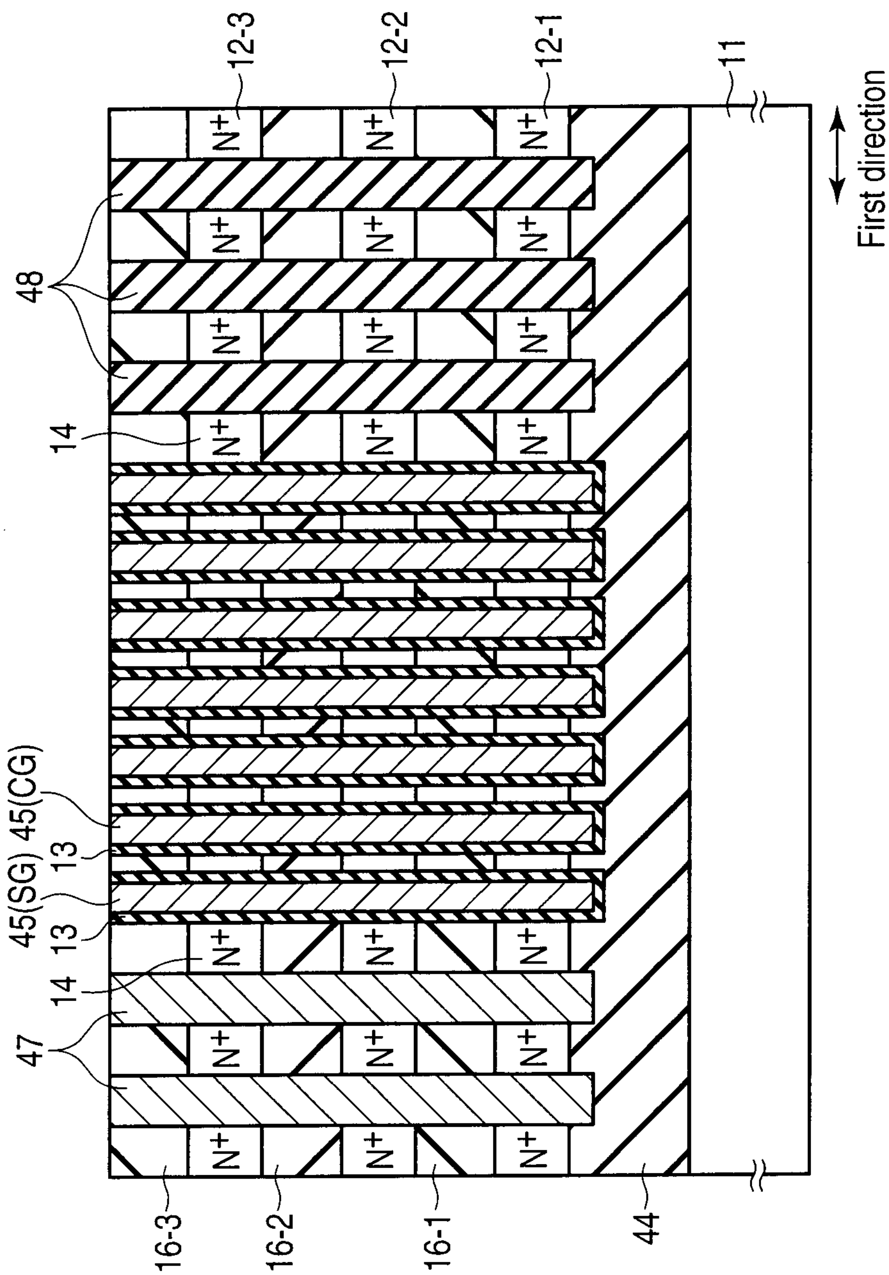

Thereafter, N-type impurities (for example, P and As) are doped into first to third semiconductor layers 12-1, 12-2, 12-3 via trenches 46 by plasma doping. Then, as shown in FIGS. 195 and 196, the N-type impurities are activated by thermal diffusion, so that N+-type diffusion layers 14 are formed in first to third semiconductor layers 12-1, 12-2, 12-3 at a time.

Figure 199:
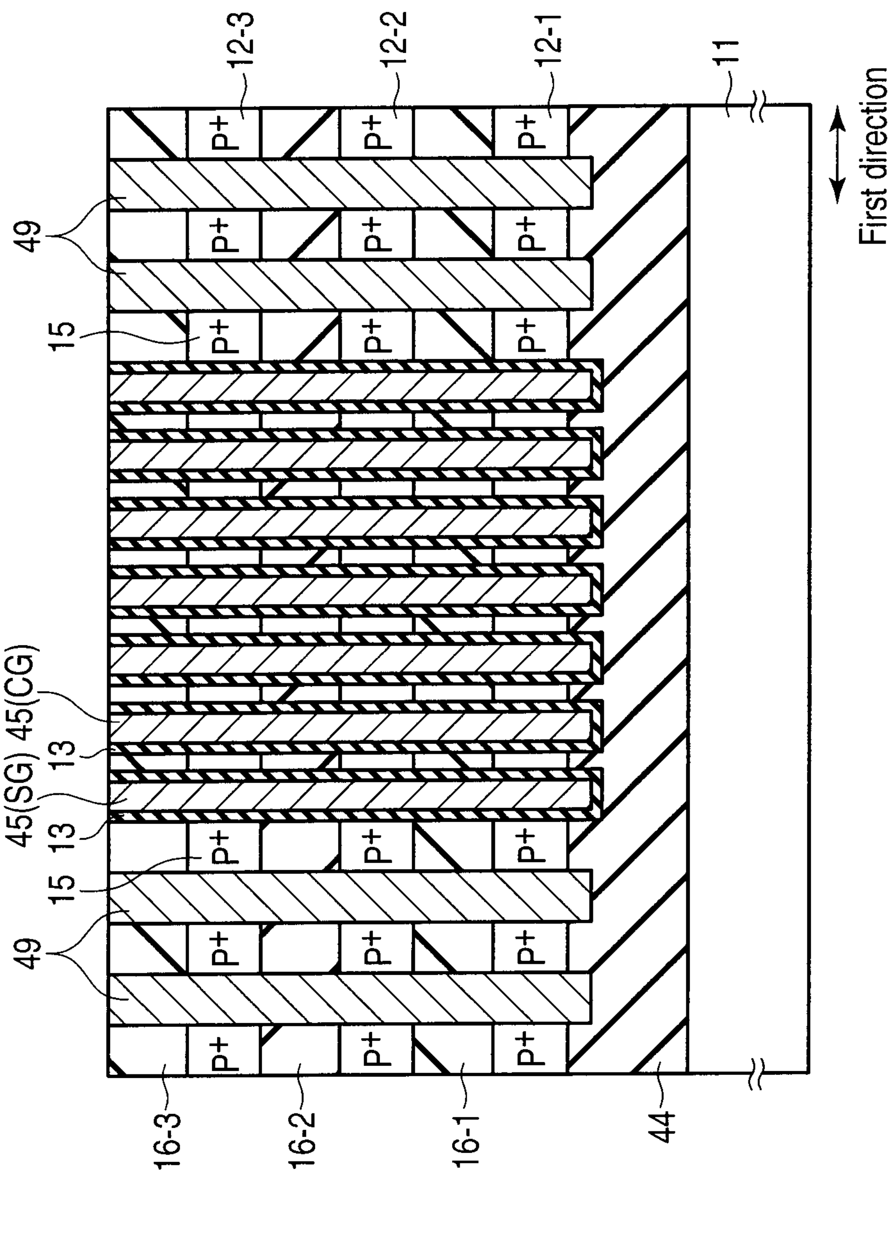

Subsequently, as shown in FIGS. 197 and 199, for example, the trenches in hook up area A3 at the left side are filled with conductive layers 47. Conductive layers 47 are used as vias. In this case, as shown in FIGS. 131 and 141, one ends of NAND series in first to third semiconductor layers 12-1, 12-2, 12-3 are commonly connected to one read/write line RWL1.

On the other hand, the trenches in hook up area A3 at the right side are filled with insulating layers (for example, oxide silicon layer) 48. In this case, as shown in FIGS. 131 and 141, the other end of the NAND series in each of first to third semiconductor layers 12-1, 12-2, 12-3 is independently connected to first to third read/write lines RWL2-1, RWL2-2, RWL2-3, respectively.

However, when the one ends of NAND series in first to third semiconductor layers 12-1, 12-2, 12-3 are independently connected to first to third read/write line, respectively, the trenches in hook up area A3 at the left side are filled with insulating layers.

Like the formation of N+-type diffusion layer 14, trenches are subsequently formed in an array form in hook up areas A4. The trenches pass through first to third semiconductor layers 12-1, 12-2, 12-3, and the bottom surfaces of trenches reach inter-layer insulating layer 44.

Thereafter, P-type impurities (for example, B) are doped into first to third semiconductor layers 12-1, 12-2, 12-3 via the trenches by plasma doping. Then, the P-type impurities are activated by thermal diffusion, so that P+-type diffusion layers 15 are formed in first to third semiconductor layers 12-1, 12-2, 12-3 at a time.

Then, the trenches in hook up areas A4 are filled with conductive layers 49. Conductive layers 49 are used as vias. In this case, as shown in FIGS. 131 and 141, memory cells of the memory cell array in first to third semiconductor layers 12-1, 12-2, 12-3 are commonly connected to first and second erase lines EL1, EL2.

However, when each of first and second erase lines is independently connected to memory cells of the memory cell array in first to third semiconductor layers 12-1, 12-2, 12-3, the trenches in hook up areas A4 are filled with insulating layers.

As a result of the above steps, N+/P+-type diffusion layers 14, 15 are formed in first to third semiconductor layers 12-1, 12-2, 12-3 at a time.

B.-2. Method Using Solid Phase Diffusion

Figure 201:
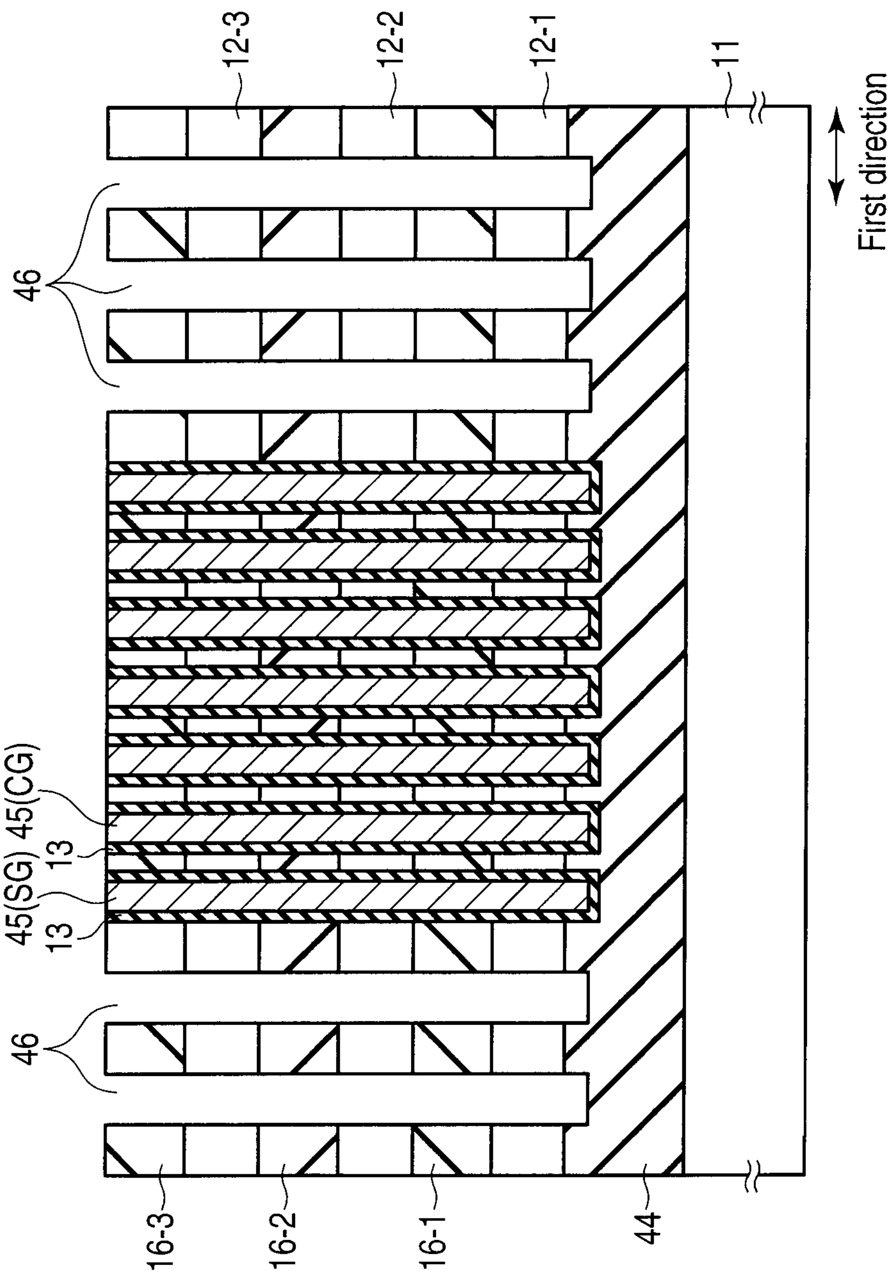

First, as shown in FIGS. 200 and 201, trenches 46 are formed in an array form in hook up areas A3, A4. Trenches 46 pass through first to third semiconductor layers 12-1, 12-2, 12-3, and the bottom surfaces of trenches 46 reach inter-layer insulating layer 44.

Subsequently, as shown in FIG. 202, trenches 46 in hook up areas A3, A4 are filled with insulating layers (for example, oxide silicon layer) 51 including N-type impurities (for example, P and As). Then, as shown in FIG. 203, only insulating layers 51 filled in trenches 46 in hook up areas A4 are removed by wet etching, for example.

Figure 204:
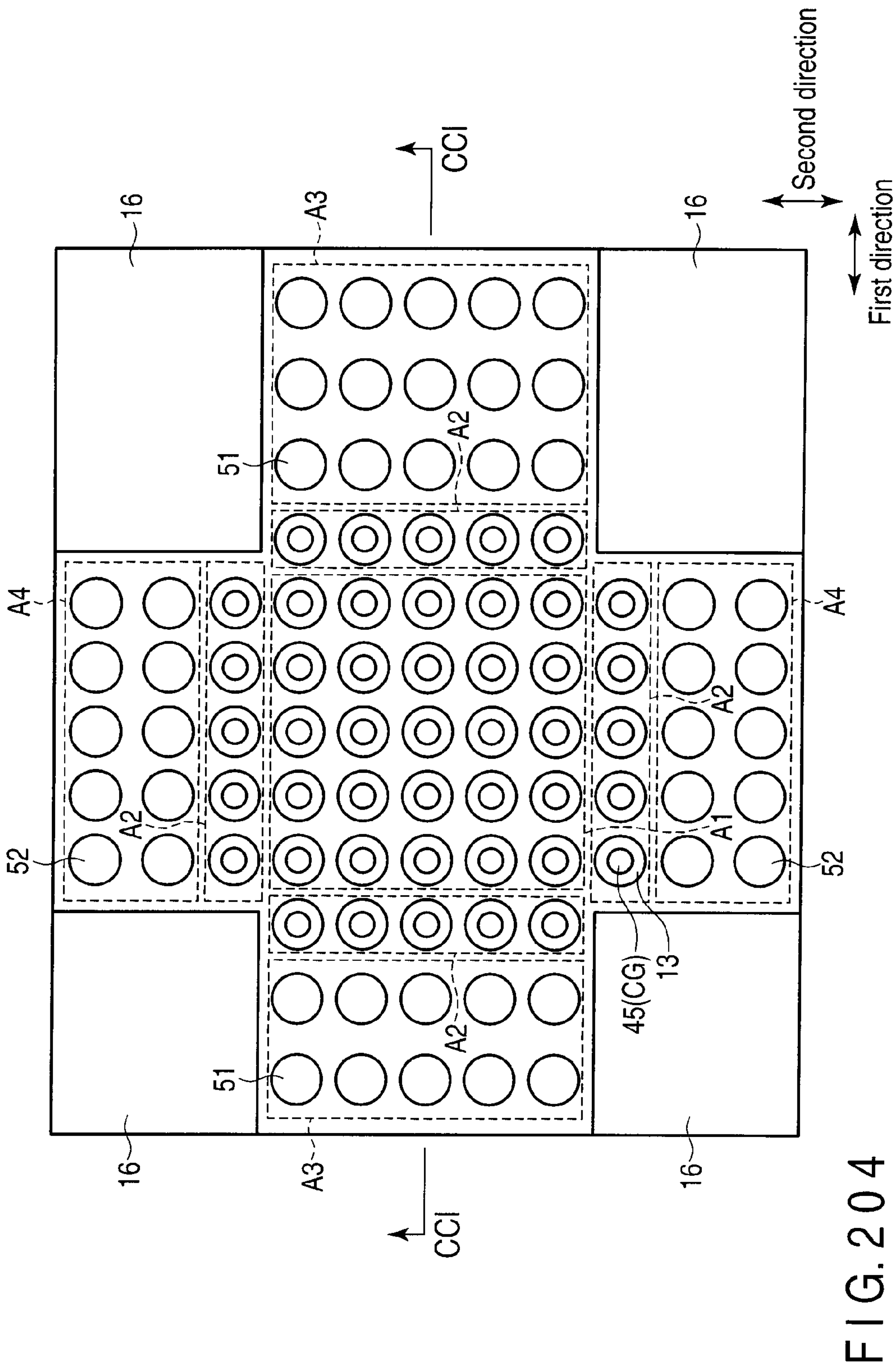

Subsequently, as shown in FIG. 204, trenches 46 in hook up areas A4 are filled with insulating layers (for example, oxide silicon layer) 52 including P-type impurities (for example, B).

Figure 205:
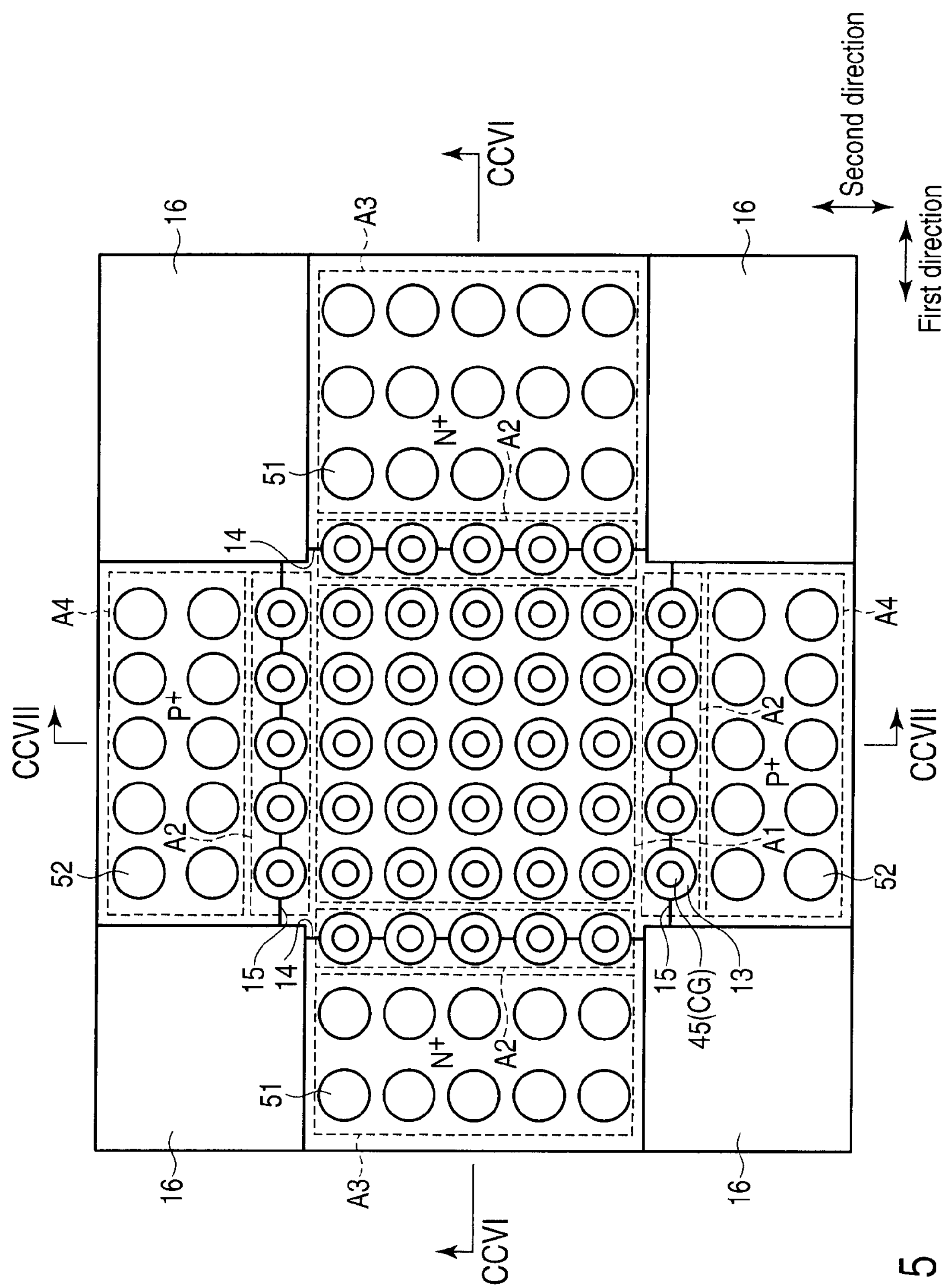
Figure 206:
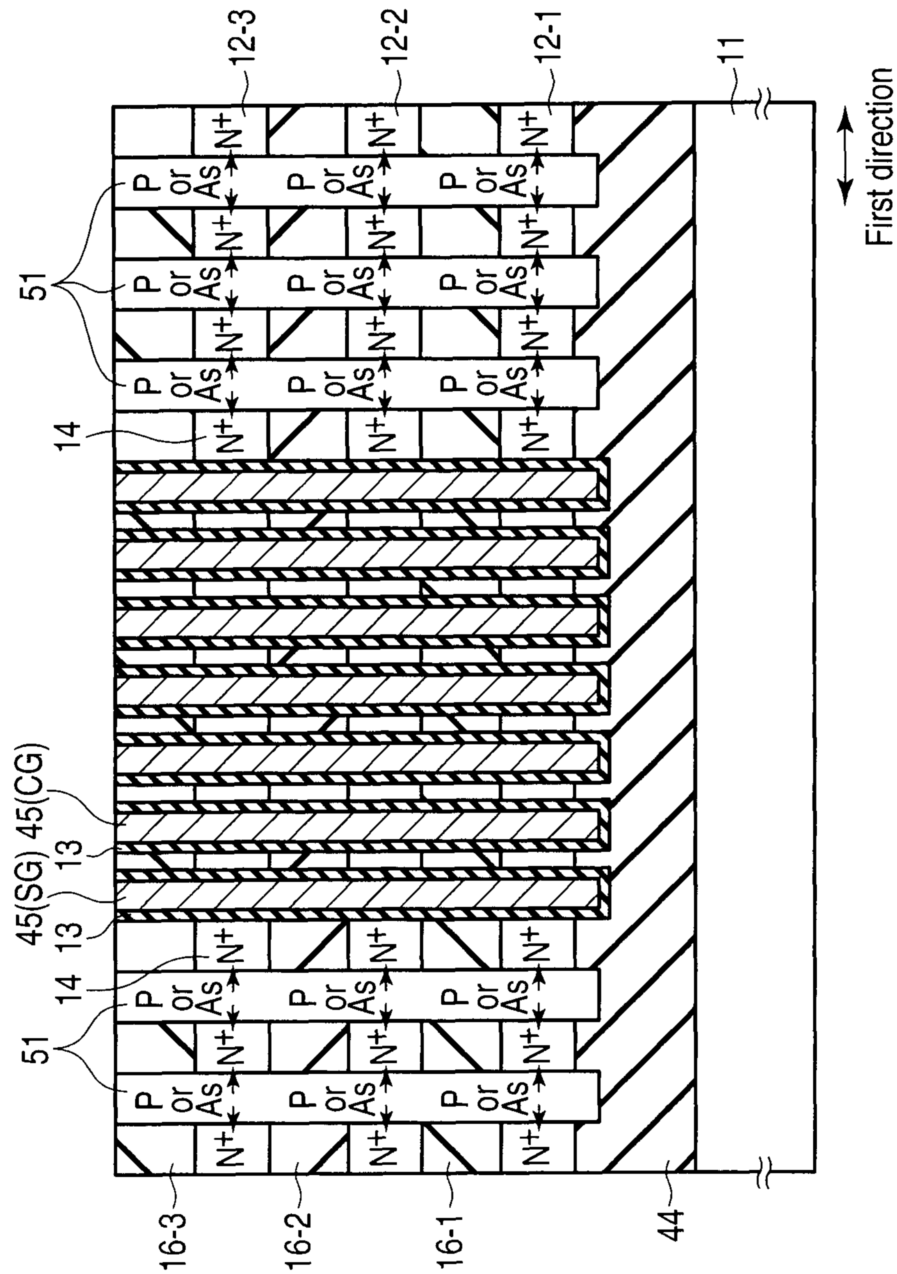
Figure 207:
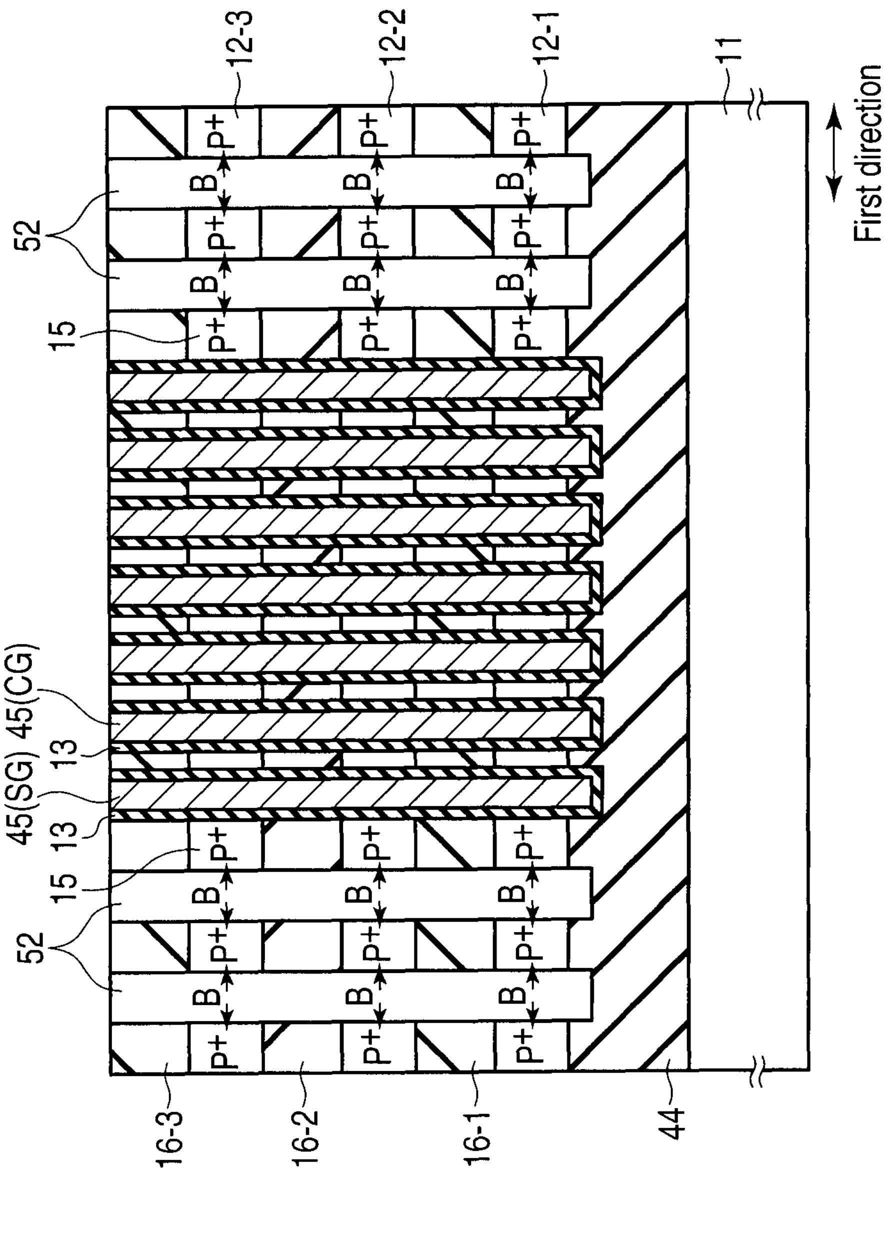

Thereafter, as shown in FIGS. 205 to 207, N-type impurities are diffused in solid phase from insulating layers 51 into first to third semiconductor layers 12-1, 12-2, 12-3 by thermal diffusion, and P-type impurities are diffused in solid phase from insulating layers 52 to first to third semiconductor layers 12-1, 12-2, 12-3.

As a result of the above steps, N+/P+-type diffusion layers 14, 15 are formed in first to third semiconductor layers 12-1, 12-2, 12-3 at a time.

In this method, insulating layers 51, 52 filled in trenches 46 in hook up areas A3, A4 are not removed and left there as they are. Contacts for N+/P+-type diffusion layers 14, 15 are formed by, e.g., the following method for producing vias.

C. Method for Forming Vias

FIGS. 208 to 220 illustrate a method for forming vias in a hook up area in a staircase structure.

The method described below can be applied to all of hook up areas A3 at two ends in the first direction of the memory cell array and hook up areas A4 at two ends in the second direction of the memory cell array.

In the explanation below, for the sake of simplicity of explanation, this method is applied to hook up area A3 at one of two ends in the first direction of the memory cell array which is considered to be processed in a staircase shape most effectively.

C.-1. First Example of Staircase Processing

FIGS. 208 to 212 illustrate the first example of staircase processing.

First, as shown in FIG. 208, mask layer 53 is formed on inter-layer insulating layer 16-3 serving as the uppermost layer. Mask layer 53 can be formed from a carbon material (for example, photoresist layer), a hard mask (for example, silicon nitride layer), and the like.

Thereafter, using mask layer 53 as a mask, inter-layer insulating layer 16-3 is selectively etched by RIE. In this etching process, inter-layer insulating layer 16-3 as well as insulating layers 48 in the trenches are etched at a time. When inter-layer insulating layer 16-3 and insulating layer 48 are made of the same material (for example, oxide silicon layer), etching process can be easily controlled.

What is important is that the etched portion of insulating layer 48 (E1 portion) reaches inter-layer insulating layer 16-2. This structure is made for the purpose of preventing the adverse effect caused by the remaining portion of insulating layer 48 (protrusion in the third direction) in the staircase processing.

Therefore, in the actual steps, this etching process is done in an over etching manner so that the etched portion of insulating layer 48 reaches below the upper surface of inter-layer insulating layer 16-2.

Subsequently, as shown in FIG. 209, using mask layer 53 as a mask, third semiconductor layer 12-3 is selectively etched by RIE.

Subsequently, mask layer 53 is slimmed as shown in FIG. 210.

More specifically, mask layer 53 is etched by isotropic etching, so that the end in the first direction of mask layer 53 is reduced (etched in the horizontal direction). The amount of etching in the horizontal direction is equivalent to the width (for example, about 60 nm) of one step in the staircase processing.

Thereafter, using mask layer 53 as a mask, inter-layer insulating layers 16-3, 16-2 are selectively etched by RIE. In this etching process, inter-layer insulating layers 16-3, 16-2 as well as insulating layers 48 in the trenches are etched at a time.

What is important in this etching process is also that the etched portion of insulating layer 48 (E2 portion) reaches inter-layer insulating layer 16-2. Therefore, this etching process is done in an over etching manner so that the etched portion of insulating layer 48 reaches below the upper surface of inter-layer insulating layer 16-2.

Subsequently, as shown in FIG. 211, using mask layer 53 as a mask, first and second semiconductor layers 12-1, 12-2 are selectively etched by RIE.

Subsequently, mask layer 53 is slimmed again as shown in FIG. 212.

More specifically, mask layer 53 is etched by isotropic etching, so that the end in the first direction of mask layer 53 is further reduced (etched in the horizontal direction). The amount of etching in the horizontal direction is equivalent to the width (for example, about 60 nm) of one step in the staircase processing.

Thereafter, using mask layer 53 as a mask, inter-layer insulating layers 16-3, 16-2, 16-1 are selectively etched by RIE. In this etching process, inter-layer insulating layers 16-3, 16-2, 16-1 as well as insulating layers 48 in the trenches are etched at a time.

What is important in this etching process is also that the etched portion of insulating layer 48 (E3 portion) reaches inter-layer insulating layer 16-2. Therefore, this etching process is done in an over etching manner so that the etched portion of insulating layer 48 reaches below the upper surface of inter-layer insulating layer 16-2.

As a result of the above steps, the hook up area in the staircase structure is formed.

C.-1. Second Example of Staircase Processing

FIGS. 213 to 216 illustrate the second example of staircase processing.

In the first example, the etching process of the upper inter-layer insulating layer is done in an over etching manner so that the etched portion of the insulating layer in the trench reaches the lower inter-layer insulating layer so as to obtain the staircase structure.

In this case, however, when silicide layers are formed on the upper surfaces of first to third semiconductor layers 12-1, 12-2, 12-3 using a so-called salicide (self-aligned silicide) technique during formation of vias explained later in order to reduce the contact resistance, first to third semiconductor layers 12-1, 12-2, 12-3 may be short-circuited with each other via gaps of the insulating layers on which the silicide layer are over-etched.

In the second example, a method of staircase processing for solving the above short-circuit problem will be explained.

First, the hook up area in the staircase structure is formed by the process of the first example.

Subsequently, as shown in FIG. 213, the mask layer used for the staircase processing (numeral "53" of FIG. 212) is removed, and then, protective layer (for example, silicon nitride layer) 54 is formed on the memory cell array area. Protective layer 54 is arranged for the purpose of protecting the memory cell array in the salicide step explained later.

However, when the mask layer used during the staircase processing has a function of protecting the memory cell array, it is not necessary to provide protective layer 54 over again, and the mask layer may also be used as the mask layer.

By the way, as shown in a region S of FIG. 214, the gap formed in insulating layers 48 may reach from first semiconductor layer 12-1 to second semiconductor layer 12-2 due to over etching of insulating layer 48 in the process of the first example. In this case, in the salicide step explained later, the silicide layer may short-circuit first and second semiconductor layers 12-1, 12-2 via the gap of insulating layer 48.

To prevent the shirt-circuit, the following process is added, so that this gap is filled with an insulating layer.

First, as shown in FIG. 215, sidewall insulating layer 55 is formed on side surfaces in the first direction of each step of the staircase structure. Sidewall insulating layers 55 can be easily formed by depositing insulating layers and executing anisotropic etching process thereon.

Sidewall insulating layers 55 completely fill the gaps formed in insulating layers 48.

In this state, as shown in FIG. 216, metal layers are formed on first to third semiconductor layers (silicon layers) 12-1, 12-2, 12-3, and silicide layers (for example, NiSi, CoSi2) 56 are formed on first to third semiconductor layers 12-1, 12-2, 12-3 by heat treatment. Thereafter, unreacted metal layers are removed.

Silicide layers 56 are formed on first to third semiconductor layers 12-1, 12-2, 12-3 by self alignment (salicide process).

Since the gaps formed in insulating layers 48 are completely filled with sidewall insulating layers 55, first to third semiconductor layers 12-1, 12-2, 12-3 are not short-circuited with each other by silicide layers 56.

As described above, when the first and second examples are combined, the staircase structure for independently allowing contact with each of first to third semiconductor layers 12-1, 12-2, 12-3 can be formed without the problem of short circuit between first to third semiconductor layers 12-1, 12-2, 12-3.

C.-3. Method for Forming Vias

A method for independently allowing contact with each of first to third semiconductor layers 12-1, 12-2, 12-3 will be hereinafter explained.

Figure 217:
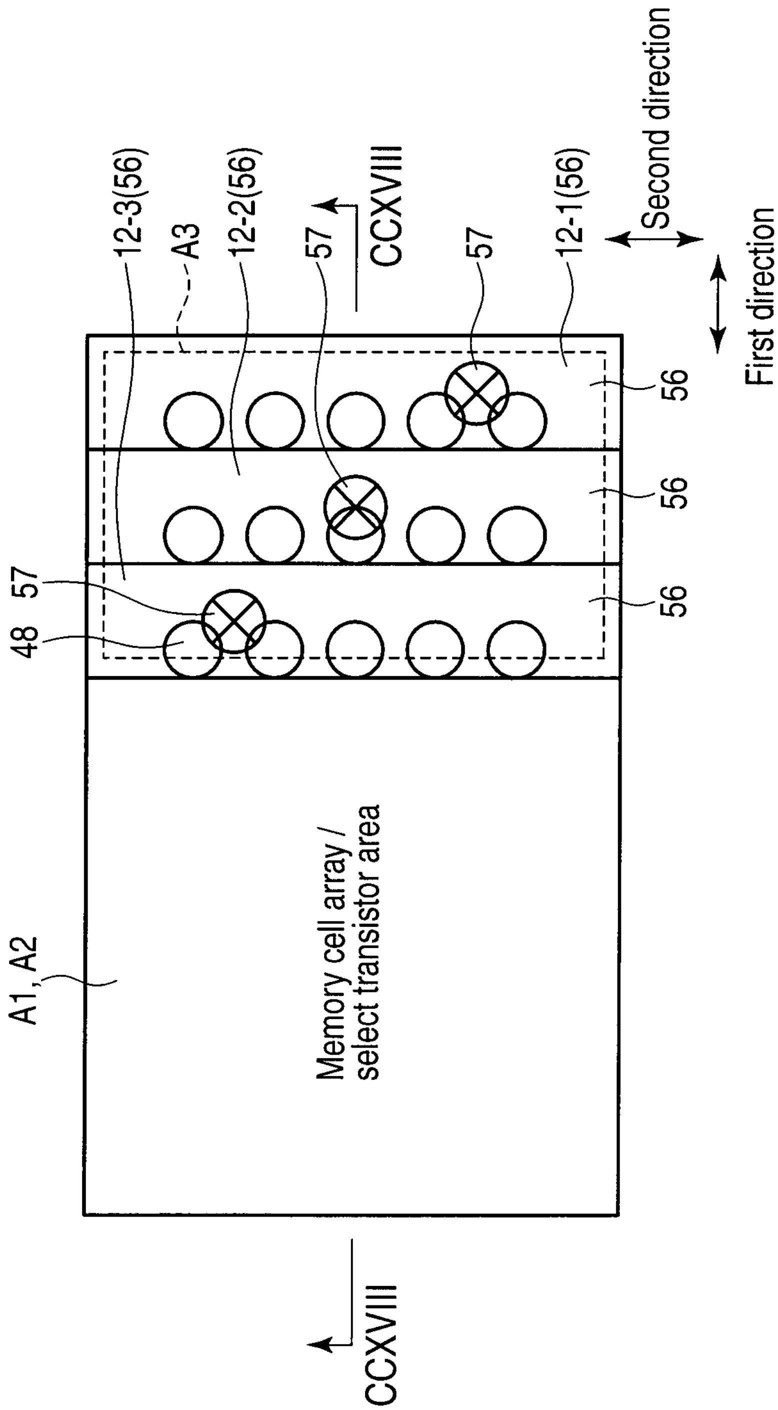
Figure 218:
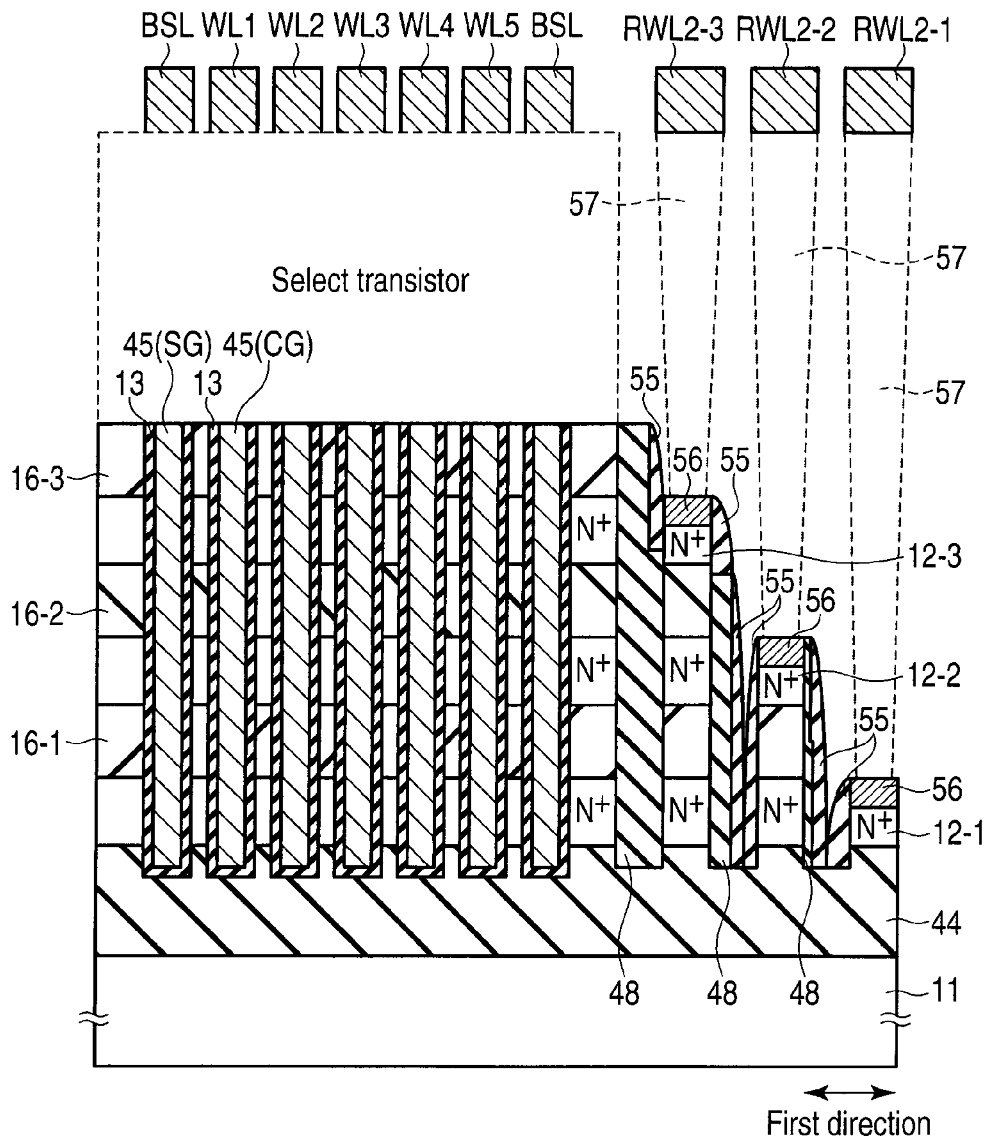

First, as shown in FIGS. 217 and 218, select transistors are formed on memory cell array area A1 and select transistor areas A2. A method for forming the select transistors is not explained here, and will be explained later.

Thereafter, vias 57 are formed so that the bottom surfaces of vias 57 are in contact with silicide layers 56.

Further, word lines WL1 to WL5 and block select lines BSL are respectively formed on the select transistors. Second read/write lines RWL2-1, RWL2-2, RWL2-3 are respectively formed on vias 57 in the hook up area.

Figure 219:
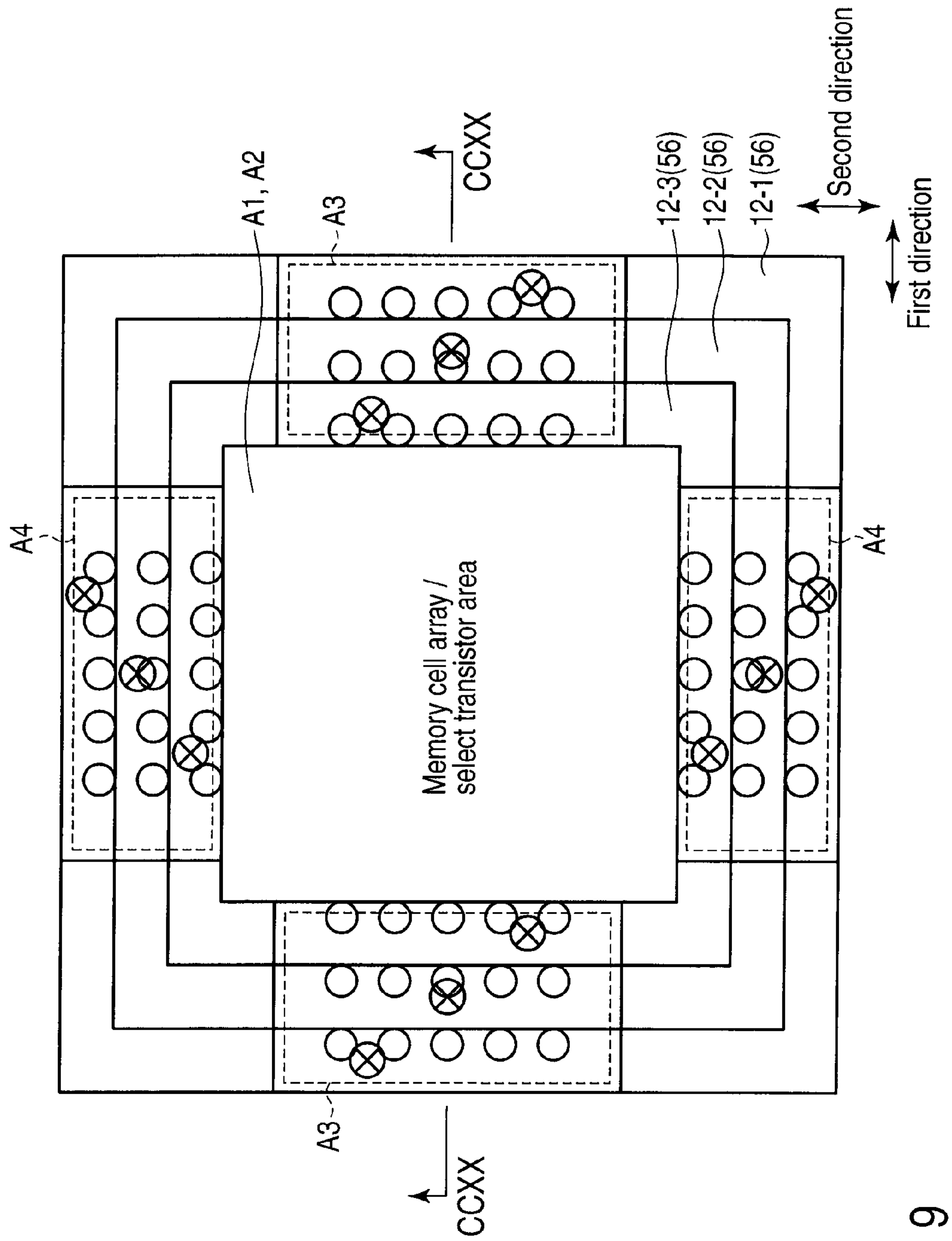
Figure 220:
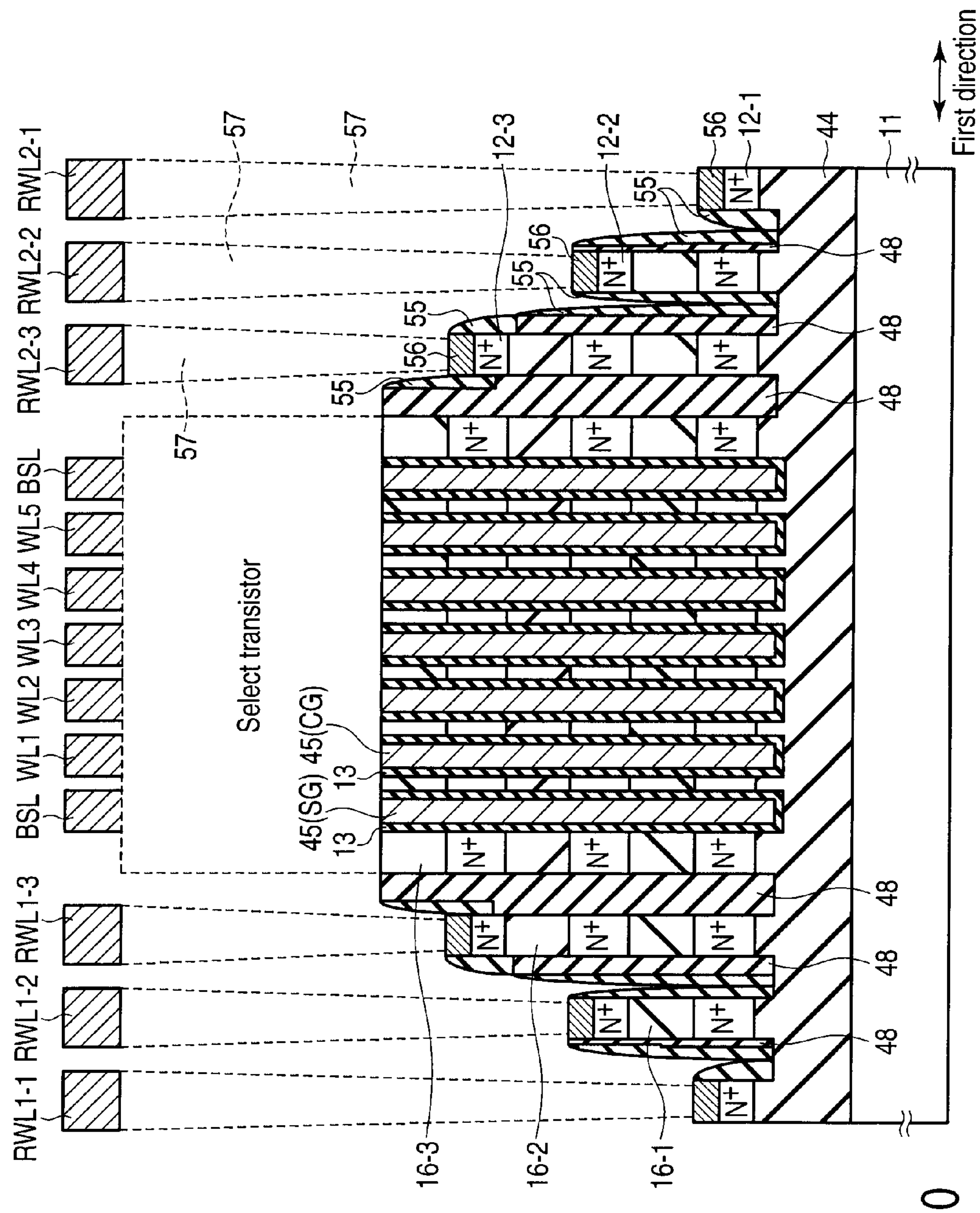

As shown in FIGS. 219 and 220, the method for forming contacts by the staircase processing can be applied to all of hook up areas A3 at two ends in the first direction of the memory cell array and hook up areas A4 at two ends in the second direction of the memory cell array.

As a result of the above steps, the three-dimensional MaCS is produced.

(3) Third Example

FIGS. 221 to 242 illustrate the third example of method for producing a three-dimensional MaCS.

In the second example, it is difficult to make semiconductor layers (channels) stacked on the semiconductor substrate into single crystals. In the third example, a technique for stacking single-crystal semiconductor layers on a semiconductor substrate will be suggested.

With this technique, channels of NAND series can be formed with single-crystal semiconductors (for example, silicon single crystals), which achieves a highly reliable MaCS capable of operating at a high speed.

Figure 221:
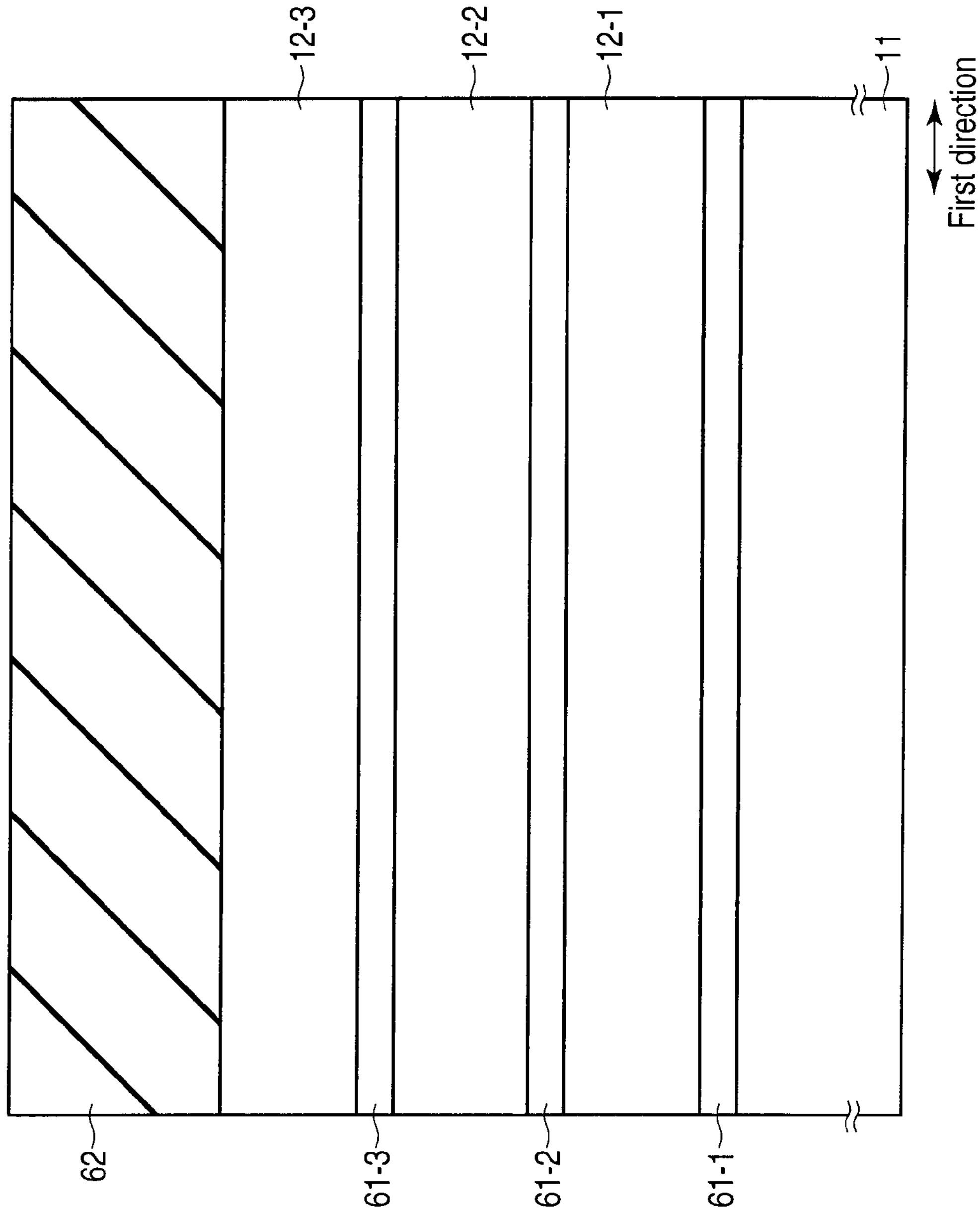

First, as shown in FIG. 221, first compound semiconductor layer (for example, SiGe layer) 61-1 is formed on single-crystal semiconductor substrate 11 by CVD in a chamber, for example. Subsequently, a deposition gas is switched in the chamber, and first single-crystal semiconductor layer 12-1 is formed on first compound semiconductor layer 61-1 by epitaxial growth.

The above operation is repeatedly executed to form a stacked layer structure on semiconductor substrate 11. The stacked layer structure includes first to third compound semiconductor layers 61-1, 61-2, 61-3 and first to third single-crystal semiconductor layers 12-1, 12-2, 12-3.

When first to third semiconductor layers 12-1, 12-2, 12-3 are silicon single crystal (Si) layers at this occasion, first to third compound semiconductor layers 61-1, 61-2, 61-3 are preferably SiGe layers. On the other hand, the concentration of Ge in the SiGe layer is preferably 30% or more.

The thickness of each of first to third semiconductor layers 12-1, 12-2, 12-3 is, for example, about 40 nm. The thickness of each of first to third compound semiconductor layers 61-1, 61-2, 61-3 is, for example, about 20 nm.

Then, protective layer (for example, SiN layer) 62 is formed on third semiconductor layer 12-3 serving as the uppermost layer by CVD, for example.

In this example, there are three semiconductor layers. However, the number of semiconductor layers may be changed as necessary.

Figure 222:
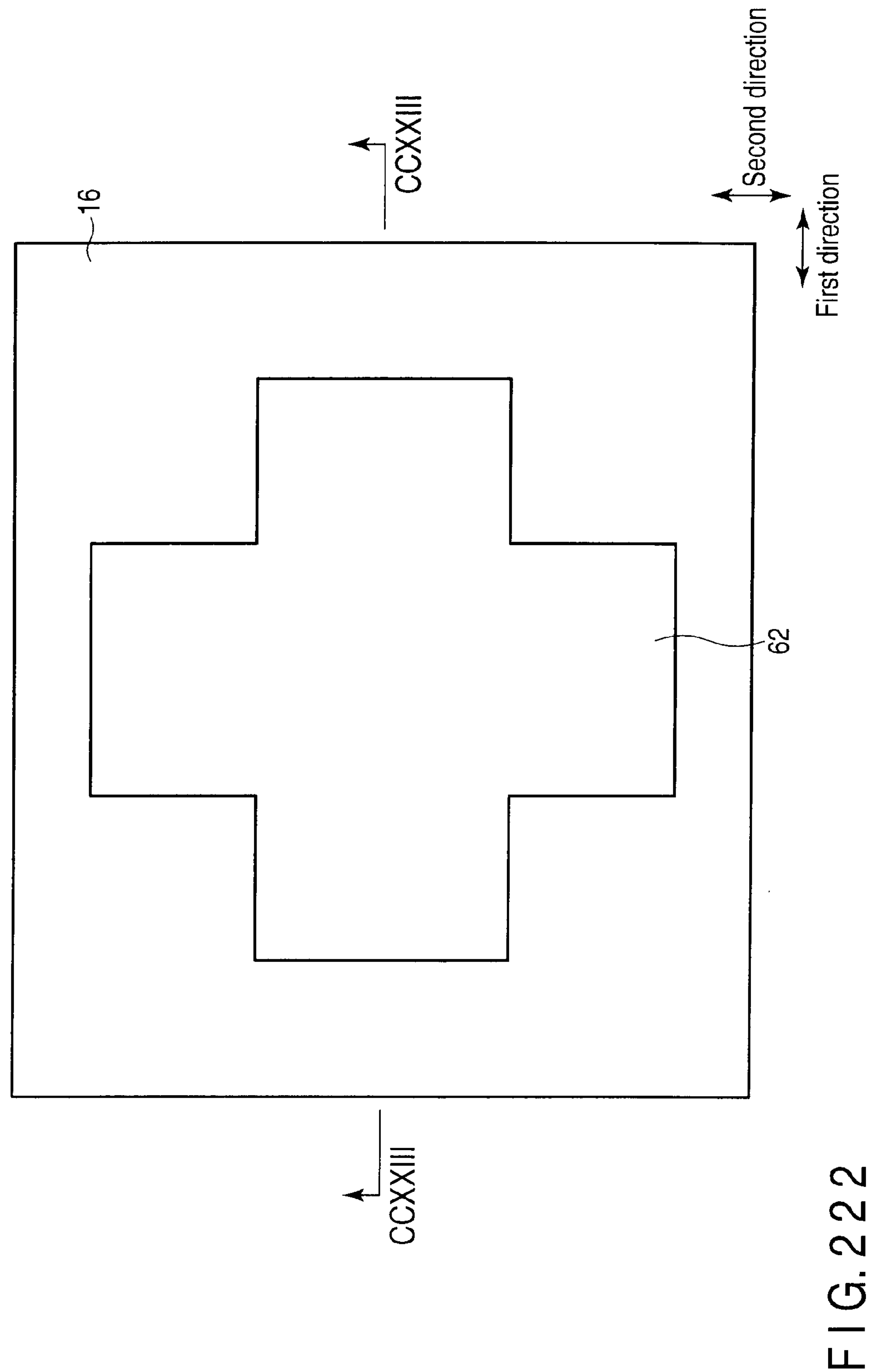
Figure 223:
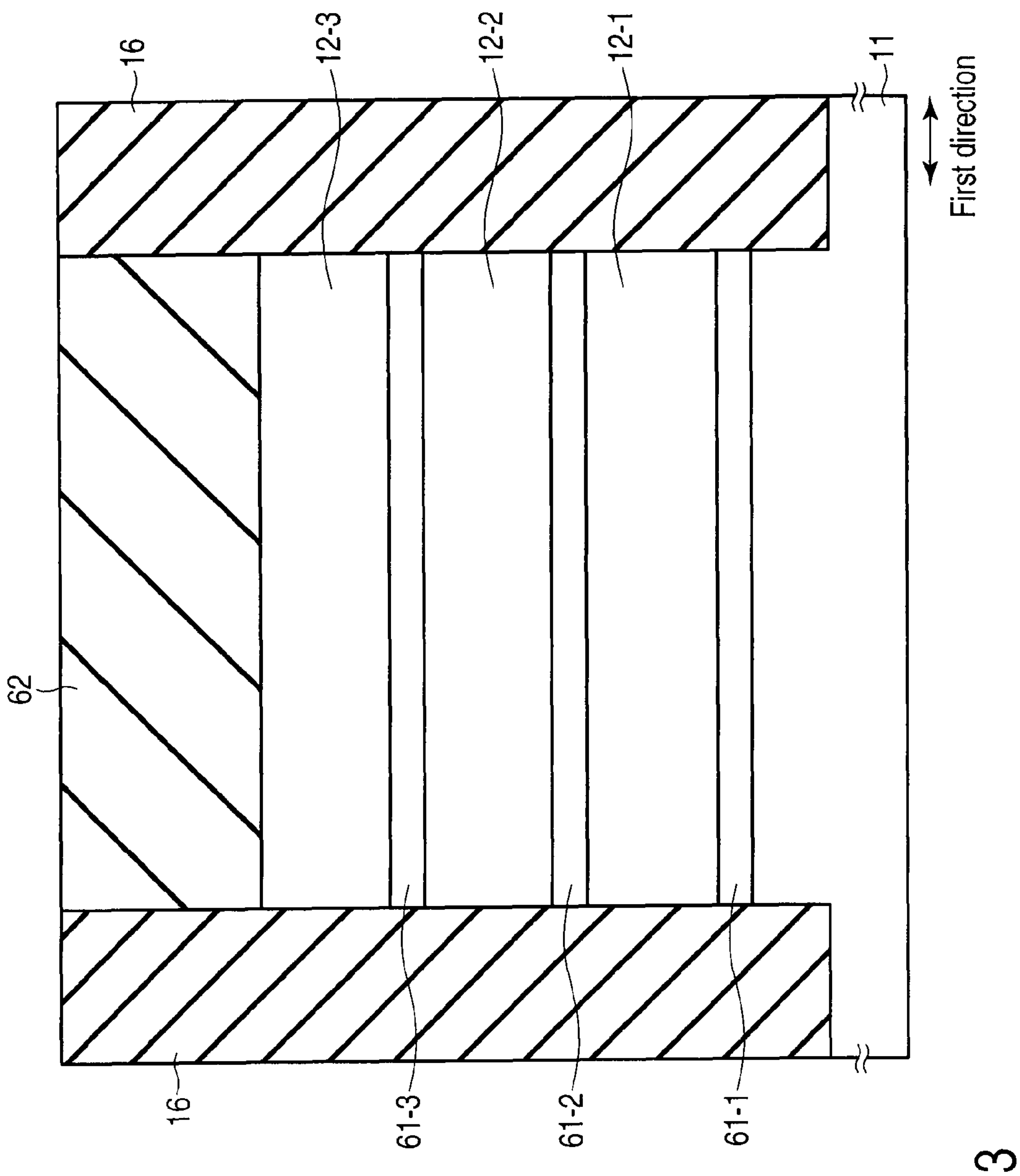

Subsequently, as shown in FIGS. 222 and 223, a resist pattern is formed on protective layer 62. Using the resist pattern as a mask, protective layer 62 is patterned by RIE. Subsequently, the resist pattern is removed. Using protective layer 62 as a hard mask, third semiconductor layer 12-3, third compound semiconductor layer 61-3, second semiconductor layer 12-2, second compound semiconductor layer 61-2, first semiconductor layer 12-1, and first compound semiconductor layer 61-1 are etched by RIE in order.

As a result, device isolating trenches for isolating N+/P+-type diffusion layers are formed.

An insulating layer (for example, oxide silicon layer) is formed in each of the device isolating trenches, and this is adopted as element isolation insulating layer 16.

Figure 224:
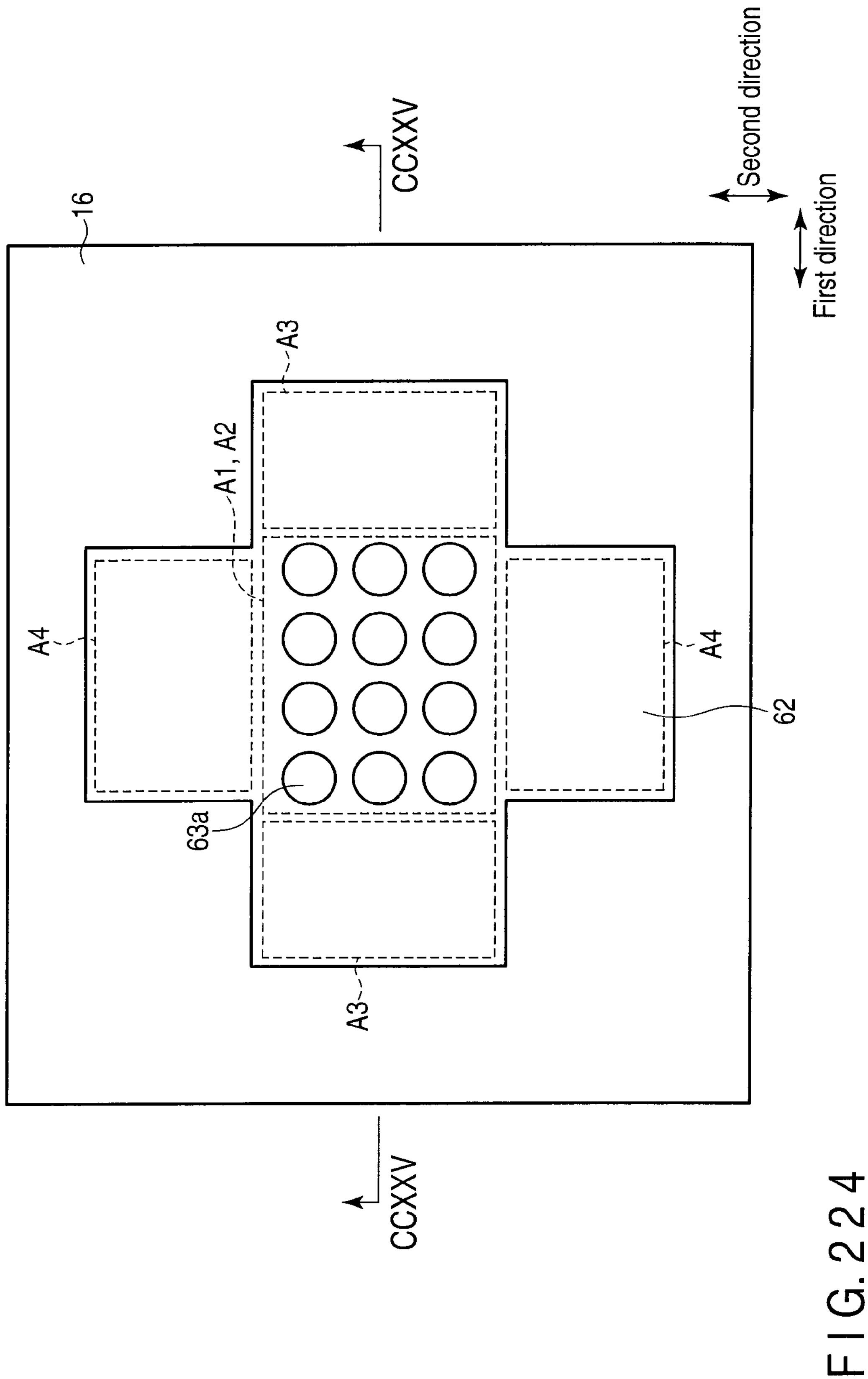
Figure 225:
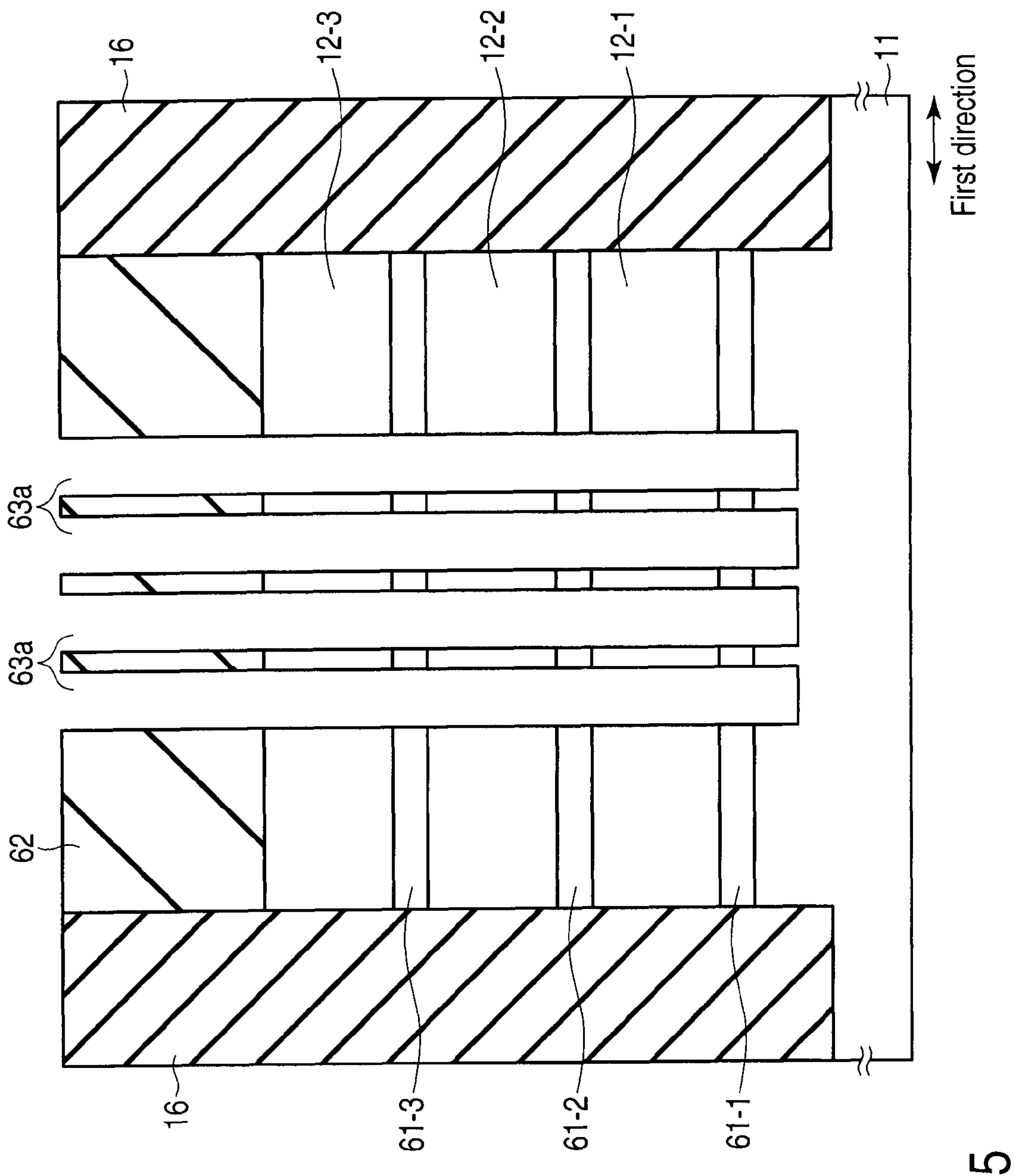

Subsequently, as shown in FIGS. 224 and 225, trenches 63*a* are formed in an array form. The trenches 63*a* are used to form control gates and select gates of MaCS.

Trenches 63*a* are formed in memory cell array/select transistor areas A1, A2. In this case, areas A3 and A4 are hook up areas. For example, N+-type diffusion layer is arranged in hook up areas A3, and P+-type diffusion layer is arranged in hook up area A4.

Trenches 63*a* pass through first to third semiconductor layers 12-1, 12-2, 12-3, and the bottom surfaces of trenches 63*a* reach semiconductor substrate 11.

In order to form trench 63*a*, the stacked layer structure including Si and SiGe is etched. These Si and SiGe can be etched using the same etching gas. Therefore, the accuracy in processing the trenches can be improved as compared with the second example in which the etching processes of Si and $SiO_2$ are repeated, for example.

Figure 226:
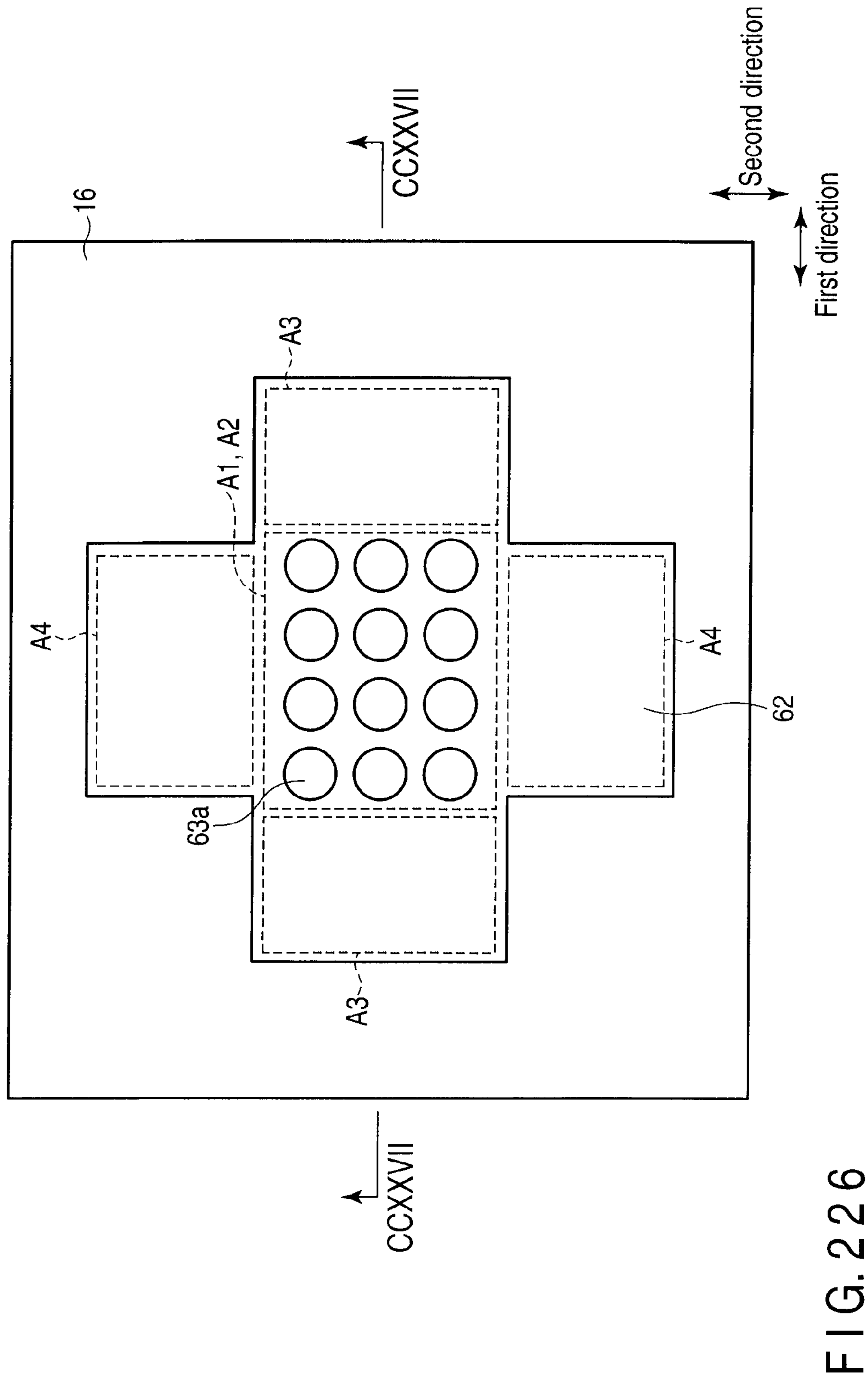
Figure 227:
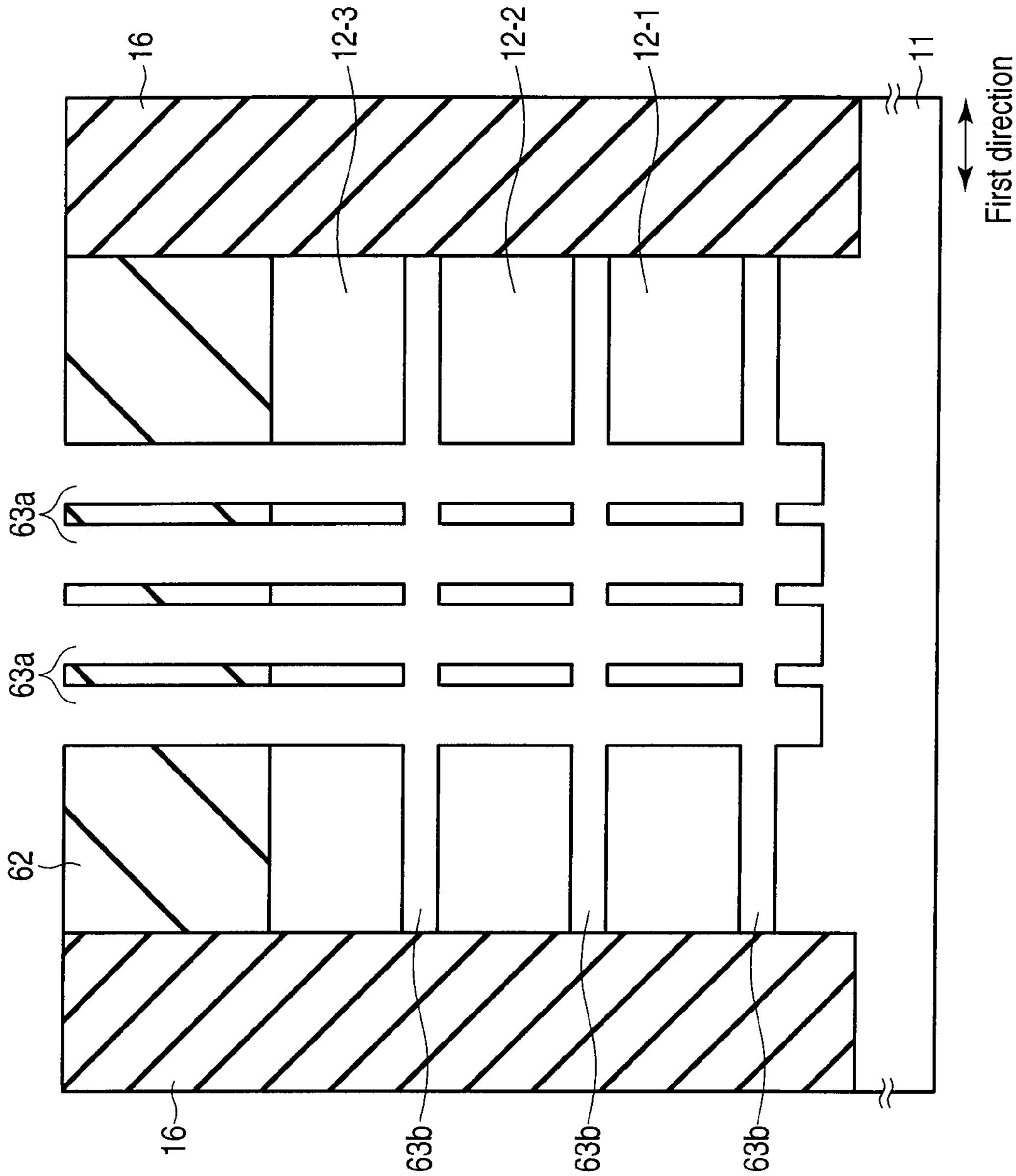

Subsequently, as shown in FIGS. 226 and 227, first to third compound semiconductor layers 61-1, 61-2, 61-3 are selectively removed.

For example, first to third compound semiconductor layers 61-1, 61-2, 61-3 can be removed by wet etching. More specifically, a mixed solution of hydrofluoric acid and nitric acid is provided to first to third compound semiconductor layers 61-1, 61-2, 61-3 via trenches 63*a*, so that first to third compound semiconductor layers 61-1, 61-2, 61-3 are removed.

On the other hand, for example, first to third compound semiconductor layers 61-1, 61-2, 61-3 can be removed by isotropic etching. More specifically, HCl gas is provided to first to third compound semiconductor layers 61-1, 61-2, 61-3 via trenches 63*a*, so that first to third compound semiconductor layers 61-1, 61-2, 61-3 are removed.

As a result, cavities (air gaps) 63*b* are formed between first to third semiconductor layers 12-1, 12-2, 12-3.

One of the following two examples can be selectively employed as the subsequent process.

A. Example of Filling Cavities with Oxide Layers

First, as shown in FIGS. 228 and 229, oxide layers 64*a* are formed by thermal oxidation to fill cavities 63*b* of FIG. 227. It should be noted, however, oxide layers 64*a* do not fill trenches 63*a*.

Now, a condition for allowing oxide layers 64*a* to fill cavities 63*b* but not to fill trenches 63*a* will be considered.

Figure 230:
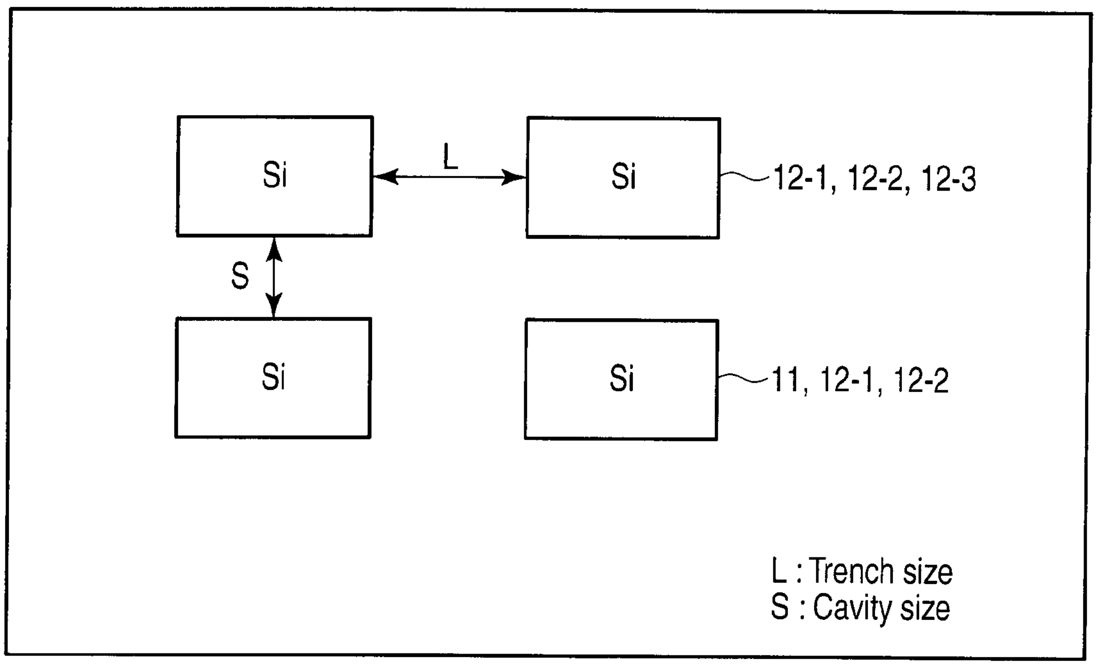

For example, as shown in FIG. 230, it is assumed that semiconductor substrate 11 and first to third semiconductor layers 12-1, 12-2, 12-3 are Si, the trench size is denoted with L, and the cavity size is denoted with S. The trench size L is the diameter of the trench when the planar shape of the trench is a circle. The cavity size S is equivalent to the thickness of first to third compound semiconductor layers 61-1, 61-2, 61-3 of FIG. 225.

It is assumed that when the volume of Si serving as a source of $SiO_2$ is 1 before the thermal oxidation, the volume of $SiO_2$ is 1.5 after the thermal oxidation. In other words, the volumetric expansion ratio from Si into $SiO_2$ is 1.5.

At this occasion, cavities 63*b* are filled when the thickness tox of $SiO_2$ becomes S/2. Trenches 63*a* are filled when the thickness tox of $SiO_2$ becomes L/2. Therefore, the thickness tox of $SiO_2$ is required to satisfy $S/2 \leq tox < L/2$.

The conditions of the thermal oxidation (oxygen flow rate, oxidation time, oxidation temperature, and the like) are set so that the thickness tox of $SiO_2$ satisfies $S/2 \leq tox < L/2$.

More specifically, when process margins and the like of the etching process of oxide layer ($SiO_2$) 64*a* in trenches 63*a*, explained later, are taken into consideration, the conditions are preferably set as follows. When S is about 20 nm, L is preferably more than 70 nm.

Figure 231:
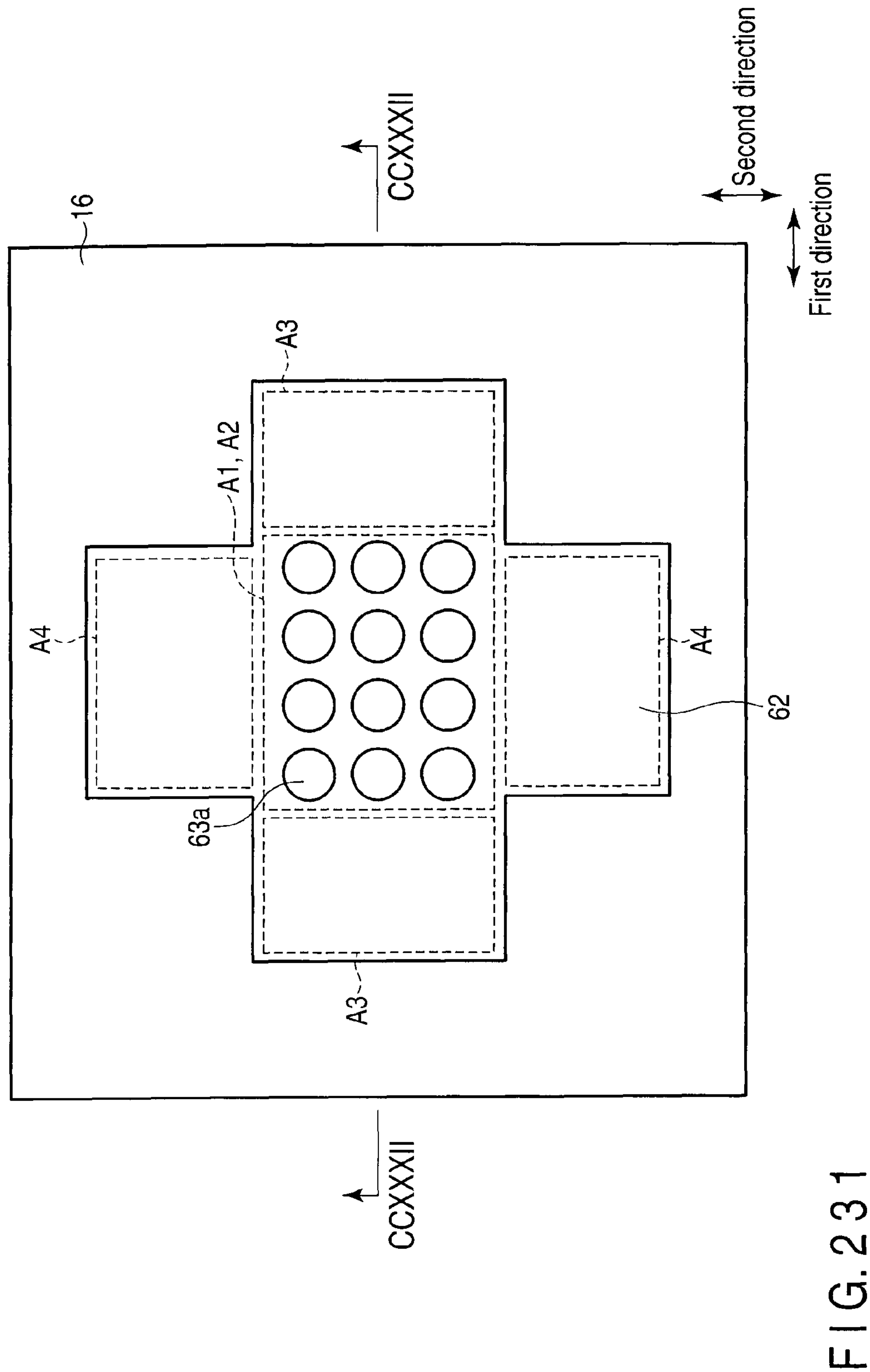
Figure 232:
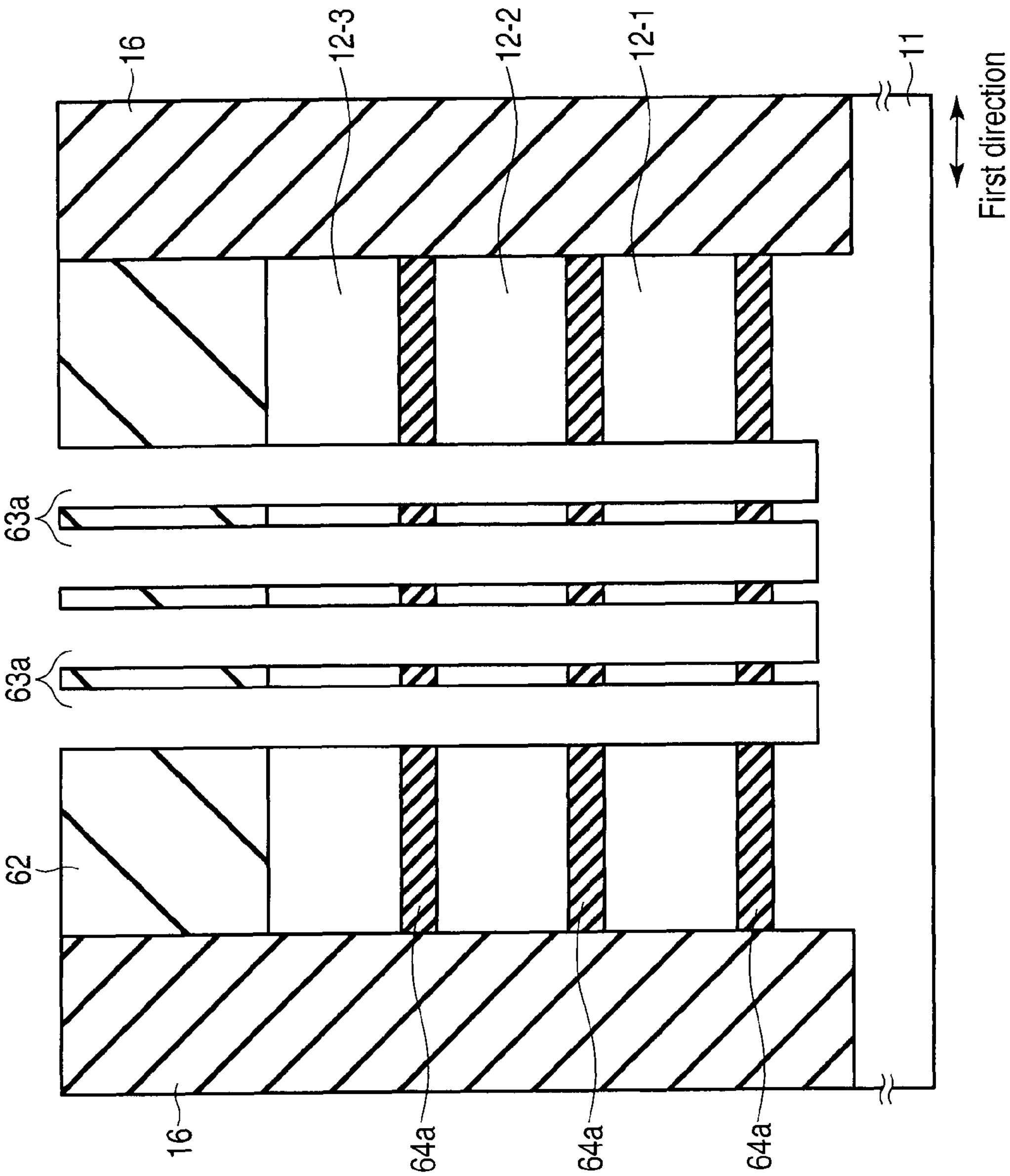

Subsequently, as shown in FIGS. 231 and 232, oxide layers 64*a* in trenches 63*a* are selectively removed by isotropic etching such as wet etching. In this etching process, for example, etching solution needs to enter into the bottom portion of trenches 63*a*. Therefore, as described above, it is important for oxide layers 64*a* not to fill trenches 63*a*.

Figure 233:
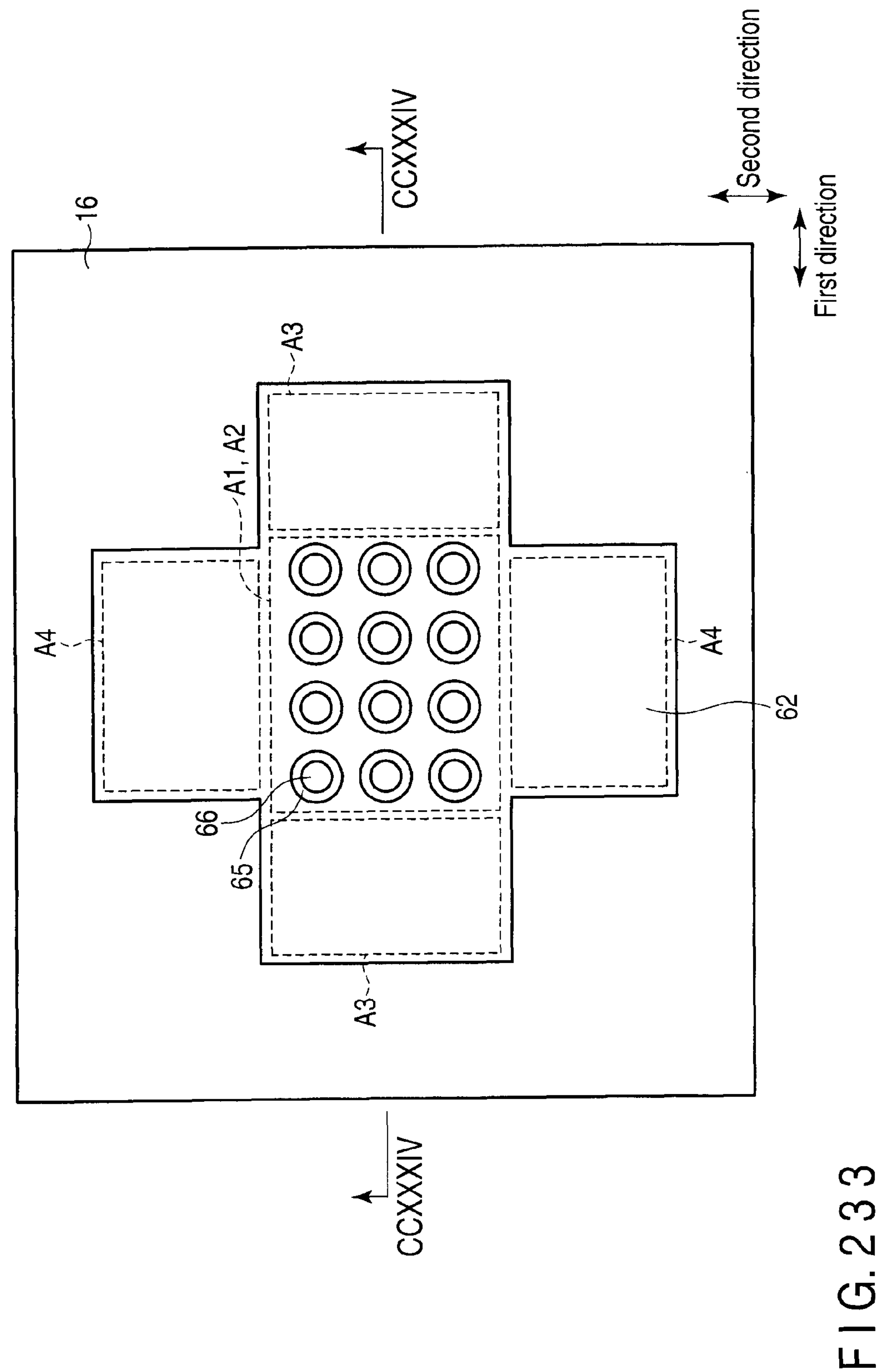
Figure 234:
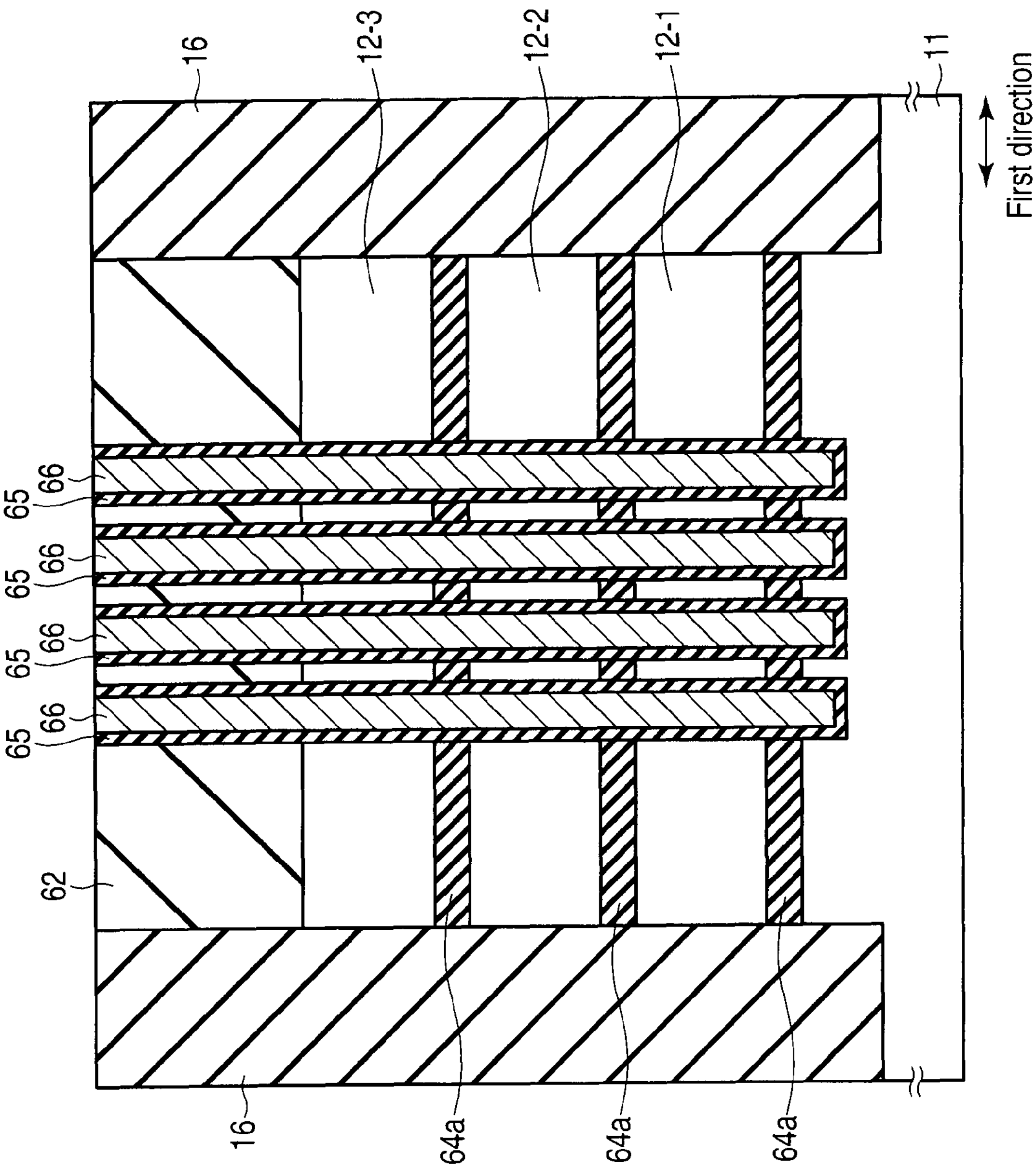

Subsequently, as shown in FIGS. 233 and 234, stacked layer structures 65 are respectively formed on the inner surfaces of trenches 63*a* of FIG. 232. For example, when memory cells as shown in FIGS. 10 and 11 are employed, stacked layer structure 65 includes a gate insulating layer, a data recording layer, and a block insulating layer. For example, when memory cells as shown in FIGS. 12 and 13 are employed, stacked layer structure 65 includes a gate insulating layer, a data recording layer, and an inter-electrode insulating layer.

Stacked layer structure 65 are formed on the inner surfaces of trenches 63*a* without filling trenches 63*a*.

Thereafter, conductive layers (for example, polysilicon layer including impurities and metal layer such as TaN) 66 filling trenches 63*a* are formed. Conductive layers 66 filling trenches 63*a* in memory cell array area A1 are control gates CG. Conductive layers 66 filling trenches 63*a* in select transistor areas A2 are select gates SG.

As a result of the above steps, the memory cell array having first to third single-crystal semiconductor layers 12-1, 12-2, 12-3 as channels is formed.

Figure 236:
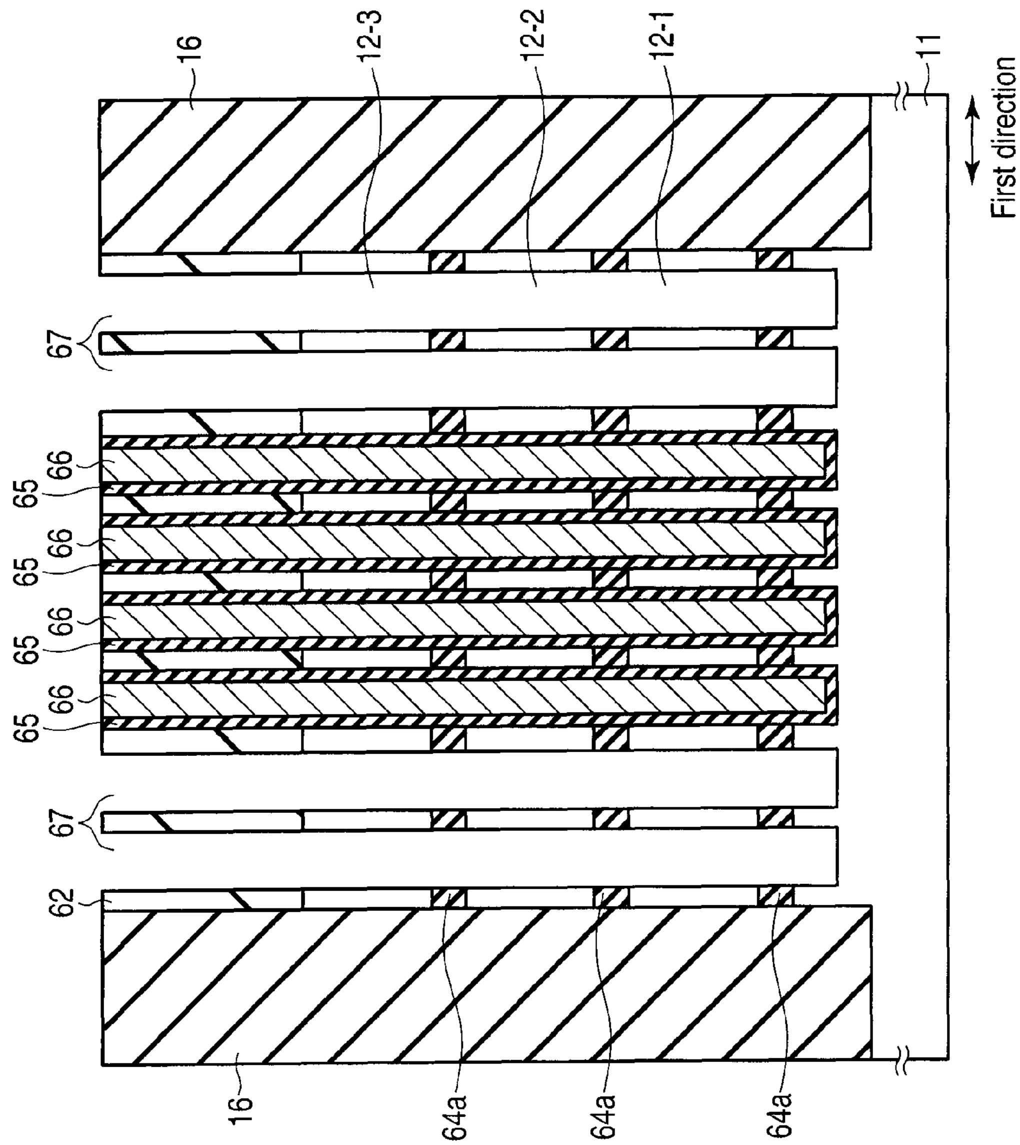

Subsequently, as shown in FIGS. 235 and 236, trenches 67 are formed in hook up areas A3, A4.

Thereafter, for example, the same method as the method for forming the N+/P+-type diffusion layers in the second example (FIGS. 193 to 207) is used to form N+/P+-type diffusion layers in first to third semiconductor layers 12-1, 12-2, 12-3.

On the other hand, for example, the same method as the method for forming the vias in the second example (FIGS. 208 to 220) is used to form the vias that come into contact with N+/P+-type diffusion layers in first to third semiconductor layers 12-1, 12-2, 12-3.

As a result of the above steps, the three-dimensional MaCS is produced.

B. Example for Filling Cavities with Stacked Layer Structure

Figure 237:
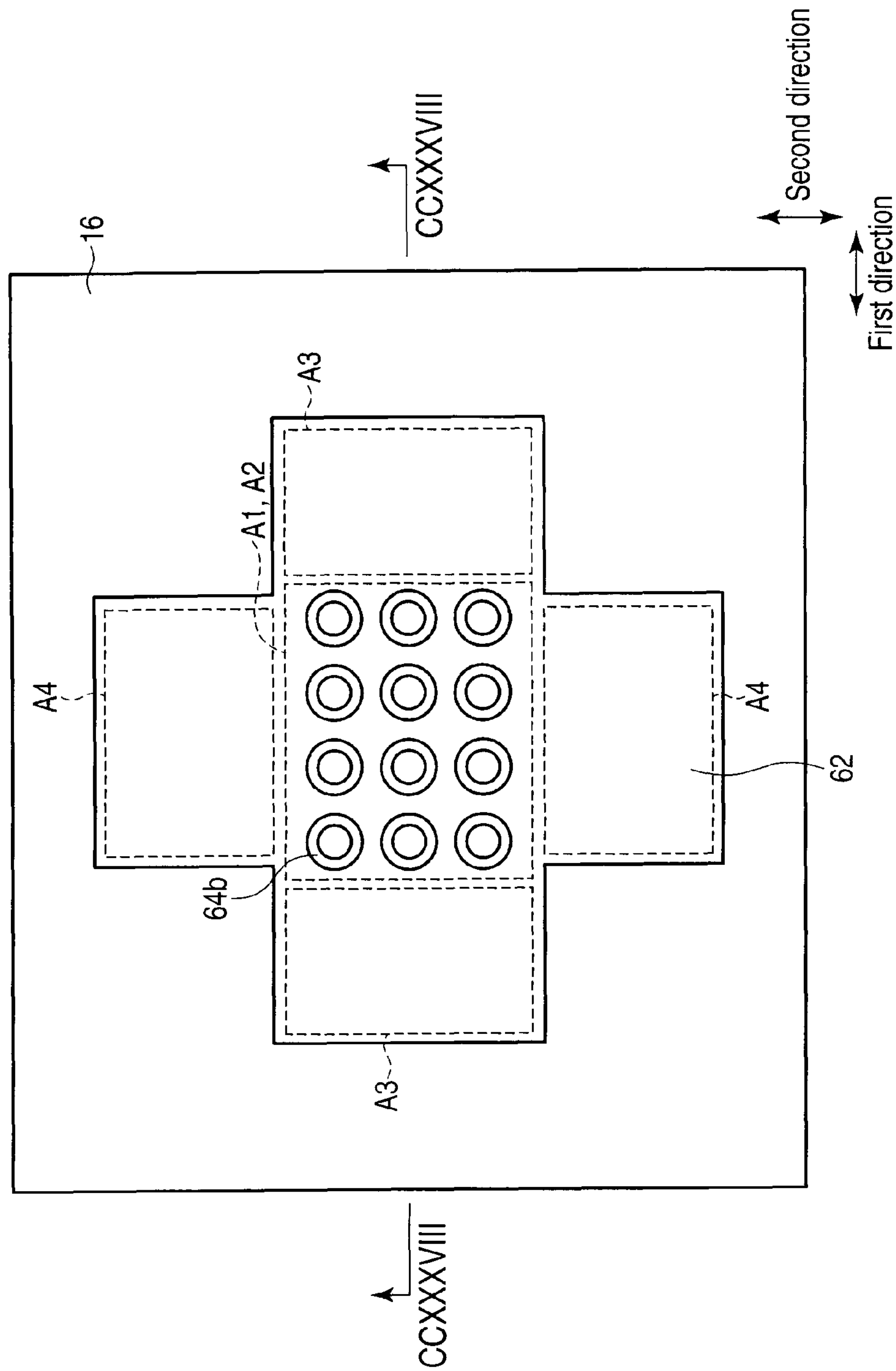

First, as shown in FIGS. 237 and 238, stacked layer structures 64*b* are formed to fill cavities 63*b* of FIG. 227 by thermal oxidation. It should be noted, however, stacked layer structures 64*b* do not fill trenches 63*a*.

A condition for allowing stacked layer structures 64*b* to fill cavities 63*b* but not to fill trenches 63*a* is that, when the trench size is denoted with L and the cavity size is denoted with S as shown in FIG. 230, the thickness tox of stacked layer structure 64*b* satisfies $S/2 \leq tox < L/2$.

For example, when memory cells as shown in FIGS. 10 and 11 are employed, stacked layer structure 64*b* includes a gate insulating layer, a data recording layer, and a block insulating layer. For example, when memory cells as shown in FIGS. 12 and 13 are employed, stacked layer structure 64*b* includes a gate insulating layer, a data recording layer, and an inter-electrode insulating layer.

For example, the trench size is set at about 70 nm, the cavity size S is set at about 20 nm, the thickness of the gate insulating layer is set at about 7 nm, the thickness of the data recording layer is set at about 3 nm, and the thickness of the block insulating layer or the inter-electrode insulating layer is set at 12 nm. In this case, cavities 63*b* are filled with stacked layer structure 64*b*. However, trenches 63*a* are not filled with stacked layer structure 64*b*.

Figure 239:
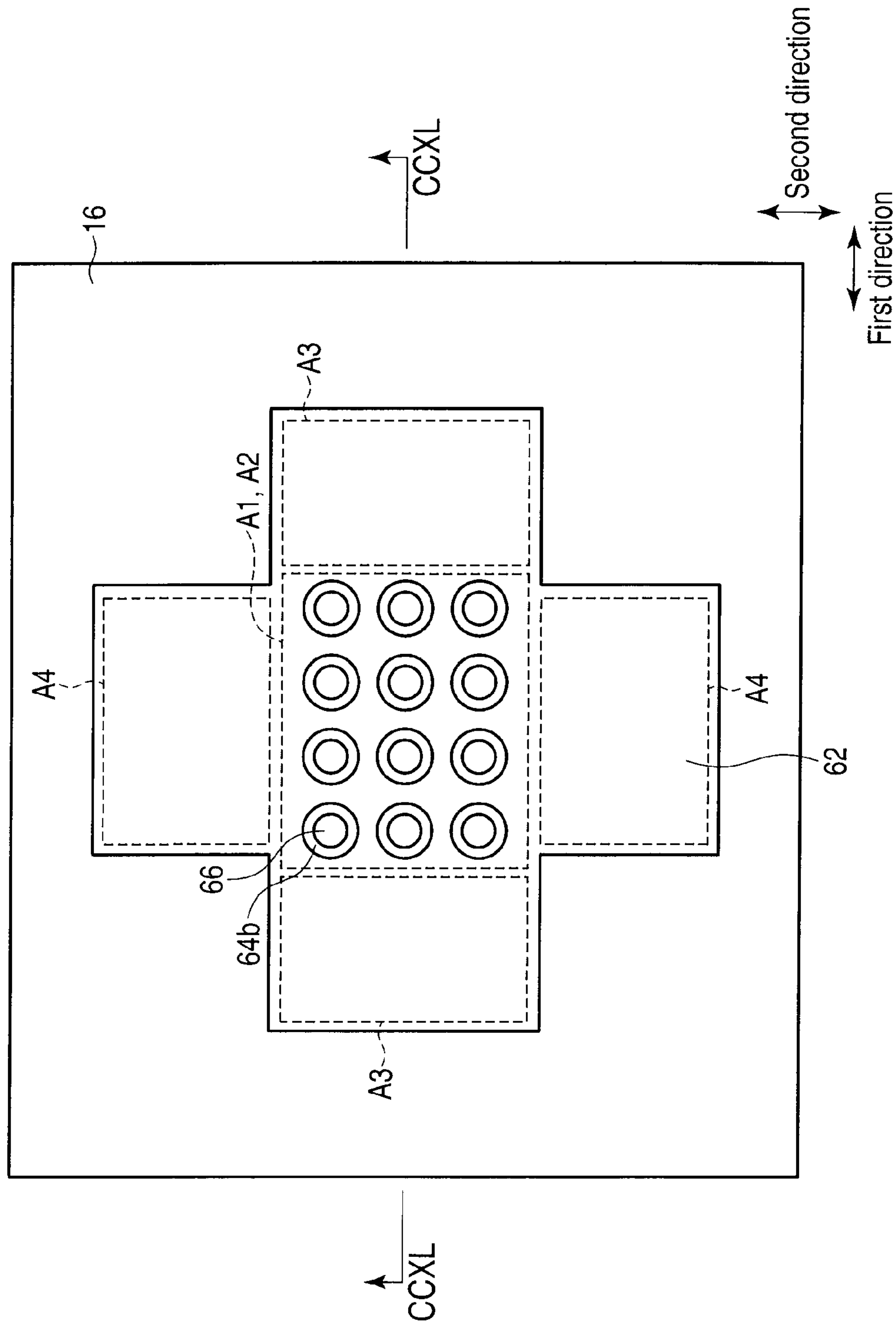
Figure 240:
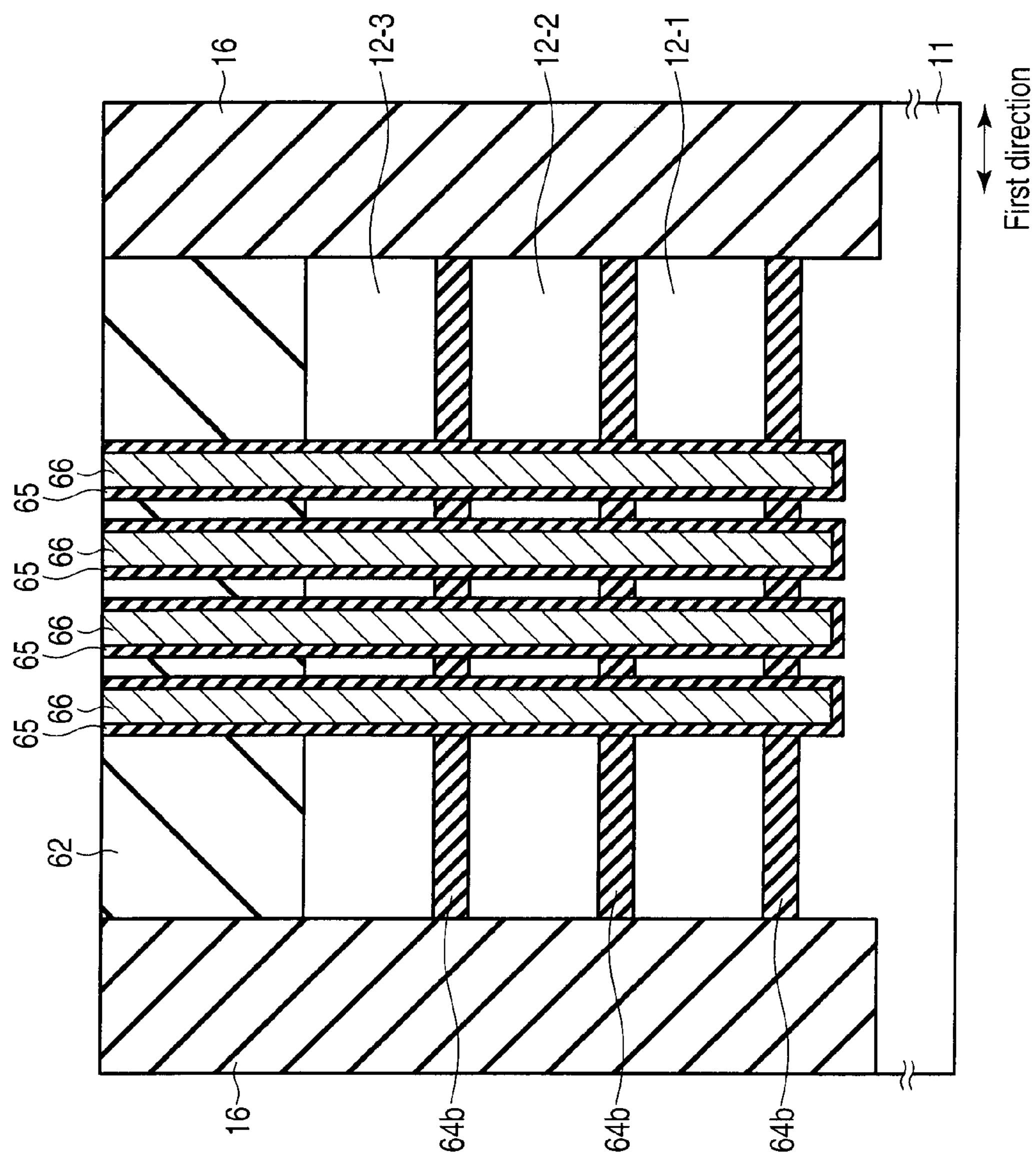

Subsequently, as shown in FIGS. 239 and 240, conductive layers (for example, polysilicon layer including impurities and metal layer such as TaN) 66 filling trenches 63*a* of FIG. 238 are formed. Conductive layers 66 filling trenches 63*a* in memory cell array area A1 are control gates CG. Conductive layers 66 filling trenches 63*a* in select transistor areas A2 are select gates SG.

As a result of the above steps, the memory cell array having first to third single-crystal semiconductor layers 12-1, 12-2, 12-3 as channels is formed.

Figure 241:
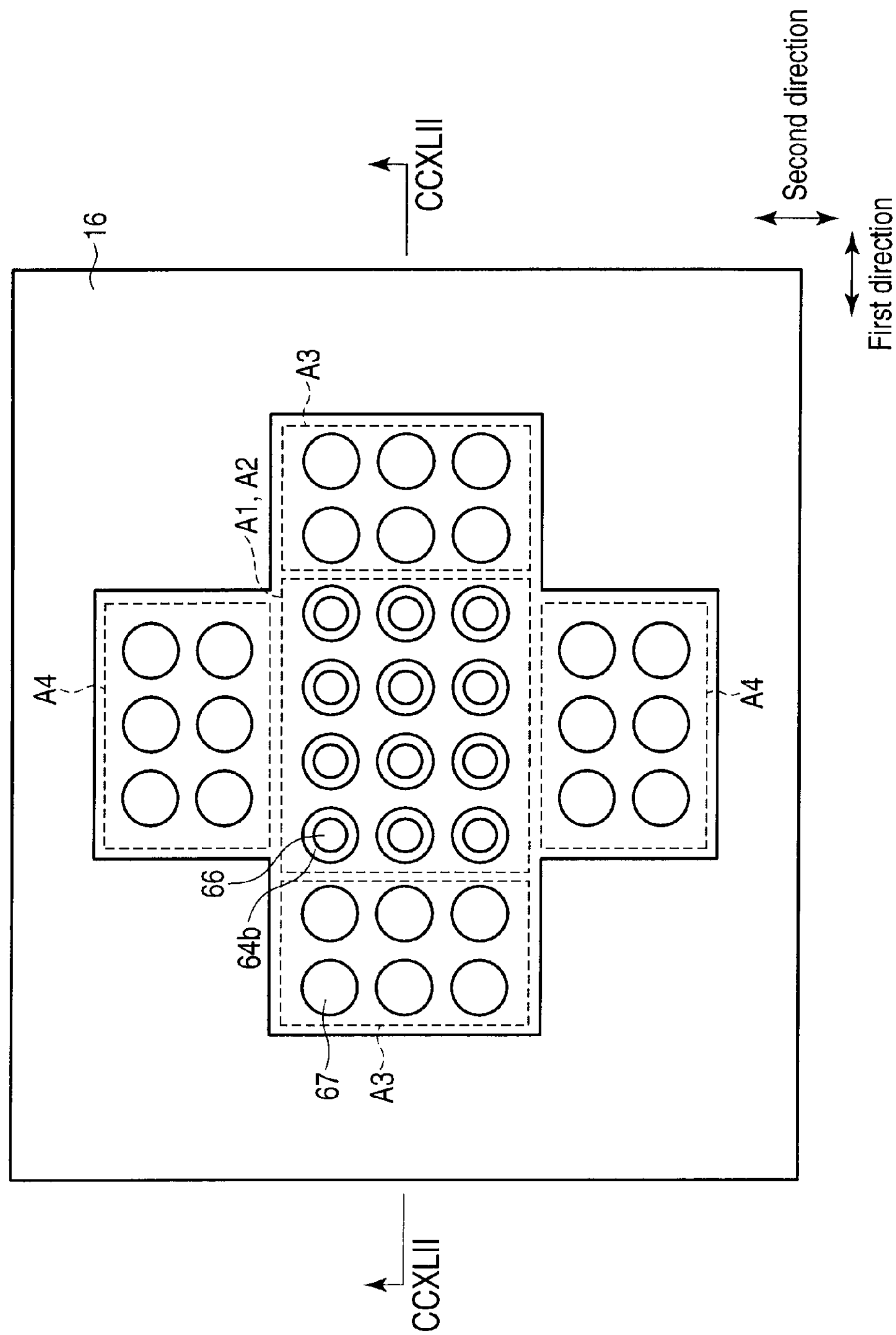
Figure 242:
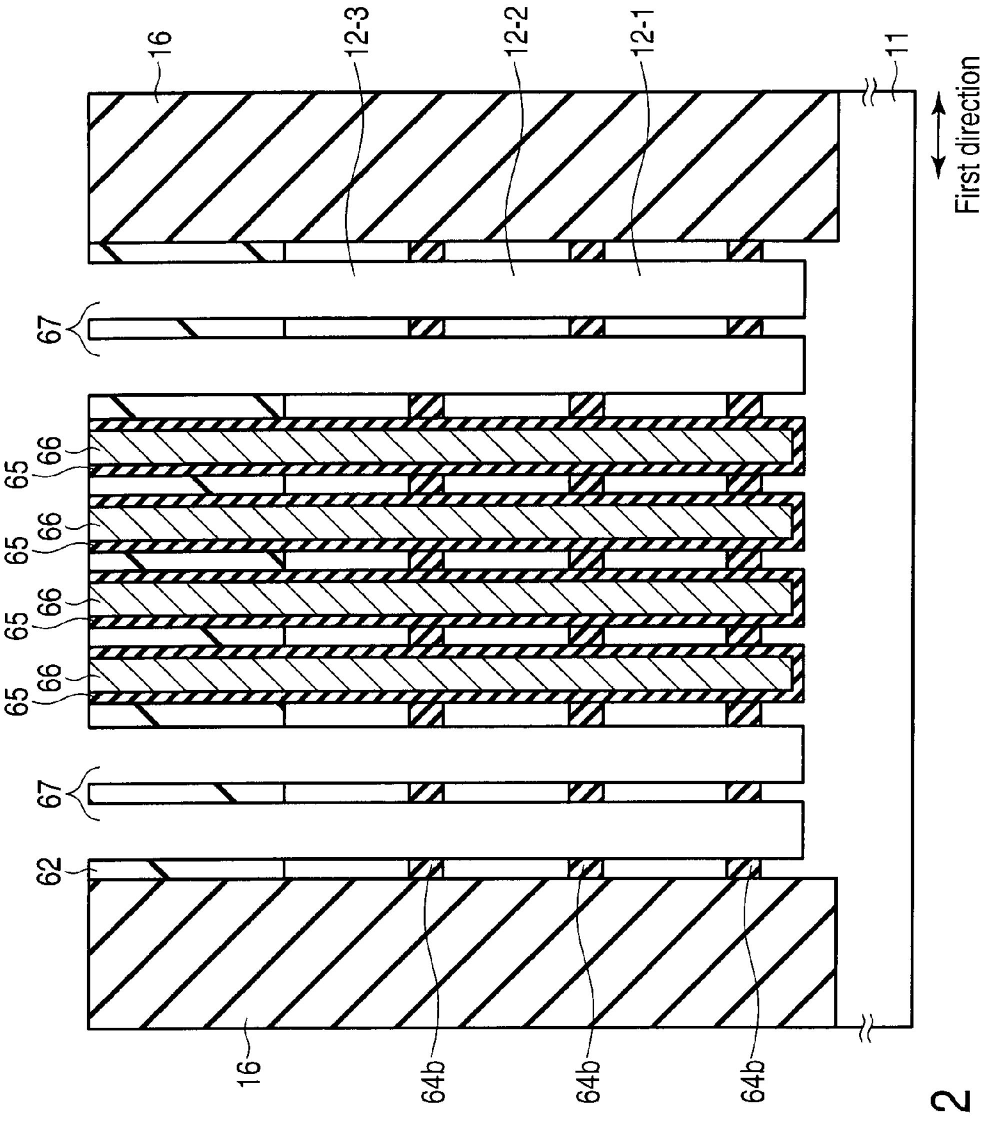

Subsequently, as shown in FIGS. 241 and 242, trenches 67 are formed in hook up areas A3, A4.

Thereafter, for example, the same method as the method for forming the N+/P+-type diffusion layers in the second example (FIGS. 193 to 207) is used to form N+/P+-type diffusion layers in first to third semiconductor layers 12-1, 12-2, 12-3.

On the other hand, for example, the same method as the method for forming the vias in the second example (FIGS. 208 to 220) is used to form the vias that come into contact with N+/P+-type diffusion layers in first to third semiconductor layers 12-1, 12-2, 12-3.

As a result of the above steps, the three-dimensional MaCS is produced.

In the example in which the cavities are filled with the stacked layer structures, there is no process for removing oxide layers 64*a* from trenches 63*a*, which exits in the example in which the cavities are filled with the oxide layers (FIGS. 231 and 232). This is because the cavities 63*b* are filled with stacked layer structures 64*b* comprising the memory cells. Therefore, the example in which the cavities are filled with the stacked layer structures is effective for reducing the production cost resulted from the reduction of the number of processes.

(4) Fourth Example

FIGS. 243 to 269 illustrate the fourth example of method for producing a three-dimensional MaCS.

In the fourth example, a production method is suggested to achieve hook up areas made in a bent structure as shown in FIGS. 157 and 158.

Figure 243:
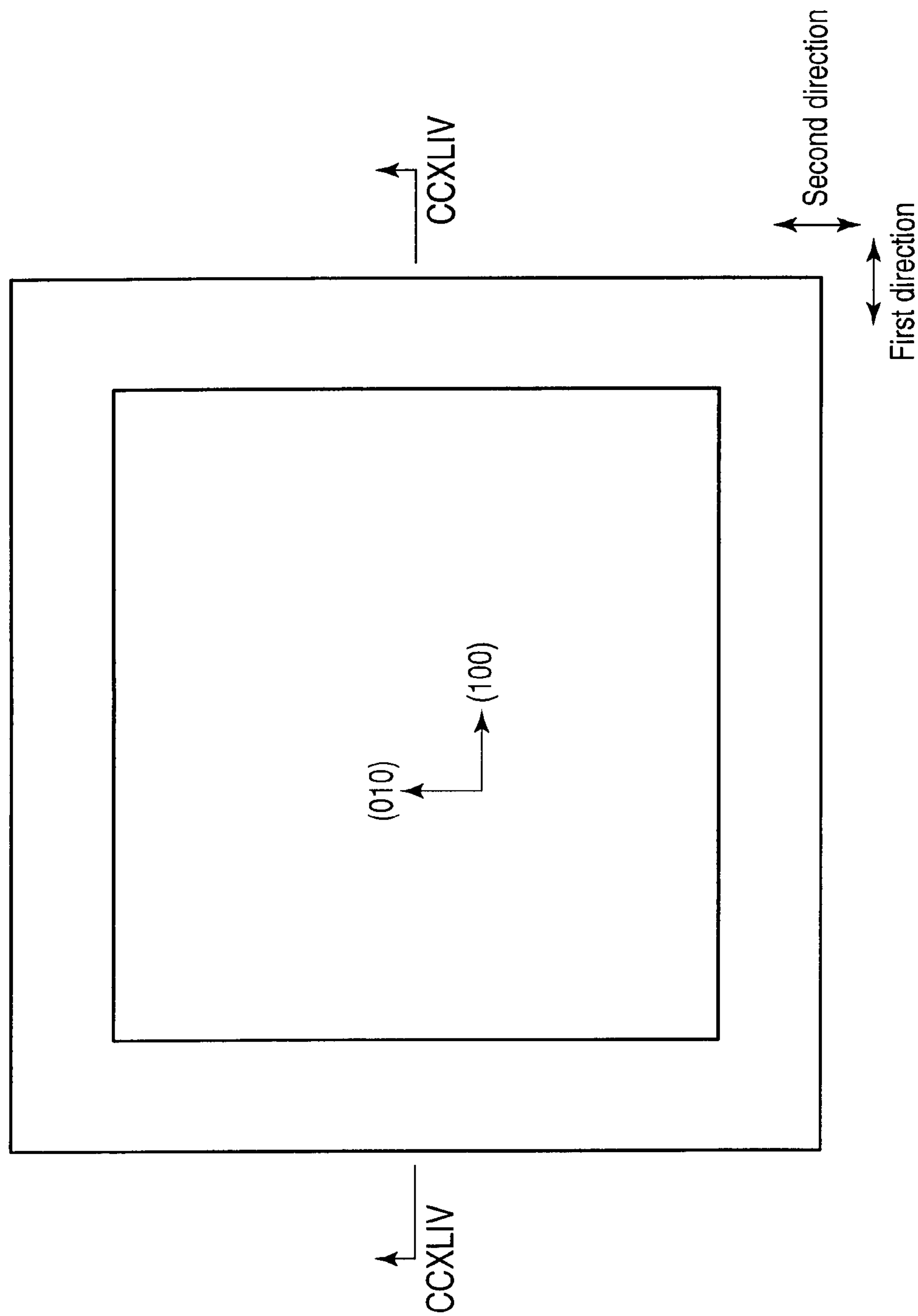
Figure 244:
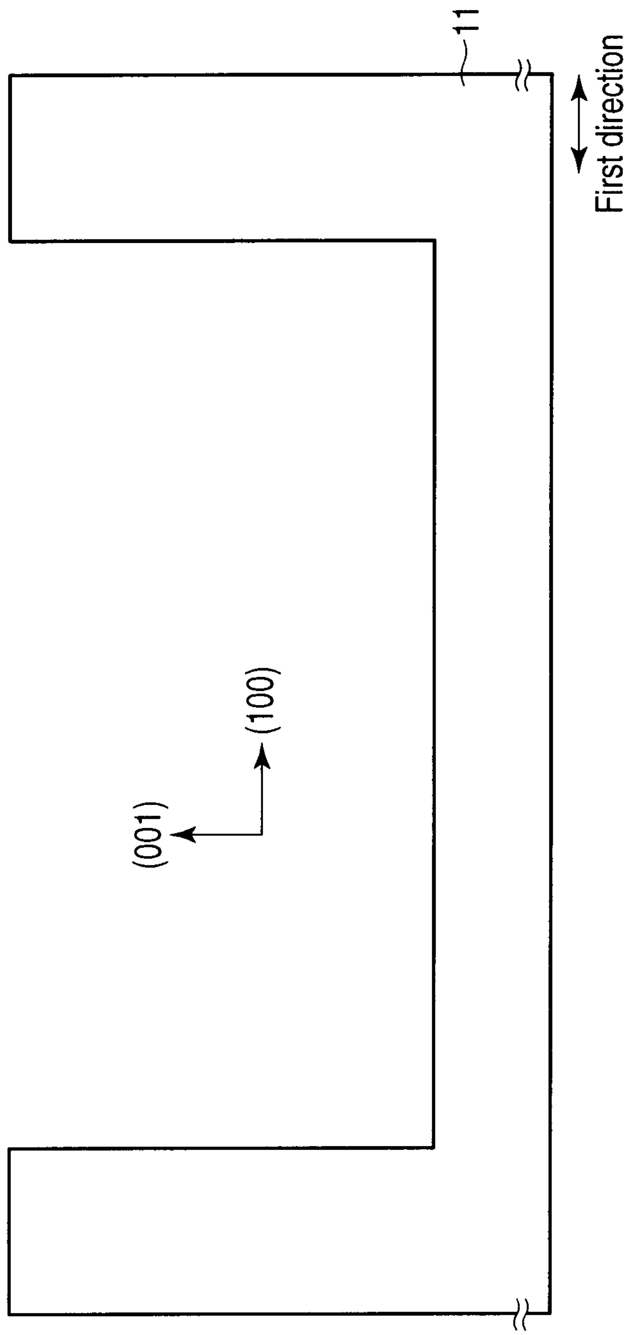

First, as shown in FIGS. 243 and 244, a recessed portion whose planar shape is a rectangle is formed in semiconductor substrate (for example, 45 degrees-notch Si wafer) 11 by vertical recess processing. In FIGS. 243 and 244, (010), (100), and (001) denote crystal orientations of Si.

Figure 245:
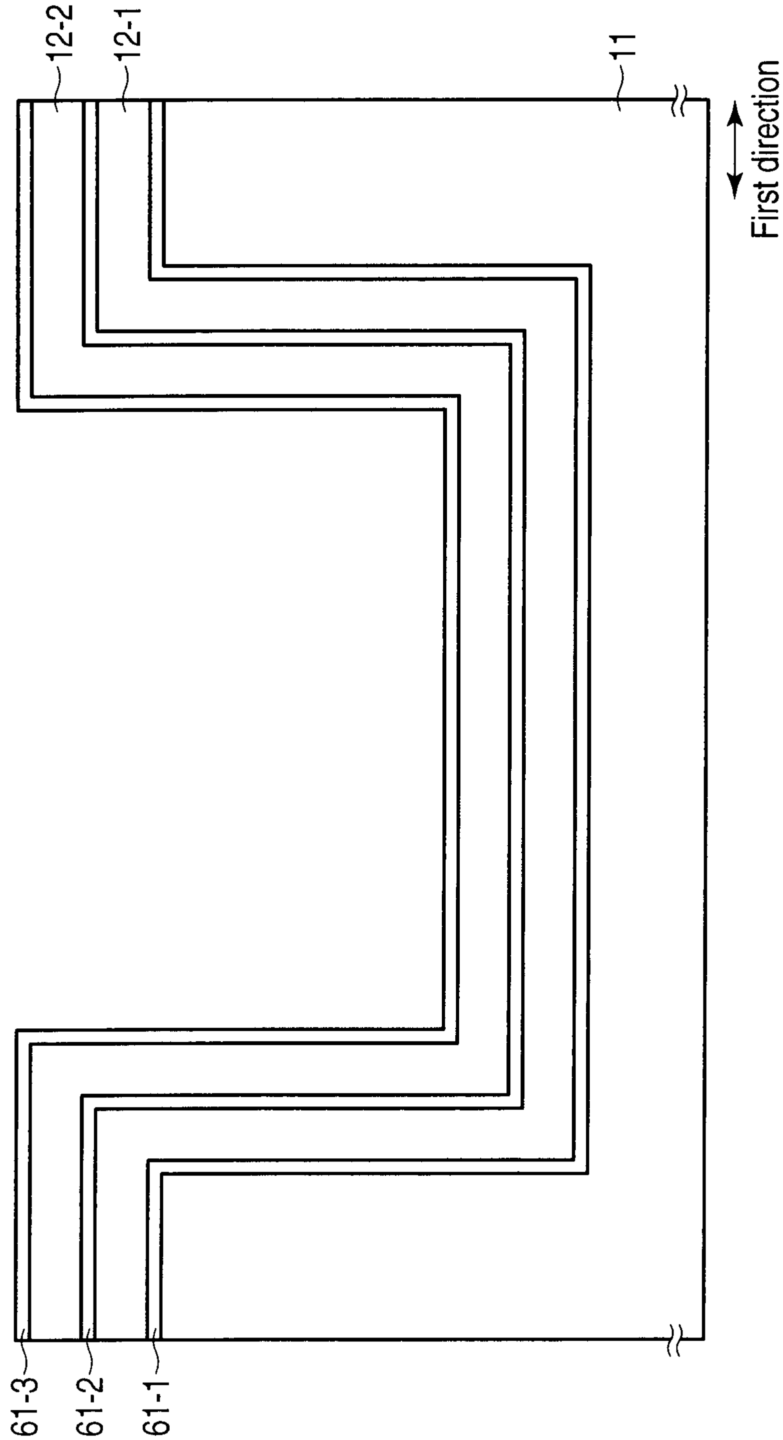
Figure 246:
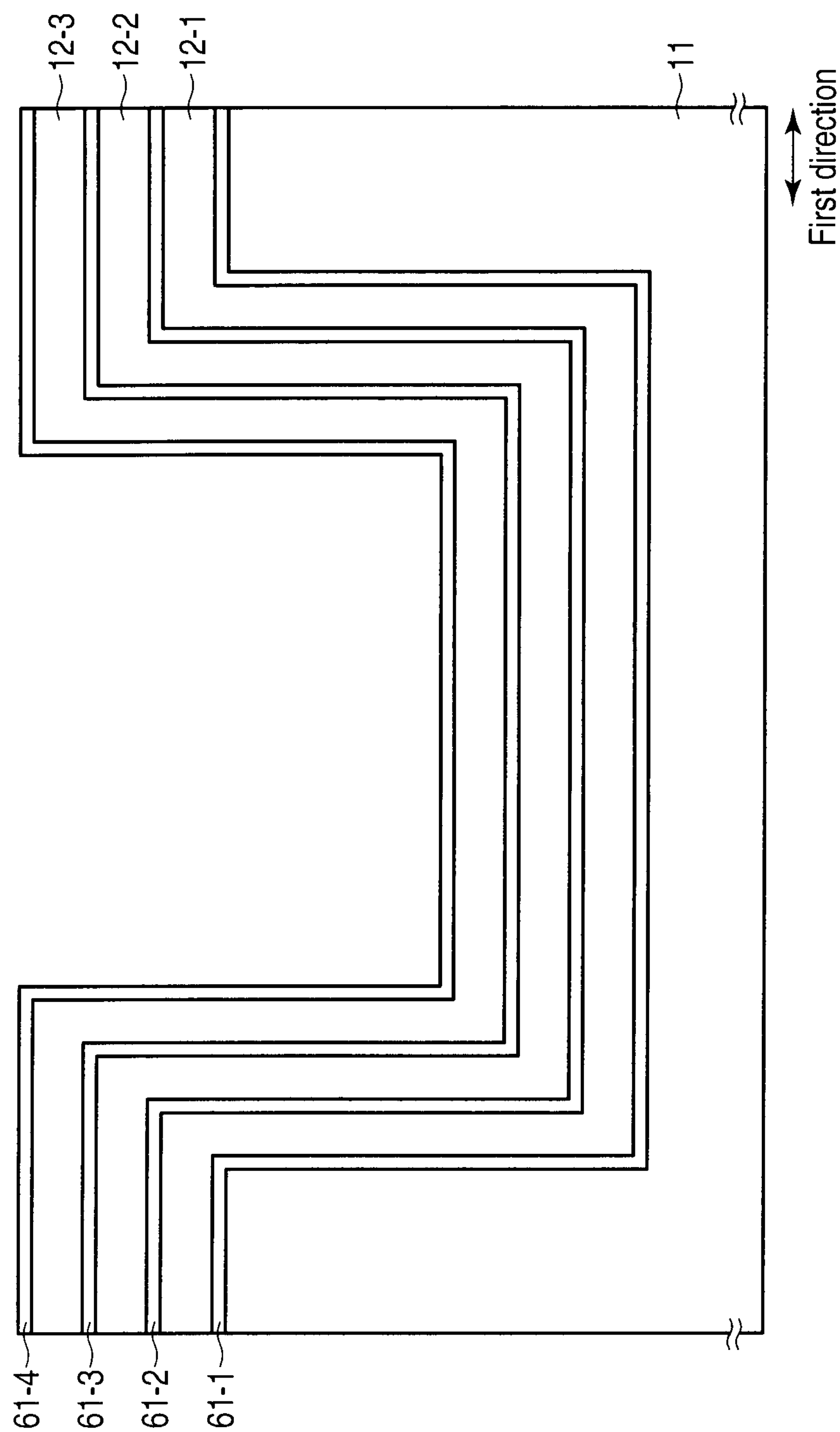

Subsequently, as shown in FIGS. 245 and 246, first compound semiconductor layer (for example, SiGe layer) 61-1 is formed on semiconductor substrate 11 by CVD in a chamber, for example. Subsequently, a deposition gas is switched in the chamber, and first single-crystal semiconductor layer 12-1 is formed on first compound semiconductor layer 61-1 by epitaxial growth.

The above operation is repeatedly executed to form a stacked layer structure on semiconductor substrate 11. The stacked layer structure includes first to fourth compound semiconductor layers 61-1, 61-2, 61-3, 61-4 and first to third single-crystal semiconductor layers 12-1, 12-2, 12-3.

When first to third semiconductor layers 12-1, 12-2, 12-3 are silicon single crystal (Si) layers at this occasion, first to fourth compound semiconductor layers 61-1, 61-2, 61-3, 61-4 are preferably SiGe layers. On the other hand, the concentration of Ge in the SiGe layer is preferably 30% or more.

The thickness of each of first to third semiconductor layers 12-1, 12-2, 12-3 is, for example, about 50 nm. The thickness of each of first to fourth compound semiconductor layers 61-1, 61-2, 61-3, 61-4 is, for example, about 10 nm.

Figure 247:
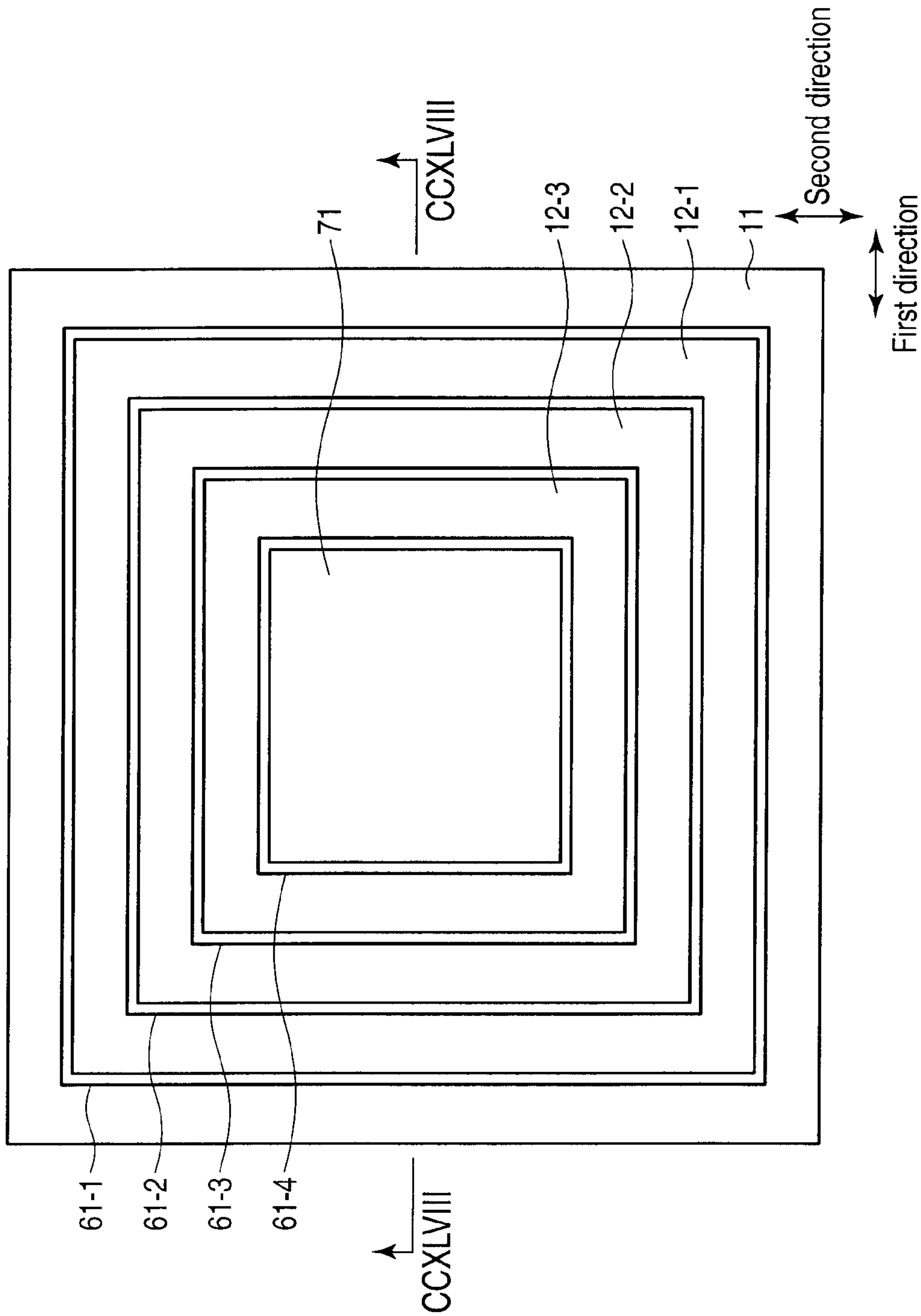
Figure 248:
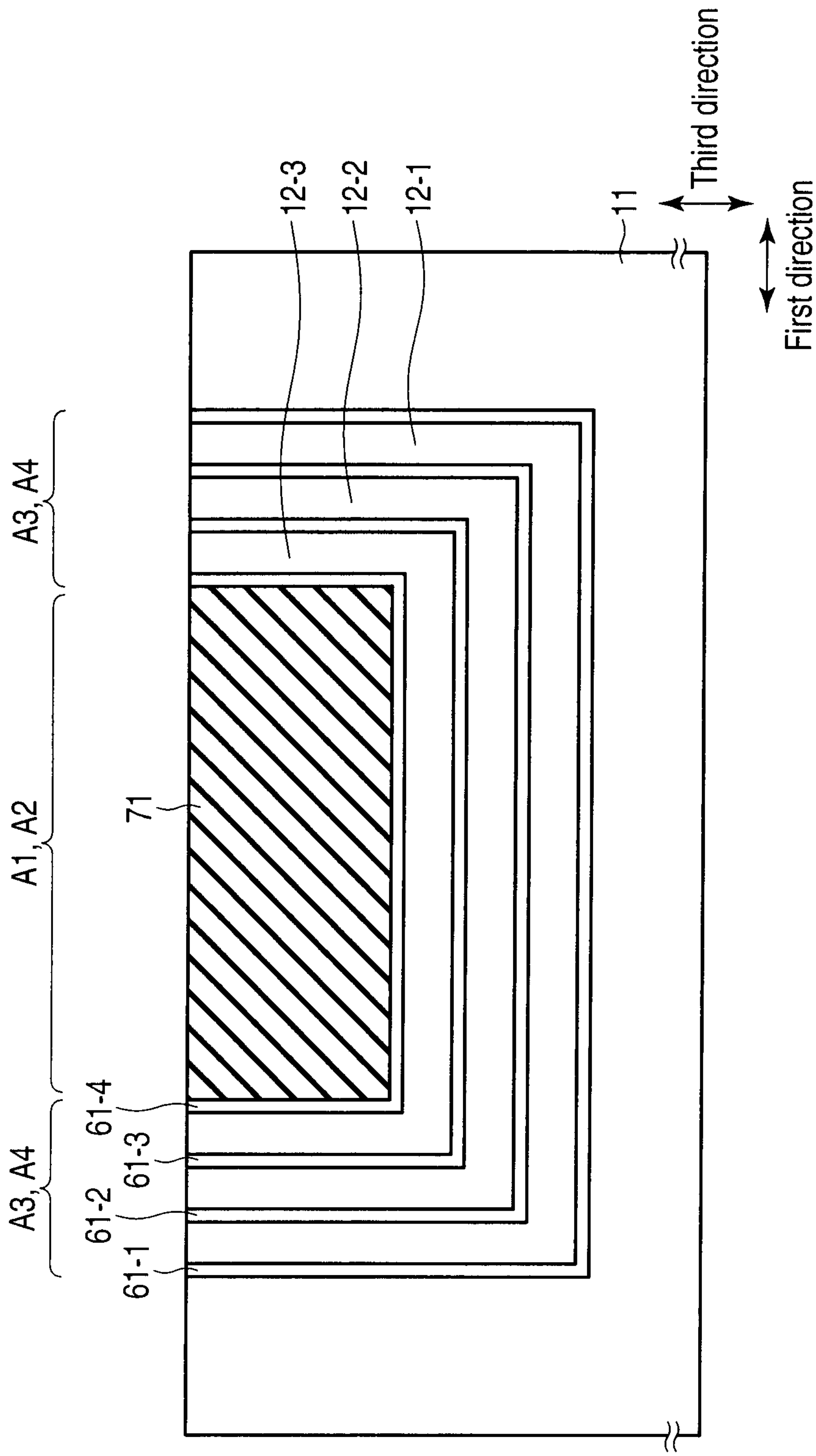

Subsequently, as shown in FIGS. 247 and 248, insulating layer (for example, $SiO_2$) 71 completely filling the recessed portion on fourth compound semiconductor layer 61-4 serving as the uppermost layer is formed by CVD, for example.

Further, for example, etch-back process is executed by CMP (chemical mechanical etching), thus removing first to third semiconductor layers 12-1, 12-2, 12-3, first to fourth compound semiconductor layers 61-1, 61-2, 61-3, 61-4, and insulating layer 71, which are outside of recessed portion of semiconductor substrate 11.

As a result of the above steps, first to third semiconductor layers 12-1, 12-2, 12-3 made in the bent structure is made in the recessed portion of semiconductor substrate 11. The bent structure is such that first to third semiconductor layers 12-1, 12-2, 12-3 extend in the first and second directions in memory cell array/select transistor areas A1, A2 and extend in the third direction in hook up areas A3, A4.

Figure 249:
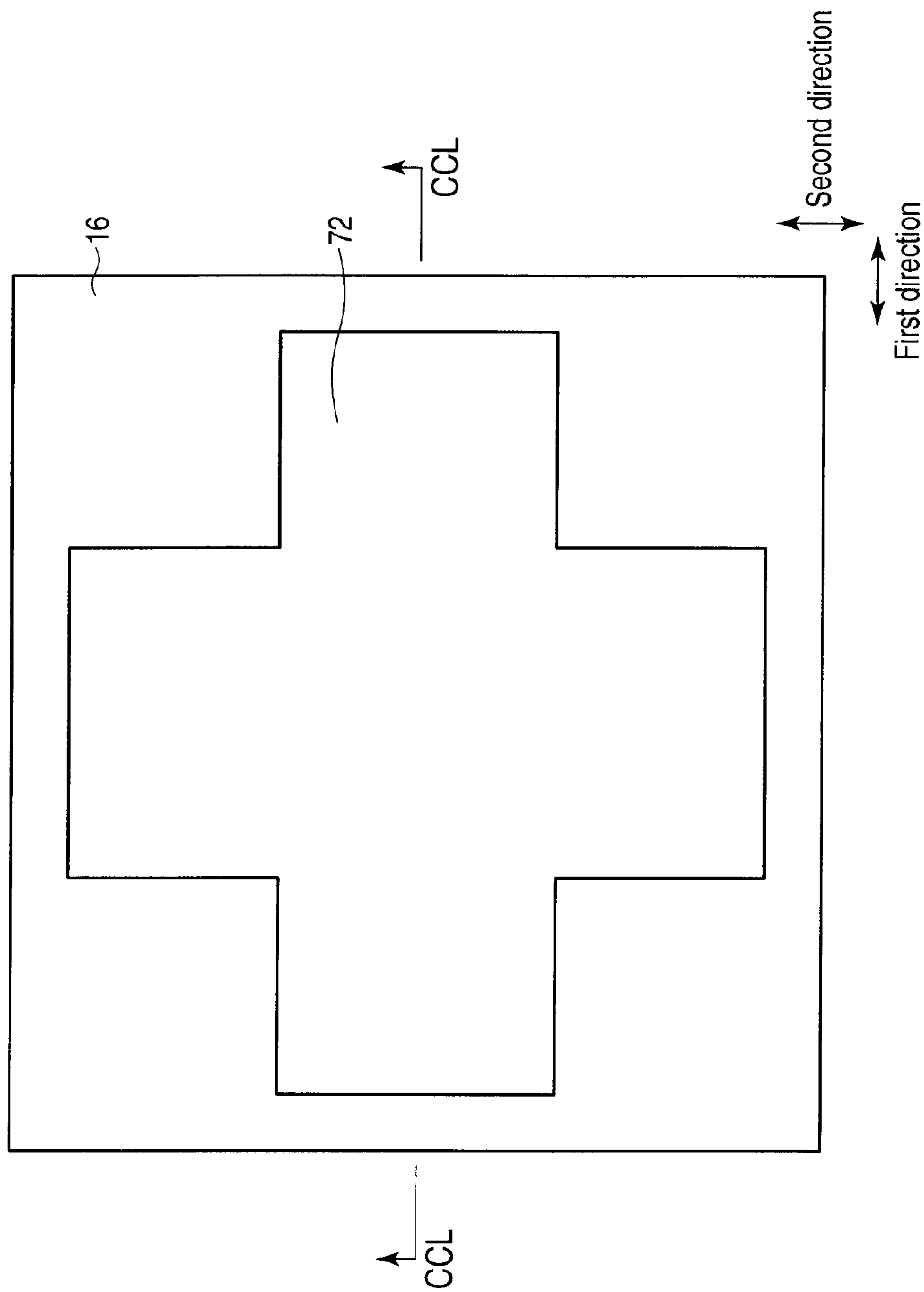
Figure 250:
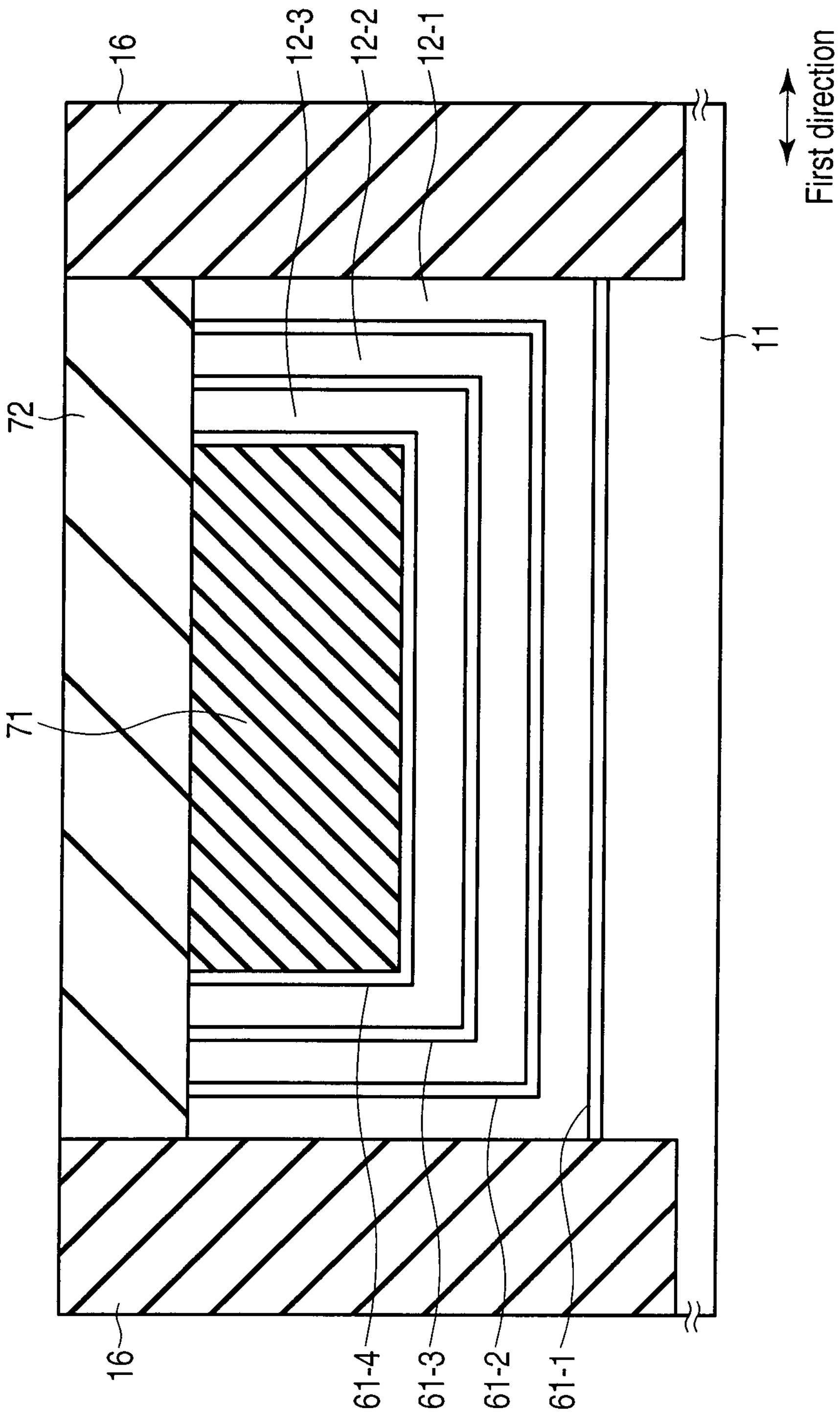

Subsequently, as shown in FIGS. 249 and 250, protective layer (for example, SiN layer) 72 is formed on insulating layer 71 and first to third semiconductor layers 12-1, 12-2, 12-3 made in the bent structure.

Then, a resist pattern is formed on protective layer 72. Using the resist pattern as a mask, protective layer 72 is patterned by RIE. Subsequently, the resist pattern is removed. Using protective layer 72 as a hard mask, fourth compound semiconductor layer 61-4, third semiconductor layer 12-3, third compound semiconductor layer 61-3, second semiconductor layer 12-2, second compound semiconductor layer 61-2, first semiconductor layer 12-1, and first compound semiconductor layer 61-1 are etched by RIE in order.

As a result, device isolating trenches for isolating N+/P+-type diffusion layers are formed.

An insulating layer (for example, oxide silicon layer) is formed in each of the device isolating trenches, and this is adopted as element isolation insulating layer 16.

Figure 251:
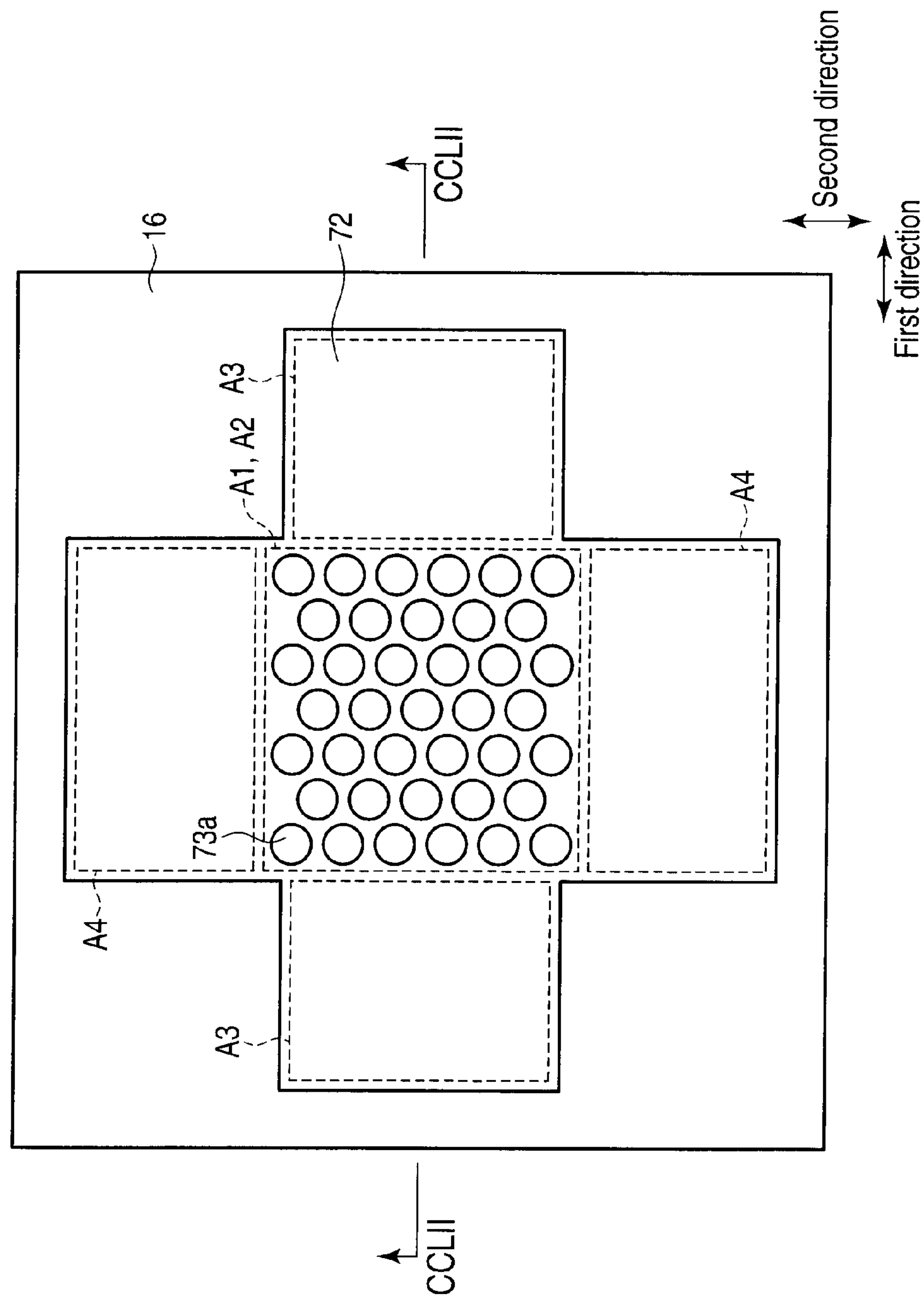
Figure 252:
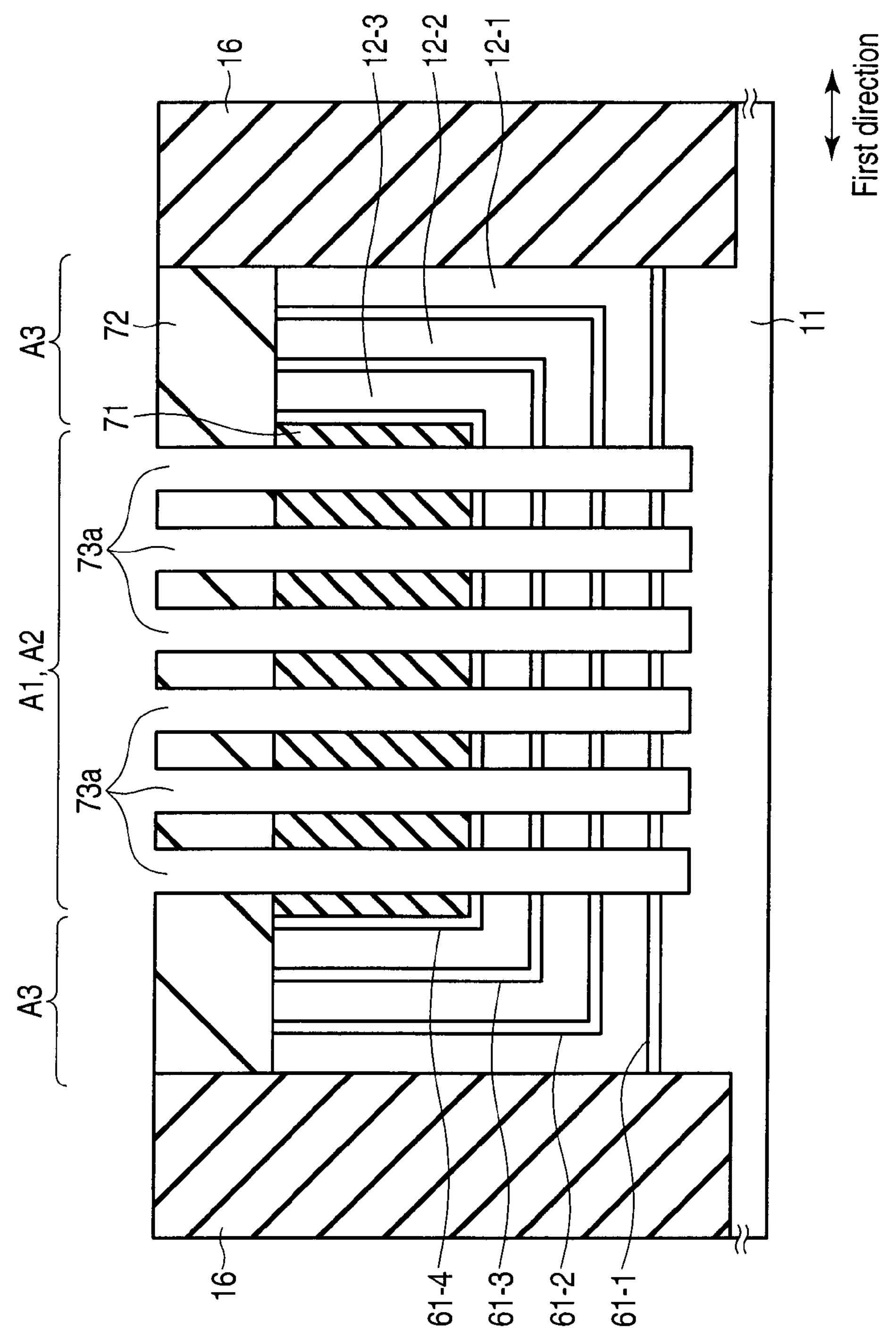

Subsequently, as shown in FIGS. 251 and 252, trenches 73*a* are formed in an array form. The trenches 73*a* are used to form control gates and select gates of MaCS.

Trenches 73*a* are respectively formed in memory cell array/select transistor areas A1, a2. In this case, areas A3 and A4 are hook up areas. For example, N+-type diffusion layer is arranged in hook up areas A3, and P+-type diffusion layer is arranged in hook up area A4.

Trenches 73*a* pass through first to third semiconductor layers 12-1, 12-2, 12-3, and the bottom surfaces of trenches 73*a* reach semiconductor substrate 11.

In order to form trench 73*a*, the stacked layer structure including Si and SiGe is etched. These Si and SiGe can be etched using the same etching gas. Therefore, the accuracy in processing the trenches can be improved as compared with the second example in which the etching processes of Si and $SiO_2$ are repeated, for example.

Subsequently, as shown in FIG. 253, first to fourth compound semiconductor layers 61-1, 61-2, 61-3, 61-4 are selectively removed.

For example, first to fourth compound semiconductor layers 61-1, 61-2, 61-3, 61-4 can be removed by wet etching. More specifically, a mixed solution of hydrofluoric acid and nitric acid is provided to first to fourth compound semiconductor layers 61-1, 61-2, 61-3, 61-4 via trenches 73*a*, so that first to fourth compound semiconductor layers 61-1, 61-2, 61-3, 61-4 are removed.

On the other hand, for example, first to fourth compound semiconductor layers 61-1, 61-2, 61-3, 61-4 can be removed by isotropic etching. More specifically, HCl gas is provided to first to fourth compound semiconductor layers 61-1, 61-2, 61-3, 61-4 via trenches 73*a*, so that first to third compound semiconductor layers 61-1, 61-2, 61-3 are removed.

As a result, cavities (air gaps) 73*b* are formed between first to third semiconductor layers 12-1, 12-2, 12-3.

In this example, however, it is not necessary to change all of first to fourth compound semiconductor layers 61-1, 61-2, 61-3, 61-4 into cavities 73*b*. First to fourth compound semiconductor layers 61-1, 61-2, 61-3, 61-4 in at least memory cell array/select transistor areas A1, A2 may be converted into cavities 73*b*.

Like the third example, the subsequent process may be executed according to, e.g., "A. Example of filling cavities with oxide layers" and "B. Example for filling cavities with stacked layer structure".

Hereinafter, a modification based on "A. Example of filling cavities with oxide layers" will be explained.

Figure 255:
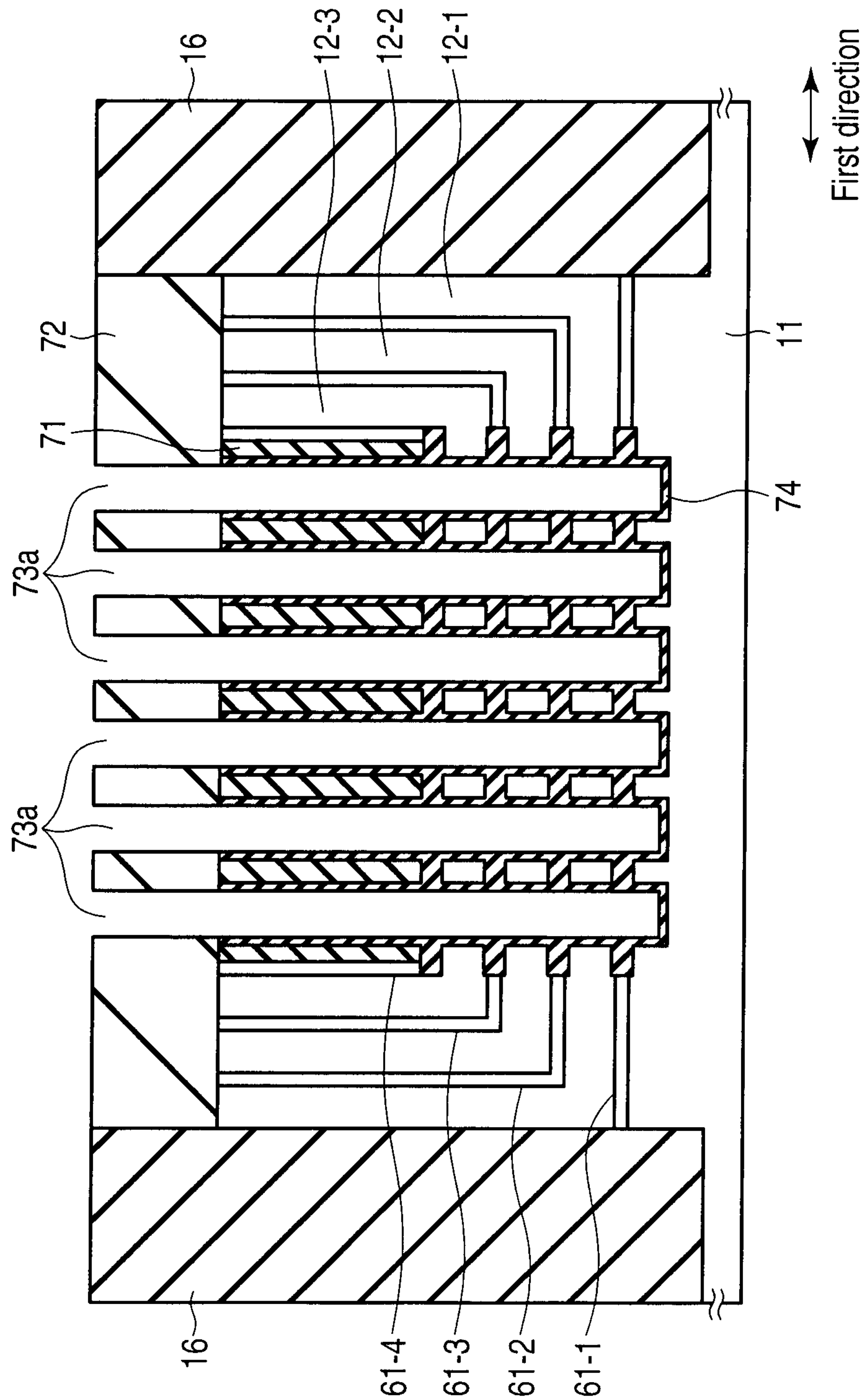

First, as shown in FIGS. 254 and 255, oxide layers 74 are formed by thermal oxidation to fill cavities 73*b* of FIG. 253. It should be noted, however, oxide layers 74 do not fill trenches 63*a*.

In this case, the condition for allowing oxide layers 74 to fill cavities 73*b* but not to fill trenches 73*a* is the same as that of the third example. More specifically, as shown in FIG. 230, for example, when the trench size is denoted with L and the cavity size is denoted with S, the thickness tox of oxide layers 74 is required to satisfy $S/2 \leq tox < L/2$.

The conditions of the thermal oxidation (oxygen flow rate, oxidation time, oxidation temperature, and the like) are set so that the thickness tox of oxide layer 74 satisfies $S/2 \leq tox < L/2$.

In this example, thermal oxide layer 74 is also used as the gate insulating layer of the stacked layer structure (for example, gate insulating layer, data recording layer, and block insulating layer or inter-electrode insulating layer) of the memory cell. For this reason, the thickness of oxide layer 74 is not only set to satisfy the above condition but also set at a thickness (for example, 10 nm or less) allowing the function of the gate insulating layer.

As described above, when oxide layers 74 filling cavities 73*b* are also used as the gate insulating layers, it is not necessary to have the process for removing oxide layers 74 formed on the inner surfaces of trenches 73*a* and the process for forming new gate insulating layers. Therefore, the production cost can be reduced.

Figure 256:
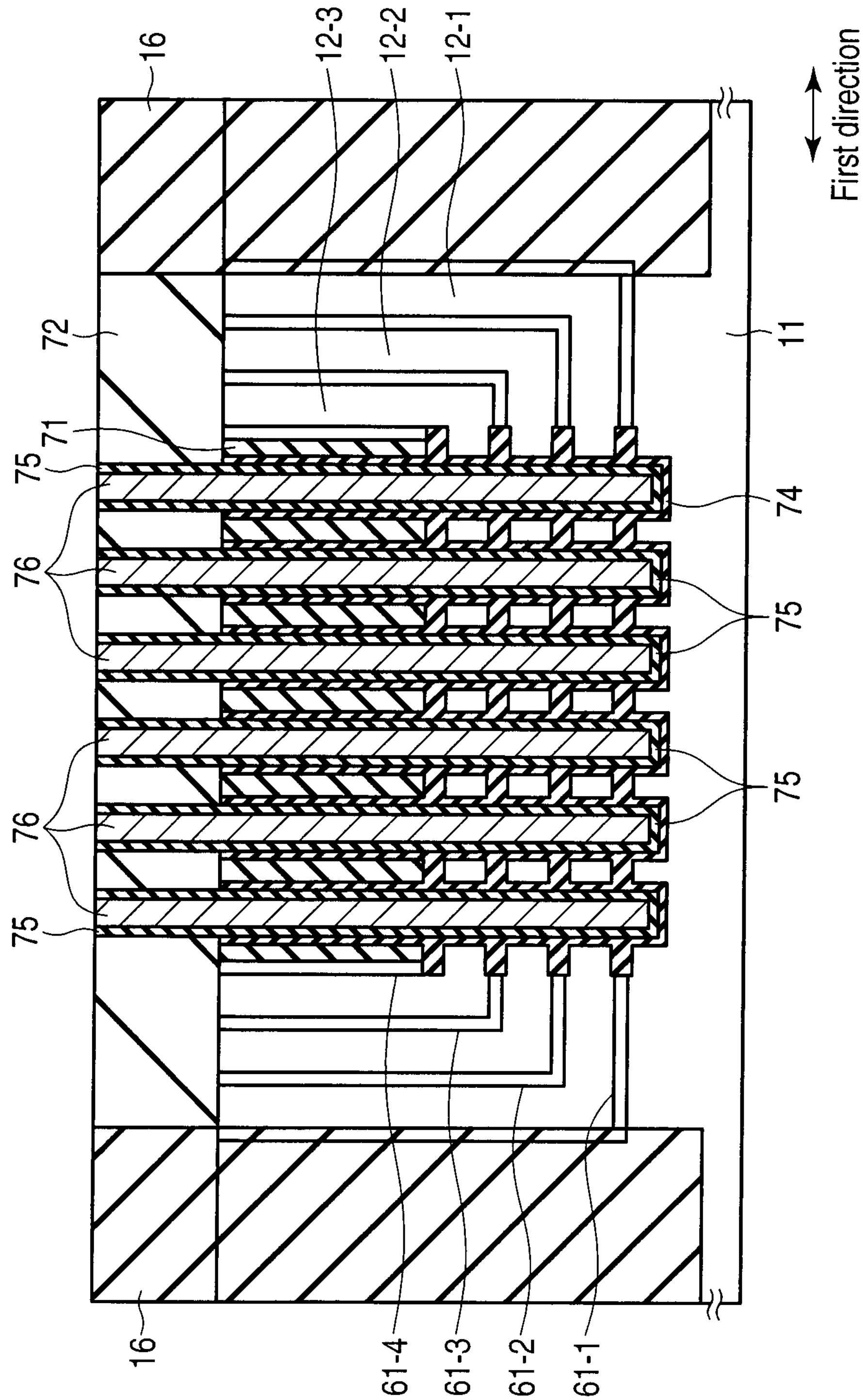

Subsequently, as shown in FIG. 256, the stacked layer structure (data recording layer, block insulating layer, or inter-electrode insulating layer) 75 are further formed on the inner surfaces (oxide layers 74) of trenches 73*a* of FIG. 255. Stacked layer structure 75 are formed on the inner surfaces (oxide layers 74) of trenches 73*a* without filling trenches 73*a*.

Thereafter, conductive layers (for example, polysilicon layer including impurities and metal layer such as TaN) 76 filling trenches 73*a* are formed.

As a result of the above steps, the memory cell array having first to third single-crystal semiconductor layers 12-1, 12-2, 12-3 as the channels is formed.

Figure 257:
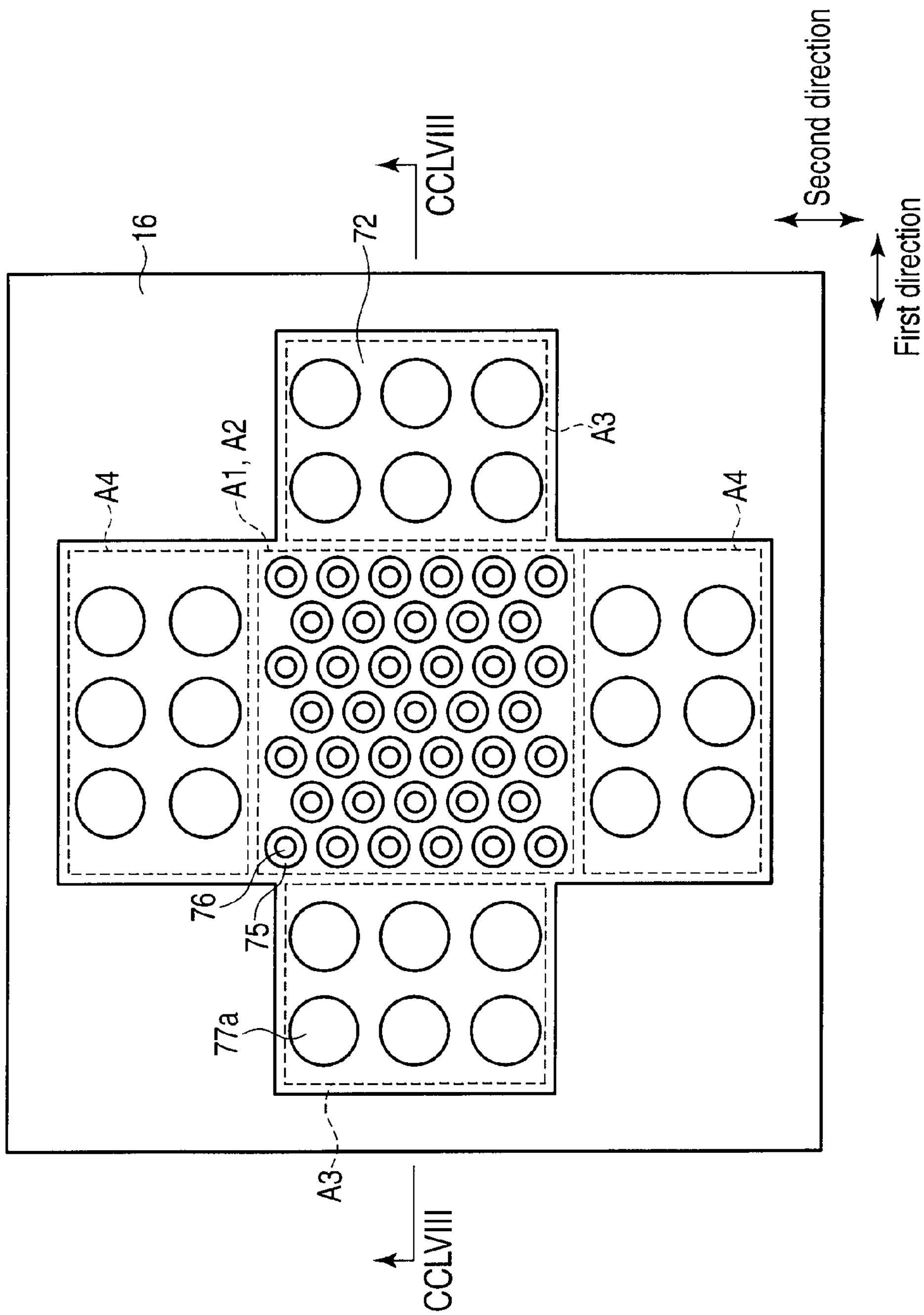
Figure 258:
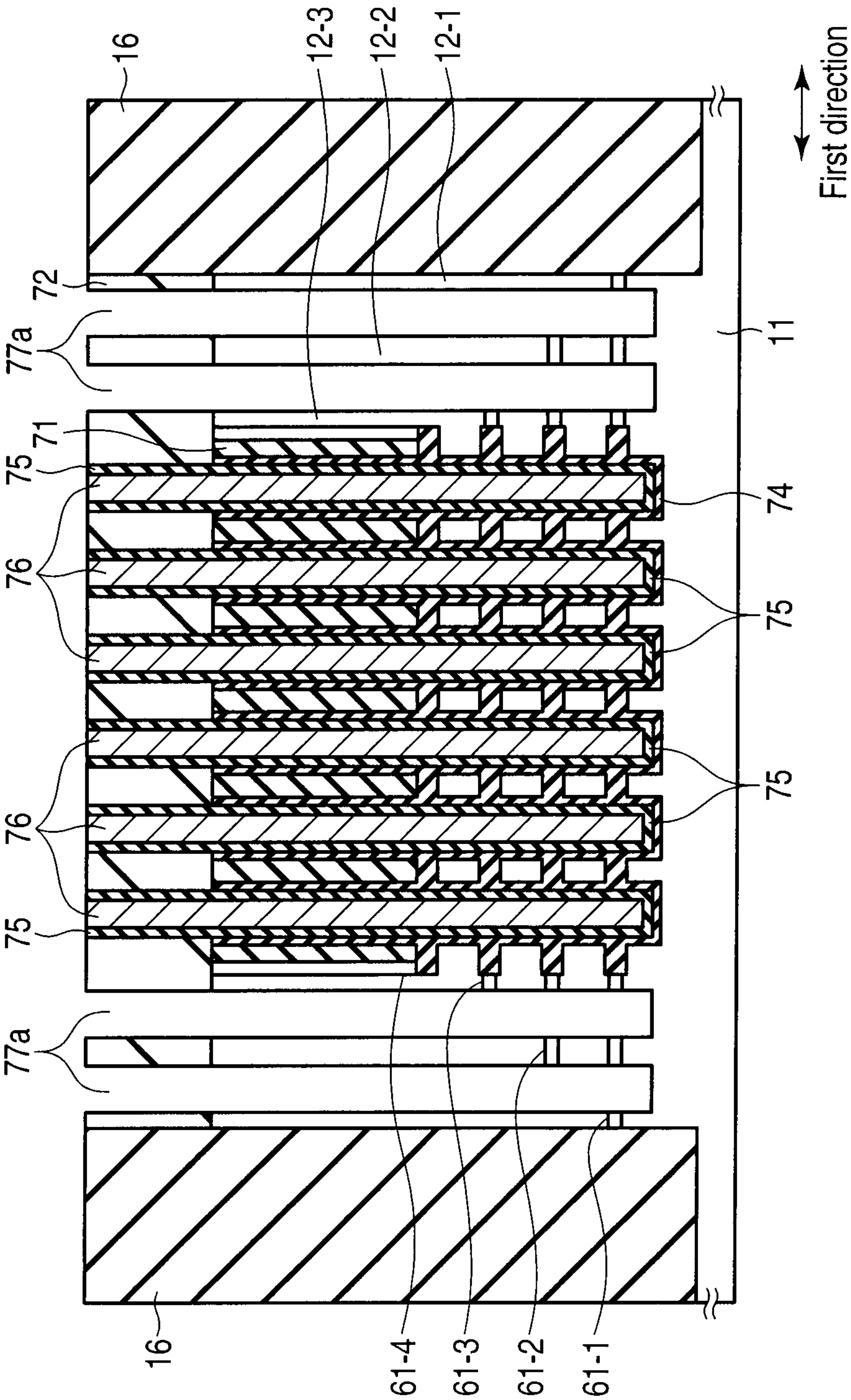

Subsequently, as shown in FIGS. 257 and 258, trenches 77*a* are formed in hook up areas A3, A4. The bottom surfaces of trenches 77*a* reach semiconductor substrate 11.

Figure 259:
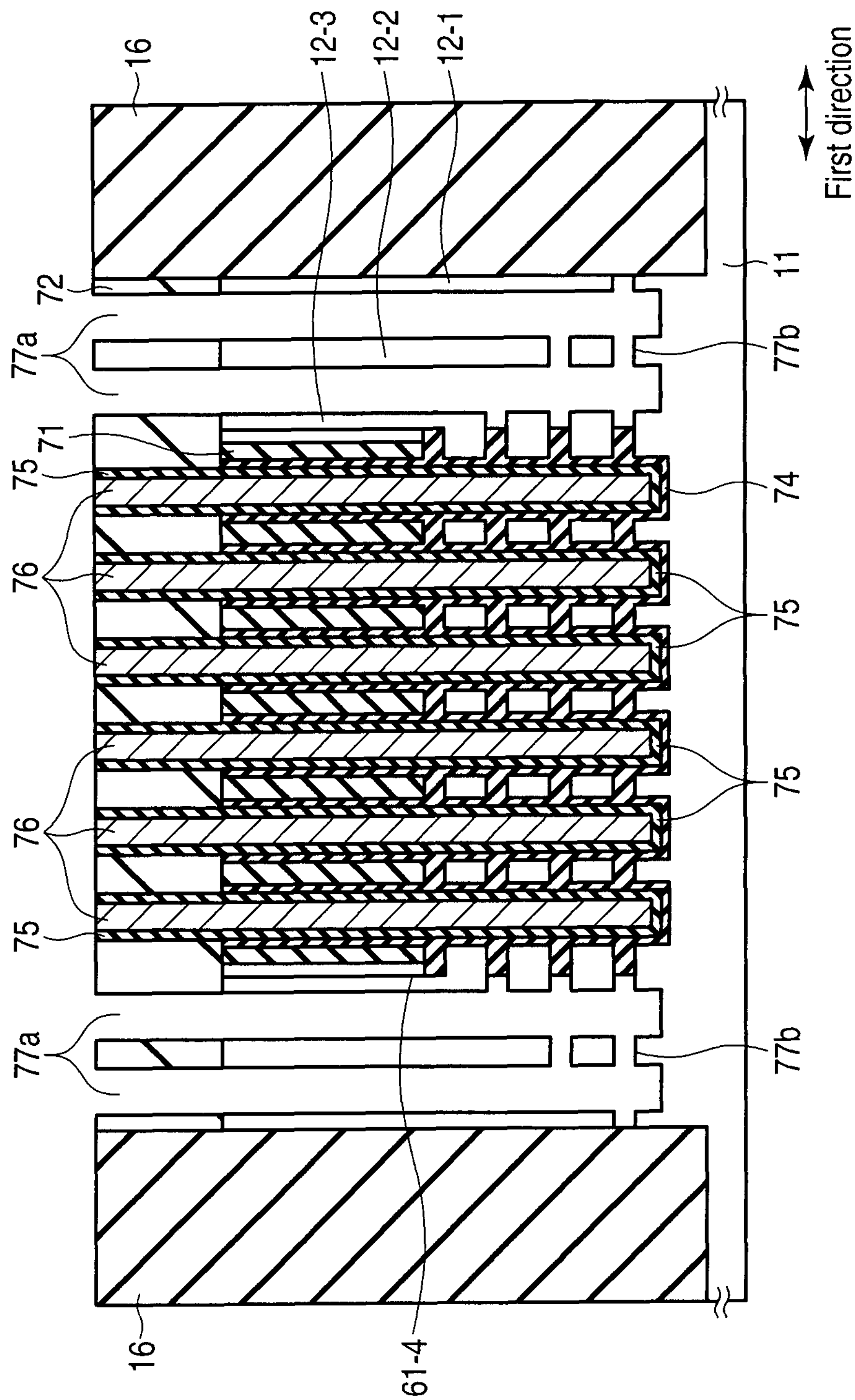

Subsequently, as shown in FIG. 259, first to fourth compound semiconductor layers 61-1, 61-2, 61-3, 61-4 are selectively removed.

For example, first to fourth compound semiconductor layers 61-1, 61-2, 61-3, 61-4 can be removed by wet etching. More specifically, a mixed solution of hydrofluoric acid and nitric acid is provided to first to fourth compound semiconductor layers 61-1, 61-2, 61-3, 61-4 via trenches 73*a*, so that first to fourth compound semiconductor layers 61-1, 61-2, 61-3, 61-4 are removed.

On the other hand, for example, first to fourth compound semiconductor layers 61-1, 61-2, 61-3, 61-4 can be removed by isotropic etching. More specifically, HCl gas is provided to first to fourth compound semiconductor layers 61-1, 61-2, 61-3, 61-4 via trenches 73*a*, so that first to fourth compound semiconductor layers 61-1, 61-2, 61-3, 61-4 are removed.

As a result, cavities (air gaps) 77*b* are formed between first to third semiconductor layers 12-1, 12-2, 12-3.

In this example, however, it is not necessary to change all of first to fourth compound semiconductor layers 61-1, 61-2, 61-3, 61-4 into cavities 77*b*. First to fourth compound semiconductor layers 61-1, 61-2, 61-3, 61-4 in at least hook up areas A3, A4 may be converted into cavities 77*b*.

Thereafter, N+/P+-type diffusion layers are formed in first to third semiconductor layers 12-1, 12-2, 12-3 using the same method (method using plasma doping or solid phase diffusion) as the method for forming N+/P+-type diffusion layers in the second example (FIGS. 193 to 207), for example.

Now, the method using solid phase diffusion will be explained.

Figure 260:
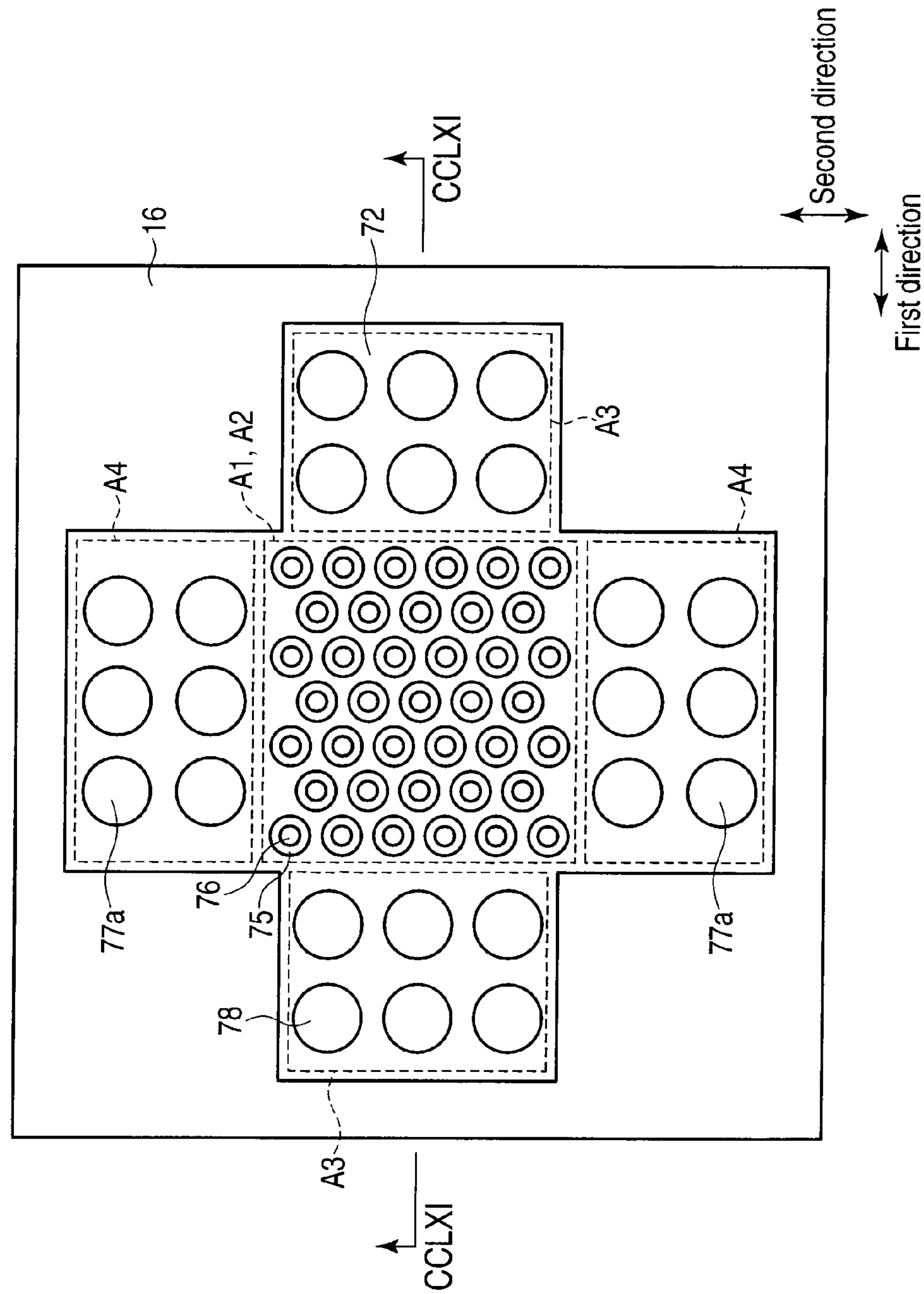
Figure 261:
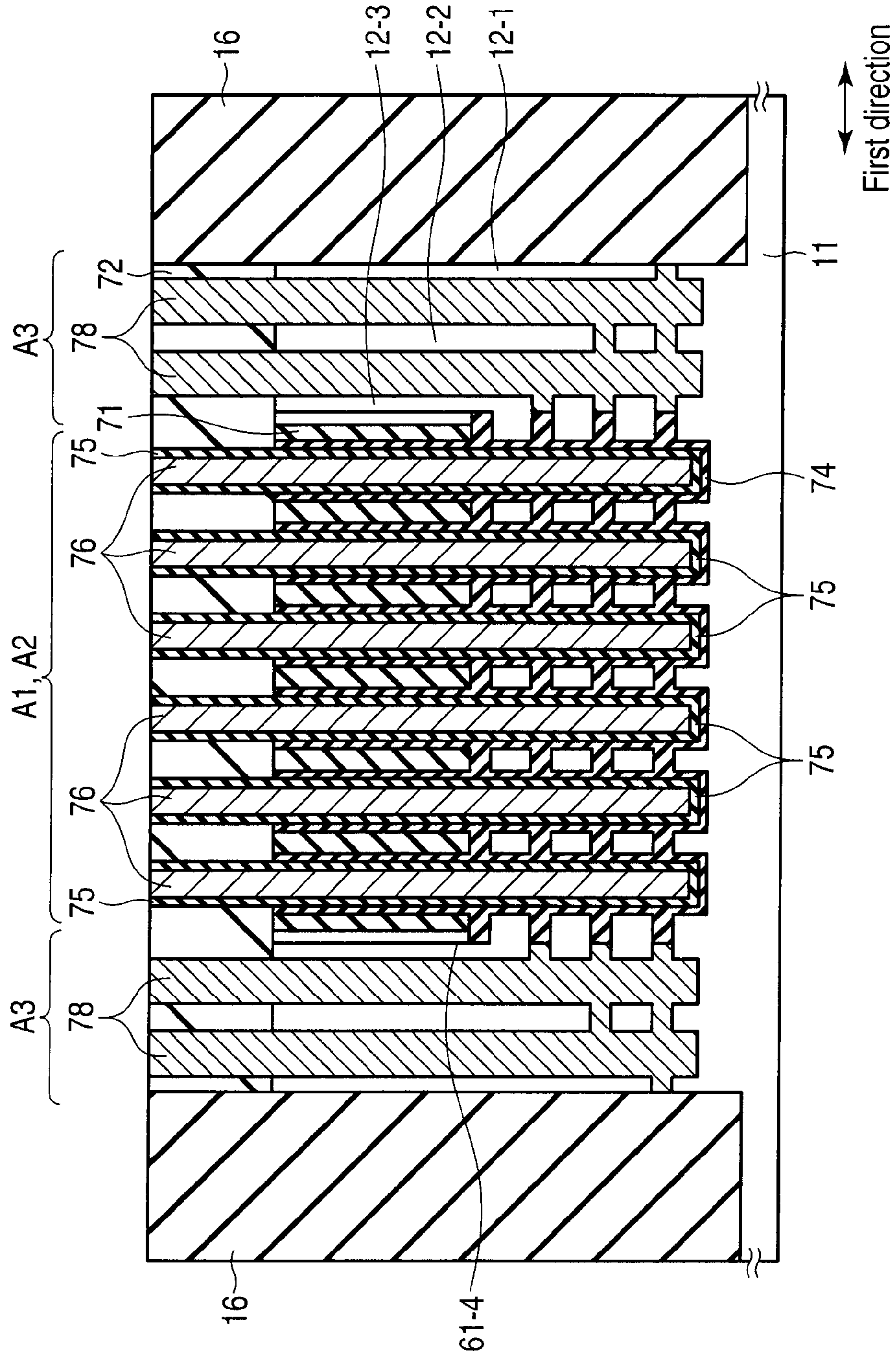

First, as shown in FIGS. 260 and 261, trenches 77*a* and cavities 77*b* in hook up areas A3, A4 (see FIG. 259) are filled with insulating layers (for example, PSG layers) 78 including N-type impurities (for example, P and As). Then, only insulating layers 78 filled in trenches 77*a* and cavities 77*b* in hook up areas A4 (see FIG. 259) are removed by wet etching, for example.

Figure 262:
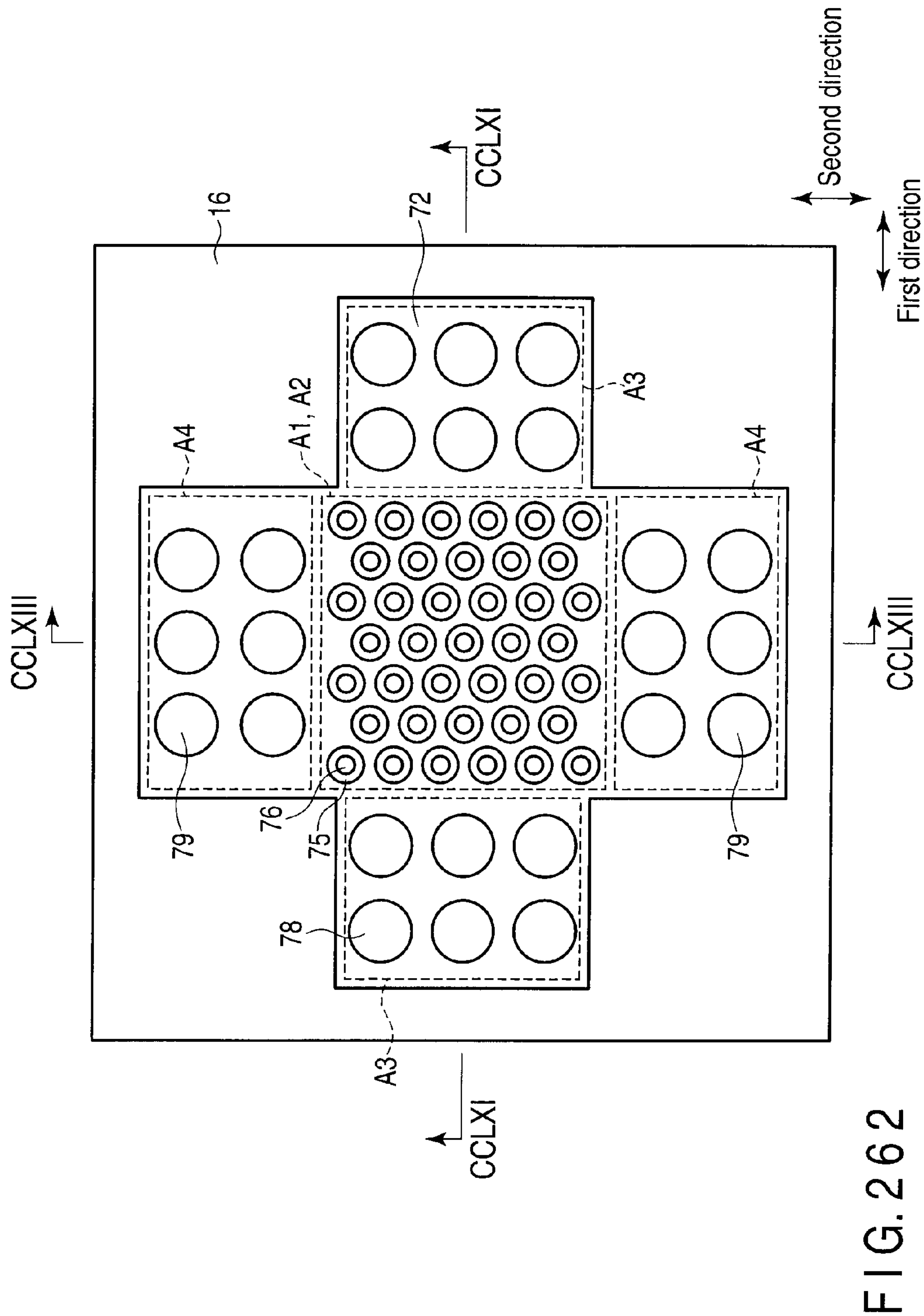

Subsequently, as shown in FIGS. 262 and 263, trenches 77*a* and cavities 77*b* in hook up areas A4 (see FIG. 259) are filled with insulating layers (for example, BSG layers) 79 including P-type impurities (for example, B).

Figure 264:
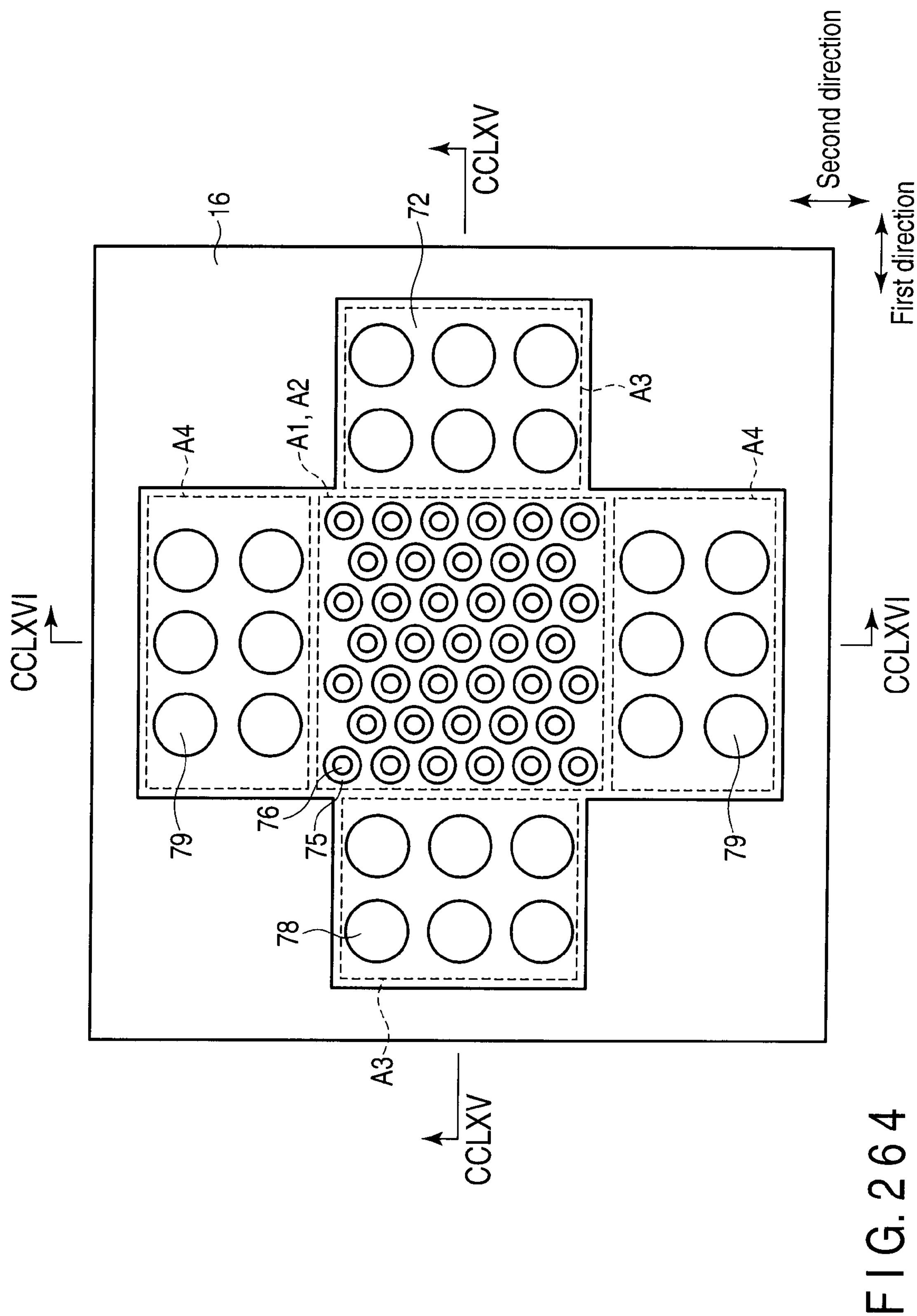
Figure 265:
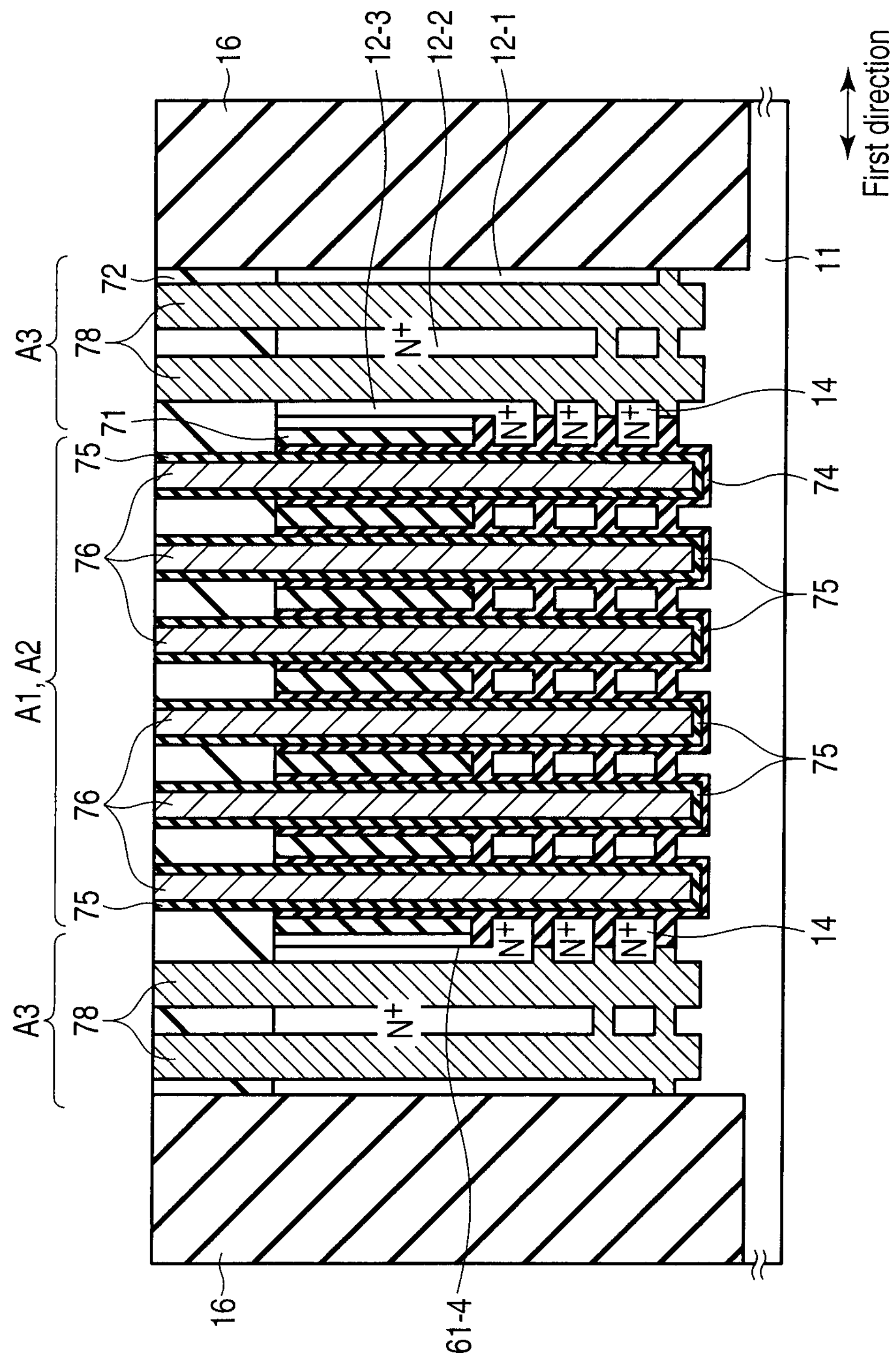
Figure 266:
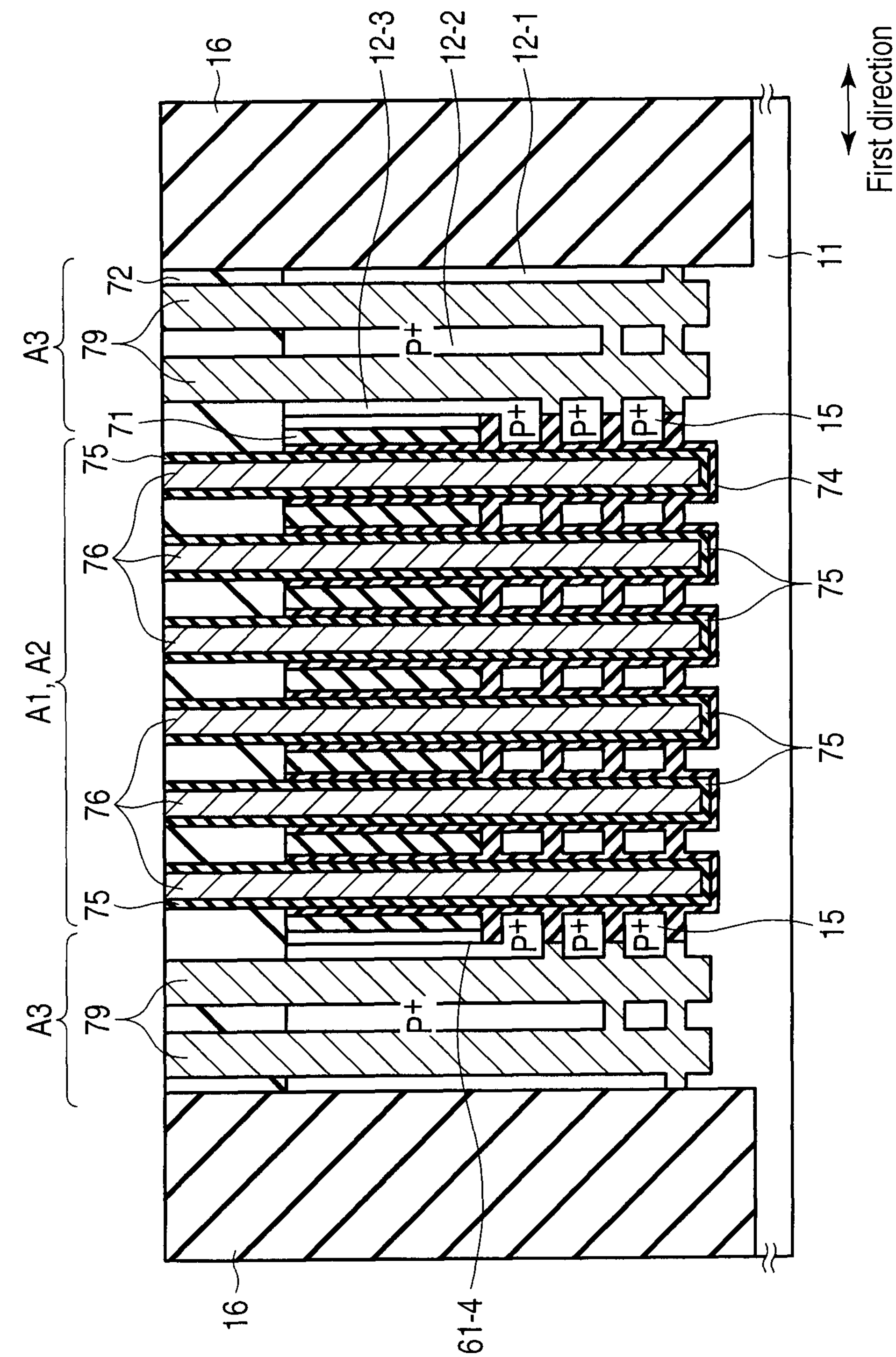

Thereafter, as shown in FIGS. 264 to 266, the N-type impurities are diffused in solid phase from insulating layers 78 to first to third semiconductor layers 12-1, 12-2, 12-3 by thermal diffusion, and the P-type impurities are diffused in solid phase from insulating layer 79 to first to third semiconductor layers 12-1, 12-2, 12-3.

As a result of the above steps, N+/P+-type diffusion layers 14, 15 are formed in first to third semiconductor layers 12-1, 12-2, 12-3 at a time.

In this example, thereafter, insulating layer 77, 78 are selectively removed.

Figure 267:
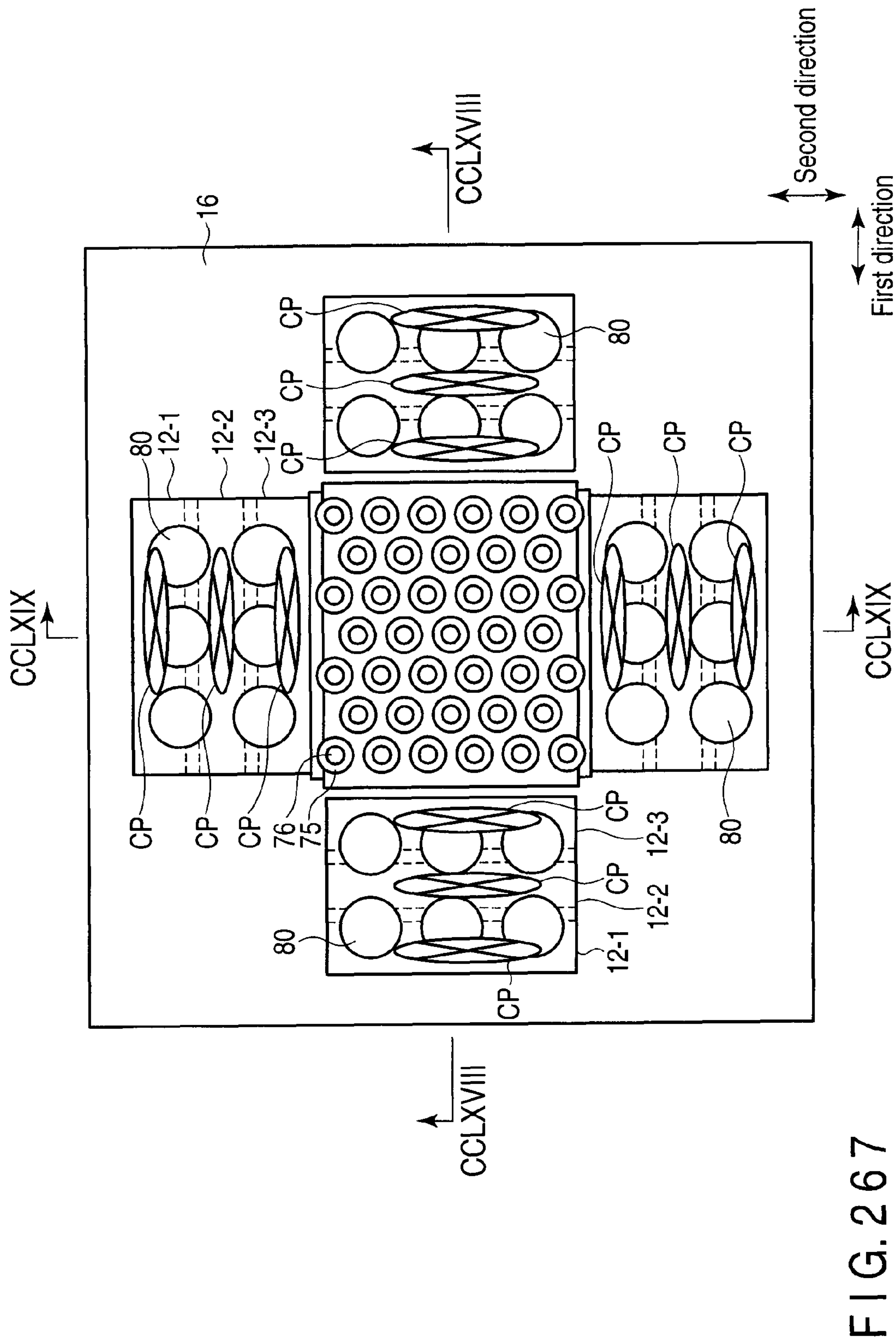
Figure 268:
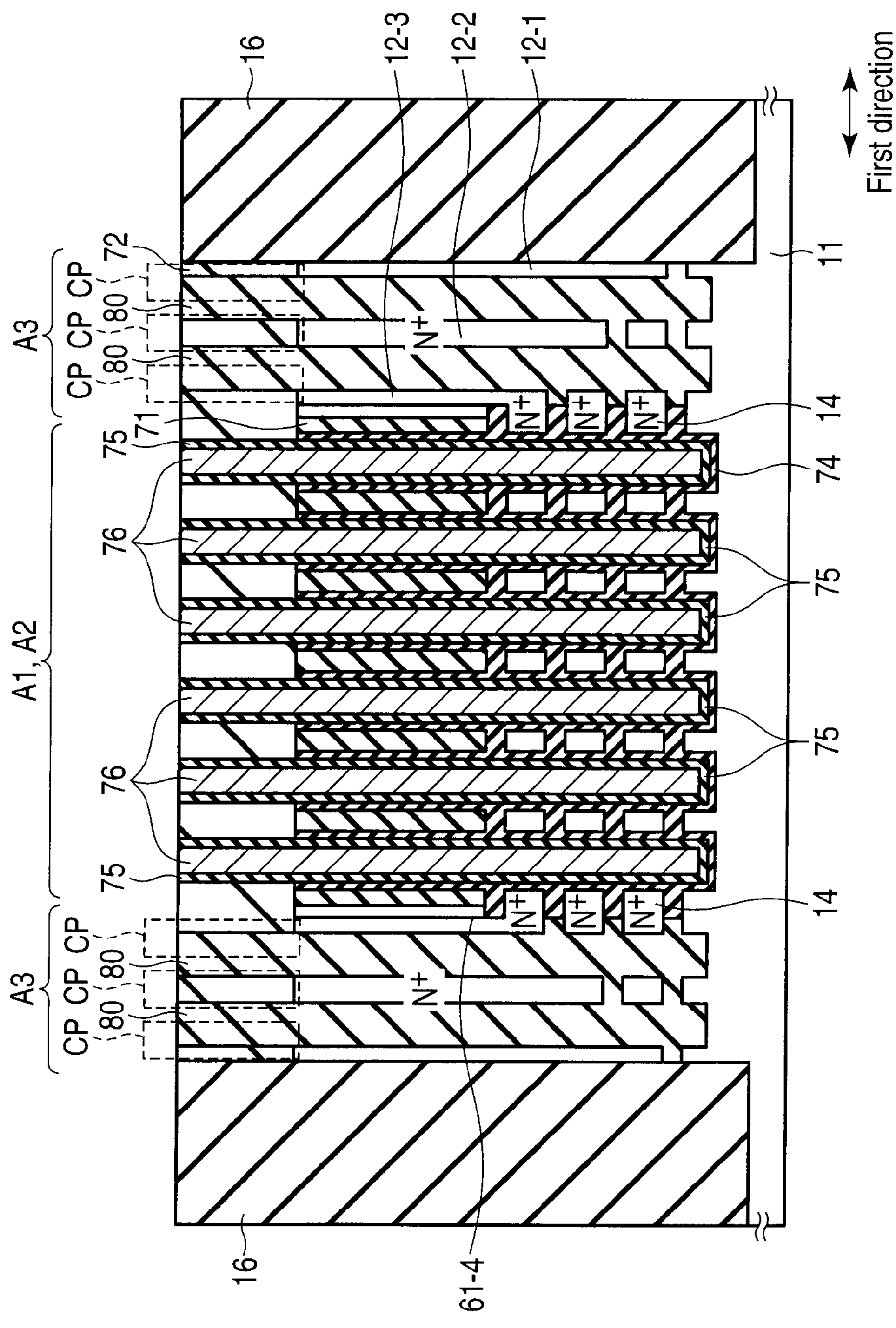
Figure 269:
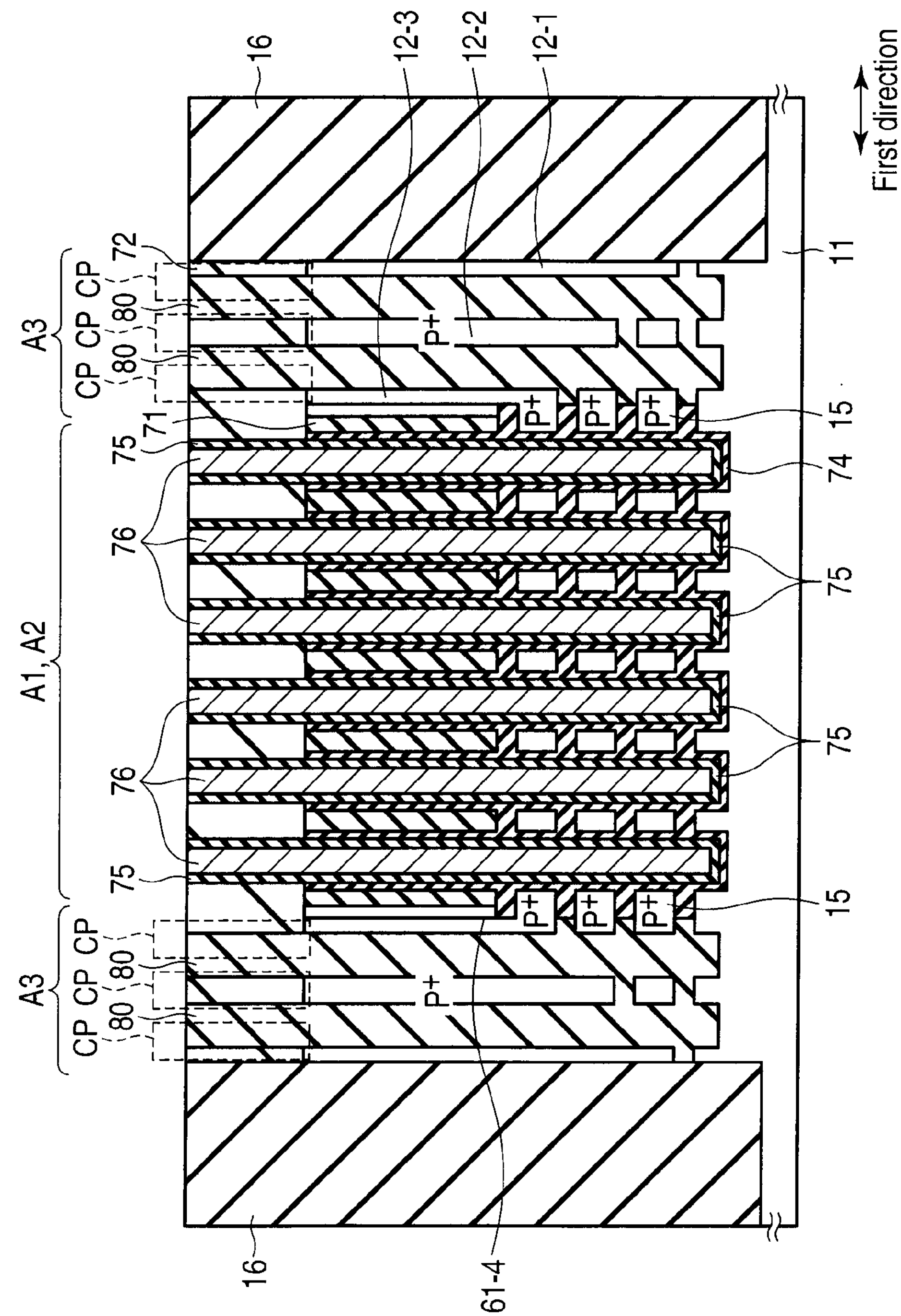

Subsequently, as shown in FIGS. 267 to 269, trenches 77*a* and cavities 77*b* in hook up areas A3, A4 (see FIG. 259) are filled with insulating layers (for example, oxide silicon) 80. Then, contact plugs (vias) CP are independently connected to N+/P+-type diffusion layers 14, 15 in first to third semiconductor layers 12-1, 12-2, 12-3.

As a result of the above steps, the three-dimensional MaCS having the hook up areas made in the bent structure can be achieved.

(5) Fifth Example

FIGS. 270 to 294 illustrate the fifth example of method for producing a three-dimensional MaCS.

Figure 170:
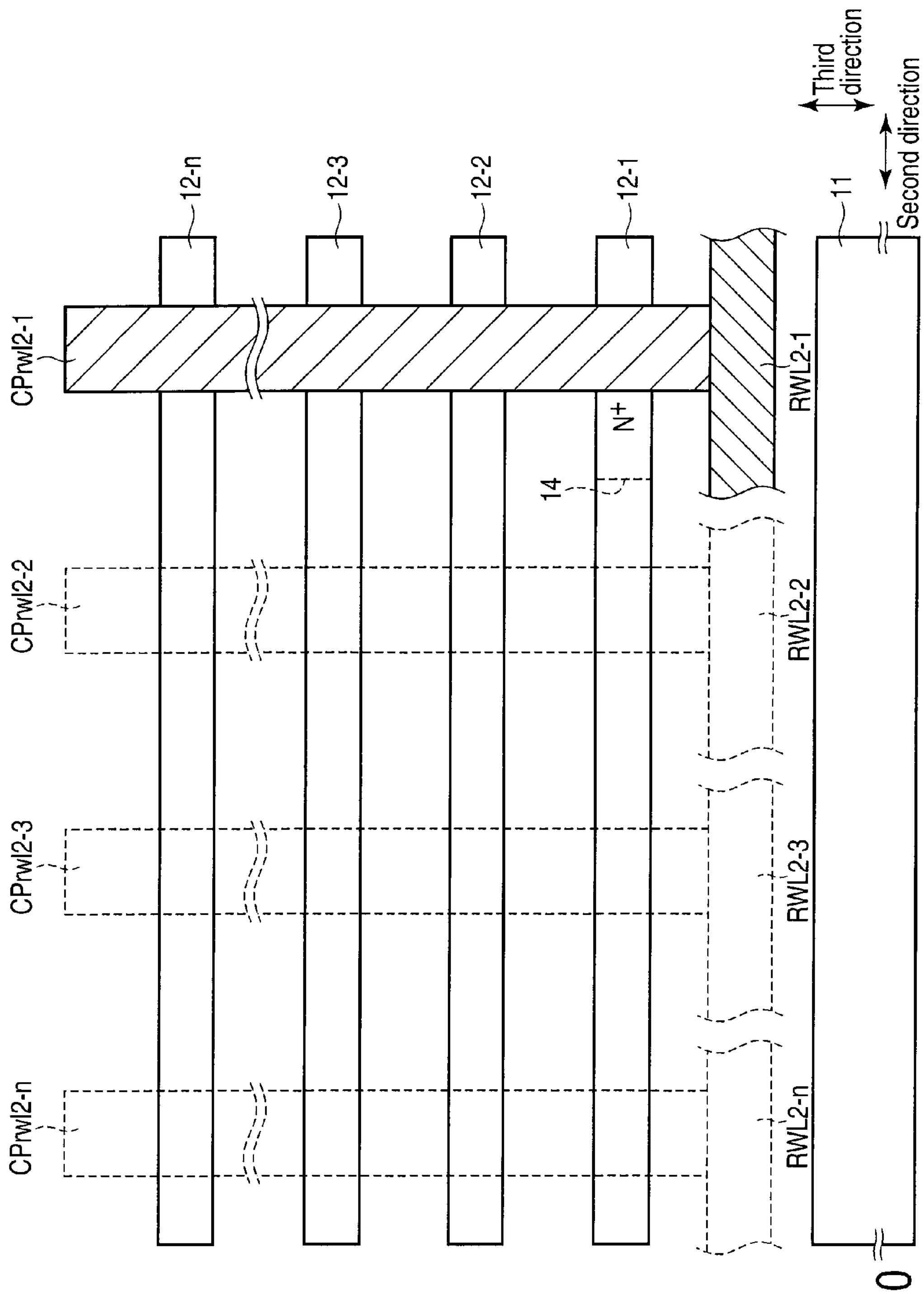

In the fifth example, the production method is suggested to achieve hook up areas made in a passing through structure as shown in FIGS. 159 and 170.

Figure 270:
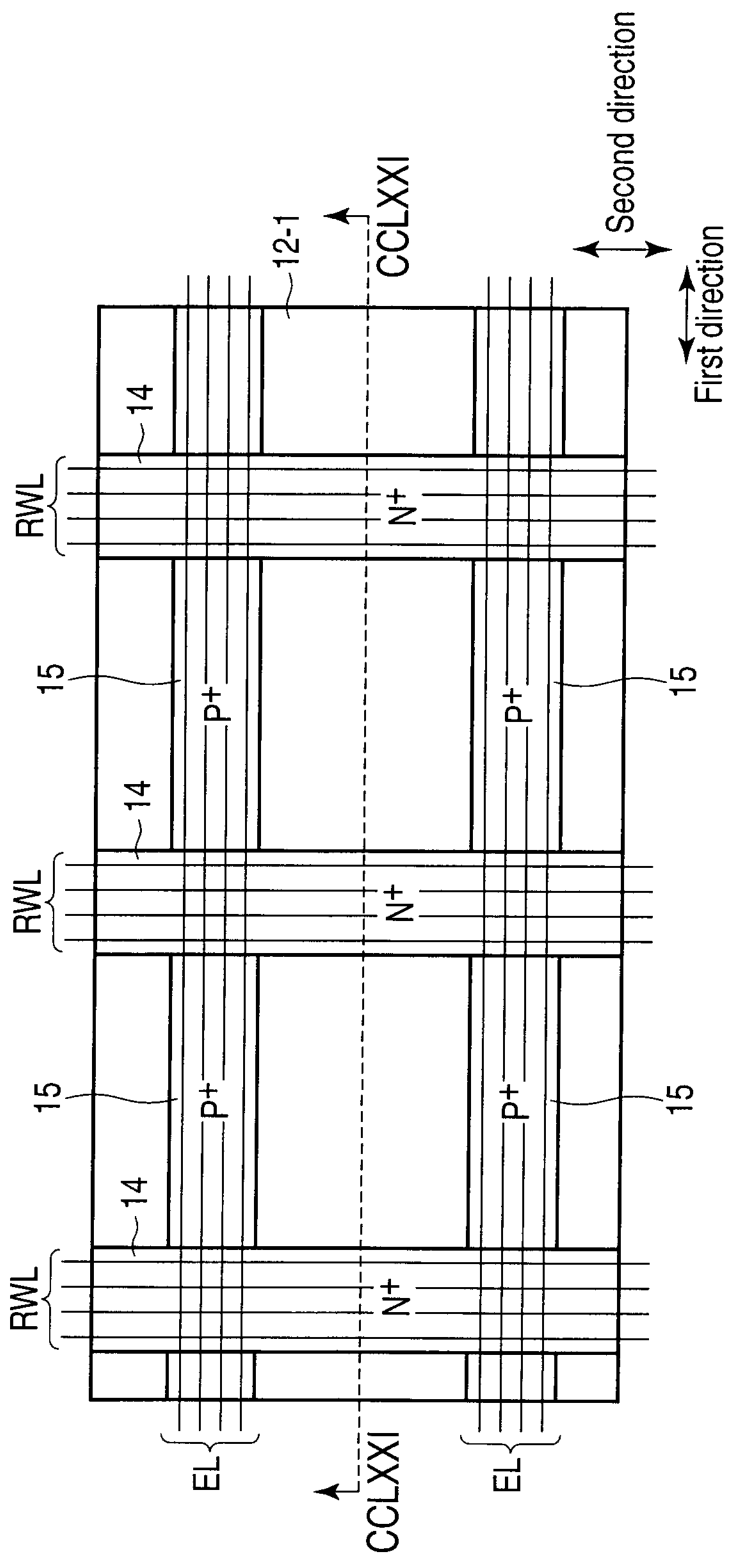
Figure 271:
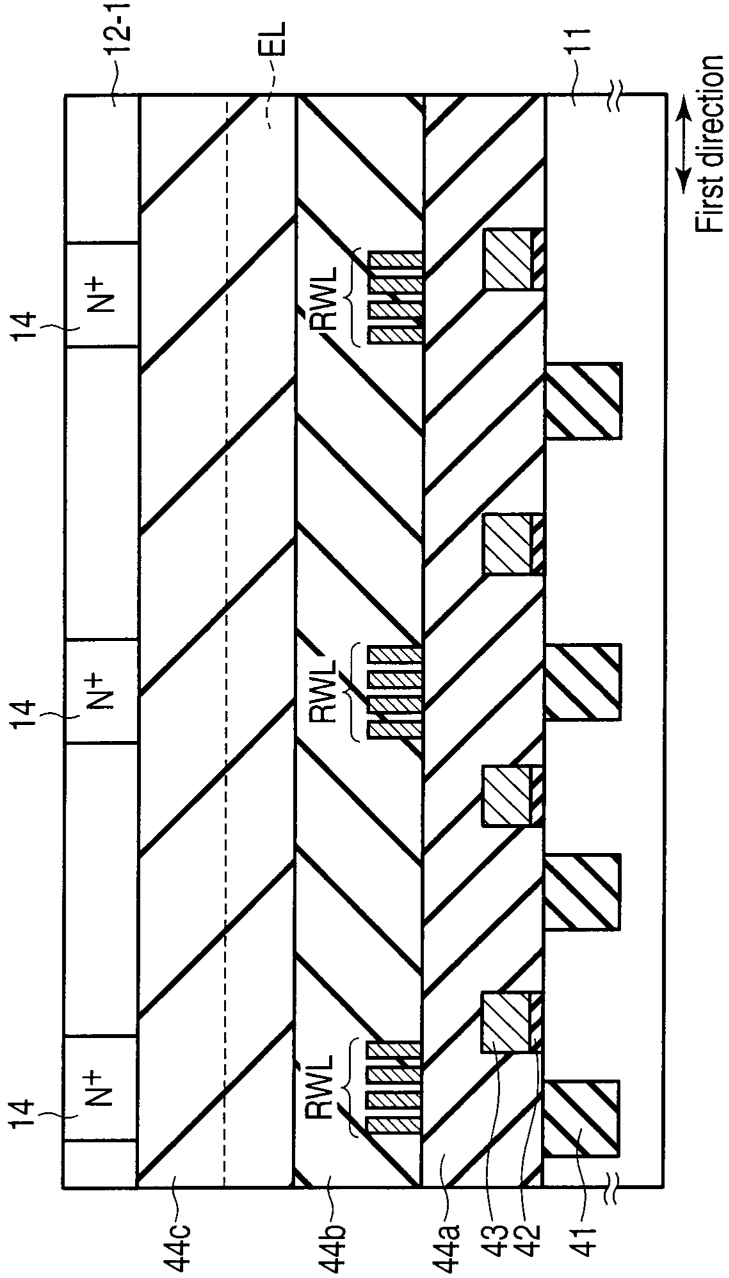

First, as shown in FIGS. 270 and 271, element isolation insulating layers 41 made in an STI (shallow trench isolation) structure are formed in semiconductor substrate 11. An FET (field effect transistor) including gate insulating layer 42 and gate electrode 43 is formed in each of device regions (active areas) surrounded by element isolation insulating layers 41. Further, inter-layer insulating layer 44*a* is formed on semiconductor substrate 11, and the upper surface of inter-layer insulating layer 44*a* is smoothed.

Thereafter, read/write lines RWL extending in the second direction are formed on inter-layer insulating layer 44*a*, and these are covered with inter-layer insulating layer 44*b*. In addition, erase lines EL extending in the first direction are formed on inter-layer insulating layer 44*b*, and these are covered with inter-layer insulating layer 44*c*.

It should be noted that read/write lines RWL may not be arranged below erase lines EL as described in this example. Alternatively, erase lines EL may be arranged below read/write lines RWL.

Then, first semiconductor layer (for example, polysilicon layer) 12-1 is formed on inter-layer insulating layer 44*c*.

Further, a resist pattern is formed by PEP (photo engraving process). Using the formed resist pattern as a mask, N-type impurities (for example, P and As) are injected into first semiconductor layer 12-1 by ion implantation. Thereafter, the resist pattern is removed.

A resist pattern is formed again by PEP. Using the formed resist pattern as a mask, P-type impurities (for example, B) are injected into first semiconductor layer 12-1 by ion implantation. Thereafter, the resist pattern is removed.

As a result, N+-type diffusion layers 14 and P+-type diffusion layers 15 are formed in first semiconductor layer 12-1.

Figure 272:
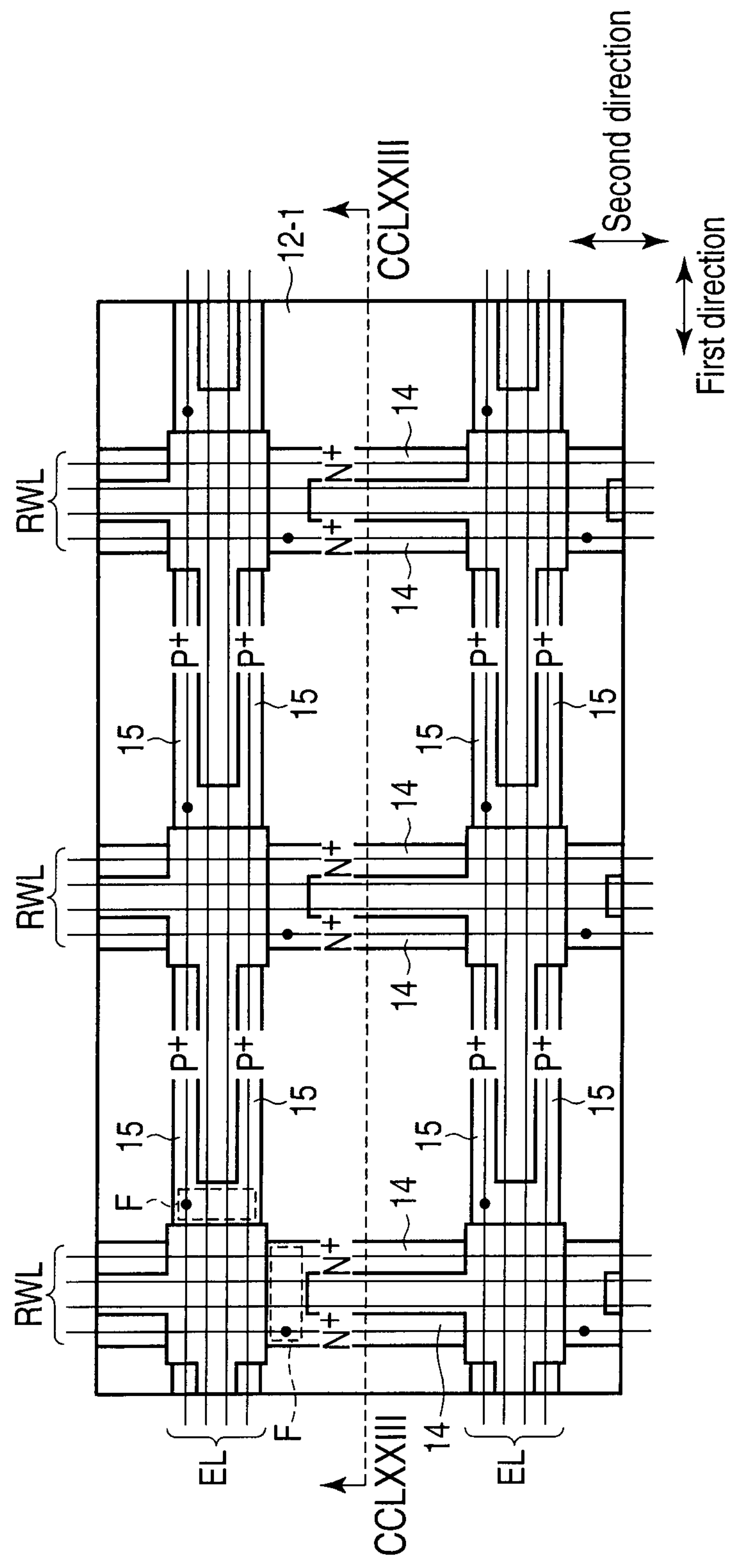
Figure 273:
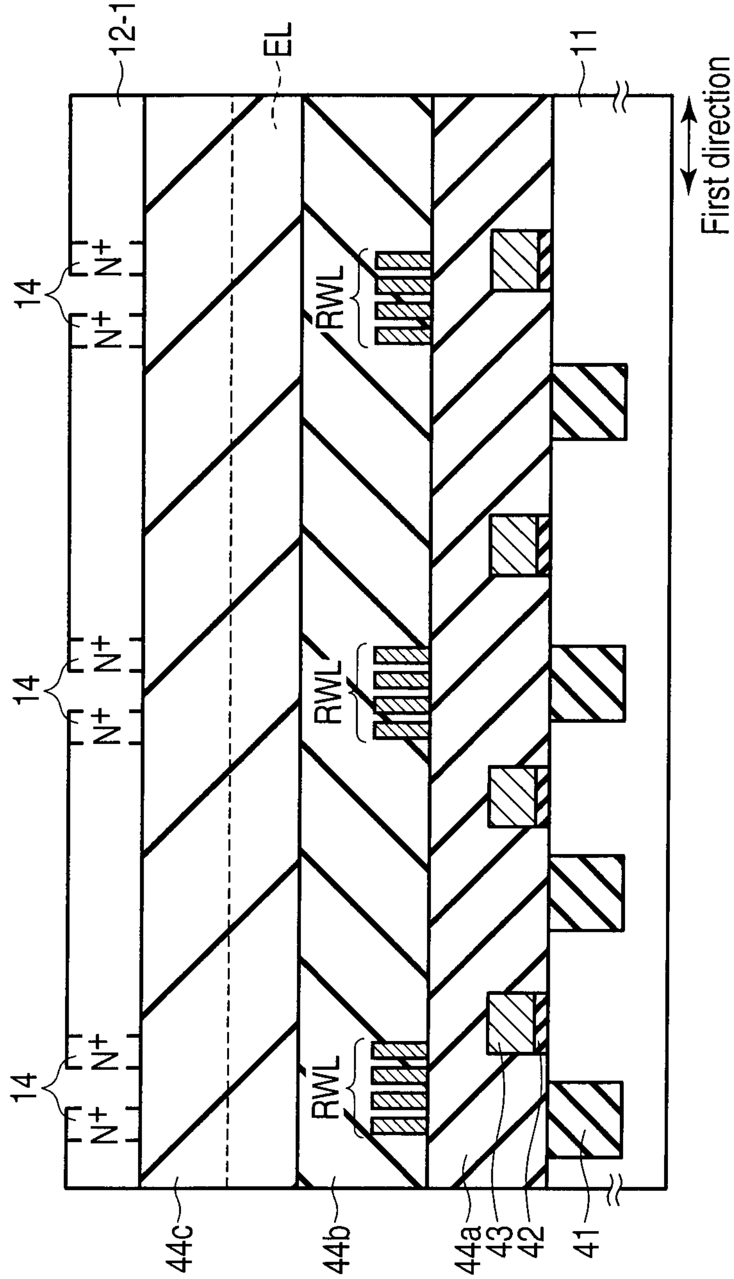

Subsequently, as shown in FIGS. 272 and 273, a resist pattern is formed by PEP. Using the formed resist pattern as a mask, first semiconductor layer 12-1 is patterned by RIE (reactive ion etching). This patterning process is done for the purpose of isolating N+-type diffusion layer 14 and P+-type diffusion layer 15 from each other.

Figure 275:
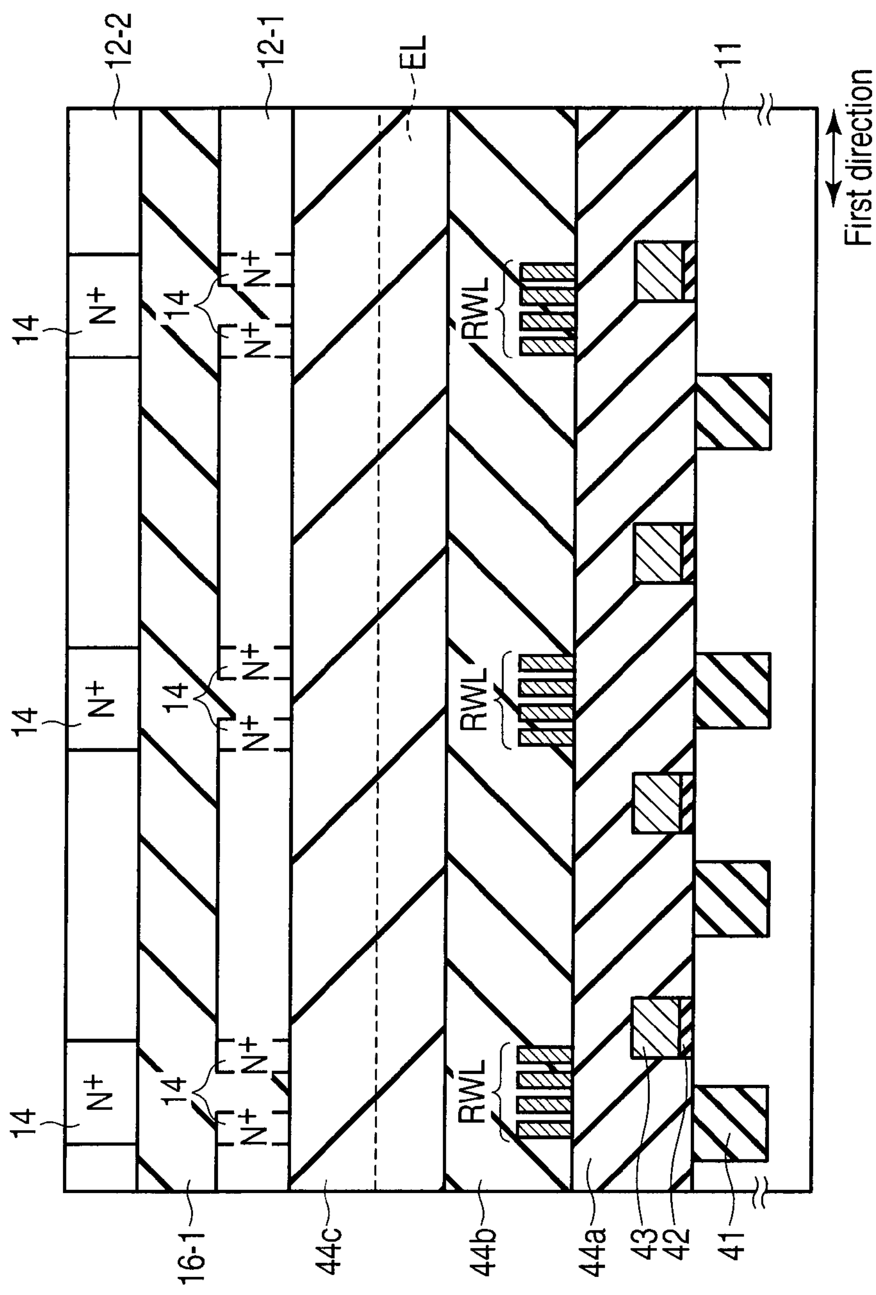

Subsequently, as shown in FIGS. 274 and 275, inter-layer insulating layer (element isolation insulating layer) 16-1 is formed using a method such as LPCVD. Inter-layer insulating layer (element isolation insulating layer) 16-1 fills grooves formed in first semiconductor layer 12-1 and covers first semiconductor layer 12-1. Then, the upper surface of inter-layer insulating layer 16-1 is smoothed.

Thereafter, second semiconductor layer (for example, polysilicon layer) 12-2 is formed on inter-layer insulating layer 16-1.

Then, a resist pattern is formed by PEP. Using the formed resist pattern as a mask, N-type impurities (for example, P and As) are injected into second semiconductor layer 12-2 by ion implantation. Thereafter, the resist pattern is removed.

Then, a resist pattern is formed again by PEP. Using the formed resist pattern as a mask, P-type impurities (for example, B) are injected into second semiconductor layer 12-2 by ion implantation. Thereafter, the resist pattern is removed.

As a result, N+-type diffusion layers 14 and P+-type diffusion layers 15 are formed in second semiconductor layer 12-2.

Figure 276:
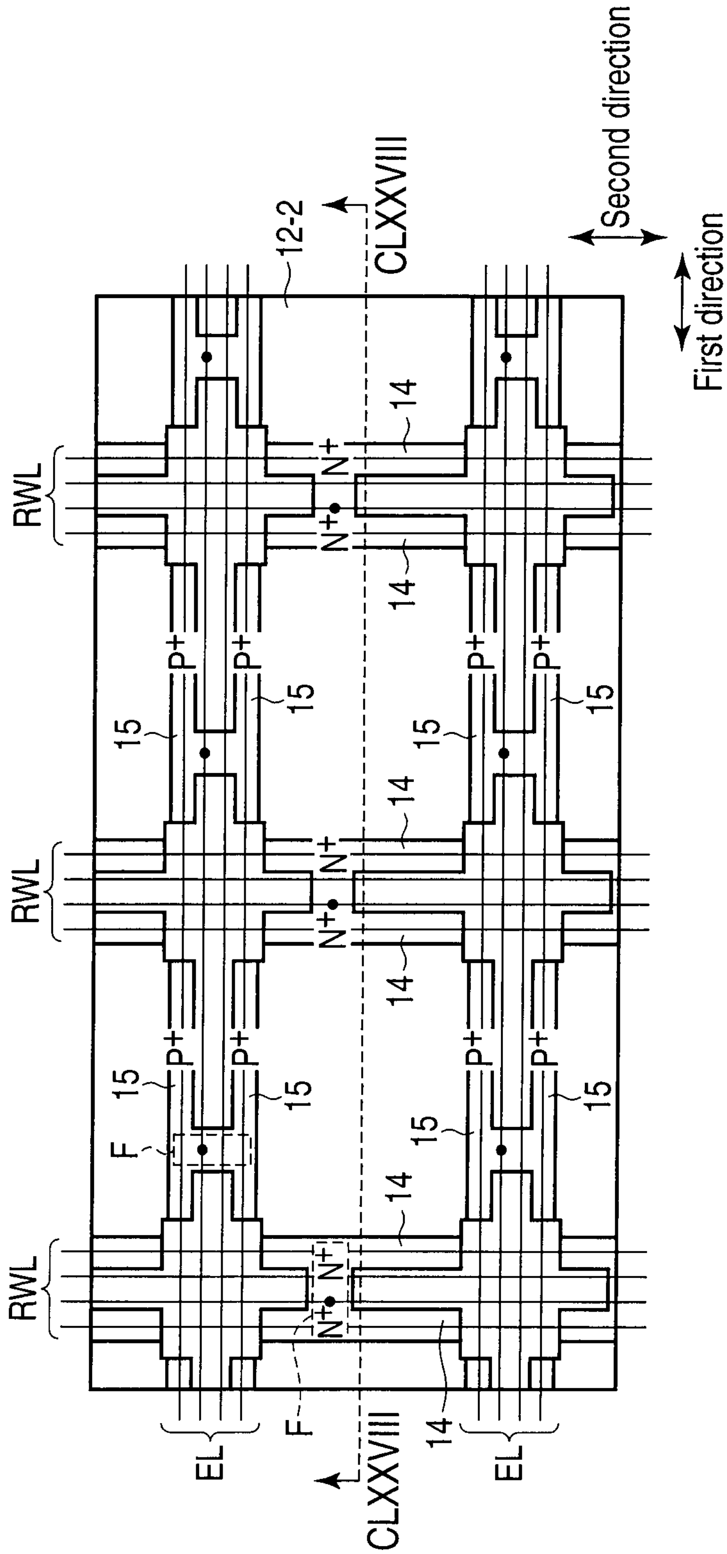
Figure 277:
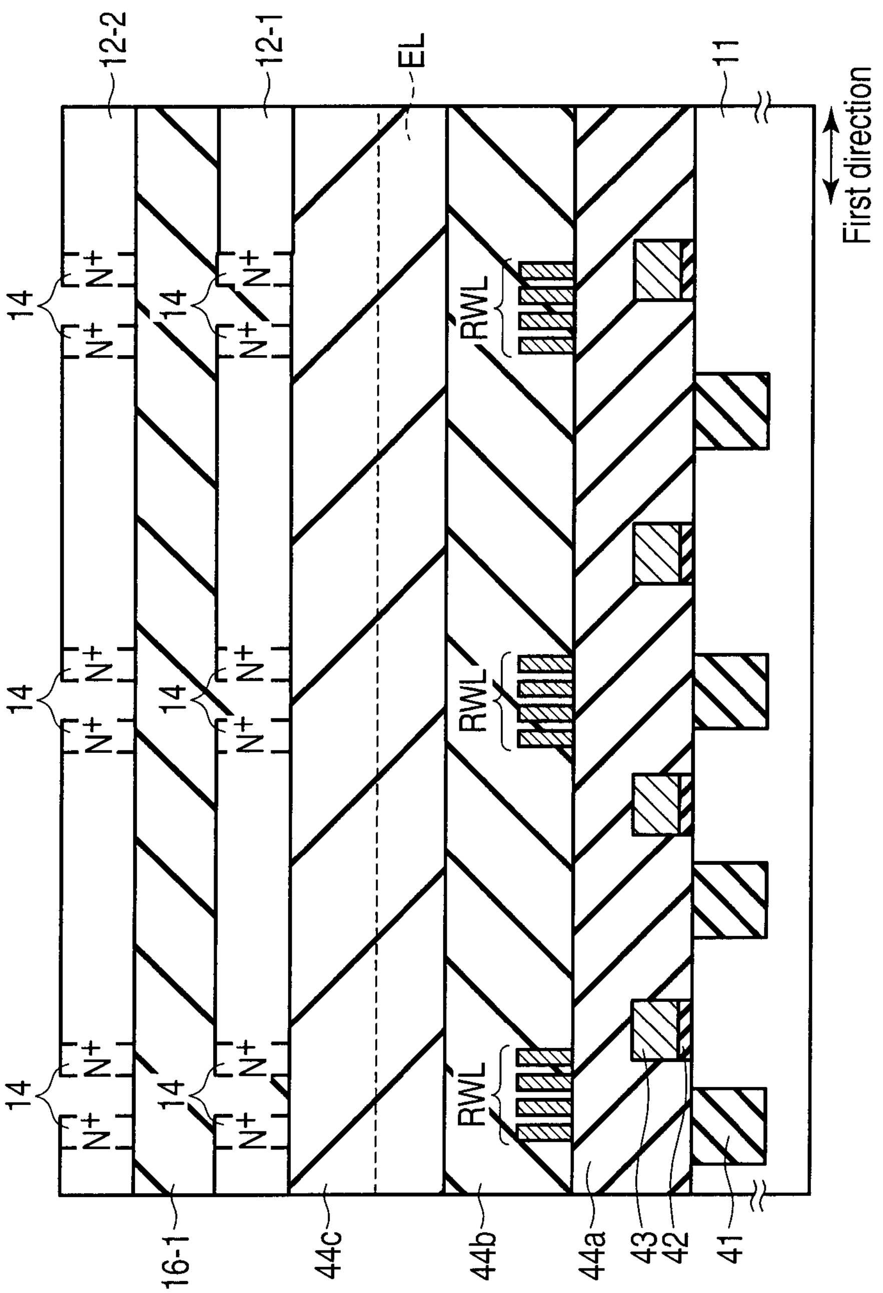

Subsequently, as shown in FIGS. 276 and 277, a resist pattern is formed by PEP. Using the formed resist pattern as a mask, second semiconductor layer 12-2 is patterned by RIE. This patterning process is done for the purpose of isolating N+-type diffusion layer 14 and P+-type diffusion layer 15.

In this example, fringe areas (contact areas) F of N+/P+-type diffusion layers 14, 15 in second semiconductor layer 12-2 do not overlap fringe areas (contact areas) F of N+/P+-type diffusion layers 14, 15 in first semiconductor layer 12-1 as shown in FIG. 272. This configuration allows vias to be independently in contact with respective semiconductor layers.

Figure 278:
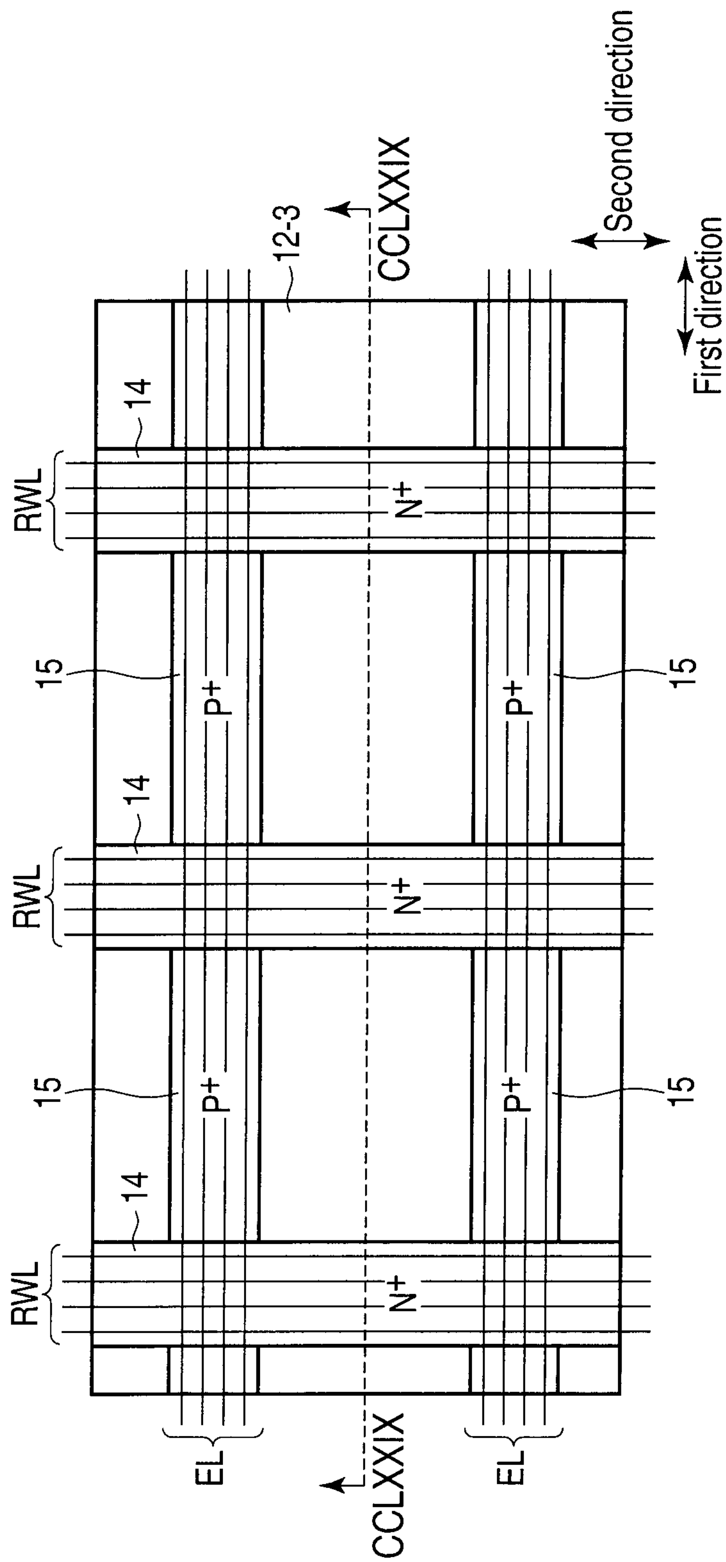
Figure 279:
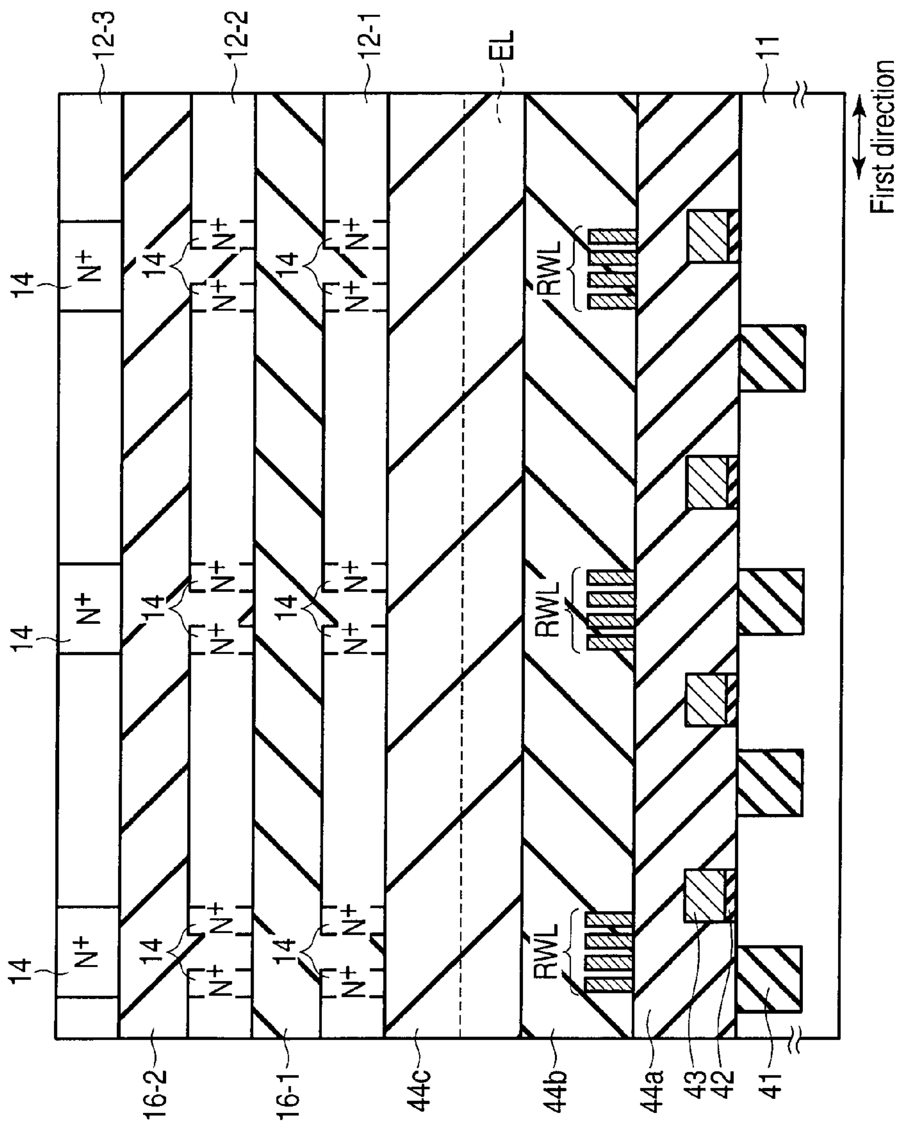

Subsequently, as shown in FIGS. 278 and 279, inter-layer insulating layer (element isolation insulating layer) 16-2 is formed using a method such as LPCVD. Inter-layer insulating layer (element isolation insulating layer) 16-2 fills grooves formed in second semiconductor layer 12-2 and covers second semiconductor layer 12-2. Then, the upper surface of inter-layer insulating layer 16-2 is smoothed.

Thereafter, third semiconductor layer (for example, polysilicon layer) 12-3 is formed on inter-layer insulating layer 16-2.

Then, a resist pattern is formed by PEP. Using the formed resist pattern as a mask, N-type impurities (for example, P and As) are injected into third semiconductor layer 12-3 by ion implantation. Thereafter, the resist pattern is removed.

Then, a resist pattern is formed again by PEP. Using the formed resist pattern as a mask, P-type impurities (for example, B) are injected into third semiconductor layer 12-3 by ion implantation. Thereafter, the resist pattern is removed.

As a result, N+-type diffusion layers 14 and P+-type diffusion layers 15 are formed in third semiconductor layer 12-3.

Figure 280:
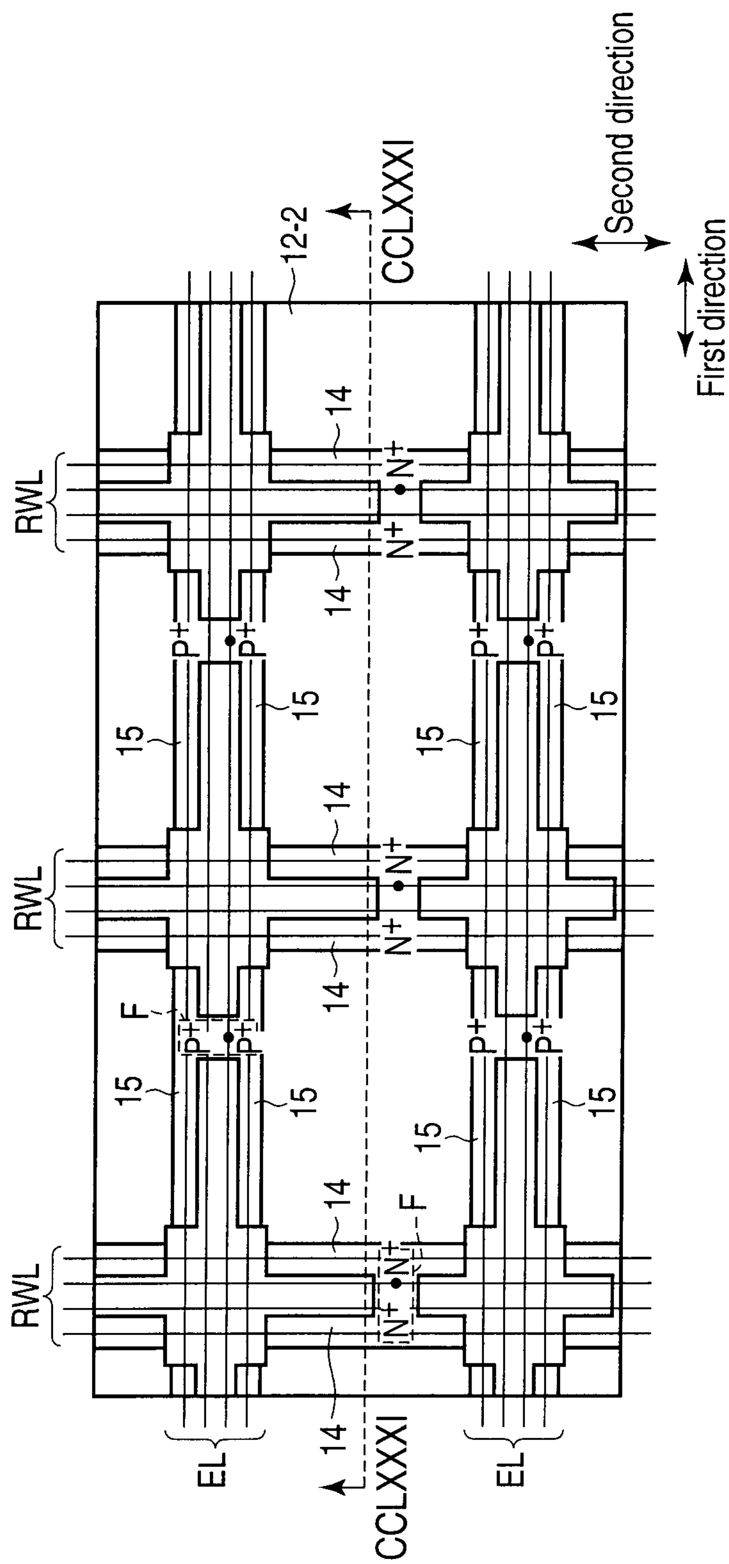
Figure 281:
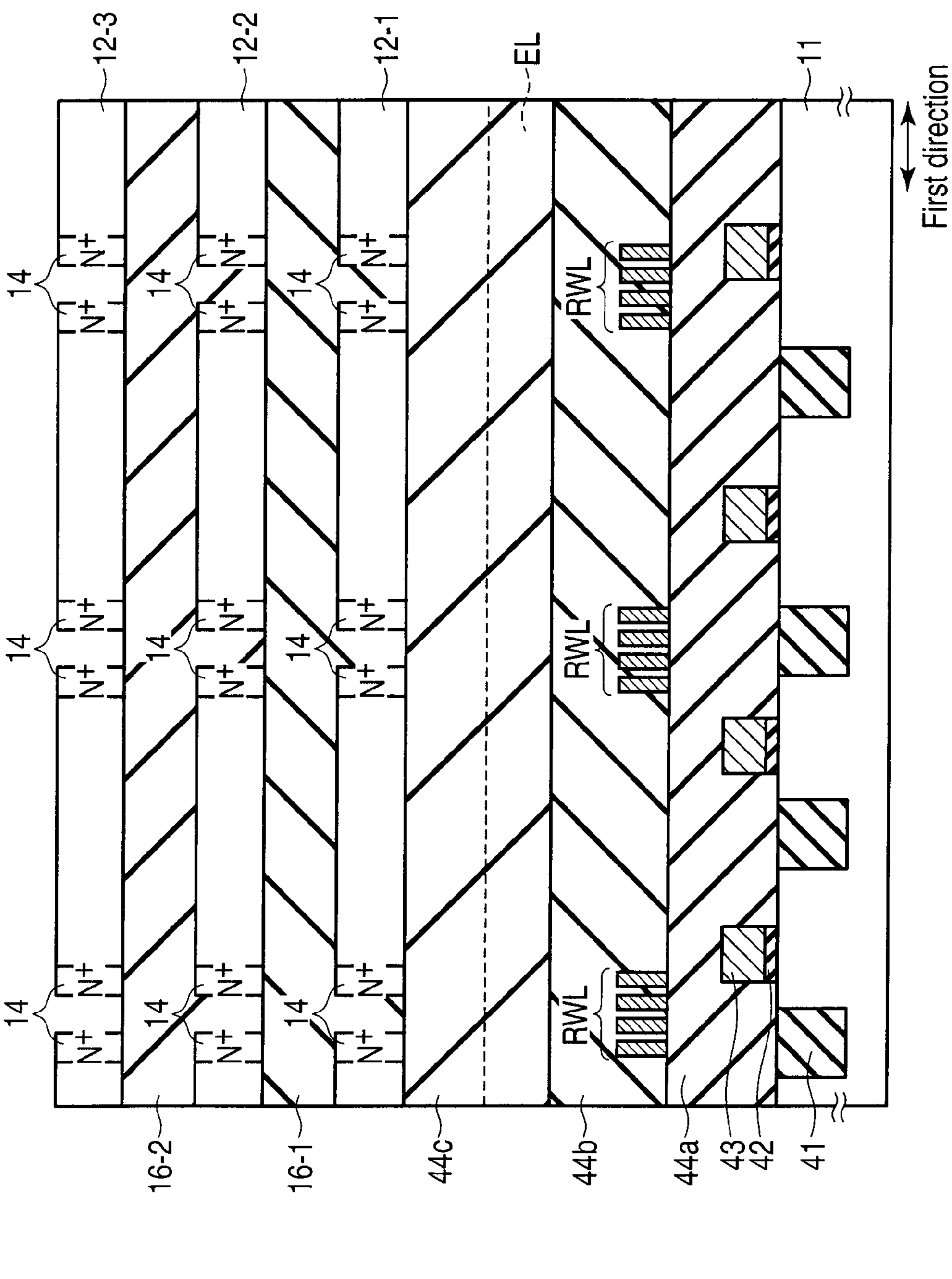

Subsequently, as shown in FIGS. 280 and 281, a resist pattern is formed by PEP. Using the formed resist pattern as a mask, third semiconductor layer 12-3 is patterned by RIE. This patterning process is done for the purpose of isolating N+-type diffusion layer 14 and P+-type diffusion layer 15 from each other.

In this example, fringe areas (contact areas) F of N+/P+-type diffusion layers 14, 15 in third semiconductor layer 12-3 do not overlap fringe areas (contact areas) F of N+/P+-type diffusion layers 14, 15 in first semiconductor layer 12-1 as shown in FIG. 272 and fringe areas (contact areas) F of N+/P+-type diffusion layers 14, 15 in second semiconductor layer 12-2 as shown in FIG. 276. This configuration allows vias to be independently in contact with respective semiconductor layers.

Figure 282:
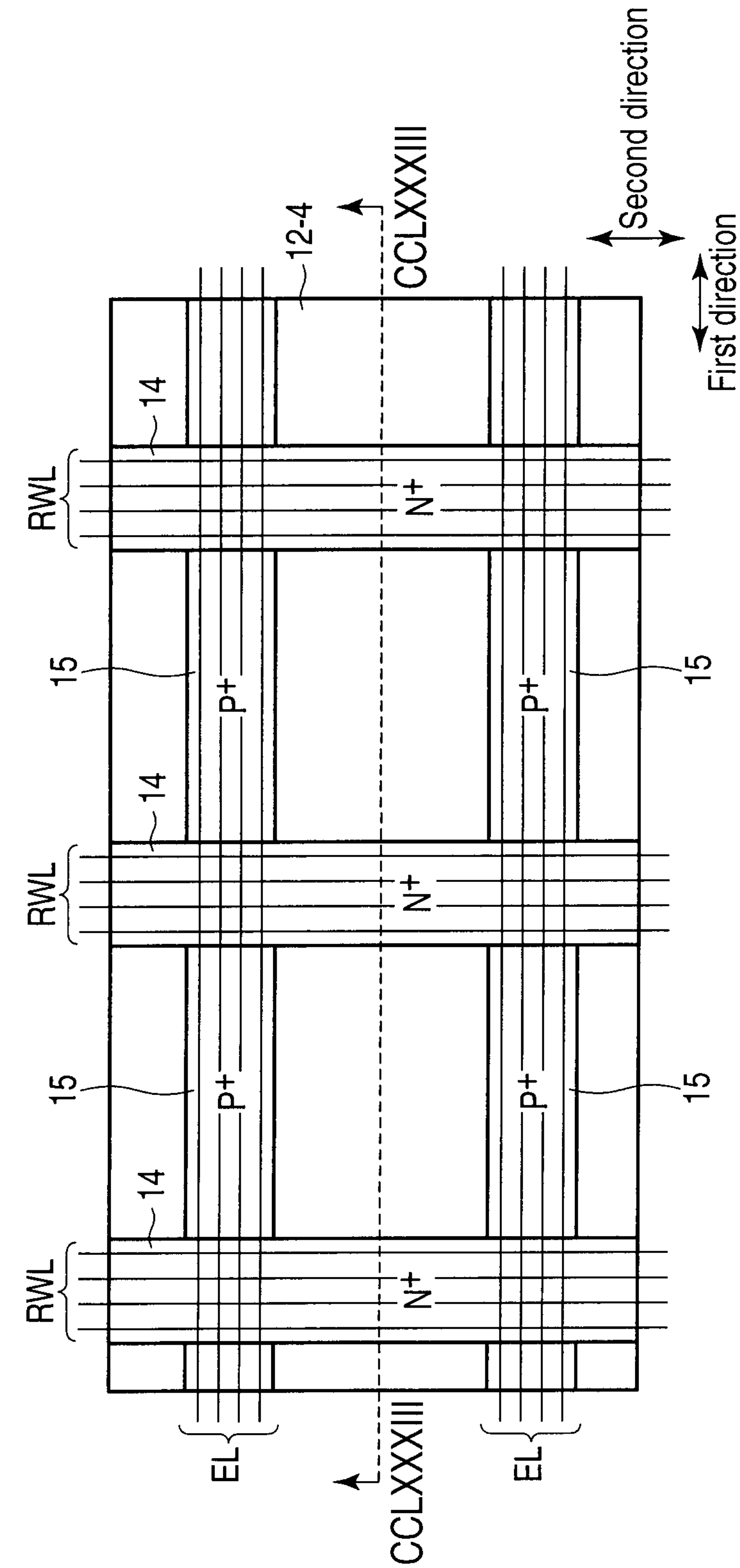
Figure 283:
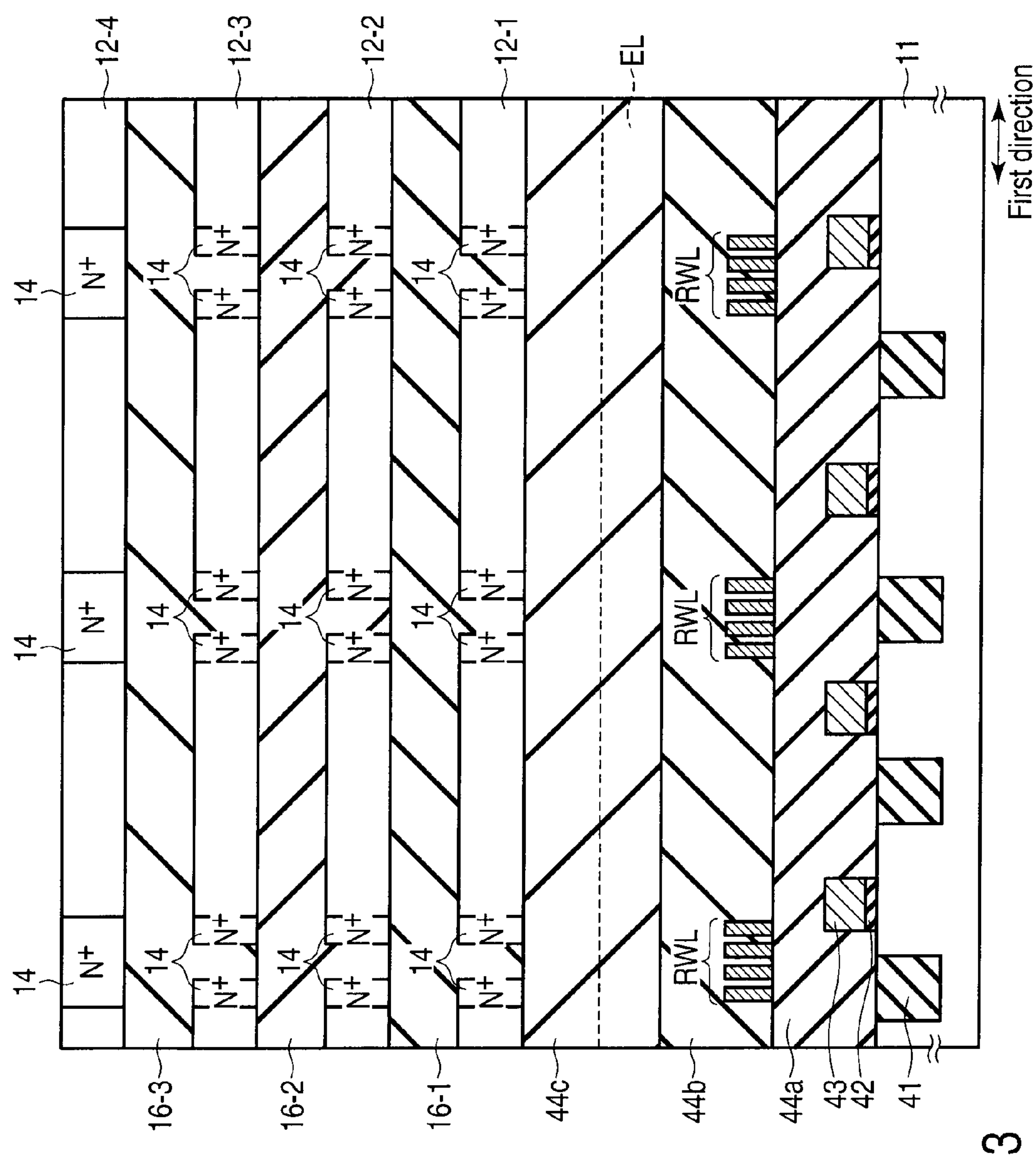

Subsequently, as shown in FIGS. 282 and 283, inter-layer insulating layer (element isolation insulating layer) 16-3 is formed using a method such as LPCVD. Inter-layer insulating layer (element isolation insulating layer) 16-3 fills grooves formed in third semiconductor layer 12-3 and covers third semiconductor layer 12-3. Then, the upper surface of third semiconductor layer 12-3 is smoothed.

Thereafter, fourth semiconductor layer (for example, polysilicon layer) 12-4 is formed on inter-layer insulating layer 16-3.

Then, a resist pattern is formed by PEP. Using the formed resist pattern as a mask, N-type impurities (for example, P and As) are injected into fourth semiconductor layer 12-4 by ion implantation. Thereafter, the resist pattern is removed.

Then, a resist pattern is formed again by PEP. Using the formed resist pattern as a mask, P-type impurities (for example, B) are injected into fourth semiconductor layer 12-4 by ion implantation. Thereafter, the resist pattern is removed.

As a result, N+-type diffusion layers 14 and P+-type diffusion layers 15 are formed in fourth semiconductor layer 12-4.

Figure 284:
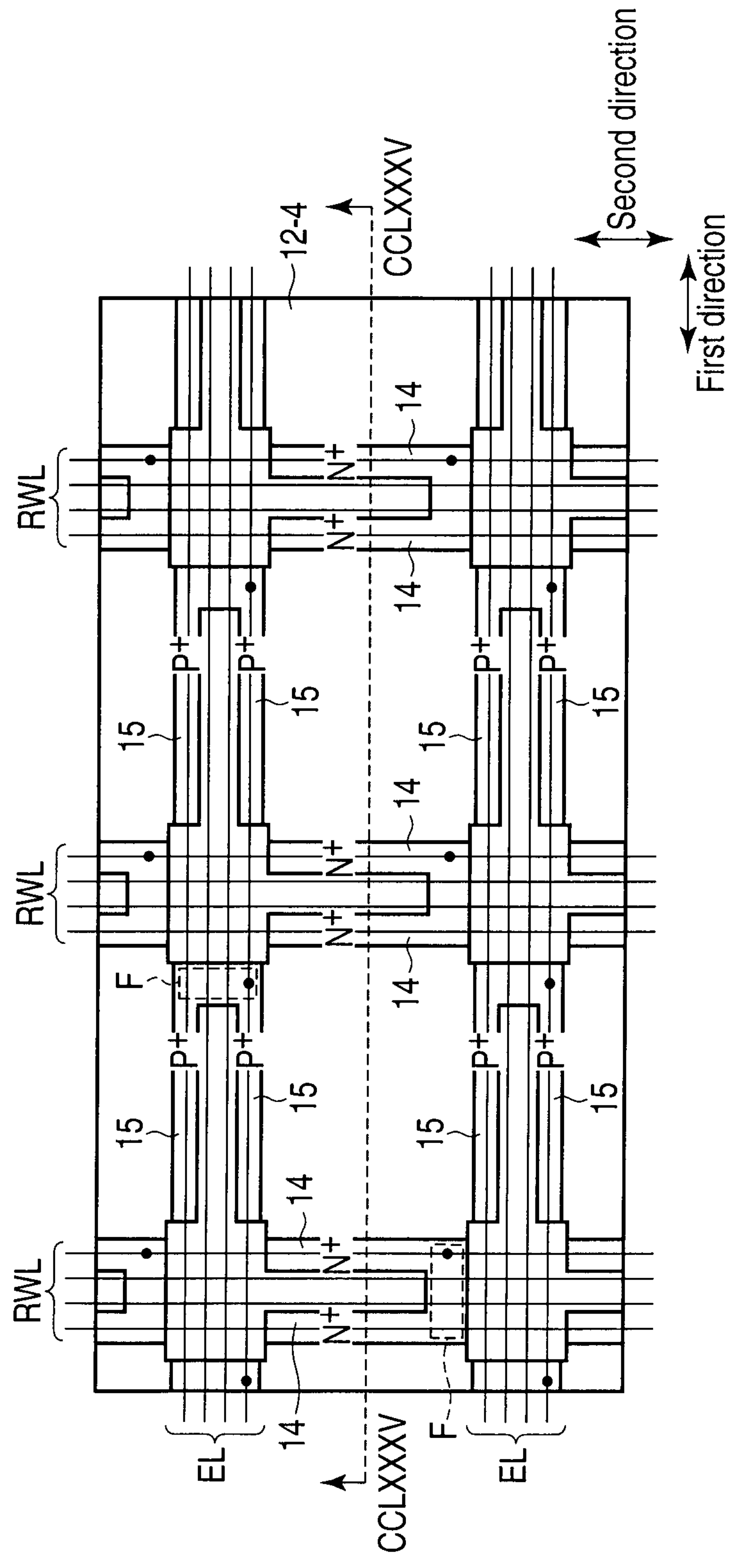
Figure 285:
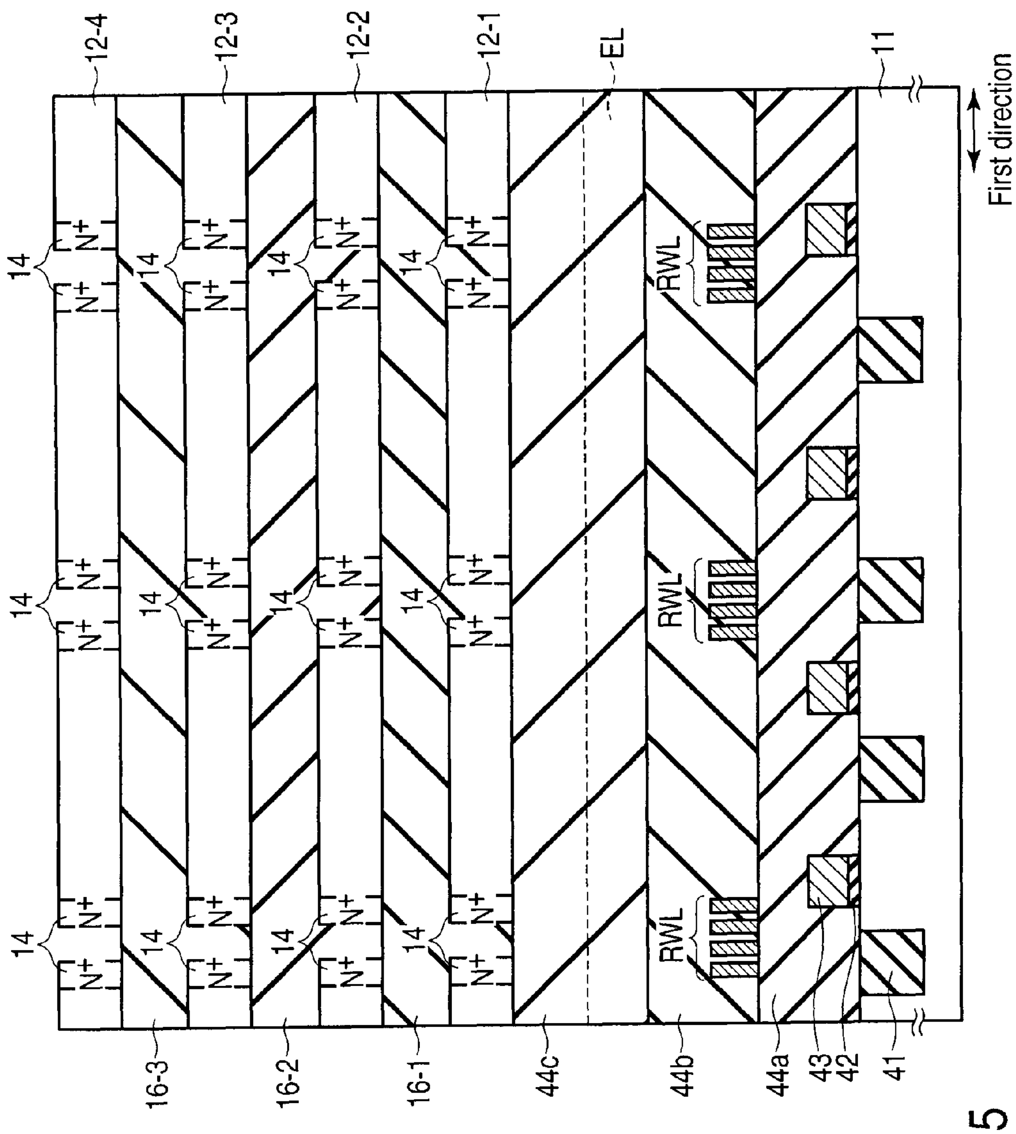

Subsequently, as shown in FIGS. 284 and 285, a resist pattern is formed by PEP. Using the formed resist pattern as a mask, fourth semiconductor layer 12-4 is patterned by RIE. This patterning process is done for the purpose of isolating N+-type diffusion layer 14 and P+-type diffusion layer 15 from each other.

In this example, fringe areas (contact areas) F of N+/P+-type diffusion layers 14, 15 in fourth semiconductor layer 12-4 do not overlap fringe areas (contact areas) F of N+/P+-type diffusion layers 14, 15 in first semiconductor layer 12-1 as shown in FIG. 272, fringe areas (contact areas) F of N+/P+-type diffusion layers 14, 15 in second semiconductor layer 12-2 as shown in FIG. 276, and fringe areas (contact areas) F of N+/P+-type diffusion layers 14, 15 in third semiconductor layer 12-3 as shown in FIG. 280. This configuration allows vias to be independently in contact with respective semiconductor layers.

As a result of the above steps, semiconductor layers 12-1, 12-2, 12-3, 12-4 are stacked and formed on semiconductor substrate 11.

Figure 286:
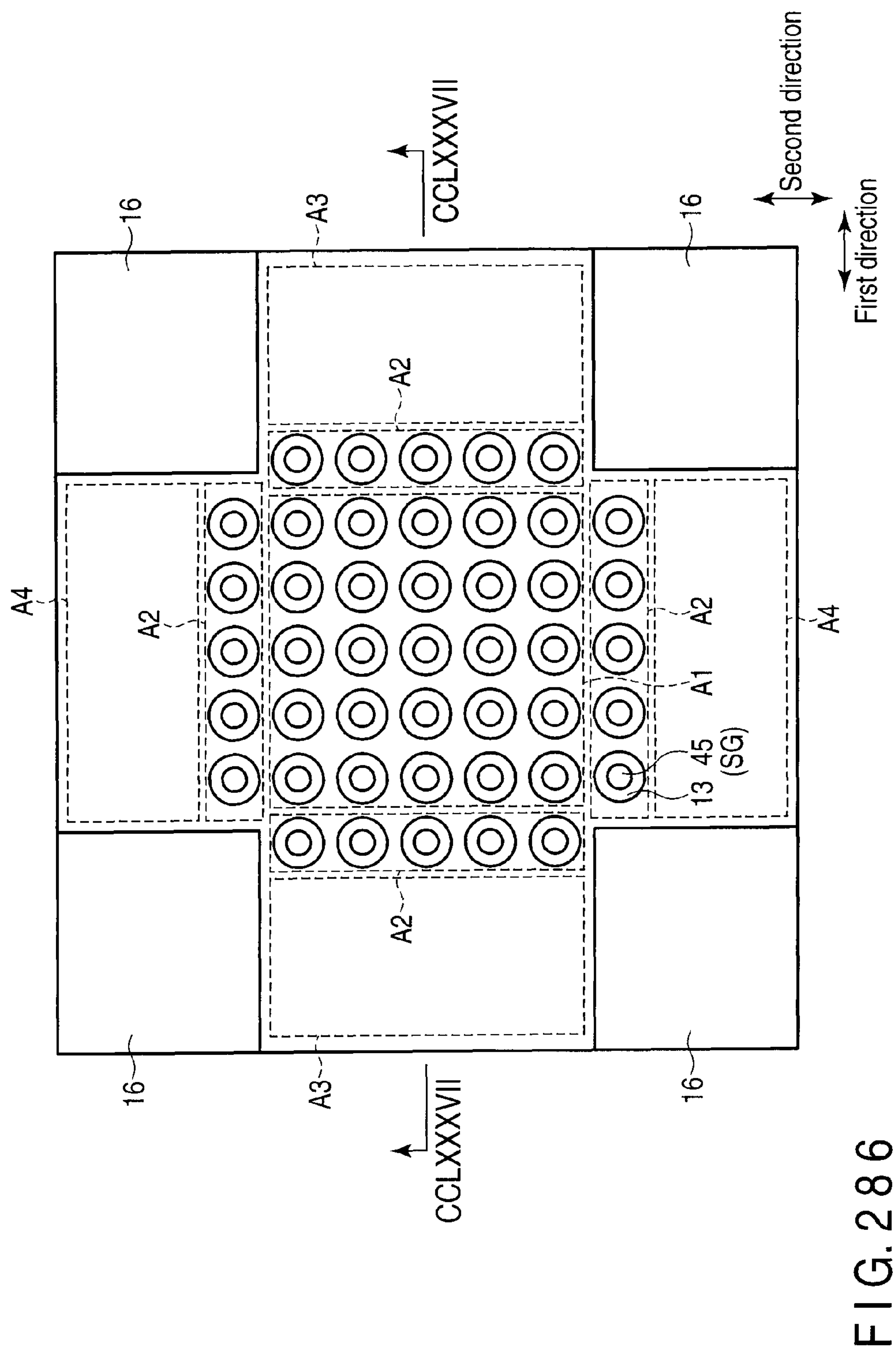
Figure 288:
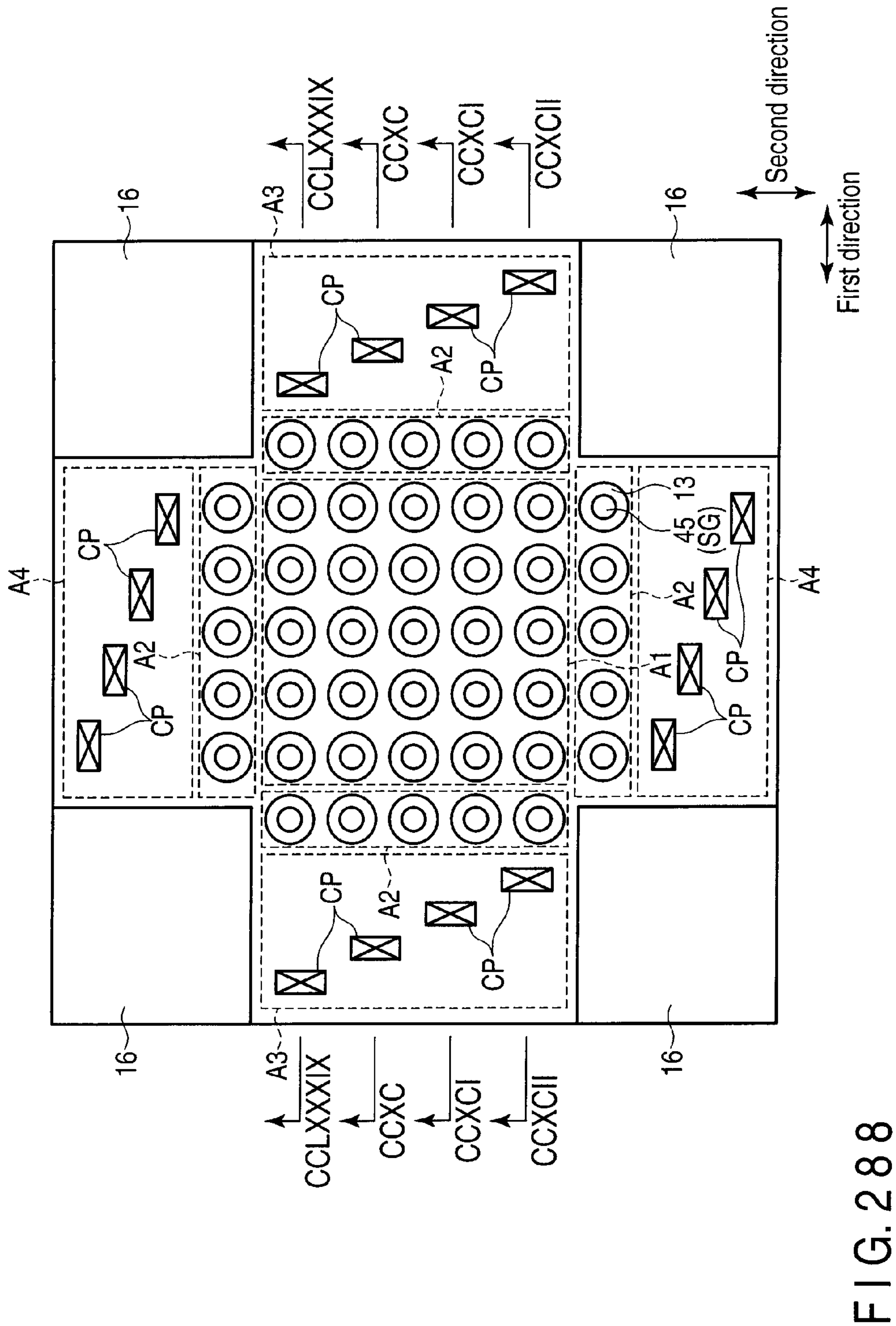

Subsequently, as shown in FIGS. 286 and 287, trenches are formed to pass through semiconductor layers 12-1, 12-2, 12-3, 12-4. Stacked layer structure (gate insulating layer, data recording layer, and block insulating layer or inter-electrode insulating layer) 13 are respectively formed on the inner surfaces of these trenches. Control gates 45 (CG) and select gates 45 (SG) are formed to fill these trenches.

A specific method for forming the memory cell array is the same as the method in the second example (FIGS. 187 to 192), for example. Therefore, detailed description thereabout is not repeated here.

Thereafter, as shown in FIGS. 288 to 292, contact plugs (vias) CP are formed to independently connect to N+/P+-type diffusion layers 14, 15 in first to fourth semiconductor layers 12-1, 12-2, 12-3, 12-4.

In this case, fringe areas F of N+/P+-type diffusion layers 14, 15 in first to fourth semiconductor layers 12-1, 12-2, 12-3, 12-4 are arranged not to overlap each other. Therefore, contact plugs CP extending in the third direction from respective read/write lines RWL and contact plugs CP extending in the third direction from respective erase lines EL are formed at a time, so that contact plugs (vias) CP can independently connect to respective N+/P+-type diffusion layers 14, 15 in a self aligned manner.

Figure 289:
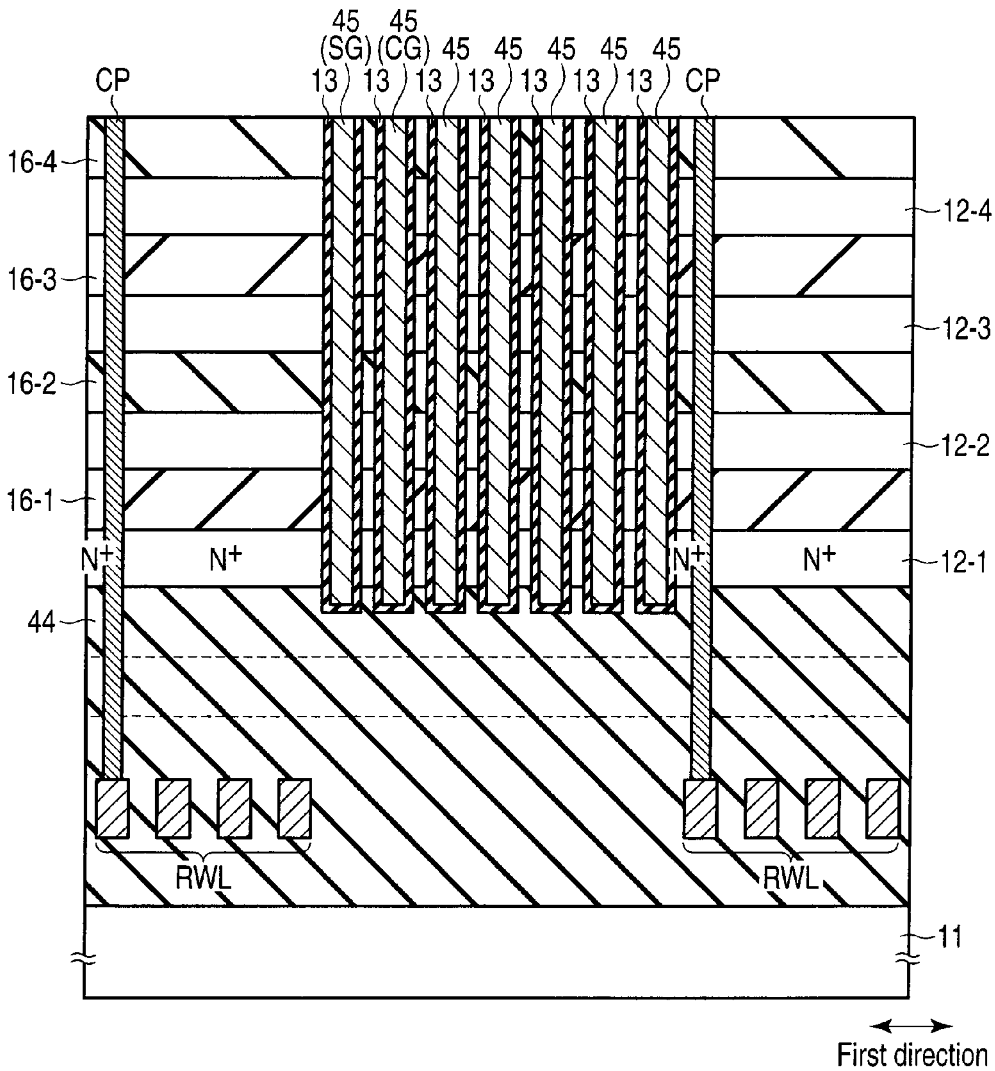

For example, as shown in FIG. 289, first read/write line RWL from the left independently connect to N+-type diffusion layer 14 in first semiconductor layer 12-1 via contact plug CP. As shown in FIG. 290, second read/write line RWL from the left independently connect to N+-type diffusion layer 14 in second semiconductor layer 12-2 via contact plug CP.

Figure 292:
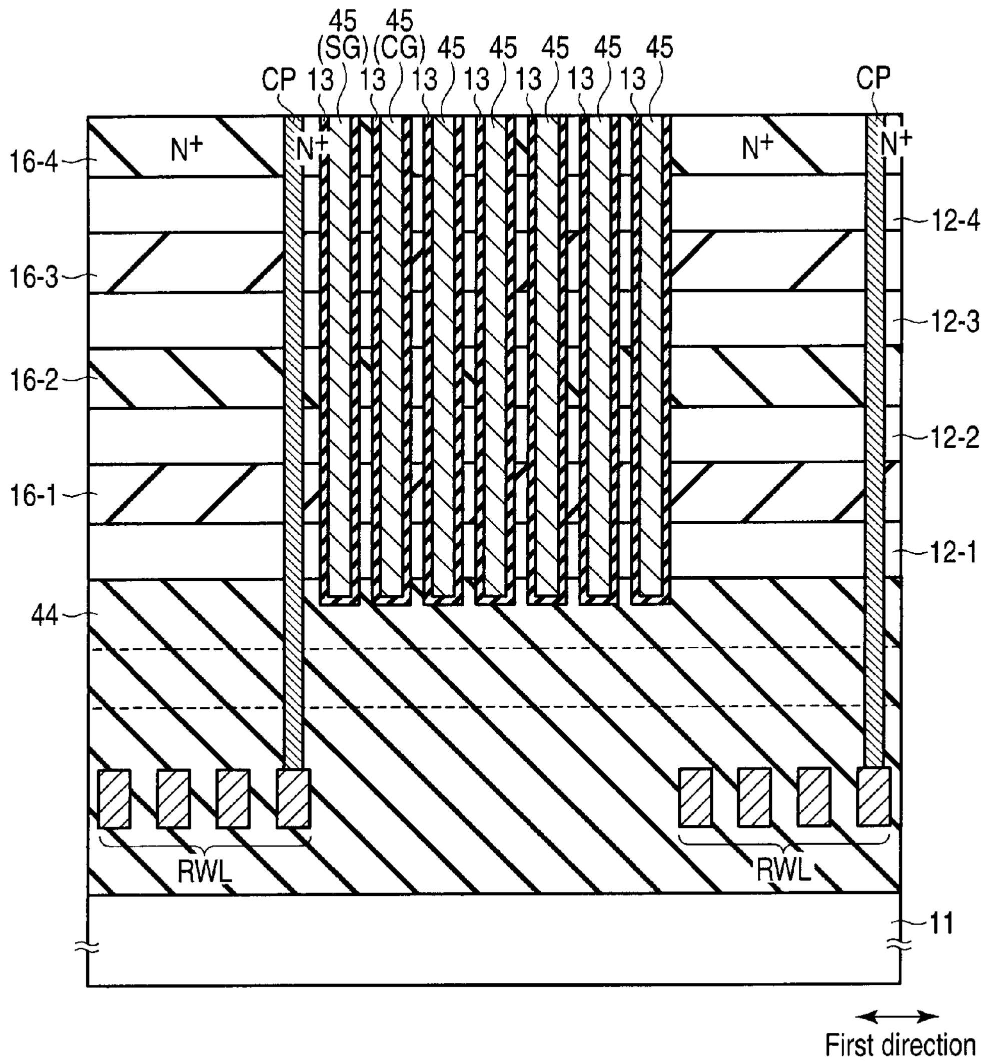

Further, as shown in FIG. 291, the third read/write line RWL from the left independently connect to N+-type diffusion layer 14 in third semiconductor layer 12-3 via contact plug CP. As shown in FIG. 292, first read/write line RWL from the right independently connect to N+-type diffusion layer 14 in fourth semiconductor layer 12-4 via contact plug CP.

Figure 293:
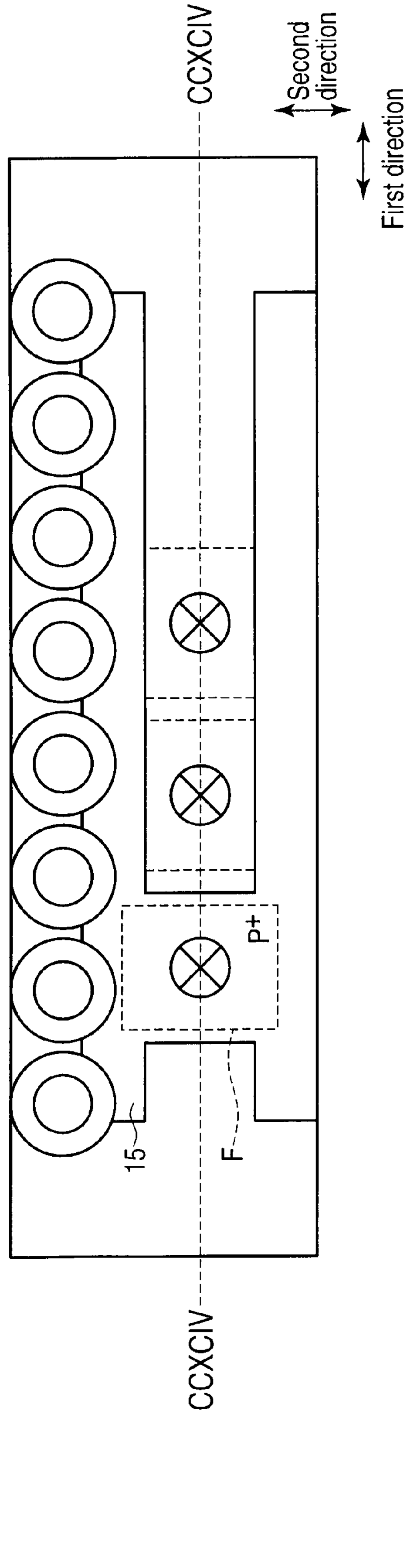
Figure 294:
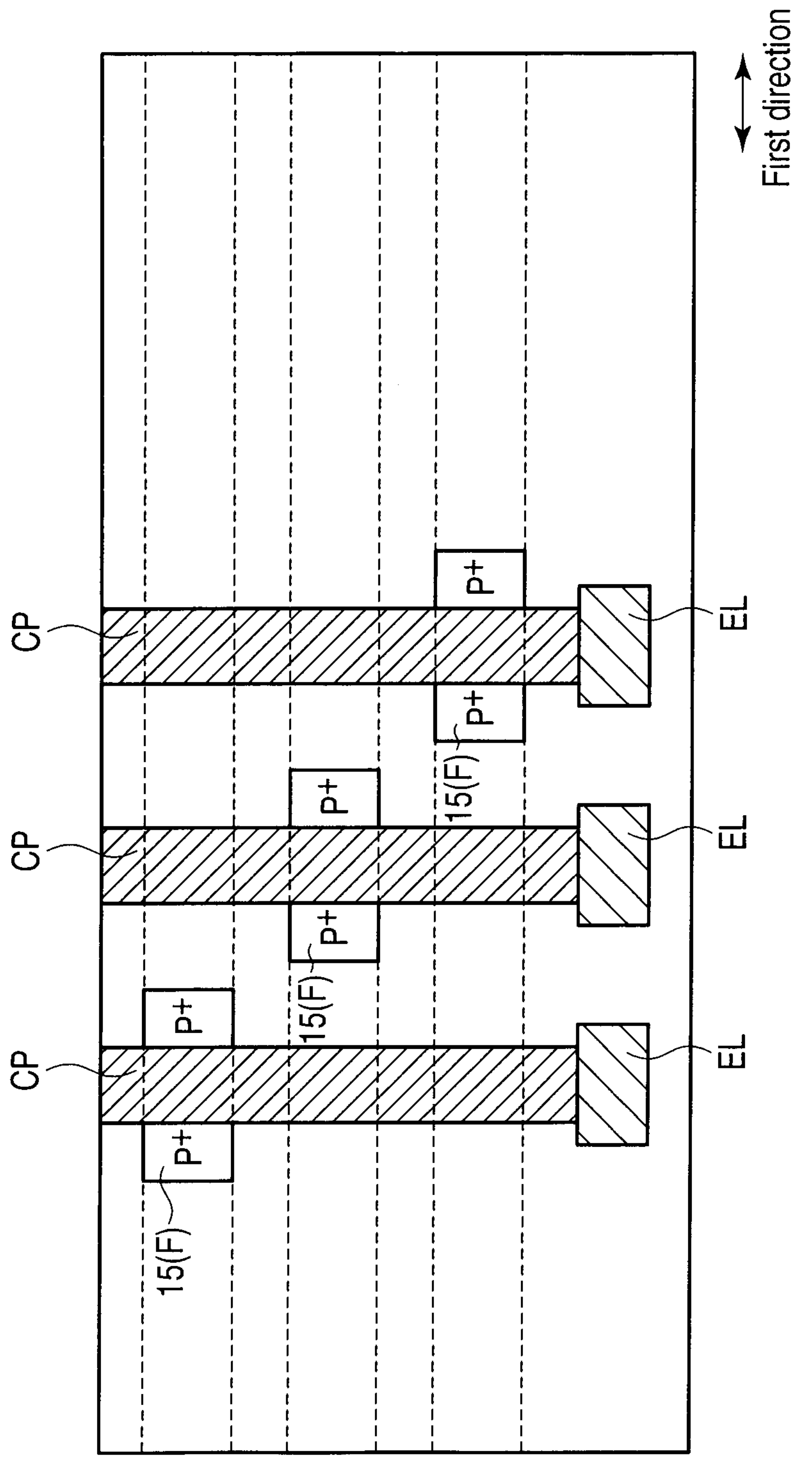

FIGS. 293 and 294 illustrate an overview of contact plugs CP connecting between erase lines EL and P+-type diffusion layers 15.

Since fringe areas F of P+-type diffusion layers 15 in first to fourth semiconductor layers 12-1, 12-2, 12-3, 12-4 are arranged not to overlap each other, P+-type diffusion layers 15 in first to fourth semiconductor layers 12-1, 12-2, 12-3, 12-4 can independently connect to erase lines EL.

In this passing through structure, the size of the hook up areas are less than those of the staircase structure explained in the second example.

(6) Sixth Example

FIGS. 295 to 302 illustrate the sixth example of method for producing a three-dimensional MaCS.

The sixth example relates to a production method of select transistors and word lines on a memory cell array.

Figure 295:
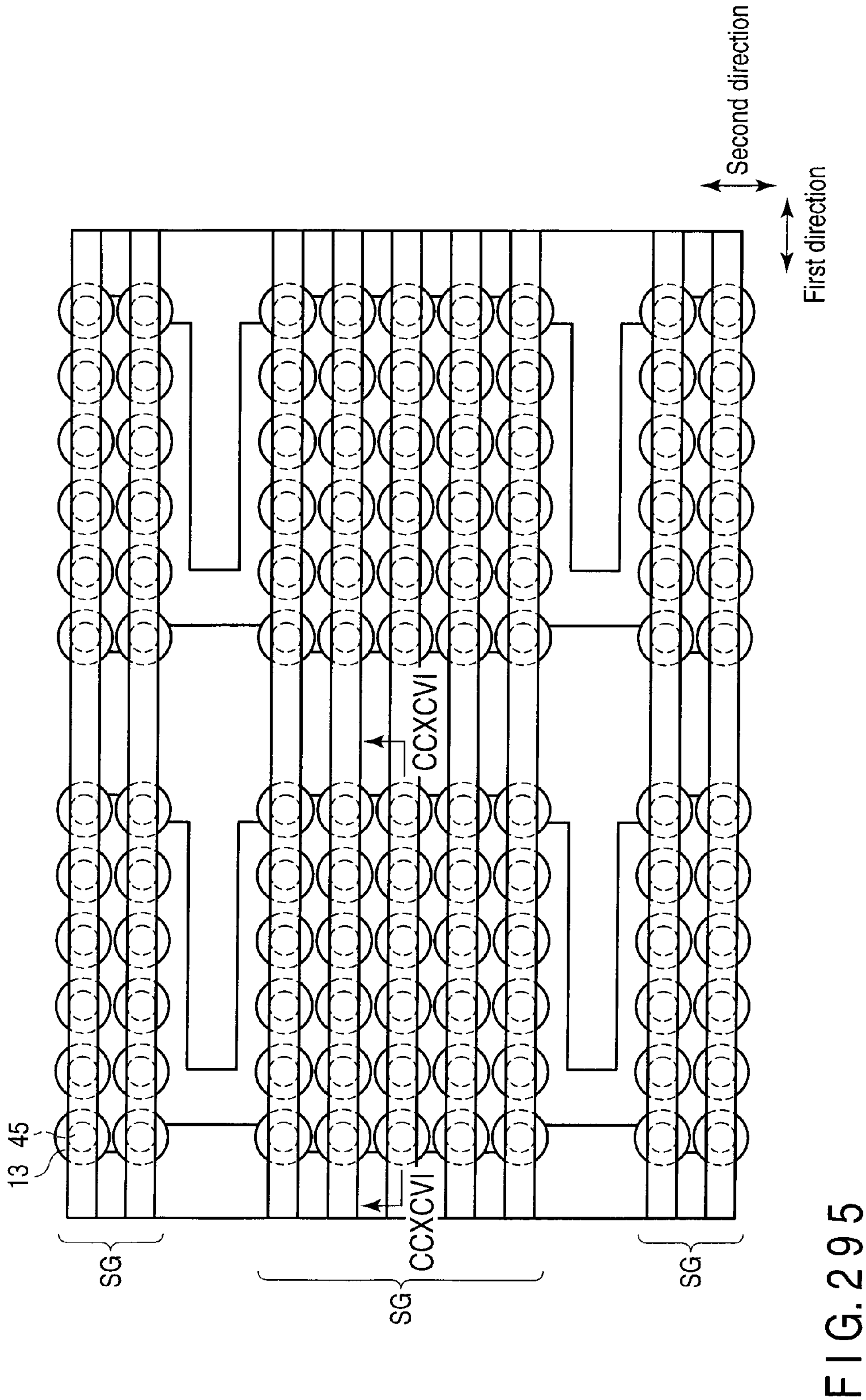

First, as shown in FIGS. 295 and 296, memory cell arrays are formed on semiconductor substrate 11, and inter-layer insulating layer 81*a* is formed on the memory cell arrays. The memory cell array is formed using the method as described above. FIG. 296 illustrate n-th semiconductor layer 12-*n* serving as the uppermost layer, stacked layer structures (gate insulating layer, data recording layer, block insulating layer or inter-electrode insulating layer) 13, and control gates (or select gates) 45.

In addition, select gate lines SG are formed using CVD, PEP, and RIE techniques. Select gate lines SG extend in the first direction on inter-layer insulating layer 81*a*.

Figure 297:
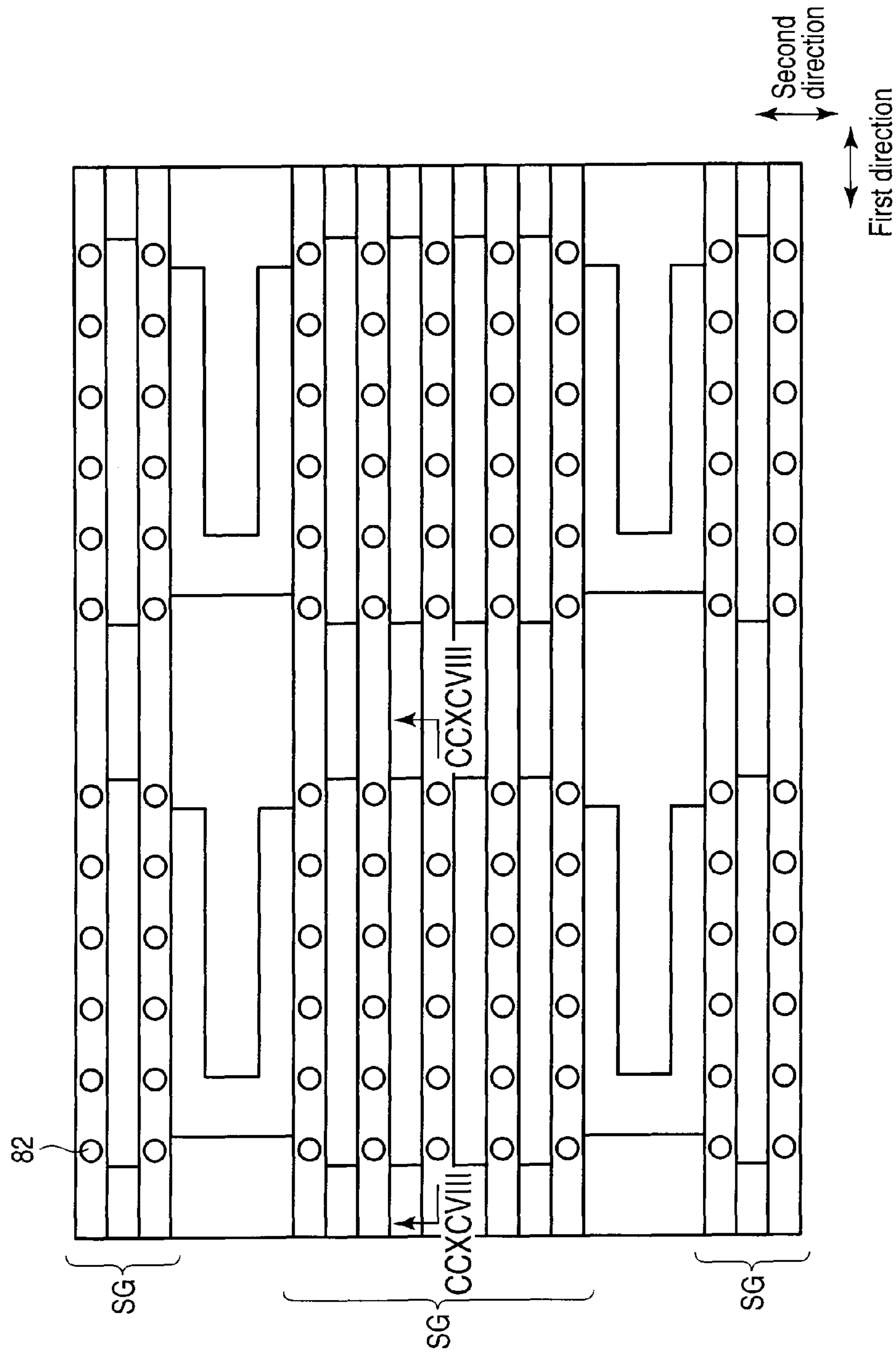

Subsequently, as shown in FIGS. 297 and 298, inter-layer insulating layers 81*b* are formed on select gate lines SG. In addition, using CVD, PEP, and RIE techniques, trenches 82 are formed in inter-layer insulating layers 81*a*, 81*b*. Trenches 82 pass through select gate lines SG, and the bottom surfaces of trenches 82 reach control gates (or select gates) 45.

Subsequently, as shown in FIG. 299, sidewall insulating layers 83 are formed on sidewalls of trenches 82 using CVD and RIE techniques. Sidewall insulating layers 83 are formed not to fill trenches 82 so as to allow the function as the gate insulating layer of the select transistor. On the other hand, the thickness of inter-layer insulating layer 81*b* is sufficiently thick, so as to uniformize the thicknesses of sidewall insulating layers 83 between select gate lines SG (widths in the first and second directions).

Thereafter, N-type semiconductor layers (for example, N+-type impurities doped polysilicon) 84 doped with N-type impurities are formed in trenches 82. Then, recess etching is executed on N-type semiconductor layers 84, so as to cause the upper surfaces of N-type semiconductor layers 84 to be substantially the same as the lower surfaces of select gate lines SG.

Subsequently, as shown in FIG. 300, P-type semiconductor layers (for example, P−-type impurities doped polysilicon) 85 doped with P-type impurities are formed in trenches 82. Then, recess etching is executed on P-type semiconductor layers 85, so as to cause the upper surfaces of P-type semiconductor layers 85 to be substantially the same as the upper surfaces of select gate lines SG.

Subsequently, N-type semiconductor layers (for example, N+-type impurities doped polysilicon) 86 doped with N-type impurities are formed in trenches 82. Then, recess etching is executed on N-type semiconductor layers 86*s*, so as to cause the upper surfaces of N-type semiconductor layers 86 to be substantially the same as the upper surface of inter-layer insulating layer 81*b*.

Figure 301:
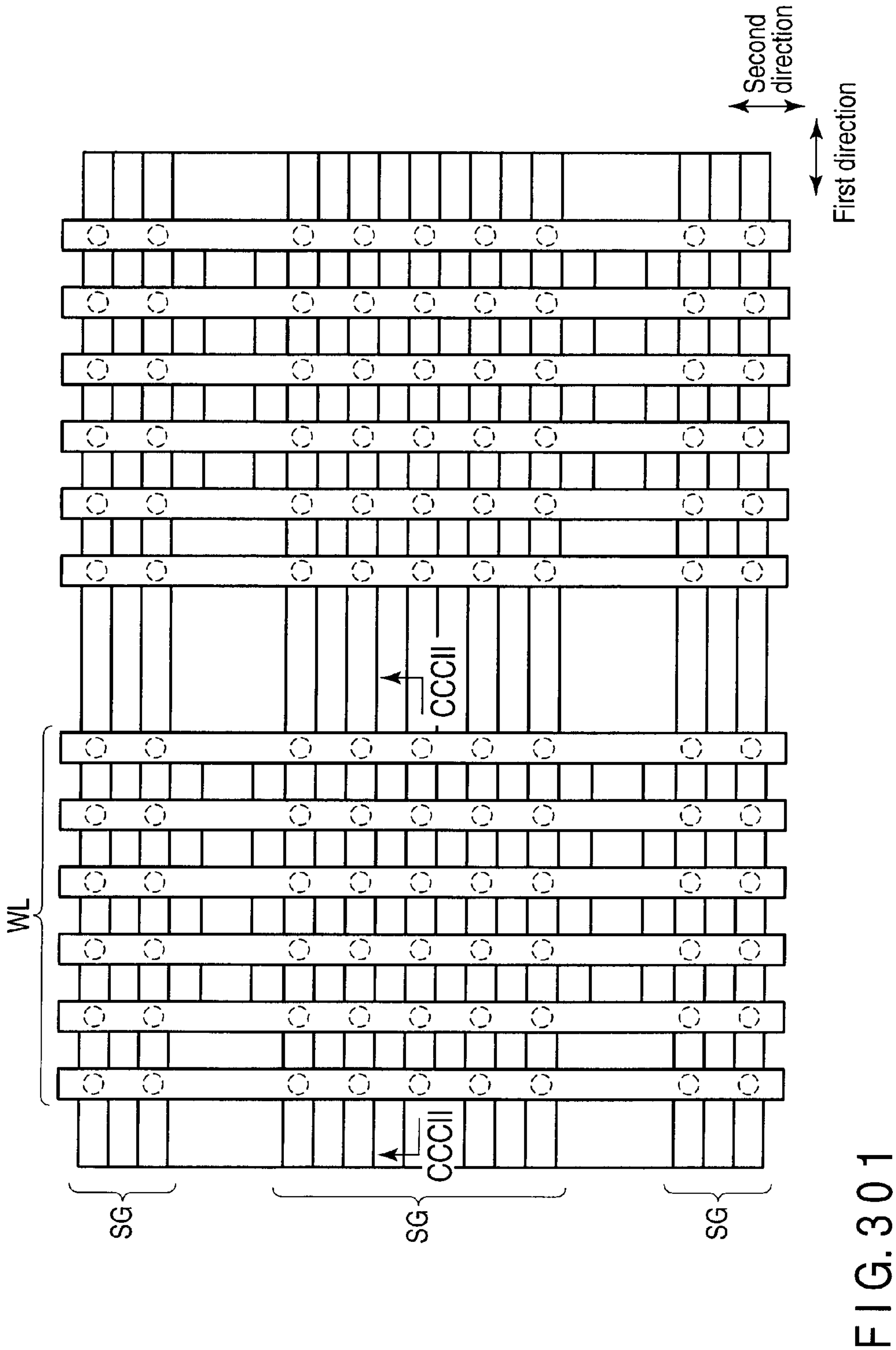

Subsequently, as shown in FIGS. 301 and 302, word lines WL are formed using CVD, PEP, and RIE techniques. Word lines WL extend in the second direction on inter-layer insulating layer 81*a*, and come into contact with N-type semiconductor layers 86.

As a result of the above steps, the select transistors and the word lines of the three-dimensional MaCS are formed.

(7) Seventh Example

FIGS. 303 to 306 illustrate the seventh example of method for producing a three-dimensional MaCS.

The seventh example relates to a production method of a memory cell array in which data recording layers are independently arranged for respective memory cells. As described above, the data recording layer of the memory cell may be made of any one of a conductor, an insulating material, and a variable resistance material. In this example, however, a floating gate-type memory cell in which a data recording layer is made of a conductor will be explained.

Figure 303:
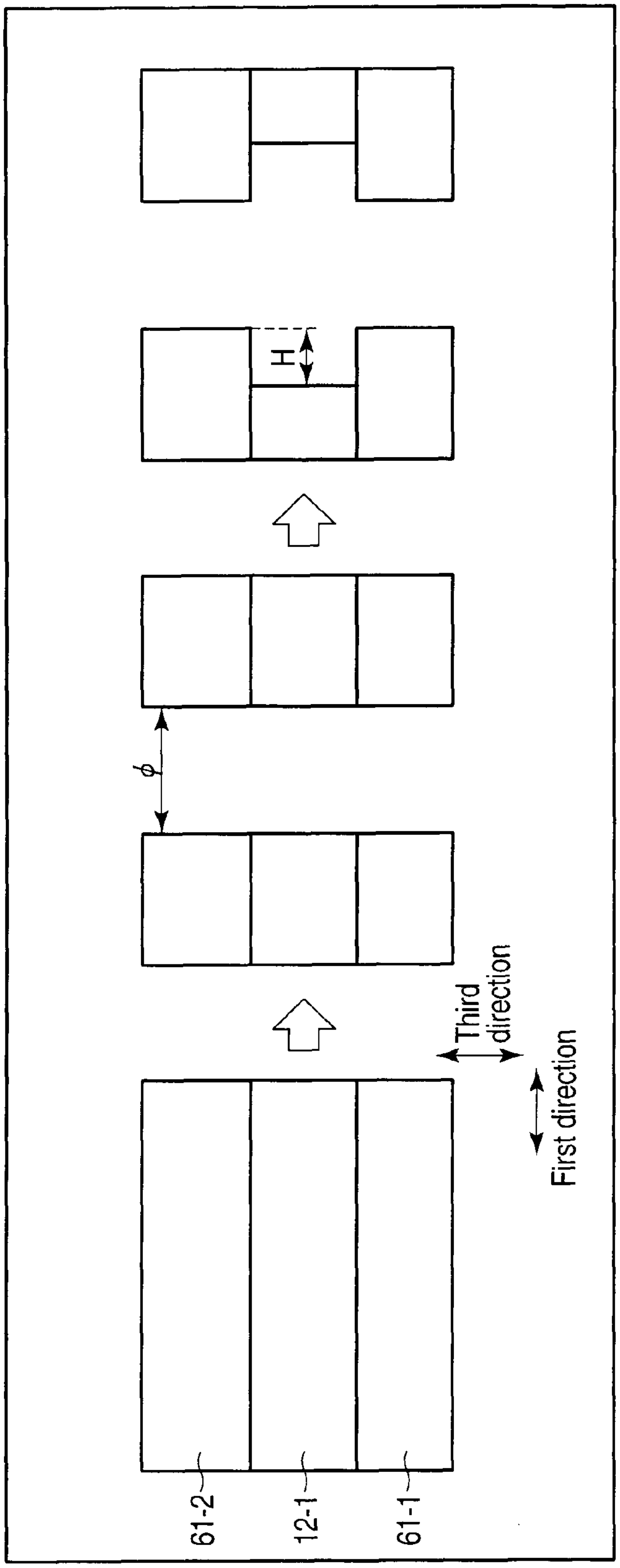

First, as shown in FIG. 303, a stacked layer structure including first compound semiconductor layer 61-1, first single-crystal semiconductor layer 12-1, and second compound semiconductor layer 61-2 is formed. In this case, only first semiconductor layer 12-1 is shown for the sake of simplifying the explanation. However, when this production method is applied to the three-dimensional MaCS, first to n-th semiconductor layers are naturally stacked.

Thereafter, for example, a trench having a diameter ϕ is formed. In addition, first semiconductor layer 12-1 is selectively etched, so that the side surface in the first direction of first semiconductor layer 12-1 is reduced. In this case, the side surface of first semiconductor layer 12-1 is etched by H (for example, about 20 nm) in the first direction.

Figure 304:
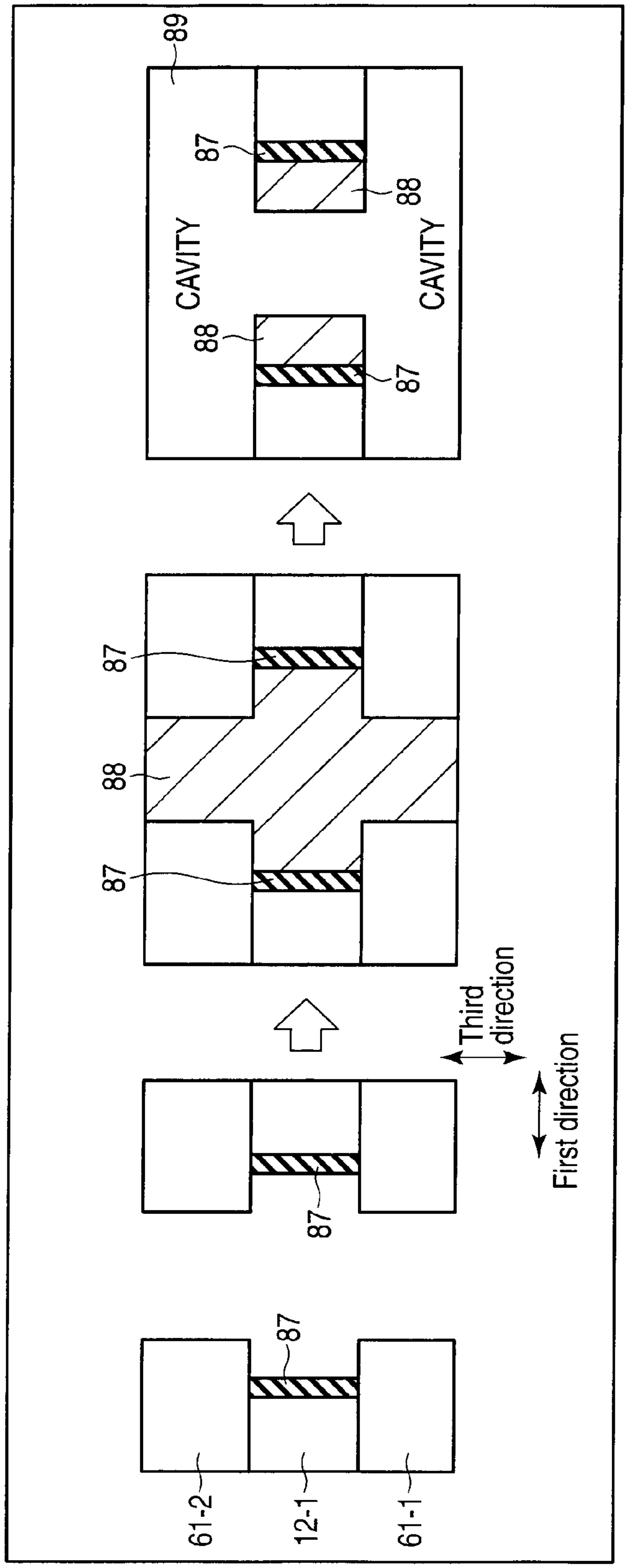

Subsequently, as shown in FIG. 304, gate insulating layers 87 are formed by thermal oxidation on the side surfaces in the first direction of first semiconductor layer 12-1. Gate insulating layer 87 is, for example, oxide silicon having a thickness of about 8 nm. Subsequently, the trench is filled with a conductor (for example, polysilicon including P-type impurities) 88.

Then, conductor 88 is selectively etched by RIE, for example. Conductor 88 is left only in recessed portions (portions having width H in FIG. 303) between first and second compound semiconductor layers 61-1, 61-2. Conductor 88 is a floating gate in an electrically floating state.

Thereafter, when first and second compound semiconductor layers 61-1, 61-2 are selectively removed, cavities are formed above and below first semiconductor layer 12-1.

Subsequently, as shown in FIG. 305, the cavities are filled with insulating layers (for example, oxide silicon) 90 by thermal oxidation, for example. In this example, insulating layers 90 fill only the cavity and do not fill trenches. Inter-electrode insulating layers 91 are formed on side surfaces of the trench, i.e., on the side surfaces in the first direction of conductors 88 serving as floating gates. Inter-electrode insulating layers 91 are made of ONO (oxide/nitride/oxide) materials, for example.

Finally, the trench is filled with control gate (for example, polysilicon including P-type impurities) 92. Thus, the memory cell array in which the data recording layers (in this example, floating gates) are arranged independently for respective memory cells is produced.

For example, a device structure as shown in FIG. 306 can be obtained by applying the production method of this example to the three-dimensional MaCS. In FIG. 306, the same elements as those in FIGS. 303 to 305 are denoted with the same reference numerals. Numerals 12-2 and 12-3 denote the second and third semiconductor layers, respectively.

8. SELECTION TECHNIQUE OF STACKED SEMICONDUCTOR LAYERS

(1) Basic Concept

In the MaCS according to the present disclosure, the memory size can be increased by increasing the number of stacked semiconductor layers. However, when the number of stacked semiconductor layers is increased, this increases the size of the hook up areas for providing contacts with the semiconductor layers.

For example, the sizes of hook up areas increase in proportional to the number of stacked semiconductor layers in any of the staircase structure as shown in FIGS. 155 and 156, the bent structure as shown in FIGS. 157 and 158, and the passing through structure as shown in FIGS. 159 to 170 as described above.

In particular, when the number of stacked semiconductor layers becomes more than 20 in the bent structure as shown in FIGS. 157 and 158, the size of the hook up areas becomes larger than the size of the memory cell array and the select transistor area, and this limits the increase of the memory size.

Accordingly, a technique will be hereinafter suggested in order to suppress the increase of the size of the hook up areas even when the number of stacked semiconductor layers increases.

Figure 307:
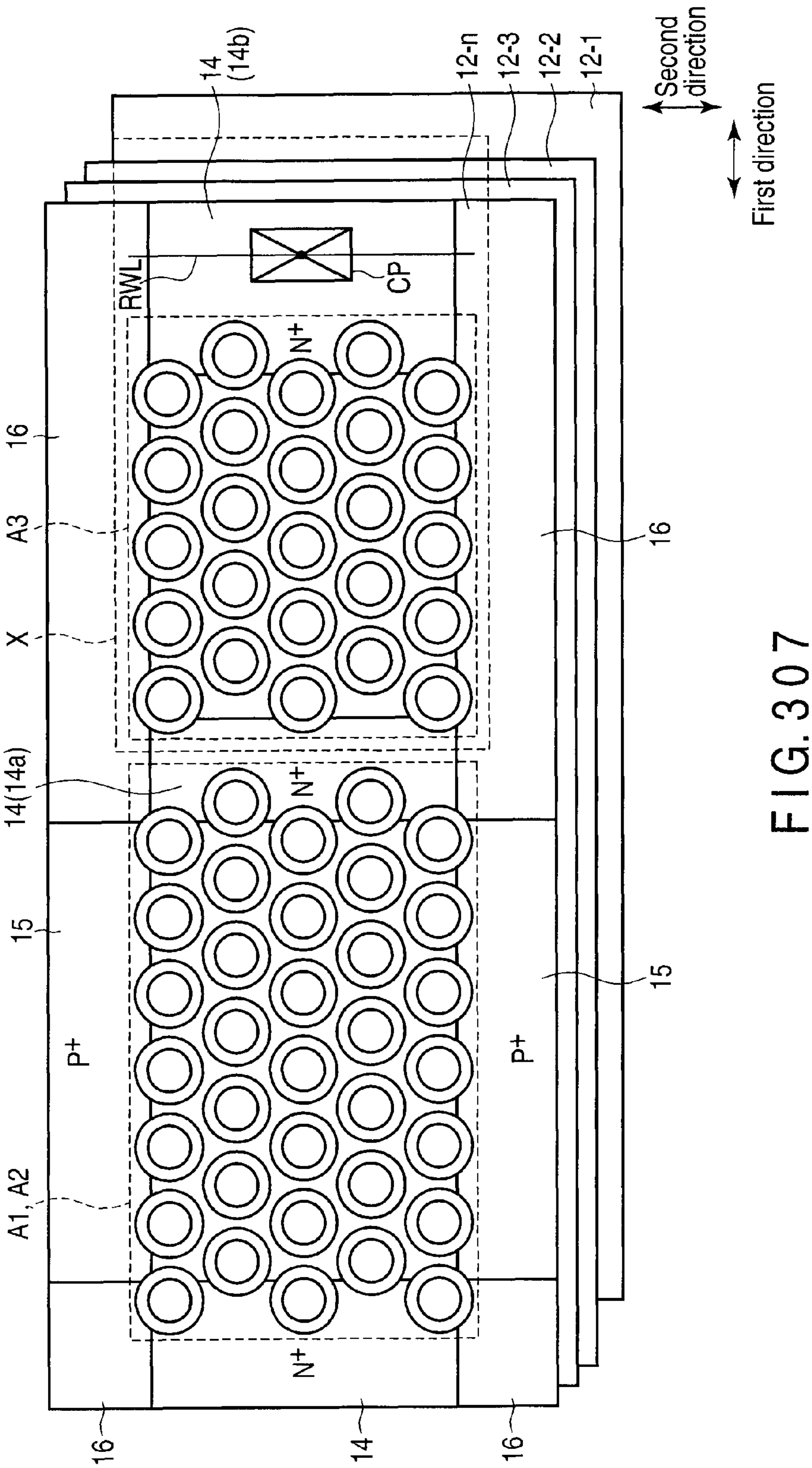

FIG. 307 is a top view illustrating the three-dimensional MaCS according to the present disclosure.

In this example, it is assumed that first to n-th (n is a natural number of 2 or more) semiconductor layers 12-1, 12-2, 12-3, . . . **12-*n*** are stacked on a semiconductor substrate.

A memory cell array and select transistors are formed in memory cell array/select transistor areas A1, A2. The structure of the memory cell arrays and select transistors have already been explained in detail. Therefore, description thereabout is not repeated here.

N+-type diffusion layers 14 are provided at ends in the first direction of memory cell array/select transistor areas A1, A2. P+-type diffusion layers 15 are provided at ends in the second direction of memory cell array/select transistor areas A1, A2.

N+-type diffusion layers **14*a*, 14*b* are provided in hook up areas A3. Select transistor array X is provided between N+-type diffusion layers 14*a*, 14*b*. Read/write line RWL is commonly connected to N+-type diffusion layers 14*b* in first to n-th semiconductor layers 12-1, 12-2, 12-3, . . . 12-*n*** via contact plug CP.

Select transistor array X has the same structure as the memory cell array in memory cell array/select transistor areas A1, A2. In other words, the MaCS according to the present disclosure decodes select transistor array X and control electrical connection between read/write lines RWL and the memory cell array in each semiconductor layer.

Figure 308:
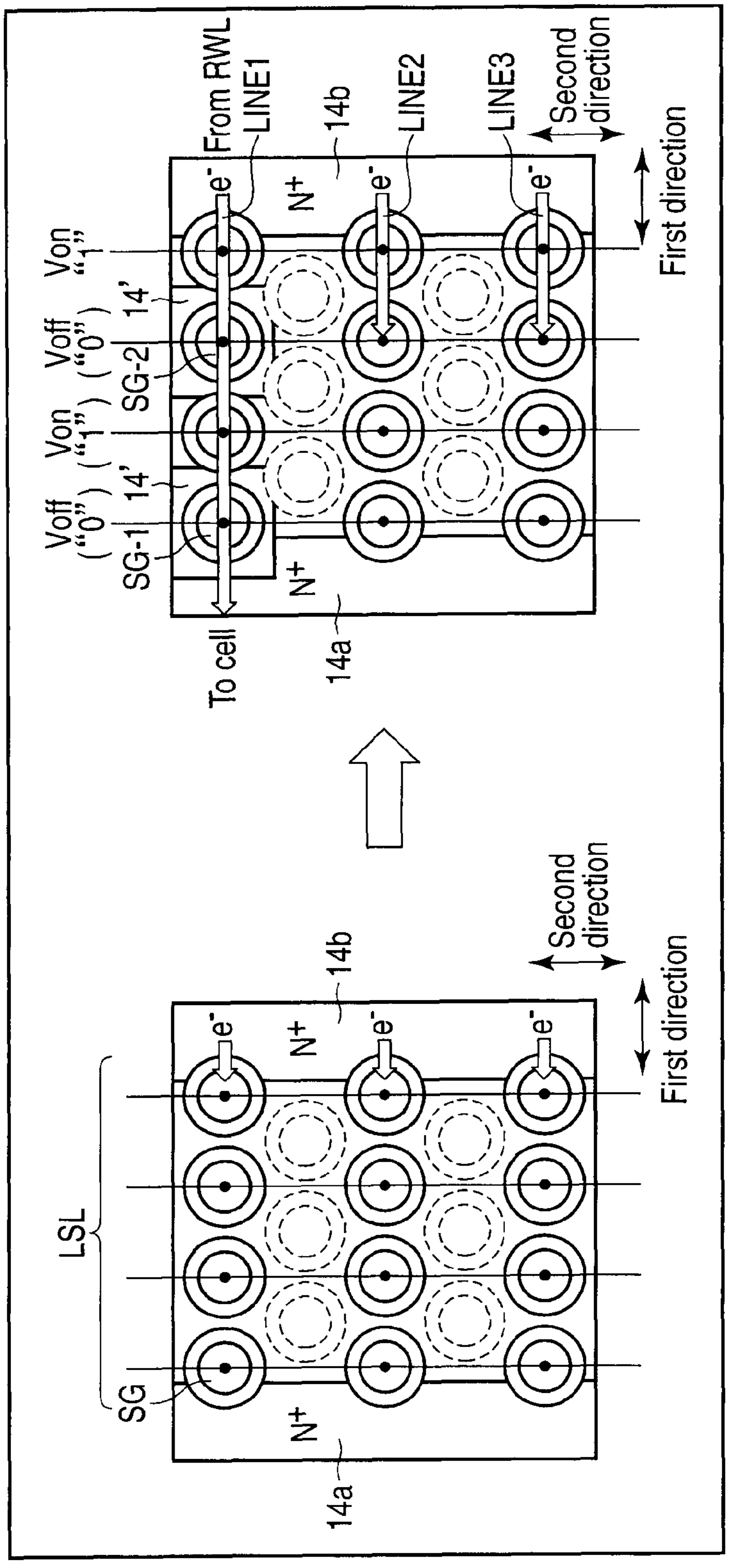

FIG. 308 illustrates the principle of the present disclosure.

Select gates SG comprising select transistor array X are connected to layer selection lines LSL. The select transistor array X is decoded on the basis of a combination of potentials given to layer selection lines LSL.

For example, in FIG. 308, N−-type impurities are doped to the channels of select gates SG-1, SG-2, whereby N-type channel regions 14' are formed. Accordingly, irrespective of the potentials of layer selection lines LSL, select gates SG-1, SG-2 are always in ON state. The other select gates are turned on/off in accordance with the potentials of layer selection lines LSL.

In this case, for example, when (0101)-signal is given to layer selection lines LSL, first line LINE1 has an electric conduction path formed from N+-type diffusion layer **14*b* to N+-type diffusion layer 14*a*. In contrast, second and third lines LINE2, LINE3 do not have the electric conduction path from N+-type diffusion layer 14*b* to N+-type diffusion layer 14*a***.

This kind of decoding method is applied to selection of first to n-th semiconductor layers.

(2) Embodiment

FIG. 309 illustrates a select transistor array. FIG. 310 shows first semiconductor layer (the first layer) 12-1. FIG.

311 shows second semiconductor layer (the second layer) 12-2. FIG. 312 shows third semiconductor layer (the third layer) 12-3. FIG. 313 shows fourth semiconductor layer (the fourth layer) 12-4.

Select transistor array X has first to fourth lines LINE1, LINE2, LINE3, LINE4. First line LINE1 is used to select first semiconductor layer 12-1. Second line LINE2 is used to select second semiconductor layer 12-2. Third line LINE3 is used to select third semiconductor layer 12-3. Fourth line LINE1 is used to select fourth semiconductor layer 12-4.

As shown in FIG. 310, in first semiconductor layer 12-1, N−-type impurities are doped to the channels of two select gates at both ends (the first select gate and the fourth select gate from the left) among four select gates comprising first line LINE1, so that the channels of these two select gates are always in ON state.

As shown in FIG. 311, in second semiconductor layer 12-2, N−-type impurities are doped to the channels of two select gates, i.e., the first select gate and the third select gate from the left, among the four select gates comprising second line LINE2, so that the channels of these two select gates are always in ON state.

As shown in FIG. 312, in third semiconductor layer 12-3, N−-type impurities are doped to the channels of two select gates, i.e., the second select gate and the fourth select gate from the left, among the four select gates comprising third line LINE3, so that the channels of these two select gates are always in ON state.

As shown in FIG. 313, in fourth semiconductor layer 12-4, N−-type impurities are doped to the channels of two select gates, i.e., the second select gate and the third select gate from the left, among the four select gates comprising fourth line LINE4, so that the channels of these two select gates are always in ON state.

In this case, for example, when (0110)-signal is given to layer selection lines LSL as shown in FIG. 314, first line LINE1 of first semiconductor layer 12-1 has an electric conduction path formed from N+-type diffusion layer 14*b* to N+-type diffusion layer 14*a*. In other words, first semiconductor layer 12-1 is selected, read/write line RWL is electrically connected to the memory cell array in first semiconductor layer 12-1.

In contrast, second to fourth lines LINE2, LINE3, LINE4 in second to fourth semiconductor layers 12-2, 12-3, 12-4 do not have electric conduction paths formed from N+-type diffusion layer 14*b* to N+-type diffusion layer 14*a*. Therefore, read/write line RWL is not electrically connected to the memory cell arrays in second to fourth semiconductor layers 12-2, 12-3, 12-4.

As shown in FIG. 315, second semiconductor layer 12-2 can be selected by giving (0101)-signal to layer selection lines LSL. Third semiconductor layer 12-3 can be selected by giving (1010)-signal to layer selection lines LSL. Further, fourth semiconductor layer 12-4 can be selected by giving (1001)-signal to layer selection lines LSL.

By the way, in the decoding method according to the present disclosure, one bit is represented by two columns (surrounded by broken line in FIG. 315) of the select transistor array. In an ordinary decoding method, one bit can represent two values. Therefore, in the decoding method according to the present disclosure, one bit (two basic columns) can be used to select two semiconductor layers.

Therefore, for example, when the number of stacked semiconductor layers is 4 (=22) (decodable with two bits), it is necessary to have four columns (=two basic columns×two bits) of select transistors. On the other hand, it is necessary to have the same number of lines as the number of semiconductor layers.

Therefore, select transistor array X needs to have 4 lines by 4 columns in order to select one of the four stacked semiconductor layers.

For example, when the number of stacked semiconductor layers is 8 (=$2^3$) (decodable with three bits), it is necessary to have six columns (=two basic columns×three bits) of select transistors. On the other hand, it is necessary to have the same number of lines as the number of semiconductor layers.

Therefore, select transistor array X needs to have 8 lines by 6 columns in order to select one of the eight stacked semiconductor layers.

For example, when the number of stacked semiconductor layers is 32 (=$2^5$) (decodable with five bits), it is necessary to have ten columns (=two basic columns×five bits) of select transistors. On the other hand, it is necessary to have the same number of lines as the number of semiconductor layers.

Therefore, select transistor array X needs to have 32 lines by 10 columns in order to select one of the 32 stacked semiconductor layers.

In general, when the number of stacked semiconductor layers is 2Z (decodable with Z bits), it is necessary to have (2×Z) columns (=two basic columns×Z bits) of select transistors. On the other hand, it is necessary to have the same number of lines as the number of semiconductor layers.

Therefore, select transistor array X needs to have 2Z lines by (2×z) columns in order to select one of the 2Z stacked semiconductor layers.

As described above, in the selection technique (decoding technique) of the semiconductor layers according to the present disclosure, only one read/write line commonly arranged for the stacked semiconductor layers is sufficient. In other words, only one contact plug (via) connecting between the read/write line and the semiconductor layers is sufficient. Even when the number of stacked semiconductor layers increases, the number of contacts does not increase in proportional to the number of stacked semiconductor layers. In such case, the select transistor array simply slightly increases in size.

Therefore, even when the number of stacked semiconductor layers increases, the increase in the size of the hook up areas can be suppressed.

(3) Production Method

FIGS. 316 to 318 illustrate select transistor arrays.

As already explained above, according to the present disclosure, first to fourth semiconductor layers 12-1, 12-2, 12-3, 12-4 are selected using the select transistor array.

Therefore, for example, the select transistor array in first semiconductor layer 12-1 selectively forms an electric conduction path in response to a first input signal, and the select transistor array in second semiconductor layer 12-2 selectively forms an electric conduction path in response to a second input signal.

Further, the select transistor array in third semiconductor layer 12-3 selectively forms an electric conduction path in response to a third input signal, and the select transistor array in fourth semiconductor layer 12-4 selectively forms an electric conduction path in response to a fourth input signal.

This kind of structure is achieved by selectively forming N−-type diffusion layer or P−-type diffusion layer in first to fourth semiconductor layers 12-1, 12-2, 12-3, 12-4.

A production method for obtaining this structure will be hereinafter explained.

FIGS. 319 to 363 illustrate an example of production method for obtaining the structure as shown in FIGS. 316 to 318.

First, as shown in FIGS. 319 to 321, first compound semiconductor layer (for example, SiGe layer) 61-1 is formed on insulating layer 100 by CVD in a chamber, for example. Subsequently, a deposition gas is switched in the chamber, and first single-crystal semiconductor layer 12-1 is formed on first compound semiconductor layer 61-1 by epitaxial growth.

The above operation is repeatedly executed to form a stacked layer structure on insulating layer 100. The stacked layer structure includes first to fourth compound semiconductor layers 61-1, 61-2, 61-3, 61-4 and first to fourth single-crystal semiconductor layers 12-1, 12-2, 12-3, 12-4.

When first to fourth semiconductor layers 12-1, 12-2, 12-3, 12-4 are silicon single crystal (Si) layers at this occasion, first to fourth compound semiconductor layers 61-1, 61-2, 61-3, 61-4 are preferably SiGe layers. On the other hand, the concentration of Ge in the SiGe layer is preferably 30% or more.

Then, protective layer (for example, SiN layer) 101 is formed on fourth semiconductor layer 12-4 serving as the uppermost layer by CVD, for example.

Thereafter, a resist pattern is formed on protective layer 101. Using the resist pattern as a mask, protective layer 101 is patterned by RIE. Subsequently, the resist pattern is removed. Using protective layer 101 as a hard mask, fourth semiconductor layer 12-4, fourth compound semiconductor layer 61-4, third semiconductor layer 12-3, third compound semiconductor layer 61-3, second semiconductor layer 12-2, second compound semiconductor layer 61-2, first semiconductor layer 12-1, and first compound semiconductor layer 61-1 are etched by RIE in order.

As a result, trenches in an array form for forming the select transistor arrays and trenches for forming N+-type diffusion layers are formed.

Subsequently, as shown in FIGS. 322 to 324, oxide silicon layers (PSG layers) 102 including N-type impurities are formed in the trenches. Then, as shown in FIGS. 325 to 327, oxide silicon layers 102 in the trenches for forming the select transistor arrays are selectively removed.

As a result, oxide silicon layers 102 including N-type impurities remain only in the trenches for forming N+-type diffusion layers.

Subsequently, as shown in FIGS. 328 to 330, for example, P-type impurities (for example, boron) are provided by vapor-phase diffusion to first to fourth semiconductor layers 12-1, 12-2, 12-3, 12-4 via the trenches for forming the select transistor arrays, so that P−-type diffusion layers are formed in first to fourth semiconductor layers 12-1, 12-2, 12-3, 12-4 in the select transistor arrays.

At the same time, N-type impurities (for example, phosphorus) are provided by solid-phase diffusion from oxide silicon layers 102 filled in the trenches for forming the N+-type diffusion layers to first to fourth semiconductor layers 12-1, 12-2, 12-3, 12-4, so that N-type diffusion layers 14*a*, 14*b* are formed in first to fourth semiconductor layers 12-1, 12-2, 12-3, 12-4 at both ends of the select transistor arrays.

Thereafter, oxide silicon layers 102 filled in the trenches for forming the N+-type diffusion layers are removed.

Subsequently, as shown in FIGS. 331 to 333, all the trenches are filled with insulating layers (for example, oxide silicon layers) 103. Further, as shown in FIGS. 334 to 336, resist layer 104*a* is formed on protective layer 101. Resist layer 104*a* has a partial opening at an end in the second direction in this example.

Then, using resist layer 104*a* as a mask, etch-back process is executed by RIE on insulating layer 103. Insulating layers 103 in the trenches that are not covered with resist layer 104*a* are etched so that the side surfaces of fourth semiconductor layer 12-4 are completely exposed (i.e., insulating layers 103 equivalent to one step of semiconductor layer is etched).

Thereafter, resist layer 104*a* is removed.

Likewise, as shown in FIGS. 340 to 342, resist layer 104*b* is formed on protective layer 101 again. Resist layer 104*b* has a partial opening at an end in the second direction in this example. This opening includes a range of the previously formed opening as shown in FIGS. 334 to 336.

Then, using resist layer 104*b* as a mask, etch-back process is executed by RIE on insulating layer 103. Insulating layers 103 in the trenches that are not covered with resist layer 104*b* are etched so that the side surfaces of third or fourth semiconductor layer 12-3, 12-4 are completely exposed (i.e., insulating layers 103 equivalent to one step of semiconductor layer is etched).

Thereafter, resist layer 104*b* is removed.

The above operation is repeatedly executed. As shown in FIGS. 343 to 345, insulating layers 103 in the trenches for forming the select transistor array are ultimately formed into a staircase pattern in the second direction, for example.

In this state, plasma doping or solid-phase diffusion is executed to introduce N-type impurities into first to fourth semiconductor layers 12-1, 12-2, 12-3, 12-4 that are not covered with insulating layer 103, whereby a portion of the P−-type diffusion layer is converted into an N−-type diffusion layer.

Subsequently, as shown in FIGS. 346 to 348, some of the trenches are filled with resist layers 106. Then, using the process as shown in FIGS. 334 to 345, resist layers 106 are etched in a staircase pattern as shown in FIGS. 349 to 351. Resist layer 106 has a thickness equivalent to one step of semiconductor layer in each of the trenches.

Then, conversion process from N−-type diffusion layers to P−-type diffusion layers is thereafter executed again as shown in FIGS. 352 to 354.

In this process, the N−-type diffusion layers in first to fourth semiconductor layers 12-1, 12-2, 12-3, 12-4 covered with resist layer 106 are protected by resist layer 106.

The other N−-type diffusion layers, i.e., N−-type diffusion layers in first to fourth semiconductor layers 12-1, 12-2, 12-3, 12-4 that are not covered with resist layer 106, are converted from N−-type diffusion layers to P−-type diffusion layer again by plasma doping or solid-phase diffusion.

Thereafter, when resist layer 106 is removed, the structure as shown in FIGS. 355 to 357 is obtained.

Subsequently, in FIGS. 355 to 357, first to fourth compound semiconductor layers 61-1, 61-2, 61-3, 61-4 are selectively removed.

For example, first to fourth compound semiconductor layers 61-1, 61-2, 61-3, 61-4 can be removed by wet etching. More specifically, a mixed solution of hydrofluoric acid and nitric acid is provided to first to fourth compound semiconductor layers 61-1, 61-2, 61-3, 61-4 via trenches, so that first to fourth compound semiconductor layers 61-1, 61-2, 61-3, 61-4 are removed.

On the other hand, for example, first to fourth compound semiconductor layers 61-1, 61-2, 61-3, 61-4 can be removed by isotropic etching. More specifically, HCl gas is provided to first to fourth compound semiconductor layers 61-1, 61-2, 61-3, 61-4 via trenches, so that first to fourth compound semiconductor layers 61-1, 61-2, 61-3, 61-4 are removed.

As a result, cavities (air gaps) are formed between first to fourth semiconductor layers 12-1, 12-2, 12-3, 12-4.

These cavities are filled by the same process as the second example.

For example, the spaces between first to fourth semiconductor layers 12-1, 12-2, 12-3, 12-4 are filled with inter-layer insulating layers (for example, oxide silicon layers) 107 as shown in FIGS. 358 to 360. Further, gate insulating layers (for example, oxide silicon layer) 108 are formed in the trenches in which the select transistor array is formed.

Inter-layer insulating layers 107 and gate insulating layers 108 may be formed at a time.

Finally, as shown in FIGS. 360 to 363, the trenches for forming the select transistor array are filled with gate electrodes 109.

At this occasion, the select transistor array and the memory cell array may be formed at a time. In this case, the select transistor array has the same structure as the memory cell array.

9. PERIPHERAL CIRCUIT

Logic Circuit

(1) Overview

A small logic circuit can be achieved by applying the architecture concept of the present disclosure. For example, basic components of a logic circuit, i.e., an inverter circuit, an NAND gate circuit, and an NOR gate circuit, are usually achieved with a combination of P-channel MOSFET and N-channel MOSFET. However, the sizes of these MOSFETs are extremely large. In the present disclosure, a logic circuit having a novel structure with an extremely small circuit size is suggested.

In this explanation, an element comprising the logic circuit having the novel structure will be referred to as a matrix channel element.

The logic circuit disclosed here can be used as a peripheral circuit for the above non-volatile semiconductor memory (MaCS). When the peripheral circuit (logic circuit) is constituted by MOSFETs, it is difficult to ensure consistency in terms of process between the memory cell array and the peripheral circuit, since the MaCS has a unique structure. When the peripheral circuit is made to have the same structure as the memory cell array, the memory cell array and the peripheral circuit can be formed at a time. Therefore, this is extremely effective to reduce the production cost.

(2) Basic Structure

FIG. 364 illustrates a basic structure of a matrix channel element according to the present disclosure. FIG. 365 is a cross sectional view taken along line CCCLXV-CCCLXV of FIG. 364. FIG. 366 is a cross sectional view taken along line CCCLXVI-CCCLXVI of FIG. 364. FIG. 367 is a cross sectional view taken along line CCCLXVII-CCCLXVII of FIG. 364.

Semiconductor substrate 11 is made of a single-crystal semiconductor formed by one crystal such as Si and Ge, or a compound semiconductor formed by multiple crystals (mixed crystal). Semiconductor layer 12 serving as an active area is provided on insulating layer 203 on semiconductor substrate 11. Semiconductor layer 12 is made of, for example, an intrinsic semiconductor.

Four gate electrodes 202 are arranged in an array form in the first direction in parallel to the surface of semiconductor substrate 11 and in the second direction perpendicular thereto, and four gate electrodes 202 pass through semiconductor layer 12 in the third direction perpendicular to the first and second directions. The lower surfaces of four gate electrodes 202 (the surfaces at the side of semiconductor substrate 11) are open, i.e., not in contact with semiconductor substrate 11.

Each of four gate electrodes 202 has a columnar shape extending in the third direction. The shape of a cross section of gate electrode 202 in a plane parallel to the surface of semiconductor substrate 11 is not limited to a circular shape, and may be an elliptic shape, a rectangular shape, and a polygonal shape. Gate electrode 202 is made of a conductor such as conductive polysilicon including impurities, metal, and metal silicide.

Gate insulating layers 201 are respectively provided between semiconductor layer 12 and four gate electrodes 202. Like the memory cell, gate insulating layer 201 may have a stacked layer structure including a data recording layer.

Two N+-type diffusion layers 14 are provided within semiconductor layer 12 at two ends in the first direction of four gate electrodes 202. On the other hand, two P+-type diffusion layer 15 are provided within semiconductor layer 12 at two ends in the second direction of four gate electrodes 202.

N+-type diffusion layers 14 and P+-type diffusion layers 15 are isolated from each other by element isolation insulating layers 16.

Both of a distance Sx between the four gate electrodes 202 in the first direction of the semiconductor layer 12 and a distance Sy between the four gate electrodes 202 in the second direction of the semiconductor layer 12 are 50 nm or less, preferably 20 nm or less, and more preferably 10 nm or less (when sx=0, sy=0 is excluded).

The distance Sx and the distance Sy may be the same or may be different.

The matrix channel element has a structure similar to FIN-FET having double gate structure. The feature of the matrix channel element is as follows. For example, as shown in FIGS. 368 and 369, an electric conduction path can be formed between two N+-type diffusion layers 14 or between P+-type diffusion layers 15 in accordance with the voltage applied to four gate electrodes 202.

For example, as shown in FIG. 368, positive potentials are applied to four gate electrode 202, whereby an electric conduction path (flow of electrons e−) can be formed between two N+-type diffusion layers 14. For example, as shown in FIG. 369, negative potentials are applied to four gate electrode 202, whereby an electric conduction path (flow of holes h+) can be formed between two P+-type diffusion layers 15.

(3) Example of Logic Circuit

An example of a logic circuit using the matrix channel element will be hereinafter explained.

A. Inverter Circuit

FIG. 370 illustrates an equivalent circuit of an inverter.

The inverter circuit can be achieved with the basic structure of the matrix channel element as shown in FIGS. 364 to 367.

More specifically, as shown in FIGS. 371 and 372, input signal Vin is given to four gate electrodes 202. High potential power supply potential Vdd is applied to one of two P+-type diffusion layers 15. Low potential power supply potential Vss is applied to one of two N+-type diffusion layers 14. At this occasion, output signal Vout is output to common connection node N connected to the other of two P+-type diffusion layers 15 and the other of two N+-type diffusion layers 14.

For example, as shown in FIG. 371, when input signal Vin is "1", N-type inversion layer is formed on intrinsic semiconductor layer 12, whereby an electric conduction path (flow of electrons e−) is formed between two N+-type diffusion layers 14. Accordingly, output signal Vout attains "0".

On the other hand, as shown in FIG. 372, when input signal Vin is "0", P-type inversion layer is formed on intrinsic semiconductor layer 12, whereby an electric conduction path (flow of holes h+) is formed between two P+-type diffusion layers 15. Accordingly, output signal Vout attains "1".

By the way, the mobility of electrons and the mobility of holes in semiconductor layer (for example, silicon layer) 12 are known to be different. In this case, when the matrix channel element according to the present disclosure is formed symmetrically, the amount of current (ON current) flowing through two N+-type diffusion layers 14 and the amount of current (ON current) flowing through two P+-type diffusion layers 15 are different as a result.

This may hinder accurate inverter operations.

In an ordinary MOSFET, the channel width of a P-channel MOSFET and the channel width of an N-channel MOSFET are trimmed in order to solve this problem. It is difficult to execute trimming in this structure.

This is because in the matrix channel element, the thickness of semiconductor layer 12 corresponds to the channel width. However, the thickness of semiconductor layer 12 is constant and is the same in all the transistors comprising the matrix channel element.

To solve this problem, as shown in FIG. 373, the number of transistors connected in series between two N+-type diffusion layers 14 (the number of gate electrodes 202) are set at a number different from the number of transistors connected in series between two P+-type diffusion layers 15 (the number of gate electrodes 202).

More specifically, the number of transistors between two N+-type diffusion layer 14 serving as an electric conduction path for electrons having a high degree of mobility is set at a number more than the number of transistors between two P+-type diffusion layer 15 serving as an electric conduction path for holes having a low degree of mobility.

In the present example, three transistors are connected in series between two N+-type diffusion layers 14, and two transistors are connected in series between two P+-type diffusion layers 15. In other words, the matrix channel element has gate electrodes 202 arranged in two lines by three columns.

As shown in FIG. 374, the shape of a cross section of gate electrode 202 in a plane parallel to the first and second directions is an elliptic shape which is long in the first direction and is short in the second direction.

More specifically, the distance between two N+-type diffusion layers 14 serving as the electric conduction path for electrons having a high degree of mobility is set at a distance longer than the distance between two P+-type diffusion layers 15 serving as the electric conduction path for holes having a low degree of mobility.

In this example, the distance between two N+-type diffusion layers 14 is about 1.5 times longer than the distance between two P+-type diffusion layers 15. However, the distances Sx, Sy between gate electrodes 202 of the matrix channel element (see FIG. 364) needs to satisfy the condition explained in the basic structure.

As described above, according to the structure as shown in FIGS. 373 and 374, the amount of current (ON current) flowing through two N+-type diffusion layers 14 is set at the same amount as the amount of current (ON current) flowing through two P+-type diffusion layers 15, so that the inverter operation can be executed accurately.

B. NAND Gate Circuit

FIG. 375 illustrates an equivalent circuit of an NAND gate.

The NAND gate circuit can be achieved with the basic structure of the matrix channel element as shown in FIGS. 364 to 367.

More specifically, as shown in FIG. 376, input signal A is given to two gate electrodes 202 at the left (at one of two N+-type diffusion layers 14), and input signal B is given to two gate electrodes 202 at the right (at the other of two N+-type diffusion layers 14). High potential power supply potential Vdd is applied to one of two P+-type diffusion layers 15, and low potential power supply potential Vss is applied to one of two N+-type diffusion layers 14.

At this occasion, output signal Vout is output to common connection node N connected to the other of two P+-type diffusion layers 15 and the other of two N+-type diffusion layers 14.

For example, as shown in FIG. 377, when input signal A is "1" and input signal B is "0", an electric conduction path (flow of holes h+) is formed between two P+-type diffusion layers 15. Accordingly, output signal Vout attains "1". When both of input signals A, B are "0" or when input signal A is "0" and input signal B is "1", an electric conduction path is formed in the same manner.

As shown in FIG. 378, when input signal A is "1" and input signal B is "1", an electric conduction path (flow of electrons e−) is formed between two N+-type diffusion layers 14. Accordingly, output signal Vout attains "0".

The NAND gate circuit may employ the structure as shown in FIG. 373 and the structure as shown in FIG. 374 in view of the difference between the mobility of electrons and the mobility of holes.

C. NOR Gate Circuit

FIG. 379 illustrates an equivalent circuit of an NOR gate.

The NOR gate circuit can be achieved with the basic structure of the matrix channel element as shown in FIGS. 364 to 367.

More specifically, as shown in FIG. 380, input signal A is given to two gate electrodes 202 at the upper side (at one of two P+-type diffusion layers 15), input signal B is given to two gate electrodes 202 at the lower side (at the other of two P+-type diffusion layers 15). High potential power supply potential Vdd is applied to one of two P+-type diffusion layers 15, and low potential power supply potential Vss is applied to one of two N+-type diffusion layers 14.

At this occasion, output signal Vout is output to common connection node N connected to the other of two P+-type diffusion layers 15 and the other of two N+-type diffusion layers 14.

For example, as shown in FIG. 381, when input signal A is "1" and input signal B is "0", an electric conduction path (flow of electrons e−) is formed between two N+-type diffusion layers 14. Accordingly, output signal Vout attains "0". When input signal A is "0" and input signal B is "1" or when both of input signals A, B are "1", an electric conduction path is formed in the same manner.

As shown in FIG. 382, when input signal A is "0" and input signal B is "0", an electric conduction path (flow of holes h+) is formed between two P+-type diffusion layers 15. Accordingly, output signal Vout attains "1".

The NOR gate circuit may employ the structure as shown in FIG. 373 and the structure as shown in FIG. 374 in view of the difference between the mobility of electrons and the mobility of holes.

D. Three-Input NAND Gate Circuit

FIG. 383 illustrates an equivalent circuit of a three-input NAND gate.

The three-input NAND gate circuit can be achieved with a structure based on the basic structure of the matrix channel element as shown in FIGS. 364 to 367 (gate electrode structure having 2 lines by 3 columns).

More specifically, as shown in FIG. 384, input signal A is given to two gate electrodes 202 at the left (at one of two N+-type diffusion layers 14), input signal B is given to two gate electrodes 202 in the center, and input signal C is given to two gate electrodes 202 at the right (at the other of two N+-type diffusion layers 14). High potential power supply potential Vdd is applied to one of two P+-type diffusion layers 15, and low potential power supply potential Vss is applied to one of two N+-type diffusion layers 14.

At this occasion, output signal Vout is output to common connection node N connected to the other of two P+-type diffusion layers 15 and the other of two N+-type diffusion layers 14.

According to the matrix channel element of FIG. 384, the three-input NAND gate circuit can be achieved as shown in a truth table of FIG. 383.

E. Three-Input NOR Gate Circuit

FIG. 385 illustrates an equivalent circuit of a three-input NOR gate.

The three-input NOR gate circuit can be achieved with a structure based on the basic structure of the matrix channel element as shown in FIGS. 364 to 367 (gate electrode structure having three lines by two columns).

More specifically, as shown in FIG. 386, input signal A is given to two gate electrodes 202 at the upper side (at one of two P+-type diffusion layers 15), input signal B is given to two gate electrodes 202 in the center, and input signal C is given to two gate electrodes 202 at the lower side (at the other of two P+-type diffusion layers 15). High potential power supply potential Vdd is applied to one of two P+-type diffusion layers 15, and low potential power supply potential Vss is applied to one of two N+-type diffusion layers 14.

At this occasion, output signal Vout is output to common connection node N connected to the other of two P+-type diffusion layers 15 and the other of two N+-type diffusion layers 14.

According to the matrix channel element of FIG. 386, the three-input NOR gate circuit can be achieved as shown in a truth table of FIG. 385.

(4) Three-Layer Structure Matrix Channel Element

When the matrix channel element has a three-layer structure, a large amount of output current can be ensured in logic circuits (inverter circuit, NAND gate circuit, NOR gate circuit), and this contributes to stable operation.

The three-layer structure means that the semiconductor layers are made into a three-layer structure like the MaCS.

For example, FIG. 387 illustrates an example in which the inverter circuit of FIG. 372 is made into a three-layer structure. FIG. 388 illustrates an example in which the NAND gate circuit of FIG. 376 is made into a three-layer structure. FIG. 389 illustrates an example in which the NOR gate circuit of FIG. 380 is made into a three-layer structure.

In any example, semiconductor layers 12 have the same structure, and gate electrodes 202 can be easily formed by passing through semiconductor layers 12.

10. READING METHOD (1) Overview

In the MaCS (matrix channel stacked memory), for example, control gates of MONOS cells are connected to one word line. A method for applying desired potentials to control gates of MONOS cells is not obvious.

As described above, a select transistor are connected between a control gate of an MONO cells and a word line. When the select transistor is in ON state, the potential of the control gate of the MONOS cell is the same as the potential of the word line.

When the select transistor is turned off, the word line is electrically insulated from the control gate of the MONOS cell. Even when the potential of the word line changes, the potential of the control gate of the MONOS cell does not change. In other words, the potential of the control gate of the MONOS cell is maintained at the potential of the word line immediately before the select transistor changes from ON state to OFF state.

However, more specifically, the values of them both may be different. This is because when the select transistor is in OFF state, the control gate of the MONOS cell is in an electrically floating state, and the potential thereof may change due to capacitive coupling with electrodes therearound.

Therefore, even when the select transistor is in OFF state, the potential of the control gate of the MONOS cell may change due to the potentials of the electrodes therearound.

On the other hand, the control gate of a MONOS cell whose select transistor is in ON state is not in a floating state. The potential thereof is the same as the potential of the word line. Therefore, the potential is less likely to be affected by the potentials of electrodes therearound, and the potential of the word line can be controlled more accurately.

Using the above principle, ON/OFF control of the select transistors is executed while changing the potentials of the word lines, whereby desired potentials can be applied to the control gates of the MONOS cells connected to the same word line.

In the read operation, a potential determined by the reading method and the device structure of the MaCS needs to be applied to the control gate of each of the MONOS cells. This can be carried out according to the above principle. Further, at this occasion, the potential of the control gate of the MONOS cell serving as a reading cell is preferably controlled more accurately than the potentials of the control gates of the other MONOS cells. This is because the variation of the potential of the control gate of the MONOS cell serving as the reading cell causes reading error of the threshold voltage of the reading cell.

Therefore, in the reading method of the MaCS in the present disclosure, the read operation is executed while the select transistor connected to the control gate of the MONOS cell serving as the reading cell is in ON state. This is a key factor of the reading method according to the present disclosure.

(2) Embodiment

FIG. 390 is a flowchart illustrating the reading method according to the present disclosure.

Symbols VCG, USW denote potentials. When this potential is applied to a control gate of a MONOS cell, the MONOS cell attains non-conductive state irrespective of data "0"/"1" stored therein.

Symbol VREAD denotes a potential. When this potential is applied to the control gate of the MONOS cell, the MONOS cell attains conductive state irrespective of data "0"/"1" stored therein.

Symbol VSENSE denotes a potential. This potential is applied to the control gate of the reading cell to detect the threshold voltage of the reading cell. If the potential VSENSE is less than the threshold voltage of the reading cell, an electric conduction path is formed in an NAND series. If not, no electric conduction path is formed in the NAND series.

Symbol VF denotes a potential, and is a forward voltage of a PN junction including an N+-type diffusion layer serving as a source region or a drain region of a select transistor and a semiconductor layer serving as a channel region (P-type region).

Symbols VTH, SG denote a potential, and is a threshold voltage of a select transistor when the channel region of the select transistor is 0 V.

The select transistor is turned on when a gate potential VG thereof satisfies VG>min(VS, VD)+VF+VTH, SG. The select transistor is turned off when VG<min(VS, VD)+VF+VTH, SG holds.

It should be noted that min (VS, VD) represents the lesser of the source potential VS and the drain potential VD.

The reading method according to the present disclosure is as follows. First, at a time t0, VCG, USW are applied to selected word line WL-sel and unselected word line WL-unsel. A potential higher than VCG, USW+VF+VTH, SG is applied to selected select gate line SG-sel and unselected select gate line SG-unsel.

At this occasion, all the select transistors are turned on, and the potentials of the control gates of all the MONOS cells attain VCG, USW.

Subsequently, at a time t1, the potential of selected word line WL-sel is changed to VREAD, and the potential of selected gate line SG-sel is changed to a potential less than VREAD+VF+VTH, SG.

At this occasion, the select transistors connected to selected gate line SG-sel are in OFF state. Accordingly, the potentials of the control gates of the MONOS cells connected thereto are still VCG, USW (state 1+3).

On the other hand, the select transistors connected to unselected select gate line SG-unsel are in ON state. Among these, the potential of the control gate of the MONOS cell connected to selected word line WL-sel attains VREAD (state 1+4).

In this manner, VREAD is applied to only the control gate of the MONOS cell connected to selected word line WL-sel and unselected select gate line SG-unsel.

Subsequently, at a time t2, the potential of unselect gate line SG-unsel is changed to a value less than VREAD+VF+VTH, SG.

At this occasion, all the select transistors are in OFF state.

Subsequently, at a time t3, the potential of selected word line WL-sel is changed to VSENSE, the potential of selected gate line SG-sel is changed to a potential higher than VCG, USW+VF+VTH, SG.

At this occasion, the select transistor connected to selected gate line SG-sel is turned on. The potential VSENSE is applied to the MONOS cell connected to selected word line WL-sel and selected gate line SG-sel, i.e., the control gate of the reading cell.

Since this select transistor is in ON state, the potential of selected word line WL-sel can be accurately controlled. Therefore, the threshold voltage of the reading cell can be accurately read out.

11. CONCLUSION

According to the present invention, the non-volatile semiconductor memory having a large capacity can be achieved on the basis of the new architecture concept.

The present invention provides great industrial advantage to a file memory capable of random write operation at a high speed, a portable terminal capable of executing download operation at a high speed, a portable player capable of executing download operation at a high speed, a semiconductor memory for broadcast equipment, a drive recorder, a home video, a large capacity buffer memory for communication, a semiconductor memory for a surveillance camera.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory comprising:

a semiconductor substrate;

a first semiconductor layer on the semiconductor substrate;

control gates provided in an array form in a first direction in parallel with a surface of the semiconductor substrate and in a second direction perpendicular thereto, the control gates passing through the first semiconductor layer in a third direction perpendicular to the first and second directions;

data recording layers between the first semiconductor layer and the control gates;

two first conductive-type diffusion layers at two ends in the first direction of the first semiconductor layer;

two second conductive-type diffusion layers at two ends in the second direction of the first semiconductor layer;

select gate lines extending in the first direction on the first semiconductor layer; and word lines extending in the second direction on the select gate lines, wherein the select gate lines function as select gates shared by select transistors connected between the control gates and the word lines arranged in the first direction, each of the word lines is commonly connected to the control gates arranged in the second direction, a first memory cell array comprises the first semiconductor layer, the control gates, and the data recording layers therebetween, and the first memory cell array has NAND series including memory cells connected in series in the first direction.

2. The memory of claim 1, wherein a writing to a selected memory cell of a selected NAND series of the NAND series is executed by:

setting the two second conductive-type diffusion layers to a floating state, setting the control gate of the selected memory cell to a potential for the writing, and providing charges from one of the two first conductive-type diffusion layers to the selected memory cell.

3. The memory of claim 1, wherein a reading to a selected memory cell of a selected NAND series of the NAND series is executed by:

setting control gates of memory cells in two unselected NAND series adjacent to the selected NAND series and the two second conductive-type diffusion layers to a floating state, setting the control gate of the selected memory cell to a potential for the reading, and setting control gates of unselected memory cells in the selected NAND series to a potential at which an electric conduction path is generated in the selected NAND series.

4. The memory of claim 3, wherein when the reading is executed repeatedly multiple times, the control gates of all the memory cells in the selected NAND series are set to a potential for erasing a channel inversion layer in the first semiconductor layer after the reading.

5. The memory of claim 1, wherein a reading to a selected memory cell of a selected NAND series of the NAND series is executed by:

setting the two second conductive-type diffusion layers to a floating state, setting control gates of memory cells in two unselected NAND series adjacent to the selected NAND series to a potential at which no electric conduction path is generated in the two unselected NAND series, setting the control gate of the selected memory cell to a potential for the reading, and setting the control gates of the unselected memory cells in the selected NAND series to a potential at which an electric conduction path is generated in the selected NAND series.

6. The memory of claim 5, wherein when the reading is executed repeatedly multiple times, the control gates of all the memory cells in the selected NAND series are set to a potential for erasing a channel inversion layer formed in the first semiconductor layer after the reading.

7. The memory of claim 1, wherein an erasing to the memory cells in the NAND series is executed by:

setting the two first conductive-type diffusion layers to a floating state, setting the control gates to a potential for the erasing, and providing charges from at least one of the two second conductive-type diffusion layers to the memory cells in the NAND series.

8. The memory of claim 1, further comprising blocks arranged in the first and second directions, wherein each of the blocks includes the control gates, the data recording layers, the select gate lines, and the word lines, and one of the two first conductive-type diffusion layers or one of the two second conductive-type diffusion layers is shared by two of the blocks adjacent to each other in the first or second direction.

9. The memory of claim 8, wherein each of the blocks includes select transistors provided at ends in the first direction of the NAND series, and each of the select transistors has a select gate passing through the first semiconductor layer in the third direction.

10. The memory of claim 9, wherein each of the blocks includes select transistors provided at ends in the second direction of the NAND series, and each of the select transistors has a select gate passing through the first semiconductor layer in the third direction.

11. The memory of claim 10, wherein a read/write buffer is connected to only one of the two first conductive-type diffusion layers provided at one end of blocks in each of odd-numbered columns or even-numbered columns with respect to an end in the first direction of the blocks.

12. The memory of claim 8, wherein each of the blocks includes select transistors provided at ends in the second direction of the NAND series, and each of the select transistors has a select gate passing through the first semiconductor layer in the third direction.

13. The memory of claim 12, wherein a read/write buffer is connected to only one of the two first conductive-type diffusion layers provided at one end of blocks in each of odd-numbered channels or even-numbered channels with respect to an end in the first direction of the blocks.

14. The memory of claim 1, further comprising:

a second semiconductor layer between the first semiconductor layer and the select gate lines, the control gates passing through the second semiconductor layer in the third direction;

data recording layers between the second semiconductor layer and one of the control gates;

two first conductive-type diffusion layers at two ends in the first direction of the second semiconductor layer; and two second conductive-type diffusion layers at two ends in the second direction of the second semiconductor layer, wherein a second memory cell array comprises the second semiconductor layer, the control gates, and the data recording layers therebetween, and the second memory cell array has NAND series including memory cells connected in series in the first direction.

15. The memory of claim 14, further comprising:

a first conductive line independently connected to one of the two first conductive-type diffusion layers in the first semiconductor layer; and a second conductive line independently connected to one of the two first conductive-type diffusion layers in the second semiconductor layer.

16. The memory of claim 15, wherein one of the two first conductive-type diffusion layers is provided at one end in the first direction of the first and second semiconductor layers, one end in the first direction of the first and second semiconductor layer has a staircase structure, and the first and second semiconductor layers comprising the staircase structure have trenches filled with insulating layers.

17. The memory of claim 15, wherein one of the two first conductive-type diffusion layers is provided at one end in the first direction of the first and second semiconductor layers, one end in the first direction of the first and second semiconductor layer has a curvature structure curved in the third direction, and the first and second semiconductor layers comprising the curvature structure have trenches filled with insulating layers.

18. The memory of claim 15, further comprising:

a first contact plug for connecting between the first conductive line and one of the two first conductive-type diffusion layers in the first semiconductor layer; and a second contact plug for connecting between the second conductive line and one of the two first conductive-type diffusion layers in the second semiconductor layer, wherein the first and second contact plugs pass through the first and second semiconductor layers in the third direction.

19. The memory of claim 18, wherein one of the two first conductive-type diffusion layers in the first semiconductor layer has a first fringe area connected to the first contact plug, one of the two first conductive-type diffusion layers in the second semiconductor layer has a second fringe area connected to the second contact plug, the first and second fringe areas are displaced from each other when seen from the third direction, and the first and second conductive lines are connected to ends of the first and second contact plugs at the semiconductor substrate side.

20. The memory of claim 14, further comprising a first conductive line commonly connected to one of the two first conductive-type diffusion layers in the first and second semiconductor layers, wherein the first conductive line is connected to one of the two first conductive-type diffusion layers in the first semiconductor layer via a first select transistor array, the second conductive line is connected to one of the two first conductive-type diffusion layers in the second semiconductor layer via a second select transistor array, and the first and second select transistor arrays have the same structure as the first and second memory cell arrays.

* * * * *